US012747836B2

(12) United States Patent
Xiong et al.

(10) Patent No.: US 12,747,836 B2
(45) Date of Patent: Sep. 29, 2026

(54) LED LAMP AND MISUSE WARNING MODULE THEREOF

(71) Applicant: JIAXING SUPER LIGHTING ELECTRIC APPLIANCE CO., LTD, Jiaxing (CN)

(72) Inventors: Aiming Xiong, Jiaxing (CN); Junren Chen, Jiaxing (CN); Lin Zhou, Jiaxing City (CN); Haibo You, Jiaxing City (CN); Hechen Hu, Jiaxing City (CN); Hao Zhang, Jiaxing City (CN)

(73) Assignee: JIAXING SUPER LIGHTING ELECTRIC APPLIANCE CO., LTD, Jiaxing City (CN)

( * ) Notice: Subject to any disclaimer, the term of this patent is extended or adjusted under 35 U.S.C. 154(b) by 395 days.

(21) Appl. No.: 18/219,737

(22) Filed: Jul. 10, 2023

(65) Prior Publication Data

US 2024/0093841 A1 Mar. 21, 2024

Related U.S. Application Data

(63) Continuation-in-part of application No. PCT/CN2022/071054, filed on Jan. 10, 2022, and a
(Continued)

(30) Foreign Application Priority Data

Mar. 10, 2015 (CN) ......................... 201510104823.3
Mar. 25, 2015 (CN) ......................... 201510133689.X
(Continued)

(51) Int. Cl.
*F21V 23/00* (2015.01)
*F21K 9/272* (2016.01)
(Continued)

(52) U.S. Cl.
CPC .............. *F21K 9/278* (2016.08); *F21K 9/272* (2016.08); *F21K 9/275* (2016.08); *F21V 3/061* (2018.02);
(Continued)

(58) Field of Classification Search
None
See application file for complete search history.

(56) References Cited

U.S. PATENT DOCUMENTS 5,051,732 A 9/1991 Robitaille
5,936,599 A 8/1999 Reymond
(Continued)

FOREIGN PATENT DOCUMENTS

CN 101193486 A 6/2008
CN 101272652 A 9/2008
(Continued)

OTHER PUBLICATIONS

*Current Lighting Solutions, LLC d/b/a GE Current*, Petitioner, v. *Jiaxing Super Lighting Electricappliance Co., LTD*, Patent Owner, Inter Partes Review No. IPR2023-00676 U.S. Pat. No. 9,939,140, Under 35 USC §312 Mar. 22, 2023.
(Continued)

*Primary Examiner* — Anh Q Tran
(74) *Attorney, Agent, or Firm* — Simon Kuang Lu

(57) ABSTRACT

A misuse warning module, including a detection circuit and a warning circuit is provided. The detection circuit is electrically connected to the power circuit of the LED lamp to detect the type of external power supply signal and the current level in the power loop and output the detection signal. The warning circuit is configured to generate a misuse warning based on the detection signal to prompt the user that the LED lamp is connected to an incompatible external power supply.

17 Claims, 113 Drawing Sheets

Related U.S. Application Data continuation-in-part of application No. 18/075,549, filed on Dec. 6, 2022, now Pat. No. 11,754,232, which is a continuation of application No. 17/338,485, filed on Jun. 3, 2021, now Pat. No. 11,543,086, which is a continuation of application No. 16/667,370, filed on Oct. 29, 2019, now Pat. No. 11,028,973, which is a continuation-in-part of application No. 16/436,454, filed on Jun. 10, 2019, now Pat. No. 10,605,415, which is a continuation of application No. 16/143,755, filed on Sep. 27, 2018, now Pat. No. 10,317,017, which is a continuation-in-part of application No. 16/106,060, filed on Aug. 21, 2018, now Pat. No. 10,281,092, which is a continuation of application No. 15/662,094, filed on Jul. 27, 2017, now Pat. No. 10,054,271, which is a continuation-in-part of application No. 15/626,238, filed on Jun. 19, 2017, now Pat. No. 10,208,897, which is a continuation of application No. 15/373,388, filed on Dec. 8, 2016, now Pat. No. 9,689,536, which is a continuation-in-part of application No. 15/084,483, filed on Mar. 30, 2016, now Pat. No. 9,521,718, which is a continuation-in-part of application No. 14/865,387, filed on Sep. 25, 2015, now Pat. No. 9,609,711, said application No. 15/373,388 is a continuation-in-part of application No. 15/065,892, filed on Mar. 10, 2016, now Pat. No. 9,526,145, which is a continuation-in-part of application No. 14/865,387, filed on Sep. 25, 2015, now Pat. No. 9,609,711, said application No. 15/373,388 is a continuation-in-part of application No. 15/211,813, filed on Jul. 15, 2016, now Pat. No. 9,756,698, which is a continuation-in-part of application No. 14/865,387, filed on Sep. 25, 2015, now Pat. No. 9,609,711, and a continuation-in-part of application No. 14/699,138, filed on Apr. 29, 2015, now Pat. No. 9,480,109, and a continuation-in-part of application No. 15/150,458, filed on May 10, 2016, now Pat. No. 9,794,990, which is a continuation-in-part of application No. 14/865,387, filed on Sep. 25, 2015, now Pat. No. 9,609,711, and a continuation-in-part of application No. 14/699,138, filed on Apr. 29, 2015, now Pat. No. 9,480,109, said application No. 15/373,388 is a continuation-in-part of application No. 15/339,221, filed on Oct. 31, 2016, now Pat. No. 9,939,140, which is a continuation-in-part of application No. 15/210,989, filed on Jul. 15, 2016, now Pat. No. 9,587,817, which is a continuation-in-part of application No. 15/066,645, filed on Mar. 10, 2016, now Pat. No. 9,497,821, which is a continuation-in-part of application No. 14/865,387, filed on Sep. 25, 2015, now Pat. No. 9,609,711, said application No. 15/210,989 is a continuation-in-part of application No. 15/205,011, filed on Jul. 8, 2016, now Pat. No. 9,629,211, which is a continuation-in-part of application No. 15/150,458, filed on May 10, 2016, now Pat. No. 9,794,990.

(30) Foreign Application Priority Data

| | | |
|---|---|---|
| Mar. 26, 2015 | (CN) | 201510134586.5 |
| Apr. 3, 2015 | (CN) | 201510155807.7 |
| Apr. 22, 2015 | (CN) | 201510193980.6 |
| May 29, 2015 | (CN) | 201510284720.X |
| Jun. 17, 2015 | (CN) | 201510338027.6 |
| Jun. 26, 2015 | (CN) | 201510364735.7 |
| Jun. 26, 2015 | (CN) | 201510373492.3 |
| Jun. 29, 2015 | (CN) | 201510378322.4 |
| Jul. 10, 2015 | (CN) | 201510406595.5 |
| Jul. 20, 2015 | (CN) | 201510428680.1 |
| Jul. 27, 2015 | (CN) | 201510448220.5 |
| Aug. 8, 2015 | (CN) | 201510486115.0 |
| Aug. 14, 2015 | (CN) | 201510499512.1 |
| Aug. 26, 2015 | (CN) | 201510530110.3 |
| Sep. 6, 2015 | (CN) | 201510557717.0 |
| Sep. 18, 2015 | (CN) | 201510595173.7 |
| Sep. 25, 2015 | (CN) | 201510617370.4 |
| Oct. 8, 2015 | (CN) | 201510645134.3 |
| Oct. 27, 2015 | (CN) | 201510705222.8 |
| Oct. 30, 2015 | (CN) | 201510726365.7 |
| Nov. 27, 2015 | (CN) | 201510848766.X |
| Dec. 9, 2015 | (CN) | 201510903680.2 |
| Jan. 22, 2016 | (CN) | 201610044148.4 |
| Jan. 26, 2016 | (CN) | 201610050944.9 |
| Jan. 26, 2016 | (CN) | 201610051691.7 |
| Feb. 15, 2016 | (CN) | 201610085895.2 |
| Feb. 16, 2016 | (CN) | 201610087627.4 |
| Feb. 23, 2016 | (CN) | 201610098424.5 |
| Mar. 3, 2016 | (CN) | 201610120993.5 |
| Mar. 9, 2016 | (CN) | 201610132513.7 |
| Mar. 14, 2016 | (CN) | 201610142140.1 |
| Mar. 25, 2016 | (CN) | 201610177706.4 |
| Apr. 29, 2016 | (CN) | 201610281812.7 |
| May 18, 2016 | (CN) | 201610327806.0 |
| Jun. 14, 2016 | (CN) | 201610420790.8 |
| Jun. 20, 2016 | (CN) | 201610452437.8 |
| Oct. 8, 2016 | (CN) | 201610876593.7 |
| Oct. 8, 2016 | (CN) | 201610878349.4 |
| Oct. 12, 2016 | (CN) | 201610890527.5 |
| Oct. 27, 2016 | (CN) | 201610955338.1 |
| Oct. 27, 2016 | (CN) | 201610955342.8 |
| Nov. 3, 2016 | (CN) | 201610975119.X |
| Nov. 25, 2016 | (CN) | 201611057357.9 |
| Jan. 19, 2017 | (CN) | 201710036966.4 |
| Mar. 16, 2017 | (CN) | 201710158971.2 |
| Mar. 21, 2017 | (CN) | 201710170620.3 |
| Apr. 19, 2017 | (CN) | 201710258874.0 |
| Apr. 28, 2017 | (CN) | 201710295599.X |
| Jul. 19, 2017 | (CN) | 201710591551.3 |
| Sep. 27, 2017 | (CN) | 201710888946.X |
| Dec. 8, 2017 | (CN) | 201711298908.5 |
| Jan. 12, 2018 | (CN) | 201810032366.5 |
| Feb. 8, 2018 | (CN) | 201810130074.5 |
| Mar. 13, 2018 | (CN) | 201810205729.0 |
| Mar. 29, 2018 | (CN) | 201810272726.9 |
| Mar. 30, 2018 | (CN) | 201810292824.9 |
| Apr. 12, 2018 | (CN) | 201810326908.X |
| Jul. 10, 2018 | (CN) | 201810752429.4 |
| Aug. 30, 2018 | (CN) | 201811005720.1 |
| Sep. 10, 2018 | (CN) | 201811053085.4 |
| Oct. 30, 2018 | (CN) | 201811277947.1 |
| Nov. 29, 2018 | (CN) | 201811441563.9 |
| May 17, 2019 | (CN) | 201910412116.9 |
| Jun. 20, 2019 | (CN) | 201910537220.0 |
| Aug. 9, 2019 | (CN) | 201910732298.8 |
| Jan. 11, 2021 | (CN) | 202110032557.3 |
| Jan. 14, 2021 | (CN) | 202110048805.3 |
| Jan. 14, 2021 | (CN) | 202110049979.1 |
| Jun. 25, 2021 | (CN) | 202110708563.6 |

(51) Int. Cl.

*F21K 9/275* (2016.01)
*F21K 9/278* (2016.01)

| | |
|---|---|
| ***F21V 3/02*** | (2006.01) |
| ***F21V 3/06*** | (2018.01) |
| ***F21V 15/015*** | (2006.01) |
| ***F21V 23/02*** | (2006.01) |
| ***F21V 25/02*** | (2006.01) |
| ***F21V 25/04*** | (2006.01) |
| ***F21V 29/70*** | (2015.01) |
| ***H05B 45/00*** | (2022.01) |
| ***H05B 45/10*** | (2020.01) |
| ***H05B 45/20*** | (2020.01) |
| ***H05B 45/37*** | (2020.01) |
| ***H05B 45/50*** | (2022.01) |
| ***H05B 45/59*** | (2022.01) |
| ***H05K 1/00*** | (2006.01) |
| *F21V 29/83* | (2015.01) |
| *F21Y 103/10* | (2016.01) |
| *F21Y 115/10* | (2016.01) |
| *H05K 1/14* | (2006.01) |

(52) U.S. Cl.

CPC .......... *F21V 15/015* (2013.01); *F21V 23/003* (2013.01); *F21V 23/005* (2013.01); *F21V 23/023* (2013.01); *F21V 25/02* (2013.01); *F21V 25/04* (2013.01); *F21V 29/70* (2015.01); *H05B 45/00* (2020.01); *H05B 45/10* (2020.01); *H05B 45/20* (2020.01); *H05B 45/37* (2020.01); *H05B 45/50* (2020.01); *H05B 45/59* (2022.01); *H05K 1/00* (2013.01); *F21V 23/02* (2013.01); *F21V 29/83* (2015.01); *F21Y 2103/10* (2016.08); *F21Y 2115/10* (2016.08); *H05K 1/147* (2013.01); *H05K 2201/10106* (2013.01); *Y02B 20/30* (2013.01)

(56) References Cited

U.S. PATENT DOCUMENTS

| | | | |
|---|---|---|---|
| 7,701,275 | B2 | 4/2010 | Hsia |
| 7,887,226 | B2 | 2/2011 | Huang et al. |
| 7,929,100 | B2 | 4/2011 | Kim |
| 8,330,381 | B2 | 12/2012 | Langovsky |
| 8,427,070 | B2 | 4/2013 | Matsuda |
| 8,502,454 | B2 | 8/2013 | Sadwick |
| 8,564,214 | B2 | 10/2013 | Briggs |
| 8,596,813 | B2 | 12/2013 | Ivey |
| 8,624,509 | B2 | 1/2014 | Hartikka et al. |
| 8,729,809 | B2 | 5/2014 | Kit et al. |
| 8,749,167 | B2 | 6/2014 | Hsia et al. |
| 8,773,031 | B2 | 7/2014 | Sadwick |
| 8,872,437 | B2 | 10/2014 | Esaki et al. |
| 8,931,918 | B2 | 1/2015 | Liu et al. |
| 8,979,299 | B2 | 3/2015 | Hsia et al. |
| 9,095,023 | B2 | 7/2015 | Deppe et al. |
| 9,163,818 | B2 | 10/2015 | Hsia et al. |
| 9,239,157 | B2 | 1/2016 | Özgüc et al. |
| 9,240,227 | B2 | 1/2016 | Pyeon et al. |
| 9,277,603 | B2 | 3/2016 | Hsia et al. |
| 9,288,867 | B2 | 3/2016 | Hsia et al. |
| 9,288,879 | B2 | 3/2016 | Tao et al. |
| 9,420,663 | B1 | 8/2016 | Hsia et al. |
| 9,438,165 | B2 | 9/2016 | Powell et al. |
| 9,480,109 | B2 | 10/2016 | Ye et al. |
| 9,480,123 | B2 | 10/2016 | Van Dijk et al. |
| 9,496,795 | B2 | 11/2016 | Morota et al. |
| 9,497,821 | B2 | 11/2016 | Liu |
| 9,521,718 | B2 | 12/2016 | Xiong et al. |
| 9,526,145 | B2 | 12/2016 | Xiong et al. |
| 9,585,221 | B1 | 2/2017 | Chen et al. |
| 9,587,817 | B2 | 3/2017 | Liu et al. |
| 9,622,317 | B2 | 4/2017 | Ackermann et al. |
| 9,668,308 | B2 | 5/2017 | Hsia |
| 9,689,536 | B2 | 6/2017 | Xiong et al. |
| 9,723,662 | B2 | 8/2017 | Ye et al. |
| 9,750,096 | B2 | 8/2017 | Xiong et al. |
| 9,775,215 | B2 | 9/2017 | Xiong et al. |
| 9,781,805 | B2 | 10/2017 | Xiong et al. |
| 9,794,990 | B2 | 10/2017 | Ye et al. |
| 9,795,001 | B2 | 10/2017 | Ye et al. |
| 9,801,240 | B2 | 10/2017 | Xiong et al. |
| 9,807,826 | B2 | 10/2017 | Xiong et al. |
| 9,820,341 | B2 | 11/2017 | Xiong et al. |
| 9,826,585 | B2 | 11/2017 | Xiong |
| 9,826,595 | B2 | 11/2017 | Hsia |
| 9,841,174 | B2 | 12/2017 | Liu et al. |
| 9,942,955 | B2 | 4/2018 | Na et al. |
| 9,958,117 | B2 | 5/2018 | Engel et al. |
| 9,970,602 | B2 | 5/2018 | Xiong et al. |
| 9,970,640 | B2 | 5/2018 | Zhao |
| 10,117,296 | B1 | 10/2018 | Zhao |
| 10,281,092 | B2 | 5/2019 | Xiong et al. |
| 10,317,017 | B2 | 6/2019 | Xiong et al. |
| 10,337,676 | B2 | 7/2019 | Xiong et al. |
| 10,645,784 | B1 | 5/2020 | Lu et al. |
| 11,499,682 | B2 | 11/2022 | Xiong et al. |
| 2002/0176262 | A1 | 11/2002 | Tripathi et al. |
| 2003/0102819 | A1 | 6/2003 | Min et al. |
| 2007/0127242 | A1 | 6/2007 | Allen et al. |
| 2009/0261706 | A1 | 10/2009 | Sorella et al. |
| 2010/0096976 | A1 | 4/2010 | Park et al. |
| 2010/0308738 | A1 | 12/2010 | Shteynberg et al. |
| 2011/0043127 | A1 | 2/2011 | Yamasaki |
| 2011/0080110 | A1 | 4/2011 | Nuhfer et al. |
| 2011/0084554 | A1 | 4/2011 | Tian et al. |
| 2011/0148313 | A1 | 6/2011 | Ramaker et al. |
| 2011/0228526 | A1 | 9/2011 | Hartikka et al. |
| 2011/0234107 | A1 | 9/2011 | Simon et al. |
| 2011/0248646 | A1 | 10/2011 | Beyer et al. |
| 2011/0260614 | A1 | 10/2011 | Hartikka et al. |
| 2012/0147598 | A1 | 6/2012 | Ivey |
| 2012/0181952 | A1 | 7/2012 | Roeer |
| 2012/0249014 | A1 | 10/2012 | Mei |
| 2012/0299500 | A1 | 11/2012 | Sadwick et al. |
| 2013/0010459 | A1 | 1/2013 | Wilson |
| 2013/0099948 | A1 | 4/2013 | Dedic et al. |
| 2013/0147350 | A1 | 6/2013 | Yang |
| 2013/0214316 | A1 | 8/2013 | Lai |
| 2013/0335959 | A1 | 12/2013 | Hsia et al. |
| 2013/0342128 | A1 | 12/2013 | Chen et al. |
| 2014/0015345 | A1 | 1/2014 | Ivey et al. |
| 2014/0035463 | A1 | 2/2014 | Miyamichi |
| 2014/0055029 | A1 | 2/2014 | Jans |
| 2014/0055031 | A1 | 2/2014 | Myamoto et al. |
| 2014/0104824 | A1 | 4/2014 | Hsia et al. |
| 2014/0239827 | A1 | 8/2014 | Park |
| 2014/0265900 | A1 | 9/2014 | Sadwick et al. |
| 2015/0061520 | A1 | 3/2015 | Tao et al. |
| 2015/0173138 | A1 | 6/2015 | Roberts |
| 2015/0176770 | A1 | 6/2015 | Wilcox et al. |
| 2015/0181661 | A1 | 6/2015 | Hsia et al. |
| 2015/0223303 | A1 | 8/2015 | Hsia et al. |
| 2015/0252958 | A1 | 9/2015 | Barnetson et al. |
| 2015/0349651 | A1 | 12/2015 | Morota et al. |
| 2016/0081147 | A1 | 3/2016 | Guang |
| 2016/0091147 | A1 | 3/2016 | Jiang et al. |
| 2016/0102813 | A1 | 4/2016 | Ye et al. |
| 2016/0113076 | A1 | 4/2016 | Davenport et al. |
| 2016/0219658 | A1 | 7/2016 | Xiong et al. |
| 2016/0219672 | A1 | 7/2016 | Liu |
| 2016/0270163 | A1 | 9/2016 | Hu et al. |
| 2016/0270165 | A1 | 9/2016 | Xiong et al. |
| 2017/0067627 | A1 | 3/2017 | Liu et al. |
| 2017/0079115 | A1 | 3/2017 | Hsia |
| 2017/0184294 | A1 | 6/2017 | Tao |
| 2017/0290119 | A1 | 10/2017 | Xiong et al. |
| 2017/0300353 | A1 | 10/2017 | Yu et al. |
| 2017/0303353 | A1 | 10/2017 | Guang |
| 2017/0311396 | A1 | 10/2017 | Sadwick |
| 2017/0311397 | A1 | 10/2017 | Hsia |
| 2018/0259135 | A1 | 9/2018 | Xiong et al. |
| 2018/0310370 | A1 | 10/2018 | Heilman et al. |
| 2019/0041008 | A1 | 2/2019 | Xiong et al. |

(56) References Cited

U.S. PATENT DOCUMENTS

FOREIGN PATENT DOCUMENTS

| | | | | | |
|---|---|---|---|---|---|
| CN | 201382385 | Y | | 1/2010 | |
| CN | 101868111 | A | | 10/2010 | |
| CN | 201608956 | U | | 10/2010 | |
| CN | 101945512 | A | | 1/2011 | |
| CN | 102014560 | A | | 4/2011 | |
| CN | 201827683 | U | | 5/2011 | |
| CN | 202059618 | U | | 11/2011 | |
| CN | 202082866 | U | | 12/2011 | |
| CN | 102595687 | A | | 7/2012 | |
| CN | 102625525 | A | | 8/2012 | |
| CN | 202603010 | U | | 12/2012 | |
| CN | 202613100 | U | | 12/2012 | |
| CN | 202691968 | U | | 1/2013 | |
| CN | 202840991 | U | | 3/2013 | |
| CN | 203010510 | U | | 6/2013 | |
| CN | 203286318 | U | | 11/2013 | |
| CN | 203384684 | U | | 1/2014 | |
| CN | 103867991 | A | | 6/2014 | |
| CN | 203691724 | U | | 7/2014 | |
| CN | 203859899 | U | | 10/2014 | |
| CN | 104246348 | A | | 12/2014 | |
| CN | 204028258 | U | * | 12/2014 | |
| CN | 105009436 | A | | 10/2015 | |
| CN | 105282930 | A | | 1/2016 | |
| CN | 103968285 | A | | 9/2016 | |
| CN | 205584538 | U | | 9/2016 | |
| CN | 106015996 | A | | 10/2016 | |
| CN | 106465503 | A | | 2/2017 | |
| CN | 105325058 | B | | 3/2017 | |
| CN | 106941746 | A | | 7/2017 | |
| CN | 106996514 | A | | 8/2017 | |
| CN | 107079545 | A | | 8/2017 | |
| CN | 206555763 | U | | 10/2017 | |
| CN | 207039939 | U | | 2/2018 | |
| CN | 207124784 | U | | 3/2018 | |
| CN | 207369353 | U | | 5/2018 | |
| CN | 105282930 | B | | 10/2018 | |
| CN | 108802603 | A | | 11/2018 | |
| CN | 106326068 | B | | 1/2019 | |
| CN | 211955768 | U | | 11/2020 | |
| CN | 212163776 | U | | 12/2020 | |
| EP | 2602544 | A1 | | 6/2013 | |
| EP | 2477456 | B1 | | 4/2016 | |
| GB | 2465966 | A | | 6/2010 | |
| GB | 2543380 | A | | 4/2017 | |
| GB | 2544211 | A | | 5/2017 | |
| GB | 2546605 | A | | 7/2017 | |
| IL | 231562 | A | | 1/2015 | |
| JP | 2004152499 | A | | 5/2004 | |
| JP | 2009545115 | A | | 12/2009 | |
| JP | 4520910 | B2 | | 5/2010 | |
| JP | 2014007809 | A | | 1/2014 | |
| JP | 2014057501 | A | | 3/2014 | |
| JP | 2014170947 | A | | 9/2014 | |
| KR | 20130130925 | A | * | 12/2013 | ............ F21K 9/238 |
| KR | 101446836 | B1 | * | 10/2014 | ......... H05B 45/3578 |
| TW | M469426 | U | | 1/2014 | |
| WO | 2010069983 | A1 | | 6/2010 | |
| WO | 2012009260 | A2 | | 1/2012 | |
| WO | 2012066822 | A1 | | 5/2012 | |
| WO | 2012070277 | A1 | | 5/2012 | |
| WO | 2013114485 | A1 | | 8/2013 | |
| WO | 2013131002 | A1 | | 9/2013 | |
| WO | 2014115045 | A1 | | 7/2014 | |
| WO | 2014116328 | A1 | | 7/2014 | |
| WO | 2014195350 | A1 | | 12/2014 | |
| WO | 2015001067 | A1 | | 1/2015 | |
| WO | 2015014584 | A1 | | 2/2015 | |
| WO | 2015028639 | A1 | | 3/2015 | |
| WO | 2015066566 | A1 | | 5/2015 | |
| WO | 2015104246 | A1 | | 7/2015 | |
| WO | 2015140789 | A1 | | 9/2015 | |
| WO | 2017012514 | A1 | | 1/2017 | |

OTHER PUBLICATIONS

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; Declaration of Michael Lebby, Current Lighting EX1002.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; Declaration of Sylvia D Hall-Ellis, Current Lighting EX1038.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; FETs-Arrays, Discrete Semiconductor Products, DigiKey, Current Lighting EX1011.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; EtKina, Light-Emitting Diodes: Exploration Underlying Physics, Current Lighting EX1016.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; Fairchild Semiconductor, Current Lighting EX1012.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; High Power LED and DC/DC-Driver Applications, Current Lighting EX1019.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; or Gate, Current Lighting EX1023.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; Relaxation Oscillator, Current Lighting EX1024.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; Calculating LED current limiting resistor, Current Lighting EX1015.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; T8 Fluorescent Lamps vs. T8 LED Tubes, Current Lighting EX1013.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; Ring Oscillators: Characteristics and applications, Current Lighting EX1018.

*Current Lighting Solutions, LLC d/b/a GE Current*, Petitioner, v. *Jiaxing Super Lighting Electric Appliance Co., LTD*, Patent Owner, Inter Partes Review No. IPR2023-00676 U.S. Pat. No. 9,939,140, Petition for Inter Partes Review Under 35 USC §312 Mar. 22, 2023; Two Types of Connections, Current Lighting EX1022.

Cree announces residential-targeted LED T8, new rural outdoor, Jul. 20, 2020.

Show Colors True and Natural, Jul. 20, 2020.

Hands-on testing of popular LED T8 lamps and linear fixtures reveals promises and pitfalls (Magazine), Jul. 20, 2020.

(56) References Cited

OTHER PUBLICATIONS

Cree Recalls LED T8 Lamps Due to Burn Hazard; Includes T8 Lamps Provided as Replacements in Previous Recall, Jul. 20, 2020.
Cree LED T8 Replacement Lamp—General Information, Jul. 20, 2020.
*Current Lighting Solutions, LLC d/b/a GE Current*, Petitioner, v. *Jiaxing Super Lighting Electric Appliance Co., LTD*, Patent Owner, Petition Under 35 USC §312, Inter Partes Review No. IPR2023-00984, U.S. Pat. No. 9,841,174, Jun. 9, 2023.
Disputed_terms_MaxliteEX1025.
LebbyDeclaration_Expert_CurrentLightingEX1002.
Self_Ballasted_Lamps_and_LampAdapters_ULwbsite_CurrentLightingEX1033.
UL 1993_self_Ballasted_Lamps_and_LampAdapters_CurrentLightingEX1007.
Defendant Maxlite, Inc.'s Preliminary Noninfringement and Invalidity Contentions Pursuant to Court's Order, May 19, 2020.
Defendant Maxlite, Inc.'s Preliminary Noninfringement and Invalidity Contentions for Plaintiffs' 35 Elected Claims Pursuant to Court's Order, Jul. 20, 2020.

* cited by examiner

LED LAMP AND MISUSE WARNING MODULE THEREOF

TECHNICAL FIELD

The present disclosure relates to the technical field of LED lighting, specifically relating to an LED lamp and a misuse warning module.

BACKGROUND

LED lamps gradually replace fluorescent lamps as the fourth generation of lighting products because of their high efficiency and environmental protection characteristics.

One type of LED tube lamp directly uses the mains electricity as power supply, and this type of LED tube lamp (e.g., T5 or T8 type lamp) may have potential safety hazards during installation. That is, if one pin at one end of the lamp has been connected to the mains electricity, there can be a risk of electric shock when the construction personnel contact the pin at the other end of the lamp.

In order to ensure the safety of construction personnel, the installation detection module is generally set on the lamp, which generally includes two types, mechanical type or electronic type. The mechanical installation detection module is equipped with a mechanical device on the lamp head, and only after the tube lamp is correctly loaded into the lamp holder will the pin be connected to the power to prevent electric shock during the installation process. On the other hand, when the lamp is powered on, the electronic installation detection module conducts the power loop for only a very short period for detection. During this detection conduction, the electronic installation detection module determines whether the lamp is installed correctly/properly based on the current level or the voltage level in the circuit. When it is detected that a human body is connected to the power loop, the electronic installation detection module would disconnect the power loop to ensure human safety.

When such electronic installation detection module is powered by an emergency ballast, since the emergency ballast provides a DC power supply signal, there is no risk of electric shock even if the installer touches the lamp pin. In addition, this DC power supply signal may cause the installed detecting module fail to detect normally, and the LED lamp may not light up normally.

When the LED lamp that is configured to be supplied by mains electricity is connected to an incompatible external power supply signal, such as an electronic ballast or an inductive ballast, the LED lamp may not work properly or even burn out. Generally, specific wiring method will be clearly informed of the user in the installation manual of the lamp, but it is still impossible to avoid the misuses from users.

When the impedance of the power loop is larger, the electronic installation detection module may mistakenly determine the impedance of the power loop as a human body connected to the power loop. In this case, the LED lamp cannot be lit normally.

Furthermore, the driving power used in traditional lamps includes inductive ballasts and electronic ballasts. When replacing the traditional lamps with the new LED lamps, if the original ballasts are not removed together with the traditional lamps, the LED lamps may not be able to light up. Or worse, the LED lamps would burn or even catch fire.

SUMMARY

It is noted that the present disclosure may include one or more inventions claimed currently or not yet claimed, and for avoiding confusion due to unnecessarily distinguishing between those possible inventions at the stage of preparing the specification, the possible plurality of inventions herein may be collectively referred to as "the (present) disclosure" herein.

The present disclosure provides a misuse warning module. The misuse warning module includes a detection circuit and a warning circuit. The detection circuit is electrically connected to a power loop of a LED lamp and configured to detect a type of an external power supply signal and current level of the power loop to generate a detection signal. The warning circuit is configured to receive the detection signal and generate a warning when the LED light is not properly installed.

In some embodiments of the present disclosure, the detection circuit includes a first detection circuit, electrically connected to the power loop of the LED lamp and configured to detect the current level of the power loop, output a first detection signal when the current level is greater than a set threshold, and output a second detection signal when the current level is lower than or equal to the set threshold.

In some embodiments of the present disclosure, the detection circuit further includes a second detection circuit, electrically connected to an input of an external power supply, and configured to output a third detection signal when the external power supply signal is a DC signal.

In some embodiments of the present disclosure, the detection circuit further includes a third detection circuit, electrically connected to the input of the external power supply, and configured to output a fourth detection signal when the external power supply signal is provided by an electronic ballast, wherein the third detection circuit determines whether the external power supply signal is provided by the electronic ballast by detecting at least one of frequency, phase, and amplitude of the external power supply signal.

In some embodiments of the present disclosure, the first detection circuit includes: a detection pulse generating module, configured to generate a pulse signal; a switching circuit, coupled to the power loop, and configured to conduct or cut off based on the pulse signal; and a detection determining circuit, configured to detect the current level of the power loop when the switching circuit is conducted, output the first detection signal when the current level is greater than the set threshold and output the second detection signal when the current level is lower than or equal to the set threshold.

In some embodiments of the present disclosure, the switching circuit is configured to conduct based on the first detection signal and/or the third detection signal.

In some embodiments of the present disclosure, the warning circuit is configured to instruct the switching circuit to be intermittently conducted based on the second detection signal and/or the fourth detection signal to cause the LED light to flash.

In some embodiments of the present disclosure, the switching circuit is configured to cut off based on the second detection signal and/or the fourth detection signal, and the warning circuit is configured to generate the warning based on the second detection signal and/or fourth detection signal.

In some embodiments of the present disclosure, the warning circuit includes at least one of: a buzzer, a warning light, wherein the buzzer or the warning light is configured to generate a warning based on the second detection signal.

In some embodiments of the present disclosure, the misuse warning module further includes a current limiting circuit, connected in series to the power loop, for conducting the power loop based on the first detection signal and/or third detection signal, and intermittently conducting the power loop based on the second detection signal and/or the fourth detection signal to make the LED light flash.

In some embodiments of the present disclosure, the misuse warning module further includes a current limiting circuit, connected in series to the power loop and configured to conduct the power loop based on the first detection signal and/or third detection signal, and cut off the power loop based on the second detection signal and/or fourth detection signal, the warning circuit is configured to generate the warning based on the second detection signal and/or the fourth detection signal.

In some embodiments of the present disclosure, the warning circuit includes at least one of a buzzer or a warning light, wherein the buzzer or the warning light is configured to generate a warning based on the second detection signal.

The present disclosure provides an LED lamp, including: at least two pins, a first pin and a second pin, configured to receive an external driving signal; a power supply module, electrically connected to the first pin and the second pin, and configured to execute power conversion of the external driving signal to generate a driving signal; an LED module, configured to receive the driving signal to light up; an installation detection module, configured to detect current in a power loop and determine whether to limit the current of the power loop based on the current level of the power loop; an impedance adjusting module, electrically connected to the first pin and the second pin, and configured to adjust impedance of the power loop to affect the determination of the installation detection module, wherein when a first resistor is connected in series in the power loop, the installation detection module limits the current of the power loop and the LED lamp cannot be lit normally; and when at least two or more of the LED lamps are connected in parallel, the installation detection module does not limit the current of the power loop and the plurality of the LED lights are lit normally; and wherein, the external power supply signal is supplied to the LED lamp through the power loop, and the first resistor is connected in series with the plurality of LED lamps.

In some embodiments of the present disclosure, the resistance of the first resistor is 100-500 ohms.

In some embodiments of the present disclosure, the impedance adjusting module comprises a first capacitor, a first pin of the first capacitor is electrically connected to the first pin, and a second pin of the first capacitor is electrically connected to the second pin.

In some embodiments of the present disclosure, the capacitance of the first capacitor is 30-50 nF.

In some embodiments of the present disclosure, the capacitance of the first capacitor is 47 nF.

In some embodiments of the present disclosure, the installation detection module includes: a detection pulse generating module, configured to generate a pulse signal; a switching circuit, coupled to the power loop, and configured to conduct or cut off based on the pulse signal; and a detection determining circuit, configured to detect current level of the power loop when the switching circuit is conducted and output the first detection signal when the current level is greater than a set threshold, wherein the switching circuit is turned on based on the first detection signal.

Various embodiments are summarized in this section and may be described with respect to the "present disclosure," which terminology is used to describe certain presently disclosed embodiments, whether claimed or not, and is not necessarily an exhaustive description of all possible embodiments, but rather is merely a summary of certain embodiments. Certain of the embodiments described below as various aspects of the "present disclosure" can be combined in different manners to form an LED tube lamp or a portion thereof.

DESCRIPTION OF DRAWINGS

FIG. 22B is a block diagram of a signal processing unit according to an exemplary embodiment is illustrated.

FIG. 22C is a block diagram of a signal generating unit according to an exemplary embodiment is illustrated.

FIG. 22D is a block diagram of a signal capturing unit according to an exemplary embodiment is illustrated.

FIG. 22E is a block diagram of a switch unit according to an exemplary embodiment is illustrated.

FIG. 22F is a block diagram of an internal power detection unit according to an exemplary embodiment is illustrated.

FIG. 37B is a schematic circuit diagram of the detection pulse generating module according to some embodiments.

FIG. 37C is a schematic circuit diagram of the detection path circuit according to some embodiments.

FIG. 56 is a schematic diagram of the circuit structure of a LED lamp 200 according to some embodiments.

FIGS. 57A-57B are flowcharts of the action flows of a LED lighting system according to some embodiments.

DETAILED DESCRIPTION

Figure 1A:
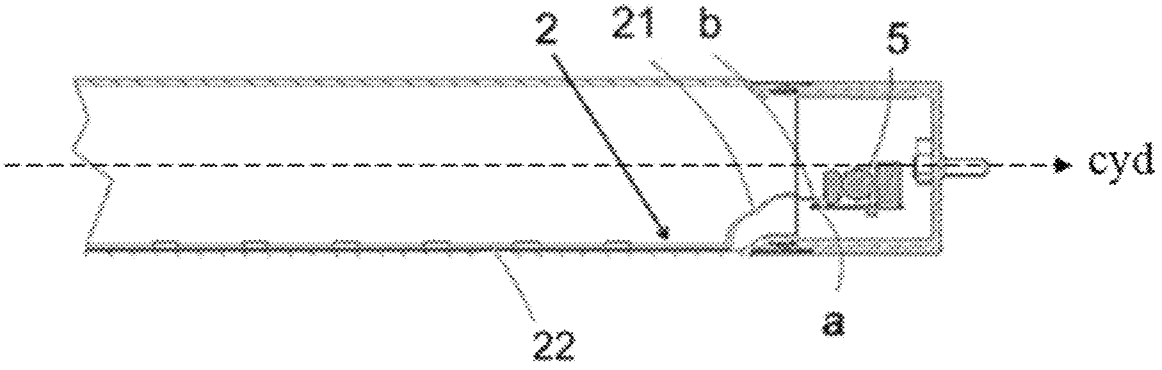
FIGS. 1A-1C are planar cross-sectional views each schematically illustrating an LED light strip and a power supply module both disposed in a lamp tube of an LED tube lamp according to some exemplary embodiments.

The present disclosure provides a novel LED tube lamp. The present disclosure will now be described in the following embodiments with reference to the drawings. The following descriptions of various embodiments of this disclosure are presented herein for purpose of illustration and giving examples only. It is not intended to be exhaustive or to be limited to the precise form disclosed. These example embodiments are just that—examples—and many implementations and variations are possible that do not require the details provided herein. It should also be emphasized that the disclosure provides details of Alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the disclosure.

In the drawings, the size and relative sizes of components may be exaggerated for clarity. Like numbers refer to like elements throughout.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present disclosure. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct connection (i.e., touching) unless the context indicates otherwise.

Embodiments described herein will be described referring to plane views and/or cross-sectional views by way of ideal schematic views. Accordingly, the exemplary views may be modified depending on manufacturing technologies and/or tolerances. Therefore, the disclosed embodiments are not limited to those shown in the views but include modifications in configuration formed on the basis of manufacturing processes. Therefore, regions exemplified in figures may have schematic properties, and shapes of regions shown in figures may exemplify specific shapes of regions of elements to which aspects of the disclosure are not limited.

Spatially relative terms, such as "beneath," "below," "lower," "above," "upper" and the like, may be used herein for ease of description to describe one elements or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Terms such as "transistor", used herein may include, for example, a field-effect transistor (FET) of any appropriate type such as N-type metal-oxide-semiconductor field-effect transistor (MOSFET), P-type MOSFET, GaN FET, SiC FET, bipolar junction transistor (BJT), Darlington BJT, hetero junction bipolar transistor (HBT), etc.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present disclosure, and will not be interpreted in an idealized or overly formal sense unless expressly so defined herein.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, etc. As such, directly electrically connected components do not include components electrically connected through active elements, such as transistors or diodes, or through capacitors. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or board does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to any material that provides incidental heat conduction but are intended to refer to materials that are typically known as good heat conductors or known to have utility for transferring heat, or components having similar heat conducting properties as those materials.

Embodiments may be described, and illustrated in the drawings, in terms of functional blocks, units and/or modules. Those skilled in the art will appreciate that these blocks, units and/or modules are physically implemented by electronic (or optical) circuits such as logic circuits, discrete components, analog circuits, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules. Further, the blocks, units and/or modules of the various embodiments may be physically combined into more complex blocks, units and/or modules.

If any terms in this application conflict with terms used in any application(s) from which this application claims priority, or terms incorporated by reference into this application or the application(s) from which this application claims priority, a construction based on the terms as used or defined in this application should be applied.

It should be noted that, the following description of various embodiments of the present disclosure is described herein in order to clearly illustrate the inventive features of the present disclosure. However, it is not intended that various embodiments can only be implemented alone. Rather, it is contemplated that various of the different embodiments can be and are intended to be used together in a final product and can be combined in various ways to achieve various final products. Thus, people having ordinary skill in the art may combine the possible embodiments together or replace the components/modules between the different embodiments according to design requirements. The embodiments taught herein are not limited to the form described in the following examples, any possible replacement and arrangement between the various embodiments are included.

Although Applicant of this disclosure had presented improvements by utilizing a bendable circuit sheet to reduce the incidence of leakage current accidents in previous disclosures, such as the features disclosed in the China Application CN105465640U, some embodiments of improvements can be used in conjunction with the features disclosed in this disclosure by connecting through electrical circuits achieve more significant improvements.

FIG. 1A is a plane cross-sectional view schematically illustrating an LED tube lamp including an LED light strip and a power supply module according to some exemplary embodiments. Referring to FIG. 1A, an LED tube lamp may include an LED light strip 2 and a power supply 5, in which the power supply 5 can be a modularized element, which means the power supply 5 can be integrated into a single power supply circuit or can be integrated into several separated power supply circuits. For example, in an embodiment, the power supply 5 can be a single unit (i.e., all components of the power supply 5 are disposed on a single body/carrier) disposed in one of the end caps at one end of the lamp tube. In another embodiment, the power supply 5 can be two separate units (i.e., the components of the power supply 5 are divided into two parts) disposed in different end caps at respective ends of the lamp tube.

In the embodiment of FIG. 1A, the power supply 5 is illustrated as being integrated into one module for example (hereinafter referred to as a power supply module 5) and is disposed in the end cap parallel to the axial direction cyd of the lamp tube. More specifically, the axial direction cyd of the lamp tube, which refers to the direction pointed to by the axis of the lamp tube, is perpendicular to the end wall of the end caps. Disposing the power supply module 5 parallel to the axial direction cyd means the circuit board, with the electronic components of the power supply module, is parallel to the axial direction cyd. Therefore, the normal direction of the circuit board is perpendicular to the axial direction cyd. In certain embodiments, the power supply module 5 can be arranged in a position where the axial direction cyd passes, in a position above the axial plane/axial direction cyd, or in a position below the axial plane/axial direction cyd (relative to the figure). The disclosure is not limited thereto.

Figure 1B:
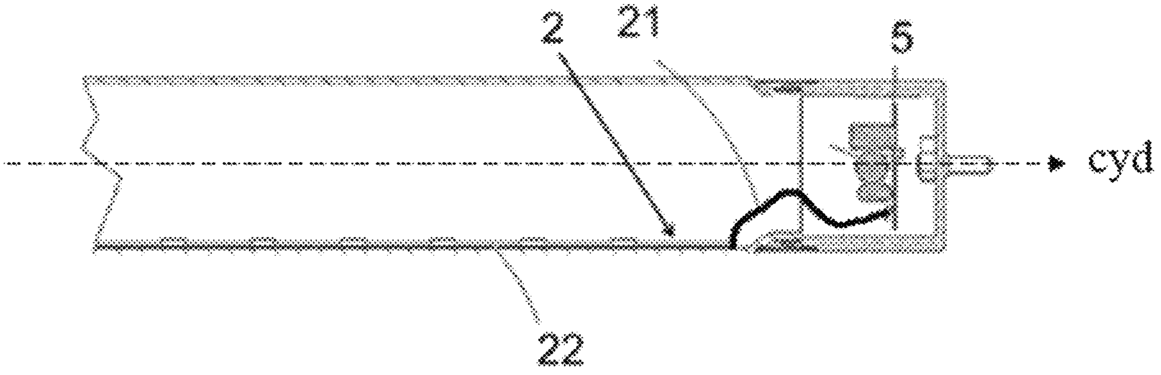

FIG. 1B is another plane cross-sectional view schematically illustrating an LED tube lamp including an LED light strip and a power supply module according to some exemplary embodiments. Referring to FIG. 1B, the difference between the embodiments of FIGS. 1A and 1B is that the power supply module 5 illustrated in FIG. 1B is disposed in the end cap perpendicular to the axial direction cyd of the lamp tube. For example, the power supply module 5 is disposed parallel to the end wall of the end caps. Although the FIG. 1B shows that the electronic components are disposed on the side facing the interior of the lamp tube, the disclosure is not limited thereto. In certain embodiments, the electronic component can be disposed on the side facing the end wall of the corresponding end cap. Under these configurations, since at least one opening can be formed in the end wall of the end caps, the heat dissipation effect of the electronic components can be improved through the opening.

Figure 1C:
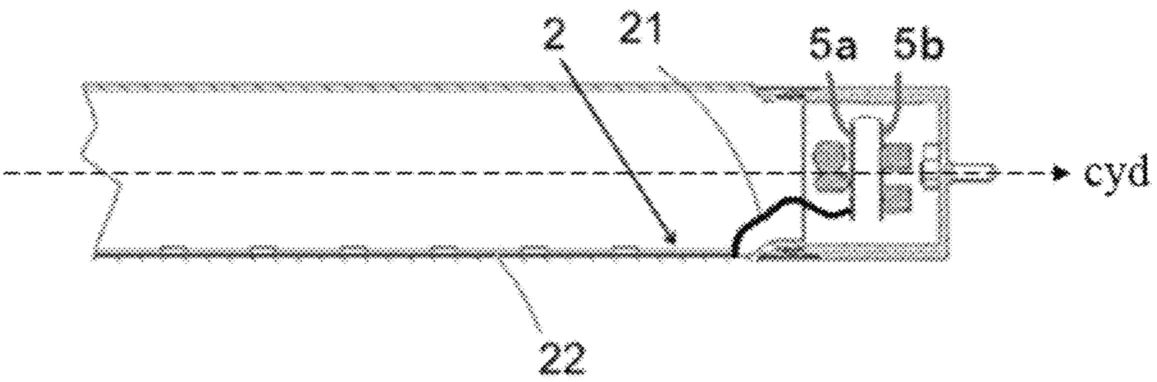

In addition, due to the power supply module 5 being vertically disposed in the end caps, the space within the end caps can be increased so that the power supply module 5 can be further divided into a plurality of separated circuit boards as shown in FIG. 1C. FIG. 1C is still another plane cross-sectional view schematically illustrating an LED tube lamp including an LED light strip and a power supply module according to some exemplary embodiments. The difference between the embodiments of FIGS. 1B and 1C is that the power supply 5 is formed by two power supply modules 5*a* and 5*b*. The power supply modules 5*a* and 5*b* are disposed in the end cap perpendicular to the axial direction cyd and are arranged, toward to the end wall of the end cap, along the axial direction cyd. Specifically, power supply modules 5*a* and 5*b* are respectively provided with each having an independent circuit board. The circuit boards are connected to each other through one or more electrical connection means, so that the overall power supply circuit topology is similar to the embodiment illustrated in FIG. 1A or FIG. 1B. According to the configuration of FIG. 1C, the space within the end caps can be more effectively utilized, such that the circuit layout space can be increased. In some certain embodiments, the electronic components generating more heat (e.g., the capacitor and the inductor) can be disposed on the power supply module 5*b*, which is close to the end wall, so as to enhance the heat dissipation effect of the electronic components through the opening on the end cap.

In terms of the connection between the power supply modules 5*a* and 5*b*, the power supply modules 5*a* and 5*b* that are separated from each other can be connected by male and female plugs, or by wire bonding, where the outer layer of the wire can be wrapped with an insulation sleeve as electrical insulation protection. In addition, the power supply module 5*a* and 5*b* can be directly connected to each other by rivet installation, solder paste bonding, soldering, or bundling with wires.

Figure 2:
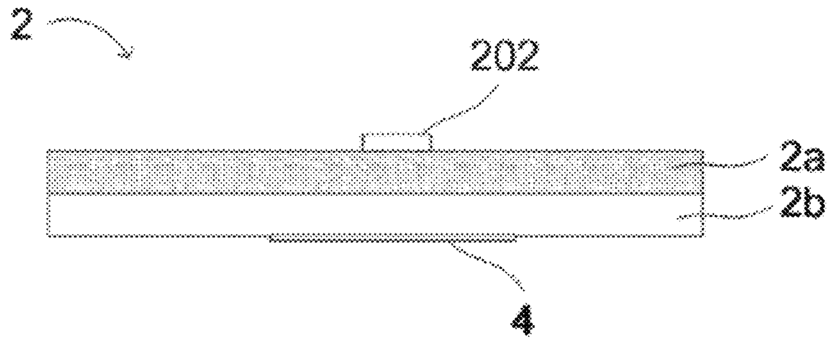
FIG. 2 is a planar sectional view of a light strip of an LED tube lamp according to some exemplary embodiments.

Referring to FIG. 2, to form an LED light strip 2, a bendable circuit sheet includes a wiring layer 2*a* with conductive effect. An LED light source 202 is disposed on the wiring layer 2*a* and is electrically connected to the power supply through the wiring layer 2*a*. Referring to FIG. 2 again, in one embodiment, the LED light strip 2 includes a bendable circuit sheet having a conductive wiring layer 2*a* and a dielectric layer 2*b* that are arranged in a stacked manner. In some embodiments, the wiring layer 2*a* and the dielectric layer 2*b* may have the same areas or the area of the wiring layer 2*a* may slightly be smaller than that of the dielectric layer 2*b*. The LED light source 202 is disposed on one surface of the wiring layer 2*a*, the dielectric layer 2*b* is disposed on the other surface of the wiring layer 2*a* that is away from the LED light sources 202 The wiring layer 2*a* is electrically connected to a power supply 5 (as shown in FIG. 1) to carry direct current (DC) signals. In some embodiments, the surface of the dielectric layer 2*b* away from the wiring layer 2*a* is fixed to an inner circumferential surface of a lamp tube, for example, by means of an adhesive sheet 4. The portion of the dielectric layer 2*b* fixed to the inner circumferential surface of the lamp tube 1 may substantially conform to the shape of the inner circumferential surface of the lamp tube 1. The wiring layer 2*a* can be a metal layer or a power supply layer including wires such as copper wires.

In some embodiments, the outer surface of each of the wiring layer 2*a* and the dielectric layer 2*b* can be covered with a circuit protective layer, wherein the circuit protective layer can be an ink material having the functions of weld resistant and reflection improvement. As another example, the bendable circuit sheet can be a one-layer structure comprising one layer of wiring layer 2*a* having the outer surface thereof covered with the circuit protective layer made of such ink material. Opening(s) can be disposed on the circuit protective layer such that a light source can be electrically connect to the wiring layer 2*a* through the opening(s). No matter whether the bendable circuit sheet is a one-layer structure or a two-layer structure (e.g., including one wiring layer 2*a* and one dielectric layer 2*b*), a circuit protective layer can be disposed thereon. In some embodiments, the circuit protective layer can be disposed only on one side/surface of a bendable circuit sheet, such as disposed only on the surface having LED light source(s) 202. It is noted that the embodiment of a bendable circuit sheet being one wiring layer 2*a* or a two-layer structure (e.g., including one wiring layer 2*a* and one dielectric layer 2*b*) can be significantly more bendable or flexible to curl when compared to a conventional three-layer flexible substrate (one dielectric layer sandwiched between two wiring layers). As a result, the embodiment of a bendable circuit sheet being one wiring layer 2*a* or a two-layer structure can be adopted with a lamp tube 1 with a customized shape or non-tubular shape (such as not of a straight tube lamp), and be firmly mounted to the inner surface of the lamp tube 1. In addition, in some preferable arrangements, the bendable circuit sheet is closely/firmly mounted to the inner surface of the lamp tube. Moreover, the fewer layers the bendable circuit sheet includes, the more the heat dissipation is improved, the lower the material cost is, the more friendly to the environment, and the more the chances to improve the flexible effect.

Properly, the bendable circuit sheet disclosed herein is not limited to being one-layered or two-layered. In some embodiments, the bendable circuit sheet may include multiple wiring layers 2*a* and multiple dielectric layers 2*b*, the dielectric layers 2*b* and the wiring layers 2*a* are sequentially stacked in a staggered manner, a dielectric layer 2*b* is disposed on a surface opposite to the wiring layer 2*a* and the LED light sources 202, where the LED light sources 202 are disposed on an uppermost layer of the multiple wiring layers 2*a* in order to electrically connect to a power supply through the uppermost layer of the multiple wiring layers 2*a*. In some embodiments, an axial projection of the length of the bendable circuit sheet as a light strip 2 is longer than the length of the lamp tube.

Figure 3:
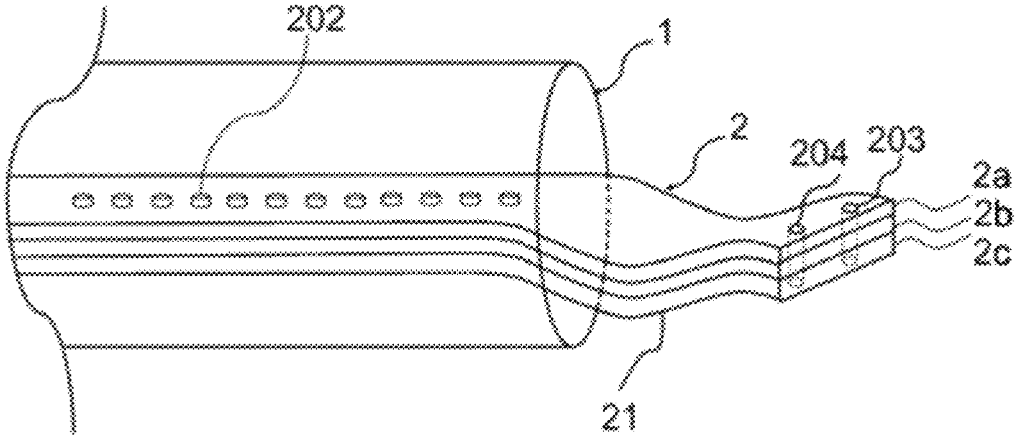
FIG. 3 is a perspective view of a light strip of an LED tube lamp according to some exemplary embodiments.

FIG. 3 is a perspective view of a light strip of an LED tube lamp according to some exemplary embodiments. Referring to FIG. 3, in one of the embodiments, a bendable circuit sheet as a light strip 2 includes, in sequence from the top, a first wiring layer 2*a*, a dielectric layer 2*b*, and a second wiring layer 2*c*. In one example, the thickness of the second wiring layer 2*c* is larger than that of the first wiring layer 2*a*, and an axial projection of the length of the light strip 2 is larger than the length of the lamp tube 1, wherein a LED light source 202 is disposed on the light strip 2 and an end region of the light strip 2 is extended beyond the end portion of the lamp tube 1. The first wiring layer 2*a* and the second wiring layer 2*c* can be electrically connected through two through holes 203 and 204 respectively, and the through holes 203 and 204 are not connected to each other to avoid short circuiting.

In this way, the larger thickness of a second wiring layer 2*c* (than that of a first wiring layer 2*a*) serves for the second wiring layer 2*c* to support the first wiring layer 2*a* and the dielectric layer 2*b*, and meanwhile causes the LED light strip 2 not to be shifted or deformed when LED light strip 2 is attached/mounted onto the inner circumferential surface inside the lamp tube 1, and thus the yield rate of production of such an LED tube lamp can be improved. In addition, a first wiring layer 2*a* and a second wiring layer 2*c* are configured to be electrically connected such that the circuit layout on the first wiring layer 2*a* can be extended to the second wiring layer 2*c* to allow the overall circuit layout of a LED light strip 2 to be more diverse. Moreover, since the circuit layout becomes two-layered instead of one-layered, the area of each wiring layer or the longitudinal width of a LED light strip 2 can be reduced such that the number of LED light strips 2 per batch of die bonding process can be increased and productivity can be improved thereby.

Further, in some embodiments, a LED light source 202 is disposed on the light strip 2 and an end region of the light strip 2 is extended beyond the end portion of the lamp tube 1. This arrangement can also be used to accomplish a circuit layout of a power supply module that the power supply module can be directly disposed on the bendable circuit sheet.

In a case where two ends of an LED light strip 2, along axial direction of a lamp tube 1, are detached from or not mounted on the inner circumferential surface of the lamp tube 1 and where the LED light strip 2 is connected to a power supply 5 via wire-bonding. Since these two ends are not fixed securely, any movements in subsequent transportation of the lamp tube 1 including the LED light strip 2 are likely to cause shaking and the bonded wires may detach from the two ends of the LED light strip 2. Therefore, a preferable implementation for the connection between an LED light strip 2 and a power supply 5 is by soldering.

Figure 4:
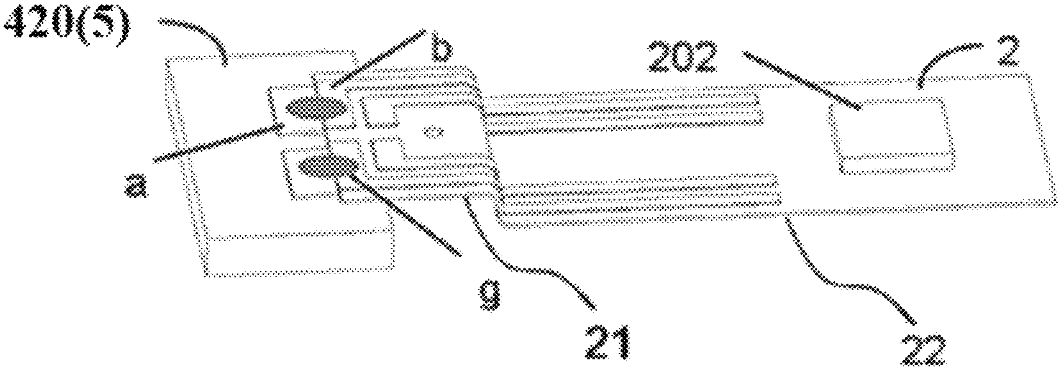
FIG. 4 is a perspective view of a light strip and a printed circuit board of a power supply module in an LED tube lamp according to some exemplary embodiments.

FIG. 4 is a perspective view of a light strip of an LED tube lamp and a printed circuit board of a power supply module according to some exemplary embodiments. Referring to FIG. 4, a concrete implementation is to arrange an output terminal of the power supply 5 to have power supply soldering pads "a" provided with an amount of solder (e.g., tin solder) with sufficient thickness convenient for soldering, and correspondingly to arrange the end(s) of the LED light strip 2 to have light source soldering pads "b", then the power supply soldering pads "a" on the output terminal of the power supply 5 are soldered to the light source soldering pads "b" on the LED light strip 2. Considering that the side where the soldering pads are located is defined as the front side, the connection between the LED light strip 2 and the power supply 5 may be firmest if the soldering pads "a" and the soldering pads "b" are positioned in manner of front-side facing front-side in soldering the soldering pads "a" and the soldering pads "b" to each other. However, typically in practical implementation, the soldering head would be configured to be pressed on the back/rear surface of the LED light strip 2 and heat the tin solder through the LED light strip 2 intervening between the soldering head and the tin solder, and reliability problems may occur thereby. In some embodiments, a through hole may be formed in the middle of the front side of the light source soldering pad(s) "b" on the LED light strip 2 to allow the front side of the light source soldering pads "b" to be overlaid with the power supply soldering pads "a" on the front side of the power supply 5, and thus the soldering head is able to directly press and melt the tin solder during soldering the power supply soldering pads "a" and the light source soldering pads "b", which is easier to implement in practical application.

Referring again to FIG. 4, in the above-described embodiments, most part of the bendable circuit sheet as an LED light strip 2 are fixed in the inner circumferential surface of the lamp tube 1, only two ends of the bendable circuit sheet as an LED light strip 2 are detached from the inner circumferential surface of the lamp tube 1 (as shown in FIG. 3) and these two ends form freely extending portions 21 (as shown in FIGS. 1A-1C and 3), while most of the LED light strip 2 is attached and secured to the inner circumferential surface of the lamp tube 1 and forms a fixed portion 22. The freely extending portion 21 has the light source soldering pads "b" as mentioned above. In one embodiment, one end of the freely extending portion 21 is soldered to the power supply 5, and the other end of the freely extending portion 21 is extended and integrally connected to the fixed portion 22. The portions of a freely extending portion 21 between its two ends are not attached to the inner circumferential surface of the lamp tube 1, which means, the middle section of the freely extending portion 21 is in a state of hanging (i.e., not fixedly held by the lamp tube 1). During assembling of the LED tube lamp, the end of a freely extending portion 21 soldered to the power supply 5 would lead or drive the freely extending portion 21 to be coiled, curled up or deformed to be fittingly accommodated inside the lamp tube 1. It is noted that when the bendable circuit sheet as the LED light strip 2 includes in sequence a first wiring layer 2*a*, a dielectric layer 2*b*, and a second wiring layer 2*c*, as shown in FIG. 3, the end regions of the LED light strip 2 extending beyond end portions of the lamp tube 1 and not bearing LED light sources 202 can form the freely extending portions 21, allowing the freely extending portions 21 to be configured for the connection between the first wiring layer 2*a* and the second wiring layer 2*c* and for arrangement of circuit layout on a power supply module (of a power supply 5).

Further, in designing the position of conductive pins or external connection terminals of an LED tube lamp, various arrangements of pins may be used, including disposing a single pin on each end of the LED tube lamp (to have two pins in total), or disposing two pins on each end of the LED tube lamp (to have four pins in total). Accordingly, under the configuration of supplying power from two ends of an LED tube lamp, as least one pin at each end can be used to receive an external driving signal. Wires connected to the two pins respectively on two ends of an LED tube lamp, for inputting and transmitting of a signal, are typically referred to as a hot or live wire (generally marked as "L") and a ground or neutral wire (generally marked as "N"), respectively.

Figure 5A:
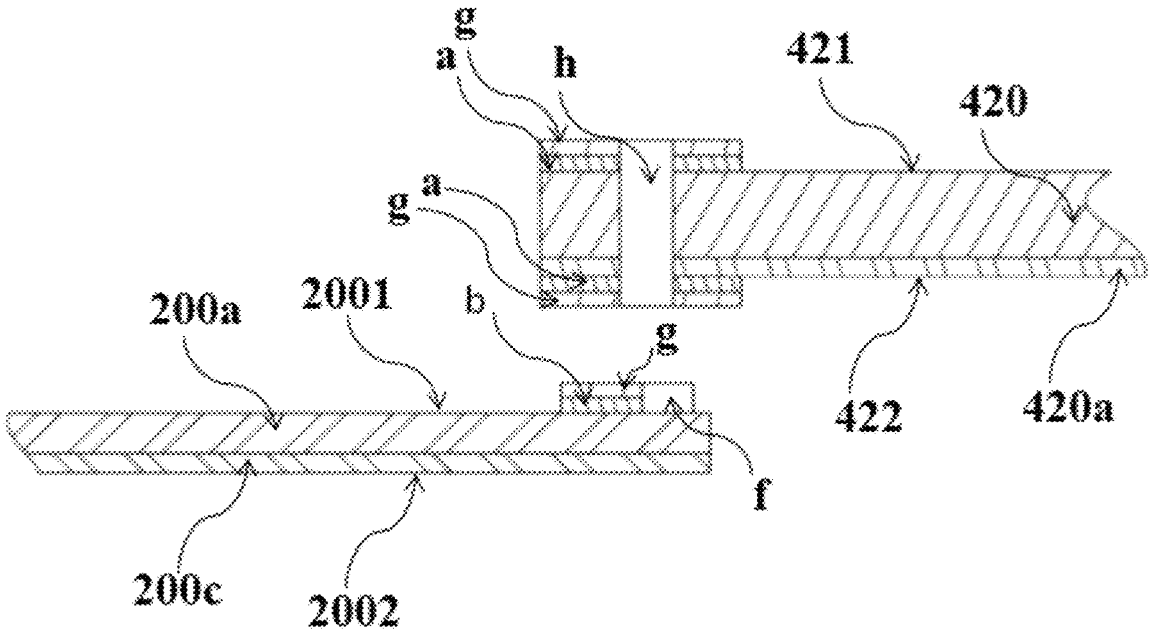
FIGS. 5A to 5C are partial schematic diagrams of a soldering process for soldering a light strip to a power supply module according to some exemplary embodiments.
Figure 5B:
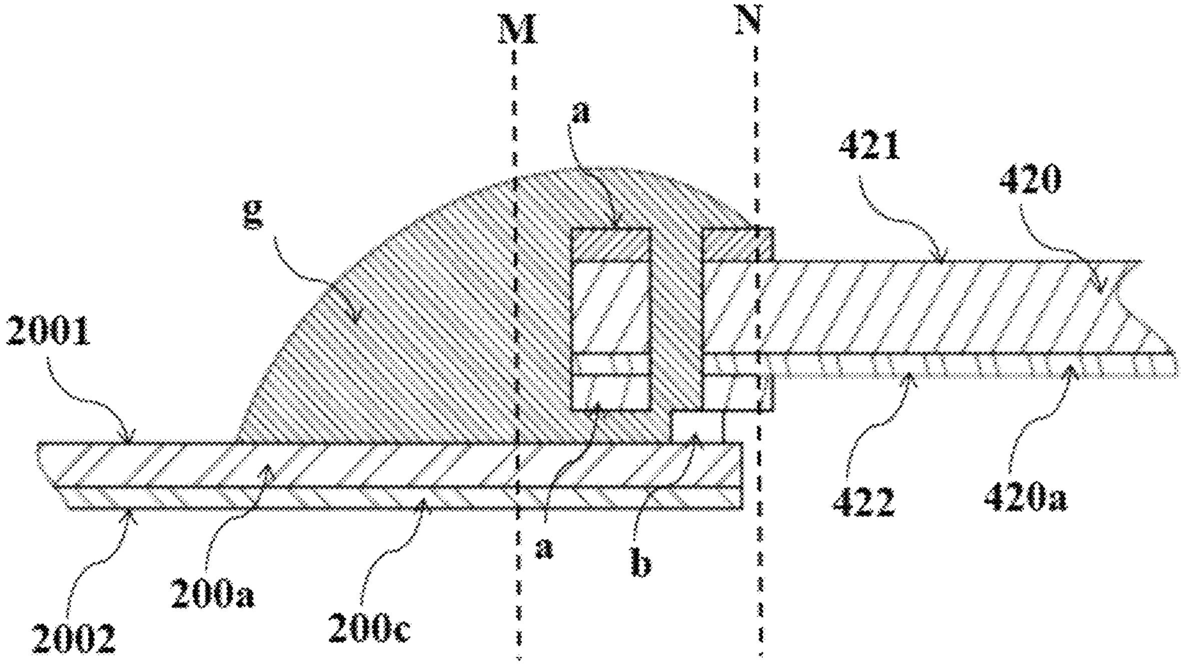
Figure 5C:
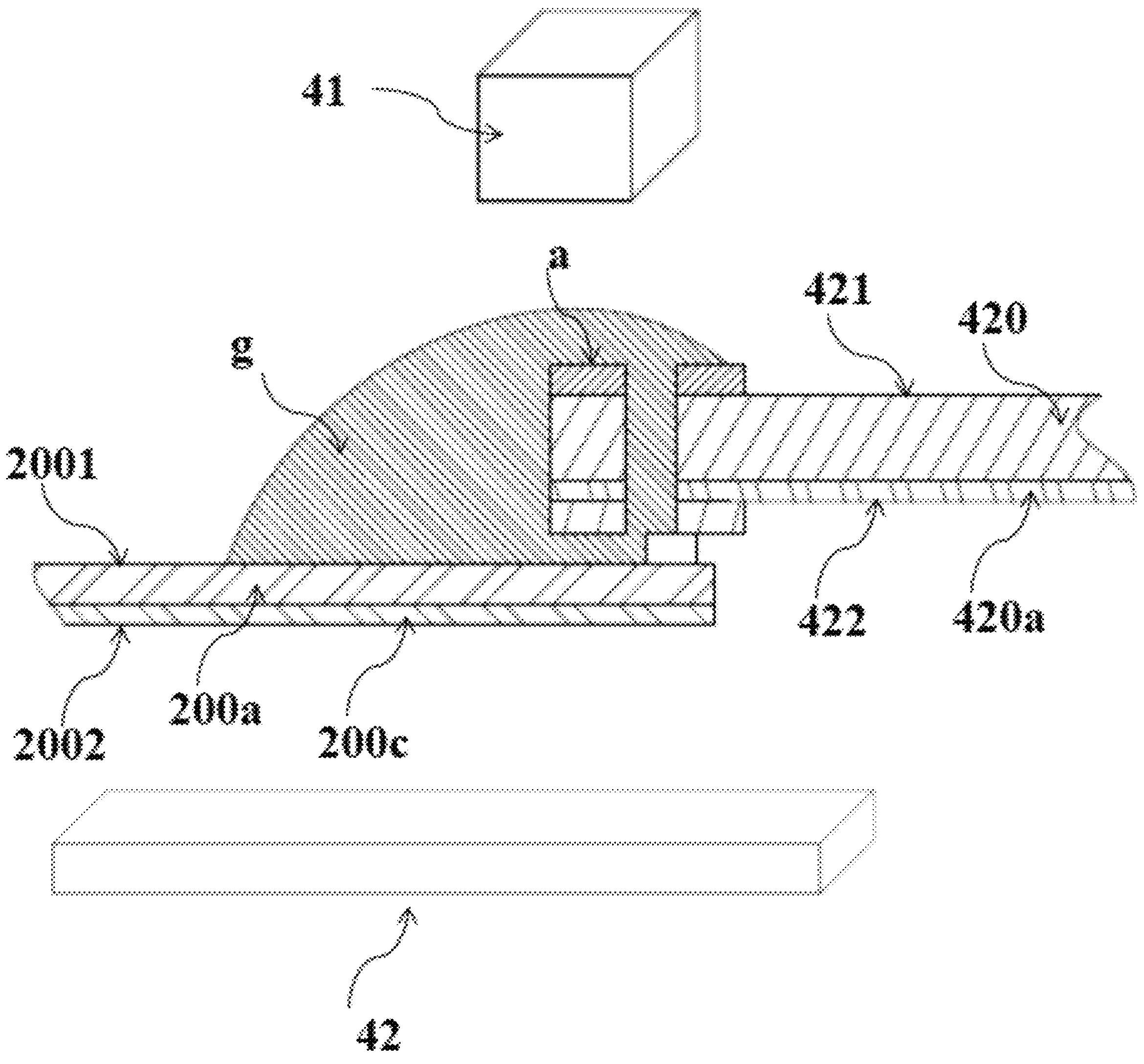

Referring to FIGS. 5A to 5C, FIGS. 5A to 5C are partial schematic diagrams of a soldering process for soldering a light strip with a power supply module according to some exemplary embodiments, which FIGS. 5A to 5C illustrate connection structures and ways of connection between a light strip 2 and a circuit board 420 of a power supply module 5. In some embodiments, the light strip 2 has the same structure as that described in FIG. 4, wherein the freely extending portion is the portions of two opposite ends of the light strip 2 that are configured to connect the circuit board 420, and the fixed portion is the portion of the light strip 2 that attached and secured to the inner circumferential surface of a lamp tube. The light strip 2 is a bendable circuit sheet and comprises a circuit layer 200*a* stacked with a circuit protection layer 200*c*. As described herein, a first surface 2001 is the surface on the circuit layer 200*a* away from the circuit protection layer 200*c*. A second surface 2002 is the surface on the circuit protection layer 200*c* away from the circuit layer 200*a*. That is, the first surface 2001 and the second surface 2002 are the two opposite surfaces on the light strip 2. Several LED light sources 202 are disposed on the first surface 2001 and are electrically connected to circuits in the circuit layer 200*a*. The circuit protection layer 200*c* can be made of polyimide (PI), which has less thermal conductivity but brings protection effects to the circuits. The first surface 2001 of the light strip 2 has soldering pads "b", wherein tin solder "g" can be placed on the soldering pads "b". In one embodiment, a solder end of the light strip 2 further comprises a notch "f". The circuit board 420 comprises a circuit layer 420*a* and the circuit board 420 has two opposite surfaces including a first surface 421 and a second surface 422. The second surface 422 is the side with the circuit layer 420*a* on the circuit board 420. The soldering pads "a" are correspondingly disposed on the first surface 421 and the second surface 422. Tin solder "g" can be formed on the soldering pads "a". In one embodiment, considering optimizations of the stability of soldering and automatic processing, the light strip 2 is disposed below the circuit board 420 (as shown in FIG. 5A), in other words, the first surface 2001 of the light strip 2 is connected to the second surface 422 of the circuit board 420.

As shown in FIG. 5B and FIG. 5C, in an exemplary soldering process of a light strip 2 and a circuit board 420, a circuit protection layer 200*c* of the light strip 2 is placed on a supporting table 42 (i.e., a second surface 2002 of the light strip 2 contacts the supporting table 42) beforehand, allowing the soldering pads "a" on a second surface 422 of the circuit board 420 to directly and sufficiently contact the soldering pads "b" on a first surface 2001 of the light strip 2. And then, a soldering head 41 is pressed onto where the light strip 2 and the circuit board 420 are to be soldered to each other. When soldering, heat from the soldering head 41 is directly transmitted through the first surface 421 of the circuit board 420 to the soldering pads "b" on the first surface 2001 of the light strip 2, and the heat would not be affected by the circuit protection layer 200*c* having less thermal conductivity, therefore the efficiency and stability regarding the soldering process on the connection(s) between the soldering pads "a" and "b" of the circuit board 420 and the light strip 2 is further improved. Meanwhile, the soldering pads "b" on the first surface 2001 of the light strip 2 and the soldering pads "a" on the second surface 422 of the circuit board 420 are contacted and soldered, and the soldering pads "a" on the first surface 421 of the circuit board 420 is contacted with and pressed on by the soldering head 41. As shown in the exemplary embodiment of FIG. 5C, the circuit board 420 and the light strip 2 are firmly soldered together by the soldering material "g". Main connection components among the circuit board 420, light strip 2, and the soldering material "g" and illustrated between the virtual line M and the virtual line N of FIG. 5B, which include, from top to bottom, the soldering pads "a" on the first surface 421 of the circuit board 420, the circuit layer 420*a*, the soldering pads "a" on the second surface 422 of the circuit board 420, the circuit layer 200*a* of the light strip 2, and the circuit protection layer 200*c* of the light strip 2. The connection structure between the circuit board 420 and the light strip 2 arranged in this sequence of components can be firmer and stabler.

In some embodiments, an additional circuit protection layer (e.g., PI layer) can be disposed over the first surface 2001 of the circuit layer 200*a*. In other words, the circuit layer 200*a* can be sandwiched between two circuit protection layers, such that the first surface 2001 of the circuit layer 200*a* is also protected by a circuit protection layer, with only a part of the circuit layer 200*a* (which part has the soldering pads "b") being exposed for being connected to the soldering pads "a" of the circuit board 420. In such case, one part of the bottom of the LED light source(s) 202 would be contacted the circuit protection layer on the first surface 2001 of the circuit layer 200*a*, and another part of the bottom of the LED light source(s) 202 would be contacted the circuit layer 200*a*.

Moreover, according to the design of the embodiments shown in FIG. 5A to FIG. 5C, after soldering material (e.g., tin solder) is placed on the through holes "h" passing through the soldering pads "a" of the circuit board 420, in an automatic soldering process, when the soldering head 41 is automatically pressed down onto the circuit board 420, the placed soldering material on the soldering pads "a" would be pushed into the through holes "h" by the pressed soldering head 41, which may well satisfy the needs in automatic processing.

Figure 5D:
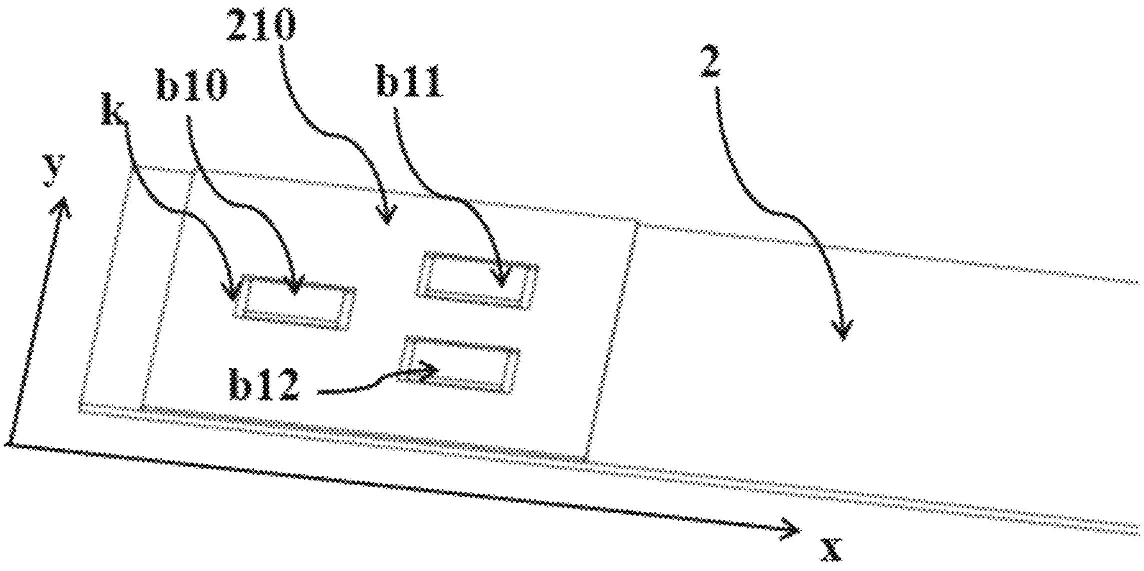
FIG. 5D is a partial schematic diagram of a light strip of an LED tube lamp according to some exemplary embodiments.

FIG. 5D is a partial schematic diagram of a light strip of an LED tube lamp according to some exemplary embodiments, which illustrates a structure of an insulation sheet having hollow hole k disposed on a freely extending portion of a light strip, and the structure is usually used with a light strip 2 having 2 or more soldering pads. Referring to FIG. 5D, the width of the insulation sheet 210 is about the same as that of the light strip 2; the length of the insulation sheet 210 is 1-50 times of that of a soldering pad and is preferably 10 times of that of the soldering pad; the thickness of an insulation sheet 210 is 0.5-5 times of that of the light strip 2 and is preferably the same as that of the light strip 2; and the shape of the hollow hole k on the insulation sheet 210 is about the same as that of a soldering pad. The size of the hollow hole k is slightly larger than that of the soldering pad and is preferably in the range of 101% to 200% of that of a soldering pad. The whole body of the insulation sheet 210 is substantially in the shape of a strip or an oval. Such design as mentioned above can have the following benefit. First, during soldering, the insulation sheet 210 may surround melted soldering material to prevent it from dispersing, thereby reducing the risk of making short circuits between soldering pads during soldering. Second, the ink over the area of soldering between the light strip 2 and a circuit board of a power supply may be damaged so as to cause the risk of exposing the wire below the ink, so disposing an insulation sheet 210 on the area of soldering can reduce the risk of making short circuits during soldering and thus improve reliability of the soldering. Third, Live or Neutral wire (L or N) are disposed on the light strip 2, when a tube lamp including the light strip 2 is connected to electrical power, there would be strong electricity flowing through the strip 2 (e.g., through the N wire); in some cases, the strong electricity may be a high voltage exceeding 300V on an area of soldering between the light strip 2 and the circuit board, causing a breakdown in the ink covering a surface of the light strip 2, which then causes short circuiting between the electrically conductive layer and the circuit board of the power supply below the ink. As a solution, by disposing an insulation component (insulation sheet 210) on the area of soldering, the risk of short circuits is reduced and reliability of such a tube lamp is thus improved.

Figure 5E:
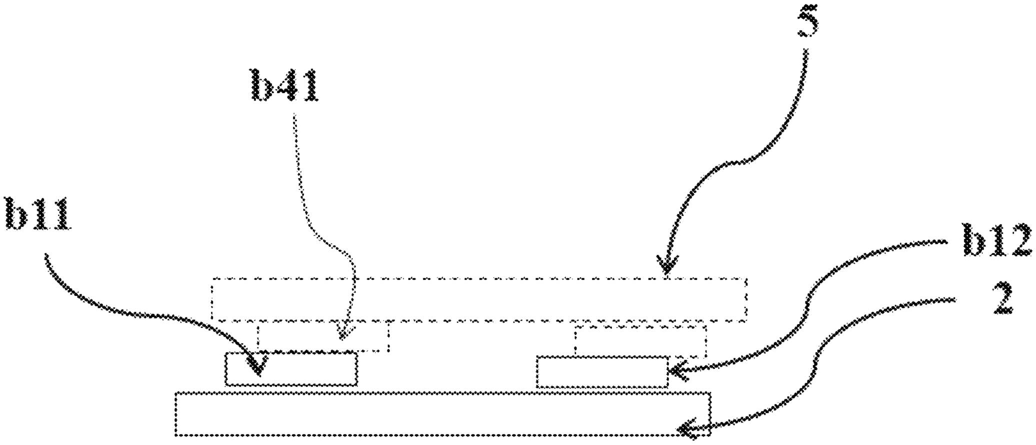
FIG. 5E is a planar sectional view of connecting a light strip to a circuit board of a power supply module in an LED tube lamp according to some exemplary embodiments.

Next, with reference to the combination of FIGS. 5D and 5E, connection between a light strip 2 and a circuit board of a power supply 5 will be described. FIG. 5E is a planar sectional view of the connection of a light strip to a circuit board of a power supply module in an LED tube lamp according to some exemplary embodiments, in which a soldering pad b41 being in a partially shifted position from a soldering pad b11 is illustrated. As shown in FIG. 5D, three soldering pads b10, b11, and b12 are disposed in a freely extending portion of a light strip 2, which are arranged in two rows along y-axis direction, wherein the soldering pad b10 is in a row and the soldering pads b11 and b12 are in another row. Three soldering pads corresponding to the three soldering pads b10, b11, and b12 are disposed at corresponding positions on a circuit board of a power supply (not shown in FIG. 5D). During soldering, the soldering pads of the light strip 2 and the soldering pads of the circuit board of the power supply may be shifted along y-axis direction, so a corresponding soldering pad (b41) disposed on a short-length circuit board of the power supply and for connecting to the soldering pad b11 or b12 may be shifted accordingly, wherein the portion of the soldering pad b41 shifted off relative to the soldering pad b11 is overlaid on a position between the soldering pads b11 and b12.

Since an electrically conductive layer is disposed in the above-described areas and substantial strong current may flow through the electrically conductive layer, in some circumstances, the applied oil ink could be penetrated by high electrical voltage, causing a short circuit between the electrically conductive layer and the soldering pad of the circuit board of the power supply.

In some embodiments, the soldering pad b10 on the light strip 2 is electrically connected to a Live wire or a Neutral wire, the soldering pad b11 corresponds to a first driving output terminal, and the soldering pad b12 corresponds to a second driving output terminal. In some embodiments, the soldering pad b10 on the light strip 2 is electrically connected to a Live wire or a Neutral wire, the soldering pad b11 corresponds to a second driving output terminal, and the soldering pad b12 corresponds to a first driving output terminal. In some embodiments, the soldering pad b10 corresponds to a first driving output terminal, the soldering pad b11 corresponds to a second driving output terminal, and the soldering pad b12 is electrically connected to a Live wire or a Neutral wire. And in some embodiments, the soldering pad b10 corresponds to a first driving output terminal, the soldering pad b12 corresponds to a second driving output terminal, and the soldering pad b11 corresponds to a Live wire or a Neutral wire.

Figure 5F:
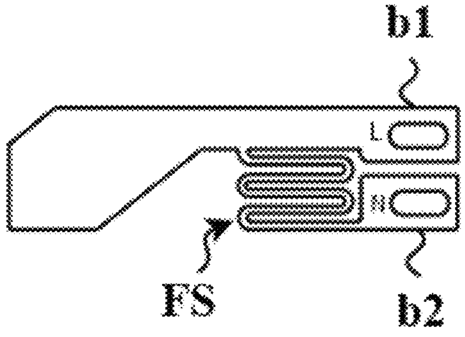
FIG. 5F is a schematic diagram of a partial structure of soldering pad(s) for light sources of an LED tube lamp according to some exemplary embodiments.

FIG. 5F is a plan view of a circuit layout of the LED module according to another embodiment. Referring to FIG. 5F, the soldering pads b1 and b2 of the LED light strip are adapted to solder with the soldering pads of the power supply circuit board. The soldering pads of the present embodiment can be adapted to the dual-end-single-pin configuration, which means the soldering pads at the same side will receive the external driving signal having the same polarity.

Specifically, the soldering pads b1 and b2 are connected to each other via a S-shaped fuse FS, in which the fuse FS is constituted by, for example, a thin wire. In one embodiment, the resistance of the thin wire is extremely low, so that the soldering pads b1 and b2 can be regarded as short-circuit. In the correct application situation, the soldering pads b1 and b2 receive the external driving signal having the same polarity. Even if the soldering pads b1 and b2 are mis-connected to the external driving signal having opposite polarities, the fuse will be fused (e.g., broken) by a large current passing through, thereby preventing the tube lamp from being damaged. In addition, the soldering pad b2 is at the floating state and the soldering pad b1 is still connected to the LED light strip after the fuse FS is fused, therefore, the LED light strip can be continuously used by receiving the external driving signal via the soldering pad b1.

In an exemplary embodiment, the thickness of the soldering pads b1 and b2 and the wiring connected to the soldering pads b1 and b2 at least reach 0.4 mm, and the actual thickness can be selected from any thickness greater than 0.4 mm that is capable of implementing in the LED light strip design based on the understanding of one of the ordinary skill in the art. Based on the verification result, once the thickness of the soldering pads b1 and b2 and the connection wire reach 0.4 mm, even if the copper foil at the soldering pads b1 and b2 is broken when the soldering pads b1 and b2 are connected to the power supply circuit board and disposed into the lamp tube, the copper foil on the periphery of the soldering pads b1 and b2 can also connect the LED light strip to the circuit on the power supply circuit board, so that the tube lamp can work normally.

Figure 5G:
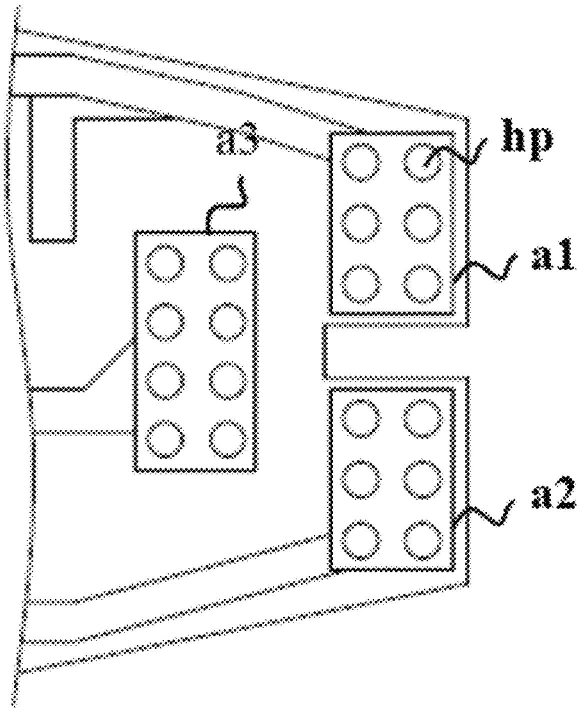
FIG. 5G is a schematic diagram of a partial structure of soldering pad(s) for power supply of an LED tube lamp according to some exemplary embodiments.

FIG. 5G is a schematic view of a power pad according to an embodiment of the present disclosure. Referring to FIG. 5G, the power supply circuit board has, for example, three pads a1, a2, and a3, and the power supply circuit board can be a printed circuit board (PCB), however, the present disclosure is not limited thereto. There are a plurality of through holes hp disposed on each of the pads a1, a2 and a3. During the welding process, the soldering material (e.g., soldering tin) is filled with at least one of the through holes hp so that the soldering pads a1 to a3 on the power supply circuit board (herein described as an after "power soldering pad") are connected to the pad on the LED light strip (hereinafter "LED soldering pad"). Herein, the LED light strip is, for example, a flexible circuit board. It should be noted that in some embodiments, a flexible circuit board has a higher rigidity than a bendable circuit sheet or flexible tape or ribbon. For example, a flexible circuit board may substantially maintain its shape when supported by one or two hands of a person, whereas a flexible or bendable circuit sheet, tape, or ribbon may collapse or coil and thus significantly changes shape when supported by one or two hands. Both a flexible circuit board and bendable circuit sheet may be bent or deformed, but the flexible circuit board may be bent by applying a force, whereas a bendable circuit sheet, when held, may bend on its own without the application of any force.

Due to the through holes hp, the contact area between the solder and the power soldering pads a1 to a3, and thus the adhesion force between the power soldering pads a1 to a3 and the LED soldering pad can be enhanced. In addition, due to the arrangement of the through holes hp, the heat dissipation area can be increased, and the terminal characteristic of the tube lamp can be improved. In the present embodiment, the number of the through holes on each power soldering pads is selected, for example, to be 7 or 9. If the configuration of 7 through holes being selected, the arrangement of the through holes hp can be that 6 through holes are arranged on a circumference on the pad, and the remaining is disposed on the center of the circle. If the configuration of 9 through holes being selected, the arrangement of the through holes hp can be arranged in a 3×3 array. According to the selected arrangement, the effect of the heat dissipation can be preferably improved.

Figure 6A:
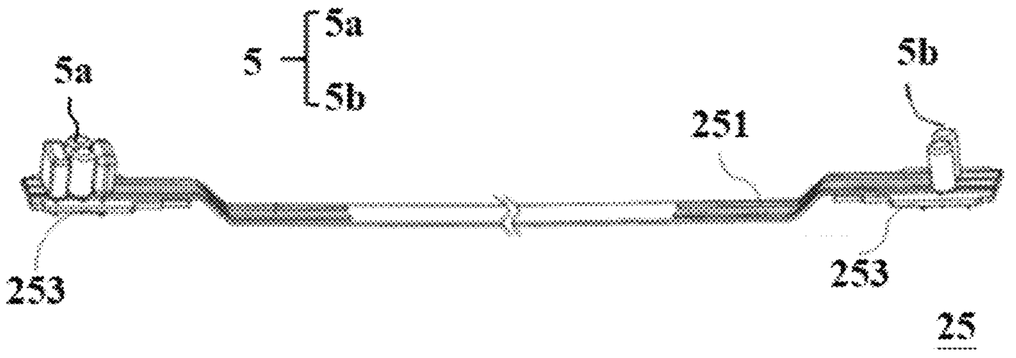
FIG. 6A is a perspective view of a structure of a light strip and a power supply module of an LED tube lamp according to some exemplary embodiments.
Figure 6B:
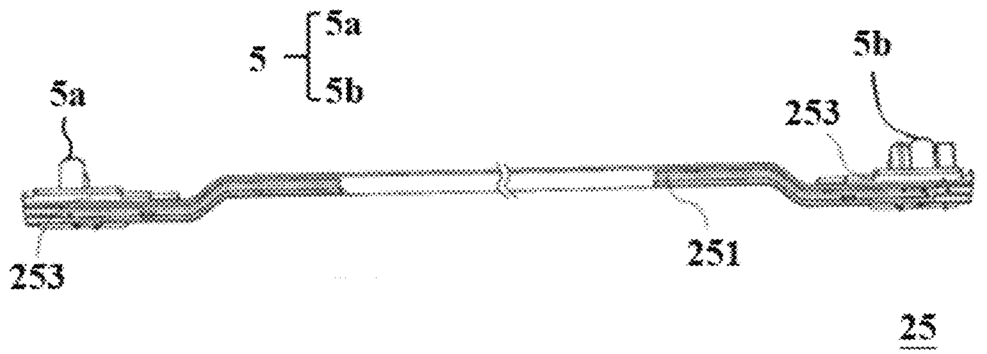
FIG. 6B is a perspective view of a structure of a light strip and a power supply module in an LED tube lamp according to some exemplary embodiments.

FIG. 6A and FIG. 6B are perspective views of structures of a light strip and a power supply module of an LED tube lamp according to two different exemplary embodiments. Referring to FIGS. 6A and 6B, in some embodiments, the LED light strip 2 and the power supply 5 can be fixed connected by utilizing a circuit board assembly 25 carrying a power supply module 5, instead of being soldered together as described above. The circuit board assembly 25 has a long-length circuit board 251 and a short-length circuit board 253 that are adhered to each other firmly, with the short-length circuit board 253 being adjacent to a terminal edge of the long-length circuit board 251. The short-length circuit board 253 may be provided with a power supply module 5 to constitute a power supply. The short-length circuit board 253 is stiffer or more rigid than the long-length circuit board 251 to be able to support the power supply module 5.

The long-length circuit board 251 can be a bendable circuit sheet or a flexible substrate, which are disposed as a light strip 2 as described above and includes a wiring layer 2*a* as shown in FIG. 2. The wiring layer 2*a* of the light strip 2 and the power supply module 5 can be electrically connected in different manners depending on actual conditions of use. As shown in FIG. 6A, the power supply module 5 and the wiring layer 2*a* of the long-length circuit board 251 to be electrically connected to the power supply module 5 are on the same side of the short-length circuit board 253 to allow the power supply module 5 to be directly electrically connected to the long-length circuit board 251. As shown in FIG. 6B, alternatively, the power supply module 5 and the wiring layer 2*a* of the long-length circuit board 251 to be electrically connected to the power supply module 5 are on two opposite sides of the short-length circuit board 253 respectively, to allow the power supply module 5 to be electrically connected to the wiring layer 2*a* of the light strip 2 through the short-length circuit board 253. In these cases, electronic components of the power supply module 5 on the left side end of the short-length circuit board 253 can be referred to as power supply module 5*a*, and electronic components of the power supply module 5 on the right side end of the short-length circuit board 253 can be referred to as power supply module 5*b*.

Figure 7:
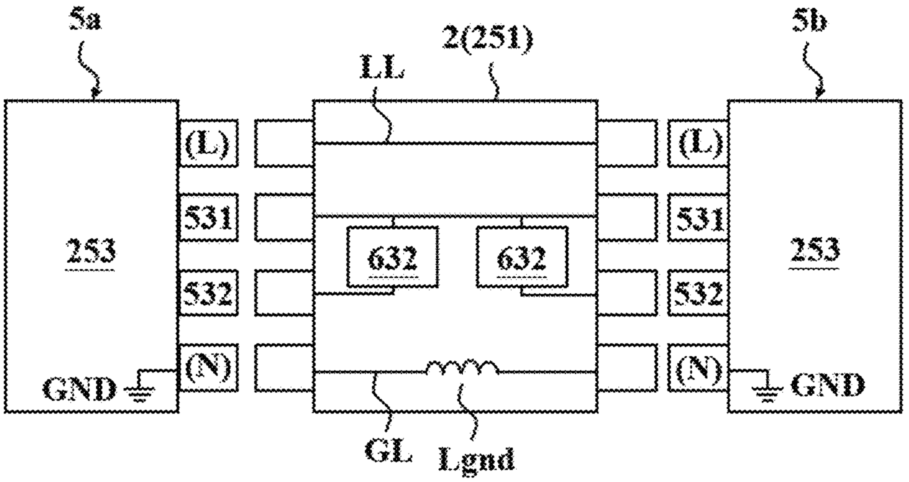
FIG. 7 is a schematic diagram of the internal wires of the LED tube lamps according to some exemplary embodiments.

FIG. 7 is a schematic diagram illustrating leads that are disposed in an LED tube lamp according to some exemplary embodiments. Referring to FIG. 7, in some embodiments, the LED tube lamp includes a lamp tube (not shown in FIG. 7), end caps (not shown in FIG. 7), a light strip 2 (or referred to as a long-length circuit board 251), short-length circuit boards 253, and an inductor Lgnd. Each of two ends of the tube lamp has at least one conductive pin or external connection terminal for receiving the external driving signal. In the design of the conductive pins or external connection terminals of an LED tube lamp, various arrangements of pins can be used, including disposing a single pin on each end of the LED tube lamp (to have two pins in total), or disposing two pins on each end of the LED tube lamp (to have four pins in total). Accordingly, under the configuration of supplying power to two ends of an LED tube lamp, at least one pin at each end can be configured to receive the external driving signal. Wires connected respectively to the two pins respectively on two ends of an LED tube lamp, for inputting and transmitting of signals, are typically referred to as a hot or live wire (generally marked as “L”) and a ground or neutral wire (generally marked as “N”), respectively.

The end caps are disposed respectively at the two ends of the lamp tube, and as shown in FIG. 7 (at least some electronic components of) the short-length circuit boards 253 located respectively at the left-side and right-side ends of the lamp tube can be disposed respectively in the end caps respectively at the two ends. The light strip 2 is disposed in the lamp tube and includes an LED module, which includes an LED unit 632. The power supply modules 5*a* and 5*b* are both electrically connected to the light strip 2 respectively through the corresponding short-length circuit boards 253, which electrical connections (such as through soldering pads) may include, connecting the power supply modules 5*a* and 5*b* through two respective signal terminals “L” to corresponding pins respectively at two ends of the light strip 2, connecting the power supply modules 5*a* and 5*b* through the driving output terminals 531 and 532 to the positive and negative terminals of the LED unit 632 respectively, and connecting the power supply modules 5*a* and 5*b* through grounding terminals “N” to reference grounding terminals of the light strip 2, wherein the reference grounding terminals of the light strip 2 are to be connected to a ground terminal GND through the grounding terminals “N” and thus the voltage at the grounded reference ground terminals of the light strip 2 can be defined as an earth ground voltage level. Further, the inductor Lgnd is to be serially connected between the two fourth terminals (i.e., the terminals “L”) of the two short-length circuit boards 253 respectively disposed at two ends of the lamp tube. In some embodiments, the inductive element Lgnd can include, for example, a choke inductor or Dual-Inline-Package inductor.

Specifically, in designing an LED tube lamp with power supply receiving from two ends, especially elongated LED tube lamps (for example, 8 ft.), two partial power-supply circuits (e.g., power supply modules a and b) can be disposed respectively in the two end caps of the lamp tube. As a result, two elongated signal conductive line LL and grounding conductive line GL may need to be disposed along the light strip 2. The signal conductive line LL may often be positioned adjacent to a positive conductive line on the light strip 2, so parasitic capacitance(s) may be caused between them. In this case, some high frequency interference passing through the positive conductive line will be reflected to the signal conductive line LL through the parasitic capacitance(s), to further generate detectable EMI effects.

Therefore, through the deployment of the inductor Lgnd serially connected to the grounding conductive line GL, the characteristic that the inductor Lgnd presents high impedance under a high frequency signal may be used to block a signal loop of the high frequency interference, in order to further eliminate high frequency interference on the positive conductive line on the light strip 2, so as to prevent the EMI effects from being reflected to the signal conductive line LL through the parasitic capacitance(s). In other words, the function of the inductor Lgnd is to eliminate or reduce the EMI effects caused by the positive conductive line or the impacts of the EMI effects, therefore the signal transmission (which may include transmissions through a signal conductive line LL, a positive conductive line, and a negative conductive line on the light strip 2) of a power signal in the LED tube lamp and quality of the LED tube lamp are improved thereby.

Figure 8A:
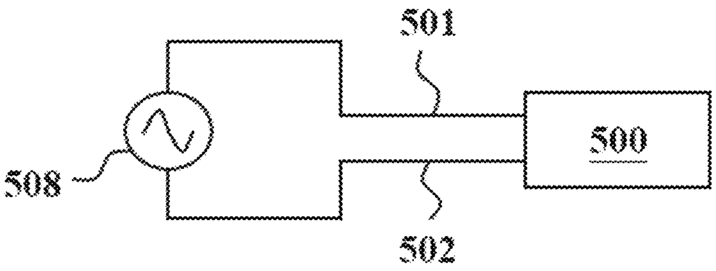
FIGS. 8A to 8E are block diagrams of exemplary power supply systems for LED tube lamps according to some exemplary embodiments.

FIG. 8A is a block diagram of a system including an LED tube lamp including a power supply module according to certain embodiments. Referring to FIG. 8A, an alternating current (AC) power supply 508 is used to supply an AC supply signal and may be an AC power line with a voltage rating, for example, in 100-277V and a frequency rating, for example, of 50 Hz or 60 Hz. An LED tube lamp 500 receives the AC supply signal as an external driving signal and is thus driven to emit light. In the present embodiment, the LED tube lamp 500 is in a driving environment in which it is power supplied at its one end cap having two conductive pins 501 and 502 (which can be referred to the external connection terminals), which are used to receive the AC supply signal.

Figure 8B:
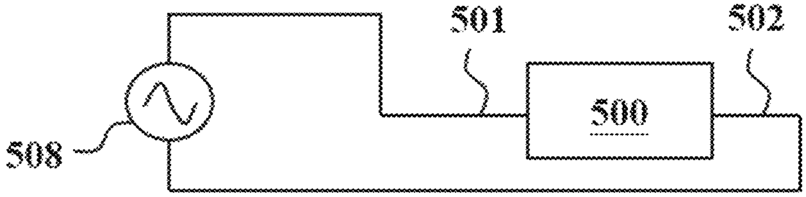

Other than the application with a single-ended power-supply configuration mentioned above, the LED tube lamp 500 may be applied in a circuit structure having a single conductive pin at each of the two ends of the LED tube lamp 500, and in a circuit structure having two conductive pins at each of the two ends of the LED tube lamp 500. A circuit structure having a single conductive pin at each end is illustrated in FIG. 8B, which is a circuit block diagram of an LED tube lamp lighting system according to some embodiments. Compared to the embodiments illustrated in FIG. 8A, in the embodiments of FIG. 8B, for a configuration of supplying power through both ends of an LED tube lamp, a first pin 501 and a second pin 502 are disposed respectively at the two end caps respectively at the two ends of an LED tube lamp 500, in order to receive an external driving signal at the two ends of the LED tube lamp 500, with other circuit connections and functions being similar to or the same as those in the circuit structure of FIG. 8A.

Figure 8C:
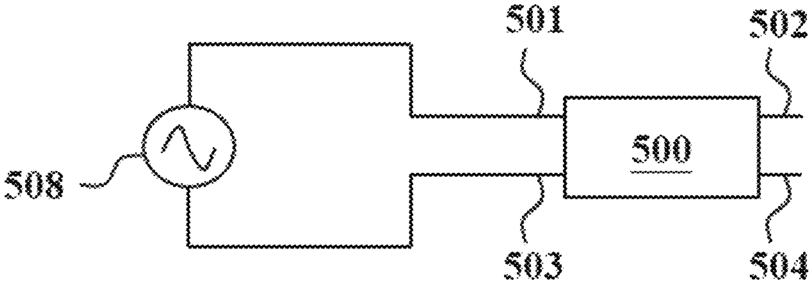
Figure 8D:
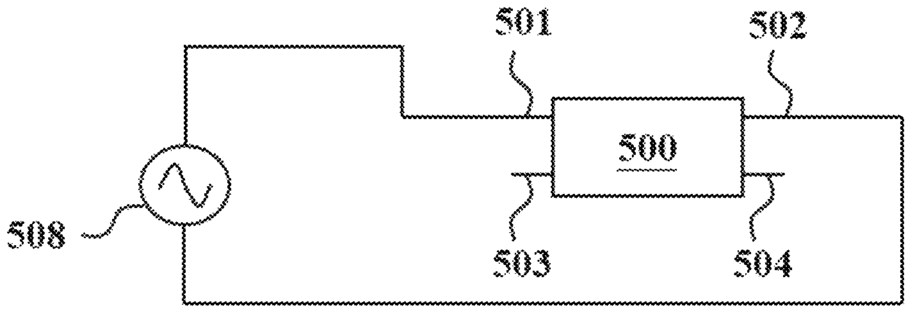
Figure 8E:
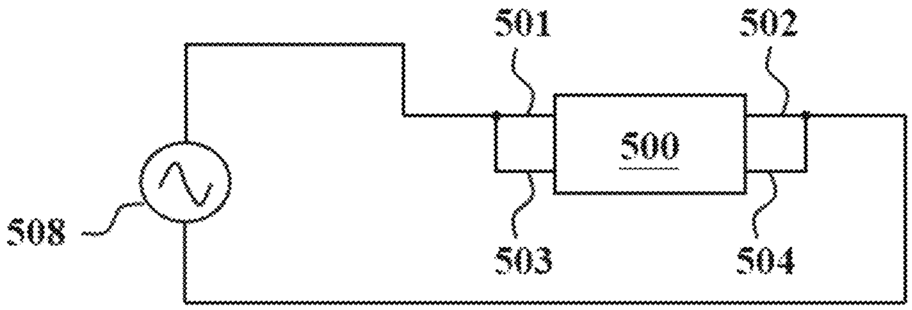

FIGS. 8C to 8E are circuit block diagrams of an LED tube lamp lighting system illustrating circuit structures/configurations of disposing two pins at each end of an LED tube lamp according to various embodiments. Compared to the embodiments illustrated in FIGS. 8A and 8B, a third pin 503 and a fourth pin 504 are included in the embodiments of FIGS. 8C to 8E. An end cap on an end of the lamp tube of the LED tube lamp has a first pin 501 and a third pin 503, and the other end cap on the other end of the lamp tube has a second pin 502 and a fourth pin 504, wherein the first pin 501, third pin 503, second pin 502, and fourth pin 504 can be configured to receive external driving signals, in order to drive LED components (not illustrated) in the LED tube lamp 500 to emit light.

Under the circuit configuration of both end caps respectively having two conductive pins, no matter whether power supply is input through only a single end of an LED tube lamp (as shown in FIG. 8C), through both ends of an LED tube lamp using one conductive pin at each end (as shown in FIG. 8D), or through both ends of an LED tube lamp using two conductive pins at each end (as shown in FIG. 8E), power supplying to the LED tube lamp can be realized through adjusting configuration of a power supply module. Under the configuration of power supplying through both ends of the LED tube lamp using one conductive pin at each end, i.e., inputting different polarities of an external driving signal respectively to two conductive pins respectively at the two ends, or this can be referred as coupling the Live wire and the Neutral wire of the AC power source 508 to two conductive pins respectively at the two ends. As shown in the exemplary embodiment of FIG. 8D, the end cap at each end may have a conductive pin in a floating or no-load condition, e.g., the third pin 503 and the fourth pin 504 in FIG. 8D in a state of floating or no-load, with the LED tube lamp being configured to receive an external driving signal only through the first pin 501 and second pin 502 and the power supply module in the LED tube lamp thereby performing following operations of rectification and filtering. In another exemplary embodiment shown in FIG. 8E, the two conductive pins at each end can be shorted together through wires external to or inside the lamp tube. For example, the first pin 501 and the third pin 503 at the same end are shorted and the second pin 502 and the fourth pin 504 at the other end are shorted, which allows using the first pin 501 and the third pin 503 to receive the positive or negative polarity of an external driving signal and using the second pin 502 and the fourth pin 504 to receive the opposite polarity of the external driving signal, such that the power supply module in the LED tube lamp is able to perform following operations of rectification and filtering.

Figure 9A:
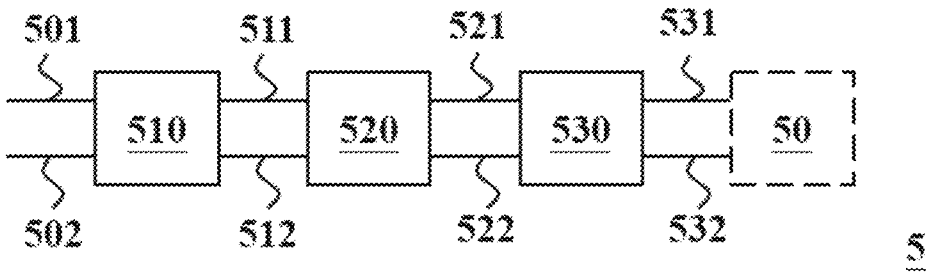
FIGS. 9A-9C are block diagrams of exemplary power supply modules in an LED tube lamp according to some exemplary embodiments.

FIG. 9A is a block diagram of an exemplary power supply module in an LED lamp according to some embodiments. Referring to FIG. 9A, the power supply module 5 is coupled to an LED module 50 in the LED tube lamp 500 and includes a rectifying circuit 510 (also referred to as first rectifying circuit 510), a filtering circuit 520, and a driving circuit 530. The rectifying circuit 510 is coupled to a first pin 501 and a second pin 502 at one end, for receiving and then rectifying an external driving signal in order to output or produce a rectified signal at a first rectifying output terminal 511 and a second rectifying output terminal 512. The external driving signal in this embodiment may be an AC power signal provided by an AC power supply 508 under any of the power-supply configurations of FIGS. 8A-8E, or even be a DC signal compatible with or suitable for normal operations of the LED tube lamp 500. The filtering circuit 520 is coupled to the rectifying circuit 510 for performing filtering of the rectified signal. Specifically, the filtering circuit 520 is coupled to the first rectifying output terminal 511 and second rectifying output terminal 512 in order to receive and then filter the rectified signal, and then outputs or produces a filtered signal at a first filtering output terminal 521 and a second filtering output terminal 522. The driving circuit 530 is coupled to the LED module 50 and the filtering circuit 520, in order to receive the filtered signal and then produce a driving signal for driving the LED module 50 to emit light. The driving circuit 530 includes, e.g., a DC-to-DC converter circuit for converting the received filtered signal into the driving signal, which is output at a first driving output terminal 531 and a second driving output terminal 532. In FIG. 9A, the driving circuit 530 is coupled to the first filtering output terminal 521 and second filtering output terminal 522 in order to receive the filtered signal and then drive LEDs (not illustrated) in the LED tube lamp 500 to emit light. The operation(s) of embodiments of the driving circuit 530 is further described in more detail below. The LED module 50 is coupled to the first driving output terminal 531 and second driving output terminal 532 in order to receive the driving signal to emit light, for which the electrical current flowing on or through the LED module 50 is preferably stable at a set or defined current value. In some embodiments, an LED module 50 being driven to emit light can refer to lumens of the LED module reaching at least fifty percent of the lumen output indicated by the manufacturer, also described as nominal lumens (e.g., at least fifty percent of the lumens expected to be output under full power operating condition). The specific configuration of the LED module 50 can be found in the subsequent descriptions of FIGS. 10A to 10I.

Figure 9B:
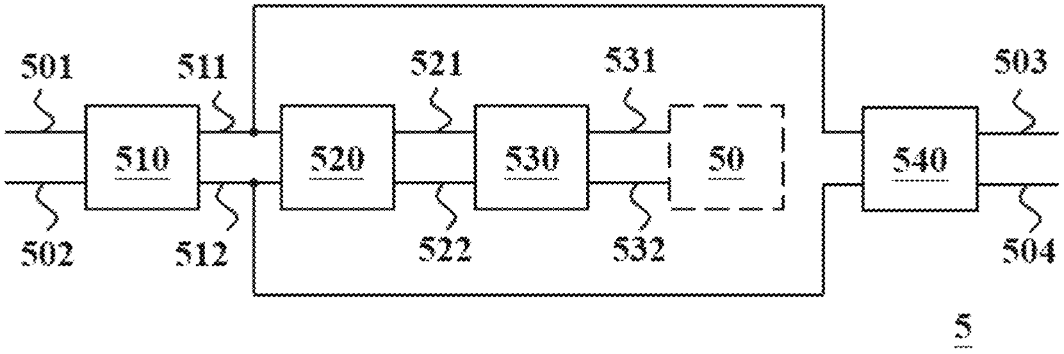

FIG. 9B is a block diagram of an exemplary power supply module in LED lamp according to some exemplary embodiments. Referring to FIG. 9B, the power supply module of the LED lamp includes a first rectifying circuit 510, a filtering circuit 520, a driving circuit 530, and another rectifying circuit 540 (also referred to as second rectifying circuit 540). The power supply module 5 of FIG. 9B can be utilized in the single-end power supply configuration illustrated in FIG. 8C or the dual-end power supply configuration illustrated in FIGS. 8D to 8E. The first rectifying circuit 510 is coupled to the pins 501 and 502 to receive and then rectify an external driving signal transmitted by the pins 501 and 502; the second rectifying circuit 540 is coupled to the pins 503 and 504 to receive and then rectify an external driving signal transmitted by pins 503 and 504. The first rectifying circuit 510 and the second rectifying circuit 540 of the power supply module collectively output a rectified signal at two rectifying circuit output terminals 511 and 512. The filtering circuit 520 is coupled to the rectifying circuit output terminals 511 and 512 to receive and then filter the rectified signal, so as to output a filtered signal at two filtering output terminals. The driving circuit 530 is coupled to the first filtering output terminal 521 and second filtering output terminal 522 in order to receive the filtered signal and then drive LEDs (not illustrated) in the LED tube lamp 500 to emit light.

Figure 9C:
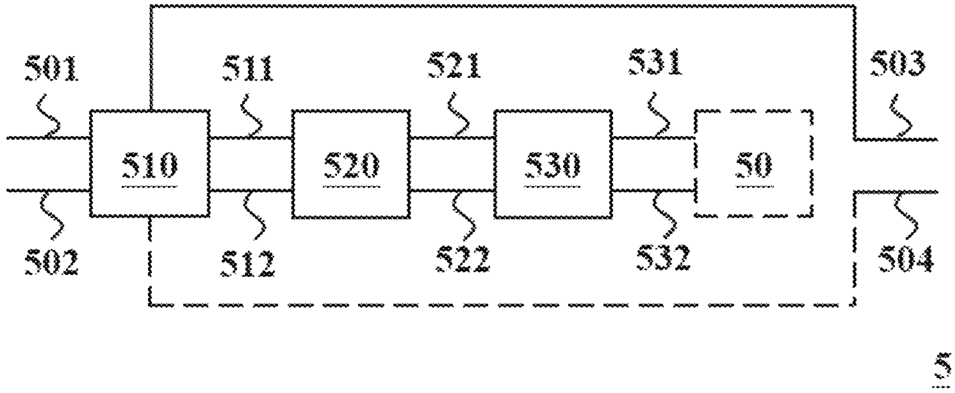

FIG. 9C is a block diagram of an exemplary LED lamp according to some exemplary embodiments. Referring to FIG. 9C, the power supply module of LED tube lamp includes a rectifying circuit 510, a filtering circuit 520 and a driving circuit 530, which can also be utilized in the single-end power supply configuration illustrated in FIG. 8A or 8C or the dual-end power supply configuration illustrated in FIG. 8B, 8D, or 8E. The difference between the embodiments illustrated in FIG. 9C and FIG. 9B is that the rectifying circuit 510 in FIG. 9C has three input terminals to be coupled to the pins 501 to 503, respectively. The rectifying circuit 510 rectifies the signals received from the pins 501 to 503, in which the pin 504 can be set to the floating state or connected to the pin 503. Therefore, the second rectifying circuit 540 can be omitted in the present embodiment. The rest of circuitry operates substantially the same as the embodiment illustrated in FIG. 9B, so the detailed description is not repeated herein.

Although there are two rectifying output terminals 511 and 512 and two filtering output terminals 521 and 522 in the embodiments of these FIGS., in practice the number of ports or terminals for coupling between the rectifying circuit 510, the filtering circuit 520, the driving circuit 530 and the LED module 50 may be one or more depending on the needs of signal transmission between the circuits or devices.

Embodiments of the power supply module in the LED tube lamp illustrated in any of FIGS. 9A-9C or of the power supply module described below are not only applicable to an LED tube lamp in any of FIGS. 8A-8E, but also can be used in any other type of lighting circuit structure having two conductive pins used to conduct power, such as any of various kinds of lamp including LED light bulbs, personal area lights (PAL), and plug-in LED lamps (such as types of PL-S, PL-D, PL-T, PL-L, etc.), respectively having different specifications of base or holder. Further, for implementation in LED light bulbs, such embodiments of the power supply module can be used along with structural implementations disclosed in the Chinese Applications CN105465630A or CN105465663.

When an LED tube lamp 500 disclosed herein is applied with a power-supply configuration using at least one pin at each of its two opposite ends, the LED tube lamp 500 may be modified or retrofitted, and then installed in a lamp holder including a lamp driver circuit or ballast 505 (e.g., electronic ballast or inductive ballast), which is also suitable for being power-supplied by an AC power source 508 (e.g., mains electricity) bypassing through the ballast 505 instead.

Figure 10A:
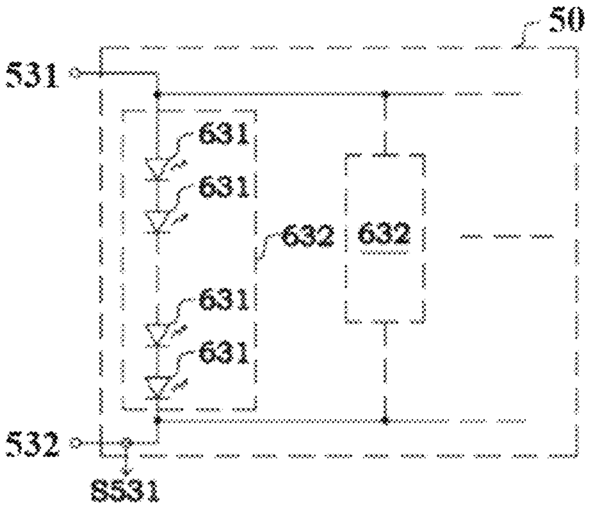
FIGS. 10A-10B are schematic diagrams of exemplary LED modules according to some exemplary embodiments.

FIG. 10A is a schematic diagram of an LED module according to an embodiment. Referring to FIG. 10A, an LED module 50 has an anode connected to a driving output terminal 531, a cathode connected to a driving output terminal 532, and includes at least one LED unit 632, such as the light source mentioned above. When two or more LED units are included, they are connected in parallel. The anode of each LED unit 632 is connected to the anode of LED module 50 to couple with the driving output terminal 531, and the cathode of each LED unit 632 is connected to the cathode of LED module 50 to couple to the driving output terminal 532. Each LED unit 632 includes at least one LED 631. When multiple LEDs 631 are included in an LED unit 632, they are connected in series with the anode of the first LED 631 connected to the anode of this LED unit 632 (the anode of the first LED 631 and the anode of the LED unit 632 may be the same terminal) and the cathode of the first LED 631 connected to the next or second LED 631. And the anode of the last LED 631 in this LED unit 632 is connected to the cathode of a previous LED 631 and the cathode of the last LED 631 connected to the cathode of this LED unit 632 (the cathode of the last LED 631 and the cathode of the LED unit 632 may be the same terminal).

In some embodiments, the LED module 50 may produce a current detection signal S531 reflecting the magnitude of current through the LED module 50 and being used for controlling or detecting the LED module 50.

Figure 10B:
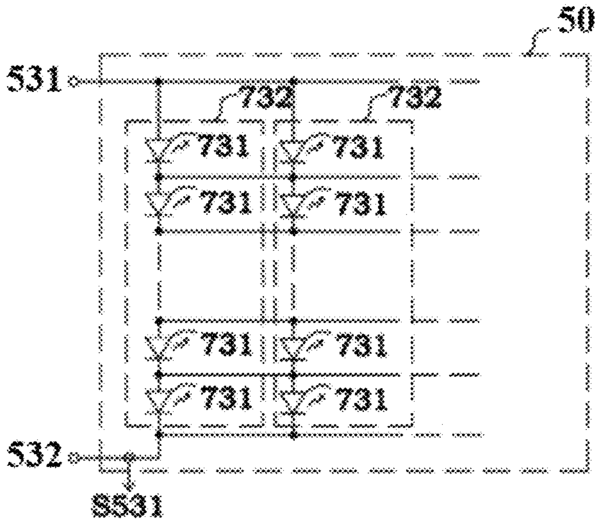

FIG. 10B is a schematic diagram of an LED module according to an exemplary embodiment. Referring to FIG. 10B, an LED module 50 has an anode connected to a filtering output terminal 531, a cathode connected to a filtering output terminal 532, and includes at least two LED units 732 with the anode of each LED unit 732 connected to the anode of LED module 50 and the cathode of each LED unit 732 connected to the cathode of LED module 50 (the anode of each LED unit 732 and the anode of the LED module 50 may be the same terminal, and the cathode of each LED unit 732 and the cathode of the LED module 50 may be the same terminal). Each LED unit 732 includes at least two LEDs 731 connected in the same way as those described in FIG. 10A. For example, the anode of the first LED 731 in an LED unit 732 is connected to the anode of this LED unit 732, the cathode of the first LED 731 is connected to the anode of the next or second LED 731, and the cathode of the last LED 731 is connected to the cathode of this LED unit 732. Further, LED units 732 in an LED module 50 are connected to each other in this embodiment. All of the n-th LEDs 731 in the related LED units 732 thereof are connected by their anodes and cathodes, where n is a positive integer. In this way, the LEDs in the LED module 50 of this embodiment are connected in the form of a mesh.

In some embodiments, the number of LEDs 731 included by an LED unit 732 is in the range of 15-25 and may be in some embodiments in the range of 18-22.

Figure 10C:
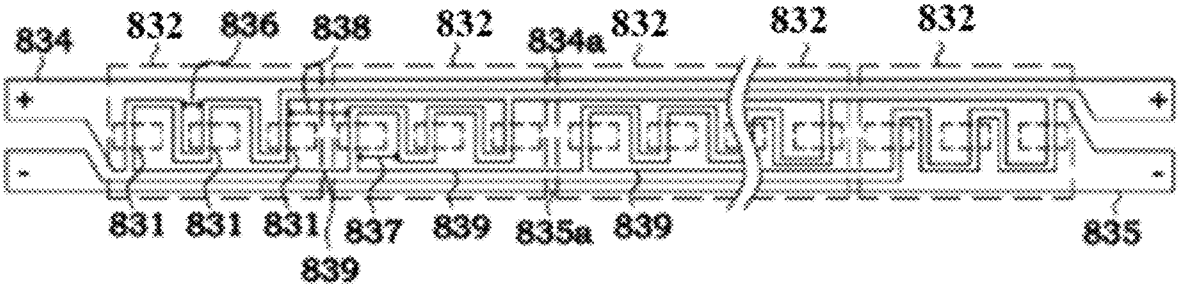
FIGS. 10C-10I are plan view of a circuit layout of the LED module according to an exemplary embodiment.

FIG. 10C is a plan view of a circuit layout of the LED module according to an embodiment. Referring to FIG. 10C, in this embodiment, multiple LEDs 831 are connected in the same way as described in FIG. 10B, and three LED units are assumed in the LED module 630 and described as follows for illustration. A positive conductive line 834 and a negative conductive line 835 are to receive a driving signal for supplying power to the LEDs 831. For example, the positive conductive line 834 may be coupled to the filtering output terminal 521 of the filtering circuit 520 described above, and the negative conductive line 835 coupled to the filtering output terminal 522 of the filtering circuit 520 to receive a filtered signal. For the convenience of illustration, all three of the n-th LEDs 832 in the three related LED units thereof are grouped as an LED set 833 in FIG. 10C.

The positive conductive line 834 connects the first LED components 831 of the leftmost three related LED units, i.e., it connects the anodes (e.g., terminals at the left-hand sides) of the three LED components in the leftmost LED set 832 as shown in FIG. 10C. The negative conductive line 835 connects the last LED components 831 of the rightmost three LED units, i.e., it connects the cathodes (e.g., terminals at the right-hand sides) of the three last LED components 831 in the rightmost LED set 832 as shown in FIG. 10C. The cathodes of the first LED components 831 of each LED unit, the anodes of the last LED components 831, and the anodes and cathodes of all remaining LED components 831 are connected by connection lines 839.

In other words, the anodes of the three LED components 831 in the leftmost LED set 832 can be connected together by a positive conductive line 834, and their cathodes can be connected together by a leftmost connection part 839. The anodes of the three LED components 831 in the second, next-leftmost LED set 832 are also connected together by the leftmost connection part 839, whereas the cathodes thereof are connected together by a second, next-leftmost connection part 839. Since the cathodes of the three LED components 831 in the leftmost LED set 832 and the anodes of the three LED components 831 in the second, next-leftmost LED set 832 are connected together by the same leftmost connection part 839, the cathode of the first LED component 831 in each of the three LED units is connected to the anode of the next or second LED component 831. The remaining LED components 831 of the three LED units are also connected in the same way to form the mesh connection structure as shown in FIG. 10B.

In this embodiment, the length 836 of a portion of each conductive part 839 that connects to the anode of an LED 831 is smaller than the length 837 of another portion of each conductive part 839 that connects to the cathode of an LED 831. This makes the area of the latter portion connecting to the cathode larger than that of the former portion connecting to the anode. Moreover, the length 837 may be smaller than a length 838 of a portion of each conductive part 839 that connects the cathode of an LED 831 and the anode of the next LED 831 in two adjacent LED sets 833. This makes the area of the portion of each conductive part 839 that connects a cathode and an anode larger than the area of any other portion of each conductive part 839 that connects to only a cathode or an anode of an LED 831. Due to the length differences and area differences, this layout structure improves heat dissipation of the LEDs 831.

In some embodiments, the positive conductive line 834 includes a lengthwise portion 834*a*, and the negative conductive line 835 includes a lengthwise portion 835*a*, which are conducive to make the LED module have a positive "+" connective portion and a negative "−" connective portion at each of the two ends of the LED module, as shown in FIG. 10C. Such a layout structure allows for coupling any of other circuits of the power supply module of the LED lamp, including e.g., the filtering circuit 520 and the rectifying circuits 510 and 540, to the LED module through the positive connective portion and/or the negative connective portion at each or both ends of the LED lamp. Thus, the layout structure increases the flexibility in arranging actual circuits in the LED lamp.

Figure 10D:
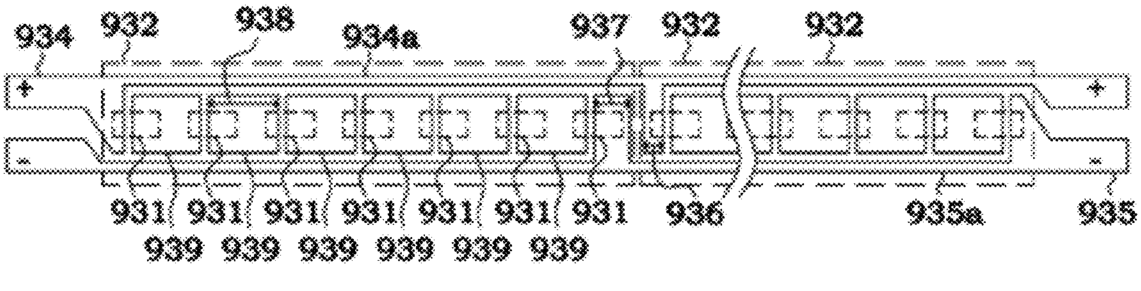

FIG. 10D is a plan view of a circuit layout of the LED module according to another embodiment. Referring to FIG. 10D, in this embodiment, multiple LEDs 931 are connected in the same way as described in FIG. 10A, and three LED units each including 7 LEDs 931 are assumed in the LED module 630 and described as follows for illustration. A positive conductive line 934 and a negative conductive line 935 are to receive a driving signal for supplying power to the LEDs 931. For example, the positive conductive line 934 may be coupled to the filtering output terminal 521 of the filtering circuit 520 described above, and the negative conductive line 935 is coupled to the filtering output terminal 522 of the filtering circuit 520, so as to receive a filtered signal. For the convenience of illustration, all seven LEDs 931 of each of the three LED units are grouped as an LED set 932 in FIG. 10D. Thus, there are three LED sets 932 corresponding to the three LED units.

The positive conductive line 934 connects the anode on the left side of the first or leftmost LED 931 of each of the three LED sets 932. The negative conductive line 935 connects the cathode on the right side of the last or rightmost LED 931 of each of the three LED sets 932. In each LED set 932 of each two adjacent LEDs 931, the LED 931 on the left has a cathode connected by a conductive part 939 to an anode of the LED 931 on the right. By such a layout, the LEDs 931 of each LED set 932 are connected in series.

It is noted that the connection part 939 is configured to connect the anode and the cathode respectively of two consecutive LED components 931. The negative conductive line 935 connects to the cathode of the last or rightmost LED component 931 of each LED set 932. And the positive conductive line 934 connects to the anode of the first or leftmost LED component 931 of each LED set 932. Therefore, the width of each of these connection part and conductive lines and the area of each for heat dissipation for an LED component is ranked as from relatively large to relatively small in the above-described sequence of these described connection part and conductive lines. That is, as shown in FIG. 10D, the width 938 of the connection part 939 is the largest and larger than the width 937 of the negative conductive line 935 connecting to a cathode of an LED component 931, which is in turn larger than the width 936 of the positive conductive line 934 connecting to an anode of an LED component 931. Therefore, such a layout structure of conductive lines and connection parts benefits heat dissipation for the LED components.

The positive conductive line 934 may include a lengthwise portion 934*a*, and the negative conductive line 935 may include a lengthwise portion 935*a*, which are conducive to make the LED module have a positive "+" connective portion and a negative "−" connective portion at each of the two ends of the LED module, as shown in FIG. 10D. Such a layout structure allows for coupling any of other circuits of the power supply module of the LED lamp, including e.g., the filtering circuit 520 and the rectifying circuits 510 and 540, to the LED module through the positive connective portion 934*a* and/or the negative connective portion 935*a* at each or both ends of the LED lamp. Thus, the layout structure increases the flexibility in arranging actual circuits in the LED lamp.

Further, the circuit layouts as shown in FIGS. 10C and 10D may be implemented with a bendable circuit sheet or substrate or may be a flexible circuit board depending on its specific construction. For example, the bendable circuit sheet may comprise one conductive layer where the positive conductive line 834, the positive lengthwise portion 834*a*, the negative conductive line 835, the negative lengthwise portion 835*a*, and the conductive parts 839 shown in FIG. 10C, and the positive conductive line 934, the positive lengthwise portion 934*a*, the negative conductive line 935, the negative lengthwise portion 935*a*, and the conductive parts 939 shown in FIG. 10D are formed by the method of etching.

Figure 10E:
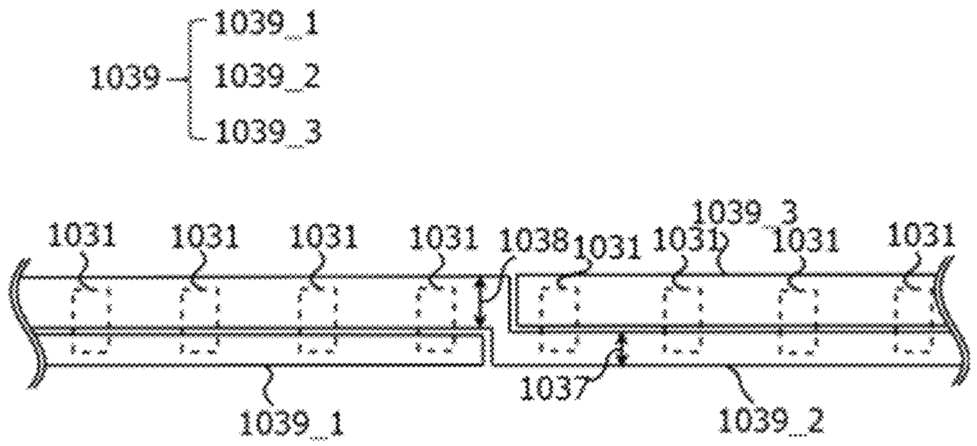

FIG. 10E is a plan view of a circuit layout of the LED module according to another embodiment. Referring to FIG. 10E, the connection relationship of the LEDs 1031 is the same as FIG. 10B. The configuration of the positive conductive line and the negative conductive line (not shown) and the connection relationship between the conductive lines and other circuits is substantially the same as FIG. 10C. The difference between the present embodiment and the above embodiments is that the LEDs 1031 are modified to be arranged in the longitudinal direction (i.e., the positive and negative electrodes of each LEDs are disposed along the direction perpendicular to the lead extension direction) from the transverse direction such as arrangement of the LEDs 831 shown in FIG. 10C (i.e., the positive and negative electrodes of each LEDs are disposed along the lead extension direction), and the connection configuration of the present embodiment are correspondingly adjusted due to the arrangement direction.

Specifically, taking a conductive part 1039_2 for example, the conductive part 1039_2 includes a first long-side portion having a width 1037, a second long-side portion having a width 1038 which is greater than the width of the first long-side portion, and a transition portion connecting the first and the second long-side portions. The conductive part 1039_2 can be formed in a right-angled Z shape, which means the joints of each long-side portions and the transition portion are perpendicular. The first long-side portion of the conductive part 1039_2 and the second long-side portion of the adjacent conductive part 1039_3 are correspondingly disposed; similarly, the second long-side portion of the conductive part 1039_2 and the first long-side portion of the adjacent conductive part 1039_1 are correspondingly disposed. According to the configuration described above, the conductive part 1039 is arranged along the extension direction of the long-side portions, and the first long-side portion of each conductive parts 1039 and the second long-side portion of each adjacent conductive parts 1039 are correspondingly disposed; similarly, the second long-side portion of each conductive parts 1039 and the first long-side portion of each adjacent conductive parts 1039 are correspondingly disposed. Therefore, each of the conductive parts 1039 can be formed as a wiring configuration having consistent width. The configuration of the other conductive parts 1039 can be similar to the description of the conductive part 1039_2 described above.

The conductive part 1039 is taken as an example for explaining the relative configuration of the LEDs 1031 and the conductive parts 1039 as well. In the present embodiment, the positive electrodes of part of the LEDs 1031 (e.g., the four LEDs 1031 at the right-hand side) are connected to the first long-side portion of the conductive part 1039_2 and connected to each other via the first long-side portion; and the negative electrodes of the part of the LEDs 1031 are connected to the second long-side portion of the adjacent conductive part 1039_3 and connected to each other via the conductive part 1039_3. On the other hand, the positive electrodes of another part of the LEDs 1031 (e.g., the four LEDs 1031 at the left-hand side) are connected to the first long-side portion of the conductive part 1039_1, and the negative electrodes of another part of the LEDs 1031 are connected to the second long-side portion of the conductive part 1039_2.

As can be seen in FIG. 10E, positive electrodes of the four LEDs 1031 at the left-hand side are connected to each other via the conductive part 1039_1, and the negative electrodes of the four LEDs 1031 at the left-hand side are connected to each other via the conductive part 1039_2. The positive electrodes of the four LEDs 1031 at the right-hand side are connected to each other via the conductive part 1039_2, and the negative electrodes of the four LEDs 1031 at the right-hand side are connected to each other via the conductive part 1039_3. Since the negative electrodes of the four LEDs 1031 at the left-hand side are connected to the positive electrodes of the four LEDs 1031 at the right-hand side via the conductive part 1039_2, the left four LEDs 1031 can be respectively referred to as the first LED in the four LED units, and the right four LEDs can be respectively referred to as the second LED in the four LED units. The connection relationship of the other LEDs can be derived from the above configuration, so as to form the mesh connection as shown in FIG. 10B.

It should be noted that, compared to FIG. 10C, the LEDs 1031 of the present embodiment are modified to be arranged in the longitudinal direction, such that the gap between the LEDs 1031 can be increased, which allows the effective width (which can be referred to the lead width) of the conductive part to be broadened. Therefore, the risk that the circuit is easily punctured when reconditioning the tube lamp can be avoided. Moreover, the short-circuit issue caused by the insufficient coverage area of the copper foil between the LEDs 1031 when the LEDs 1031 require to be arranged tightly can be removed or reduced.

On the other hand, by designing the width 1037 of the first long-side portion connected to the positive electrodes smaller than the width 1038 of the second long-side portion connected to the negative electrodes, the connection area of the negative electrodes on the LEDs 1031 is larger than the connection area of the positive electrodes on the LEDs 1031. Thus, such wiring architecture facilitates heat dissipation of the LEDs.

Figure 10F:
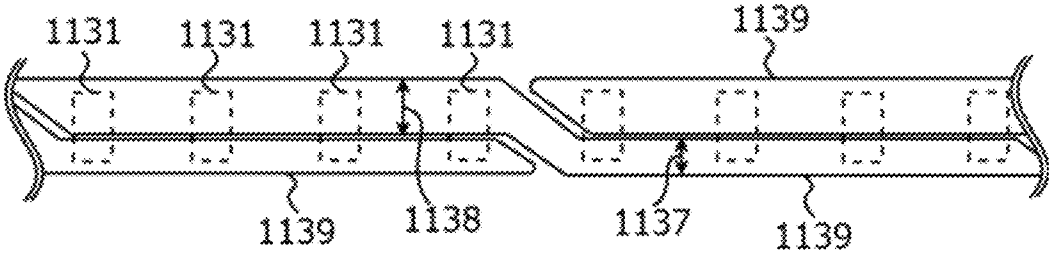

FIG. 10F is a planar view of a circuit layout of an LED module according to another embodiment. Referring to FIG. 10F, the present embodiment is largely similar to the embodiment illustrated in FIG. 10E, with a difference that in the embodiment of FIG. 10F, a connection part 1139 is formed in a Z shape rather than in a right-angled form. In other words, in the present embodiment, the transition portion of a connection part 1139 is formed along an oblique direction, such that each joint between each lengthwise portion and the transition portion does not exhibit a right angle. In the configuration of the present embodiment, in addition to increasing the gap between positions of the LEDs 1131 and achieving the effect of broadened width of each connection part 1139 by disposing the LEDs 1131 along the lengthwise direction, configuring part of a connection part 1139 along an oblique direction in this embodiment may reduce the incidence of displacement or being shifted of an LED component when attaching the LED component to an uneven or not-level soldering pad. Similarly, the connection part 1139 in this embodiment can be configured such that the width 1137 of the lengthwise portion of the connection part 1139 acting for connecting anodes of the LED components is smaller than a width 1138 of a lengthwise portion of the connection part 1139 for connecting cathodes of the LED components, and the effect of heat-dissipation can also be improved.

Specifically, according to the embodiment utilizing the flexible circuit board as the LED light strip, the vertical conductive parts/leads (e.g., portions that extend in a vertical direction in the configuration shown in FIG. 10C to FIG. 10E) cause a regular recessed/indented area at the transition portion, so that the soldering spots of the LED soldering pads on the conductive parts are relatively on a raised position. Since the soldering spots are not a flat surface, it is hard to dispose the LEDs on the predetermined position when attaching the LEDs on the LED light strip. Thus, the present embodiment eliminates the recessed area by adjusting the configuration of the vertical wiring to the oblique wiring, so that the strength of the copper foil of the whole wiring can be uniform without a bulge or uneven situation at a specific position crossing the width of the LED light strip. Accordingly, the LEDs 1131 can be attached on the conductive part easier, so as to enhance the reliability of tube lamp installation process. Also, since each of the LED units only passes the oblique wiring once on the LED light strip, the strength of the entire LED light strip can be greatly improved, therefore, the LED light strip can be prevented from being bent and the length of the LED light strip can be shortened.

In addition, in an exemplary embodiment, the copper foil can be covered (e.g., extend laterally) around the soldering pads of the LEDs 1131, so as to eliminate effects of an offset generated from attaching the LEDs 1131 and avoid a short-circuit caused by the solder ball. This is particularly the case for an offset in the lengthwise direction of the LED light strip.

Figure 10G:
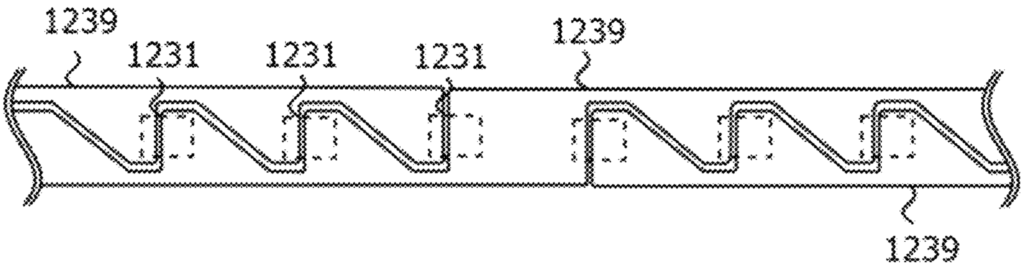

FIG. 10G is a planar view of a circuit layout of the LED module according to another embodiment. Referring to FIG. 10G, the present embodiment is similar to the embodiment illustrated in FIG. 10C, with the difference that the corresponding/matching shapes between two connection parts 1239 (except for corresponding shapes which the soldering pads of the LED components 1231 are positioned across) are formed/arranged along an oblique direction. In the embodiments of FIG. 10G, through arranging some corresponding shapes of two connection parts 1239 along an oblique direction, rather than along a transverse and perpendicular direction, this arrangement can make the strength of copper foil/clad in the overall wirings even or uniform and avoid/reduce occurrence of some positions protruding or being uneven, therefore making attaching the LED components to conductive parts/lines easier and improving reliability in assembling the LED tube lamp.

Figure 10H:
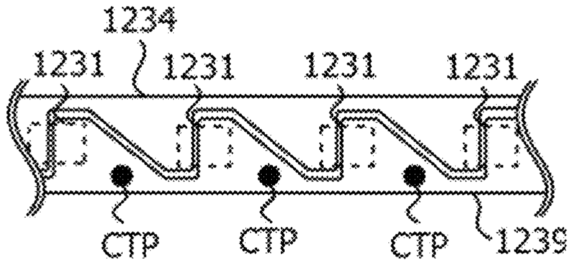

In addition, according to the configuration of the present embodiment, color temperature points CTP can be uniformly disposed between LED components 1231 as shown in FIG. 10H. FIG. 10H is a planar view of a circuit layout of an LED module according to another embodiment. In the present embodiment, by disposing color temperature points CTP uniformly between the LED components, and the conductive parts 1234 and 1239 are matched to form an LED module, the color temperature points CTP on corresponding positions on each of the conductive parts 1234 and 1239 can be aligned along the same line. In this case, only several or few tapes are needed to cover/block all color temperature points CTP on the LED module during soldering (e.g., as shown in FIG. 10H, only three tapes are needed if three color temperature points CTP are disposed on each conductive part). As a result, the smoothness in assembling process of the LED tube lamp can be improved and the time needed in assembling can be saved thereby.

Figure 10I:
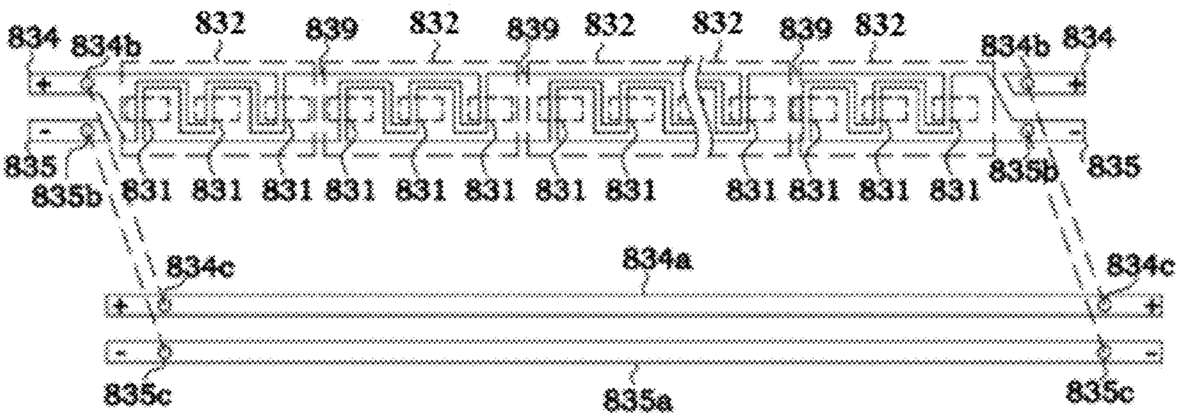

FIG. 10I is a planar view of a circuit layout of an LED module according to an embodiment. Referring to FIG. 10I, in the embodiment of FIG. 10I two-layer structure of wiring layer is deployed instead of a one-layer structure of wiring layer as shown in the embodiment of FIG. 10C, mainly by disposing a positive-pole lengthwise portion 834*a* and a negative-pole lengthwise portion 835*a* in a second wiring layer. Details of the embodiment of FIG. 10I would be described as follows.

With additionally reference to FIG. 3, a bendable circuit sheet includes two wiring layers, and specifically includes a first wiring layer 2*a*, a dielectric layer 2*b*, and a second wiring layer 2*c*. The first wiring layer 2*a* and the second wiring layer 2*c* are electrically insulated from each other by the dielectric layer 2*b*. In the first wiring layer 2*a* of the bendable circuit sheet, a positive conductive line 834, a negative conductive line 835, and connection parts 839 in FIG. 10I are formed by the method of etching for electrically connecting a plurality of LED components 831, e.g., for electrically connecting an LED set 832 comprising the plurality of LED components 831 connected in a form of a mesh. In the second wiring layer 2*c* of the bendable circuit sheet, a positive lengthwise portion 834*a* and a negative lengthwise portion 835*a* are formed by etching for electrically connecting (a filtering output terminal of) the filtering circuit. Further, the positive conductive line 834 and the negative conductive line 835 in the first wiring layer 2*a* of the bendable circuit sheet have via points 834*b* and via points 835*b*, respectively. And the positive lengthwise portion 834*a* and the negative lengthwise portion 835*a* in the second wiring layer 2*c* have via points 834*c* and via points 835*c*, respectively. The via points 834*b* are positioned corresponding to the via points 834*c*, for electrically connecting the positive conductive line 834 and the positive lengthwise portion 834*a*. The via points 835*b* are positioned corresponding to the via points 835*c*, for electrically connecting the negative conductive line 835 and the negative lengthwise portion 835*a*. An exemplary preferable configuration is to form a hole connecting each via point 834*b* and a corresponding via point 834*c*, and to form a hole connecting each via point 835*b* and a corresponding via point 835*c*, with the holes extending through the two wiring layers 2*a* and 2*c* and the dielectric layer 2*b* in-between. And the positive conductive line 834 and the positive lengthwise portion 834*a* can be electrically connected by welding metallic part(s) through the connecting hole(s), and the negative conductive line 835 and the negative lengthwise portion 835*a* can be electrically connected by welding metallic part(s) through the connecting hole(s).

Similarly, the layout structure of the LED module in FIG. 10D may alternatively have the positive lengthwise portion 934*a* and the negative lengthwise portion 935*a* disposed in a second conductive layer to constitute a two-layered layout structure.

It is noted that in some embodiments, the thickness of a second conductive layer of a bendable circuit sheet including two conductive layers or wiring layers is preferably larger than that of a first conductive layer of the bendable circuit sheet in order to reduce a voltage drop or loss along each of the positive conductive line and the negative conductive line in the bendable circuit sheet. Comparing to the bendable circuit sheet with only one conductive layer, since the positive conductive line and the negative conductive line are disposed in the second conductive layer in the two-layer bendable circuit sheet with two conductive layers, the width of the two-layer bendable circuit sheet is or can be reduced. On the same fixture or plate in a production process, the maximum number of bendable circuit sheets each having a shorter width that can be laid together is larger than that of bendable circuit sheets each having a longer width. Thus, adopting a bendable circuit sheet having a shorter width can increase the efficiency of production of an LED module. Further, reliability in the production process, such as the accuracy of soldering position during soldering (materials on) the LED components, can also be improved, because a two-layer bendable circuit sheet including two conductive layers can maintain the shape thereof better.

As a variation of the above embodiments, an LED tube lamp is also provided herein that at least some electronic components of power supply module thereof are disposed on a light strip of the LED tube lamp. For example, the technique of printed electronic circuit (PEC) can be used to print, insert, or embed the at least some electronic components of the power supply module onto the LED light strip.

In one embodiment, all electronic components of a power supply module are disposed on a light strip. The production process may include or proceed with the following steps: preparing of a circuit substrate (e.g., preparing a flexible printed circuit board); inkjet printing the metallic nano-ink; inkjet printing the active and passive components (as of the power supply module); drying/sintering; inkjet printing the interlayer bumps; spraying the insulating ink; inkjet printing of metallic nano-ink; inkjet printing the active and passive components (to sequentially form the layers on the circuit substrate); spraying the soldering pad(s) on the surface; and spraying solder resist against the LED components.

In this embodiment, if all the electronic components of the power supply module are disposed on the LED light strip, electrical connection between terminal pins of the LED tube lamp of the power supply module and the light strip can be achieved by connecting the pins to conductive lines at the ends of the light strip through soldering. In this case, another substrate for supporting the power supply module is not required, allowing further improved design or arrangement in the end cap(s) of the LED tube lamp. In some embodiments, (components of) the power supply module are disposed at two ends of the light strip, such that the impact of heat generated from the power supply module's operations on the LED components can be greatly reduced. Since no substrate other than the light strip is used to support the power supply module in this case, the total amount of welding or soldering can be significantly reduced and the general reliability of the power supply module can be improved thereby.

Another case is that some electronic components of the power supply module, such as some resistors and/or smaller-size capacitors, are printed onto a light strip, and some bigger-size components, such as some inductors and/or electrolytic capacitors, are disposed in the end cap(s). The production process of the light strip in this case can be the same as that described above. And in this case, disposing some electronic components of the power supply module on the light strip is conducive to achieving a reasonable layout of the power supply module in the LED tube lamp, which may allow of an improved design in the end cap(s).

As a variation of the above embodiment, electronic components of a power supply module can be disposed on the light strip by embedding or inserting, for example, by embedding the electronic components onto the bendable or flexible light strip. In some embodiments, this embedding is preferably realized by using copper-clad laminates (CCL) with a resistor or capacitor formed; using ink related to silkscreen printing; or inkjet printing to embed passive components, wherein an inkjet printer is used to directly print conductive inks and inks with related functions as passive components and related functionalities to designated positions on the light strip. Then, through processing by ultraviolet (UV) light or drying/sintering, the light strip with embedded passive components is formed. The electronic components embedded onto the light strip can include for example, resistors, capacitors, and inductors. In some embodiments, active components may also be embedded. Through such design of embedding the components onto the light strip, a reasonable layout of the power supply module can be achieved to allow of an improved design in the end cap(s). Since some resistors and/or capacitors are embedded onto the light strip, precious surface area on a printed circuit board used for carrying components of the power supply module can be reduced or smaller, and as a result, the size, weight, and thickness of a resulting printed circuit board carrying components of the power supply module is also smaller or reduced. In addition, with such design, the soldering points on the printed circuit board for soldering the resistors and/or capacitors are eliminated, the reliability of the power supply module is improved, in view of the fact that these soldering points are most liable to cause faults, malfunctions, or failures. Further, the length of conductive lines needed for connecting components on the printed circuit board is reduced thereby, which allows of a more compact layout of components on the printed circuit board and thus improving electrical functionalities of these components.

Next, methods to produce embedded capacitors and resistors are explained as follows.

Usually, methods for manufacturing embedded capacitors employ or involve a concept called distributed or planar capacitance. As described herein, on a substrate of a copper layer, a very thin insulation layer is applied or pressed, which is generally disposed between a pair of layers including a power conductive layer and a ground layer. This thin insulation layer makes the distance between the power conductive layer and the ground layer very short. A capacitance resulting from this structure can also be realized by a conventional technique of a plated-through hole. Basically, this step is used to create a structure comprising a big parallel-plate capacitor on a circuit substrate.

Of products each of high electrical capacity or capacitance, certain types of products employ distributed capacitances, and other types of products employ separate embedded capacitances. Through putting or adding a high dielectric-constant material, such as barium titanate, into an insulation layer, such a high electrical capacity is achieved.

A usual method for manufacturing embedded resistors employs resistive adhesive. This may include, for example, a resin to which conductive carbon or graphite is added, can be used as an additive or filler. The additive resin is silkscreen printed to designated location, and then be processed to laminate inside a circuit board. The resulting resistor is connected to other electronic components through plated-through holes or microvias. Another method is called Ohmega-Ply, by which a two-metallic-layer structure of a copper layer and a thin nickel-alloy layer constitutes elements of a layer resistor formed relative to a substrate. Then through etching the copper layer and nickel-alloy layer, different nickel-alloy resistors with copper terminals can be formed. These resistors are each laminated in the circuit board.

In an embodiment, conductive wires/lines are directly printed in a linear layout on an inner surface of a glass lamp tube, with LED components directly attached on the inner surface and electrically connected by the conductive wires. In some embodiments, LED components in the form of chips are directly attached over the conductive wires on the inner surface, and connective points are disposed at terminals of the conductive wires for connecting the LED components and the power supply module. After being attached, the LED-component chips may have fluorescent powder applied or dropped thereon, for producing white light or light of other color by the operating LED tube lamp.

In some embodiments, luminous efficacy of the LED or LED component is 80 lm/W or above, and in some embodiments, it is preferably 120 lm/W or above, or more preferably 160 lm/W or above. White light emitted by an LED tube lamp in this disclosure can be produced by mixing fluorescent powder with monochromatic light emitted by a monochromatic LED chip. The white light's spectrum includes major wavelength ranges of 430-460 nm and 550-560 nm, or major wavelength ranges of 430-460 nm, 540-560 nm, and 620-640 nm.

It is also noted that the different configurations of circuit connection or layout of an LED module 50 illustrated in FIGS. 10A to 10I are not limited to being applied with an LED tube lamp, but can be applicable to other different types of LED lamps powered by AC electrical power (i.e., not provided by a ballast of an LED lamp), such as LED light bulbs, LED filament lamps, and integrally formed LED lamps, but the present disclosure is not limited to these recited types.

As mentioned above, electronic components of the power supply module can be disposed either on the circuit board disposed on the light strip or on the circuit board disposed in the end cap(s) of the tube lamp. For improving benefits or advantages of the power supply module, in some embodiments, capacitor(s) in the power supply module can be chip capacitor(s), such as multilayer ceramic chip capacitor(s), disposed either on the circuit board disposed on the light strip or on the circuit board disposed in the end cap(s). However, such disposed chip capacitor(s) is likely to produce or incur distinct noises due to piezoelectric effects during use, which may adversely affect the degree of comfort in using the LED tube lamp by consumers. To address and reduce this problem, in the LED tube lamp disclosed herein, a hole or groove can be disposed (directly) below the chip capacitor by drilling or boring, which may significantly reduce the noise by changing the vibration system formed under piezoelectric effects between the chip capacitor and the circuit board carrying the chip capacitor. The shape of the circumference of the hole or groove can be substantially close to, for example, a circle or round, an oval or ellipse, or a rectangle. In some embodiments, the hole or groove is formed in the conductive layer in the light strip, or in the circuit board disposed in the end cap(s), and below the chip capacitor(s).

Figure 11A:
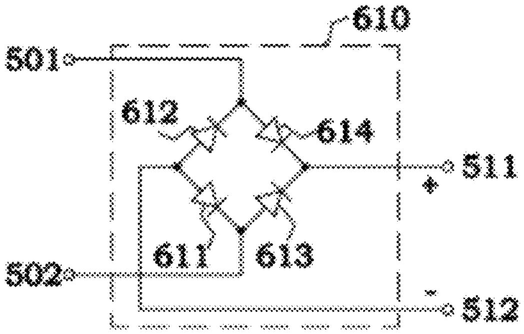
FIGS. 11A-11F are schematic circuit diagrams of exemplary rectifying circuits according to some exemplary embodiments.

FIG. 11A is a schematic circuit diagram of a rectifying circuit according to an embodiment. Referring to FIG. 11A, a rectifying circuit 610, i.e., a bridge rectifier, includes four rectifying diodes 611, 612, 613, and 614, configured to full wave rectify a received signal. The diode 611 has an anode connected to the output terminal 512, and a cathode connected to the pin 502. The diode 612 has an anode connected to the output terminal 512, and a cathode connected to the pin 501. The diode 613 has an anode connected to the pin 502, and a cathode connected to the output terminal 511. The diode 614 has an anode connected to the pin 501, and a cathode connected to the output terminal 511.

When the pins 501 and 502 receive an AC supply signal, the rectifying circuit 610 operates as follows. During the connected AC supply signal's positive half cycle, the AC supply signal is input through the pin 501, the diode 614, and the output terminal 511 in sequence, and later output through the output terminal 512, the diode 611, and the pin 502 in sequence. During the connected AC supply signal's negative half cycle, the AC supply signal is input through the pin 502, the diode 613, and the output terminal 511 in sequence, and later output through the output terminal 512, the diode 612, and the pin 501 in sequence. Therefore, during the connected AC supply signal's full cycle, the positive pole of the rectified signal produced by the rectifying circuit 610 keeps at the output terminal 511, and the negative pole of the rectified signal remains at the output terminal 512. Accordingly, the rectified signal produced or output by the rectifying circuit 610 is a full wave rectified signal.

When the pins 501 and 502 are coupled to a DC power supply to receive a DC signal, the rectifying circuit 610 operates as follows. When the pin 501 is coupled to the positive end of the DC power supply and the pin 502 to the negative end of the DC power supply, the DC signal is input through the pin 501, the diode 614, and the output terminal 511 in sequence, and later output through the output terminal 512, the diode 611, and the pin 502 in sequence. When the pin 501 is coupled to the negative end of the DC power supply and the pin 502 to the positive end of the DC power supply, the DC signal is input through the pin 502, the diode 613, and the output terminal 511 in sequence, and later output through the output terminal 512, the diode 612, and the pin 501 in sequence. Therefore, no matter what the electrical polarity of the DC signal is between the pins 501 and 502, the positive pole of the rectified signal produced by the rectifying circuit 610 keeps at the output terminal 511, and the negative pole of the rectified signal remains at the output terminal 512.

Therefore, the rectifying circuit 610 in this embodiment can output or produce a proper rectified signal regardless of whether the received input signal is an AC or DC signal.

Figure 11B:
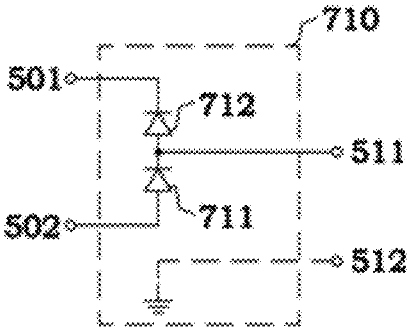

FIG. 11B is a schematic diagram of a rectifying circuit according to an embodiment. Referring to FIG. 11B, a rectifying circuit 710 includes two rectifying diodes 711 and 712, configured to half-wave rectify a received signal. The rectifying diode 711 has an anode connected to the pin 502, and a cathode connected to the rectifying output terminal 511. The rectifying diode 712 has an anode connected to the rectifying output terminal 511, and a cathode connected to the pin 501. The rectifying output terminal 512 can be omitted or connect to ground according to the practical application.

Detailed operations of the rectifying circuit 710 are described below.

During the connected AC supply signal's positive half cycle, the signal level of the AC supply signal input through the pin 501 is greater than the signal level of the AC supply signal input through the pin 502. At that time, both the rectifying diodes 711 and 712 are cut off since being reverse biased, and thus the rectifying circuit 710 stops outputting the rectified signal. During the connected AC supply signal's negative half cycle, the signal level of the AC supply signal input through the pin 501 is less than the signal level of the AC supply signal input through the pin 502. At that time, both the rectifying diodes 711 and 712 are conducting since they are forward biased, and thus the AC supply signal is input through the pin 502, the rectifying diode 711, and the rectifying output terminal 511 in sequence, and later output through the rectifying output terminal 512 or another circuit or ground of the LED tube lamp. Accordingly, the rectified signal produced or output by the rectifying circuit 710 is a half-wave rectified signal.

Figure 11C:
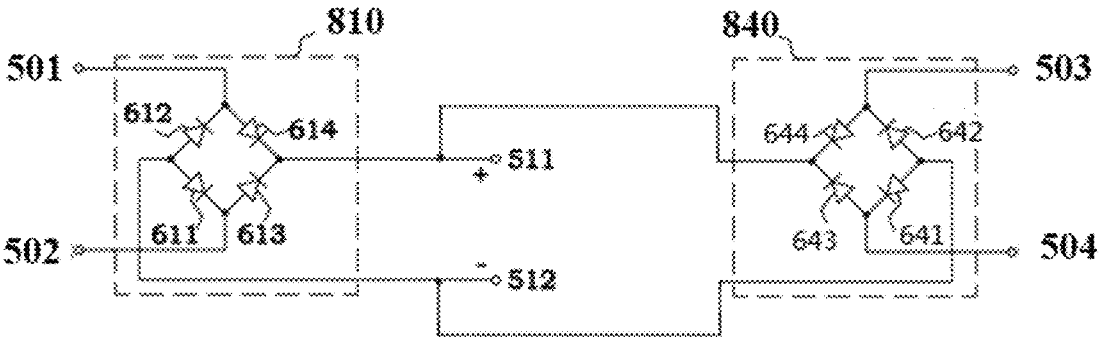

It should be noted that, when the pins 501 and 502 shown in FIG. 11A and FIG. 11B are respectively changed to the pins 503 and 504, the rectifying circuit 610 and 710 can be considered as the rectifying circuit 540 illustrated in FIG. 9B. More specifically, in an exemplary embodiment, when the full-wave rectifying circuit 610 shown in FIG. 11A is applied to the dual-end tube lamp shown in FIG. 9B, the configuration of the rectifying circuits 510 and 540 is shown in FIG. 11C. FIG. 11C is a schematic diagram of a rectifying circuit according to an embodiment.

Referring to FIG. 11C, the rectifying circuit 840 has the same configuration as the rectifying circuit 810, which is the bridge rectifying circuit. The rectifying circuit 810 includes four rectifying diodes 611 to 614, which has the same configuration as the embodiment illustrated in FIG. 11A. The rectifying circuit 840 includes four rectifying diodes 641 to 644 and is configured to perform full-wave rectification on the received signal. The rectifying diode 641 has an anode coupled to the rectifying output terminal 512, and a cathode coupled to the pin 504. The rectifying diode 642 has an anode coupled to the rectifying output terminal 512, and a cathode coupled to the pin 503. The rectifying diode 643 has an anode coupled to the pin 502, and a cathode coupled to the rectifying output terminal 511. The rectifying diode 644 has an anode coupled to the pin 503, and a cathode coupled to the rectifying output terminal 511.

In the present embodiment, the rectifying circuits 810 and 840 are configured to correspond to each other, in which the difference between the rectifying circuits 610 and 840 is that the input terminal of the rectifying circuit 810 (which can be used as the rectifying circuit 510 shown in FIG. 9B) is coupled to the pins 501 and 502, but the input terminal of the rectifying circuit 840 (which can be used as the rectifying circuit 540 shown in FIG. 9B) is coupled to the pins 503 and 504. Therefore, the present embodiment applies a structure including two full-wave rectifying circuits for implementing the dual-end-dual-pin circuit configuration.

Further, in a rectifying circuit shown in the embodiments of FIG. 11C, although a circuit configuration having two pins at each of the two ends of an LED tube lamp including the rectifying circuit is disposed for power supplying, each of other power-supplying ways, including providing power to only one end of an LED tube lamp and providing power to a conductive pin at each of the two ends of the LED tube lamp, may be adopted for providing power to the LED tube lamp with the circuit structure of the rectifying circuit in the embodiments of FIG. 10C. Specific operations in these embodiments are described below.

When the AC supply signal is provided through both pins on single end cap, the AC supply signal can be applied to the pins 501 and 502, or to the pins 503 and 504. When the AC supply signal is applied to the pins 501 and 502, the rectifying circuit 810 performs full-wave rectification on the AC supply signal based on the operation illustrated in the embodiment of FIG. 9A, and the rectifying circuit 840 does not operate. On the contrary, when the external driving signal is applied to the pins 503 and 504, the rectifying circuit 840 performs full-wave rectification on the AC supply signal based on the operation illustrated in the embodiment of FIG. 9A, and the rectifying circuit 810 does not operate.

When the AC supply signal is provided through a single pin on each end cap, the AC supply signal can be applied to the pins 501 and 504, or to the pins 502 and 503. When the AC supply signal is applied to the pins 501 and 504, during the AC supply signal's positive half cycle (e.g., the voltage at pin 501 is higher than the voltage at pin 504), the AC supply signal is input through the pin 501, the diode 614, and the output terminal 511 in sequence, and later output through the output terminal 512, the diode 641, and the pin 504 in sequence. In this manner, output terminal 511 remains at a higher voltage than output terminal 512. During the AC supply signal's negative half cycle (e.g., the voltage at pin 504 is higher than the voltage at pin 501), the AC supply signal is input through the pin 504, the diode 643, and the output terminal 511 in sequence, and later output through the output terminal 512, the diode 612, and the pin 501 in sequence. In this manner, output terminal 511 still remains at a higher voltage than output terminal 512. Therefore, during the AC supply signal's full cycle, the positive pole of the rectified signal remains at the output terminal 511, and the negative pole of the rectified signal remains at the output terminal 512. Accordingly, the diodes 612 and 614 of the rectifying circuit 810 and the diodes 641 and 643 of the rectifying circuit 840 are configured to perform the full-wave rectification on the AC supply signal and thus the rectified signal produced or output by the diodes 612, 614, 641, and 643 is a full-wave rectified signal.

On the other hand, when the AC supply signal as the external driving signal is applied to the pins 502 and 503, during the positive half cycle of the AC supply signal (e.g., the voltage at pin 502 is higher than the voltage at pin 503), the AC supply signal is input through the pin 503, the diode 644, and the input terminal 511 in sequence, and later output through the output terminal 512, the diode 611, and the pin 502. During the negative half cycle of the AC supply signal (e.g., the voltage at pin 503 is higher than the voltage at pin 502), the AC supply signal is input through the pin 502, the diode 613, and the output terminal 511 in sequence, and later output through the output terminal 512, the diode 642, and the pin 503 in sequence. Therefore, during the AC supply signal's full cycle, the positive pole of the rectified signal remains at the output terminal 511, and the negative pole of the rectified signal remains at the output terminal 512. Accordingly, the diodes 611 and 613 of the rectifying circuit 810 and the diodes 642 and 644 of the rectifying circuit 840 are configured to perform the full-wave rectification on the AC supply signal and thus the rectified signal produced and output by the diodes 611, 613, 642, and 644 is a full-wave rectified signal.

When the AC supply signal is provided through two pins on each end cap, the operation in each of the rectifying circuits 810 and 840 can be referred to the embodiment illustrated in FIG. 11A, and it will not be repeated herein. The rectified signal produced by the rectifying circuits 810 and 840 is output to the back-end circuit after superposing on the output terminals 511 and 512.

Figure 11D:
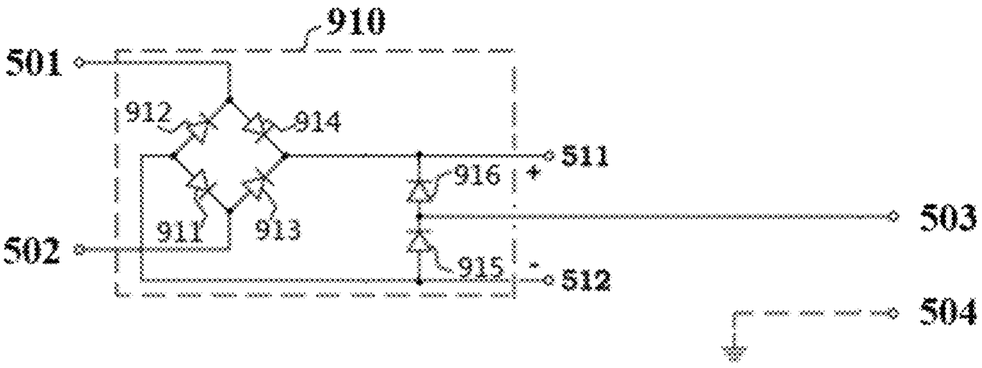

In an exemplary embodiment, the rectifying circuit 510 illustrated in FIG. 9C can be implemented by the configuration illustrated in FIG. 11D. FIG. 11D is a schematic diagram of a rectifying circuit according to an embodiment. Referring to FIG. 11D, the rectifying circuit 910 includes diodes 911 to 914, which are configured as the embodiment illustrated in FIG. 11A. In the present embodiment, the rectifying circuit 910 further includes rectifying diodes 915 and 916. The diode 915 has an anode coupled to the rectifying output terminal 512, and a cathode coupled to the pin 503. The diode 916 has an anode coupled to the pin 503, and a cathode coupled to the rectifying output terminal 511. The pin 504 is set to the float state in the present embodiment.

Specifically, the rectifying circuit 910 can be regarded as a rectifying circuit including three sets of bridge arms, in which each of the bridge arms provides an input signal receiving terminal. For example, the diodes 911 and 913 constitute a first bridge arm for receiving the signal on the pin 502; the diodes 912 and 914 constitute a second bridge arm for receiving the signal on the pin 501; and the diodes 915 and 916 constitute a third bridge arm for receiving the signal on the pin 503. According to the rectifying circuit 910 illustrated in FIG. 11D, the full-wave rectification can be performed as long as AC signal with different polarity are respectively received by two of the bridge arms. Accordingly, under the configuration illustrated in FIG. 11D, no matter what kind of power supply configuration, such as the AC supply signal being provided to both pins on a single end cap, a single pin on each end cap, or both pins on each end cap, the rectifying circuit 910 is compatible for producing the rectified signal, correctly. Detailed operations of the are described below.

When the AC supply signal is provided through both pins on single end cap, the AC supply signal can be applied to the pins 501 and 502. The diodes 911 to 914 perform full-wave rectification on the AC supply signal based on the operation illustrated in the embodiment of FIG. 11A, and the diodes 915 and 916 do not operate.

When the AC supply signal is provided through single pin on each end cap, the AC supply signal can be applied to the pins 501 and 503, or to the pins 502 and 503. When the AC supply signal is applied to the pins 501 and 503, during the AC supply signal's positive half cycle (e.g., when the signal on pin 501 has a greater voltage than the signal on pin 503), the AC supply signal is input through the pin 501, the diode 914, and the output terminal 511 in sequence, and later output through the output terminal 512, the diode 915, and the pin 503 in sequence. During the AC supply signal's negative half cycle (e.g., when the signal on pin 503 has a greater voltage than the signal on pin 501), the AC supply signal is input through the pin 503, the diode 916, and the output terminal 511 in sequence, and later output through the output terminal 512, the diode 912, and the pin 501 in sequence. Therefore, during the AC supply signal's full cycle, the positive pole of the rectified signal remains at the output terminal 511, and the negative pole of the rectified signal remains at the output terminal 512. Accordingly, the diodes 912, 914, 915, and 916 of the rectifying circuit 910 are configured to perform the full-wave rectification on the AC supply signal and thus the rectified signal produced or output by the diodes 912, 914, 915, and 916 is a full-wave rectified signal.

On the other hand, when an external driving signal is applied to the second pin 502 and third pin 503 and the external driving signal is an AC signal, during the positive half cycle of the AC signal, the AC signal is input and flows in through the third pin 503, the sixth rectifying diode 916, and the first rectifying output terminal 511 in sequence, and is later output and flows out through the second rectifying output terminal 512, the first rectifying diode 911, and the second pin 502 in sequence. During the negative half cycle of the AC signal, the AC signal is input and flows in through the second pin 502, the third rectifying diode 913, and the first rectifying output terminal 511 in sequence, and is later output and flows out through the second rectifying output terminal 512, the fifth rectifying diode 915, and the third pin 503 in sequence. Therefore, no matter whether the AC signal Is In the positive half cycle or negative half cycle thereof, the positive pole of the rectified signal remains at the first rectifying output terminal 511, and the negative pole of the rectified signal remains at the second rectifying output terminal 512. According to the above description of operations, the first, third, fifth, and sixth rectifying diodes 911, 913, 915, and 916 of the rectifying circuit 910 are configured to perform full-wave rectification on the AC signal and thus the output rectified signal is a full-wave rectified signal.

When the AC supply signal is provided through two pins on each end cap, the operation of the diodes 911 to 914 can be referred to the embodiment illustrated in FIG. 11A, and it will not be repeated herein. Also, if the signal polarity of the pin 503 is the same as the pin 501, the operation of the diodes 915 and 916 is similar to that of the diodes 912 and 914 (i.e., the first bridge arm). On the other hand, if the signal polarity of the pin 503 is the same as that of the pin 502, the operation of the diodes 915 and 916 is similar with the diodes 912 and 914 (i.e., the second bridge arm).

Figure 11E:
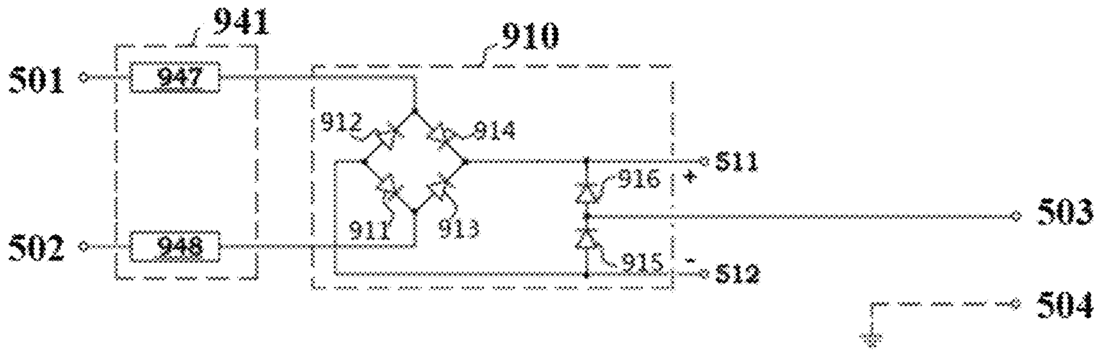

FIG. 11E is a circuit structure diagram of a rectifying circuit according to some exemplary embodiments. Referring to FIG. 11E, the embodiments shown in FIG. 11E similar to the embodiment of FIG. 11D, with a difference that input terminals of a first rectifying circuit 910 in FIG. 11E are coupled to a terminal adapter circuit 941. In these embodiments, the terminal adapter circuit 941 comprises fuses 947 and 948. The fuse 947 has an end connected to a first pin 501, and another end connected to a common node between a second rectifying diode 912 and a fourth rectifying diode 914, which is an input terminal of a first bridge arm. The fuse 948 has an end connected to a second pin 502, and another end connected to a common node between a first rectifying diode 911 and a third rectifying diode 913, which is an input terminal of a second bridge arm. With this structure, when a current flowing through the first pin 501 or second pin 502 exceeds a current rating of the fuse 947 or 948 respectively, the fuses 947 or 948 will correspondingly melt and then break the circuit in order to achieve overcurrent protection function. Besides, in the case that only one of the fuses 947 and 948 has melted, for example, when an overcurrent condition happened just briefly and soon disappeared, after the overcurrent condition disappeared the rectifying circuit in these embodiments may continue to operate steadily based on the power-supply configuration using one conductive pin at each of the two ends of the LED tube lamp including the rectifying circuit.

Figure 11F:
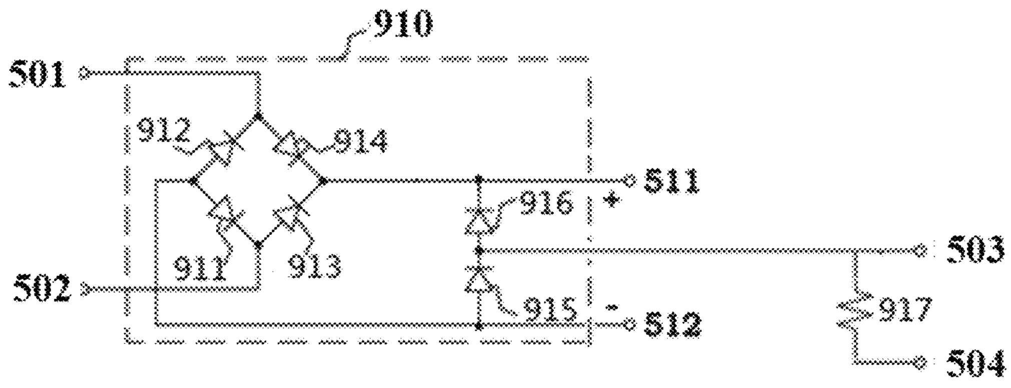

FIG. 11F is a circuit structure diagram of a rectifying circuit according to some exemplary embodiments. Referring to FIG. 11F, the embodiment shown in FIG. 11F is similar to the embodiment of FIG. 11D, with a difference that two pins 503 and 504 in FIG. 11F are connected to each other through a thin conductive line 917. Compared to the embodiments shown respectively in FIGS. 11D and 11E, when power supplying configuration using a pin at each of the two ends of the LED tube lamp is applied in the embodiments of FIG. 11F, no matter whether an external driving signal is input to the third pin 503 or fourth pin 504, the rectifying circuit in the embodiments of FIG. 11F can normally operate. Beside, when the third pin 503 and fourth pin 504 of the tube lamp are wrongly connected to the lamp socket/base configured for the power supplying configuration using only one of the two ends of the tube lamp, the thin conductive line 917 can be melted reliably, so that after the tube lamp is again connected to a suitable lamp socket, the tube lamp using the rectifying circuit in the embodiments of FIG. 11F can still perform normal rectification.

It can be known from the above description that the rectifying circuit in the embodiments of FIGS. 11C to 11F can be compatible with each of the situations of providing power to only one end of an LED tube lamp, providing power to a conductive pin at each of the two ends of an LED tube lamp, and providing power to two conductive pins at each of the two ends of an LED tube lamp, so as to improve an LED tube lamp's overall compatibility with different application environments. In addition, considering actual circuit layout circumstances, circuit configurations in a tube lamp in the embodiments of FIGS. 11C to 11F require merely three soldering pads disposed for connecting to corresponding pins at the two end caps, which few number of pads can significantly contribute to improving yields in the overall manufacturing process.

Figure 12A:
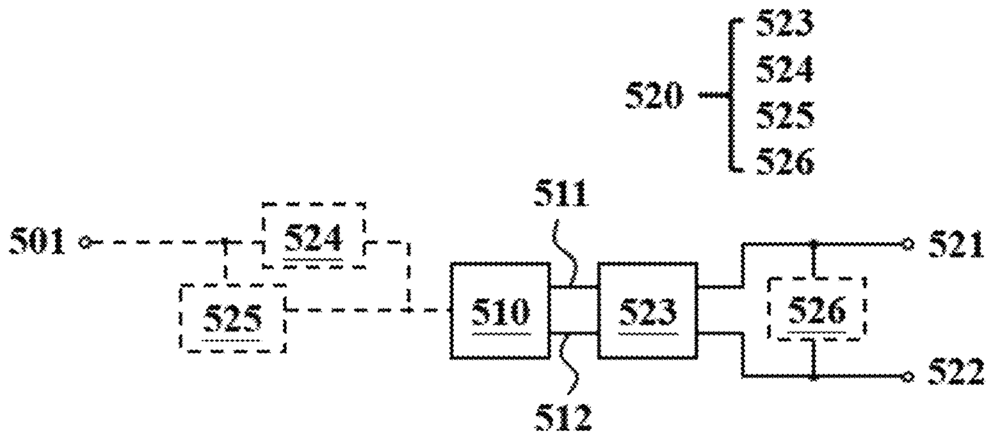
FIGS. 12A-12G are block diagrams of exemplary filtering circuits according to some exemplary embodiments.

FIG. 12A is a circuit block diagram of a filtering circuit according to some embodiments. The rectifying circuit 510 is shown in FIG. 12A for illustrating its connection with other circuits, without intending the filtering circuit 520 to include the rectifying circuit 510. Referring to FIG. 12A, the filtering circuit 520 includes a filtering unit 523 coupled to a first rectifying output terminal 511 and a second rectifying output terminal 512, in order to receive a rectified signal output from the rectifying circuit 510, to filter out ripples of the rectified signal, and then to output a filtered signal. Therefore, the waveform of the filtered signal is smoother than that of the rectified signal. The filtering circuit 520 may further include a filtering unit 524 coupled between a rectifying circuit and a corresponding conductive pin, in order to perform filtering with respect to a specific frequency, so as to filter out the specific frequency from the external driving signal. For example, a filtering unit 524 can be coupled between the first rectifying circuit 510 and a first pin 501, between the first rectifying circuit 510 and a second pin 502, between the second rectifying circuit 540 and a third pin 503, or between the second rectifying circuit 540 and a fourth pin 504. In the embodiments of FIG. 12A, the filtering unit 524 is coupled between a first pin 501 and the first rectifying circuit 510. The filtering circuit 520 may further include a filtering unit 525 coupled between one of the first and second pins 501 and 502 and one of the diodes of the first rectifying circuit 510, or between one of the third and fourth pins 503 and 504 and one of the diodes of the second rectifying circuit 540, in order to reduce or filter out electromagnetic interference (EMI). In the embodiments of FIG. 12A, the filtering unit 525 is coupled between the first pin 501 and one of diodes (not shown in FIG. 12A) of the first rectifying circuit 510.

In some embodiments, a filtering circuit 520 may further include a negative-voltage offsetting unit 526. The negative-voltage offsetting unit 526 is coupled to a filtering unit 523, in order to eliminate possible effects of a negative voltage generated during resonance occurring in the filtering unit 523, thereby preventing circuit chip(s) or controller(s) in a later-stage driving circuit from being damaged. Specifically, the filtering unit 523 is usually a circuit including a combination of resistor(s), capacitor(s), and/or inductor(s), wherein characteristics respectively of a capacitor and an inductor may cause the filtering unit 523 to exhibit purely resistive property under specific frequency (i.e., a resonance point). At the resonance point, a signal received by the filtering unit 523 will be amplified and then output, causing a phenomenon of signal oscillation observable at an output terminal of the filtering unit 523. When an amplitude of the signal oscillation is excessive to cause a wave-trough voltage level below a ground voltage level, a negative voltage will occur on the filtering output terminals 521 and 522, which negative voltage will be applied to, and thus liable to cause damages to, later-stage circuit(s). The negative-voltage offsetting unit 526 is configured to conduct a discharging loop when the negative voltage occurs, in order to release a reverse current caused by the negative voltage to a main power line through the discharging loop, thereby preventing the reverse current from flowing to later-stage circuit(s).

Since the filtering units 524 and 525 and the negative-voltage offsetting unit 526 may be added or omitted depending on circumstances of practical applications, the filtering units 524 and 525 and the negative-voltage offsetting unit 526 are depicted by dotted lines in FIG. 12A.

Figure 12B:
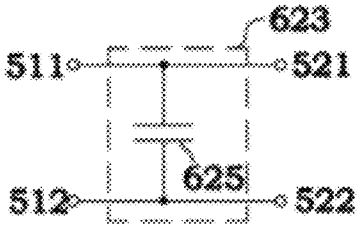

FIG. 12B is a schematic diagram of the filtering unit according to an embodiment. Referring to FIG. 12B, a filtering unit 623 includes a capacitor 625 having an end coupled to the output terminal 511 and a filtering output terminal 521 and the other end thereof coupled to the output terminal 512 and a filtering output terminal 522, and is configured to low-pass filter a rectified signal from the output terminals 511 and 512, so as to filter out high-frequency components of the rectified signal and thereby output a filtered signal at the filtering output terminals 521 and 522.

Figure 12C:
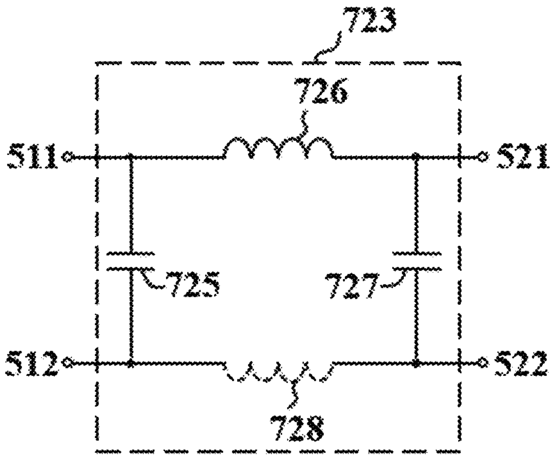

FIG. 12C is a circuit structure diagram of a filtering unit according to some embodiments. Referring to FIG. 12C, the filtering unit 723 includes a pi filter circuit including a capacitor 725, an inductor 726, and a capacitor 727, where the structure of the pi filter circuit is similar the symbol Tr. The capacitor 725 has an end coupled to a first rectifying output terminal 511 and coupled to a first filtering output terminal 521 through the inductor 726, and another end coupled to a second rectifying output terminal 512 and a second filtering output terminal 522. The inductor 726 is coupled between the first rectifying output terminal 511 and the first filtering output terminal 521. The capacitor 727 has an end coupled to the first rectifying output terminal 511 through the inductor 726 and coupled to the first filtering output terminal 521, and another end coupled to the second rectifying output terminal 512 and the second filtering output terminal 522.

Equivalently, the filtering unit 723 compared to the filtering unit 623 in FIG. 12B additionally has an inductor 726 and a capacitor 727, which perform the function of low pass filtering like the capacitor 725 does. Therefore, the filtering unit 723 in this embodiment compared to the filtering unit 623 in FIG. 12B has a better ability to filter out high-frequency components to output a filtered signal with a smoother waveform. In some embodiments, the filtering unit 723 further includes an inductor 728 serially connected between the second rectifying output terminal 512 and the second filtering output terminal 522. The inductance values of the inductor 726 and 728 in the embodiments mentioned above are chosen in the range of, for example, about 10 nH to 10 mH. And the capacitance values of the capacitors 625, 725, and 727 in the embodiments described above are chosen in the range of, for example, about 100 pF to 1 μF.

Figure 12D:
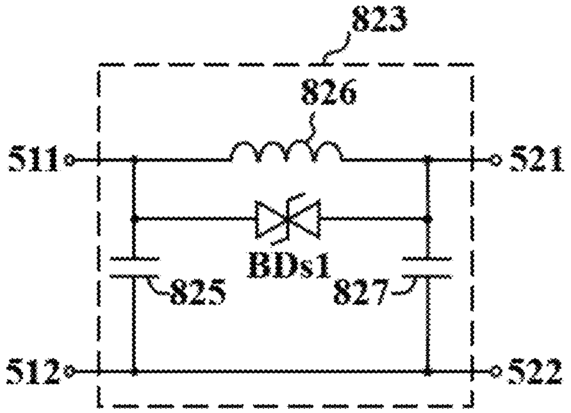

FIG. 12D is a circuit structure diagram of a filtering unit according to some embodiments. The embodiment shown in FIG. 12D is similar to the embodiment of FIG. 12C, with a difference that the filtering unit 823 in these embodiments of FIG. 12D further includes a voltage-controlled component BDs1 in addition to the inductor 826, and the capacitors 825 and 827. The voltage-controlled component BDs1 is connected in parallel with the inductor 826 and configured to conduct or cut off in response to the voltage across two ends of the inductor 826, wherein the voltage-controlled component BDs1 conducts only when the voltage across two ends of the inductor 826 is larger than a set value determined according to parameters of the voltage-controlled component BDs1. Through disposing the voltage-controlled component BDs1, when the power supply module is affected by a surge to induce instantaneous voltage variation across two ends of the inductor 826, the voltage-controlled component BDs1 can instantly conduct current to absorb suddenly increased electric energy, in real-time response to an instantaneous overvoltage condition, thereby preventing a surge current from damaging later-stage circuit(s). The voltage-controlled component BDs1 is illustrated as a symmetrical trigger diode (or a surge protection device) in FIG. 12D as an example but is not limited thereto.

In some embodiments, a filtering unit 823 may further have a disposed inductor (as an inductor 728 in FIG. 12C) serially connected between a second rectifying output terminal 512 and a second filtering output terminal 522. Under this disposition, the filtering unit 823 may further include a voltage-controlled component (not illustrated) connected in parallel with the added inductor, in order to avoid a surge current causing damages to later-stage circuit(s). The connection relationship between the voltage-controlled component and the added inductor can be understood by referencing the above-described connection relationship between the voltage-controlled component BDs1 and the inductor 826.

Figure 12E:
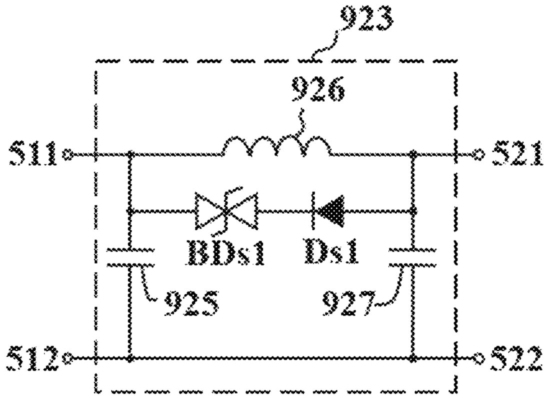

FIG. 12E is a circuit structure diagram of a filtering unit according to some embodiments. The embodiment shown in FIG. 12E is similar to the embodiment of FIG. 12D, with a difference that a filtering unit 923 in these embodiments of FIG. 12E further includes a current-limiting component Ds1 in addition to the inductor 926, the capacitors 925 and 927, and the voltage-controlled component BDs1. The current-limiting component Ds1 is connected in series to the voltage-controlled component BDs1 and is configured to limit the voltage-controlled component BDs1 to conduct current under only some certain states/conditions. Specifically, under a configuration including merely the voltage-controlled component BDs1 (as shown in FIG. 12D), no matter whether the voltage at a first end of the inductor 926 (or an end thereof connected to a first rectifying output terminal 511) exceeds that at a second end of the inductor 926 (or an end thereof connected to a first filtering output terminal 521) by a set value (hereinafter, referred to as "a first state"), or the voltage at the second end of the inductor 926 exceeds that at the first end of the inductor 926 by a set value (hereinafter, referred to as "a second state"), under each of these two states the voltage-controlled component BDs1 enters into a conducting state. On the other hand, under a configuration including both a voltage-controlled component BDs1 and a current-limiting component Ds1 (as shown in FIG. 12E), when the first state occurs, the current-limiting component Ds1 is in a cutoff state, causing the end of the voltage-controlled component BDs1 connected to the current-limiting component Ds1 to be in a floating state (or regarded as being electrically isolated from the second end of the inductor 926), thus preventing the voltage-controlled component BDs1 from conducting in response to the first state; but when a second state occurs, the current-limiting component Ds1 is in a conducting state, causing the end of the voltage-controlled component BDs1 connected to the current-limiting component Ds1 being equivalent to be electrically connected to the second end of the inductor 926, which further causes the voltage-controlled component BDs1 to conduct in response to the second state so as to discharge or consume surge energy.

In some embodiments, the current-limiting component Ds1 can be implemented as a diode (hereinafter referred to as the diode Ds1). The diode Ds1 has an anode electrically connected to a second end of an inductor 926, and a cathode electrically connected to a voltage-controlled component BDs1. Under this configuration, when the first state with respect to the inductor 926 occurs, the diode Ds1 is reverse-biased and thus kept in a cutoff state, causing an end of the voltage-controlled component BDs1 connected to the diode Ds1 to be in a floating state; but when a second state with respect to the inductor 926 occurs, the diode Ds1 is forward-biased and thus enters into a conducting state, causing the end of the voltage-controlled component BDs1 connected to the diode Ds1 to be electrically connected to the second end of the inductor 926.

In some embodiments, the filtering unit 923 may further have a disposed inductor (as an inductor 728 in FIG. 12C) serially connected between the second rectifying output terminal 512 and the second filtering output terminal 522. Under this disposition, the filtering unit 923 may further include a voltage-controlled component (not illustrated) and a current-limiting component (not illustrated), which are connected in parallel with the added inductor, in order to avoid a surge current causing damages to later-stage circuit (s). The connection relationship between the added inductor, voltage-controlled component, and current-limiting component can be understood by referencing the above-described connection relationship between the inductor 926, voltage-controlled component BDs1, and current-limiting component Ds1.

Figure 12F:
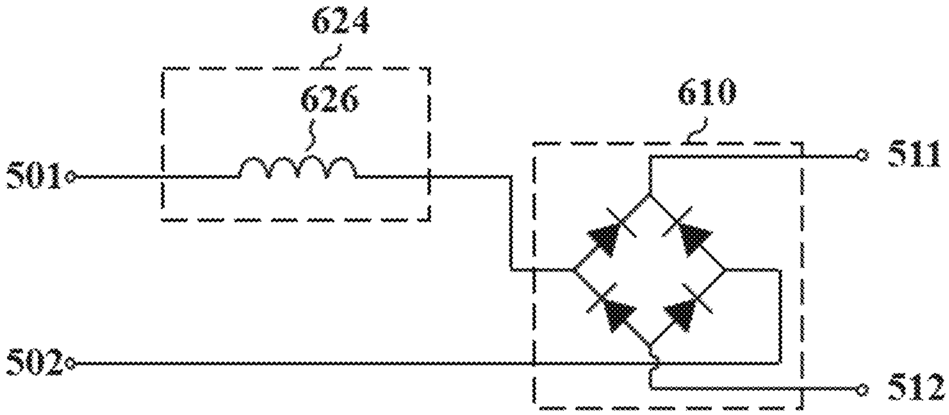

FIG. 12F is a circuit structure diagram of a filtering unit according to some embodiments. In the embodiment of FIG. 12F, the filtering unit 624 includes an inductor 626. The inductor 626 has a first end coupled to a first pin 501 and a second end coupled to a first rectifying input terminal of a rectifying circuit 610, in order to perform low-pass filtering to a power signal input through the first pin 501, to filter out high-frequency components in the power signal and then provide the filtered power signal to the rectifying circuit 610.

Figure 12G:
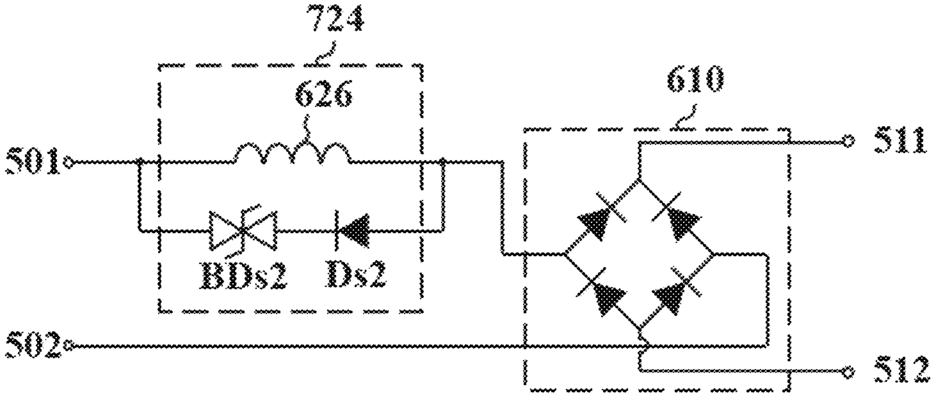

FIG. 12G is a circuit structure diagram of a filtering unit according to some embodiments. The embodiment of FIG. 12G is similar to the embodiment of FIG. 12F, with a difference that the filtering unit 724 in FIG. 12G further includes a current-limiting component Ds2 and a voltage-controlled component BDs2 in addition to an inductor 626. The current-limiting component Ds2 is connected in series with the voltage-controlled component BDs2. The voltage-controlled component BDs2 has a first end electrically connected to a first end of the inductor 626, and a second end electrically connected to a second end of the current-limiting component Ds2, which has a first end electrically connected to a second end of the inductor 626. In the embodiment of FIG. 12G, when a first state occurs, the current-limiting component Ds2 is in a cutoff state, causing the end of the voltage-controlled component BDs2 connected to the current-limiting component Ds2 to be in a floating state (or regarded as being electrically isolated from the second end of the inductor 626), thus preventing the voltage-controlled component BDs2 from conducting in response to the first state; but when a second state occurs, the current-limiting component Ds2 is in a conducting state, causing the end of the voltage-controlled component BDs2 connected to the current-limiting component Ds2 being equivalent to be electrically connected to the second end of the inductor 626, which further causes the voltage-controlled component BDs2 to conduct in response to the second state so as to discharge or consume surge energy.

Figure 12H:
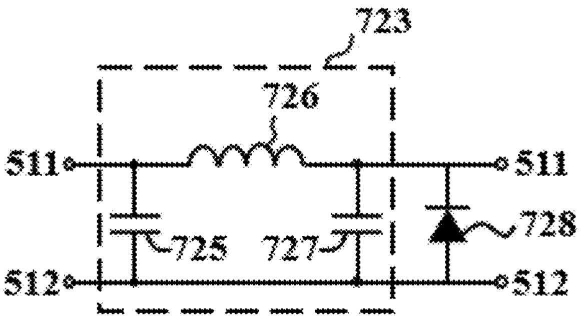
FIG. 12H is a circuit diagram of a filtering unit 723 and a negative voltage clipping unit according to an embodiment of the present disclosure.

FIG. 12H is a circuit diagram of a filtering unit 723 and a negative voltage clipping unit according to an embodiment of the present disclosure. Referring to FIG. 12H, in this embodiment the negative voltage clipping unit is implemented by a diode 728, although the present disclosure is not limited thereto. When resonance of the filtering unit 723 does not occur, the first filtering output terminal 521 has a voltage level higher than that at the second filtering output terminal 522, so that the diode 728 is cutoff to prevent a current to flow through. On the other hand, when resonance of the filtering unit 723 occurs to cause the negative voltage, the second filtering output terminal 522 has a voltage level higher than that at the first filtering output terminal 521, causing the diode 728 to conduct due to the forward bias voltage across it, which conduction then releases a reverse current due to the negative voltage back to the first filtering output terminal 521.

Figure 13A:
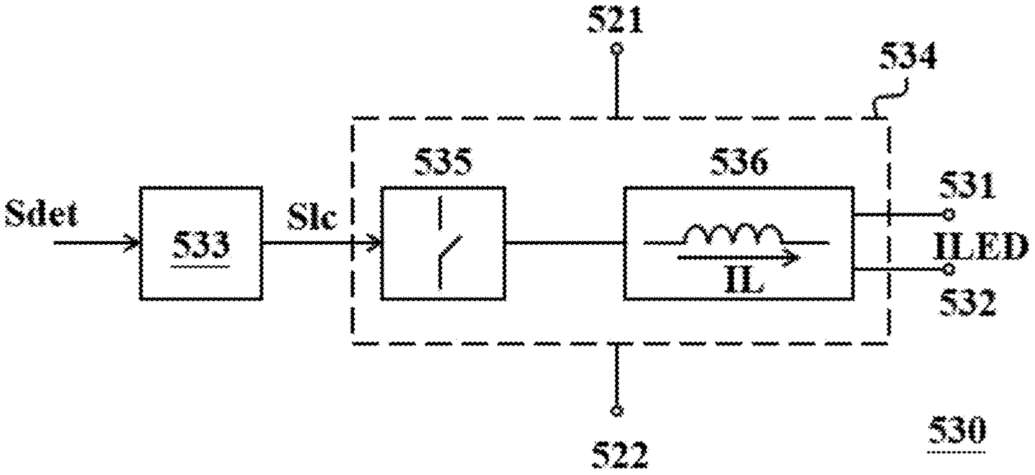
FIG. 13A is a block diagram of a driving circuit according to some exemplary embodiments.

FIG. 13A is a block diagram of the driving circuit according to an embodiment. Referring to FIG. 13A, the driving circuit 530 includes a controller 533, and a conversion circuit 534 for power conversion based on a current source, for driving an LED module to emit light. The conversion circuit 534 includes a switching circuit 535 (also known as a power switch) and an energy storage circuit 536. And the conversion circuit 534 is coupled to first and second filtering output terminals 521 and 522 in order to receive and then convert a filtered signal, under the control by the controller 533, into a driving signal at first and second driving output terminals 531 and 532 for driving the LED module. Under the control by the controller 533, the driving signal output by the conversion circuit 534 comprises a steady current, making the LED module emit steady light.

Figure 14A:
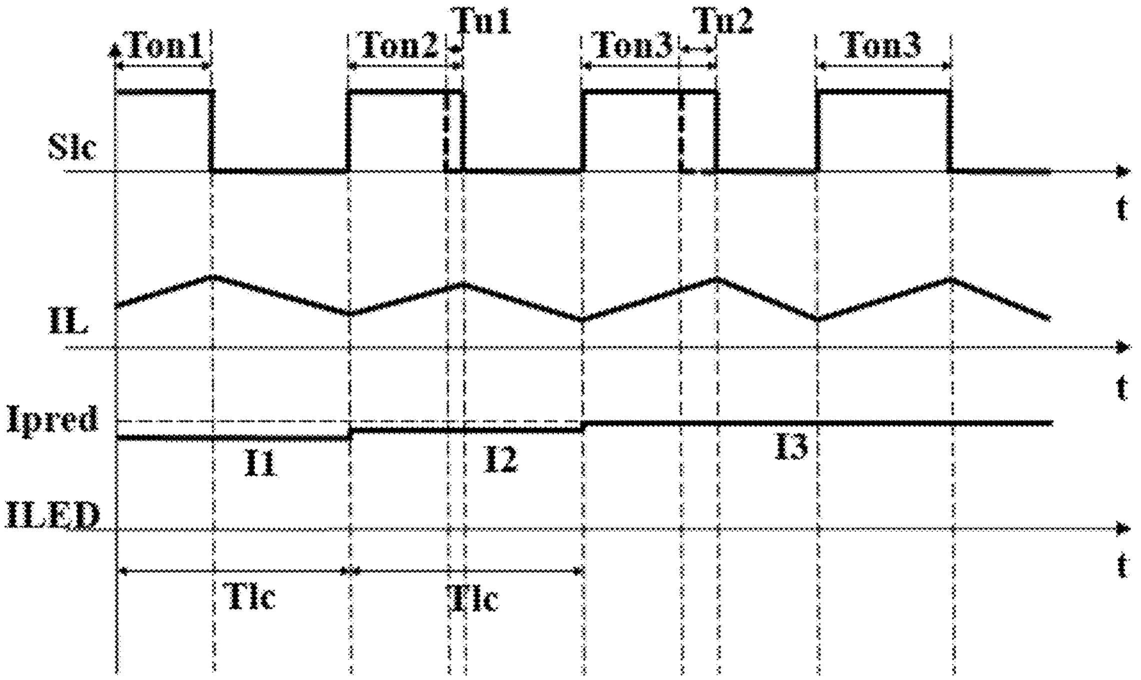
FIGS. 14A-14D are signal waveform diagrams of exemplary driving circuits according to some exemplary embodiments.
Figure 14B:
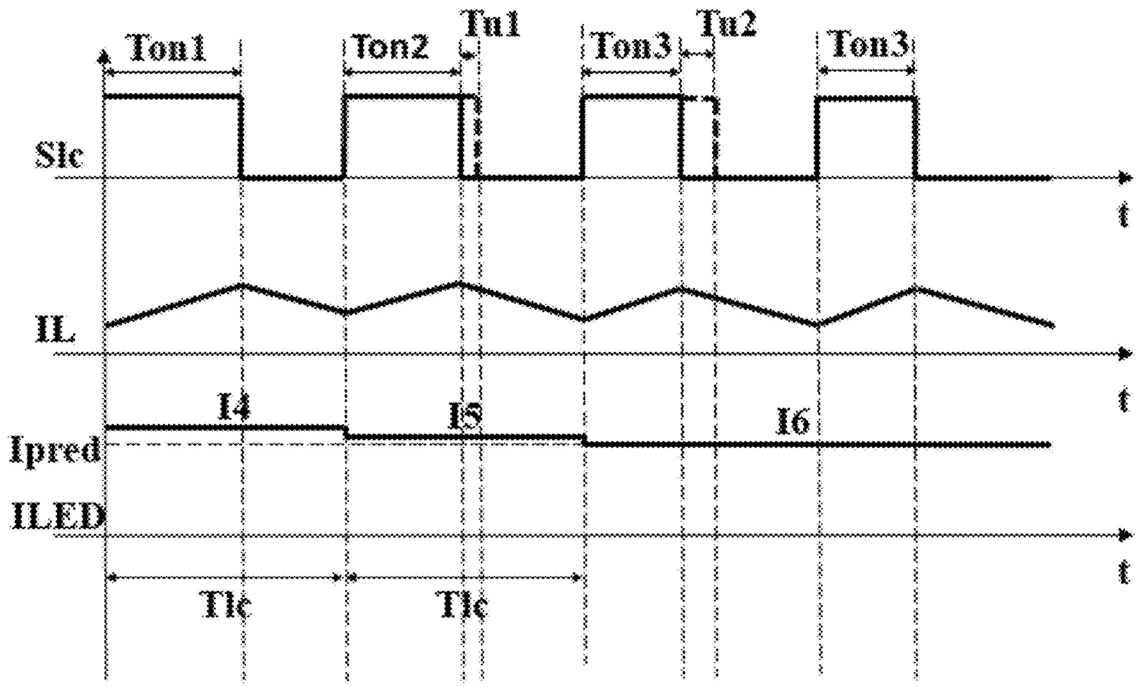
Figure 14C:
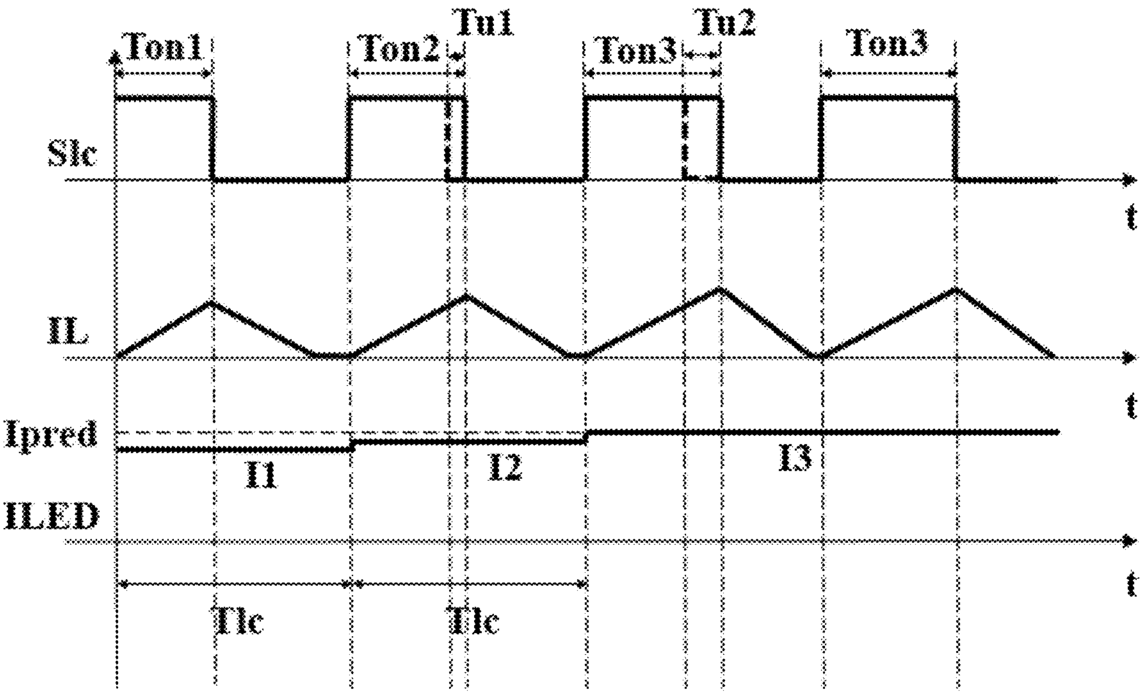
Figure 14D:
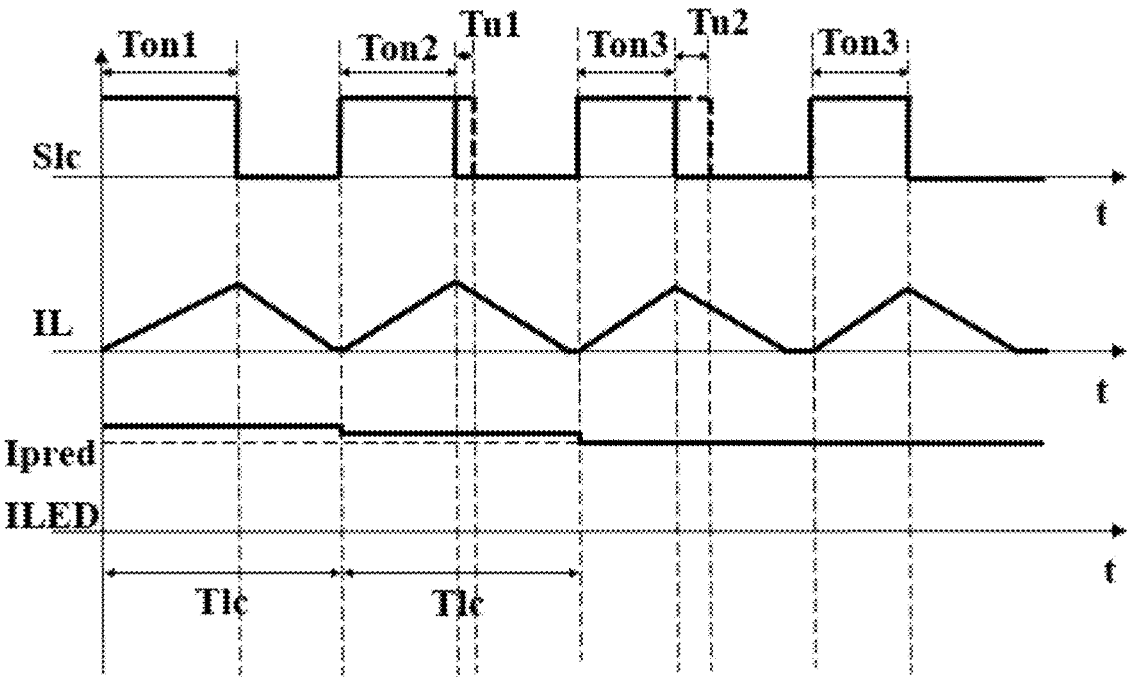

The operation of the driving circuit 530 is further described based on the signal waveform illustrated in FIGS. 14A to 14D. FIGS. 14A to 14D are signal waveform diagrams of exemplary driving circuits according to some exemplary embodiments, in which FIGS. 14A and 14B illustrate the signal waveform and the control condition when the driving circuit 530 is operated in a Continuous-Conduction Mode (CCM) and FIGS. 14C and 14D illustrate the signal waveform and the control condition when the driving circuit 530 is operated in a Discontinuous-Conduction Mode (DCM). In signal waveform diagrams, the horizontal axis represents time (represent by a symbol "t"), and the vertical axis represents a voltage or current value (depending on the type of the signal).

The controller 533 can be, for example, a constant current controller which can generate a lighting control signal Slc and adjust the duty cycle of the lighting control signal Slc based on a current detection signal Sdet, so that the switch circuit 535 is turned on or off in response to the lighting control signal Slc. The energy storage circuit 536 is repeatedly charged and discharged according to the on/off state of the switch circuit 535, so that the driving current ILED received by the LED module 50 can be stably maintained at a predetermined current value Ipred. In some embodiments, the lighting control signal Slc may have fixed signal period Tlc and signal amplitude, and the pulse-on period (also known as the pulse width) of each signal period Tlc, such as Ton1, Ton2 and Ton3, can be adjusted according to the control requirement. In the present embodiment, the duty cycle of the lighting control signal Slc represents a ratio of the pulse-on period and the signal period Tlc. For example, when the pulse-on period Ton1 is 40% of the signal period Tlc, the duty cycle of the lighting control signal Slc under the first signal period Tlc is 0.4.

In addition, the signal level of the current detection signal may represent the magnitude of the current flowing through the LED module 50 or represent the magnitude of the current flowing through the switching circuit 535; the present disclosure is not limited thereto.

Referring to FIGS. 13A and 14A, FIG. 14A illustrates the signal waveform variation of the driving circuit 530 during a plurality of signal periods Tlc when the driving current ILED is smaller than the predetermined current value Ipred. Specifically, under the first signal period Tlc, the switching circuit 535 is turned on during the pulse-on period Ton1 in response to the high-level voltage of the lighting control signal Slc. In the meantime, the conversion circuit 534 provides the driving current ILED to the LED module 50 according to an input power received from the first and the second filtering output terminals 521 and 522, and further charges the energy storage circuit 536 via the turned-on switch circuit 535, so that the current IL flowing through the energy storage circuit 536 gradually increases. In this manner, during the pulse-on period Ton1, the energy storage circuit 536 is charged in response to the input power received from the first and the second filtering output terminals 521 and 522.

After the pulse-on period Ton1, the switch circuit 535 is turned off in response to the low-level voltage of the lighting control signal Slc. During a cut-off period of the switch circuit 535, the input power output from the first and the second filtering output terminals 521 and 522 would not be provided to the LED module 50, and the driving current ILED is dominated by the energy storage circuit 536 (i.e., the driving current ILED is generated by the energy storage circuit 536 by discharging). Due to the energy storage circuit 536 discharging during the cut-off period, the current IL is gradually decreased. Therefore, even when the lighting control signal Slc is at the low level (i.e., the disabled period of the lighting control signal Slc), the driving circuit 530 continuously supply power to the LED module 50 by discharging the energy storage circuit 536. In this embodiment, no matter whether the switch circuit 535 is turned on or off, the driving circuit 530 continuously provides a stable driving current ILED to the LED module 50, and the current value of the driving current ILED is I1 during the first signal period Tlc.

Under the first signal period Tlc, the controller 533 determines the current value I1 of the driving current ILED is smaller than the predetermined current value Ipred, so that the pulse-on period of the lighting control signal Slc is adjusted to Ton2 when entering the second signal period Tlc. The length of the pulse-on period Ton2 equals to the length of the pulse-on period Ton1 plus a unit period Tu1.

Under the second signal period Tlc, the operation of the switch circuit 535 and the energy storage circuit 536 are similar to the operation under the first signal period Tlc. The difference of the operation between the first and the second signal periods Tlc is the energy storage circuit 536 has relatively longer charging time and shorter discharging time since the pulse-on period Ton2 is longer than pulse-on period Ton1. Therefore, the average current value of the driving current ILED under the second signal period Tlc is increased to a current value I2 closer to the predetermined current value Ipred.

Similarly, since the current value I2 of the driving current ILED is still smaller than the predetermined current value Ipred, the controller 533 further adjusts, under the third signal period Tlc, the pulse-on period of the lighting control signal Slc to Ton3, in which the length of the pulse-on period Ton3 equals the length of the pulse-on period Ton2 plus the unit period Tu1 and equals the pulse enable period Ton1 plus the period Tu2 (equivalent to two unit periods Tu1). Under the third signal period Ton3, the operation of the switch circuit 535 and the energy storage circuit 536 are similar to the operation under the first and the second signal periods Tlc. Due to the pulse-on period Ton3 being further increased in comparison with the pulse-on period Ton1 and Ton2, the current value of the driving current ILED is increased to I3, and substantially reaches the predetermined current value Ipred. Since the current value I3 of the driving current ILED has reached the predetermined current value Ipred, the controller 533 maintains the same duty cycle after the third signal period Tlc, so that the driving current ILED can be substantially maintained at the predetermined current value Ipred.

Referring to FIGS. 13A and 14B, FIG. 14B illustrates the signal waveform variation of the driving circuit 530 during a plurality of signal periods Tlc when the driving current ILED is larger than the predetermined current value Ipred. Specifically, under the first signal period Tlc, the switching circuit 535 is turned on during the pulse-on time Ton1 in response to the high-level voltage of the lighting control signal Slc. In the meantime, the conversion circuit 534 provides the driving current ILED to the LED module 50 according to an input power received from the first and the second filtering output terminals 521 and 522, and further charges the energy storage circuit 536 via the turned-on switch circuit 535, so that the current IL flowing through the energy storage circuit 536 gradually increases. As a result, during the pulse-on time Ton1, the energy storage circuit 536 is charged in response to the input power received from the first and the second filtering output terminals 521 and 522.

After the pulse-on time Ton1, the switch circuit 535 is turned off in response to the low-level voltage of the lighting control signal Slc. During a cut-off period of the switch circuit 535, the input power output from the first and the second filtering output terminals 521 and 522 would not be provided to the LED module 50, and the driving current ILED is dominated by the energy storage circuit 536 (i.e., the driving current ILED is generated by the energy storage circuit 536 by discharging). Due to the energy storage circuit 536 discharging during the cut-off period, the current IL is gradually decreased. Therefore, even when the lighting control signal Slc is at the low level (i.e., the disabled period of the lighting control signal Slc), the driving circuit 530 continuously supplies power to the LED module 50 by discharging the energy storage circuit 536. Accordingly, no matter whether the switch circuit 535 is turned on or turned off, the driving circuit 530 continuously provides a stable driving current ILED to the LED module 50, and the current value of the driving current ILED is I4 during the first signal period Tlc.

Under the first signal period Tlc, the controller 533 determines the current value I4 of the driving current ILED is larger than the predetermined current value Ipred, so that the pulse-on time of the lighting control signal Slc is adjusted to Ton2 when entering the second signal period Tlc. The length of the pulse-on time Ton2 equals to the length of the pulse-on time Ton1 minus the unit period Tu1.

Under the second signal period Tlc, the operation of the switch circuit 535 and the energy storage circuit 536 are similar to the operation under the first signal period Tlc. The difference of the operation between the first and the second signal periods Tlc is the energy storage circuit 536 has relatively shorter charging time and longer discharging time since the pulse-on time Ton2 is shorter than pulse-on time Ton1. Therefore, the average current value of the driving current ILED under the second signal period Tlc is decreased to a current value I5 closer to the predetermined current value Ipred.

Similarly, since the current value I5 of the driving current ILED is still larger than the predetermined current value Ipred, the controller 533 further adjusts, under the third signal period Tlc, the pulse-on time of the lighting control signal Slc to Ton3, in which the length of the pulse-on time Ton3 equals to the length of the pulse-on time Ton2 minus the unit period Tu1. Under the third signal period Tlc, the operation of the switch circuit 535 and the energy storage circuit 536 are similar to the operation under the first and the second signal periods Tlc. Since the pulse-on time Ton3 is further decreased in comparison with the pulse-on time Ton1 and Ton2, the current value of the driving current ILED is decreased to I6, so that the driving current ILED substantially reaches the predetermined current value Ipred. Since the current value I6 of the driving current ILED has reached the predetermined current value Ipred, the controller 533 maintains the same duty cycle after the third signal period Tlc, so that the driving current ILED can be substantially maintained on the predetermined current value Ipred.

According to the above operations, the driving circuit 530 may adjust, by a stepped approach, the pulse-on time/pulse width of the lighting control signal Sic, so that the driving current ILED is gradually adjusted to be close to the predetermined current value Ipred. Therefore, the constant current output can be realized.

In the present embodiment, the driving circuit 530 is operated in CCM for example, which means the energy storage circuit 536 will not be discharged to zero current (i.e., the current IL will not be decreased to zero) during the cut-off period of the switch circuit 535. By utilizing the driving circuit 530 operating in CCM to provide power to the LED module 50, the power provided to the LED module 50 can be more stable and has a low ripple.

The control operation of the driving circuit 530 operating in DCM will be described below. Referring to FIGS. 13A and 14C, the operation and the signal waveform of the driving circuit 530 illustrated in FIG. 14C are similar to the FIG. 14A. The difference between the FIGS. 14C and 14A is that the driving circuit 530 in FIG. 14C operates in DCM, so that the energy storage circuit 536 discharges, during the pulse-off time of the lighting control signal Slc, to zero current (i.e., the current IL equals to zero) and then recharges in the next signal period Tlc. The other operation of the driving circuit 530 can be referred to the embodiments of FIG. 14A and will not be described in detail herein.

Referring to FIGS. 13A and 14D, the operation and the signal waveform of the driving circuit 530 illustrated in FIG. 14D are similar to that of FIG. 14B. The difference between the FIGS. 14D and 14B is that the driving circuit 530 in FIG. 14D operates in DCM, so that the energy storage circuit 536 discharges, during the pulse-off time of the lighting control signal Slc, to zero current (i.e., the current IL decreases to zero) and then re-charges in the next signal period Tlc. The other operation of the driving circuit 530 can be referred to the embodiments of FIG. 14B and will not be described in detail herein.

By utilizing the driving circuit 530 operating in DCM to provide power to the LED module 50, the driving circuit 530 may have lower power consumption, so as to obtain higher power conversion efficiency.

It is noted that although a single-stage DC-to-DC converter circuit is taken as an example of the mentioned driving circuit 530, the driving circuit 530 in this disclosure is not limited to such type of circuit. For example, the driving circuit 530 may comprise a two-stage driving circuit including an active power-factor correction circuit and a DC-to-DC converter circuit. In other words, any power conversion circuit structure that can be used for driving LED light sources can be applied in the present disclosure.

In addition, the embodiments of the power conversion operation described above are not limited to be utilized in a tube lamp. The embodiments can be applied to any kind of LED lamp directly powered by the mains electricity/commercial electricity (i.e., the AC power without passing a ballast), such as an LED bulb, an LED filament lamp, an integrated LED lamp or etc. The disclosure is not limited to these specific examples.

Figure 13B:
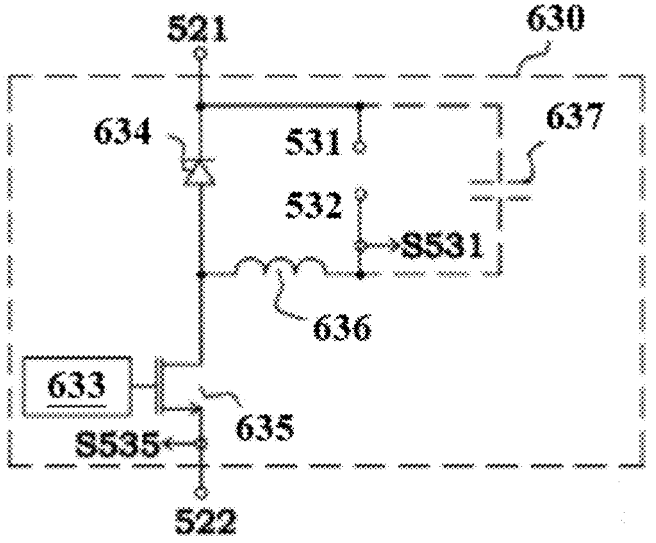
FIGS. 13B-13E are schematic diagrams of exemplary driving circuits according to some exemplary embodiments.

FIG. 13B is a schematic diagram of the driving circuit according to an embodiment of the present disclosure. Referring to FIG. 13B, a driving circuit 630 in this embodiment comprises a buck DC-to-DC converter circuit having a controller 633 and a conversion circuit. The conversion circuit includes an inductor 636, a diode 634 for "freewheeling" of current, a capacitor 637, and a switch 635. The driving circuit 630 is coupled to the filtering output terminals 521 and 522 to receive and then convert a filtered signal into a lamp driving signal for driving an LED module connected between the driving output terminals 531 and 532.

In this embodiment, the switch 635 includes a metal-oxide-semiconductor field-effect transistor (MOSFET) and has a first terminal coupled to the anode of freewheeling diode 634, a second terminal coupled to the filtering output terminal 522, and a control terminal coupled to the controller 633 used for controlling current conduction or cutoff between the first and second terminals of switch 635. The driving output terminal 531 is connected to the filtering output terminal 521, and the driving output terminal 532 is connected to an end of the inductor 636, which has another end connected to the first terminal of switch 635. The capacitor 637 is coupled between the driving output terminals 531 and 532 to stabilize the voltage between the driving output terminals 531 and 532. The freewheeling diode 634 has a cathode connected to the driving output terminal 531.

Next, a description follows as to an exemplary operation of the driving circuit 630.

The controller 633 is configured for determining when to turn the switch 635 on (in a conducting state) or off (in a cutoff state) according to a current detection signal S535 and/or a current detection signal S531. For example, in some embodiments, the controller 633 is configured to control the duty cycle of switch 635 being on and switch 635 being off in order to adjust the size or magnitude of the lamp driving signal. The current detection signal S535 represents the magnitude of current through the switch 635. The current detection signal S531 represents the magnitude of current through the LED module coupled between the driving output terminals 531 and 532. The controller 633 may control the duty cycle of the switch 635 being on and off, based on, for example, a magnitude of a current detected based on current detection signal S531 or S535. As such, when the magnitude is above a threshold, the switch may be off (cutoff state) for more time, and when magnitude goes below the threshold, the switch may be on (conducting state) for more time. According to any of current detection signal S535 or current detection signal S531, the controller 633 can obtain information on the magnitude of power converted by the conversion circuit. When the switch 635 is switched on, a current of a filtered signal is input through the filtering output terminal 521, and then flows through the capacitor 637, the driving output terminal 531, the LED module, the inductor 636, and the switch 635, and then flows out from the filtering output terminal 522. During this flowing of current, the capacitor 637 and the inductor 636 are performing storing of energy. On the other hand, when the switch 635 is switched off, the capacitor 637 and the inductor 636 perform releasing of stored energy by a current flowing from the freewheeling diode 634 to the driving output terminal 531 to make the LED module continuing to emit light.

From another aspect, the driving circuit 630 can maintain a stable current flowing through the LED module. Therefore, as for some LED modules (such as white, red, blue, or green LED modules), the phenomenon of the color temperature changing with the magnitude of a current can be improved or reduced. That is, the color temperature of the LED module driven by the driving circuit 630 can be maintained constant or stable even with different luminance of the LED module. When a switch 635 is cut off, the Inductor 636 acting as an energy-storage circuit discharges the stored energy thereof, such that the LED module is able to keep lighting steadily, while preventing a current/voltage on the LED module from abruptly dropping to a minimum value. As a result, when the switch 635 is conducting again, rising of the current/voltage on the LED module does not need to start from the minimum value to a maximum value, so as to avoid intermittent light emission by the LED module and thereby to improve overall illumination/luminance of the LED module, to allow reduction of a minimum conduction period, and to allow increasing of a driving signal's frequency.

Figure 13C:
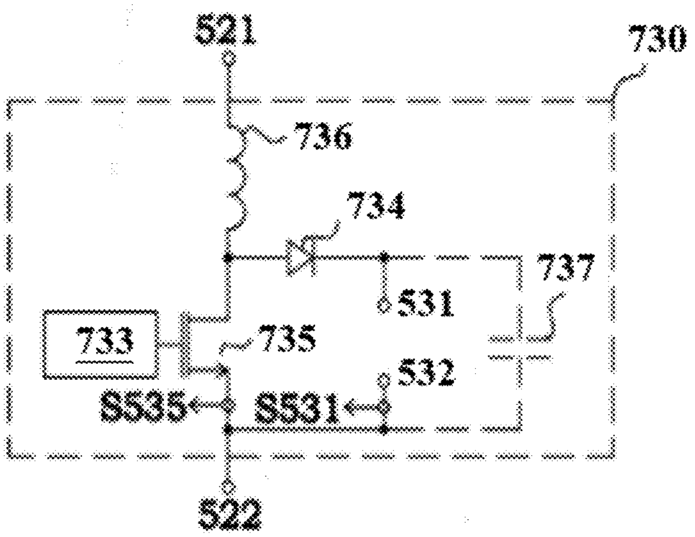

FIG. 13C is a schematic diagram of the driving circuit according to an embodiment of the present disclosure. Referring to FIG. 13C, a driving circuit 730 in this embodiment comprises a boost DC-to-DC converter circuit having a controller 733 and a converter circuit. The converter circuit includes an inductor 736, a diode 734 for "freewheeling" of current, a capacitor 737, and a switch 735. The driving circuit 730 is configured to receive and then convert a filtered signal from the filtering output terminals 521 and 522 into a lamp driving signal for driving an LED module coupled between the driving output terminals 531 and 532.

The inductor 736 has an end connected to the filtering output terminal 521, and another end connected to the anode of freewheeling diode 734 and a first terminal of the switch 735, which has a second terminal connected to the filtering output terminal 522 and the driving output terminal 532. The freewheeling diode 734 has a cathode connected to the driving output terminal 531. And the capacitor 737 is coupled between the driving output terminals 531 and 532.

The controller 733 is coupled to a control terminal of switch 735 and is configured for determining when to turn the switch 735 on (in a conducting state) or off (in a cutoff state), according to a current detection signal S535 and/or a current detection signal S531. When the switch 735 is switched on, a current of a filtered signal is input through the filtering output terminal 521, and then flows through the inductor 736 and the switch 735, and then flows out from the filtering output terminal 522. During this flowing of current, the current through the inductor 736 increases with time, with the inductor 736 being in a state of storing energy, while the capacitor 737 enters a state of releasing energy, making the LED module continuing to emit light. On the other hand, when the switch 735 is switched off, the inductor 736 enters a state of releasing energy as the current through the inductor 736 decreases with time. In this state, the current through the inductor 736 then flows through the freewheeling diode 734, the capacitor 737, and the LED module, while the capacitor 737 enters a state of storing energy.

In some embodiments, the capacitor 737 is an optional element, so it can be omitted and is thus depicted as a dotted line in FIG. 13C. When the capacitor 737 is omitted and the switch 735 is switched on, the current of inductor 736 does not flow through the LED module, making the LED module does not emit light; but when the switch 735 is switched off, the current of inductor 736 flows through the freewheeling diode 734 to reach the LED module, making the LED module emit light. Therefore, by controlling the time that the LED module emits light, and the magnitude of current through the LED module, the average luminance of the LED module can be stabilized to be above a defined value, thus also achieving the effect of emitting a steady light.

For detecting magnitude of current flowing through the switch 735, a detection resistor (not shown) may be disposed between the switch 735 and the second filtering output terminal 522, according to some embodiments of the present disclosure. When the switch 735 is conducting, current flowing through the detection resistor will cause a voltage difference across two terminals of the detection resistor, so using or sending current detection signal S535 to control the controller 733 can be based on the voltage across the detection resistor, namely the voltage difference between the two terminals of the detection resistor. However, at the instant that the LED tube lamp is powered up or is struck by lightning, for example, a relatively large current (as high as 10 A or above) is likely to occur on a circuit loop on the switch 735 that may damage the detection resistor and the controller 733. Therefore, in some embodiments, the driving circuit 730 may further include a clamping component, which is connected to the detection resistor. The clamping component performs a clamping operation on the circuit loop of the detection resistor when a current flowing through the detection resistor or the voltage difference across the detection resistor exceeds a threshold value, so as to limit a current to flow through the detection resistor. In some embodiments, the clamping component may comprise for example a plurality of diodes connected in series and the diode series are connected in parallel with the detection resistor. In such a configuration, when a large current occurs on a circuit loop on the switch 735, the diode series in parallel with the detection resistor will quickly conduct current, so as to limit a voltage across the detection resistor to a specific voltage level. For example, if the diode series comprises 5 diodes, since the forward bias voltage of a diode is about 0.7 V, the diode series can clamp the voltage across the detection resistor to be about 3.5 V.

From another aspect, a driving circuit 730 can maintain a stable current flow through the LED module. Therefore, the color temperature may not change with the current for some LED modules, such as white, red, blue, or green LED modules. For example, an LED can retain the same color temperature under different illumination conditions. In some embodiments, because the inductor 736 acting as the energy-storing circuit releases the stored power when the switch 735 cuts off, the voltage/current flowing through the LED module remains above a predetermined voltage/current level so that the LED module may continue to emit light maintaining the same color temperature. In this way, when the switch 735 conducts again, the voltage/current flowing through the LED module does not need to be adjusted to go from a minimum value to a maximum value. Accordingly, the problem of flickering in the LED module can be avoided, the entire illumination can be improved, the lowest conducting period can be smaller, and the driving frequency can be higher.

Figure 13D:
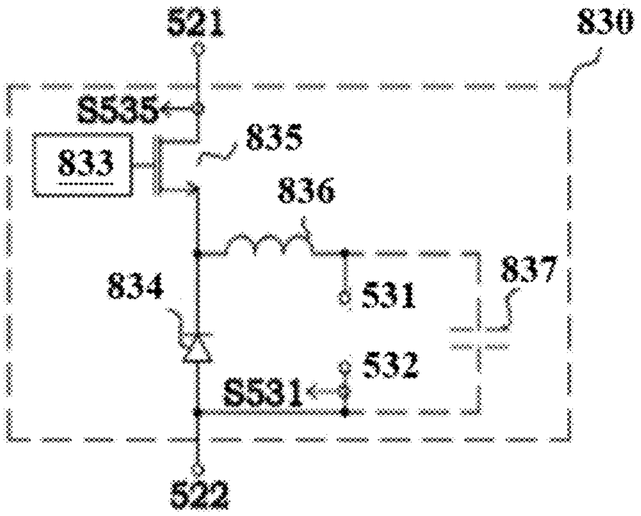

FIG. 13D is a schematic diagram of the driving circuit according to an exemplary embodiment of the present disclosure. Referring to FIG. 13D, a driving circuit 830 in this embodiment comprises a buck DC-to-DC converter circuit having a controller 833 and a conversion circuit. The conversion circuit includes an inductor 836, a diode 834 for "freewheeling" of current, a capacitor 837, and a switch 835. The driving circuit 830 is coupled to the filtering output terminals 521 and 522 to receive and then convert a filtered signal into a lamp driving signal for driving an LED module connected between the driving output terminals 531 and 532.

The switch 835 has a first terminal coupled to the filtering output terminal 521, a second terminal coupled to the cathode of freewheeling diode 834, and a control terminal coupled to the controller 833 to receive a control signal from the controller 833 for controlling current conduction or cutoff between the first and second terminals of the switch 835. The anode of freewheeling diode 834 is connected to the filtering output terminal 522 and the driving output terminal 532. The inductor 836 has an end connected to the second terminal of switch 835, and another end connected to the driving output terminal 531. The capacitor 837 is coupled between the driving output terminals 531 and 532 to stabilize the voltage between the driving output terminals 531 and 532.

The controller 833 is configured for controlling when to turn the switch 835 on (in a conducting state) or off (in a cutoff state) according to a current detection signal S535 and/or a current detection signal S531. When the switch 835 is switched on, a current of a filtered signal is input through the filtering output terminal 521, and then flows through the switch 835, the inductor 836, and the driving output terminals 531 and 532, and then flows out from the filtering output terminal 522. During this flowing of current, the current through the inductor 836 and the voltage of the capacitor 837 both increase with time, so the inductor 836 and the capacitor 837 are in a state of storing energy. On the other hand, when the switch 835 is switched off, the inductor 836 is in a state of releasing energy and thus the current through it decreases with time. In this case, the current through the inductor 836 circulates through the driving output terminals 531 and 532, the freewheeling diode 834, and back to the inductor 836.

In some embodiments the capacitor 837 is an optional element, so it can be omitted and is thus depicted as a dotted line in FIG. 13D. When the capacitor 837 is omitted, no matter whether the switch 835 is turned on or off, the current through the inductor 836 will flow through the driving output terminals 531 and 532 to drive the LED module to continue emitting light.

And then from another point of view, the driving circuit 830 can maintain a stable current flow through the LED module. Therefore, the color temperature may not change with the current for some LED modules, such as white, red, blue, or green LED modules. For example, an LED can retain the same color temperature under different illumination conditions. In some embodiments, because the inductor 836 acting as the energy-storing circuit releases the stored power when the switch 835 cuts off, the voltage/current flowing through the LED module remains above a predetermined voltage/current level so that the LED module may continue to emit light maintaining the same color temperature. In this way, when the switch 835 conducts again, the voltage/current flowing through the LED module does not need to be adjusted to go from a minimum value to a maximum value. Accordingly, the problem of flickering in the LED module can be avoided, the entire illumination can be improved, the lowest conducting period can be smaller, and the driving frequency can be higher.

Figure 13E:
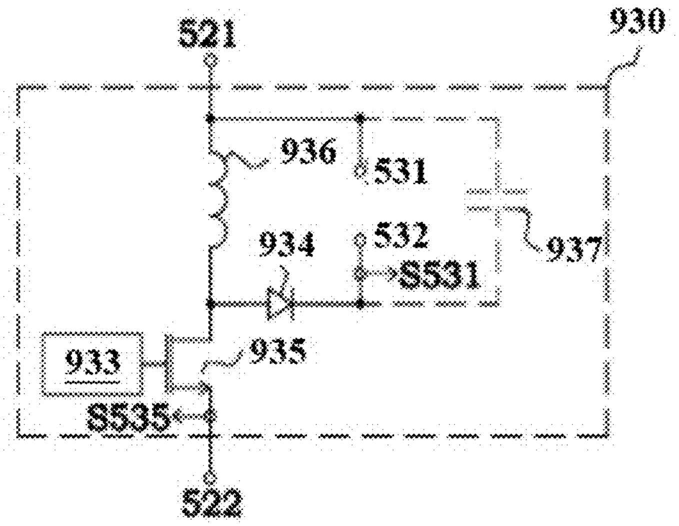

FIG. 13E is a schematic diagram of the driving circuit according to an exemplary embodiment of the present disclosure. Referring to FIG. 13E, a driving circuit 930 in this embodiment comprises a buck DC-to-DC converter circuit having a controller 933 and a conversion circuit. The conversion circuit includes an inductor 936, a diode 934 for "freewheeling" of current, a capacitor 937, and a switch 935. The driving circuit 930 is coupled to the filtering output terminals 521 and 522 to receive and then convert a filtered signal into a lamp driving signal for driving an LED module connected between the driving output terminals 531 and 532.

The inductor 936 has an end connected to the filtering output terminal 521 and the driving output terminal 532, and another end connected to a first end of the switch 935. The switch 935 has a second end connected to the filtering output terminal 522, and a control terminal connected to controller 933 to receive a control signal from controller 933 for controlling current conduction or cutoff of the switch 935. The freewheeling diode 934 has an anode coupled to a node connecting the inductor 936 and the switch 935, and a cathode coupled to the driving output terminal 531. The capacitor 937 is coupled to the driving output terminals 531 and 532 to stabilize the driving of the LED module coupled between the driving output terminals 531 and 532.

The controller 933 is configured for controlling when to turn the switch 935 on (in a conducting state) or off (in a cutoff state) according to a current detection signal S531 and/or a current detection signal S535. When the switch 935 is turned on, a current is input through the filtering output terminal 521, and then flows through the inductor 936 and the switch 935, and then flows out from the filtering output terminal 522. During this flowing of current, the current through the inductor 936 increases with time, so the inductor 936 is in a state of storing energy; but the voltage of the capacitor 937 decreases with time, so the capacitor 937 is in a state of releasing energy to keep the LED module continuing to emit light. On the other hand, when the switch 935 is turned off, the inductor 936 is in a state of releasing energy and its current decreases with time. In this case, the current through the inductor 936 circulates through the freewheeling diode 934, the driving output terminals 531 and 532, and back to the inductor 936. During this circulation, the capacitor 937 is in a state of storing energy and its voltage increases with time.

In some embodiments the capacitor 937 is an optional element, so it can be omitted and is thus depicted as a dotted line in FIG. 13E. When the capacitor 937 is omitted and the switch 935 is turned on, the current through the inductor 936 doesn't flow through the driving output terminals 531 and 532, thereby making the LED module does not emit light. On the other hand, when the switch 935 is turned off, the current through the inductor 936 flows through the freewheeling diode 934 and then the LED module to make the LED module emit light. Therefore, by controlling the time that the LED module emits light, and the magnitude of current through the LED module, the average luminance of the LED module can be stabilized to be above a defined value, thus also achieving the effect of emitting a steady light.

From another aspect, a driving circuit 930 can maintain a stable current flow through the LED module. Therefore, the color temperature may not change with the current for some LED modules, such as white, red, blue, or green LED modules. For example, an LED can retain the same color temperature under different illumination conditions. In some embodiments, because the inductor 936 acting as the energy-storing circuit releases the stored power when the switch 935 cuts off, the voltage/current flowing through the LED module remains above a predetermined voltage/current level so that the LED module may continue to emit light maintaining the same color temperature. In this way, when the switch 935 conducts again, the voltage/current flowing through the LED module does not need to be adjusted to go from a minimum value to a maximum value. Accordingly, the problem of flickering in the LED module can be avoided, the entire illumination can be improved, the lowest conducting period can be smaller, and the driving frequency can be higher.

With reference back to FIGS. 6A and 6B, a short circuit board 253 includes a first short circuit substrate and a second short circuit substrate respectively connected to two terminal portions of a long circuit sheet 251, and electronic components of the power supply module are respectively disposed on the first short circuit substrate and the second short circuit substrate. The first short circuit substrate and the second short circuit substrate may have roughly the same length, or different lengths. In general, the first short circuit substrate (i.e., the right circuit substrate of short circuit board 253 in FIG. 6A and the left circuit substrate of short circuit board 253 in FIG. 6B) has a length that is about 30%-80% of the length of the second short circuit substrate (i.e., the left circuit substrate of short circuit board 253 in FIG. 6A and the right circuit substrate of short circuit board 253 in FIG. 6B). In some embodiments the length of the first short circuit substrate is about ⅓-⅔ of the length of the second short circuit substrate. For example, in one embodiment, the length of the first short circuit substrate may be about half the length of the second short circuit substrate. The length of the second short circuit substrate may be, for example in the range of about 15 mm to about 65 mm, depending on actual application occasions. In certain embodiments, the first short circuit substrate is disposed in an end cap at an end of the LED tube lamp, and the second short circuit substrate is disposed in another end cap at the opposite end of the LED tube lamp.

For example, capacitors of the driving circuit, such as the capacitors 637, 737, 837, and 937 in FIGS. 13B-13E, in practical use may include two or more capacitors connected in parallel. Some or all capacitors of the driving circuit in the power supply module may be arranged on the first short circuit substrate of short circuit board 253, while other components such as the rectifying circuit, filtering circuit, inductor(s) of the driving circuit, controller(s), switch(es), diodes, etc. are arranged on the second short circuit substrate of short circuit board 253. Since the inductors, controllers, switches, etc. are electronic components with higher temperature, arranging some or all capacitors on a circuit substrate separate or away from the circuit substrate(s) of high-temperature components helps prevent the working life of capacitors (especially electrolytic capacitors) from being negatively affected by the high-temperature components, thus improving the reliability of the capacitors. Further, the physical separation between the capacitors and both the rectifying circuit and filtering circuit also contributes to reducing the problem of EMI.

In one embodiment of the LED tube lamp, components of the driving circuit that have relatively high temperature during operation are disposed at one terminal of the lamp tube (which can be referred as a first end of the lamp tube), and the rest of components of the driving circuit are disposed at another terminal of the lamp tube (which can be referred as a second end of the lamp tube). In a lighting system of a plurality of LED tube lamps, the LED tube lamps can be connected to lamp sockets/bases in an arrangement where some of the LED tube lamps are inverted, that is, a first end of each tube lamp is positioned close/adjacent to the opposite second end of a close positioned tube lamp of the rest of the plurality of LED tube lamps. By this arrangement, relatively higher-temperature components can be evenly distributed/disposed among the plurality of LED tube lamps, so as to avoid heat concentration on a certain location among the plurality of LED tube lamps, which heat concentration may adversely affect lighting efficiency of the overall LED tube lamps.

In certain exemplary embodiments, the conversion efficiency of the driving circuits is above 80%. In some embodiments, the conversion efficiency of the driving circuits is above 90%. In still other embodiments, the conversion efficiency of the driving circuits is above 92%. The illumination efficiency of the LED lamps is above 120 lm/W. In some embodiments, the illumination efficiency of the LED lamps is above 160 lm/W. The illumination efficiency including the combination of the driving circuits and the LED modules is above 120 lm/W*90%=108 lm/W. In some embodiments, the illumination efficiency including the combination of the driving circuits and the LED modules is above 160 lm/W*92%=147.21 lm/W.

In some embodiments, the transmittance of the diffusion film in the LED tube lamp is above 85%. As a result, in certain embodiments, the illumination efficiency of the LED lamps is above 108 lm/W*85%=91.8 lm/W. In some embodiments, the illumination efficiency of the LED lamps is above 147.21 lm/W*85%=125.12 lm/W.

Figure 15A:
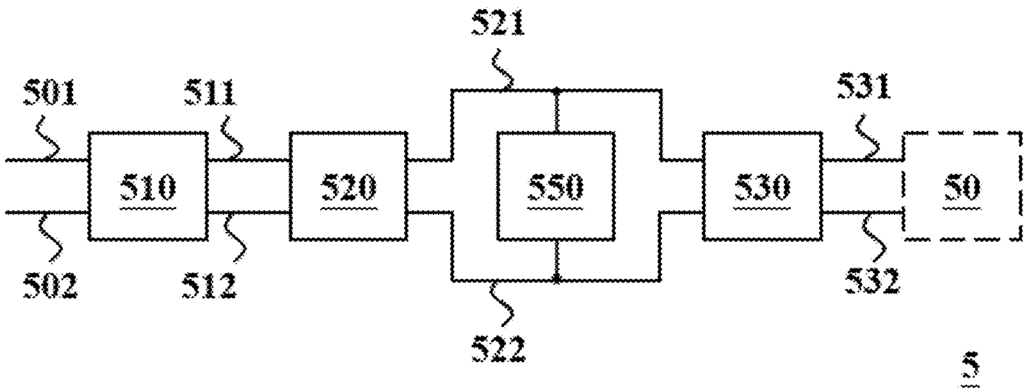
FIG. 15A is a block diagram of an exemplary power supply module of an LED tube lamp according to some exemplary embodiments.

FIG. 15A is a block diagram of a power supply module in an LED tube lamp according to an exemplary embodiment. Compared to that shown in FIG. 9A, the present embodiment comprises a rectifying circuit 510, a filtering circuit 520, and a driving circuit 530, and further comprises an over voltage protection (OVP) circuit 550. The OVP circuit 550 is coupled to the filtering output terminals 521 and 522 for detecting the filtered signal. The OVP circuit 550 clamps the logic level of the filtered signal when determining the logic level thereof higher than a defined OVP value. Hence, the OVP circuit 550 protects the LED module 50 from damage due to an OVP condition.

Figure 15B:
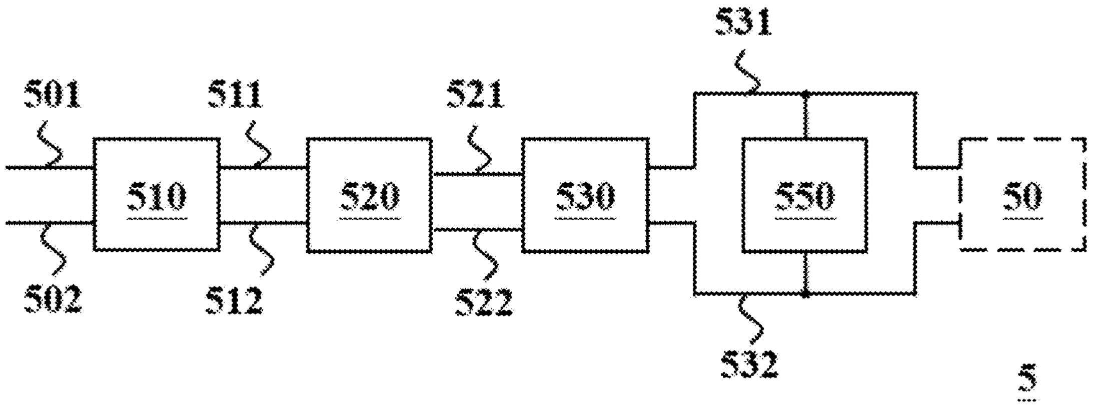
FIG. 15B is a block diagram of an exemplary power supply module of an LED tube lamp according to some exemplary embodiments.

FIG. 15B is a circuit block diagram of a power supply module according to some embodiments. Referring to FIG. 15B, the power supply module 5 in the embodiment is similar to the power supply module 5 in FIG. 15A, with a difference that an overvoltage protection circuit 550 in the embodiment is disposed between a driving circuit 530 and an LED module 50. That is, the overvoltage protection circuit 550 is coupled to a first driving output terminal 531 and a second driving output terminal 532, in order to detect a driving signal and to clamp a voltage level of the driving signal when the voltage level the driving signal exceeds a set overvoltage value. Therefore, the overvoltage protection circuit 550 can protect components of the LED module 50 from being damaged due to an excessive high voltage.

Figure 15C:
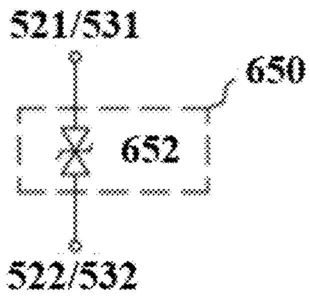
FIG. 15C is a block diagram of an overvoltage protection circuit according to some embodiments.

FIG. 15C is a schematic diagram of an overvoltage protection (OVP) circuit according to an exemplary embodiment. An OVP circuit 650 comprises a voltage clamping diode 652, such as Zener diode, coupled to the filtering output terminals 521 and 522. The voltage clamping diode 652 is conducted to clamp a voltage difference at a breakdown voltage when the voltage difference of the filtering output terminals 521 and 522 (i.e., the logic level of the filtered signal) reaches the breakdown voltage. In some embodiments, the breakdown voltage may be in a range of about 40 V to about 100 V. In certain embodiments, the breakdown voltage may be in a range of about 55 V to about 75V.

Figure 15D:
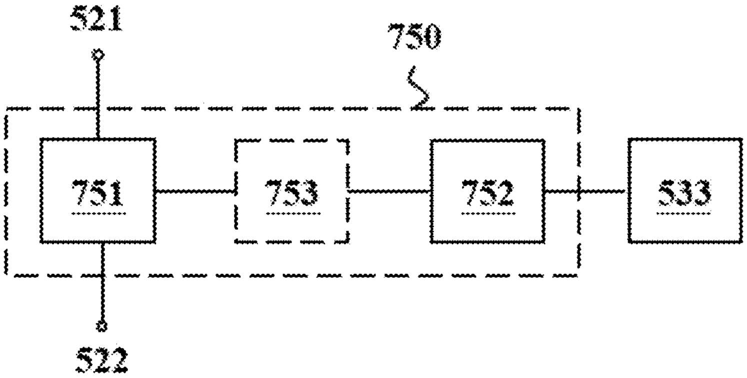
FIG. 15D is a block diagram of an overvoltage protection circuit according to some embodiments.

FIG. 15D is a block diagram of an overvoltage protection circuit according to some embodiments. Referring to FIG. 15D, the overvoltage protection circuit 750 includes a voltage sampling circuit 751 and an enabling circuit 752, in which the voltage sampling circuit 751 is coupled to filtering output terminals 521 and 522 in order to receive the filtered signal. The enabling circuit 752 is coupled to an output terminal of the voltage sampling circuit 751 and has an output terminal coupled to a controller 533 of a driving circuit. The voltage sampling circuit 751 is configured to sample the filtered signal in order to produce a voltage detection signal for the enabling circuit 752. The voltage detection signal may comprise e.g., a voltage sampled from the filtered signal. Therefore, the enabling circuit 752 can determine whether to activate overvoltage protection, according to the voltage detection signal, to control the state of operation of the controller 533 accordingly.

In the embodiment(s) including the overvoltage protection circuit 750, when the LED tube lamp receives an external driving signal having excessive voltage, an enabling circuit 752 can activate or enable overvoltage protection in response to a sample voltage signal, in order to reduce or cut off outputting current from a controller 533, thereby preventing the LED tube lamp from being damaged due to receiving unexpected excessive voltage. For example, when the LED tube lamp is connected to an electronic ballast that does not comply with specification or requirements or outputs excessive voltage, the LED tube lamp is exposed under the risk of operating in high-voltage condition. On the other hand, when the overvoltage protection circuit 750 is disposed in the LED tube lamp, overvoltage protection can be enabled to reduce the output current/power from the driving circuit or even stop the driving circuit from outputting the driving current when the peak/effect value of the external driving voltage exceeds a specific threshold.

In some embodiments, the overvoltage protection circuit 750 further includes a delaying circuit 753 coupled to the voltage sampling circuit 751 and the enabling circuit 752 and configured for affecting the voltage detection signal provided by the voltage sampling circuit 751 to the enabling circuit 752, in order to avoid an incidence in which under specific application environments a starting but excessive voltage received by the LED tube lamp causes a misoperation or wrong operation of the enabling circuit 752 in response to the voltage detection signal. The way that the delaying circuit affects the voltage detection signal may, for example, be implemented by reducing the rising speed of the level of the voltage detection signal or suppressing instantaneous change in the voltage detection signal, in order to prevent the sudden jump of the voltage detection signal from immediately causing the enabling circuit 752 to activate or enable overvoltage protection.

For instance, under the situation in which an LED tube lamp is used or supplied by an instant-start ballast, upon an electrical power supply being connected or applied to the LED tube lamp, the LED tube lamp receives an instantaneously high voltage, which may cause misoperation or wrong operation of the enabling circuit 752. If the LED tube lamp is configured to include a delaying circuit 753, the instantaneously high voltage provided by the instant-start ballast applied to the voltage sampling circuit 751 will be suppressed by the delaying circuit 753 and will not be directly reflected in the voltage detection signal, so as to prevent misoperation or wrong operation of the enabling circuit 752. From another perspective, the delaying circuit 753 delays transmission of the voltage detection signal output by the voltage sampling circuit 751 and then causes transmission of the delayed voltage detection signal to the enabling circuit 752. And the following description explains a plurality of circuit structure embodiments of the overvoltage protection circuit 750 with reference to FIGS. 15E-15H.

Figure 15E:
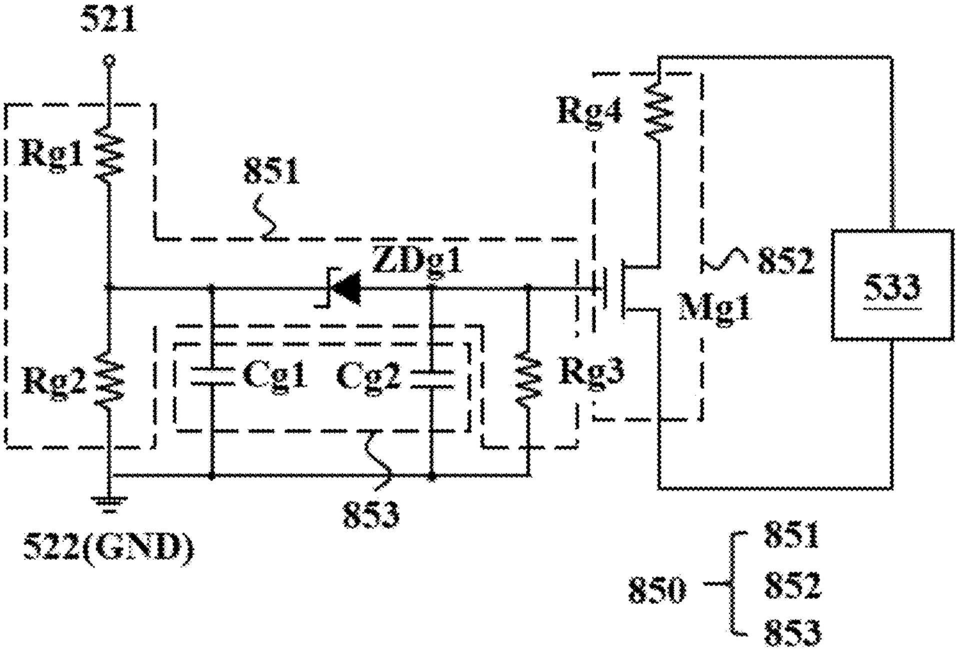
FIG. 15E is a schematic diagram of an overvoltage protection circuit according to some embodiments.

Referring to FIG. 15E, an overvoltage protection circuit 850 includes a voltage sampling circuit 851, an enabling circuit 852, and a delaying circuit 853. The voltage sampling circuit 851 includes resistors Rg1, Rg2, and Rg3 and a Zener diode ZDg1. The resistors Rg1 and Rg2 constitute a voltage divider circuit, in which the resistor Rg1 has a first end coupled to first filtering output terminal 521 and a second end coupled to a first end of the resistor Rg2, and the resistor Rg2 has a second end coupled to second filtering output terminal 522, in which the second filtering output terminal 522 is, in some embodiments, at the same voltage level as a ground terminal GND. The Zener diode ZDg1 has a cathode coupled to the voltage division point (e.g., node) of the voltage divider circuit, or the second end of the resistor Rg1 and the first end of the resistor Rg2, and the Zener diode ZDg1 has an anode coupled to an input terminal of the enabling circuit 852. The resistor Rg3 has a first end coupled to the anode of the Zener diode ZDg1 and has a second end coupled to the second filtering output terminal 522. In operation of this embodiment of FIG. 15E, a filtered signal between the first filtering output terminal 521 and the second filtering output terminal 522 is voltage-divided by the resistors Rg1 and Rg2 and then undergoes voltage-stabilization by the resistor Rg3 and the Zener diode ZDg1 to be applied to the input terminal of the enabling circuit 852. As a result, the voltage signal at the first end of the resistor Rg3 can be regarded as the voltage detection signal produced by the voltage sampling circuit 851.

The enabling circuit 852 includes a transistor Mg1, which has a first terminal, a second terminal, and a control terminal. The control terminal of the transistor Mg1 is coupled to a first end of a resistor Rg3 and an anode of a Zener diode ZDg1, in order to receive a voltage detection signal. At least one of the first and second terminals of the transistor Mg1 is coupled to a controller 533 of a driving circuit. In some embodiments, the enabling circuit 852 further includes a resistor Rg4, which can be serially connected between the first terminal of the transistor Mg1 and the controller 533 or be serially connected between the second terminal of the transistor Mg1 and the controller 533. FIG. 15E merely illustrates the embodiment where the resistor Rg4 is serially connected between the first terminal of the transistor Mg1 and the controller 533, but the position of the resistor Rg4 is not limited thereto. Exemplary embodiments of specific connection configurations between an enabling circuit 852 and a controller 533 may be understood by referencing the embodiments described below in FIGS. 15F to 15H.

The delaying circuit 853 includes capacitors Cg1 and Cg2. The capacitor Cg1 has a first end coupled to the second end of the resistor Rg1, the first end of the resistor Rg2, and the cathode of the Zener diode ZDg1, and has a second end coupled to the second filtering output terminal 522. The capacitor Cg2 has a first end coupled to the first end of the resistor Rg3 and the anode of the Zener diode ZDg1 and has a second end coupled to the second filtering output terminal 522. In operation of this embodiment of FIG. 15E, an instantaneous change in the voltage detection signal is suppressed or limited by the capacitors Cg1 and Cg2.

Figure 15F:
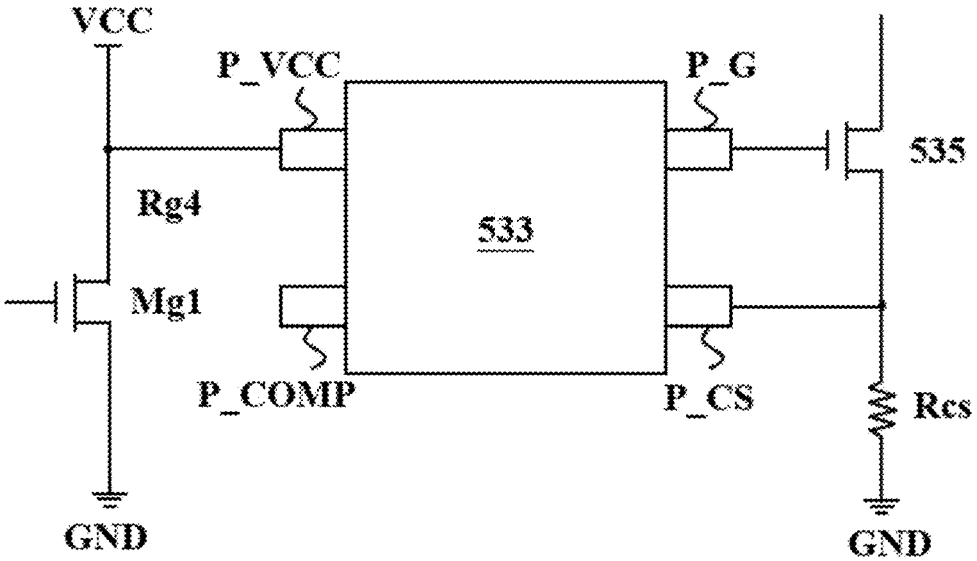
FIGS. 15F-15H are schematic diagrams of a part of an overvoltage protection circuit according to some embodiments.
Figure 15G:
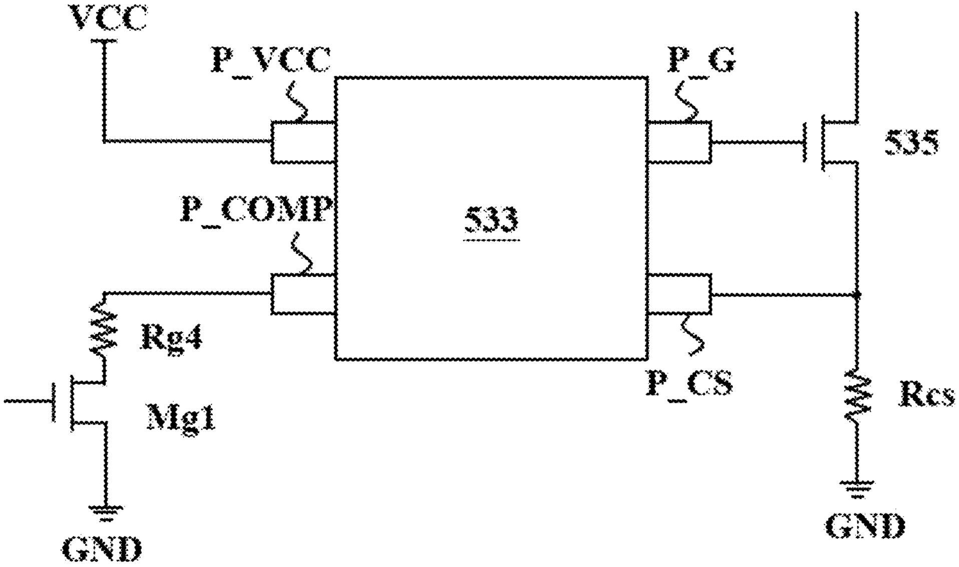
Figure 15H:
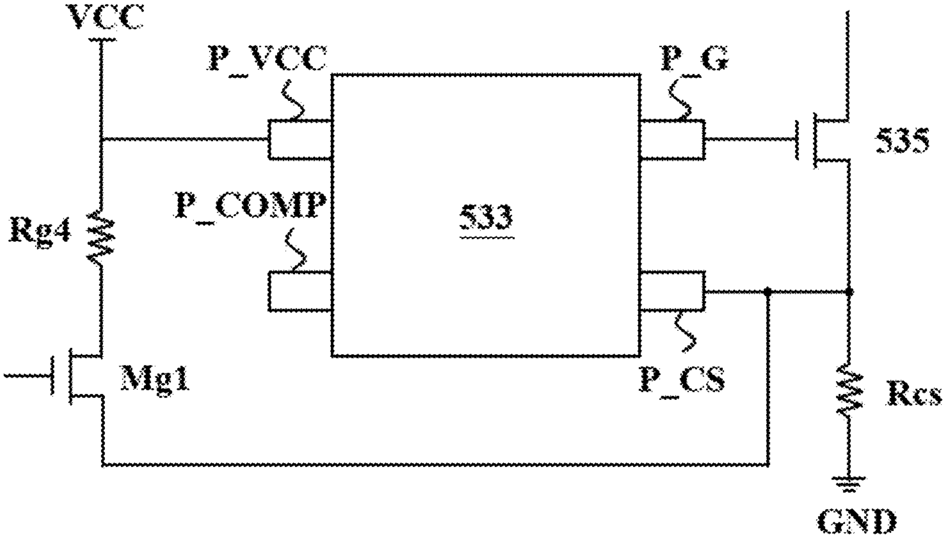

FIGS. 15F-15H illustrate embodiments of partial-circuit-structure of different circuit connections between the enabling circuit 852 and the controller 533, respectively. In these embodiments, the controller 533 has, for example, a power pin P_VCC, a driving pin P_G, a compensation pin P_COMP, and a current sampling pin P_CS. The controller 533 is configured to be activated when the power pin P_VCC receives a driving voltage VCC (such as 5 V) meeting its activation requirement(s), and is configured to control, through a signal at the driving pin P_G, the magnitude of an output or driving current from the driving circuit. Further, the controller 533 is configured to adjust a pulse width of an output lighting control signal, according to the voltage level at the current sampling pin P_CS (representing the magnitude of the driving current) and the voltage level at the compensation pin P_COMP (representing the magnitude of an input voltage), in order to make or approximately maintain the output current/output power of the driving circuit above a certain value.

From another perspective, in the configuration of the controller 533, any one pin of the controller 533 may be referred to as the power pin P_VCC (which can be known as a first pin) if activation and deactivation (or stopping of operation) of the controller 533 depends on or is in response to the voltage at this one pin. Any one pin of the controller 533 may be referred to as the compensation pin P_COMP (which can be known as a second pin) if the duty cycle of the lighting control signal output by the controller 533 decreases with decreasing of the voltage at this one pin (at least during a certain range of the voltage at this one pin). Any one pin of the controller 533 may be referred to as the current sampling pin P_CS (which can be known as a third pin) if the duty cycle of the lighting control signal output by the controller 533 decreases with increasing of the voltage at this one pin (at least during a certain range of the voltage at this one pin). In some embodiments, the driving pin P_G may be electrically connected to a gate terminal of the transistor or power switch 535 and may act as a pin for providing a lighting control signal, as illustrated by FIGS. 15F-15H but the present disclosure is not limited to such a connection; and in some other embodiments, the transistor or power switch 535 is integrated with the controller 535 and the driving pin P_G corresponds to a drain terminal of the transistor or power switch 535 in the integrated controller 535, wherein such two types of the driving pin P_G may be referred to as a fourth pin.

In the embodiments of FIGS. 15F-15H, an example is taken that the driving pin P_G of the controller 533 is coupled to the gate terminal of the transistor 535, which has a first terminal coupled to a conversion circuit and has a second terminal coupled to a ground terminal GND through a sampling resistor Rcs.

Referring to FIG. 15F, the transistor Mg1 of the enabling circuit 852 has a first terminal coupled to the power pin P_VCC of the controller 533 and a second terminal coupled to the ground terminal GND. When the enabling circuit 852 activates overvoltage protection based on the voltage detection signal, the transistor Mg1 is conducted in response to the voltage detection signal, causing the voltage at the power pin P_VCC to be pulled from a driving voltage VCC down to a low or ground voltage level and thus causing the controller 533 to stop operating or be deactivated. On the contrary, when the enabling circuit 852 does not activate overvoltage protection based on the voltage detection signal, the transistor Mg1 is cut off in response to the voltage detection signal, causing the voltage at the power pin P_VCC to remain at the driving voltage VCC and thus causing the controller 533 to be activated based on the driving voltage VCC and then output a lighting control signal to the transistor or switching circuit 535.

Referring to FIG. 15G, the transistor Mg1 of the enabling circuit 852 has a first terminal coupled to the compensation pin P_COMP of the controller 533 through a resistor Rg4 and a second terminal coupled to a ground terminal GND. When the enabling circuit 852 activates overvoltage protection based on the voltage detection signal, the transistor Mg1 is conducted in response to the voltage detection signal, causing the voltage at the compensation pin P_COMP to be pulled down to a specific voltage level (depending on the set resistance of the resistor Rg4) or to a low or ground voltage level (as when the resistor Rg4 is not present) and thus causing the duty cycle of a lighting control signal output by the controller 533 to decrease with decreasing of the voltage at the compensation pin P_COMP so as to reduce the output current/output power. On the contrary, when the enabling circuit 852 does not activate overvoltage protection based on the voltage detection signal, the transistor Mg1 is cut off in response to the voltage detection signal, so that the voltage at the compensation pin P_COMP will not be affected by the enabling circuit, and therefore the controller 533 can adjust the duty cycle of the output lighting control signal according to the designed control mechanism of normal operation.

Referring to FIG. 15H, the transistor Mg1 of the enabling circuit 852 has a first terminal coupled to receive a driving voltage VCC through a resistor Rg4 and a second terminal coupled to the current sampling pin P_CS of the controller 533 and a first end of the sampling resistor Rcs. When the enabling circuit 852 activates overvoltage protection based on the voltage detection signal, the transistor Mg1 is conducted in response to the voltage detection signal, causing the driving voltage VCC to be divided and then applied or superposed to the current sampling pin P_CS, causing the voltage level at the current sampling pin P_CS to increase to a specific level (depending on the set resistances of the resistors Rg4 and Rcs) and thus causing the duty cycle of a lighting control signal output by the controller 533 to decrease with increasing of the voltage at the current sampling pin P_CS so as to reduce the output current/output power. On the contrary, when the enabling circuit 852 does not activate overvoltage protection based on the voltage detection signal, the transistor Mg1 is cut off in response to the voltage detection signal, so that the voltage at the current sampling pin P_CS will not be affected by the enabling circuit, and therefore the controller 533 can adjust the duty cycle of the output lighting control signal according to the designed control mechanism of normal operation.

Figure 16A:
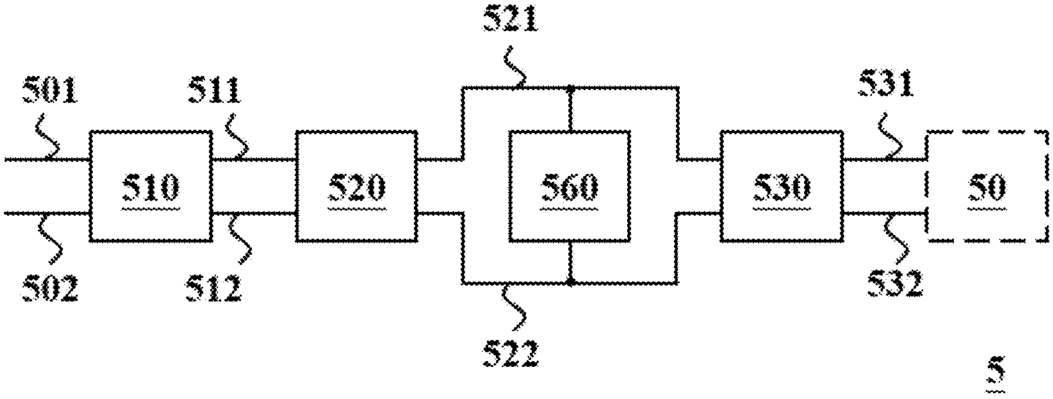
FIG. 16A is a block diagram of an exemplary power supply module of an LED tube lamp according to some exemplary embodiments.

FIG. 16A is a block diagram of a power supply module in an LED tube lamp according to an exemplary embodiment. Compared to that shown in FIG. 9A, the present embodiment comprises a rectifying circuit 510, a filtering circuit 520, and a driving circuit 530, and further comprises an auxiliary power supply module 560, wherein said power supply module 5 may also contain some components of the LED module 50. The auxiliary power supply module 560 is coupled between the filtering output terminals 521 and 522. The auxiliary power supply module 560 detects the filtered signal in the filtering output terminals 521 and 522 and determines whether to provide an auxiliary power to the filtering output terminals 521 and 522 based on the detected result. When the supply of the filtered signal is stopped or a logic level thereof is insufficient, i.e., when a drive voltage for the LED module is below a defined voltage, the auxiliary power supply module provides auxiliary power to keep the LED module 50 continuing to emit light. The defined voltage is determined according to an auxiliary power voltage of the auxiliary power supply module 560.

Figure 16B:
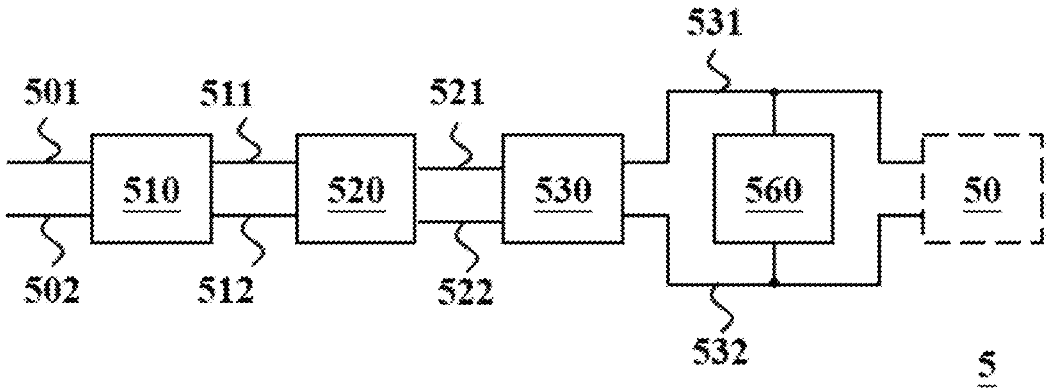
FIG. 16B is a block diagram of an exemplary power supply module of an LED tube lamp according to some exemplary embodiments.

FIG. 16B is a block diagram of a power supply module in an LED tube lamp according to an exemplary embodiment. Compared to that shown in FIG. 9A, the present embodiment comprises a rectifying circuit 510, a filtering circuit 520 and an auxiliary power supply module 560, The auxiliary power supply module 560 is coupled between the driving output terminals 531 and 1522. The auxiliary power supply module 560 detects the driving signal in the driving output terminals 531 and 532 and determines whether to provide an auxiliary power to the driving output terminals 531 and 532 based on the detected result. When the driving signal is no longer being supplied or a logic level thereof is insufficient, the auxiliary power supply module 560 provides the auxiliary power to keep the LED module 50 continuously lighting.

In another exemplary embodiment, the LED module 50 can be driven merely by the auxiliary power provided by the auxiliary power supply module 560, and the external driving signal is merely used for charging the auxiliary power supply module 560. Since such an embodiment applies the auxiliary power provided by the auxiliary power supply module 560 as the only power source for the LED module 50, regardless of whether the external driving signal is provided by commercial electricity or a ballast, the external driving signal charges the energy storage unit first, and then the energy storage unit is used for supplying power to the LED module. Accordingly, the LED tube lamp applying said power architecture may be compatible with the external driving signal provided by commercial electricity or a ballast.

From the perspective of the structure, since the auxiliary power supply module 560 is connected between the outputs of the filtering circuit 520 (i.e., the first filtering output 521 and the second filtering output 522) or the outputs of the driving circuit 530 (i.e., the first driving output terminal 531 and the second driving output terminal 532), the circuit components of the auxiliary power supply module 560 can be placed, in an exemplary embodiment, in the lamp tube (e.g., the position adjacent to the LED module 50 and between the two end caps), such that the power transmission loss caused by the long wiring can be avoided. In another exemplary embodiment, the circuit components of the auxiliary power can be placed in at least one of the end caps, such that the heat generated by the auxiliary power supply module 560 when charging and discharging does not affect operation and illumination of the LED module.

Figure 16C:
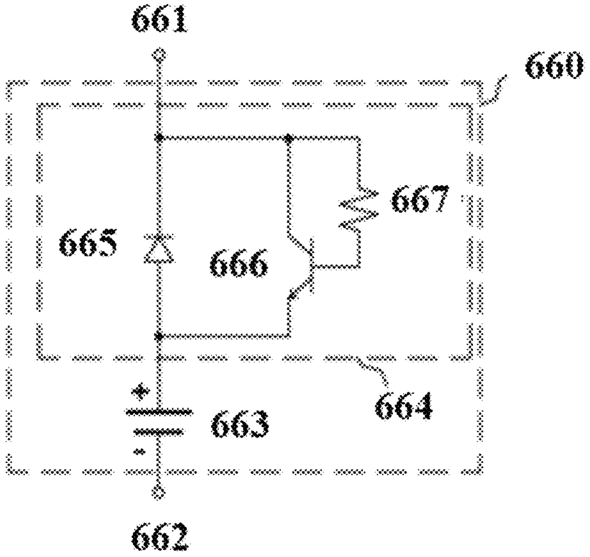
FIG. 16C is a block diagram of an exemplary auxiliary power supply module according to some exemplary embodiments.

FIG. 16C is a schematic diagram of an auxiliary power supply module according to an embodiment. The auxiliary power supply module 660 can be applied, for example, to the configuration of the auxiliary power supply module 560 illustrated in FIG. 16B. The auxiliary power supply module 660 comprises an energy storage unit 663 and a voltage detection circuit 664. The auxiliary power supply module further comprises an auxiliary power positive terminal 661 and an auxiliary power negative terminal 662 for being respectively coupled to the filtering output terminals 521 and 522 or the driving output terminals 531 and 532. The voltage detection circuit 664 detects a logic level of a signal at the auxiliary power positive terminal 661 and the auxiliary power negative terminal 662 to determine whether releasing outward the power of the energy storage unit 663 through the auxiliary power positive terminal 661 and the auxiliary power negative terminal 662.

In some embodiments, the energy storage unit 663 is a battery or a supercapacitor. When a voltage difference of the auxiliary power positive terminal 661 and the auxiliary power negative terminal 662 (the drive voltage for the LED module) is higher than the auxiliary power voltage of the energy storage unit 663, the voltage detection circuit 664 charges the energy storage unit 663 by the signal in the auxiliary power positive terminal 661 and the auxiliary power negative terminal 662. When the drive voltage is lower than the auxiliary power voltage, the energy storage unit 663 releases the stored energy outward through the auxiliary power positive terminal 661 and the auxiliary power negative terminal 662.

The voltage detection circuit 664 comprises a diode 665, a bipolar junction transistor (BJT) 666 and a resistor 667. A positive end of the diode 665 is coupled to a positive end of the energy storage unit 663 and a negative end of the diode 665 is coupled to the auxiliary power positive terminal 661. The negative end of the energy storage unit 663 is coupled to the auxiliary power negative terminal 662. A collector of the BJT 666 is coupled to the auxiliary power positive terminal 661, and an emitter thereof is coupled to the positive end of the energy storage unit 663. One end of the resistor 667 is coupled to the auxiliary power positive terminal 661 and the other end is coupled to a base of the BJT 666. When the collector of the BJT 666 is a cut-in voltage higher than the emitter thereof, the resistor 667 conducts the BJT 666. When the power source provides power to the LED tube lamp normally, the energy storage unit 663 is charged by the filtered signal through the filtering output terminals 521 and 522 and the conducted BJT 666 or by the driving signal through the driving output terminals 531 and 532 and the conducted BJT 666 until that the collector-emitter voltage of the BJT 666 is lower than or equal to the cut-in voltage. When the filtered signal or the driving signal is no longer being supplied or the logic level thereof is insufficient, the energy storage unit 663 provides power through the diode 665 to keep the LED module 50 continuously lighting.

In some embodiments, the maximum voltage of the charged energy storage unit 663 is at least one cut-in voltage of the BJT 666 lower than the voltage difference applied between the auxiliary power positive terminal 661 and the auxiliary power negative terminal 662. The voltage difference provided between the auxiliary power positive terminal 661 and the auxiliary power negative terminal 662 is a turn-on voltage of the diode 665 lower than the voltage of the energy storage unit 663. Hence, when the auxiliary power supply module 660 provides power, the voltage applied at the LED module 50 is lower (about the sum of the cut-in voltage of the BJT 666 and the turn-on voltage of the diode 665). In the embodiment shown in the FIG. 16B, the brightness of the LED module 50 is reduced when the auxiliary power supply module 50 supplies power thereto. Thereby, when the auxiliary power supply module is applied to an emergency lighting system or a constant lighting system, the user realizes the main power supply, such as commercial power, is abnormal and then performs necessary precautions therefor.

In addition to utilizing the embodiments illustrated in FIG. 16A to FIG. 16C in a single tube lamp architecture for emergency power supply, the embodiments also can be utilized in a lamp module including a multi tube lamp. Taking the lamp module having four parallel arranged LED tube lamps as an example, in an exemplary embodiment, one of the LED tube lamps includes the auxiliary power supply module. When the external driving signal is abnormal, the LED tube lamp including the auxiliary power supply module is continuously lighted up and the others LED tube lamps go off. According to the consideration of the uniformity of illumination, the LED tube lamp having the auxiliary power supply module can be arranged in the middle position of the lamp module.

In another exemplary embodiment, a plurality of the LED tube lamps respectively include the auxiliary power supply module. When the external driving signal is abnormal, the LED tube lamps including the auxiliary power supply module are continuously lighted up and the other LED tube lamps (if any) go off. In this way, even if the lamp module is operated in an emergency situation, a certain brightness can still be provided for the lamp module. In addition, if there are two LED lamps that have the auxiliary power supply module, the LED tube lamps having the auxiliary power supply module can be arranged, according to the consideration of the uniformity of illumination, in a staggered way with the LED tube lamps that don't have the auxiliary power supply module.

In still another exemplary embodiment, a plurality of the LED tube lamps respectively include the auxiliary power supply module. When the external driving signal is abnormal, part of the LED tube lamps including the auxiliary power supply module is first lighted up by the auxiliary power, and the other part of the LED tube lamps including the auxiliary power supply module is then lighted up by the auxiliary power after a predetermined period. In this way, the lighting time of the lamp module can be extended during the emergency situation by coordinating the auxiliary power supply sequence of the LED tube lamps.

The embodiment of coordinating the auxiliary power supply sequence of the LED tube lamps can be implemented by setting different start-up time for the auxiliary power supply module disposed in different tube lamp, or by disposing controllers in each tube lamp for communicating the operation state of each auxiliary power supply module. The present disclosure is not limited thereto.

Figure 16D:
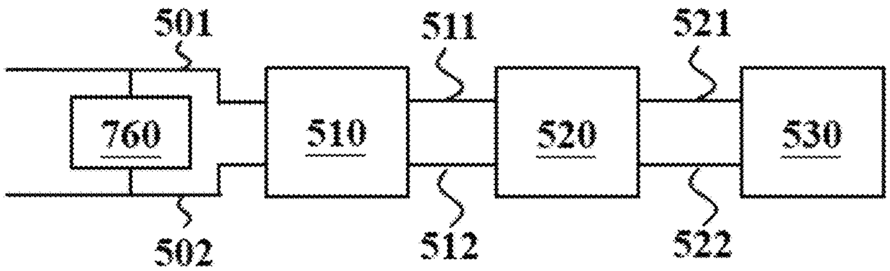
FIG. 16D is a block diagram of an exemplary power supply module of an LED tube lamp according to some exemplary embodiments.

FIG. 16D is a block diagram of a power supply module in an LED tube lamp according to an exemplary embodiment. Referring to FIG. 16D, the power supply module 5 of FIG. 16D includes a rectifying circuit 510, a filtering circuit 520, a driving circuit 530, and an auxiliary power supply module 760, according to one embodiment. The auxiliary power supply module 760 of FIG. 16D is connected between the pins 501 and 502 to receive the external driving signal and perform a charge-discharge operation based on the external driving signal, according to some embodiments.

In some embodiments, the operation of the auxiliary power supply module 760 can be compared to an Off-line uninterruptible power supply (Off-line UPS). Normally, when an AC power source (e.g., the mains electricity, the commercial electricity or the power grid) supplies the external driving signal to the LED tube lamp, the external driving signal is supplied to the rectifying circuit 510 while charging the auxiliary power supply module 760. Once the AC power source is unstable or abnormal, the auxiliary power supply module 760 takes the place of the AC power source to supply power to the rectifying circuit 510 until the AC power source recovers normal power supply. As such, the auxiliary power supply module 760 can operate in a backup manner by the auxiliary power supply module 760 interceding on behalf of the power supply process when the AC power source is unstable or abnormal. Herein, the power supplied by the auxiliary power supply module 760 can be an AC power or a DC power.

The auxiliary power supply module 760 includes an energy storage unit and a voltage detection circuit, according to some embodiments. The voltage detection circuit detects the external driving signal and determines whether the energy storage unit provides the auxiliary power to the input terminal of the rectifying circuit 510 according to the detection result. When the external driving signal stops providing or the AC signal level of the external driving signal is insufficient, the energy storage unit of the auxiliary power supply module 760 provides the auxiliary power, such that the LED module 50 continues to emit light based on the auxiliary power provided by the auxiliary power supply module 760. In some embodiments, the energy storage unit for providing auxiliary power can be implemented by an energy storage assembly such as a battery or a supercapacitor. However, the energy storage assembly of the auxiliary power supply module 760 are not limited to the above exemplary embodiments and other energy storage assemblies are contemplated.

Figure 16E:
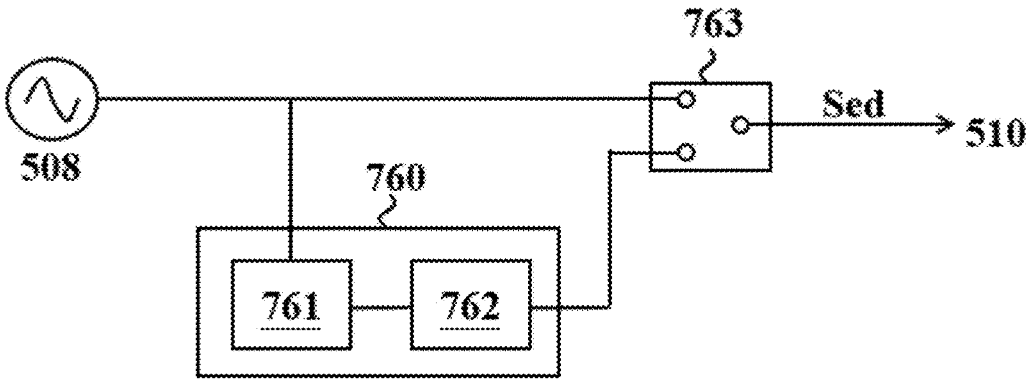
FIG. 16E is a block diagram of an exemplary auxiliary power supply module according to some exemplary embodiments.

FIG. 16E illustrates an exemplary configuration of the auxiliary power supply module 760 operating in an Off-line UPS mode according to some embodiments of the present disclosure. Referring to FIG. 16E, the auxiliary power supply module 760 includes a charging unit 761 and an auxiliary power supply unit 762. The charging unit 761 has an input terminal coupled to an external AC power supply

508 and an output terminal coupled to an input terminal of the auxiliary power supply unit 762. The auxiliary power supply module 760 further includes a switching unit 763, having terminals connected to the external AC power source 508, an output terminal of the auxiliary power supply unit 762, and an input terminal of the rectifying circuit 510, respectively, according to some embodiments. In operation, depending on the state of power supply by the external AC power source 508, the switching unit 763 is configured to selectively conduct a circuit loop passing through the external AC power supply 508 and the rectifying circuit 510, or conduct a circuit loop passing through the auxiliary power supply module 760 and the rectifying circuit 510. The auxiliary power supply unit 762 has the input terminal coupled to the output terminal of the charging unit 761 and an output terminal coupled to a power loop between the external AC power supply 508 and the rectifying circuit 510, via the switching unit 763, according to one embodiment. Specifically, when the external AC power supply 508 operates normally, the power, supplied by the external AC power supply 508, will be provided to the input terminal of the rectifying circuit 510 as an external driving signal Sed via the switching unit 763, namely, the switching unit 763 is switched to a state that connects the external AC power supply 508 to the rectifying circuit 510. Meanwhile, the charging unit 761 charges the auxiliary power supply unit 762 based on the power supplied by the external AC power supply 508, but the auxiliary power supply unit 762 does not output power to the rectifying circuit 510 because the external driving signal Sed is correctly transmitted on the power loop. When the external AC power supply 508 is unstable or abnormal, the auxiliary power supply unit 762 starts to supply an auxiliary power, serving as the external driving signal Sed, to the rectifying circuit 510 via the switching unit 763, namely, the switching unit 763 is switched to a state that connects the output terminal of the auxiliary power supply unit 762 to the rectifying circuit 510.

Figure 16F:
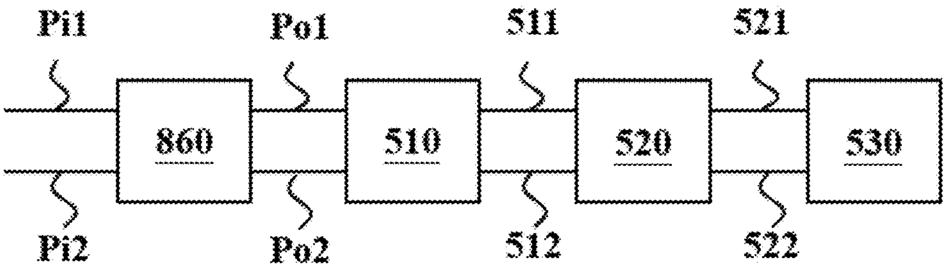
FIG. 16F is a block diagram of a power supply module in an LED tube lamp according to an exemplary embodiment.

FIG. 16F is a block diagram of a power supply module in an LED tube lamp according to an exemplary embodiment. Referring to FIG. 16F, the power supply module 5 of the present embodiment includes a rectifying circuit 510, a filtering circuit 520, a driving circuit 530 and an auxiliary power supply module 860 of FIG. 16F. Compared to the embodiment illustrated in FIG. 16D, the input terminals Pi1 and Pi2 of the auxiliary power supply module 860 are configured to receive an external driving signal and perform a charge-discharge operation based on the external driving signal, and then supply an auxiliary power, generated from the output terminals Po1 and Po2, to the rectifying circuit 510. From the perspective of the structure of the LED tube lamp, the input terminals Pi1 and Pi2 or the output terminals Po1 and Po2 of the auxiliary power supply module 860 are connected to the pins of the LED tube lamp (e.g., 501 and 502 in FIG. 16D). If the pins 501 and 502 of the LED tube lamp are connected to the input terminals Pi1 and Pi2 of the auxiliary power supply module 860, it means the auxiliary power supply module 860 is disposed inside the LED tube lamp and receives the external driving signal through the pins 501 and 502. On the other hand, if the pins 501 and 502 of the LED tube lamp are connected to the output terminals Po1 and Po2 of the auxiliary power supply module 860, it means the auxiliary power supply module 860 is disposed outside the LED tube lamp and outputs the auxiliary power to the rectifying circuit through the pins 501 and 502. The detail structure of the auxiliary power supply module will be further described in the following embodiments.

In some embodiments, the operation of the auxiliary power supply module 860 can be similar to an On-line uninterruptible power supply (On-line UPS). Under the On-line UPS operation, the external AC power source would not directly supply power to the rectifying circuit 510 but supplies power through the auxiliary power supply module 860. Therefore, the external AC power source can be isolated from the LED tube lamp, and the auxiliary power supply module 860 intervenes the whole power supply process, so that the power supplied to the rectifying circuit 510 is not affected by the unstable or abnormal AC power source.

Figure 16G:
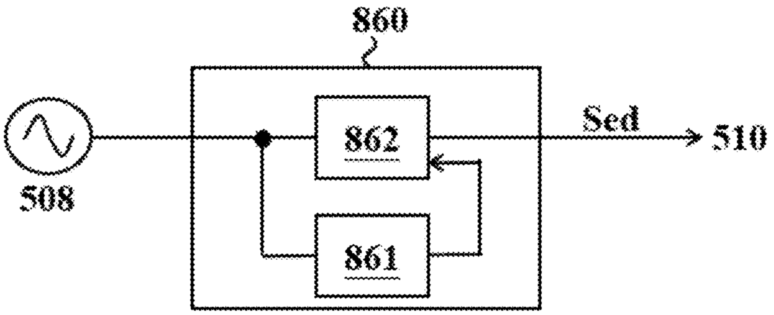
FIGS. 16G-16H are block diagrams of exemplary auxiliary power supply modules according to some exemplary embodiments.

FIG. 16G illustrates an exemplary configuration of the auxiliary power supply module 860 operating in an On-line UPS mode according to some embodiments of the present disclosure. Referring to FIG. 16G, the auxiliary power supply module 860 includes a charging unit 861 and an auxiliary power supply unit 862. The charging unit 861 has an input terminal coupled to an external AC power supply 508 and an output terminal coupled to a first input terminal of the auxiliary power supply unit 862. The auxiliary power supply unit 862 further has a second input terminal coupled to the external AC power supply 508 and an output terminal coupled to the rectifying circuit 510. Specifically, when the external AC power supply 508 operates normally, the auxiliary power supply unit 862 performs the power conversion based on the power supplied by the external AC power source 508, and accordingly provides an external driving signal Sed to the rectifying circuit 510. In the meantime, the charging unit 861 charges an energy storage unit of the auxiliary power supply unit 862. When the external AC power source is unstable or abnormal, the auxiliary power supply unit 862 performs the power conversion based on the power stored in the energy storage unit, and accordingly provides the external driving signal Sed to the rectifying circuit 510. It should be noted that the power conversion described herein could be rectification, filtering, boost-conversion, buck-conversion or a reasonable combination of above operations. The present disclosure is not limited thereto.

In some embodiments, the operation of the auxiliary power supply module 860 can be similar to a Line-Interactive UPS. The basic operation of the auxiliary power supply module 860 under a Line-Interactive UPS mode is similar to the auxiliary power supply module 760 under the Off-line UPS mode, the difference between the Line-Interactive UPS mode and the Off-line UPS mode is the auxiliary 860 has a boost and buck compensation circuit and can monitor the power supply condition of the external AC power source at any time. Therefore, the auxiliary power supply module 860 can correct the power output to the power supply module of the LED tube lamp when the external AC power source is not ideal (e.g., the external driving signal is unstable, but the variation does not exceed the threshold value), so as to reduce the frequency of using the battery for power supply.

Figure 16H:
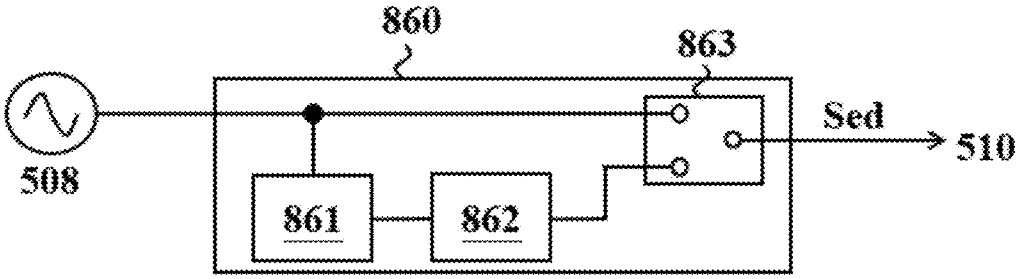

FIG. 16H illustrates an exemplary configuration of the auxiliary power supply module 860 operating in the Line-Interactive mode according to some embodiments of the present disclosure. Referring to FIG. 16H, the auxiliary power supply module 860 includes a charging unit 861, an auxiliary power supply unit 862 and a switching unit 863. The charging unit 861 has an input terminal coupled to an external AC power supply 508. The switching unit 863 is coupled between an output terminal of the auxiliary power supply unit 862 and an input terminal of the rectifying circuit 510, in which the switching unit 863 may selectively conduct a current on a path between the external AC power supply 508 and the rectifying circuit 510 or on a path between the auxiliary power supply unit 862 and the rectifying circuit 510 according to the power supply condition of the external AC power supply 508. In detail, when the external AC power source is normal, the switching unit 863 is switched to conduct a current on the path between the external AC power supply 508 and the rectifying circuit 510 and cut off the path between the auxiliary power supply unit 862 and the rectifying circuit 510. Thus, when the external AC power source is normal, the external AC power supply 508 provides power, regarded as the external driving signal Sed, to the input terminal of the rectifying circuit 510 via the switching unit 863. In the meantime, the charging unit 861 charges the auxiliary power unit 862 based on the external AC power supply 508. When the external AC power source is unstable or abnormal, the switching unit 863 is switched to conduct a current on the path between the auxiliary power supply unit 862 and the rectifying circuit 510 and cut off the path between the AC power supply 508 and the rectifying circuit 510. The auxiliary power supply unit 862 starts to supply power, regarded as the external driving signal Sed, to the rectifying circuit 510.

In the embodiments of the auxiliary power supply module, the auxiliary power provided by the auxiliary power supply unit 762/862 can be in either AC or DC. When the auxiliary power is provided in AC, the auxiliary power supply unit 762/862 includes, for example, an energy storage unit and a DC-to-AC converter. When the auxiliary power is provided in DC, the auxiliary power supply unit 762/862 includes, for example, an energy storage unit and a DC-to-DC converter, or simply includes an energy storage unit; the present disclosure is not limited thereto, and other energy storage units are contemplated. In some embodiments, the energy storage unit can be a set of batteries. In some embodiments, the DC-to-DC converter can be a boost converter, a buck converter or a buck-boost converter. The energy storage unit may be e.g., a battery module composed of a number of batteries. The DC-to-DC converter may be e.g., of the type of buck, boost, or buck-boost converter. And the auxiliary power supply module 760/860 further includes a voltage detection circuit, not shown in FIGS. 9A to 9E. The voltage detection circuit is configured to detect an operating state of the external AC power supply 508 and generate a signal, according to the detection result, to control the switching unit 763/863 or the auxiliary power supply unit 862, in order to determine whether the LED tube lamp operates in a normal lighting mode (i.e., supplied by the external AC power supply 508) or in an emergency lighting mode (i.e., supplied by the auxiliary power supply module 760/860). In such embodiments, the switching unit 763/863 may be implemented by a three-terminal switch or two complementary switches having a complementary relation. When using the complementary switches, one of the complementary switches may be serially connected on the power loop of the external AC power supply 508 and the other one of the complementary switches may be serially connected on the power loop of the auxiliary power supply module 760/860, wherein the two complementary switches are controlled in a way that when one switch is conducting the other switch is cut off.

In an exemplary embodiment, the switching unit 763/863 is implemented by a relay. The relay operates similar to a two-mode switch. In function, when the LED tube lamp is operating in a normal lighting mode (i.e., electricity provided from the external AC power supply 508 is normally input to the LED tube lamp as an external driving signal), the relay is pulled in so that the power supply module of the LED tube lamp is not electrically connected to the auxiliary power supply module 760/860. On the other hand, when the AC power line is abnormal and fails to provide power as the external AC power supply 508, magnetic force in the relay disappears so that the relay is released to a default position, causing the power supply module of the LED tube lamp to be electrically connected to the auxiliary power supply module 760/860 through the relay, thus using the auxiliary power supply module 760/860 as a power source.

According to some embodiments, from the perspective of the entire lighting system, when used in the normal lighting occasion, the auxiliary power supply module 760/860 is not active to provide power, and the LED module 50 is supplied by the AC power line, which also may charge the battery module of the auxiliary power supply module 760/860. On the other hand, when used in the emergency lighting occasion, voltage of the battery module is increased by the boost-type DC-to-DC converter to a level required by the LED module 50 to operate in order to emit light. In some embodiments, the voltage level after the boosting is usually or commonly about 4 to 10 times that of the battery module before the boosting and is in some embodiments 4 to 6 times that of the battery module before the boosting. In this embodiment, the voltage level required by the LED module 50 to operate is in the range 40 to 80 V, and is preferably in the range 55 to 75 V. In one disclosed embodiment herein, 60 V is chosen as the voltage level, but the voltage level may be other values in other embodiments.

In one embodiment, the battery module includes or is implemented by a single cylindrical battery or cell packaged in a metallic shell to reduce the risk of leakage of electrolyte from the battery. In one embodiment, the battery can be modularized as a packaged battery module including for example two battery cells connected in series, in which a plurality of the battery module can be electrically connected in sequence (e.g., in series or in parallel) and disposed inside the lamp fixture so as to reduce the complexity of maintenance. For instance, when one or part of the battery modules are damaged or bad, each damaged battery module can be easily replaced without the need to replace all of the plurality of battery modules. In some embodiments of the present disclosure, the battery module may be designed to have a cylindrical shape whose internal diameter is slightly longer than the outer diameter of each of its battery cells, for the battery module to accommodate its battery cells in sequence and to form a positive electrode and a negative electrode at two terminals of the battery module. In some embodiments, the voltage of the battery modules electrically connected in series may be designed to be lower than e.g., 36V. In some embodiments, the battery module is designed to have a cuboid shape whose width is slightly longer than the outer diameter of each of its battery cells, for its battery cells to be securely engaged in the battery module, wherein the battery module may be designed to have a snap-fit structure or other structure for easily plugging-in and pulling-out of its battery cells. However, it is understood by those skilled in the art that in some other embodiments the battery module may have other shapes besides cuboid, such as rectangular.

In one embodiment, the charging unit 761/861 is e.g., a battery management system (BMS), which is used to manage the battery module, mainly for intelligent management and maintenance of the battery module in order to prevent over-charging and over-discharging of the battery cells of the battery module. The BMS prolongs the usage lifetime of the battery cells, and to monitor states of the battery cells.

The BMS may be designed to have a port capable of connecting an external module or circuit, for reading or accessing information/data related to the battery cells through the port during periodical examinations of the battery module. If an abnormal condition of the battery module is detected, the abnormal battery module can be replaced.

In other embodiments, the number of battery cells that a battery module can hold may be more than 2, such as 3, 4, 30, or another number, and the battery cells in a battery module may be designed to be connected in series, or some of which are connected in series and some of which are connected in parallel, depending on actual application occasions. In some embodiments where lithium battery cells are used, the rated voltage of a single lithium battery cell is about 3.7V. In some embodiments the number of battery cells of a battery module can be reduced to keep the voltage of the battery unit to be below about 36V.

The relay used in these embodiments is e.g., a magnetic relay mainly including an iron core, coil(s), an armature, and contacts or a reed. The operations principle of the relay may be: when power is applied to two ends of the coil, a current is passed through the coil to produce electromagnetic force, activating the armature to overcome a force provided by a spring and be attracted to the iron core. The movement of the armature brings one of the contacts to connect to a fixed normally open contact of the contacts. During a power outage or when the current is switched off, the electromagnetic force disappears and so the armature is returned by a reaction force provided by the spring to its relaxed position, bringing the moving contact to connect to a fixed normally closed contact of the contacts. By these different movements of switching, current conduction and cutoff through the relay can be achieved. A normally open contact and a normally closed contact of a relay may be defined such that a fixed contact which is in an open state when the coil of the relay is de-energized is called a normally-open contact, and a fixed contact which is in a closed state when the coil of the relay is de-energized is called a normally-closed contact.

In an exemplary embodiment, the brightness of the LED module supplied by the external driving signal is different from the brightness of the LED module supplied by the auxiliary power supply module. Therefore, a user may find the external power is abnormal when observing that the brightness of LED module changed, and thus the user can eliminate the problem as soon as possible. In this manner, the operation of the auxiliary power supply module 760 can be considered as an indication of whether the external driving signal is normally provided, wherein when the external driving signal becomes abnormal, the auxiliary power supply module 760 provides the auxiliary power having the output power different from that of the normal external driving signal. For example, in some embodiments, the luminance of the LED module is 1600 to 2000 lm when being lighted up by the external driving signal; and the luminance of the LED module is 200 to 250 lm when being lighted up by the auxiliary power. From the perspective of the auxiliary power supply module 760, in order to let the luminance of the LED module reach 200-250 lm, the output power of the auxiliary power supply module 760 is, for example, 1 watt to 5 watts, but the present disclosure is not limited thereto. In addition, the electrical capacity of the energy storage unit in the auxiliary power supply module 760 may be, for example, 1.5 to 7.5 Wh (watt-hour) or above, so that the LED module can be lighted up for 90 minutes under 200-250 lm based on the auxiliary power. However, the present disclosure is not limited thereto.

Figure 16I:
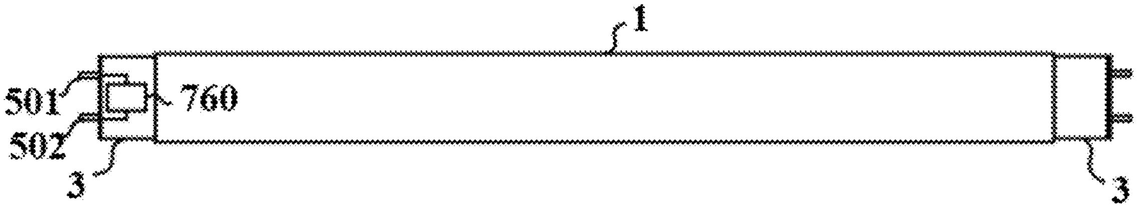
FIGS. 16I-16J are schematic structures of an auxiliary power supply module disposed in an LED tube lamp according to some exemplary embodiments.

FIG. 16I illustrates a schematic structure of an auxiliary power supply module disposed in an LED tube lamp according to an exemplary embodiment. In one embodiment, in addition, or as an alternative, the auxiliary power supply module 760/860 is disposed in the lamp tube 1. In another embodiment, the auxiliary power supply module 760/860 is disposed in the end cap 3. In order to make the description clearer, the auxiliary power supply module 760 is chosen as a representative of the auxiliary power supply modules 760 and 860 in the following paragraph, and only 760 is indicated in the figures. When the auxiliary power supply module 760 is disposed in an end cap 3, in some embodiments the auxiliary power supply module 760 connects to the corresponding pins 501 and 502 via internal wiring of the end cap 3, so as to receive the external driving signal provided to the pins 501 and 502. Compared to the structure of disposing the auxiliary power supply module into the lamp tube 1, the auxiliary power supply module 760 can be disposed far apart from the LED module since the auxiliary power supply module 760 is disposed in the end cap 3 which is connected to the respective end of the lamp tube 1. Therefore, the operation and illumination of the LED module won't be affected by heat generated by the charging or discharging of the auxiliary power supply module 760. In some embodiments, the auxiliary power supply module 760 and the power supply module of the LED tube lamp are disposed in the same end cap, and in other embodiments the auxiliary power supply module 760 and the power supply module are disposed in different end caps on the respective ends of the lamp tube. In those embodiments where the auxiliary power supply module 760 and the power supply module of the LED tube lamp are respectively disposed in the different end caps, each module may have more area for circuit layout.

Figure 16J:
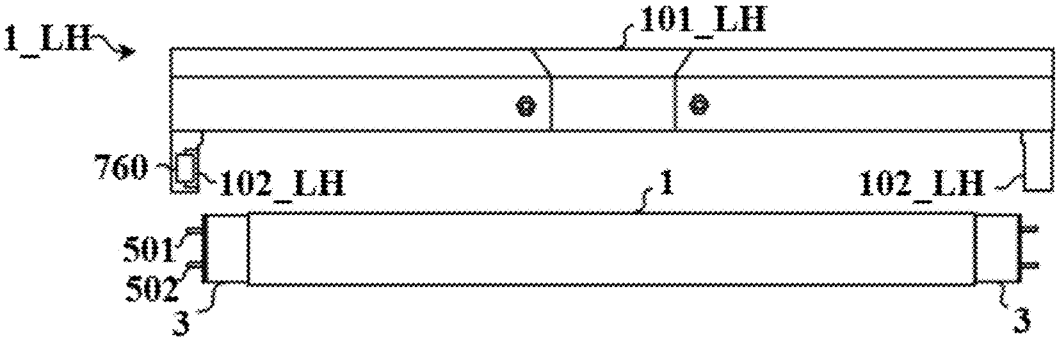

Referring to FIG. 16J, the auxiliary power supply module 760 is disposed in a lamp socket 1_LH of the LED tube lamp, according to one embodiment. In one embodiment, the lamp socket 1_LH includes a base 101_LH and a connecting socket 102_LH. The base 101_LH has power line disposed inside and is adapted to lock/attach to a fixed object such as a wall or a ceiling. The connecting socket 102_LH has slot corresponding to the pin (e.g., the pins 501 and 502) on the LED tube lamp, in which the slot is electrically connected to the corresponding power line. In the embodiment shown in FIG. 16J, the connecting socket 102_LH and the base 101_LH are formed of one piece. In another embodiment, the connecting socket 102_LH is removably disposed on the base 101_LH. It is understood by those skilled in the art that the particular lamp socket 1_LH arrangement is not limited one of these embodiments but that other arrangements are also contemplated.

In some embodiments when the LED tube lamp is installed in the lamp socket 1_LH, the pins on both end caps 3 are respectively inserted into the slot of the corresponding connecting socket 102_LH, and thus the power line can be connected to the LED tube lamp for providing the external driving signal to the corresponding pins of the LED tube lamp. Taking the configuration of the left end cap 3 as an example, when the pins 501 and 502 are inserted into the slots of the connecting socket 102_LH, the auxiliary power supply module 760 is electrically connected to the pins 501 and 502 via the slots, so as to implement the connection configuration shown in FIG. 16D.

Compared to the embodiment of disposing the auxiliary power supply module 760 in the end cap 3, the connecting socket 102_LH and the auxiliary power supply module 760 can be integrated as a module since the connecting socket can be designed as a removable configuration in an exemplary embodiment. Under such configuration, when the auxiliary power supply module 760 has a fault or the service life of the energy storage unit in the auxiliary power supply module 760 has run out, a new auxiliary power supply module can be replaced for use by replacing the modularized connecting socket 102_LH, instead of replacing the entire LED tube lamp. Thus, in addition to reducing the thermal effect of the auxiliary power supply module, the modularized design of the auxiliary power supply module has the added advantage of making the replacement of the auxiliary power supply module easier. Therefore, the durability as well as the cost savings of the LED tube lamp is evident since it is no longer necessary to replace the entire LED tube lamp when a problem occurs to the auxiliary power supply module. In addition, in some embodiments, the auxiliary power supply module 760 is disposed inside the base 101_LH. In other embodiments, the auxiliary power supply module 760 is disposed outside the base 101_LH. It is understood that the particular arrangement of the auxiliary power supply module 760 with respect to the base 101_LH is not limited to what is described in the present disclosure but that other arrangements are also contemplated.

In summary, the structural configuration of the auxiliary power supply module 760 can be divided into the following two types: (1) the auxiliary power supply module is integrated into the LED tube lamp; and (2) the auxiliary power supply module 760 is disposed independent from the LED tube lamp. Under the configuration of disposing the auxiliary power supply module 760 independent from the LED tube lamp, if the auxiliary power supply module 760 operates in the Off-line UPS mode, the auxiliary power supply module 760 and the external AC power source can provide power, through different pins or through sharing at least one pin, to the LED tube lamp. On the other hand, if the auxiliary power supply module 760 operates in the On-line UPS mode or the Line-Interactive mode, the external AC power source provides power through the auxiliary power supply module 760 rather than directly to the pins of the LED tube lamp. The detailed configuration of disposing the auxiliary power supply module independent from the LED tube lamp (hereinafter the independent auxiliary power supply module) is further described below.

Figure 16K:
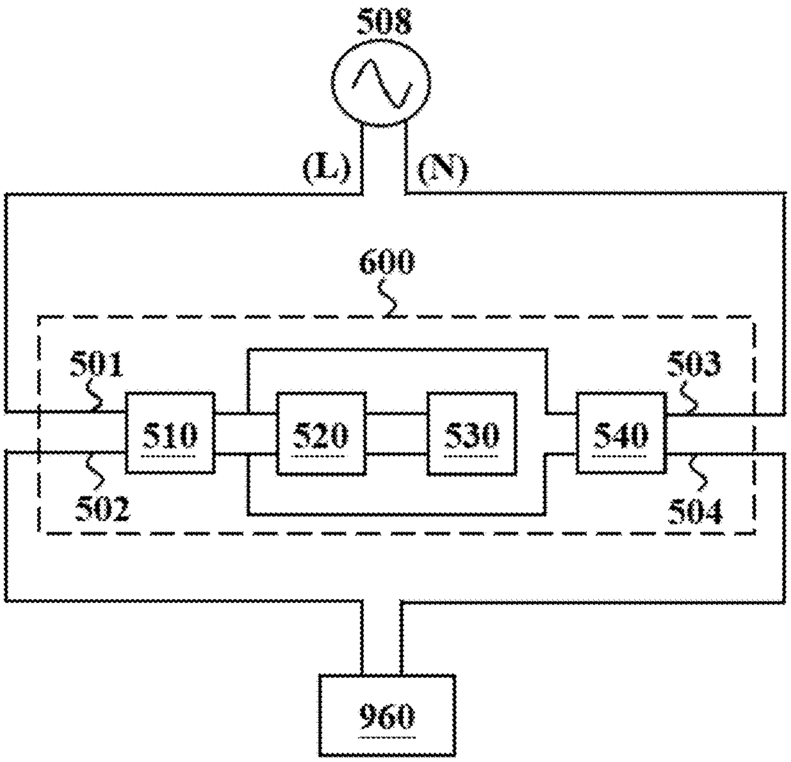
FIGS. 16K-16M are block diagrams of LED lighting systems according to some exemplary embodiments.

FIG. 16K is a block diagram of an LED lighting system according to an exemplary embodiment. Referring to FIG. 16K, the LED lighting system includes an LED tube lamp 600 and an auxiliary power supply module 960. The LED tube lamp 600 includes rectifying circuits 510 and 540, a filtering circuit 520, a driving circuit 530 and an LED module (not shown). The rectifying circuits 510 and 540 can be respectively implemented by the full-wave rectifier 610 illustrated in FIG. 11A or the half-wave rectifier 710 as shown in FIG. 11B, in which two input terminals of the rectifying circuit 510 are coupled to the pins 501 and 502 and two input terminals of the rectifying circuit 540 are coupled to the pins 503 and 504.

In the embodiment shown in FIG. 16K, the LED tube lamp 600 is configured as a dual-end power supply structure for example. The external AC power supply 508 is coupled to the pins 501 and 503 on the respective end caps of the LED tube lamp 600, and the auxiliary power supply module 960 is coupled to the pins 502 and 504 on the respective end caps of the LED tube lamp 600. In this embodiment, the external AC power supply 508 and the auxiliary power supply module 960 provide power to the LED tube lamp 600 through different pairs of the pins. Although the present embodiment is illustrated in dual-end power supply structure for example, the present disclosure is not limited thereto. In another embodiment, the external AC power supply 508 can provide power through the pins 501 and 503 on the end cap at one side of the lamp tube (i.e., the single-end power supply structure), and the auxiliary power supply module 960 can provide power through the pins 502 and 504 on the end cap at the other side of the lamp tube. Accordingly, no matter whether the LED tube lamp 600 is configured in the single-end or the dual-end power supply structure, the unused pins of the original LED tube lamp (e.g., 503 and 504 illustrated in FIG. 16K) can be the interface for receiving the auxiliary power, so that the emergency lighting function can be integrated in the LED tube lamp 600.

Figure 16L:
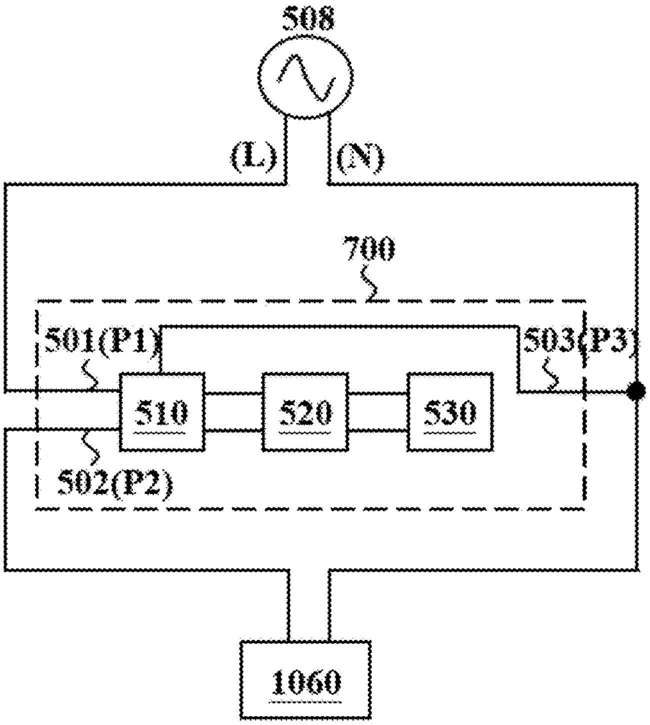

FIG. 16L is a block diagram of an LED lighting system according to another exemplary embodiment. Referring to FIG. 16L, the LED lighting system includes an LED tube lamp 700 and an auxiliary power supply module 1060. The LED tube lamp 700 includes a rectifying circuit 510, a filtering circuit 520, a driving circuit 530 and an LED module (not shown). The rectifying circuit 510 can be implemented by the rectifying circuit 910 having three bridge arms as shown in any of FIGS. 11D to 11F, in which the rectifying circuit 510 has a first signal input terminal P1 coupled to the pin 501, a second signal input terminal P2 coupled to the pin 502 and the auxiliary power supply module 1060 and a third input terminal P3 coupled to the auxiliary power supply module 1060.

In the present embodiment, the LED tube lamp 700 is configured as a dual-end power supply structure for example. The external AC power supply 508 is coupled to the pins 501 and 503 on the respective end caps of the LED tube lamp 500. The difference between the present embodiment shown in FIG. 16L and the embodiment illustrated in FIG. 16K is that besides being coupled to the pin 502, the auxiliary power supply module 1060 in FIG. 16L further shares the pin 503 with the external AC power supply 508. Under the configuration of FIG. 16L, the external AC power supply 508 provides power to the signal input terminals P1 and P3 of the rectifying circuit 510 through the pins 501 and 503, and the auxiliary power supply module 1060 provides power to the signal input terminals P2 and P3 of the rectifying circuit 510 through the pins 502 and 503. In detail, if the leads connected to the pins 501 and 503 are respectively configured as a live wire (denoted by "(L)") and a neutral wire (denoted by "(N)"), the auxiliary power supply module 1060 shares the lead (N) with the external AC power supply 508 and has a lead for transmitting power as a live wire distinct from the external AC power supply 508. In this manner, the signal input terminal P3 is a common terminal between the external AC power supply 508 and the auxiliary power supply module 1060.

In operation, when the external AC power source normally operates, the rectifying circuit 510 performs the full-wave rectification by the bridge arms corresponding to the signal input terminals P1 and P2, so as to provide power to the LED module 50 based on the external AC power supply 508. However, when the external AC power source is unstable or abnormal, the rectifying circuit 510 performs the full-wave rectification by the bridge arms corresponding to the signal input terminals P2 and P3, so as to provide power to the LED module 50 based on the auxiliary power provided by the auxiliary power supply module 1060. In the above-described embodiments, the characteristic of unidirectionally conducting of a diode in a rectifying circuit 510 can isolate the inputting respectively of the external driving signal and the auxiliary power from each other, preventing the two from affecting each other, while achieving the effects of providing the auxiliary power when the external power grid 508 is in abnormal status. In actual applications, the rectifying circuit 510 can be realized by fast recovery diodes, in order to be responsive to high-frequency characteristics of the output current from an emergency power supply.

In addition, since the LED tube lamp receives the auxiliary power provided by the auxiliary power supply module 1060 through sharing the pin 503, an unused pin (e.g., pin 504) can be used as a signal input interface of other control functions. These other control functions can be a dimming function, a communication function or a sensing function, though the present disclosure is not limited thereto. The embodiment of integrating the dimming function through the unused pin 504 is further described below.

Figure 16M:
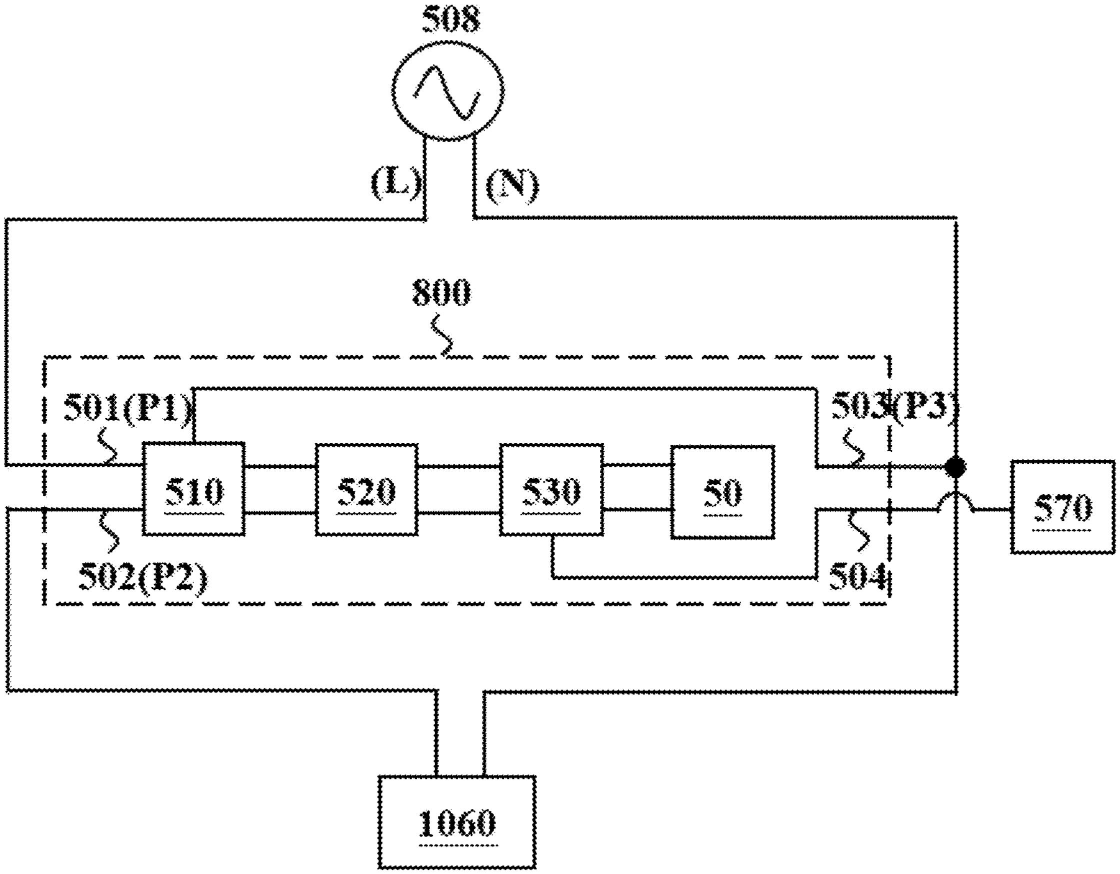

FIG. 16M is a block diagram of an LED lighting system according to still another exemplary embodiment. Referring to FIG. 16M, the LED lighting system includes an LED tube lamp 800 and an auxiliary power supply module 1060. The LED tube lamp 800 includes a rectifying circuit 510, a filtering circuit 520, a driving circuit 530 and an LED module 50. The configuration of the present embodiment is similar to the embodiment illustrated in FIG. 16L. The difference between the embodiments of FIGS. 16M and 16L is, as shown in FIG. 16M, the pin 504 of the LED tube lamp 800 is further coupled to a dimming control circuit 570, in which the dimming control circuit 570 is coupled to the driving circuit 530 through the pin 504, so that the driving circuit 530 can adjust the magnitude of the driving current, supplied to the LED module 50, according to a dimming signal received from the dimming control circuit 570. Therefore, the brightness and/or the color temperature of the LED module 50 can be varied according to the dimming signal.

For example, the dimming control circuit 570 can be implemented by a circuit including a variable impedance component (e.g., a variable resistor, a variable capacitor or a variable inductor) and a signal conversion circuit. The impedance of the variable impedance component can be tuned by a user, so that the dimming control circuit 570 generates the dimming signal having signal level corresponding to the impedance. After converting the signal formation (e.g., signal level, frequency or phase) of the dimming signal to conform the signal formation of the driving circuit 530, the converted dimming signal is transmitted to the driving circuit 530, so that the driving circuit 530 adjusts the magnitude of the driving current based on the converted dimming signal. In some embodiments, the brightness of the LED module 50 can be adjusted by tuning the frequency or the reference level of the lamp driving signal. In some embodiments, the color temperature of the LED module 50 can be adjusted by tuning the brightness of the red LED units.

It should be noted that, by utilizing the structural configurations as shown in FIGS. 161 and 16J, the auxiliary power supply module 960/1060 can obtain the similar benefits and advantages described in the embodiments of FIGS. 161 and 16J.

The disposition or configuration of the embodiments respectively in FIGS. 16D to 16M can be applied not only for providing emergency power for one tube lamp, but also for providing auxiliary emergency power in a structure of multiple tube lamps connected in parallel. Specifically, under the structure of multiple tube lamps connected in parallel, conductive pin(s) at each end of each tube lamp is/are connected to corresponding pins at corresponding ends respectively of the other tube lamps, in order to receive an identical external driving signal. For example, the first pins 501 respectively of the multiple tube lamps are connected to each other, the second pins respectively of the multiple tube lamps are connected to each other, and so on. Under this type of connection disposition, the auxiliary power supply module 760/860 is equivalent to be connected to conductive pin(s) of each of the multiple tube lamps connected in parallel. Therefore, as long as the output power of the auxiliary power supply module 760/860 is sufficient to light up all of the multiple tube lamps connected in parallel, when an abnormal condition occurs to the external power source (so an external driving signal cannot be provided), the auxiliary power supply module 760/860 may provide auxiliary power to light up all of the multiple tube lamps for emergency lighting. In practical applications, taking a structure of 4 LED tube lamps connected in parallel as an example, an auxiliary power supply module 760 can be designed to be an energy-storage unit having energy capacity in the range of 1.5-7.5 Wh (watt-hour) and having output power in the range of 1-5 W. Under this power specification, when the auxiliary power supply module 760 provides the auxiliary power to light up LED modules, the multiple LED tube lamps as a whole can have a luminance in the range of at least 200-250 Lumens (lm) and can be lighting continuously for about 90 minutes.

In a lamp structure of multiple tube lamps, similar to the described embodiments in FIGS. 16A to 16C, only one or part of the multiple tube lamps in these embodiments respectively of FIGS. 16D to 16M may have a disposed auxiliary power supply module, and the considerations in the arrangement of the multiple tube lamps for lighting uniformity can also be applied in these embodiments. In application to the lamp structure of multiple tube lamps, a main difference between these embodiments of FIGS. 16D to 16M and the described embodiments in FIGS. 16A to 16C is that, even if only one of the multiple tube lamps in these embodiments of FIGS. 16D to 16M has a disposed auxiliary power supply module, this auxiliary power supply module can still be used to provide the auxiliary power to the rest of the multiple tube lamps.

It should be noted that although the above explanation takes a structure of 4 LED tube lamps connected in parallel as an example, a person of ordinary skill in the art after referencing the description herein should understand how to choose appropriate energy-storage unit(s) for implementation in a structure of 2, 3, or more than 4 LED tube lamps connected in parallel. Thus, each embodiment where auxiliary power supply module(s) 760 can provide power concurrently to one or more of the multiple tube lamps connected in parallel to enable the supplied tube lamp(s) to exhibit certain luminance in response to the provided auxiliary power, is within the scope of embodiments as described herein.

In some embodiments, each of the auxiliary power supply modules 560, 660, 760, 960, and 1060 in FIGS. 16D to 16M can be further configured to determine, according to a lighting signal, whether to provide the auxiliary power to an LED tube lamp. Specifically, the lighting signal can be a signal indicative of or reflecting a switching state of a light switch of the LED tube lamp for turning on/off the light from the LED tube lamp. For example, according to a switching state of the switch, a signal level of the lighting signal can be adjusted into a first level (such as a high logic level) or into a second level (such as a low logic level) different from the first level. When a user switches the light switch of the LED tube lamp to a position of lighting up or turning on, the lighting signal of the LED tube lamp is adjusted into the first level; and when the user switches the light switch off to a position of turning off, the lighting signal of the LED tube lamp is adjusted into the second level. In other words, when a lighting signal of an LED tube lamp is at the first level, this indicates the light switch of the LED tube lamp is switched to the position of lighting up; and when the lighting signal is at the second level, this indicates the light switch of the LED tube lamp is switched to the position of turning off. Generation of the lighting signal of an LED tube lamp can be realized by a circuit for detecting a switching state of the light switch of the LED tube lamp.

In some embodiments, each of the auxiliary power supply modules 560, 660, 760, 860, 960, and 1060 may further include a lighting determining circuit configured to receive the lighting signal; and the lighting determining circuit is also configured to determine whether to allow the energy-storage unit in the auxiliary power supply module 560, 660, 760, 860, 960, and 1060 to provide power to later-stage circuit(s), according to the signal level of the lighting signal and a detection result of a voltage detection circuit. Specifically, based on the signal level of the lighting signal and the detection result of the voltage detection circuit, there can be the following three states: (1) the lighting signal is at a first level and an external driving signal is normally provided; (2) the lighting signal is at the first level and the external driving signal is no longer provided or has insufficient AC level; and (3) the lighting signal is at a second level and the external driving signal is no longer provided. Among the three states, state (1) corresponds to the case of a user turning on the light switch of the LED tube lamp and an external power source normally provides power to the LED tube lamp, state (2) corresponds to the case of the user turning on the light switch of the LED tube lamp but the external power supplying is in an abnormal state, and state (3) corresponds to the case of the user turning off the light switch of the LED tube lamp to stop power supplying from the external power source.

As described herein, both the states (1) and (3) are normal operation states, meaning the external power source is normally provided upon the user turning on the LED tube lamp and the external power source is no longer provided upon the user turning off the LED tube lamp, respectively. Therefore, under each of the states (1) and (3), the auxiliary power supply module does not provide power for later-stage circuit(s). More specifically, according to a determination result of the state (1) or state (3), the lighting determining circuit causes the energy-storage unit of the auxiliary power supply module not to provide power for later-stage circuit (s). Under the state (1), the external driving signal is directly input to a rectifying circuit 510 and also used to electrically charge the energy-storage unit; and under the state (3), the external driving signal is not provided and thus not used to electrically charge the energy-storage unit.

The state (2) corresponds to the case of power from the external power source being not normally provided to the LED tube lamp upon the user turning on (a light switch of) the LED tube lamp, so according to the determination result of the state (2), the lighting determining circuit causes the energy-storage unit of the auxiliary power supply module to provide power for later-stage circuit(s), enabling the LED module 50 to emit light based on the auxiliary power provided by the energy-storage unit.

Accordingly, in applications of such lighting determining circuit, the LED module 50 can be configured to have three different sections in luminance variation. The first section is for the LED module 50 to present a first luminance (such as in the range of 1600-2200 lms) when the external power source is normally provided to the LED tube lamp of the LED module. The second section is for the LED module 50 to present a second luminance (such as in the range of 200-250 lms) when the external power source is not normally provided, and auxiliary power is used to supply instead. And the third section is for the LED module 50 to present a third luminance (as of not lighting the LED module) when the user himself turns off the power supply to prevent provision of the external power source to the LED tube lamp.

More specifically, with reference to the embodiment of FIG. 16C, the lighting determining circuit can be for example, a switch circuit (not illustrated) serially connected between an auxiliary power positive terminal 661 and an auxiliary power negative terminal 662, where the switch circuit has a control terminal for receiving the lighting signal. When the lighting signal is at the first level, the switch circuit enters into a conducting state in response to the lighting signal, so as to allow a current to electrically charge the energy-storage unit 663 through the auxiliary power positive terminal 661 and auxiliary power negative terminal 662 when an external driving signal is normally provided (e.g., state 1); or to allow the energy-storage unit 663 to provide auxiliary power through the auxiliary power positive terminal 661 and auxiliary power negative terminal 662 for use by a later-stage LED module 50, when an external driving signal is not provided or has insufficient AC level (e.g., state 2). On the other hand, when the lighting signal is at the second level, the switch circuit is cut off in response to the lighting signal, so as to prevent the energy-storage unit 663 from providing auxiliary power to later-stage circuit/module even when an external driving signal is not provided or has insufficient AC level.

In applications of the above-described auxiliary power supply module, if an auxiliary power unit (e.g., the auxiliary power unit 762 or the auxiliary power unit 862) is designed in a circuit structure that has an open-loop control mechanism, that is, there is no feedback signal to the output voltage of the auxiliary power unit. Under this mechanism, if a load is open circuited from the auxiliary power unit, the output voltage of the auxiliary power supply module will keep increasing, which may cause the auxiliary power supply module to burn or be damaged. To solve such issues, the disclosure provides multiple circuit embodiments of the auxiliary power supply module having open-circuit protection, as shown in FIGS. 16N and 16O.

Figure 16N:
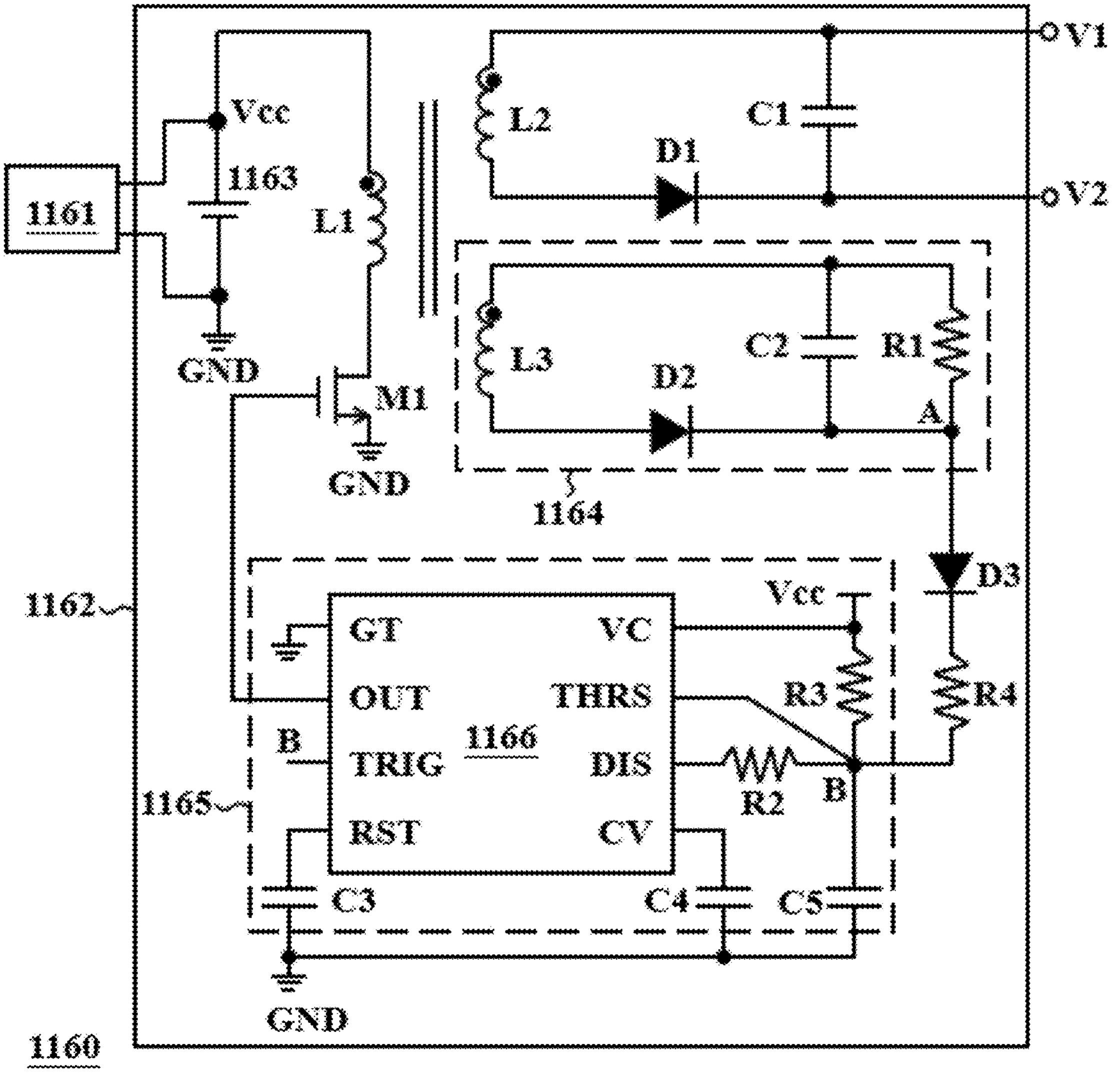
FIGS. 16N-16O are schematic circuit diagrams of auxiliary power supply modules according to some exemplary embodiments.
Figure 16O:
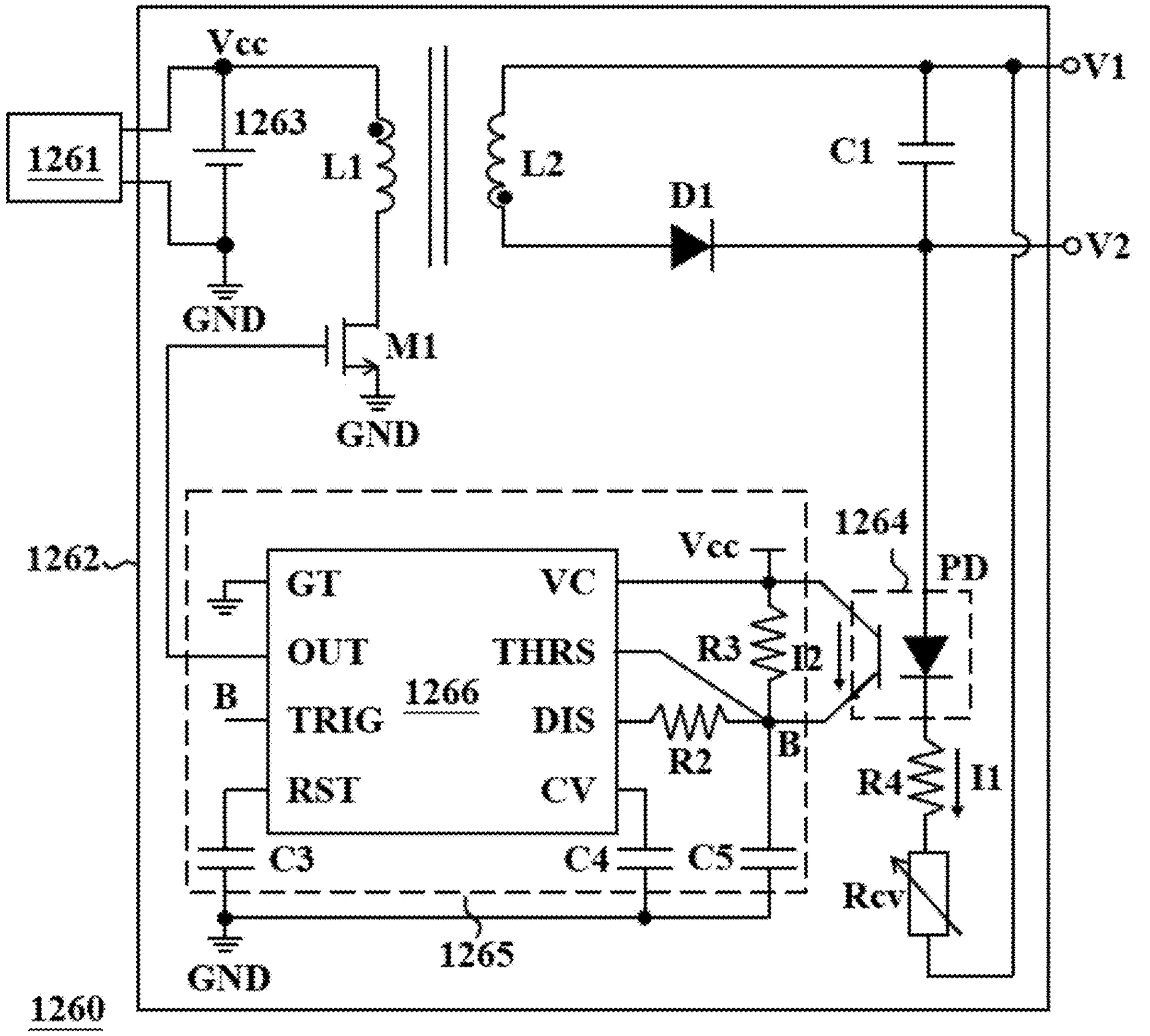

FIG. 16N is a circuit diagram of the auxiliary power supply module according to an embodiment. Referring to FIG. 16N, in this embodiment, the auxiliary power supply module 1160 includes a charging unit 1161 and an auxiliary power unit 1162. The auxiliary power unit 1162 includes a transformer, a sampling module 1164, a control module 1165, and an energy storage unit 1163 for providing a supply voltage Vcc. In the auxiliary power supply module 1160, also with reference to FIG. 16E, the transformer includes a primary winding L1 and a secondary winding L2. A terminal of the secondary winding L2 is electrically connected to switching unit 763 and therefore is electrically connected to an end of the LED tube lamp (or to input terminal(s) of rectifying circuit 510), and the other terminal of the secondary winding L2 is electrically connected to the other end of the LED tube lamp. Sampling module 1164 includes an auxiliary winding L3, which is wound along with the secondary winding L2 at the secondary side. Voltage of the secondary winding L2 is sampled by the auxiliary winding L3. If the sampled voltage exceeds a set threshold value, the sampled voltage is fed back to the control module 1165, and then the control module 1165 modulates switching frequency of a switch M1 electrically connected to the primary winding L1 based on the sampled voltage. This way of modulating the switching frequency of switch M1 then controls output voltage at the secondary side, thereby realizing open-circuit protection.

Specifically, the transformer includes a primary side unit and a secondary side unit. The primary side unit includes an energy storage unit 1163, a primary winding L1, and a switch M1. A positive electrode of the energy storage unit 1163 is electrically connected to a dotted terminal of the primary winding L1, and a negative electrode of the energy storage unit 1163 is electrically connected to a ground terminal. A non-dotted terminal of the primary winding L1 is electrically connected to the drain terminal of the switch M1 (such as a MOSFET). The gate terminal of the switch M1 Is electrically connected to control module 1165, and the source terminal of switch M1 Is connected to a ground terminal. The secondary side unit includes secondary winding L2, a diode D1, and a capacitor C1. A non-dotted terminal of the secondary winding L2 is electrically connected to the anode of diode D1, and a dotted terminal of secondary winding L2 is electrically connected to an end of the capacitor C1. The cathode of the diode D1 is electrically connected to the other end of the capacitor C1. The two ends of the capacitor C1 can be regarded as auxiliary power supply output terminals V1 and V2 (corresponding to two terminals of the auxiliary power supply module 960 in FIG. 16K, or two terminals of the auxiliary power supply module 1060 in FIGS. 16L and 16M).

Sampling module 1164 includes an auxiliary winding L3, a diode D2, a capacitor C2, and a resistor R1. A non-dotted terminal of the auxiliary winding L3 is electrically connected to the anode of diode D2, and a dotted terminal of auxiliary winding L3 is electrically connected to a first common end connecting the capacitor C2 and the resistor R1. The cathode of diode D2 is electrically connected to another common end (marked with "A" in FIG. 16N) connecting the capacitor C2 and the resistor R1. And the capacitor C2 and the resistor R1 are electrically connected to control module 1165 through the node A.

The control module 1165 includes a controller 1166, a diode D3, capacitors C3, C4 and C5, and resistors R2, R3, and R4. The ground pin GT of the controller 1166 is grounded to the ground terminal GND. The output pin OUT of the controller 1166 is electrically connected to the gate terminal of switch M1. The trigger pin TRIG of the controller 1166 is electrically connected to an end (marked with "B") of the resistor R2. The discharge pin DIS of the controller 1166 is electrically connected to the other end of resistor R2. The reset pin RST of the controller 1166 is electrically connected to an end of the capacitor C3, which has the other end connected to the ground terminal GND. The constant voltage pin CV of the controller 1166 is electrically connected to an end of the capacitor C4, which has the other end connected to the ground terminal GND. The discharge terminal DIS of the controller 1166 is coupled to an end of the capacitor C5 through the resistor R2, which capacitor C5 has the other end connected to the ground terminal GND. The power supply pin VC of the controller 1166 receives supply voltage Vcc and is electrically connected to an end of the resistor R3, which has the other end electrically connected to the node B. The anode of the diode D3 is electrically connected to the node A, the cathode of diode D3 is electrically connected to an end of the resistor R4, which has the other end electrically connected to the node B.

What follows here is a description of operations of the circuit embodiment in FIG. 16N. When the auxiliary power supply module 1160 is in a normal state, the output voltage between output terminals V1 and V2 of the auxiliary power supply module 1160 is low and usually lower than a specific value, for example 100 V. In the present embodiment, the output voltage between the output terminals V1 and V2 is in the range 60 V to 80 V. At this time the voltage, relative to the ground terminal GND, sampled at the node A of the sampling module 1164 is low such that a small current is flowing through the resistor R4 and can be ignored. When the auxiliary power supply module 1160 is in an abnormal state, the output voltage between the output terminals V1 and V2 of the auxiliary power supply module 1160 is relatively high, for example over 300 V, and then the voltage sampled at the node A of the sampling module 1164 is relatively high such that a relatively large current is flowing through the resistor R4. The relatively large current flowing through the resistor R4 increases the discharge time of the capacitor C5, whose charge time is unchanged, and this amounts to adjusting the duty cycle of the switch M1 to increase the cutoff time. With respect to the output side of the transformer, the adjusting of the duty cycle causes a smaller output energy, and thus the output voltage will not keep increasing, so as to achieve the purpose of open-circuit protection.

In this embodiment, the trigger terminal TRIG of the controller 1166 is electrically connected to the discharge terminal DIS of the controller 1166 through the resistor R2, and the discharge terminal DIS is triggered when the voltage at the node B is in the range (⅓)*Vcc to (⅔)*Vcc (the "*" denoting multiplication). When the auxiliary power supply module 1160 is in the normal state, i.e., its output voltage does not exceed a set threshold value, the voltage sampled at the node A may be lower than (⅓)*Vcc. When the auxiliary power supply module 1160 is in the abnormal state, the voltage sampled at the node A may reach or be higher than (½)*Vcc.

Figure 16P:
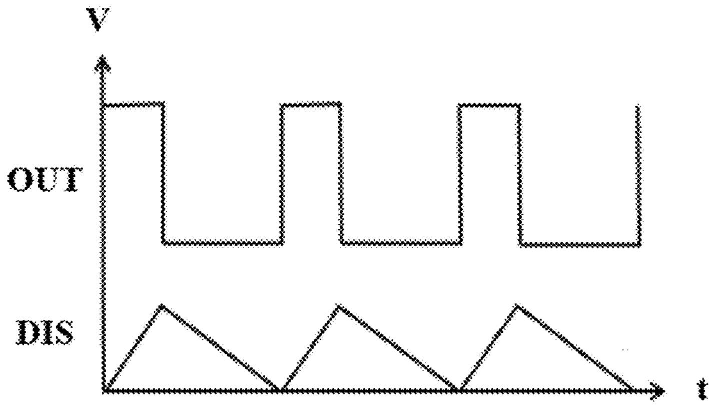
FIGS. 16P-16Q are charge-discharge waveforms of auxiliary power supply modules according to some exemplary embodiments.

In this embodiment, during the normal state, the auxiliary power supply module 1160 supplies power normally when the discharge pin DIS of the controller 1166 is triggered. The waveforms of the voltages at the discharge pin DIS and the output pin OUT are shown in FIG. 16P. FIG. 16P shows charge-discharge waveform at the discharge pin DIS and the voltage waveform at the output terminal OUT along the time axis when auxiliary power supply module 1160 is in the normal state. As shown in FIG. 16P, when the discharge pin DIS is triggered, meaning the controller 1166 is in a discharge stage (to discharge the capacitor C5), a low voltage is output at the output pin OUT. When the discharge pin DIS is not triggered, meaning the controller 1166 is in a charge stage (to charge the capacitor C5), a high voltage is output at the output pin OUT. Accordingly, the high and low voltage levels output at the output pin OUT are respectively used to control current conduction and cutoff of the switch M1.

Figure 16Q:
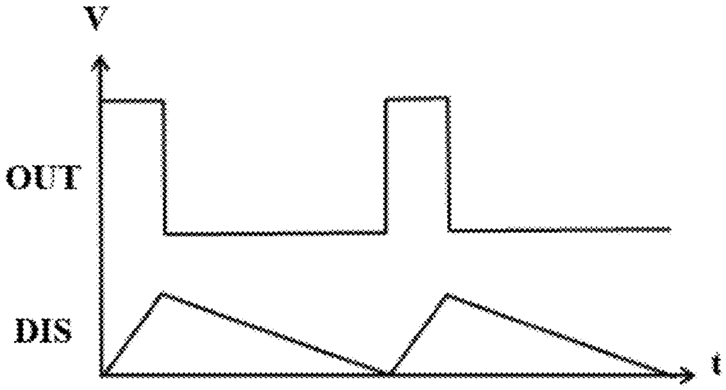

On the other hand, when the auxiliary power supply module 1160 is in the abnormal state, charge-discharge waveform at the discharge pin DIS and voltage waveform at the output pin OUT along the time axis are shown in FIG. 16Q. It is clear from FIGS. 16P and 16Q that no matter whether the auxiliary power supply module 1160 is in the normal state or the abnormal state, the period for which the discharge pin DIS is not triggered, which amounts to the period for which the capacitor C5 is charged, is the same for the two cases. And when auxiliary power supply module 1160 is in the abnormal state, since there is a current flowing from the node B to the discharge pin DIS, which results in the discharge time of the capacitor C5 being extended, a smaller or relatively small output energy results at the output side of the transformer or the auxiliary power supply module 1160 and thus the output voltage does not keep increasing, so as to achieve the purpose of open-circuit protection.

In the present embodiment, an example that can be chosen as or to constitute the control module 1166 is a chip with regulation function by time, such as a 555 timer IC, for example to control the cutoff period of the switch M1. And the present embodiment can be implemented by using resistors and capacitors to achieve the prolonging of discharge time, without using a complicated control scheme. And the voltage range for the supply voltage Vcc in this embodiment is 4.5V to 16V.

By using circuit in the embodiment discussed above, open-circuit output voltage of the auxiliary power supply module 1160 can be limited to be below a specific value, such as 300V, which can be determined by choosing appropriate values for parameters in the circuit.

It should be noted that in the circuit of the above embodiment, each electrical element or component depicted in the relevant figures, such as a resistor, capacitor, diode, or MOSFET (as switch M1), is intended to be a representative or equivalent of any plurality of such an element that may be actually used and connected according to relevant rules to implement this embodiment.

FIG. 16O is a circuit diagram of the auxiliary power supply module according to an embodiment. Referring to FIG. 16O, the auxiliary power supply module 1260 includes a charging unit 1261 and an auxiliary power unit 1262. The auxiliary power unit 1262 includes a transformer, a sampling module 1264, a control module 1265, and an energy storage unit 1263 for providing a supply voltage Vcc. The difference between embodiments of FIG. 16O and FIG. 16N is that the sampling module 1264 in the embodiment of FIG. 16O is implemented by an optical coupler.

The transformer includes a primary winding L1 and a secondary winding L2. Configuration of the primary winding L1 with a switch M1 is the same as that in the above-described embodiment. A dotted terminal of the secondary winding L2 is electrically connected to the anode of a diode D1, and a non-dotted terminal of the secondary winding L2 is electrically connected to an end of a capacitor C1. The cathode of the diode D1 is electrically connected to the other end of the capacitor C1. And the two ends of the capacitor C1 can be regarded as auxiliary power supply output terminals V1 and V2.

The sampling module 1264 includes an optical coupler PD having at least one photodiode, whose anode is electrically connected to the cathode of the diode D1 and an end of the capacitor C1 and whose cathode is electrically connected to an end of a resistor R4. The other end of the resistor R4 is electrically connected to an end of a clamping component Rcv, which has the other end electrically connected to the other end of the capacitor C1. A bipolar junction transistor in the optical coupler PD has a collector and an emitter electrically connected to two ends of a resistor R3 respectively.

The control module 1265 includes a controller 1266, capacitors C3, C4 and C5, and resistors R2 and R3. The power supply pin VC of the controller 1266 is electrically connected to the collector of the bipolar junction transistor in the optical coupler PD. The discharge pin DIS of the controller 1166 is electrically connected to an end of the resistor R2, which has the other end electrically connected to the collector of the bipolar junction transistor in the optical coupler PD. The sample pin THRS of the controller 1166 is electrically connected to the emitter of the bipolar junction transistor in the optical coupler PD and is connected to an end of the capacitor C5, which capacitor C5 has the other end electrically connected to the ground terminal GND. The ground pin GT of the controller 1166 is grounded to the ground terminal GND. The reset pin RST of the controller 1166 is electrically connected to an end of the capacitor C3, which has the other end connected to the ground terminal GND. The constant voltage pin CV of the controller 1166 is electrically connected to an end of the capacitor C4, which has the other end connected to the ground terminal GND. The trigger pin TRIG of the controller 1166 is electrically connected to the sample pin THRS. And the output pin OUT of the controller 1166 is electrically connected to the gate terminal of the switch M1.

What follows here is a description of operations of the circuit embodiment in FIG. 16O. When the auxiliary power supply module 1260 is in a normal state, the output voltage between the output terminals V1 and V2 of the auxiliary power supply module 1260 is lower than a clamping voltage of the clamping component Rcv, so a current I1 flowing through the resistor R4 is small and can be ignored. And a current I2 flowing through the collector and emitter of the bipolar junction transistor in the optical coupler PD is also small.

When the load is in an open-circuit condition, the output voltage between the output terminals V1 and V2 of the auxiliary power supply module 1260 increases and, when the output voltage exceeding a threshold voltage value of the clamping component Rcv, then conducts the clamping component Rcv, causing the current I1 flowing through the resistor R4 to increase. The increase of the current I1 then lights up the photodiode of the optical coupler PD, which causes the current I2 flowing through the collector and emitter of the bipolar junction transistor in the optical coupler PD to proportionally increase. The increase of the current I2 then compensates for discharging of the capacitor C5 through the resistor R2, prolonging the discharging time of the capacitor C5 and thereby prolonging the cutoff time of the switch M1 (i.e., reducing the duty cycle of the switch M1). With respect to the output side of the transformer, this reducing or adjusting of the duty cycle causes a smaller output energy, and thus the output voltage will not keep increasing, so as to achieve the purpose of open-circuit protection.

In this embodiment of the auxiliary power supply module 1260, the clamping component Rcv may be or comprise for example a varistor, a transient voltage suppressor diode (TVS diode), or a voltage regulation diode such as a Zener diode. The trigger threshold value of the clamping component Rcv may be in the range 100 to 400 V, and is preferably in the range 150 to 350 V. In some example embodiments herein, 300 V is chosen as the trigger threshold value.

In one embodiment of the auxiliary power supply module 1260, the resistor R4 operates mainly to limit current, and its resistance may be in the range 20 k to 1 M ohm (the "M" denoting a million) and is preferably in the range 20 k to 500 k ohm. In some disclosed embodiments herein, 50 k ohm is chosen as the resistance of the resistor 6511. And the resistor R3 operates mainly to limit current, and its resistance may be in the range 1 k to 100 k ohm and is preferably in the range 5 k to 50 k ohm. In the disclosed embodiments herein, 6 k ohm is chosen as the resistance of the resistor R3. In this embodiment of the auxiliary power supply module 1260, capacitance of the capacitor C5 may be in the range 1 nF to 1000 nF and is preferably in the range 1 nF to 100 nF. In some disclosed embodiments herein, 2.2 nF is chosen as the capacitance of the capacitor C5. Capacitance of the capacitor C4 may be in the range 1 nF to 1 pF and is preferably in the range 5 nF to 50 nF. In some disclosed embodiments herein, 10 nF is chosen as the capacitance of the capacitor C4. And capacitance of the capacitor C1 may be in the range 1 uF to 100 uF and is preferably in the range 1 uF to 10 uF. In some disclosed embodiments herein, 4.7 uF is chosen as the capacitance of the capacitor C1. The specific values for components described above in connection with FIG. 16O may be combined in one embodiment, or some of them may be used with other components having different values from the specific values described above.

In the embodiments of FIG. 16N and FIG. 16O, the energy storage unit 1163 of the auxiliary power supply module 1160/1260 may comprise for example a battery or a supercapacitor. In the above embodiments, DC power supply by the auxiliary power supply module 1160/1260 may be managed by a BMS so as to charge the capacitor C5 when the LED tube lamp operates in a normal lighting mode. Or the capacitor C5 may be charged when the LED tube lamp operates in a normal lighting mode, without the BMS. Through choosing appropriate values of parameters of components of the auxiliary power supply module 1160/1260, a small current, for example not exceed 300 mA, can be used to charge the auxiliary power supply module 1160/1260.

Advantages of using the auxiliary power supply module 1160/1260 embodiments of FIGS. 16N and 16O include that it has relatively simple circuit topology; a specialized integrated circuit chip is not needed to implement it; relatively few components are used to implement the open-circuit protection and thus the reliability of the auxiliary power supply module can be improved. The topology of the auxiliary power supply module 1160/1260 can be implemented by an isolation circuit structure so as to reduce the risks of current leakage.

In summary, the principle of using the auxiliary power supply module 1160/1260 embodiments of FIGS. 16N and 16O is to sample an output voltage (or current) as by using the sampling module 1164; and if the voltage/current sample exceeds a predefined threshold value, to prolong the cutoff period of the switch M1 by prolonging time of discharge through the discharge terminal DIS/THRS of the controller 1166, thereby modulating the duty cycle of the switch M1. The operating voltage at the discharge terminal DIS/THRS of the controller 1166 is in the range between (⅓)*Vcc and (⅔)*Vcc, each charge time of the capacitor C5 is about the same, but its discharge time is prolonged. Therefore, this adjusting of the duty cycle causes a smaller output energy, and thus the output voltage will not keep increasing, so as to achieve the purpose of open-circuit protection.

FIG. 16P and FIG. 16Q show a time diagram including corresponding waveforms of the voltage at the OUT terminal and the voltage at the DIS terminal of the control module 1165, when the auxiliary power supply module is working in the normal state. FIG. 9N shows a time diagram including corresponding waveforms of the voltage at the OUT terminal and the voltage at the DIS/THRS terminal of the control module 1165, when the auxiliary power supply module is in an abnormal state (as when the load is open-circuited). The voltage at the OUT terminal is initially at a high level while the DIS/THRS terminal is not triggered (so the capacitor C5 is being charged). When the DIS/THRS terminal is triggered (so the capacitor C5 is discharging), the voltage at the OUT terminal falls to be at a low level. The waveform or signal of the voltage at the OUT terminal is thus used to control current conduction and cutoff of the switch M1.

For any one of the above mentioned or described embodiments of a power supply device to effectively reduce any harms to a load circuit caused by a surge signal, a surge protection circuit is further disposed on a power loop on which each above-described power supply device and a load circuit are. By performing at least one of filtering out high-frequency signals, releasing excessive energy, and temporarily storing and gradually releasing excessive energy, the surge protection circuit performs surge protection process to a surge signal superposed on an external driving signal. In the following description, the circuit structure of an LED tube lamp lighting system is taken as an example for exemplifying the surge protection circuit therein by example circuit structures.

Figure 49A:
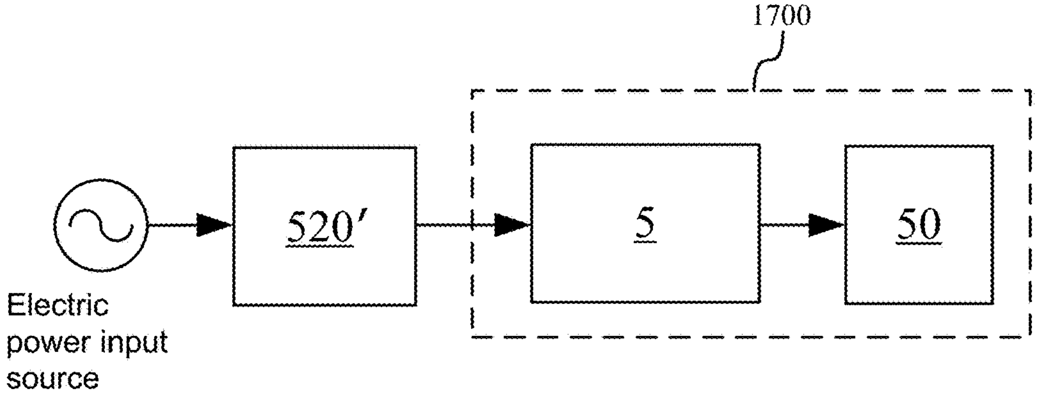
FIG. 49A to FIG. 49C are circuit block diagrams of an LED tube lamp lighting system according to some embodiments of the present disclosure.

FIG. 49A is a circuit block diagram of an LED tube lamp lighting system according to some embodiments of the present disclosure. Referring to FIG. 49A, an LED tube lamp lighting system in this embodiment includes an LED tube lamp 1700 and a surge protection circuit 520'. The LED tube lamp 1700 is for example any one of the tube lamps 500, 600, 700, or 800 described in the above-mentioned embodiments. The tube lamp 1700 includes a power supply module 5 and an LED module 50, wherein the power supply module 5 may employ the circuit structures of a power supply module corresponding to the LED tube lamp 500, 600, 700, or 800, and the power supply module 5 may omit some circuit unit(s), such as a filtering circuit, of a power supply module corresponding to the LED tube lamp 500, 600, 700, or 800. This embodiment of FIG. 49A and the below mentioned embodiments are presented mainly for explaining configured position of the surge protection circuit 520' and are not intended to limit circuit structures of the power supply module 5. The surge protection circuit 520' in this embodiment is disposed external to the LED tube lamp 1700 and on a power line of an electric power input source, such as being disposed in a lamp socket and configured for receiving an external driving signal. The external driving signal mentioned herein may be an AC power signal provided by an external grid 508 illustrated in any of FIG. 8A to FIG. 8E, an electrical signal provided by an electrical ballast, or even a DC signal. When a surge is generated on the external driving signal, the surge protection circuit 520' is configured to reduce the impact of the surge on the LED tube lamp 1700. It should be noted that the surge protection circuit 520' is not limited to being applied in the LED tube lamp lighting system illustrated in FIG. 49A, and in other embodiments the LED tube lamp 1700 as a later-stage device coupled to the surge protection circuit 520' may be substituted by other load circuit, as long as the other load circuit is an electrical appliance configured to operate or work using an external driving signal. Said other load circuit is for example any one of such electrical appliances as a TV set, an intelligent terminal device, and an electric power-driven toy. Similarly, in below descriptions an LED tube lamp is taken as an example for describing and explaining configured structure(s) and operation principle of a surge protection circuit, which descriptions taking an LED tube lamp as an example should not be understood to limit the application area of a surge protection circuit disclosed herein.

Figure 49B:
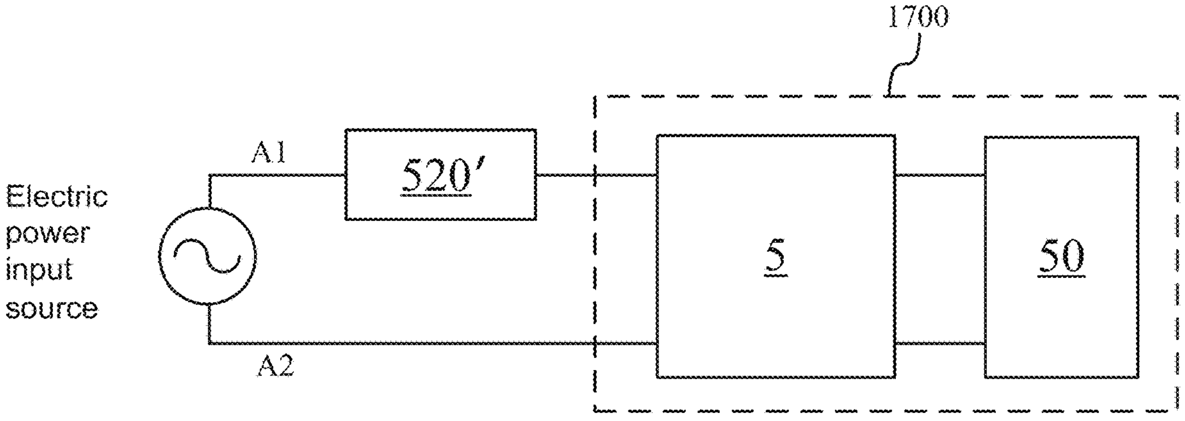

FIG. 49B is a circuit block diagram of an LED tube lamp lighting system according to some embodiments of the present disclosure. This embodiment of FIG. 49B mainly discloses a way of configuration of a surge protection circuit in an LED tube lamp lighting system, and according to the basis of the LED tube lamp lighting system disclosed as shown in FIG. 49A, the surge protection circuit 520' in FIG. 49B has an input terminal coupled to an electric power input terminal A1 of an electric power Input source, and an output terminal coupled to the pin of the LED tube lamp 1700 which pin is for correspondingly connecting to the electric power input terminal A1, in order to process an external driving signal outputted from the electric power input terminal A1. The LED tube lamp 1700 is electrically connected to the output terminal of the surge protection circuit 520' and an electric power input terminal A2 respectively. An electric surge is in general an instantaneously changing voltage signal, and when a surge is generated in electric power inputted through the electric power input terminal A1, the surge protection circuit 520' detects a surge signal and then causes a surge-releasing loop to conduct current in order to release the surge energy and thus reduce the impact of the surge on the LED tube lamp 1700. When the electric power input source is mains power or AC line power from the external grid 508, the electric power input terminals A1 and A2 may be on the live-wire (L) and on the neutral-wire (N) respectively. When the electric power input source is from an electrical ballast, the electric power input terminals A1 and A2 may be on two output terminals of the ballast respectively. According to the two cases of the electric power input source, the electric power input terminals A1 and A2 mentioned hereinafter are to be similarly understood without being so explained again.

In this embodiment illustrated in FIG. 49B, the surge protection circuit 520' is serially connected on a power loop, wherein when a surge passes through the surge protection circuit 520', an electric potential difference is formed across two sides/terminals of the surge protection circuit 520', which electric potential difference causes the surge protection circuit 520' to activate its surge protection function. However, the way of how the surge protection circuit 520' is connected is not limited to such a connection of being serially connected on a power loop, and in some other embodiments the surge protection circuit 520' is connected in parallel with a power loop in that the surge protection circuit 520' has an input terminal electrically connected to an electric power input terminal A1 and has an output terminal electrically connected to an electric power input terminal A2. When an instantaneously changed electric potential difference is formed between the electric power input terminals A1 and A2 by a surge, the electric potential difference causes the surge protection circuit 520' to conduct current on an energy-releasing loop in order to release the surge energy and thus reduce the impact of the surge on later-stage circuit(s). It should be noted that the power loop mentioned in the above embodiments refers to a path on which a power input source transmits/supplies current to a load (such as an LED module 50). Taking the LED module 50 as an example of the load, the power loop refers to both a path on which a power input source transmits/supplies current to a power supply module 5 in the LED tube lamp and a path on which the power supply module 5 transmits/supplies current to the LED module 50. And any power loop mentioned below is to be understood in similar way and will not be so explained again.

Figure 49C:
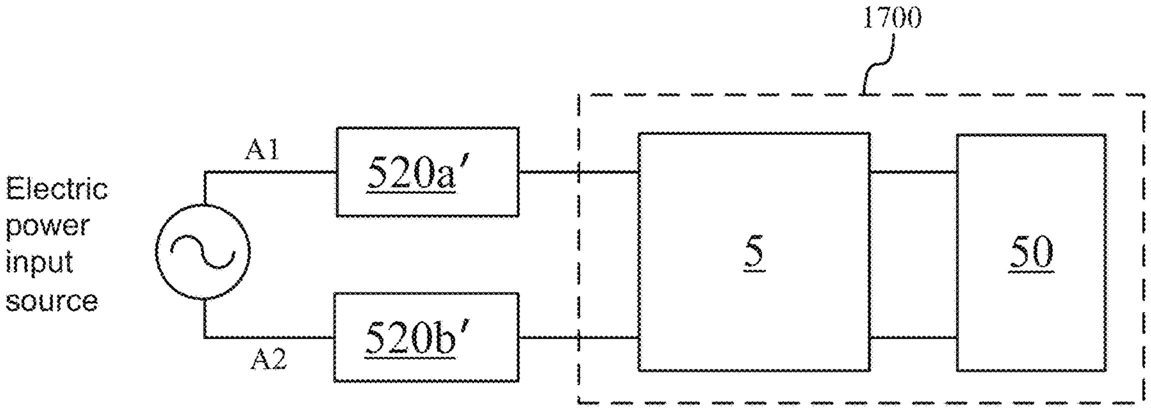

FIG. 49C is a circuit block diagram of an LED tube lamp lighting system according to some embodiments of the present disclosure. This embodiment of FIG. 49C also mainly discloses a way of configuration of a surge protection circuit in an LED tube lamp lighting system and compared to that in FIG. 49B the main difference is that the surge protection circuit in this embodiment of FIG. 49C includes a first surge protection circuit 520*a*' and a second surge protection circuit 520*a*'. The first surge protection circuit 520*a*' has an input terminal coupled to an electric power input terminal A1 and an output terminal coupled to the pin of an LED tube lamp 1700 which pin is for correspondingly connecting to the electric power input terminal A1. The second surge protection circuit 520*b*' has an input terminal coupled to an electric power input terminal A2 and an output terminal coupled to the pin of the LED tube lamp 1700 which pin is for correspondingly connecting to the electric power input terminal A2. An external driving signal outputted from the electric power input terminals A1 and A2 will go through or undergo processing by the surge protection circuit to reduce the impacts of any appearing surge on the LED tube lamp 1700.

The various embodiments described above may be conveniently compatible with or cooperate with a power supply module that does not include an integrated surge protection circuit, by disposing a surge protection circuit external to a power supply module and between a power input source and the power supply module, such as disposing a surge protection circuit into a lamp socket for an LED tube lamp, in order to effectively improve surge protection function for a load circuit. In some applications, the surge protection circuit may be part of a power supply module to realize a surge protection function. What follows immediately is a description of ways of configuration of a surge protection circuit in a power supply module illustrated in FIGS. 50A to 50E.

Figure 50A:
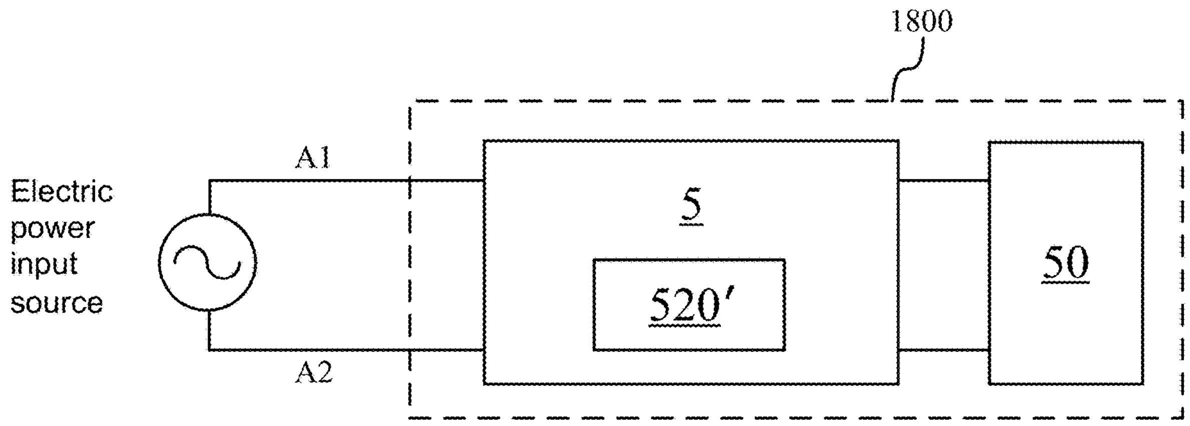
FIG. 50A to FIG. 50E are circuit block diagram of a configuration of a surge protection circuit in a power supply module according to some embodiments of the present disclosure.

FIG. 50A is a circuit block diagram of a configuration of a surge protection circuit in a power supply module according to some embodiments of the present disclosure. An LED tube lamp 1800 in this embodiment of FIG. 50A may for example directly receive an external driving signal provided by an electric power input source, which external driving signal is input through electric power input terminals A1 and A2 to corresponding pins of the LED tube lamp 1800. A surge protection circuit 520' in this embodiment of FIG. 50A is disposed in the LED tube lamp 1800 to be part of a power supply module 5 of the LED tube lamp 1800. In other words, the power supply module 5 of the LED tube lamp 1800 further includes the surge protection circuit 520' compared to the power supply module in any one of the LED tubes lamps 500, 600, 700, 800, and 1700 in the above-described embodiments. When there is surge in a signal received by the LED tube lamp 1800, the surge protection circuit 520' absorbs the surge to reduce its impacts on later-stage circuit (s). It should be noted that in various embodiments in which a surge protection circuit is disposed in a power supply module 5, the power supply module 5 may employ the circuit structures of a power supply module corresponding to the LED tube lamp 500, 600, 700, or 800, and the power supply module 5 may omit some circuit unit(s), such as a filtering circuit, of a power supply module corresponding to the LED tube lamp 500, 600, 700, or 800. The below mentioned embodiments are presented mainly for explaining configured position of a surge protection circuit 520' and are not intended to limit circuit structures of a power supply module 5. Therefore, FIG. 50A to FIG. 50E may include dotted line(s) to represent other possibly present circuit unit(s) or part(s) in the power supply module 5 in embodiments illustrated in FIG. 50A to FIG. 50E.

Figure 50B:
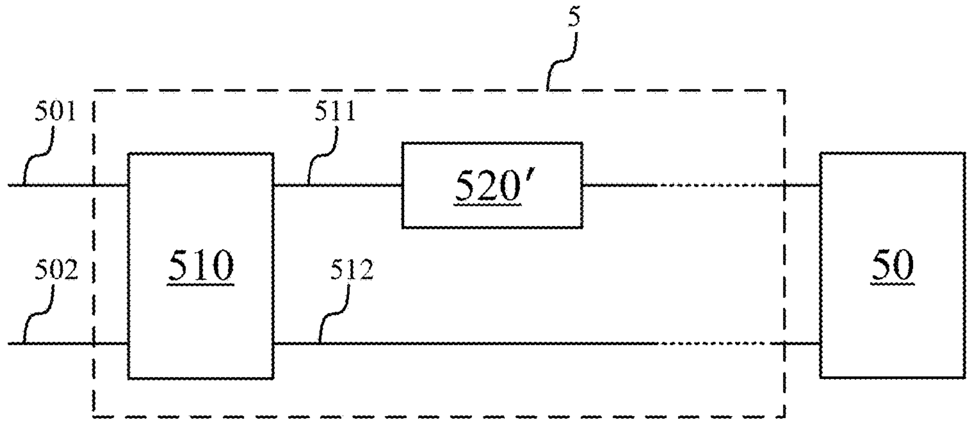

FIG. 50B is a circuit block diagram of a configuration of a surge protection circuit in a power supply module according to some embodiments of the present disclosure. This embodiment of FIG. 50B mainly discloses a way of configuration of a surge protection circuit in a power supply module. In this embodiment of FIG. 50B, a power supply module 5 further includes a surge protection circuit 520' in addition to a rectifying circuit 510. In this embodiment, the surge protection circuit 520' is serially connected on a power line of a first rectifying output terminal 511 of the rectifying circuit 510, in order to receive a rectified signal. When there is surge in the rectified signal outputted from the first rectifying output terminal 511 of the rectifying circuit 510, the surge protection circuit 520' is configured to perform surge protection process on the surge signal, in order to reduce the impacts of the surge on later-stage circuit(s).

Figure 50C:
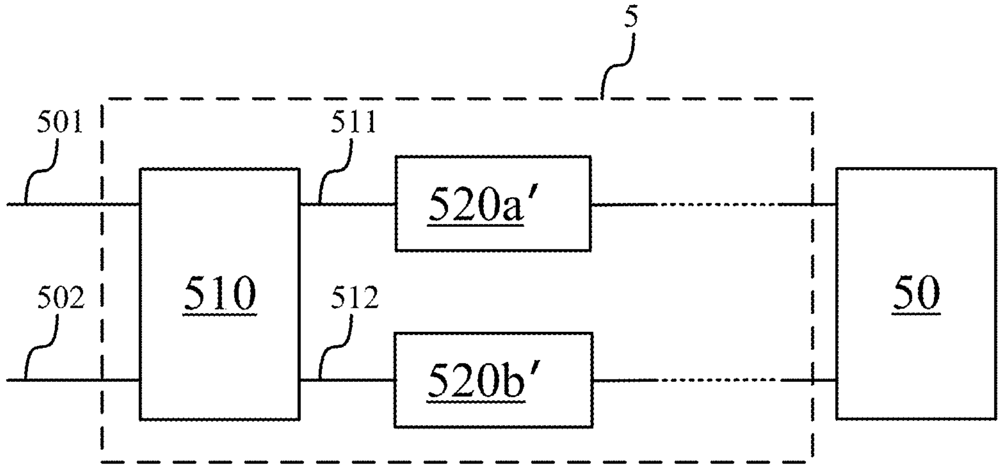

FIG. 50C is a circuit block diagram of a configuration of a surge protection circuit in a power supply module according to some embodiments of the present disclosure. Compared to that in FIG. 50B, the main difference is that a surge protection circuit in this embodiment of FIG. 50C includes a first surge protection circuit 520*a*' and a second surge protection circuit 520*a*'. The first surge protection circuit 520*a*' is serially connected to a first rectifying output terminal 511 of a rectifying circuit 510, and the second surge protection circuit 520*b*' is serially connected to a second rectifying output terminal 512 of the rectifying circuit 510. That is, the first rectifying output terminal 511 and the second rectifying output terminal 512 of the rectifying circuit 510 are each connected to a surge protection circuit. When there is surge in a rectified signal outputted from either of the first rectifying output terminal 511 and the second rectifying output terminal 512 of the rectifying circuit 510, the surge protection circuit connected to the rectifying output terminal that outputs the rectified signal is configured to process it to reduce the impacts of the surge on later-stage circuit(s).

Figure 50D:
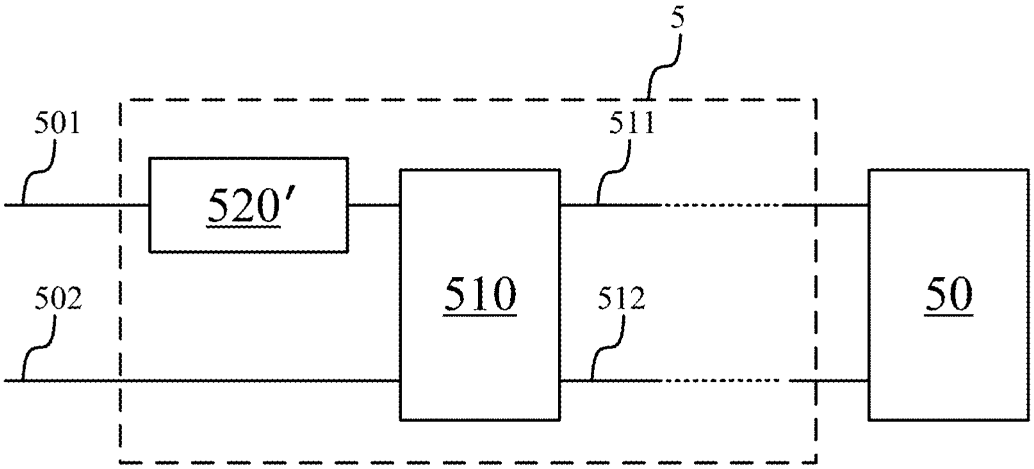

FIG. 50D is a circuit block diagram of a configuration of a surge protection circuit in a power supply module according to some embodiments of the present disclosure. Compared to that in FIG. 50B, the main difference is that a surge protection circuit 520' in this embodiment of FIG. 50D is serially connected between a first pin 501 and a rectifying circuit 510, in order to receive an external driving signal. The rectifying circuit 510 is connected to later-stage circuit (s) through first and second rectifying output terminals 511 and 512. The external driving signal is input from the electric power input terminal A1 and outputted through the first pin 501 to the surge protection circuit 520'. When there is surge in the external driving signal input through the electric power input terminal A1, the surge protection circuit 520' can absorb and then output surge energy in the surge signal to the rectifying circuit 510, which performs following process thereon in order to reduce the impacts of the surge on an LED tube lamp of the power supply module.

Figure 50E:
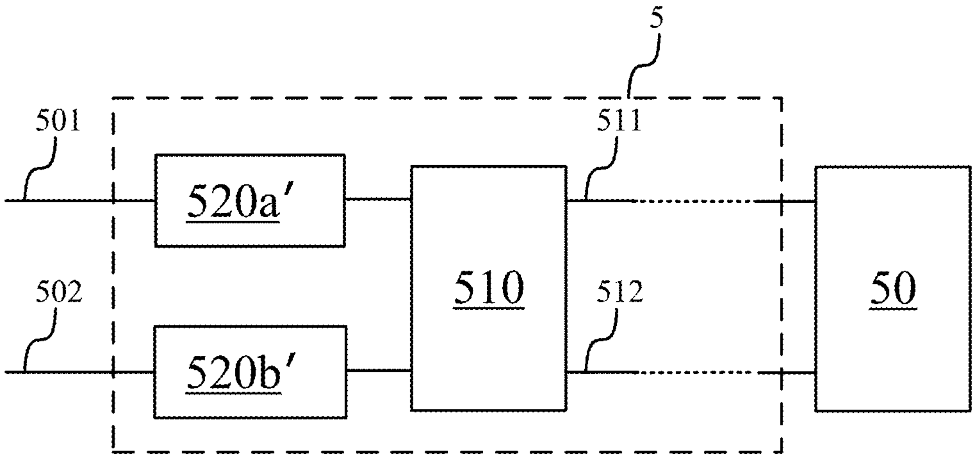

FIG. 50E is a circuit block diagram of a configuration of a surge protection circuit in a power supply module according to some embodiments of the present disclosure. Compared to that in FIG. 50C, the main difference is that in this embodiment of FIG. 50E a first surge protection circuit 520*a*' is serially connected between a first pin 501 and a rectifying circuit 510, and a second surge protection circuit 520*b*' is serially connected between a second pin 502 and the rectifying circuit 510. The rectifying circuit 510 is connected to later-stage circuit(s) through first and second rectifying output terminals 511 and 512. That is, accordingly there is a surge protection circuit that receives an external driving signal input concurrently through electric power input terminals A1 and A2; when there is surge in the external driving signal input through the electric power input terminal A1, the first surge protection circuit 520*a*' is configured to process it to reduce the impacts of the surge on later-stage circuit(s); and when there is surge in the external driving signal input through the electric power input terminal A2, the second surge protection circuit 520*b*' is configured to process it to reduce the impacts of the surge on later-stage circuit(s). Then the first and second surge protection circuits 520*a*' and 520*b*' output the processed external driving signal to the rectifying circuit 510 for subsequent processing, therefore reducing the impacts of the surge on the LED tube lamp.

Accordingly, the above FIG. 50B to FIG. 50E merely illustrate examples of ways of configuring a surge protection circuit in a power supply module. In real practice a power supply module 5 illustrated in each of FIG. 50B to FIG. 50E may directly output power to a load, or the power supply module 5 further includes other circuit(s) to realize stable provision of power to a load. Taking a power supply module 5 used for an LED tube lamp as an example, the first rectifying output terminal 511 (of a rectifying circuit 510) or an output terminal of a surge protection circuit 520' (which is a terminal not directly connected to the rectifying circuit 510) is connected to other circuit(s) in the power supply module 5, in order to stably provide power for a later-stage LED module, wherein said other circuit(s) comprises for example a filtering circuit described in FIG. 12B, 12C, or 12H, or a driving circuit described in each of FIG. 13A to FIG. 13E. In embodiments where said other circuit(s) comprises a filtering circuit, a surge protection circuit may be coupled at a stage later than the filtering circuit or may be integrated with the filtering circuit as a whole unit for simplifying or making compact included circuit structures. Besides, according to a distinct power supply module used or applied for a distinct load, other circuit/component portion needed for supplying power to the distinct load may replace the filtering circuit and/or driving circuit as in the distinct power supply module, and the load of LED module may be replaced with other load. Taking a fluorescent lamp as a load for example, a load of LED module 50 illustrated as in each of FIG. 50B to FIG. 50E should be replaced with a fluorescent module, which is to be connected to a power supply module 5.

Figure 51:
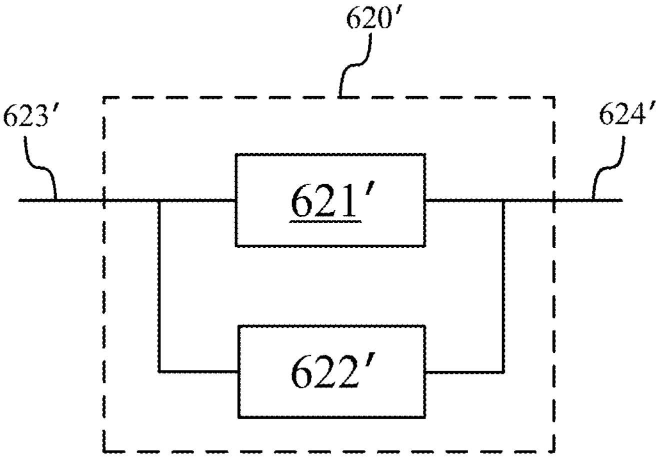
FIG. 51 is a circuit block diagram of a surge protection circuit according to some embodiments of the present disclosure.

FIG. 51 is a circuit block diagram of a surge protection circuit according to some embodiments of the present disclosure. Referring to FIG. 51, a surge protection circuit 620' has an input terminal 623' and an output terminal 624' and includes an inductive circuit 621' and an energy-releasing circuit 622'. The inductive circuit 621' is coupled to a power loop (in a position as shown in each of FIGS. 49A to 49C or in each of FIGS. 50A to 50E) through the input and output terminals 623' and 624' of the surge protection circuit 620', in order to receive and temporarily store surge energy in the power loop. The energy-releasing circuit 622' is connected in parallel with the inductive circuit 621' and between the input and output terminals 623' and 624' of the surge protection circuit 620', in order to release surge energy in the power loop, thus preventing the surge energy from affecting later-stage circuit(s). When there is surge energy in an external driving signal input from an electric power input source, the surge energy goes with the external driving signal to enter into the power loop, and then the inductive circuit 621' receives and stores the surge energy, thereby producing an electric potential difference (also referred to as a voltage difference) across its two terminals, which electric potential difference causes the energy-releasing circuit 622' to conduct current and thus form an energy-releasing path, allowing the surge energy to be released through the energy-releasing path in order to reduce the impacts of a surge signal on current/voltage in later-stage circuit(s). The stated act of the energy-releasing circuit 622' conducting current and thus forming an energy-releasing path refers to causing the energy carried by the surge signal to be released through a conductive line on which the energy-releasing circuit 622' is. In contrast, the act of the energy-releasing circuit 622' being cut off and thus not forming an energy-releasing path refers to causing the energy-releasing circuit 622' to block or resist current passage through a line on which the energy-releasing circuit 622' is, the blocking due to a circuit break or being in a high-impedance state.

Accordingly, relying on the inductive characteristic in the inductive circuit 621' of opposing any changes in current flowing through the inductive circuit 621', the temporary storage of surge energy refers to the inductive circuit 621' performing a magnetic induction process to store energy, while when a surge signal is leaving the inductive circuit 621' the stored energy is released by a decreasing magnetic field strength of the inductive circuit 621'. In this regard, the energy-releasing circuit 622' causes the surge energy to be absorbed by providing an energy-releasing path for the surge energy, to prevent outputting the surge energy to later-stage circuit(s).

The energy-releasing circuit 622' is connected in parallel with the inductive circuit 621'. Upon an external driving signal which carries a surge signal entering into the inductive circuit 621', during a period of the inductive circuit 621' storing energy, a forward electric-potential difference is generated between the input and output terminals 623' and 624' of the surge protection circuit 620'. On the other hand, during a period of the inductive circuit 621' releasing energy, a reverse electric-potential difference is generated between the input and output terminals 623' and 624' of the surge protection circuit 620'. If the energy-releasing circuit 622' can conduct current under the influence of each of the generated forward electric-potential difference and the generated reverse electric-potential difference, then during a stage of the generated forward electric-potential difference the energy-releasing circuit 622' releases part of the surge energy while during a stage of the generated reverse electric-potential difference the energy-releasing circuit 622' may further release part of the surge energy temporarily stored by the inductive circuit 621'. And if the energy-releasing circuit 622' only conducts current under the influence of the generated reverse electric-potential difference, the energy-releasing circuit 622' may release all of the surge energy temporarily stored by the inductive circuit 621', to prevent the surge energy from affecting subsequent circuit(s).

Figure 52:
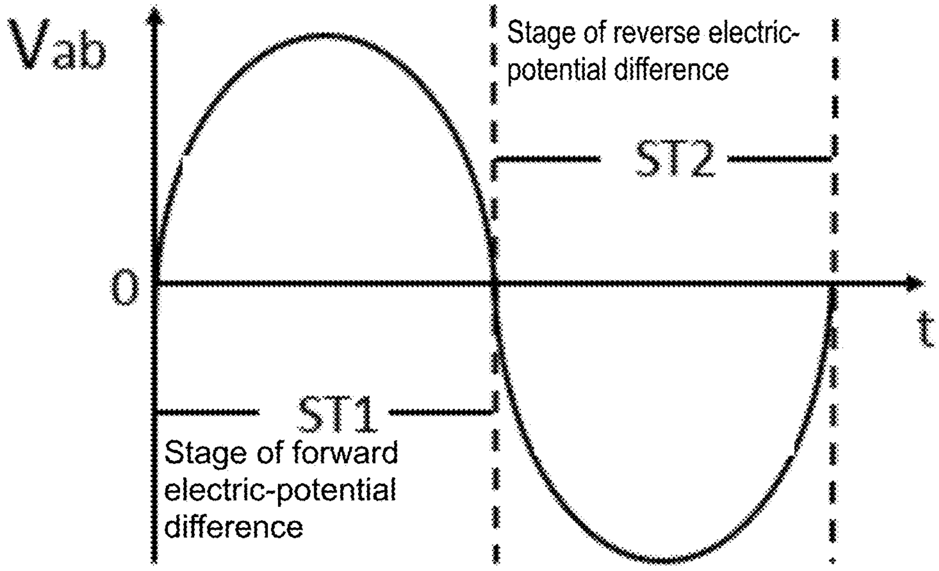
FIG. 52 is a diagram of an electric potential difference on an inductive circuit according to some embodiments of the present disclosure.

FIG. 52 is a diagram of an electric potential difference on an inductive circuit according to some embodiments of the present disclosure. With reference to FIG. 52, two stages proceed when surge energy flows through the inductive circuit 621', wherein Vab represents an electric potential difference between the input and output terminals 623' and 624' of the surge protection circuit 620'. In a first stage ST1 (also referred to as a stage of forward electric-potential difference), surge energy flows from the input terminal 623' of the surge protection circuit 620' to enter into the inductive circuit 621', instantaneously raising the voltage at the input terminal 623' to cause the electric potential at the input terminal 623' to be higher than that at the output terminal 624', which then electric potential difference across two terminals of the inductive circuit 621' is referred to as a forward electric-potential difference. On the other hand, in a second stage ST2 (also referred to as a stage of reverse electric-potential difference), surge energy flows out through the inductive circuit 621', causing the electric potential at the output terminal 624' to be higher than that at the input terminal 623', which then electric potential difference across two terminals of the inductive circuit 621' is referred to as a reverse electric-potential difference. That is, the energy-releasing circuit 622' as shown in FIG. 51 may be configured to conduct current in the first stage ST1 or second stage ST2 to form an energy-releasing path for releasing surge energy.

When an electric potential difference across two terminals of the energy-releasing circuit 622' is larger than a set voltage threshold, the energy-releasing circuit 622' switches from a high-impedance state into a low-impedance state conducting current in an energy-releasing loop/path to release surge energy, thereby reducing the impacts of surge on later-stage circuit(s). In this embodiment, the set voltage threshold may be determined by parameter(s) of circuit/component characteristic(s) of the energy-releasing circuit itself.

In this embodiment, the inductive circuit 621' may include an inductor, which has inductive characteristic of opposing any changes in current flowing through itself. For example, the inductive circuit 621' includes a differential mode inductor. The energy-releasing circuit 622' includes a voltage-controlled component BDs1 (not illustrated) configured to conduct electrical current or be cut off in response to an electric potential difference across two terminals of the surge protection circuit 620'. The voltage-controlled component BDs1 has the characteristics of conducting current when a voltage difference across two terminals of the surge protection circuit 620' reaches/exceeds a voltage threshold and of being cut off when the voltage difference across two terminals of the surge protection circuit 620' does not reach the voltage threshold. The voltage-controlled component BDs1 may include an electronic component having such characteristics, such as any one of a discharge tube or thyristor, a varistor or a variable resistor, and a transient voltage suppressor diode (TVS), for example, or include a control circuit structure such as a circuit structure of a comparator and a switch.

In some embodiments, to reduce the incidence of a power signal outputted by a power supply module having higher energy when a surge signal causes a forward electric-potential difference across two terminals of a surge protection circuit, the surge protection circuit further includes a current-limiting component (not illustrated), which is connected in series to the voltage-controlled component and for controlling transmission direction of the surge energy. In other words, the current-limiting component is configured to limit the energy-releasing circuit 622' to conducting current when in a stage of forward electric potential difference (or reverse electric potential difference) and to being cut off when in a stage of reverse electric potential difference (or forward electric potential difference). For example, the current-limiting component includes a diode and the energy-releasing circuit 622' includes a varistor and the diode (both not illustrated) connected in series. And the diode has an anode coupled to the output terminal 624' of the surge protection circuit 620' and a cathode coupled to the varistor, in order to cause the case of the line where the energy-releasing circuit 622' is conducting current when in a stage of reverse electric-potential difference.

Due to the characteristic of the inductive circuit 621' of opposing any changes in current flowing therethrough, the surge protection circuit has a filtering function as well. To provide a more compact circuit structure, a surge protection circuit disclosed in the present disclosure may have an integrated filtering circuit. Alternatively, according to the need for stability of a power signal outputted by a circuit structure including a power supply module, a surge protection circuit may be disposed separate from a filtering circuit, which is for example configured beside an LED module and for removing/reducing ripple signal in an LED lighting system in order to reduce interference of light flickering caused by the ripple signal.

Next, with reference to FIG. 53A to FIG. 53I, taking the example of not disposing a filtering circuit external to a surge protection circuit in a power supply module, the circuit structure(s) and operation principles of a surge protection circuit are explained below. In FIG. 53A to FIG. 53I, an external driving signal enters into a rectifying circuit 510 through a first pin 501 and a second pin 502, which rectifying circuit 510 is configured to perform rectification on the external driving signal to output a rectified signal. If the input external driving signal does not have surge energy, some circuit unit/component in a surge protection circuit performs filtering process directly on the rectified signal to output a filtered signal to a later-stage driving circuit 530, which transforms the filtered signal into a driving signal for driving an LED module 50 to operate normally. If the input external driving signal has surge energy, there is surge energy also in the rectified signal, which surge energy is outputted to the surge protection circuit, which is configured to absorb and release the surge energy and to output a filtered signal to the driving circuit 530, which transforms the filtered signal into a driving signal for driving an LED module 50 to operate normally. It should be noted that in real application, according to needs additional circuit part(s) may be included in a power supply module illustrated in each of FIG. 53A to FIG. 53I, the additional circuit part being for example a filtering circuit illustrated in each of FIGS. 12B, 12C, and 12F~12H, or the surge protection circuit may share some component(s) with a filtering circuit illustrated in each of FIGS. 12B, 12C, and 12F~12H. Besides, according to a distinct power supply module used or applied for a distinct load, the driving circuit as illustrated in each of FIG. 53A to FIG. 53I may be replaced with other circuit/component portion needed for supplying power to the distinct load, may be omitted, or may have other additional circuit part(s) suitable for the distinct load and disposed in a stage preceding or later than the driving circuit.

Figure 53A:
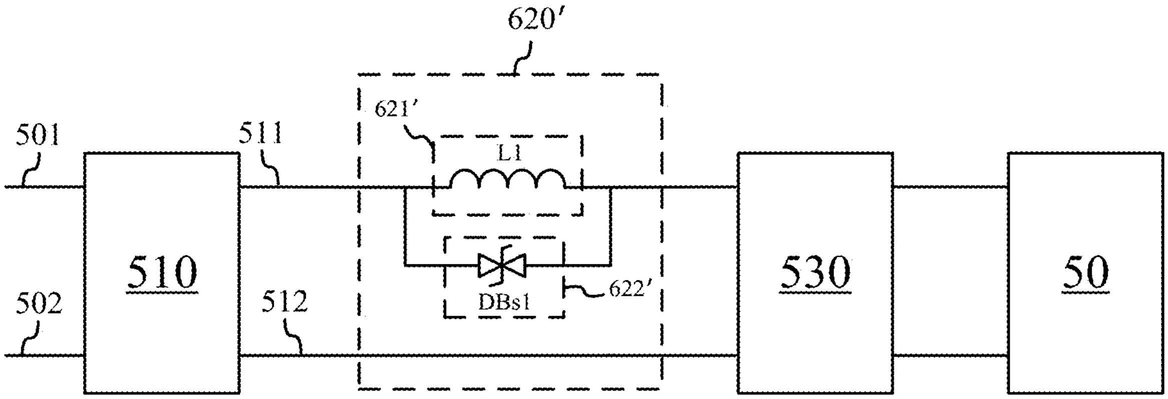
FIG. 53A to FIG. 53I are schematic circuit diagram of a surge protection circuit according to some embodiments of the present disclosure.

FIG. 53A is a schematic circuit diagram of a surge protection circuit according to some embodiments of the present disclosure. Referring to FIG. 53A, a surge protection circuit 620' is configured to include an inductive circuit 621' and an energy-releasing circuit 622'. The inductive circuit 621' includes an inductor L1, which has a first end connected to a first rectifying output terminal 511 of the rectifying circuit 510 and a second end connected to a driving circuit 530. A second rectifying output terminal 512 of the rectifying circuit 510 is electrically connected to the driving circuit 530. The first pin 501 and second pin 502 are configured to correspondingly couple to electric power input terminals A1 and A2 in order for the rectifying circuit 510 to receive an external driving signal. When a surge passes through the inductor L1, an electric potential difference is formed across two ends of the inductor L1. The energy-releasing circuit 622' includes a voltage-controlled component BDs1 connected in parallel to terminals a and b of the inductive circuit 621' and configured to conduct electrical current or be cut off in response to a voltage difference across two ends of the inductor L1. Specifically, the voltage-controlled component BDs1 conducts current when a voltage difference across two ends of the inductor L1 is larger than a threshold voltage of the energy-releasing circuit 622', which may be regarded as a threshold voltage of the voltage-controlled component BDs1 and determined according to component parameters of the voltage-controlled component BDs1, in order to form an energy-releasing path. Taking a discharge thyristor as an example of the voltage-controlled component BDs1, when a voltage difference across two ends of the inductor L1 is larger than a threshold voltage of the discharge thyristor (such as a chosen threshold voltage in the range of 50 V to 200V), the discharge thyristor conducts current to allow the surge to be released, thereby reducing the impacts of the surge on later-stage circuit(s). In this embodiment, the rectifying circuit 510 is an optional part and its position may be exchanged with that of the surge protection circuit 620', such as the surge protection circuit 620' being serially connected to the first pin 501, without affecting circuit characteristics of the surge protection circuit 620'.

Figure 53B:
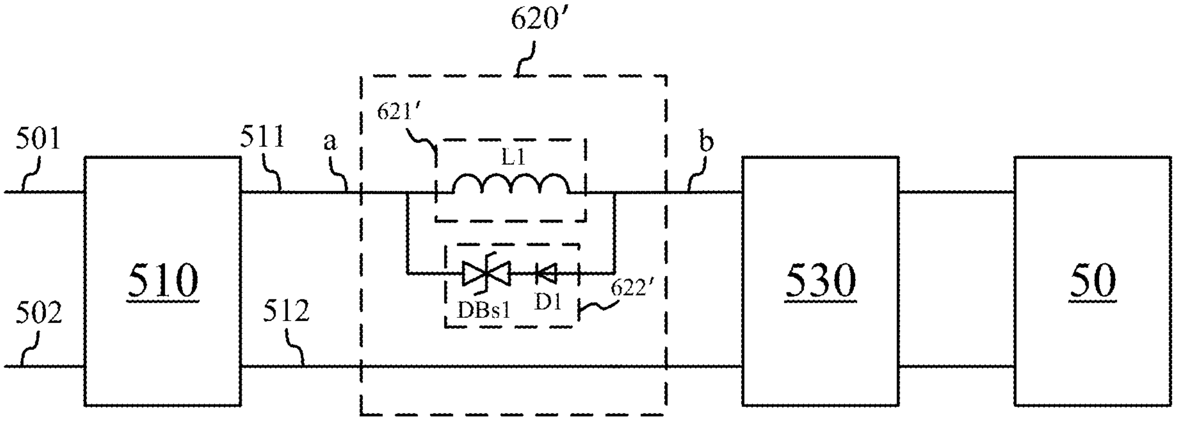

FIG. 53B is a schematic circuit diagram of a surge protection circuit according to some embodiments of the present disclosure. Referring to FIG. 53B, a surge protection circuit 620' is configured to include an inductive circuit 621' and an energy-releasing circuit 622'. Compared to the embodiment shown in FIG. 53A, the difference is that the energy-releasing circuit 622' in the embodiment of FIG. 53B further includes a current-limiting component D1 connected in series to a voltage-controlled component BDs1 and configured to control direction of a current releasing the surge energy so as to limit the voltage-controlled component BDs1 to conducting only when in certain state.

Specifically, under the configuration of including merely a voltage-controlled component BDs1 (as shown in FIG. 53A), both the condition when the voltage from the first end of the inductor L1 (the end connected to the first rectifying output terminal 511) relative to the second end of the inductor L1 (the end connected to the driving circuit 530) exceeds a threshold voltage of the voltage-controlled component BDs1 (which state is referred to as a forward electric potential difference) and the condition when the voltage from the second end of the inductor L1 relative to the first end of the inductor L1 exceeds a threshold voltage of the voltage-controlled component BDs1 (which state is referred to as a reverse electric potential difference each cause the voltage-controlled component BDs1 to enter into a conducting state. On the other hand, under the configuration of including both a voltage-controlled component BDs1 and a current-limiting component D1 (as shown in FIG. 53B), when a surge occurs and a forward electric potential difference is formed on the inductor L1, the current-limiting component D1 is in a cutoff state, causing a floating state at the terminal of the voltage-controlled component BDs1 connected to the current-limiting component D1 (or the voltage-controlled component BDs1 is regarded as being electrically isolated from the second end of the inductor L1), and thus the voltage-controlled component BDs1 cannot enter into a conducting state in response to the forward electric potential difference, and so an energy-releasing path cannot be formed. On the other hand, when a reverse electric potential difference is formed on the inductor L1 and has a voltage value exceeding a threshold voltage of the energy-releasing circuit 622' illustrated in FIG. 53B, which in the embodiment of FIG. 53B may be the sum of the threshold voltages respectively of the voltage-controlled component BDs1 and the current-limiting component D1, the current-limiting component D1 enters into a conducting state, causing the terminal of the voltage-controlled component BDs1 connected to the current-limiting component D1 to be equivalently electrically connected to the second end of the inductor L1, thus causing the voltage-controlled component BDs1 to conduct current in response to the reverse electric potential difference, which conducting forms an energy-releasing path to release or dissipate the surge energy.

In some embodiments, the current-limiting component D1 may be implemented by a diode, such as a diode D1 for description below. The diode D1 has an anode electrically connected to a second end of the inductor L1, and a cathode electrically connected to the voltage-controlled component BDs1. Under this configuration, when the inductor L1 has a forward electric potential difference, the diode D1 Is In a reverse-biased state, maintaining the diode D1 in a cutoff state to cause a terminal of the voltage-controlled component BDs1 to be in a floating state. When the inductor L1 has a reverse electric potential difference, the diode D1 is in a forward-biased state, causing the diode Ds1 to be in a conducting state to cause the terminal of the voltage-controlled component BDs1 to be electrically connected to the second end of the inductor L1. It is noted that in real application alternatively the diode D1 may have an anode electrically connected to the voltage-controlled component BDs1 and a cathode electrically connected to the first end of the inductor L1, without affecting or changing its principle of operation.

Advantages/benefits obtained from further including a current-limiting component in an energy-releasing circuit include that no matter what a result is of a surge protection circuit processing a surge in a stage ST1 of forward electric potential difference, the surge protection circuit can effectively process the surge in a stage ST2 of reverse electric potential difference. For example, the surge not effectively removed in a stage ST1 of forward electric potential difference may be absorbed in a stage ST2 of reverse electric potential difference, so as to effectively improve reliability of the surge protection circuit. This means, for example, when continual surge exists in the circuit, if an energy-releasing circuit is configured to conduct an energy-releasing loop/path in a stage ST1 of forward electric potential difference, the following/later surge may be conducted through the energy-releasing loop/path to later stage(s) to affect later-stage circuit(s); but if a current-limiting component is additionally included, the current-limiting component can conduct current to form an energy-releasing path when a reverse electric potential difference is formed on the inductor L1 by continual surge, allowing surge energy to be released through the energy-releasing path, thereby improving reliability of the surge protection circuit.

Figure 53C:
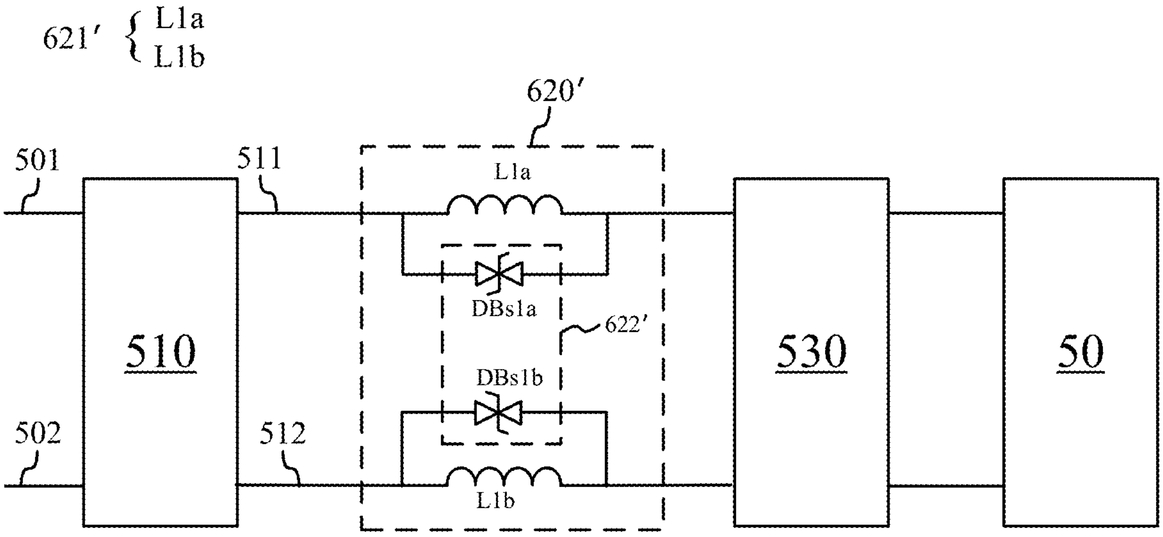

FIG. 53C is a schematic circuit diagram of a surge protection circuit according to some embodiments of the present disclosure. Referring to FIG. 53C in which the embodiment is generally similar to that in FIG. 53A, the difference is that a surge protection circuit in the embodiment of FIG. 53C is disposed on both first and second rectifying output terminals 511 and 512 of a rectifying circuit 510, an inductive circuit 621' includes inductors L1*a* and L1*b*, and an energy-releasing circuit 622' includes voltage-controlled components BDs1*a* and BDs1*b*. The inductor L1*a* has a first end coupled to the first rectifying output terminal 511 and a second end coupled to a driving circuit 530, and the inductor L1*b* has a first end coupled to the second rectifying output terminal 512 and a second end coupled to the driving circuit 530. The voltage-controlled component BDs1*a* is connected in parallel with the inductor L1*a*, and the voltage-controlled component BDs1*b* is connected in parallel with the inductor L1*b*. When a surge flows through the inductors L1*a* and L1*b*, electric potential differences are formed across two ends of the inductor L1*a* and across two ends of the inductor L1*b*, respectively. When the electric potential difference across two ends of the inductor L1*a* is larger than a threshold voltage of the voltage-controlled component BDs1*a*, the voltage-controlled component BDs1*a* conducts current; when the electric potential difference across two ends of the inductor L1*b* is larger than a threshold voltage of the voltage-controlled component BDs1*b*, the voltage-controlled component BDs1*b* conducts current; therefore the surge can be released through the voltage-controlled components BDs1*a* and BDs1*b* in order to reduce the impacts of the surge on later-stage circuit(s). Each of the inductors L1*a* and L1*b* may include a differential mode inductor, and each of the voltage-controlled components BDs1*a* and BDs1*b* may include or be realized by any one of a discharge tube or thyristor, a varistor or a variable resistor, and a transient voltage suppressor diode (TVS), for example. In this embodiment, the rectifying circuit 510 is an optional part and its position may be exchanged with that of the surge protection circuit 620', such as the surge protection circuit 620' being serially connected to the first pin 501 and the second pin 502, without affecting circuit characteristics of the surge protection circuit 620'.

Figure 53D:
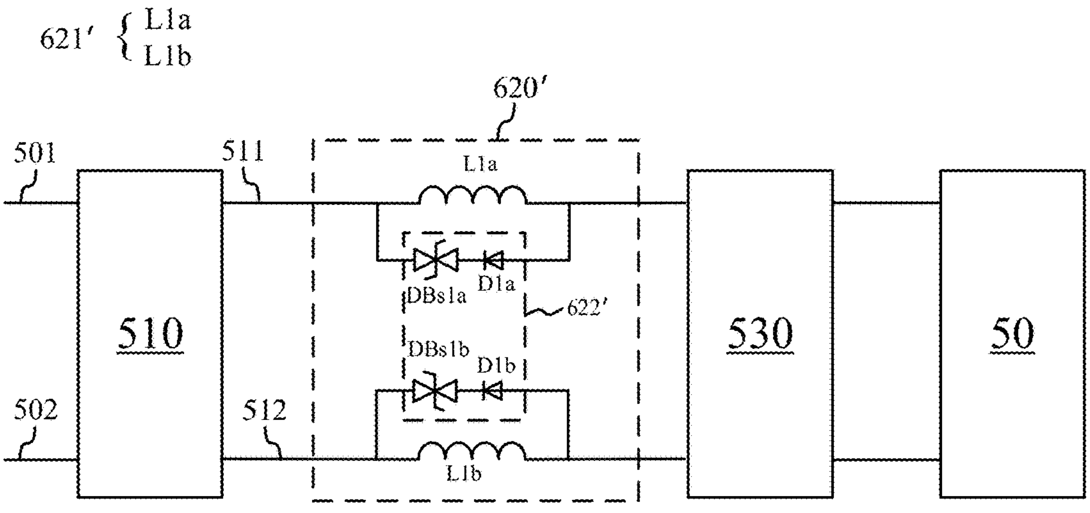

FIG. 53D is a schematic circuit diagram of a surge protection circuit according to some embodiments of the present disclosure. Referring to FIG. 53D in which the embodiment is generally similar to that in FIG. 53B, the difference is that a surge protection circuit in the embodiment of FIG. 53D is disposed on both the first and second rectifying output terminals 511 and 512 of a rectifying circuit 510, an inductive circuit 621' includes inductors L1*a* and L1*b*, and an energy-releasing circuit 622' includes voltage-controlled components BDs1*a* and BDs1*b* and current-limiting components D1*a* and D1*b*. The inductor L1*a* has a first end coupled to the first rectifying output terminal 511 and a second end coupled to a driving circuit 530, and the inductor L1*b* has a first end coupled to the second rectifying output terminal 512 and a second end coupled to the driving circuit 530. The voltage-controlled component BDs1*a* and the current-limiting component D1*a* are connected in series and then as a whole are connected in parallel with two ends of the inductor L1*a*, and the voltage-controlled component BDs1*b* and the current-limiting component D1*b* are connected in series and then as a whole are connected in parallel with two ends of the inductor L1*b*. The principle of operation of the surge protection circuit in the embodiment of FIG. 53D is similar to that in the embodiment of FIG. 53B, with a difference that the surge protection circuit in the embodiment of FIG. 53D is disposed on both the first and second rectifying output terminals 511 and 512 of the rectifying circuit 510. Whether there is surge at the first rectifying output terminal 511 or second rectifying output terminal 512 of the rectifying circuit 510, the surge protection circuit can react to it by absorbing the surge energy, and thus the described position of the surge protection circuit improves its own reliability. In this embodiment, the rectifying circuit 510 is an optional part and its position may be exchanged with that of the surge protection circuit 620', such as the surge protection circuit 620' being serially connected to the first pin 501 and the second pin 502, without affecting circuit characteristics of the surge protection circuit 620'.

Figure 53E:
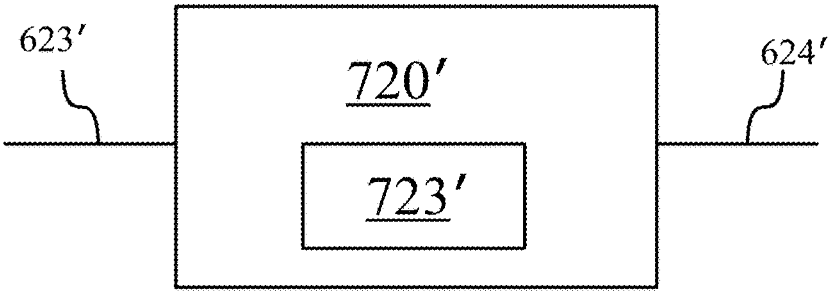

FIG. 53E is a schematic circuit diagram of a surge protection circuit according to some embodiments of the present disclosure. Though similar to the surge protection circuit illustrated in FIG. 51, a difference is that a surge protection circuit 720' in the embodiment of FIG. 53E further includes a filtering circuit 723'. Since an inductive circuit in a surge protection circuit on a power loop has a filtering function as well, in some embodiments in order to simplify circuit structure, the filtering circuit 723' acts as the inductive circuit.

Figure 53F:
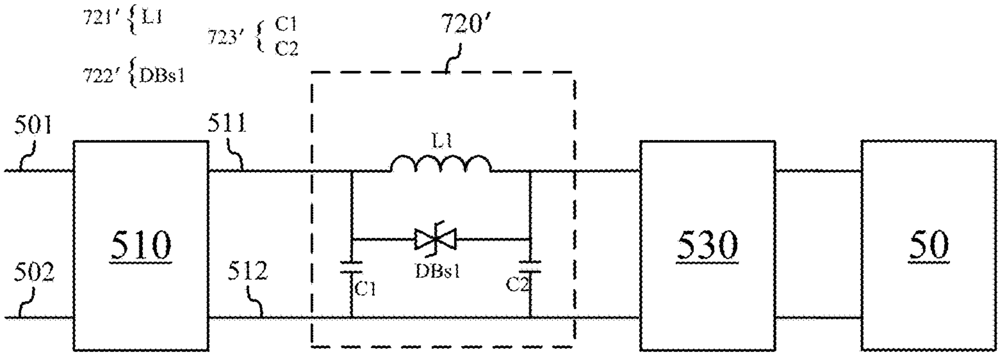

FIG. 53F is a schematic circuit diagram of a surge protection circuit according to some embodiments of the present disclosure. Though similar to the surge protection circuit illustrated in FIG. 53A, a difference is that a surge protection circuit 720' in the embodiment of FIG. 53F further includes a filtering circuit 723', in addition to an inductive circuit 721' and an energy-releasing circuit 722'. The inductive circuit 721' and the energy-releasing circuit 722' are structured and connected in the same way as that of the inductive circuit and the energy-releasing circuit in the embodiment of FIG. 53A, so their structures and connection relationship are not so explained here again. The filtering circuit 723' includes capacitors C1 and C2, which capacitor C1 has an end electrically connected to a terminal of the inductive circuit 721' and has another end electrically connected to a second rectifying output terminal 512 of a rectifying circuit 510, and which capacitor C2 has an end electrically connected to another terminal of the inductive circuit 721' and has another end electrically connected to the second rectifying output terminal 512 of the rectifying circuit 510. Since an inductor L1 in the inductive circuit 721' on a power loop has a filtering function as well, in some embodiments the inductor L1 may be designated as being included by the filtering circuit 723' and along with the capacitors C1 and C2 constitute a π-shape filtering circuit for performing filtering on a received signal. When a surge flows through the inductor L1, an electric potential difference is formed across two ends of the inductor L1, Ih electric potential difference causes the energy-releasing circuit 722' to conduct current to release the surge energy, thereby reducing the impacts of the surge on later-stage circuit(s). In this embodiment, the rectifying circuit 510 is an optional part and its position may be exchanged with that of the surge protection circuit 720', such as the surge protection circuit 720' being coupled to the first pin 501 and the second pin 502, without affecting circuit characteristics of the surge protection circuit 720'.

Figure 53G:
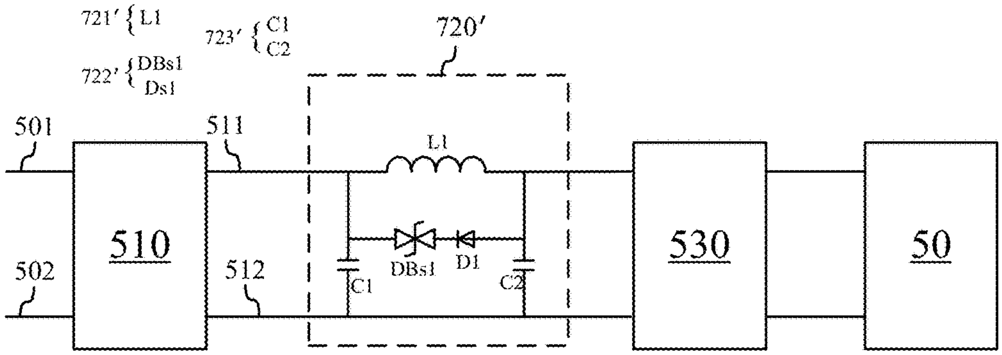

FIG. 53G is a schematic circuit diagram of a surge protection circuit according to some embodiments of the present disclosure. Though similar to the embodiment illustrated in FIG. 53F, a difference is that an energy-releasing circuit 722' in the embodiment of FIG. 53G further includes a current-limiting component D1. The ways of operation of a surge protection circuit in the embodiment of FIG. 53G are the same as that in the embodiment of FIG. 53B, on the basis of which ways a filtering function is added in the embodiment of FIG. 53G, and thus the ways of operation are not so explained again.

Figure 53H:
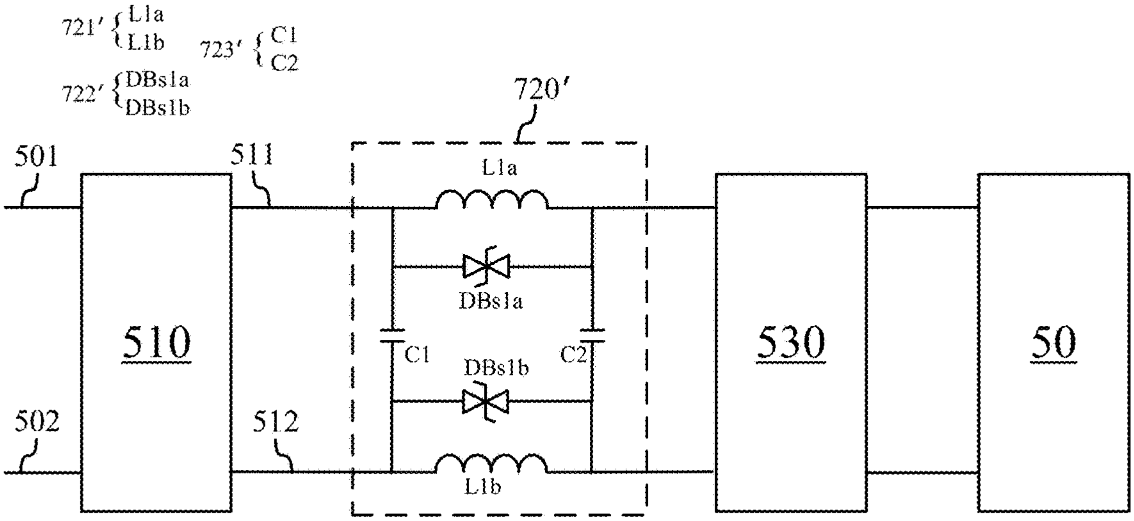

FIG. 53H is a schematic circuit diagram of a surge protection circuit according to some embodiments of the present disclosure. Though similar to the embodiment illustrated in FIG. 53C, a difference is that a surge protection circuit 720' in the embodiment of FIG. 53H further includes a filtering circuit 723', in addition to an inductive circuit 721' and an energy-releasing circuit 722'. The inductive circuit 721' and the energy-releasing circuit 722' are structured and connected in the same way as that of the inductive circuit and the energy-releasing circuit in the embodiment of FIG. 53C, so their structures and connection relationship are not so explained here again. The filtering circuit 723' includes capacitors C1 and C2, which capacitor C1 has an end electrically connected to an end of an inductor L1*a* and has another end electrically connected to an end of an inductor L1*b*, and which capacitor C2 has an end electrically connected to another end of the inductor L1*a* and has another end electrically connected to another end of the inductor L1*b*. Since inductors L1*a* and L1*b* in the inductive circuit 721' on a power loop have a filtering function as well, in some embodiments the inductors L1*a* and L1*b* may be designated as being included by the filtering circuit 723' and along with the capacitors C1 and C2 constitute a filtering circuit for performing filtering on a received signal. The ways of operation of a surge protection circuit in the embodiment of FIG. 53H are the same as that in the embodiment of FIG. 53C, on the basis of which ways a filtering function is added in the embodiment of FIG. 53H, and thus the ways of operation are not so explained again.

Figure 53I:
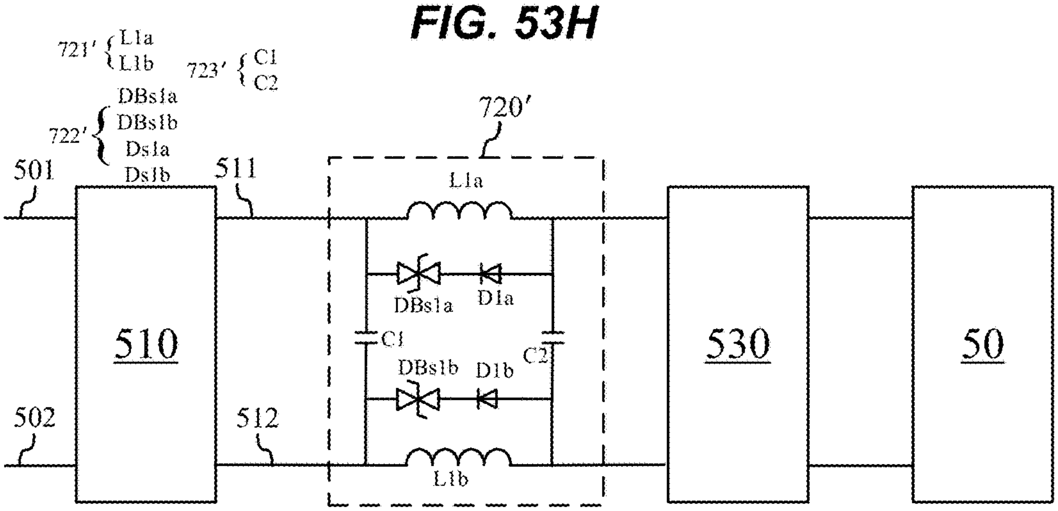

FIG. 53I is a schematic circuit diagram of a surge protection circuit according to some embodiments of the present disclosure. Though similar to the embodiment illustrated in FIG. 53H, a difference is that an energy-releasing circuit 722' in the embodiment of FIG. 53I further includes current-limiting components D1*a* and D1*b*. The current-limiting component D1*a* and a voltage-controlled component BDs1*a* are connected in series and then as a whole are connected in parallel with two ends of the inductor L1*a*, and the current-limiting component D1*b* and a voltage-controlled component BDs1*b* are connected in series and then as a whole are connected in parallel with two ends of the inductor L1*b*. The ways of operation of a surge protection circuit in the embodiment of FIG. 53I are similar to that in the embodiment of FIG. 53G, and thus are not so explained here again.

Figure 17A:
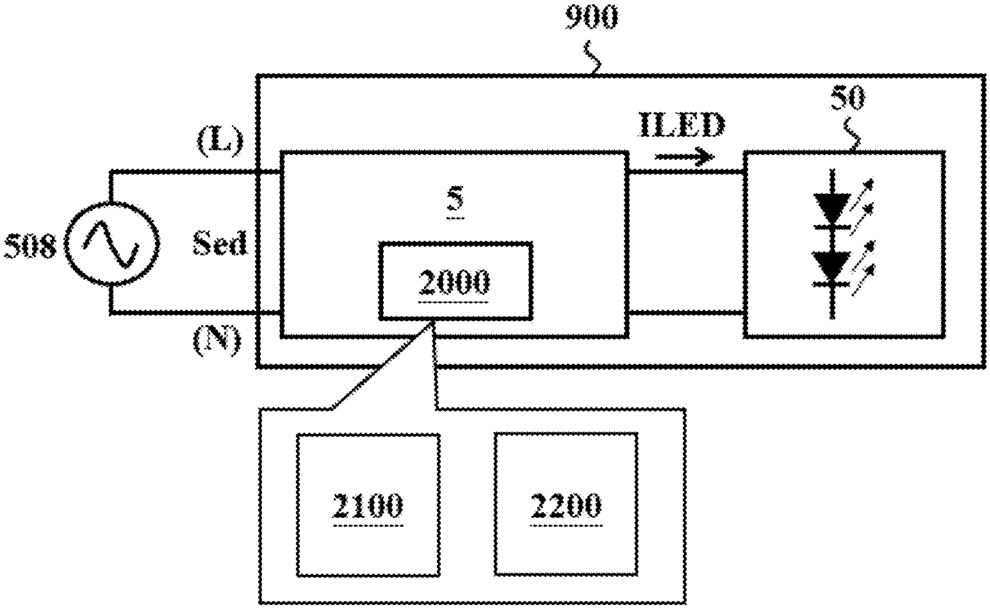
FIGS. 17A-17E are block diagrams of LED lighting systems according to some exemplary embodiments.

FIG. 17A is a block diagram of exemplary LED lighting systems according to an exemplary embodiment. Referring to FIG. 17A, compared to the LED tube lamps 500, 600, 700, 800, 1700 or 1800 described above in different embodiments, a power supply module 5 of the LED tube lamp 900 includes a rectifying circuit 510, a filtering circuit 520, a driving circuit 530, and further includes an electric-shock detection module 2000 which includes a detection control circuit 2100 (which can be referred to a detection controller) and a current-limiting circuit 2200. It should be noted that, according to various forms of circuit structure of a surge protection circuit adopted in the LED tube lamp 1700 or 1800, in addition to the detection module 2000, the power supply module 5 in these embodiments may further include a rectifying circuit (such as rectifying circuit 510), a surge protection circuit (such as the surge protection circuit 620'), and a driving circuit (such as the driving circuit 530), or other circuit units, the disclosure is not limited thereto.

In the present embodiment, the detection control circuit 2100 is configured to perform an installation state detection/impedance detection in the LED tube lamp 900, thereby to generate a corresponding control signal according to a detection result, in which the detection result indicates whether the LED tube lamp 900 is correctly/properly installed in a lamp socket or whether a foreign external impedance (e.g., human body resistor) contacts the LED tube lamp 900. The current-limiting circuit 2200 is configured to limit or determine whether to limit current flowing or to flow through the LED tube lamp 900 according to the control signal corresponding to the detection result. When the current-limiting circuit 2200 receives the control signal indicating that the LED tube lamp 900 is correctly/properly installed in a lamp socket or a foreign external impedance contacts or connects to the LED tube lamp, the current-limiting circuit 2200 allows the power supply module 5 providing electricity to the LED module 50 normally (i.e., the current-limiting circuit 2200 allows the current to normally flow through the power loop of the LED tube lamp 900). When the current-limiting circuit 2200 receives the control signal indicating that the LED tube lamp 900 is incorrectly/improperly installed in a lamp socket or a foreign external impedance contact or connects to the LED tube lamp 900, the current-limiting circuit 2200 limits a current to flow through the LED tube lamp 900 to being under a safety threshold to avoid electric shock hazards. The safety threshold is for example 5 MIU as a root-mean-square (rms) value or 7.07 MIU as a peak value.

The power loop in the LED tube lamp 900 may refer to a path or a route for transmitting current from the power supply module 5 to the LED module 50. The installation state detection or the impedance detection may refer to a circuit operation for obtaining information on an installation state of or equivalent impedance in the LED tube lamp 900 by detecting electrical characteristics (such as voltage or current). Further, in some embodiments, the detection control circuit 2100 performs detection of electrical characteristics by controlling current continuity on the power loop or forming an additional detection path, which may reduce the risk of electric shock during performing detection. Detailed descriptions of specific circuit embodiments explaining how a detection control circuit performs detection of electrical characteristics are presented below with reference to FIGS. 18-45F.

Figure 17B:
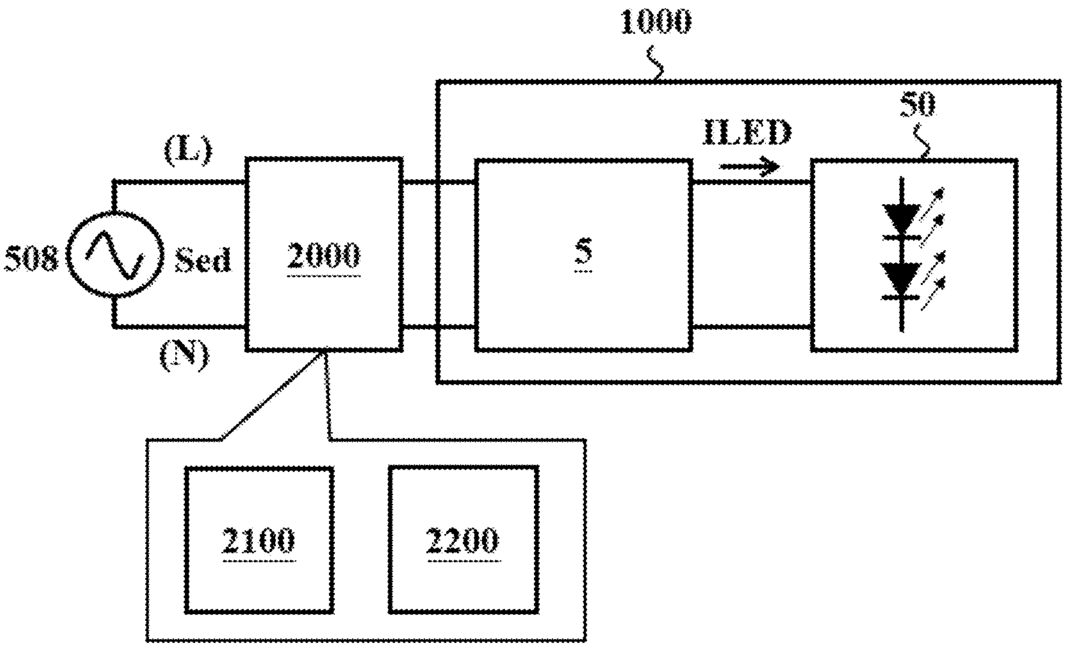

FIG. 17B is a block diagram of exemplary LED lighting systems according to another exemplary embodiment. Referring to FIG. 17B, compared to the embodiment of FIG. 17A, an electric-shock detection module 2000 of FIG. 17B is disposed external to the LED tube lamp 1000 and on a power supply path from an external AC power supply (e.g., AC grid) 508, and is for example disposed in a lamp socket or fixture. When external connection pins of the LED tube lamp 1000 are electrically connected to the external AC power supply 508, the electric-shock detection module 2000 is serially connected to a power loop in the LED tubal lamp 1000 through the corresponding pin(s), thereby the shock detection module 2000 can perform installation state detection/impedance detection in such ways as described above in FIG. 17A to determine whether the LED tube lamp 1000 is correctly/properly installed in a lamp socket or whether a user is exposed to risk of electric shock on the LED tube lamp 1000. In this embodiment of FIG. 17B, the configuration of the electric-shock detection module 2000 is similar to that in the embodiment of FIG. 17A, so it is not repeated herein.

In another embodiment, the structures of the power supply module in embodiments of FIG. 17A and FIG. 17B can be integrated. For example, a plurality of the electric-shock detection modules 2000 may be disposed in a lighting system of an LED tube lamp, wherein at least one of the electric-shock detection modules 2000 may be disposed on an internal power loop of the LED tube lamp, and at least another one of the electric-shock detection modules 2000 may be disposed to be external to the LED tube lamp, and for example disposed in the lamp socket. This external electric-shock detection module 2000 can be electrically connected to an internal power loop of the LED tube lamp through pins on an end cap of the LED tube lamp, to improve effects of protection from accidental electric shock.

Figure 17C:
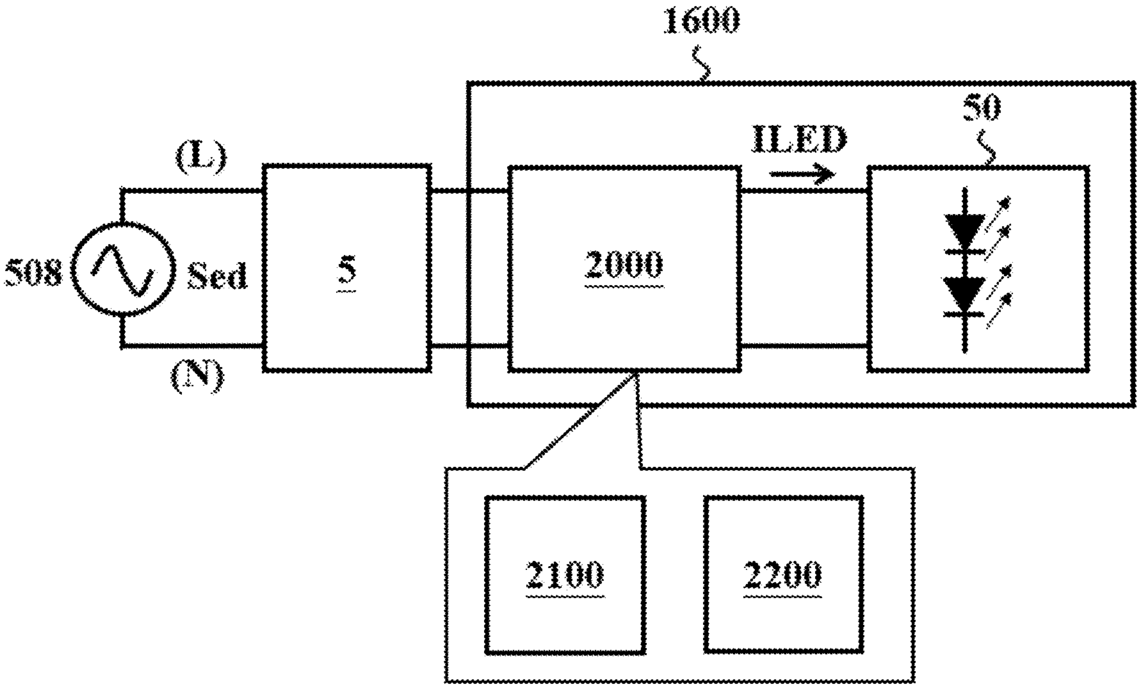

FIG. 17C is a block diagram of an LED tube lamp lighting system according to some embodiments. Referring to FIG. 17C, compared to the embodiments of FIGS. 17A and 17B, an LED tube lamp 1600 in this embodiment of FIG. 17C is for example a Type-C LED tube lamp as having a power supply module 5 disposed external to the LED tube lamp 1600. An electric-shock detection module 2000 is disposed within the LED tube lamp 1600 and includes a detection control circuit 2100 and a current-limiting circuit 2200. In this embodiment of FIG. 17C, the current-limiting circuit 2200 may be disposed on a power supply path and is controlled by the detection control circuit 2100. Specific operations and details of the electric-shock detection module 2000 are similar to those in other analogous embodiments described herein, and thus are not described in detail again. It's worth noting that in applications of this embodiment, due to the functions of the electric-shock detection module 2000, there is substantially no risk of occurrence of electric-shock hazards even if a non-isolation type of power conversion circuit is chosen as the external power supply module 5. In contrast to an external power supply module designed for supplying a traditional LED tube lamp typically requiring an isolation type of power conversion circuit, the design of an external power supply module in embodiments of the present disclosure is not limited to using an isolation type of power conversion circuit, and so the design choice thereof is more diversified.

It should be noted that the described shock detection module 2000 in either FIG. 17A or FIG. 17B is configured to be used in or with a power supply module of an LED tube lamp, which can be implemented, partially or entirely, by a discrete circuit or an integrated circuit, to which the present disclosure is not limited. In addition, the designation "shock detection module" herein for the module 2000 serves to be representative but not to limit the scope of the module 2000 or the claimed disclosure. The scope of the "shock detection module" 2000 as described herein and as may be reflected in the claims encompasses any arrangement of a circuit or module comprising electrical components with their operations, functional/structural configurations, and connections consistent with or according to the relevant descriptions herein thereof. In practice and this disclosure, according to different ways of description, the shock detection module 2000 may be alternatively referred to as, but its different formulations are not limited to, a detection circuit, an installation detection module/circuit, a shock protection module/circuit, a shock protection detection module/circuit, an impedance detection module/circuit, or directly expressed as a circuitry for such a purpose. In addition, FIGS. 17A and 17B are diagrams merely to illustrate exemplary connection relationships between an LED tube lamp 900/1000 and an external power supply 508, but they are not to limit an external driving signal from the external power supply 508 to only being applied in a single-ended power-supply configuration at one end of the LED tube lamp 900/1000.

Explanatory descriptions of different schematic circuit and functional block embodiments under the embodiment configuration of FIG. 17A where a shock detection module 2000 is disposed inside the LED tube lamp 900 are presented below.

Figure 17D:
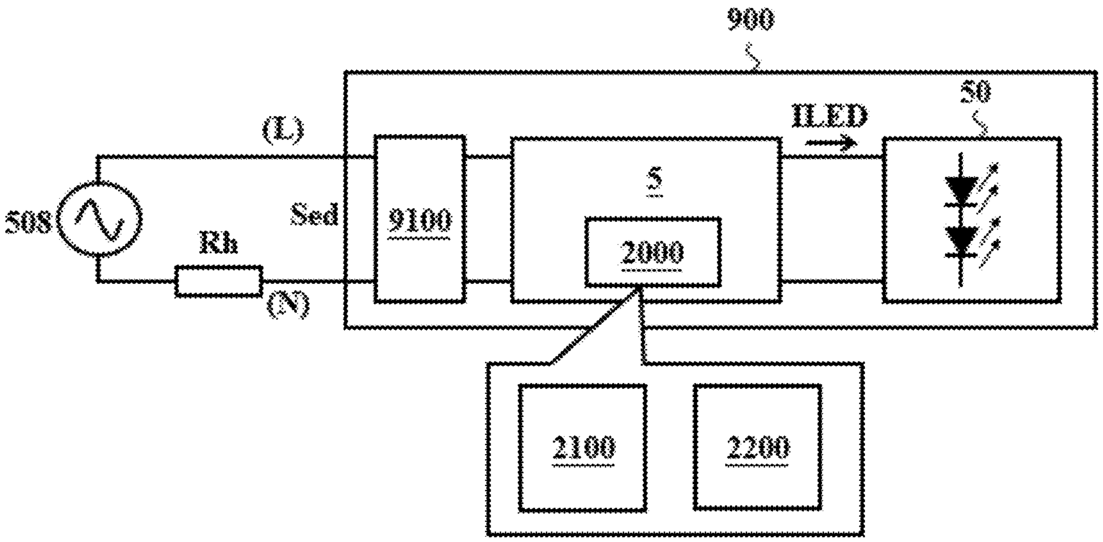

FIG. 17D is a block diagram of the LED tube lighting system according to some exemplary embodiments of the present disclosure. The circuit configuration in the present embodiment is similar to that of the embodiment shown in FIG. 17A, except that the LED tube lamp 900 in the present embodiment further includes an impedance adjusting module 9100. When the transmission line impedance Rh on the power supply path of the external power grid 508 is large, the installation detection module 2000 would determine that the LED tube lamp is not installed normally, the current limiting circuit 2200 would limit the upper limit of the LED tube lamp to be under the electric shock safety value. The electric shock safety value can be, for example, 5 MIU (effective value) or 7.07 MIU (peak value), the LED tube lamp cannot be lit normally under this value.

The impedance adjusting module 9100 is electrically connected to the input end of the power supply module 5 and the power supply input of the external power grid 508 and is configured to change the impedance characteristics of the power loop so that the LED tube lamp can still light up normally when the transmission line impedance Rh is large. In order to make a single LED tube lamp still have an electric shock protection function, impedance of the impedance adjusting module 9100 is set higher than a protection-triggering threshold. When only one single LED tube lamp is connected to the power loop, the installation detection module 2000 can still work normally, the impedance in the power loop is detected to determine whether to light the LED tube lamp normally. When the impedance of the power loop is detected to be greater than the set threshold, the installation detection module 2000 determines that the LED tube lamp is not properly installed, and the lamp cannot be lit normally. It is noted that the external power grid 508 supply power to the LED tube lamp 900 through power loop described herein.

Figure 17E:
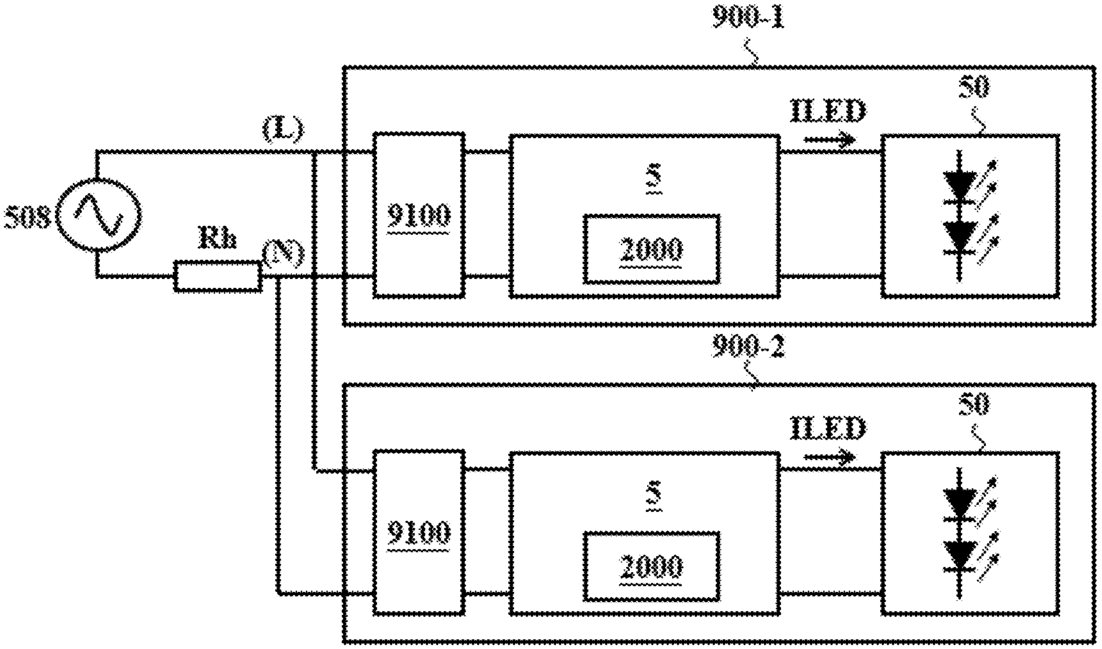

When there are two LED tube lamps connected to the power loop, referring to FIG. 17E, two LED tube lamps are connected to the external power grid 508 in parallel, and the resistance Rh is the transmission line impedance. The impedance adjusting module 9100 in the LED tube lamp 900-1 is electrically connected to the power supply inputs L and N, and the impedance adjusting module 9100 in the LED tube lamp 900-2 is electrically connected to the power supply inputs L and N. At this time, the two impedance adjusting modules are connected in parallel, the impedance after being connected in parallel is lower than the protection-triggering threshold, and the impedance of the power loop (the impedance of the impedance adjusting modules 9100 after being connected in parallel plus the transmission line impedance Rh) is lower than the set threshold, so that the installation detection module 2000 would determine that the LED tube lamp is properly installed, and the LED tube lamp 900-1 lights up normally. Similarly, the LED tube lamp 900-2 lights up normally.

It can be understood that when there are two LED tube lamps connected in parallel and are connected to the circuit, the impedance adjusting modules included in the LED tube lamps are also connected to the power loop in parallel. Further, under the influence of the impedance adjusting modules, the installation detection module determines that the LED tube lamps are properly installed, without being affected by the transmission line impedance Rh.

The installation detection module 2000 in the LED tube lamp 900-1 determines the impedance in the line, so that the LED lamp 900-1 is not affected by the transmission line impedance Rh and lights up normally.

In the present embodiment, two LED tube lamps are set as an example. That is, when two LED tube lamps are connected to a power loop at the same time, the impedance of the two impedance adjusting modules 9100 in the two LED tube lamps connected in parallel is lower than the critical protection point, so the LED tube lamps light up normally. In some embodiments, the number of LED tube lamps triggering the protection can be set to n, that is, when the number of the LED tube lamps connected to the power loop is less than n, the impedance of the impedance adjusting modules 9100 in the n LED tube lamps connected in parallel is greater than the protection-triggering threshold, so that the LED tube lamps cannot be lit normally (due to the installation detection); When the number of the LED tube lamps connected to the power loop is greater than or equal to n, the impedance adjusting modules 9100 in the n LED tube lamps connected in parallel is lower than the protection-triggering threshold, so that the LED tube lamps can be lit normally.

Figure 17F:
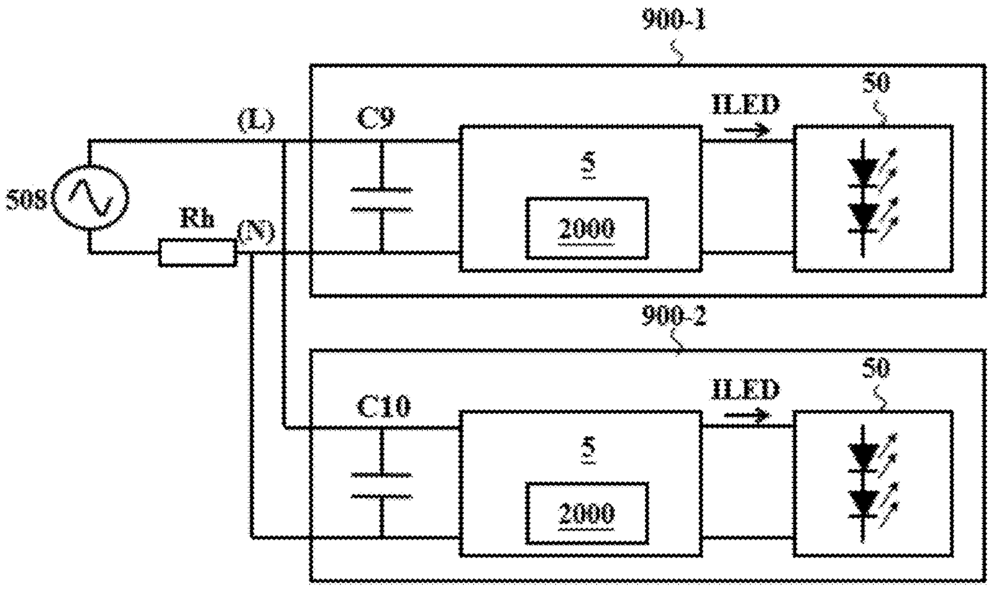
FIGS. 17F-17G are circuit block diagrams of impedance adjusting module according to some exemplary embodiments.

Referring to FIG. 17F, which is a schematic diagram of a circuit structure of the impedance adjusting module according to some exemplary embodiments of the present disclosure. The impedance adjusting module 9100 includes a capacitor C9. The capacitor C9 is electrically connected to the power supply inputs L and N, i.e., one pin of capacitor C9 is electrically connected to the power supply input L, and the other pin is electrically connected to the power supply input N. In some embodiments, the transmission line impedance Rh is greater than a set threshold, where the setting threshold is the protection-triggering threshold of the installation detection module to determine whether the LED tube lamp is properly installed. When the impedance of the power loop is greater than the set threshold, the installation detection module determines that the lamp is not properly installed, when the resistance of the power loop is lower than the set threshold, the installation detection module determines that the lamp is properly installed, and the LED tube lamp lights up normally.

When there is only one LED tube lamp connected to the power loop, only one capacitor C9 is connected to the power supply input, the impedance of capacitor C9 is greater than the critical protection point. Further, when the power is on, the external driving signal first charges the capacitor C9, so the LED tube lamp enters the electric shock detection stage. Through detecting the electrical signal in the installation detection module, the installation detection module 2000 can determine whether there is an abnormal impedance connected to the circuit or whether the LED tube lamp is properly installed. This electrical signal can be the voltage, current and other signals in the power loop during the electric shock detection stage. In the electric shock detection stage, the capacitor C9 is discharged to the later-stage circuit, and the electric shock detection current in the power loop detected by the installation detection module 2000 is larger than that of the power loop without capacitor C9. However, the electric shock detection current is still lower than the set safety threshold, and the installation detection module 2000 determines that the LED tube lamp is not properly installed, so the LED tube lamp cannot be lit normally.

In some embodiments, when two LED tube lamps are connected in parallel and are connected to the power loop, as shown in FIG. 17F, the power supply input is connected to capacitors C9 and C10 at the same time. In this example, the specifications of capacitor C9 and C10 are set to be the same, capacitors C9 and C10 can be equivalent to C11 after being connected in parallel, and the equivalent capacitor C11 is electrically connected to the power supply input L and N. After the power is on, the external driving signal first charges the equivalent capacitor C11 and the equivalent capacitor C11 is discharged to the LED tube lamps at the same time. Because the capacitance of the equivalent capacitor C11 is twice larger than that of the capacitor C9, the electric shock detection current in the power loop detected by the installation detection module 2000 being in the electric shock detection stage is greater than that when only one LED tube lamp is connected to the power loop. At this time, the electric shock detection current is greater than the set safety threshold, the installation detection module determines that the LED tube lamps are properly installed, and both the LED tube lamp 900-1 and 900-2 can be lit normally.

In the present embodiment, only two LED tube lamps are connected to the power loop. When more LED tube lamps are connected to the power loop, the capacitance incorporated into the power supply input terminal L and N would increase with the increase of the number of the LED tube lamps, and the equivalent capacitance of the capacitors connected in parallel will also increase. If the number of LED tube lamps incorporated into the power loop is n (where $n \geq 2$), the equivalent capacitance is nC9. When n is 2, two lamps are connected to the power loop, the capacitance of the equivalent capacitance is 2C9, which is greater than the critical capacitance value. At this time, the impedance adjusting module "shields" the installation detection module. In other words, the impedance adjusting module adjusts the installation detection current during the installation detection stage to make the installation detection module determines that the LED tube lamps are properly installed and the LED tube lamps can be lit up normally. When n>2, the equivalent capacitance value nC9 connected to the power loop is greater than the protection-triggering threshold, and the impedance adjusting module also "shields" the installation detection module to make the lamp light up normally.

In some embodiments, the capacitance value of the capacitor C9 in the impedance adjusting module can be adjusted so that the number of LED tube lamps triggering the protection can be adjusted correspondingly. For example, the number of LED tube lamps directed to critical lighting can be set to 3. That is, n is equal to 3, and when the number of LED tube lamps connected to the power loop is greater than or equal to 3, the LED lamp lights up normally. The present disclosure is not limited thereto.

When the transmission line impedance Rh in the power loop is lower than the set threshold, the installation detection module 2000 determines that the LED tube lamp is installed normally, and the LED tube lamp can be lit normally. At this time, even if there is only one LED tube lamp tube connected to the LED lighting system, the LED tube lamp can still be lit normally.

Figure 17G:
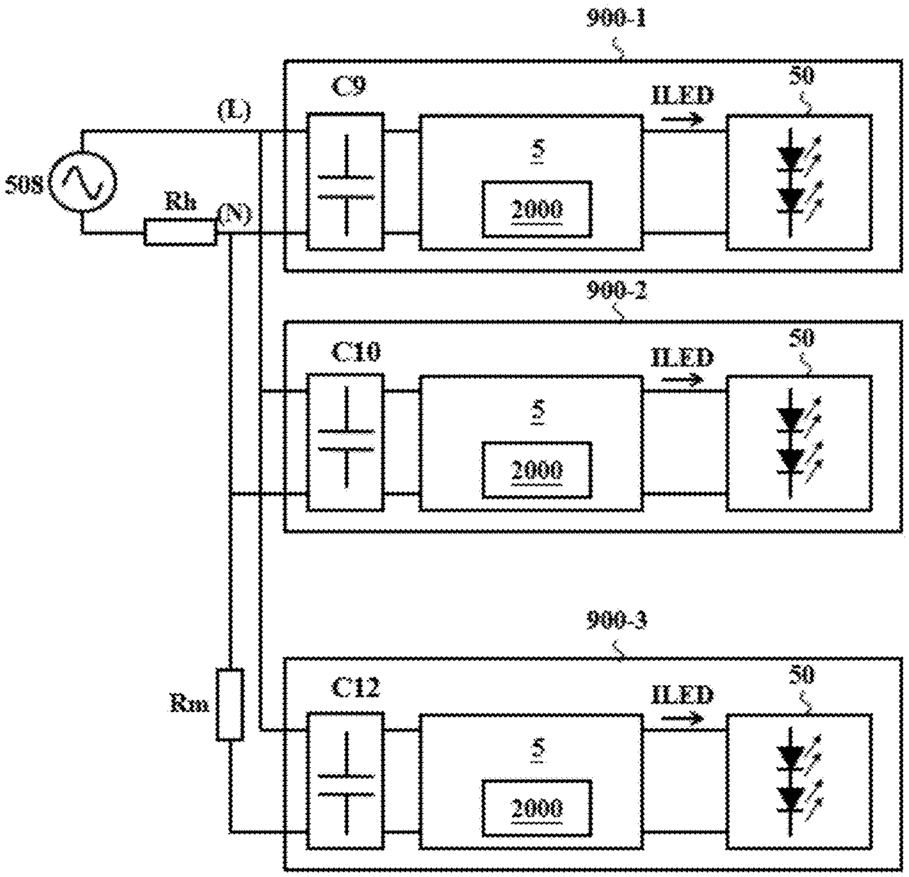

It should be noted that even if the impedance adjusting module is set in the LED tube lamp, the safety performance of the LED tube lamp is not affected thereby. That is, there is no risk of electric shock when the installer performs the installation on-line. Details are illustrated as follows in accordance with FIG. 17G. Referring to FIG. 17G, in this lighting system, the LED tube lamps 900-1 and 900-2 are connected to the power loop and are lit normally. During the installation of the LED tube lamp 900-3, the installer may accidentally touch the installation pin of the LED tube lamp 900-3, so the human body of the installer is connected to the power loop of the LED tube lamp 900-3. Then, the external driving signal first charges the capacitor in the impedance adjusting module through the transmission line impedance Rh and the human body impedance Rm. The installation detection module 2000 in the LED tube lamp 900-3 would perform an electric shock detection. Since the capacitance of the capacitor C12 is way lower than the protection-triggering threshold, the detection current detected by the installation detection module in the power loop is lower than the set safety threshold. As a result, the installation detection module may determine that the LED tube lamp 900-3 is not properly installed, the LED tube lamp 900-3 cannot be lit normally, the current flowing through the human body is less than the critical safety current (e.g., 5 MIU), and the installer has no risk of electric shock.

Figure 18:
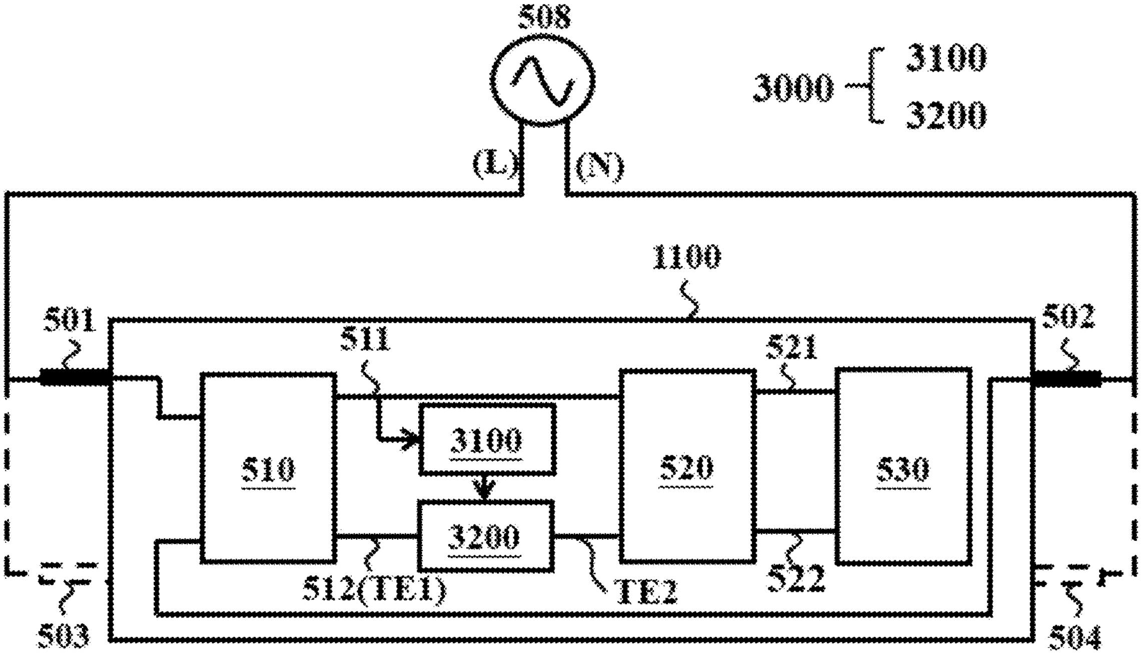
FIG. 18 is a block diagram of an exemplary power supply module in an LED tube lamp according to some exemplary embodiments.

Referring to FIG. 18, a block diagram of an LED tube lamp including a power supply module according to some exemplary embodiments is illustrated. Compared to the LED lamp shown in FIG. 4A, the LED tube lamp 1100 of FIG. 18 includes a rectifying circuit 510, a filtering circuit 520, and a driving circuit 530, and further includes an electric-shock detection module 3000 (also known as an electric shock protection module). In these embodiments, the LED tube lamp 1100 is configured to, for example, directly receive the external driving signal provided by the external AC power supply 508, wherein the external driving signal is input through the signal line (marked as "L") and the neutral line (marked as "N") to the two pins 501 and 502 on the two ends of the LED tube lamp 1100. In practical applications, the LED tube lamp 500 may further comprise two additional pins 503 and 504, also on its two ends as shown in FIG. 18. Under the structure of the LED tube lamp 1100 having the four pins 501-504, depending on design needs the two pins (such as the pins 501 and 503, or the pins 502 and 504) on an end cap disposed on one end of the LED tube lamp 1100 may be electrically connected or mutually electrically independent, but the disclosure is not limited to any of the two different cases.

The electric-shock detection module 3000 is disposed inside the LED tube lamp 1100 and includes a detection control circuit 3100 and a current-limiting circuit 3200. The electric-shock detection module 3000 may be and is hereinafter referred to as an installation detection module 3000. The current-limiting circuit 3200 is coupled to the rectifying circuit 510 via an installation detection terminal TE1 and is coupled to the filtering circuit 520 via an installation detection terminal TE2. So, the current-limiting circuit 3200 is serially coupled to a power loop of the LED tube lamp 1100. Under a detection mode, the detection control circuit 3100 detects the signal passing through the installation detection terminals TE1 and TE2 (i.e., the signal passing through the power loop) and determines whether to cut off an LED driving signal (e.g., an external driving signal) passing through the LED tube lamp based on the detected result. When the LED tube lamp 1100 is not yet correctly installed to a lamp socket or holder of the LED tube lamp, the detection control circuit 3100 detects a relatively small current signal and thus determines that the current signal is passing through high impedance, such that the current-limiting circuit 3200 would cut off the current path between the first installation detection terminal TE1 and the second installation detection terminal TE2 to cause the LED tube lamp 1100 to stop operating (so the LED tube lamp 1100 does not emit light). If a relatively small current signal is not detected by the detection control circuit 3100, the detection control circuit 3100 determines that the LED tube lamp 1100 is correctly Installed to the lamp socket or holder, such that the current-limiting circuit 3200 would maintain a conducting state between the first installation detection terminal TE1 and the second installation detection terminal TE2 to allow the LED tube lamp 1100 to normally operate (so the LED tube lamp 1100 is normally lighted up).

For example, in some embodiments, when a current passing through the installation detection terminals TE1 and TE2 is greater than or equal to a specific, defined installation current (or a current value), which may indicate that the current supplied to the driving circuit 530 is greater than or equal to a specific, defined operating current, the current-limiting circuit 3200 is conducting to make the LED tube lamp 1100 operate in a conducting state. When a current passing through the first installation detection terminal TE1 and the second installation detection terminal TE2 is smaller than the defined installation current (or the current value), the installation detection module 3000 determines that the LED tube lamp 1100 is not correctly installed to the lamp socket or holder and thus cuts off the current-limiting circuit 3200, causing the LED tube lamp 1100 to enter into a non-conducting state or limiting the effective value of the current on a power loop of the LED tube lamp 1100 to be less than 5 mA (or 5 MIU based on standard requirements). In other words, the installation detection module 3000 determines whether to conduct or cut off the current-limiting circuit 3200 based on the detected impedance, causing the LED tube lamp 1100 to operate in a conducting state or to enter into a non-conducting or current-limiting state. Accordingly, the occurrence of electric shock caused by accidentally touching a conductive part of the LED tube lamp which is not correctly/properly installed to a lamp socket or holder can be avoided.

More concretely, because when a user touches the tube lamp, resistance/impedance of the human body causes changes in equivalent impedance on a power loop, by detecting variation of voltage/current on the power loop to determine whether a user touches the tube lamp, the installation detection module 3000 can realize the function of electric shock protection. In other words, in embodiments of the present disclosure, through detecting an electrical signal (such as voltage or current), the installation detection module 3000 can determine whether the LED tube lamp has been correctly installed in the lamp socket and whether a user has touched a conductive part of the tube lamp which is not correctly installed in the lamp socket. Further, compared to an conventional power supply module of an LED tube lamp, in some embodiments, a power supply module disposed with an installation detection module 3000 has built in the function/effects of electric shock protection, so there is no need to dispose, as in a conventional power circuit design, a safety capacitor (as an X capacitor) at an input terminal (as between a Live wire and a Neutral wire) of the rectifying circuit 510. From the perspective of equivalent circuit, in a power supply module disposed with an installation detection module 3000, an equivalent capacitance at the input terminal of the rectifying circuit 510 can be, for example, smaller than 47 nF. As described herein, a power loop refers to a electric current path in the LED tube lamp 1100, going through from a conductive pin for receiving a first polarity or phase of a power signal (e.g., from the Live wire), wirings to conduct power and circuit components, to an LED module, and then going back through from the LED module to a conductive pin for receiving a second polarity or phase of the power signal (e.g., from the Neutral wire). When the double-ended power-supply configuration is applied, a power loop is formed between two conductive pins 501 and 502 respectively coupled to two end caps respectively at two opposite ends of the LED tube lamp, instead of being formed between two conductive pins 501 and 503, or pins 502 and 504, which are pins at the same end caps of the LED tube lamp.

It should be noted that, it is merely an example embodiment to dispose the current-limiting circuit 3200 between the rectifying circuit 510 and the filtering circuit 520. In some embodiments, the function of preventing electric shock can be implemented by disposing the current-limiting circuit 3200 at the position that is capable of controlling turn-on and cut-off state of the power loop. For example, the switch circuit may be disposed between the driving circuit (530) and the LED module (50), but the present disclosure is not limited thereto.

Figure 48A:
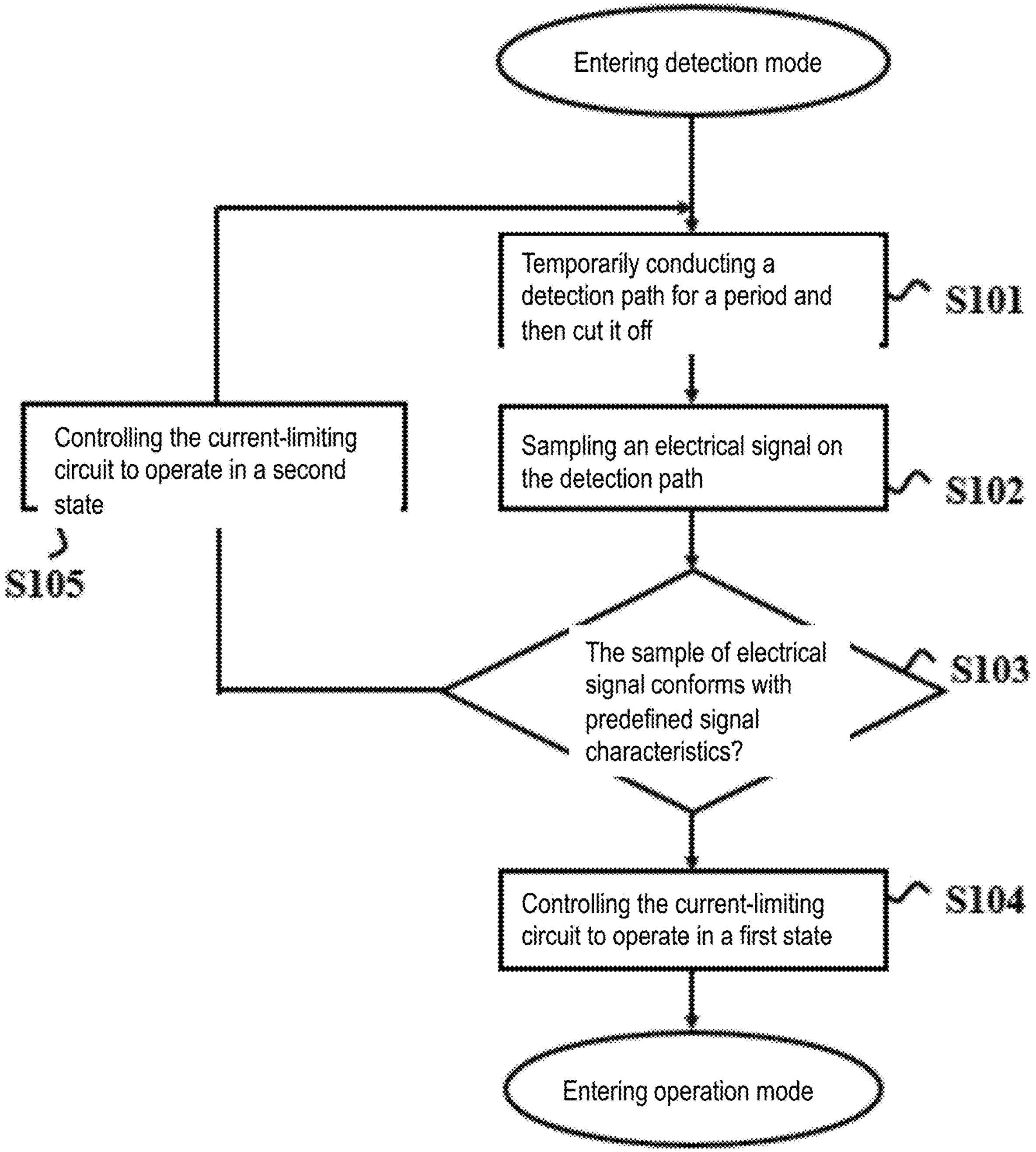
FIG. 48A is a flowchart of a relamping detection method according to some exemplary embodiments.

From circuit operation perspectives, a method performed by the detection control circuit 3100 and configured to determine, under a detection mode, whether the LED tube lamp 1100 is correctly/properly connected/installed to a lamp socket or whether there is any unintended external impedance being connected to the LED tube lamp is shown in FIG. 48A. The method includes the following steps: temporarily conducting a detection path for a period and then cutting it off (step S101); sampling an electrical signal on the detection path during the conduction period (step S102); determining whether the sample of electrical signal conforms with predefined signal characteristics (step S103); if the determination result in step S103 is positive, controlling the current-limiting circuit 3200 to operate in a first state (step S104); and if the determination result in step S103 is negative, controlling the current-limiting circuit 3200 to operate in a second state (step S105) and then returning to the step S101.

In these embodiments, the detection path can be a power loop, or an independent current path coupled to the output terminal of the rectifying circuit 510, configurations of these types of detection path can be understood by referencing the below description of the embodiments shown in FIGS. 19A to 26B. Moreover, configurations of the detection control circuit 3100, such as the time period of conducting the detection path, the time interval(s) 189 between the conductions of the detection path, and the timing of triggering conduction of the detection path, can also be understood by referencing the description of embodiments shown below.

In the step S101, conducting the detection path for a period may be implemented by means using pulse signal to control switching of a switch.

In the step S102, the sample of electrical signal is a signal that can represent or express impedance variation on the detection path, which signal may comprise a voltage signal, a current signal, a frequency signal, a phase signal, etc.

In the step S103, the operation of determining whether the sampled electrical signal conforms with predefined signal characteristics may comprise, for example, a relative relation of the sampled electrical signal to a predefined signal. In these embodiments, the detection controller 7100 may determine that the sampled electrical signal matches the characteristics of the predefined signal, and this determination may correspond to the state that the LED tube lamp is correctly/properly connected to the lamp socket or there is no foreign/unintended external impedance being coupled to the LED tube lamp. On the other hand, the detection controller 7100 may determine that the sampled electrical signal does not match the characteristics of the predefined signal characteristics, and this determination may correspond to the state that the LED tube lamp is not correctly/properly connected to the lamp socket or there is foreign/unintended external impedance being coupled to the LED tube lamp.

In the steps S104 and S105, the first state and the second state are two distinct circuit-configuration states and may be set according to the configured position and type of the current-limiting circuit 3200. For example, in the case or embodiment where the current-limiting circuit 3200 is independent of the driving circuit and refers to a switching circuit or a current-limiting circuit that is connected on the power loop in series, the first state refers to a conducting state (or non-current-limiting state) while the second state refers to a cutoff state (or current-limiting state).

Detailed operations and example circuit structures for performing the above method in FIG. 48A are illustrated by descriptions below of different embodiments of installation detection modules.

Figure 19A:
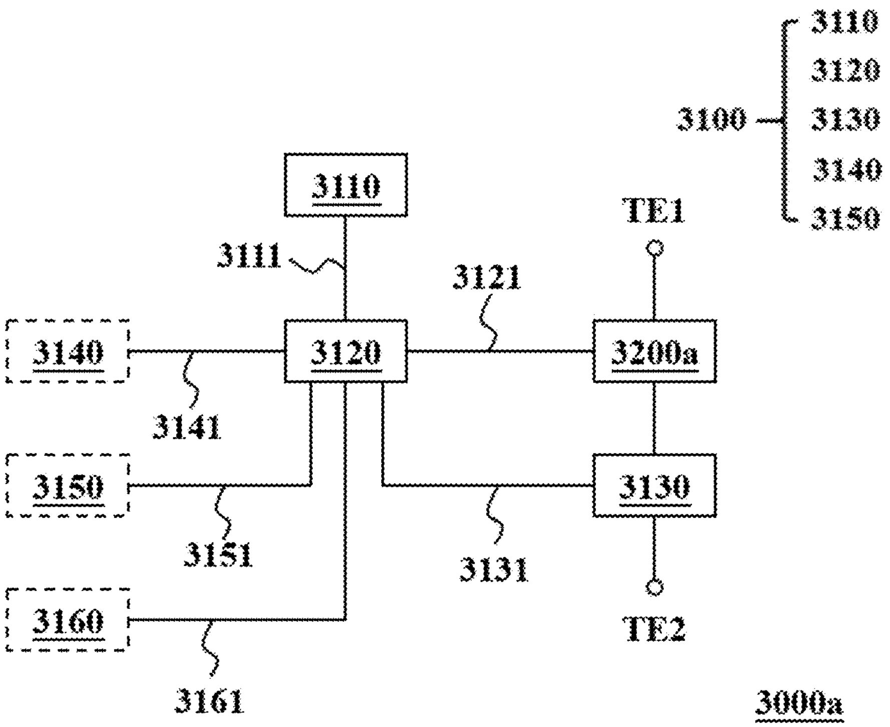
FIG. 19A is a block diagram of an installation detection module according to some exemplary embodiments.

Referring to FIG. 19A, a block diagram of an installation detection module according to some certain embodiments is illustrated. The installation detection module 3000*a* includes a detection pulse generating module 3110, a detection result latching circuit 3120, a detection determining circuit 3130 and a current-limiting circuit 3200*a*. The detection pulse generating module 3110, detection result latching circuit 3120, and detection determining circuit 3130 constitute a detection control circuit 3100. Certain of these circuits or modules may be referred to as first, second, third, etc., circuits as a naming convention to differentiate them from each other. The detection determining circuit 3130 is coupled to and detects the signal between the installation detection terminals TE1 (through a switch circuit coupling terminal 3201 and the current-limiting circuit 3200*a*) and TE2. The detection determining circuit 3130 is also coupled to the detection result latching circuit 3120 via a detection result terminal 3131 to transmit the detection result signal to the detection result latching circuit 3120. The detection determining circuit 3130 may be configured to detect a current passing through terminals TE1 and TE2 (e.g., to detect whether the current is above or below a specific current value). The detection pulse generating module 3110 is coupled to the detection result latching circuit 3120 via a pulse signal output terminal 3111, and generates a pulse signal to inform the detection result latching circuit 3120 of a time point for latching (storing) the detection result. For example, the detection pulse generating module 3110 may be a circuit configured to generate a signal that causes a latching circuit, such as the detection result latching circuit 3120 to enter and remain in a state that corresponds to one of a conducting state or a cut-off state for the LED tube lamp. The detection result latching circuit 3120 stores the detection result according to the detection result signal (or detection result signal and pulse signal) and transmits or provides the detection result to the current-limiting circuit 3200*a* coupled to the detection result latching circuit 3120 via a detection result latching terminal 3121. The current-limiting circuit 3200*a* controls the state between conducting or cut off between the installation detection terminals TE1 and TE2 according to the detection result. In some embodiments, the current-limiting circuit 3200*a* comprises a switching circuit, and in the following description is referred to as the switching circuit 3200*a*.

In some embodiments, the installation detection module 3000*a* further includes a ballast detection module 3150. The ballast detection module 3150 is configured to determine whether the external driving signal is the AC signal provided by the ballast, so that the detection result latching circuit 3120 can adjust the control mode of the switching circuit 3200*a* based on the determination. As a result, when the ballast bypass type LED tube lamp is wrongly installed in the lamp holder with ballast, the LED tube lamp may emit a warning (such as flashing) to remind the user of the misuse situation to avoid damage to the ballast bypass type LED tube lamp by the AC signal output from the ballast.

As described herein, the ballast detection module 3150 may also be referred as a misuse warning module. In other words, the ballast detection module 3150 is configured to detect whether the signal of the power loop is a ballast characteristic signal. When the signal of the power loop is detected to be the ballast characteristic signal, the first detection signal is output. Specifically, the ballast characteristic signal is referred to the AC signal output by the ballast (especially the electronic ballast) with high frequency, high voltage and other characteristics. In other words, the AC signal output by ballasts (especially electronic ballasts) would have the characteristics such as high frequency and high voltage, and the AC signal provided by the AC power grid is generally set with relatively low frequency (50 Hz to 60 Hz) and low voltage (generally less than 305V). As a result, by detecting the frequency, amplitude phase, or other electrical signal characteristics of the bus voltage, the source of the external driving signal can be identified. For example, the ballast characteristic signal may indicate the high frequency value (or range) of the AC signal output from the ballast by its voltage level (or range). For another example, the ballast characteristic signal may indicate the valley level and/or phase of the AC signal output from the ballast by its voltage level (or range). The ballast detection module 3150 detects at least one of frequency, phase, and amplitude of the signal in the power loop through the terminals thereof to determine whether the signal is a ballast characteristic signal. In this example, the first detection signal (or referred to as the first indication signal) is used to indicate that the external driving signal is provided by the ballast.

In order to be able to effectively retain the characteristics of the signal in the power loop such as high frequency, high voltage and other characteristic information, the terminal of the ballast detection module 3150 is connected to the output or input end of the rectifying circuit in the power loop of the LED tube lamp.

In the example shown in FIG. 19A, the ballast detection module 3150 is connected to the detection result latching circuit 3120 through path 3151, wherein the ballast detection module 3150 would detect the bus voltage in the power supply module, and based on the signal characteristics of the detected bus voltage, the ballast detection module 3150 determines whether the external driving signal currently received by the LED tube lamp is an AC signal output by the ballast or an AC signal directly provided by the power grid.

For example, in some embodiments, the ballast detection module 3150 may sample the signal at the rectifying output terminal 511/512 and determine the frequency of the sampled signal (i.e., the frequency of the bus voltage). When the frequency of the sampled signal detected by the ballast detection module 3150 is greater than a set value, the ballast detection module 3150 determines that the current input external driving signal is a high-frequency AC signal, which means, the external driving signal may be provided by the ballast. As a result, the ballast detection module 3150 would transmit the first indication signal (indicating that the external driving signal is provided by the ballast) to the detection result latching circuit 3120, so that the detection result latching circuit 3120 can control the switching state of the switching circuit 3200*a* based on the first indication signal to affect continuity of the current on the power loop. On the other hand, when the frequency of the sampled signal detected by the ballast detection module 3150 is less than or equal to the set value, the ballast detection module 3150 may determine that the current input external driving signal is a low-frequency AC signal, which means, the external driving signal may be provided by the AC power grid. As a result, the ballast detection module 3150 would transmit a second indication signal (indicating that the external driving signal is provided by the AC power grid) to the detection result latching circuit 3120. Based on the second indication signal, the detection result latching circuit 3120 can control the switch circuit 3200*a* to maintain in a conducted state, so that the power driving signal can be stably provided to the LED module at later-stage, and the LED module is able to emit with consistent/uniform brightness.

Based on the above examples, the installation detection module also includes an installation warning module. Specifically, the ballast detection module 3150 can be electrically connected to the installation warning module (not shown), the installation warning module can be configured to send out the LED tube lamp misuse warning based on the first detection signal mentioned above.

In some embodiments, when the ballast detection module 3150 detects that the external driving signal is provided by the ballast, the installation warning module adjusts the current continuity change on the power loop based on the first detection signal, so that the LED module at later-stage would respond to the current continuity change on the power loop and produce a specific light pattern, which may prompt the user that there might be a wrong installation situation. For example, the current continuity change on the power loop is to adjust the current intermittent change in the power loop, so that the LED module at the later-stage would produce a specific on-off light pattern. As another example, the current continuity change on the power loop changes can be strong and weak changes in the amplitude of the current in the power loop, so that the LED module at later stage would produce a specific light-dark light pattern.

The installation warning module is also connected to the detection determining circuit 3130 and is configured to control the power loop to be disconnected based on the warning logic of the pulse signal and the detection result signal.

In some embodiments, the installation warning module includes a control circuit and a switching circuit 3200*a* shown in FIG. 19A. The control circuit is electrically connected to the detection pulse generating module 3110, the detection determining circuit 3130, the ballast detection module 3150, and the switching circuit 3200*a* and is configured to control the switching circuit 3200*a* to be cut-off when determining that the LED tube lamp is not correctly installed in the lamp holder based on the pulse signal and the detection result signal or control the switching circuit 3200*a* to be turned on or off to affect the current continuity on the power loop when the first detection signal is received, so that the LED module at later-stage can produce the above-described specific light pattern.

In some embodiments, the control circuit in the installation warning module is electrically connected to the detection result latching circuit 3120 and is configured to receive the periodic control signal generated by the detection result latching circuit 3120 based on the first indication signal. The control circuit may periodically control the switching circuit 3200*a* to be on and off to make the LED module produce a specific light-emitting pattern such as flashing with a fixed frequency or non-fixed frequency.

In practical implementation, the control circuit and the detection result latching circuit 3120 may include a shared circuit structure, such as a logic circuit and the like. As shown in the above example, the detection result latching circuit 3120 may periodically turn on and off the switch circuit 3200*a* when receiving the first indication signal, so that the magnitude of the driving current of the power driving signal is affected by the switching circuit 3200*a*, and then the brightness of the LED module changes to form the flashing light pattern. When the user notices the flashing LED tube lamp, he may sense that the ballast bypass type tube lamp may have been mistakenly installed in the lamp holder with ballast, so the LED tube lamp can be removed immediately to avoid danger. An example of the detection result latching circuit 3120 with a circuit structure shared with the control circuit 3120 is described as follows.

In some embodiments, the installation detection module 3000*a* further includes a warning circuit 3160. For example, the installation warning module includes the warning circuit 3160. The warning circuit 3160 can be controlled by the detection result latching circuit 3120, and the LED tube lamp misuse warning such as sound and bright light would be generated to remind the user of the misuse of the situation. More specifically, the warning circuit 3160 electrically connects the detection result latching circuit 3120 through the path 3161 to receive the signal sent by the detection result latching circuit 3120. When the detection result latching circuit 3120 receives the first indication signal, the detection result latching circuit 3160 would send a signal to enable that the warning circuit 3160, so that the warning circuit 3160 would generate a misuse warning. In some embodiments, the warning circuit 3160 can be implemented by a buzzer, whereby when the LED tube lamp is incorrectly installed to the lamp holder with ballast, a beep sound is generated to remind the user of the current misuse situation. In some embodiments, the warning circuit 684 may also include, for example, a warning light, whereby when the LED tube lamp is incorrectly installed to the lamp holder with ballast, lights with different colors or different intensities can be emitted to remind the user of the current installation status. In some embodiments, the warning circuit 684 may include both the buzzer and the warning light, whereby when the LED tube lamp is incorrectly installed to the lamp holder with ballast, the beep sound and the warning light can be generated at the same time to remind the user of the current misuse situation.

In some embodiments, after the misuse warning is generated, the installation of the detection module 3000*a* would control the switch circuit 3200*a* to be disconnected to maintain the power loop in the cut-off state, thereby avoiding the danger that the user does not remove the LED tube lamp from the incompatible lamp socket. in time.

In some embodiments, the installation warning module is also connected to the detection determining circuit 3130 and is configured to control the power loop to be disconnected based on the warning logic of the pulse signal and the detection result signal; generate a misuse warning of the LED tube lamp based on the first detection signal; or control the power loop to be disconnected based on the warning logic of the pulse signal and the detection result signal and generate the misuse warning of the LED tube lamp based on the first detection signal at the same time.

As described herein, the installation warning module performs current leakage detection and warning, and ballast misuse detection and warning based on a preset timing, and generates corresponding warnings based on the detection result. Specifically, the present timing can be used to represent the time sequence of the current leakage detection and ballast misuse detection, or the time sequence of the leakage current warning and the ballast misuse warning. In some embodiments, the installation warning module indicates the current leakage and the ballast misuse by the configured switching circuit and the control circuit, such that the installation detection module can perform detection and warning of the current leakage and that of the ballast misuse sequentially. Correspondingly, the control circuit in the installation warning module controls the switching circuit to perform corresponding warning operations in response to the received sequence of the detection result signal and the first detection signal. In some embodiments, the installation warning module indicates the ballast misuse by the configured warning circuit and indicates the current leakage by the switching circuit and the control circuit, so that the installation detection module may perform the detection and warning of the current leakage and that of the ballast misuse in sequentially or simultaneously. Correspondingly, the installation warning module may generate corresponding warnings sequentially or simultaneously.

It should be noted that the circuit structure can be omitted or designed to be shared or time-multiplexed manner based on the actual circuit design needs. For example, the installation detection module can include an independent circuit structure with current leakage detection and warning function, and an independent circuit structure with ballast detection and warning function. As a result, in above-described configuration the installation detection module, the detection result latching circuit and the peripheral circuit structure thereof can be omitted, which are configured to temporary restore the test result signal and the first detection signal.

In some embodiments, the installation detection module 3000*a* further includes an emergency control module 3140 configured for determining whether an external driving signal is a DC signal provided by an auxiliary power supply module, in order for the detection result latching circuit 3120 to adjust its way of controlling the switching circuit 3200*a* according to the determination result, so as to avoid misoperation by the installation detection module 3000*a* when the LED tube lamp is used in an environment/application to be receiving auxiliary power input by an auxiliary power supply module. The structures and operations of other circuit(s)/module(s) in these embodiments with the emergency control module 3140 are similar to or correspond to those of the detection pulse generating module 3110, detection result latching circuit 3120, detection determining circuit 3130, and the switching circuit 3200*a* described above, and thus are not repeated herein.

Specifically, the emergency control module 3140 is connected to a detection result latching circuit 3120 through a path 3141 and is configured to detect a bus voltage of the power supply module and determine whether the external driving signal being received by the LED tube lamp is a DC signal. If the emergency control module 3140 determines that the external driving signal is a DC signal, the emergency control module 3140 outputs a first state signal indicative of an emergency state to the detection result latching circuit 3120; or if the emergency control module 3140 determines that the external driving signal is not a DC signal, the emergency control module 3140 outputs a second state signal indicative of a non-emergency state to the detection result latching circuit 3120. When the detection result latching circuit 3120 receives the first state signal, regardless of the output of the detection pulse generating module 3110 and the output of the detection determining circuit 3130, the detection result latching circuit 3120 then maintains the switch circuit 3200*a* in a conduction or on state, which can be referred to as in an emergency lighting mode. On the other hand, when the detection result latching circuit 3120 receives the second state signal, the detection result latching circuit 3120 then operates according to its ordinary mechanism to control the conduction and cutoff of the switch circuit 3200*a* based on the pulse signal and the detection result signal. Such a term "bus voltage" mentioned herein may refer to an alternating voltage/signal provided to an LED tube lamp which has not been processed by a rectifying circuit (i.e., not yet rectified, such as the external driving signal) in the LED tube lamp, or may refer to a rectified voltage/signal after rectification in the LED tube lamp and based on such an external driving signal, but the present disclosure is not limited to any of these two cases.

Figure 48B:
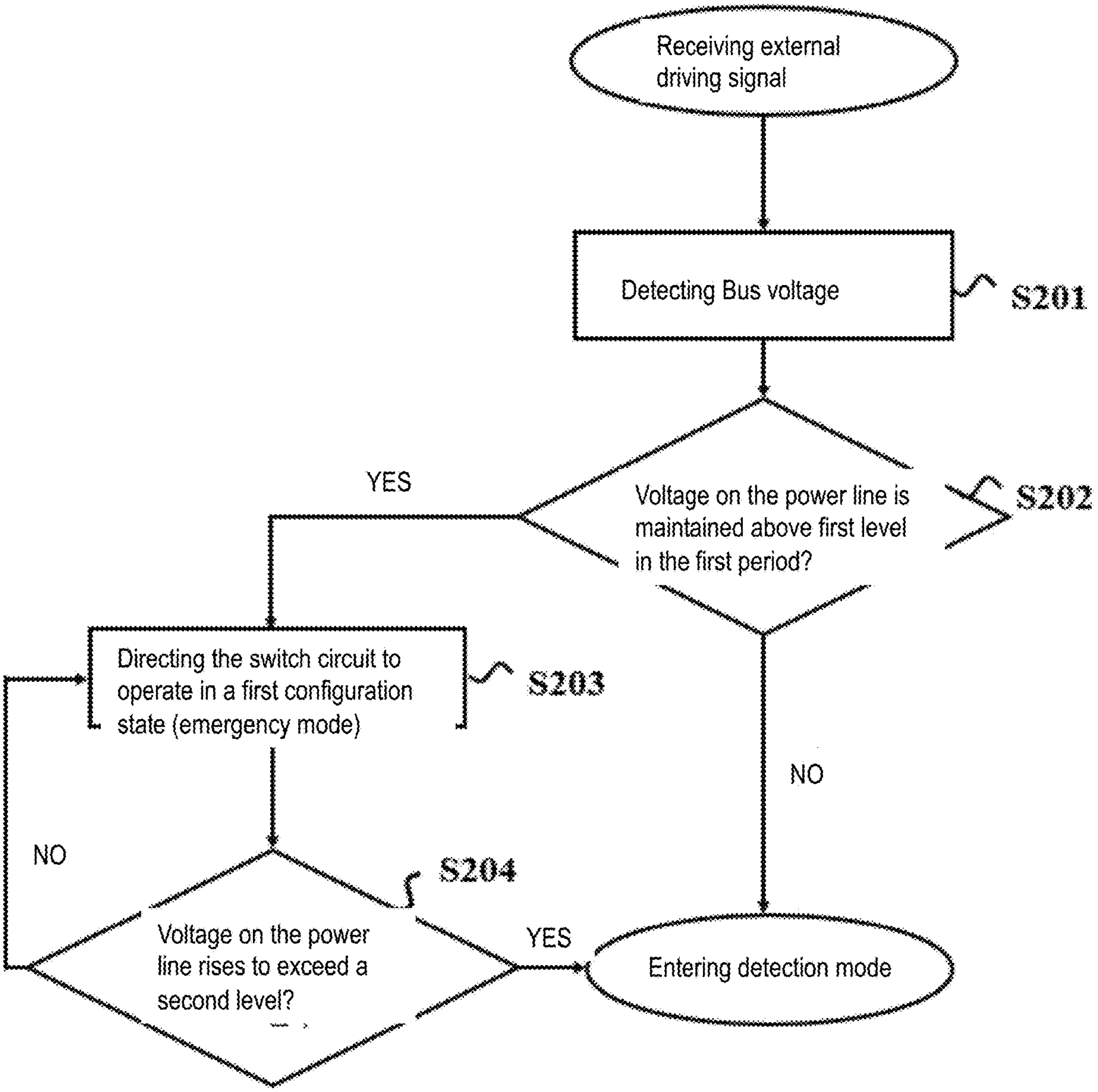
FIG. 48B is a flowchart of an emergency detection method according to some exemplary embodiments.

Next, detailed operation mechanisms of an installation detection module including the emergency control module 3140 are further described with reference to FIG. 48B. FIG. 48B is a flow chart of steps of a control method of the installation detection module with the emergency control module 3140 according to an exemplary embodiment. Referring to both FIG. 19A and FIG. 48B, when a power supply module of the LED tube lamp receives an external driving signal, the emergency control module 3140 operates to detect voltage on the power line (step S201) and then to judge whether the detected voltage on the power line is maintained above a first voltage level for a first period (step S202), wherein the first period may be for example 75 ms, and the first voltage level may be any level in the range of between 100V and 140V, such as 110V or 120V. For example, in an embodiment of the step S202, the emergency control module 3140 judges whether the detected voltage on the power line is maintained above 110V or 120V for over 75 ms.

If the determination result by the emergency control module 3140 in step S202 is positive, this means the received external driving signal is a DC signal, then the installation detection module 3000*a* enters into an emergency mode and causes the detection result latching circuit 3120 to direct the switch circuit 3200*a* to operate in a first configuration state (step S203), which is for example a conduction state. On the other hand, if the judgment by the emergency control module 3140 in step S202 is negative, this means the received external driving signal is not a DC signal but is an AC signal, then the installation detection module 3000*a* enters into a detection mode, causing the detection result latching circuit 3120 to judge the installation state of the LED tube lamp by outputting pulse(s) or pulse signal(s) to the switch circuit 3200*a*. For detailed descriptions of operations of the installation detection module 3000*a* that includes the emergency control module 3140 under the installation detection mode according to certain embodiments, refer to those of embodiments of FIG. 48A presented above.

On the other hand, under the emergency mode, in addition to maintaining the switch circuit 3200*a* to operate in the first configuration, the emergency control module 3140 further determines whether a bus voltage (i.e., the voltage on the power line of the power supply module) rises to exceed a second voltage level (step S204). When the emergency control module 3140 determines the bus voltage does not rise to exceed the second voltage level, which refers to the LED tube lamp remaining under the emergency mode, the switch circuit 3200*a* continues to operate in the first configuration. When the emergency control module 3140 determines the bus voltage rises to exceed the second voltage level from the first voltage level, which refers to the external driving signal received by the power supply module changing into the AC signal from the DC signal (e.g., AC power line has been recovered), the emergency control module 3140 controls the installation detection module 3000*a* to enter into the detection mode. In some embodiments, the second voltage level can be any voltage level higher than the first voltage level but less than 277V. For example, when the first voltage level is 110V, the second voltage level can be 120V. According to some embodiments of the step S204, the emergency control module 3140 determines whether the bus voltage has a rising edge exceeding 120V and enters into the detection mode when the determination result is positive. In practical applications, when the LED tube lamp in the above embodiments is inserted into the lamp holder, the installation detection module is configured to obtain the signal of the power loop of the LED tube lamp. When the signal is detected as a ballast characteristic signal, the LED tube lamp misuse warning is generated, and/or the power loop would be disconnected when the detected signal indicates a human contact. As described herein, the installation detection module can be used only for ballast detection or only for current leakage detection, or for both ballast detection and current leakage detection at the same time. In some examples, the installation detection module is configured to perform both the ballast detection and the current leakage detection, the circuit structure and detection method of the ballast detection are described as in the above embodiment, the circuit structure and detection method of the current leakage detection is not limited to the above embodiments, any current leakage detection method that can detect whether the signal is in contact with the human body (i.e., whether there is current leakage) falls in the scope of the present disclosure.

In some embodiments, the detection pulse generating module 3110, detection determining circuit 3130, detection result latching circuit 3120, and the switching circuit 3200*a* of the installation detection module 3000*a* comprise or are implemented by, but are not limited to, circuit structures of FIGS. 19B-19E respectively, which FIGS. Are circuit structure diagrams of respective circuits and module of an installation detection module 3000*a* according to a first embodiment. Descriptions of the circuit embodiments of FIGS. 19B-19E are presented below.

Figure 19B:
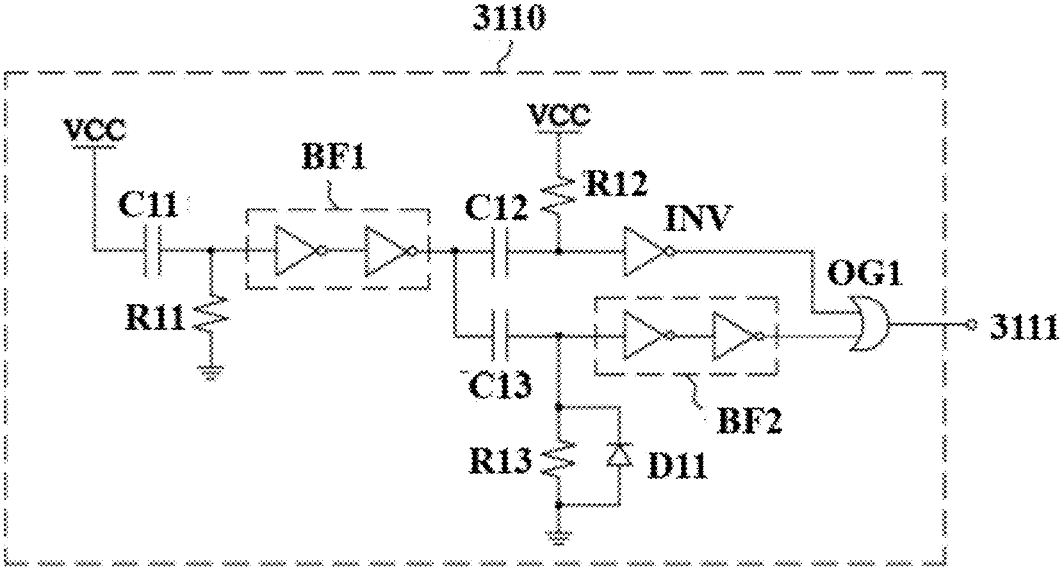
FIGS. 19B-19F are schematic circuit diagrams of an installation detection module according to some exemplary embodiments.

Referring to FIG. 19B, a block diagram of a detection pulse generating module according to some certain embodiments is illustrated. A detection pulse generating module 3110 may be a circuit that includes multiple capacitors C11, C12, and C13, multiple resistors R11, R12, and R13, two buffers BF1 and BF2, an inverter INV, a diode D11, and an OR gate OG1. The capacitor C11 may be referred to as a first capacitor C11, the capacitor C12 may be referred to as a second capacitor C12, and the capacitor C13 may be referred to as a third capacitor C13. The resistor R11 may be referred to as a first resistor R11, the resistor R12 may be referred to as a second resistor R12, and the resistor R13 may be referred to as a third resistor R13. The buffer BF1 may be referred to as a first buffer BF1 and the buffer BF2 may be referred to as a second buffer BF2. The diode D11 may be referred to as a first diode D11 and the OR gate OG1 may be referred to as a first OR gate OG1. With use or operation, the capacitor C11 and the resistor R11 connect in series between a driving voltage (e.g., a driving voltage source, which may be a node of a power supply), such as VCC usually defined as a high logic level voltage, and a reference voltage (or potential), such as ground potential in this embodiment. The connection node between the capacitor C11 and the resistor R11 is coupled to an input terminal of the buffer BF1. In this exemplary embodiment, the buffer BF1 includes two inverters connected in series between an input terminal and an output terminal of the buffer BF1. The resistor R12 is coupled between the driving voltage, e.g., VCC, and an input terminal of the inverter INV. The resistor R13 is coupled between an input terminal of the buffer BF2 and the reference voltage, e.g., ground potential in this embodiment. An anode of the diode D11 is grounded and a cathode of the diode D11 is coupled to the input terminal of the buffer BF2. First ends of the capacitors C12 and C13 are jointly coupled to an output terminal of the buffer BF1, and second, opposite ends of the capacitors C12 and C13 are respectively coupled to the input terminal of the inverter INV and the input terminal of the buffer BF2. In this exemplary embodiment, the buffer BF2 includes two inverters connected in series between an input terminal and an output terminal of the buffer BF2. An output terminal of the inverter INV and an output terminal of the buffer BF2 are coupled to two input terminals of the OR gate OG1. According to certain embodiments, the voltage (or potential) for "high logic level" and "low logic level" mentioned in this specification are all relative to another voltage (or potential) or a certain reference voltage (or potential) in circuits, and further may be described as "high logic level" and "low logic level."

Figure 45A:
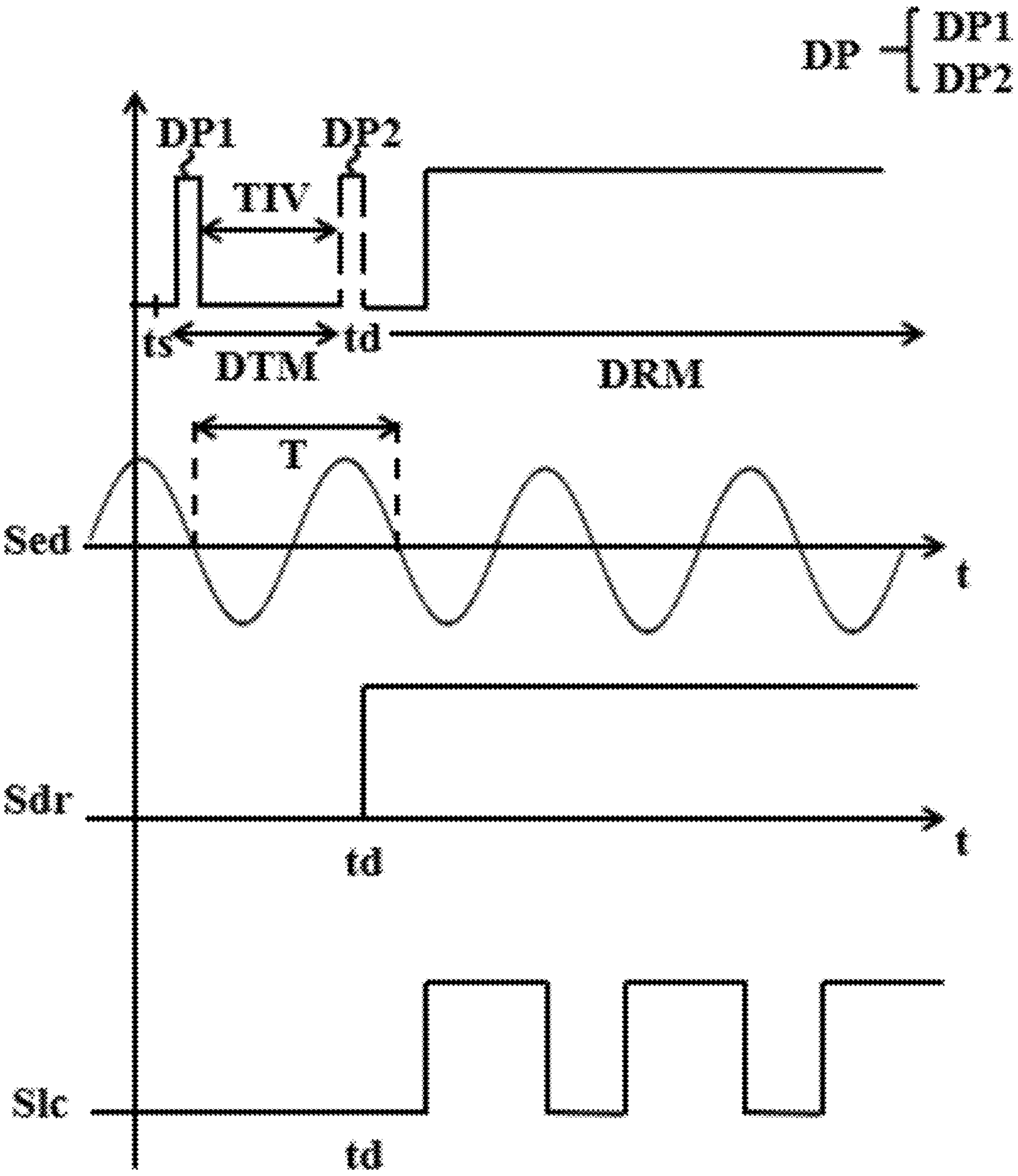
FIGS. 45A-45G are schematic signal waveform diagrams of power supply modules according to some exemplary embodiments.

FIG. 45A is a signal waveform diagram of an exemplary power supply module according to an exemplary embodiment. The installation detection operation is described further in accordance with FIG. 45A, which shows an example when an end cap of an LED tube lamp is inserted into a lamp socket and the other end cap thereof is electrically coupled to a human body, or when both end caps of the LED tube lamp are inserted into the lamp socket (e.g., at the timepoint ts), the LED tube lamp is conductive with electricity. At this moment, the Installation detection module (e.g., the installation detection module 2520 as illustrated in FIG. 18) enters a detection mode DTM. The voltage on the connection node of the capacitor C11 and the resistor R11 is high initially (equals to the driving voltage, VCC) and decreases with time to zero finally. The input terminal of the buffer BF1 is coupled to the connection node of the capacitor C11 and the resistor R11, so the buffer BF1 outputs a high logic level signal at the beginning and changes to output a low logic level signal when the voltage on the connection node of the capacitor C11 and the resistor R11 decreases to a low logic trigger logic level. As a result, the buffer BF1 is configured to produce an input pulse signal and then remain in a low logic level thereafter (stops outputting the input pulse signal.) The width for the input pulse signal may be described as equal to one (initial setting) time period, which is determined by the capacitance value of the capacitor C11 and the resistance value of the resistor R11.

Next, the operations for the buffer BF1 to produce the pulse signal with the initial setting time period will be described below. Since the voltage on a first end of the capacitor C12 and on a first end of the resistor R12 is equal to the driving voltage VCC, the voltage on the connection node of both of them is also a high logic level. The first end of the resistor R13 is grounded and the first end of the capacitor C13 receives the input pulse signal from the buffer BF1, so the connection node of the capacitor C13 and the resistor R13 has a high logic level voltage at the beginning but this voltage decreases with time to zero (in the meantime, the capacitor stores the voltage being equal to or approaching the driving voltage VCC.) Accordingly, initially the inverter INV outputs a low logic level signal and the buffer BF2 outputs a high logic level signal, and hence the OR gate OG1 outputs a high logic level signal (a first pulse signal DP1) at the pulse signal output terminal 3111. At this moment, the detection result latching circuit 3120 (as illustrated in FIG. 19A) stores the detection result for the first time according to the detection result signal Sdr received from the detection determining circuit 3130 (as illustrated in FIG. 19A) and the pulse signal generated at the pulse signal output terminal 3111. During that initial pulse time period, as illustrated in FIG. 19A, the detection pulse generating module 3110 outputs a high logic level signal, which results in the detection result latching circuit 3120 outputting the result of that high logic level signal. When the voltage on the connection node of the capacitor C13 and the resistor R13 decreases to the low logic trigger logic level, the buffer BF2 changes to output a low logic level signal to make the OR gate OG1 output a low logic level signal at the pulse signal output terminal 3111 (stops outputting the first pulse signal DP1.) The width of the first pulse signal DP1 output from the OR gate OG1 is determined by the capacitance value of the capacitor C13 and the resistance value of the resistor R13.

The operation after the buffer BF1 stops outputting the pulse signal is described as below. For example, the operation may be initially in an LED operating mode DRM. Since the capacitor C13 stores the voltage being almost equal to the driving voltage VCC, and when the buffer BF1 instantaneously changes its output from a high logic level signal to a low logic level signal, the voltage on the connection node of the capacitor C13 and the resistor R13 is below zero but will be pulled up to zero by the diode D11 rapidly charging the capacitor C13. Therefore, the buffer BF2 still outputs a low logic level signal.

In some embodiments, when the buffer BF1 instantaneously changes its output from a high logic level signal to a low logic level signal, the voltage on the one end of the capacitor C12 also changes from the driving voltage VCC to zero instantly. This makes the connection node of the capacitor C12 and the resistor R12 have a low logic level signal. At this moment, the output of the inverter INV changes to a high logic level signal to make the OR gate output a high logic level signal (a second pulse signal DP2) at the pulse signal output terminal 3111. The detection result latching circuit 3120 as illustrated in FIG. 19A stores the detection result for a second time according to the detection result signal Sdr received from the detection determining circuit 3130 (as illustrated in FIG. 19A) and the pulse signal generated at the pulse signal output terminal 3111. Next, the driving voltage VCC charges the capacitor C12 through the resistor R12 to make the voltage on the connection node of the capacitor C12 and the resistor R12 increase with time to the driving voltage VCC. When the voltage on the connection node of the capacitor C12 and the resistor R12 increases to reach a high logic trigger logic level, the inverter INV outputs a low logic level signal again to make the OR gate OG1 stop outputting the second pulse signal DP2. The width of the second pulse signal DP2 is determined by the capacitance value of the capacitor C12 and the resistance value of the resistor R12.

As those mentioned above, in certain embodiments, the detection pulse generating module 3110 generates two high logic level pulse signals in the detection mode DTM, which are the first pulse signal DP1 and the second pulse signal DP2. These pulse signals are output from the pulse signal output terminal 3111. Moreover, there is an interval TIV with a defined time between the first and second pulse signals DP2. In embodiments using the circuits as shown in FIG. 19B to implement the detection pulse generating module 3110, the defined time is determined by the capacitance value of the capacitor C11 and the resistance value of the resistor R11. In other embodiments using digital circuits to implement the detection pulse generating module 3110, adjustment of the set interval TIV can be implemented by setting the signal frequency or period or other adjustable parameter(s) of the digital circuit of each embodiment.

Upon entering into an operating mode DRM after the detection mode DTM, the detection pulse generating module 3110 no longer produces the pulse signal DP1/DP2 but maintains the pulse signal output terminal 3111 at a low signal level.

Figure 19C:
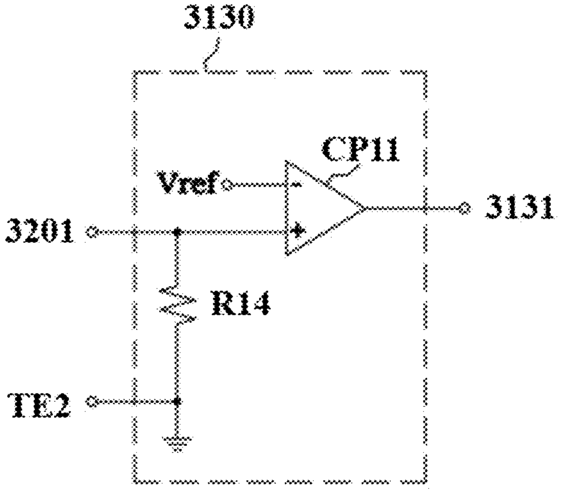

Referring to FIG. 19C, a detection determining circuit according to some certain embodiments is illustrated. An exemplary detection determining circuit 3130 includes a comparator CP11 and a resistor R14. The comparator CP11 may also be referred to as a first comparator CP11 and the resistor R14 may also be referred to as a fifth resistor R14. A negative input terminal of the comparator CP11 receives a reference logic level signal (or a reference voltage) Vref, a positive input terminal thereof is grounded through the resistor R14 and is also coupled to a switch circuit coupling terminal 3201. With reference to FIG. 18, the signal flowing into the switch circuit 3200*a* from the installation detection terminal TE1 outputs to the switch circuit coupling terminal 3201 to the resistor R14. When the current of the signal passing through the resistor R14 reaches a certain level (for example, bigger than or equal to a defined current for installation, (e.g., 2A) and this makes the voltage on the resistor R14 higher than the reference voltage Vref (referring to two end caps inserted into the lamp socket,) the comparator CP11 produces a high logic level detection result signal Sdr and outputs it to the detection result terminal 3131. For example, when an LED tube lamp is correctly installed in a lamp socket, the comparator CP11 outputs a high logic level detection result signal Sdr at the detection result terminal 3131, whereas the comparator CP11 generates a low logic level detection result signal Sdr and outputs it to the detection result terminal 3131 when a current passing through the resistor R14 is insufficient to make the voltage on the resistor R14 higher than the reference voltage Vref (referring to only one end cap inserted into the lamp socket.) Therefore, in some embodiments, when the LED tube lamp is incorrectly installed in the lamp socket or one end cap thereof is inserted into the lamp socket but the other one is grounded by an object such as a human body, the current will be too small to make the comparator CP11 output a high logic level detection result signal Sdr to the detection result terminal 3131.

Figure 19D:
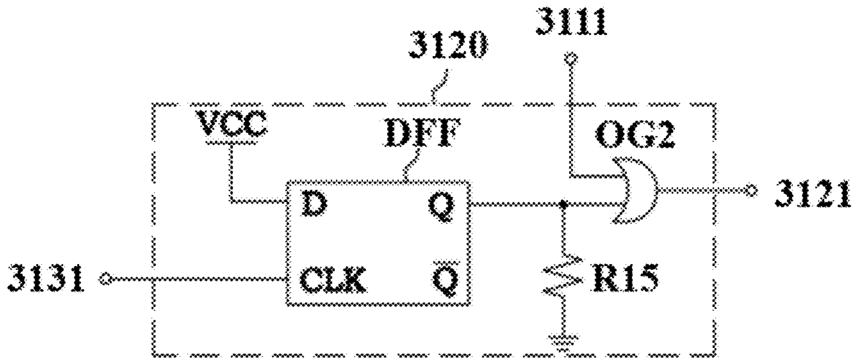

Referring to FIG. 19D, a schematic detection result latching circuit according to some embodiments of the present disclosure is illustrated. A detection result latching circuit 3120 includes a D flip-flop DFF, a resistor R15, and an OR gate OG2. The D flip-flop DFF may also be referred to as a first D flip-flop DFF, the resistor R15 may also be referred to as a fourth resistor R15, and the OR gate OG2 may also be referred to as a second OR gate OG2. The D flip-flop DFF has a CLK input terminal coupled to a detection result terminal 3131, and a D input terminal coupled to a driving voltage VCC. When the detection result terminal 3131 first outputs a low logic level detection result signal Sdr, the D flip-flop DFF initially outputs a low logic level signal at a Q output terminal thereof, but the D flip-flop DFF outputs a high logic level signal at the Q output terminal thereof when the detection result terminal 3131 outputs a high logic level detection result signal Sdr. The resistor R15 is coupled between the Q output terminal of the D flip-flop DFF and a reference voltage, such as ground potential. When the OR gate OG2 receives the first or second pulse signals DP1/DP2 from the pulse signal output terminal 3111 or receives a high logic level signal from the Q output terminal of the D flip-flop DFF, the OR gate OG2 outputs a high logic level detection result latching signal at a detection result latching terminal 3121. The detection pulse generating module 3110 only in the detection mode DTM outputs the first and the second pulse signals DP1/DP2 to make the OR gate OG2 output the high logic level detection result latching signal, and thus the D flip-flop DFF decides the detection result latching signal to be the high logic level or the low logic level the rest of the time, e.g., including the LED operating mode DRM after the detection mode DTM. Accordingly, when the detection result terminal 3131 has no high logic level detection result signal Sdr, the D flip-flop DFF keeps a low logic level signal at the Q output terminal to make the detection result latching terminal 3121 also keep a low logic level detection result latching signal in the detection mode DTM. On the contrary, once the detection result terminal 3131 has a high logic level detection result signal Sdr, the D flip-flop DFF outputs and keeps a high logic level signal (e.g., based on VCC) at the Q output terminal. In this way, the detection result latching terminal 3121 keeps a high logic level detection result latching signal in the LED operating mode DRM as well.

Figure 19E:
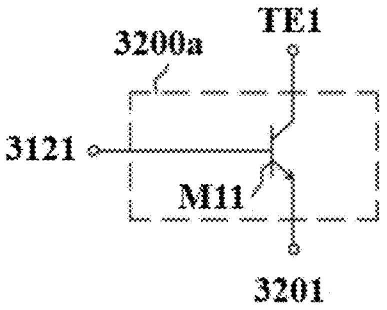

Referring to FIG. 19E, a schematic switch circuit according to some embodiments is illustrated. A switch circuit 3200*a* includes a transistor, such as a bipolar junction transistor (BJT) M11, as being a power transistor, which has the ability of dealing with high current/power and is suitable for the switch circuit. The BJT M11 may also be referred to as a first transistor M11. The BJT M11 has a collector coupled to an installation detection terminal TE1, a base coupled to a detection result latching terminal 3121, and an emitter coupled to a switch circuit coupling terminal 3201. When the detection pulse generating module 3110 produces the first and second pulse signals DP1/DP2, the BJT M11 is in a transient conducting state. This allows the detection determining circuit 3130 to perform the detection for determining the detection result latching signal to be a high logic level or a low logic level. When the detection result latching circuit 3120 outputs a high logic level detection result latching signal at the detection result latching terminal 3121, this means the LED tube lamp is correctly installed in the lamp socket, so that the BJT M11 is in the conducting state to make the installation detection terminals TE1 and TE2 conducting (i.e., make the power loop conducting). In the meantime, the driving circuit (not shown) in the power supply module starts to operate in response to the voltage received from the power loop and generates the lighting control signal Slc for controlling the conducting state of the power switch (not shown), so that the driving current can be produced to light up the LED module. In contrast, when the detection result latching circuit 3120 outputs a low logic level detection result latching signal at the detection result latching terminal 3121 and the output from detection pulse generating module 3110 is a low logic level, the BJT M11 is cut-off or in the blocking state to make the installation detection terminals TE1 and TE2 cut-off or blocking. In this case, the driving circuit of the power supply module would not be started, so that the lighting control signal Slc would not be generated.

Figure 19F:
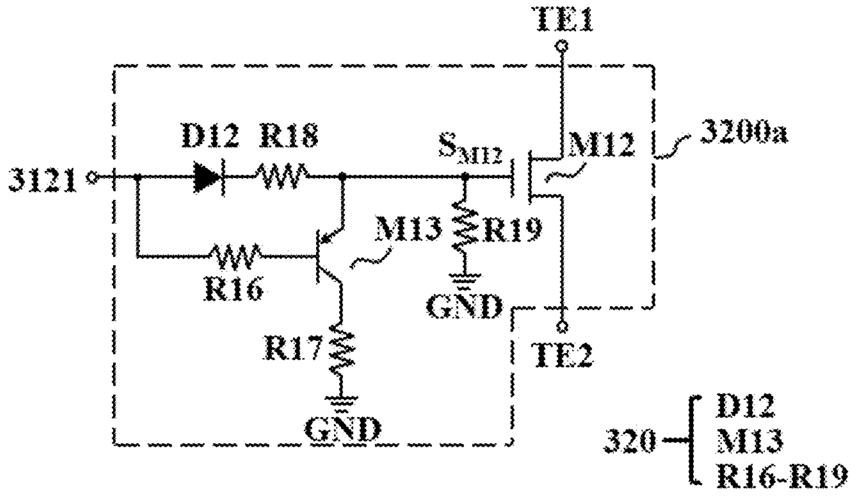

FIG. 19F is a circuit diagram of a switching circuit according to some embodiments. Compared to the embodiment of FIG. 19E where a switching circuit 3200*a* comprises a transistor M11, the switching circuit 3200*a* of FIG. 19F comprises a transistor illustrated by a MOSFET M12, and further includes a pulse resetting auxiliary circuit 320. In the embodiment of FIG. 19F, the pulse resetting auxiliary circuit 320 is electrically connected to a control terminal of the transistor M12 and a detection result latching terminal 3121 of the detection result latching circuit 3120. The pulse resetting auxiliary circuit 320 is configured to reset signal SM12 provided to the control terminal of the transistor M12 under the detection mode, so as to cause a falling edge of the signal SM12 to match a signal at the detection result latching terminal 3121 under the detection mode which can be referred to the pulse signal at the pulse signal output terminal 3111. Therefore, the pulse resetting auxiliary circuit 320 can increase the discharge speed of the signal SM12 under the detection mode, so that the signal SM12 can be pulled to a low level fast when the pulse signal is pulled to a low level, and thereby reducing the phase difference between the pulse signal and the signal SM12 and preventing misoperation of the transistor M12.

Specifically, when the LED tube lamp is operating in a detection mode, the detection result latching circuit 3120 is configured to output a pulse signal through a detection result latching terminal 3121 to control the transistor M12 for periodically and intermittently conducting. Without regard to the speed of rising up and falling down of its voltage level, i.e., assuming that the slope of both the rising up and the falling down is close to being infinite, the signal SM12 is approximately a pulse signal too and may be substantially synchronous with the signal at the detection result latching terminal 3121, with the two signals concurrently rising up and concurrently falling down. But in actual practice, the speed of charging (or rising up) and discharging (or falling down) of the signal SM12 may be significantly affected by relevant circuit design and chosen values of device parameters of the transistor M12. For example, if the transistor M12 has greater chosen dimensions, parasitic capacitors between the control terminal and one of the other terminals of the transistor M12 will be greater which prolongs its charging and discharging time. Thus, considering the speed of rising up and falling down of its voltage level, the signal SM12 might not be synchronous with the signal at the detection result latching terminal 3121. To address this issue, in this embodiment of FIG. 19F, the pulse resetting auxiliary circuit 320 is configured to be enabled, when the detection result latching circuit 3120 outputs a low-level signal and the signal SM12 remains at a high voltage level, to further conduct an additional discharge path for improving the discharge speed and thus solving the asynchronous problem.

In some embodiments, the pulse resetting auxiliary circuit 320 may be realized by a circuit structure shown in FIG. 19F, wherein the pulse resetting auxiliary circuit 320 includes a transistor M13 (illustrated by but not limited to a PNP BJT), and resistors R16 and R17. The transistor M13 has a control terminal electrically connected through the resistor R16 to a detection result latching terminal 3121, a first terminal electrically connected to the control terminal of the transistor M12, and a second terminal electrically connected through the resistor R17 to a ground terminal GND. In some embodiments, the pulse resetting auxiliary circuit 320 may further include a diode D12 and resistors R18 and R19. The diode D12 has an anode electrically connected to the detection result latching terminal 3121, and has a cathode electrically connected to an end of the resistor R18, which has the other end electrically connected to the control terminal of the transistor M12 and the first terminal of the transistor M13. And the resistor R19 is electrically connected between the control terminal of the transistor M12 and the ground terminal GND.

When the LED tube lamp is operating in a normal operation mode, the detection result latching circuit 3120 is configured to output a high-level signal through the detection result latching terminal 3121, causing the signal SM12 at the control terminal of the transistor M12 to have a high level to conduct the transistor M12. At this time, the transistor M13 of the pulse resetting auxiliary circuit 320 remains at a cutoff state in response to the high-level signal at the detection result latching terminal 3121, so the voltage level of the signal SM12 is not significantly affected by the pulse resetting auxiliary circuit 320. In this case, the pulse resetting auxiliary circuit 320 is regarded as being disabled.

On the other hand, when the LED tube lamp is operating in a detection mode, if the signal SM12 is substantially synchronous with, or does not have substantial phase difference from, the signal at the detection result latching terminal 3121, no matter whether the signal SM12 is having a high voltage level or low voltage level, the transistor M13 is in a reverse-biased state between its control terminal and first terminal, causing the transistor M13 to remain in a cutoff state. But if the signal SM12 is not synchronous with, or does have substantial phase difference from, the signal at the detection result latching terminal 3121, especially when the signal SM12 lags in phase behind the signal at the detection result latching terminal 3121, the signal SM12 has a high voltage level and the signal at the detection result latching terminal 3121 has a low voltage level, causing the transistor M13 to be in a forward-biased state between its control terminal and first terminal. In this case, the pulse resetting auxiliary circuit 320 is regarded as being enabled and the transistor M13 is caused to conduct, so that the signal SM12 can be discharged through a discharge path from the transistor M13 to the resistor R17 and then to the ground terminal GND. In this manner, the speed of falling down of the signal SM12 from a high level to a low level is further improved.

Since the external driving signal Sed is an AC signal and in order to avoid the detection error resulting from the logic level of the external driving signal being just around zero when the detection determining circuit 3130 detects, the detection pulse generating module 3110 generates the first and second pulse signals DP1/DP2 to let the detection determining circuit 3130 perform two detections. So, the issue of the logic level of the external driving signal being just around zero in a single detection can be avoided. In some cases, the time difference between the productions of the first and second pulse signals DP1/DP2 is not multiple times of half one cycle T of the external driving signal Sed. For example, it does not correspond to the multiple phase differences of 180 degrees of the external driving signal Sed. In this way, when one of the first and second pulse signals DP1/DP2 is generated and unfortunately the external driving signal Sed is around zero, it can be avoided that the external driving signal Sed is again around zero when the other pulse signal is generated.

The time difference between the productions respectively of the first pulse signal and the second pulse signal, namely a set interval TIV, may be expressed as in the following equation:

$$TIV=(X+Y)(T/2);$$

where T represents the cycle of an external driving signal Sed, X is a natural number, $0<Y<1$, with Y in some embodiments in the range of 0.05-0.95, and in some embodiments in the range of 0.15-0.85.

A person of ordinary skill in the relevant art of the present disclosure can understand according to the above descriptions of embodiments that the method of generating two pulses or pulse signals so as to perform installation detection is merely an exemplary embodiment of how the detection pulse generating module operates, and that in practice the detection pulse generating module may be configured to generate at least one or two pulse signals so as to perform installation detection, although the present disclosure is not limited to any of these different numbers.

Furthermore, in order to avoid the installation detection module entering the detection mode DTM from misjudgment resulting from the logic level of the driving voltage VCC being too small, the first pulse signal DP1 can be set to be produced when the driving voltage VCC reaches or is higher than a defined logic level. For example, in some embodiments, the detection determining circuit 3130 works after the driving voltage VCC reaching a high enough logic level in order to prevent the installation detection module from misjudgment due to an insufficient logic level.

According to the examples mentioned above, when one end cap of an LED tube lamp is inserted into a lamp socket and the other one floats or electrically couples to a human body or other grounded object, the detection determining circuit outputs a low logic level detection result signal Sdr because of high impedance. The detection result latching circuit stores the low logic level detection result signal Sdr based on the pulse signal of the detection pulse generating module, making it as the low logic level detection result latching signal, and keeps the detection result in the LED operating mode DRM, without changing the logic value. In this way, the switch circuit keeps cutting-off or blocking instead of conducting continually. And further, the electric shock situation can be prevented, and the requirement of safety standard can also be met. On the other hand, when two end caps of the LED tube lamp are correctly inserted into the lamp socket (e.g., at the timepoint td), the detection determining circuit outputs a high logic level detection result signal Sdr because the impedance of the circuit for the LED tube lamp itself is small. The detection result latching circuit stores the high logic level detection result signal Sdr based on the pulse signal of the detection pulse generating module, making it as the high logic level detection result latching signal, and keeps the detection result in the LED operating mode DRM. So, the switch circuit keeps conducting to make the LED tube lamp work normally in the LED operating mode DRM.

In some embodiments, when one end cap of the LED tube lamp is inserted into the lamp socket and the other one floats or electrically couples to a human body, the detection determining circuit outputs a low logic level detection result signal Sdr to the detection result latching circuit, and then the detection pulse generating module outputs a low logic level signal to the detection result latching circuit to make the detection result latching circuit output a low logic level detection result latching signal to make the switch circuit cutting-off or blocking. As such, the switch circuit blocking makes the installation detection terminals, e.g., the first and second installation detection terminals, blocking. As a result, the LED tube lamp is in non-conducting or blocking state.

However, in some embodiments, when two end caps of the LED tube lamp are correctly inserted into the lamp socket, the detection determining circuit outputs a high logic level detection result signal Sdr to the detection result latching circuit to make the detection result latching circuit output a high logic level detection result latching signal to make the switch circuit conducting. As such, the switch circuit conducting makes the installation detection terminals, e.g., the first and second installation detection terminals, conducting. As a result, the LED tube lamp operates in a conducting state.

Accordingly, under the process of installing the LED tube lamp by a user, once the LED tube lamp is powered up (no matter whether the LED tube lamp is lighted up or not), the installation detection module of the LED tube lamp generates the pulse for detecting the installation state or the occurrence of electric shock before continuously conducting the power loop, so that the driving current is conducted through the power loop to drive the LED module after confirming the LED tube lamp is correctly installed or is not touched by the user. Therefore, the LED tube lamp would not be lighted up until the first pulse being generated, which means the power loop would not be conducted or the current on the power loop would be limited to less than 5 mA/MIU. In practical application, the period from the timepoint of the LED tube lamp being powered up to the timepoint of the first pulse being generated is substantially not less than 100 ms. For example, the LED tube lamp provided with the installation detection module of the present embodiment does not emit light until at least 100 ms after being installed and powered up. In some embodiments, since the installation detection module continuously generates the pulses before determining whether the installation state is correct or determining that the user does not touch the LED tube lamp, the LED tube lamp will be lighted up after at least the interval TIV (i.e., after the second pulse is generated) if the LED tube lamp is not lighted up after the first pulse is generated. In this example, if the LED tube lamp is not lighted up after 100 ms, the LED tube lamp does not emit light in at least 100+TIV ms as well. It should be noted that such an expression "the LED tube lamp is powered up" refers to the fact that an external power source (such as the AC power line) is applied to the LED tube lamp, with a power loop of the LED tube lamp being electrically connected to a ground level so as to produce a voltage difference on the power loop. That the powered-up LED tube lamp is properly/correctly installed means the external power source is applied to the LED tube lamp and the LED tube lamp is electrically connected to the ground level through a ground line of the lamp fixture. And that the powered-up LED tube lamp is improperly/incorrectly installed refers to that the external power source is applied to the LED tube lamp and the LED tube lamp is electrically connected to the ground level not only through a ground line of the lamp fixture but also through a human body or other object of impedance, which means that in the state of being Improperly/Incorrectly installed an unexpected object or body of impedance happens to be serially connected on a current path in the power loop.

It is worth noting that according to certain embodiments, the pulse width of the pulse signal generated by the detection pulse generating module is between 1 μs to 1 ms, and it is used to make the switch circuit conducting for a short period when the LED tube lamp conducts instantaneously. In an exemplary embodiment, the pulse width of the pulse signal is between 10 μs to 1 ms. In another exemplary embodiment, the pulse width of the pulse signal is between 10 μs to 30 μs. In another exemplary embodiment, the pulse width of the pulse signal DP1/DP2 is in a broader range between 200 μs and 400 μs. In another exemplary embodiment, the pulse width of the pulse signal DP1/DP2 is within a range of between plus and minus 15% of 20 μs, 35 μs, or 45 μs. And in another exemplary embodiment, the pulse width of the pulse signal DP1/DP2 is within a range of between plus and minus 15% of 300 μs.

According to some embodiments, the pulse or pulse signal means a momentary occurrence of abrupt variation of a signal of voltage or current in a continual period of the signal, that is, in a short period of time the signal suddenly abruptly varies and then quickly returns to an initial value before variation. Thus, the pulse signal may be a signal of voltage or current that varies or transitions from a low level to a high level and after a short time at the high-level returns to the low level, or that varies or transitions from a high level to a low level and then returns to the high level, while the disclosure is not limited to any of these options. Such an expression "momentary occurrence of signal variation" corresponds to a period of time not sufficient for the LED tube lamp as a unit to change its state of operation and during which period the momentary signal variation is unlikely to cause an electric shock hazard on a touching human body. For example, when using the pulse signal DP1/DP2 to cause conduction of the switch circuit 3200/3200*a*, the duration of the conduction of the switch circuit 3200/3200*a* is so short as not to light up the LED module and is so short as to cause an effective current on the power loop to not exceed a rated current upper limit" (5 MIU). And the "abrupt variation of a signal" refers to an extent of variation of the pulse or pulse signal sufficient to cause an electrical element receiving it to respond thereto and then change the element's operation state. For example, when the switch circuit 3200/3200*a* receives the pulse signal DP1/DP2, the switch circuit 3200/3200*a* conducts or is cut off in response to switching of the signal level of the pulse signal DP1/DP2.

In addition, although the detection pulse generating module 3110 generates two pulse signals DP1 and DP2 for example, the detection pulse generating module 3110 of the present disclosure is not limited thereto. The detection pulse generating module 3110 is a circuit capable of generating a single pulse or plural pulses (greater than two pulses).

For an embodiment of the detection pulse generating module 3110 generating only one pulse or pulse signal, a simple circuit configuration using an RC circuit in combination with active electrical element(s) (having internal power source) can be used to implement the generation/issuance of only one pulse. For example, in some embodiments, the detection pulse generating module 3110 merely includes the capacitor C11, resistor R11 and buffer BF1. Under such configuration, the detection pulse generating module can only generate a single pulse signal DP1.

Under an embodiment of the detection pulse generating module 3110 generating a plurality of pulse signals, in some embodiments, the detection pulse generating module 3110 further includes a reset circuit (not shown). The reset circuit may reset the operation state of the circuits in the detection pulse generating module 3110 after the first pulse signal DP1 and/or the second pulse signal DP2 being generated, so that the detection pulse generating module 3110 can generate the first pulse signal DP1 and/or the second pulse signal DP2 again after a while. The generating of the plurality of pulse signals at intervals of a fixed period TIV may be for example generating a pulse signal every 20 ms to 2s (that is, 20 ms TIV 2s). In one embodiment, the fixed period TIV is between 500 ms and 2s. In another embodiment, the fixed period TIV is in a range of between plus and minus 15% of 75 ms. In still another embodiment, the fixed period TIV is in a range of between plus and minus 15% of 45 ms. In still another embodiment, the fixed period TIV is in a range of between plus and minus 15% of 30 ms. And the generating of the plurality of pulse signals at intervals of a random period TIV may be for example performed by choosing a random value in a range of between 0.5s and 2s as the random period TIV between every two consecutive generated pulse signals.

In particular, the time and frequency for the detection pulse generating module 3110 to generate a pulse signal to perform installation detection may be set or adjusted taking account of effects of a detection current under a detection stage on a normal human body touching or exposed to the detection current. In general, as long as the magnitude and duration of the detection current which is flowing through the human body conform to limiting requirements of relevant standards, the detection current flowing through the human body will not cause the human body to feel or experience an electric shock hazard and will not endanger the safety of the human body. The magnitude and the duration of the detection current should be in inverse relation so as to conform to limiting requirements of relevant standards to avoid the electric shock hazard. For example, under the requirement that the detection current flowing through the human body does not endanger the safety of the human body, the greater the magnitude of the detection current, the shorter the duration of the detection current flowing through the human body should be; inversely, if the magnitude of the detection current is very small, a rather long duration of the detection current flowing through the human body still would or could not endanger the safety of the human body. Therefore, in fact whether the detection current flowing through the human body endangers the safety of the human body or not is based on or determined by the amount of electric charge per unit time, or electric power, from the detection current and applied to or received by the human body, but not merely determined by the amount of electric charge received by the human body.

In some embodiments, the detection pulse generating module 3110 is configured to generate pulses or pulse signals for performing installation detection, only during a specific detection period, and outside the period to stop generating a pulse signal for installation detection, in order to prevent the detection current from causing electric shock on the touching human body. FIG. 45D is a signal waveform diagram of the detection current according to some embodiments, wherein the horizontal axis is the time axis (denoted by t), and the vertical axis represents value of the detection current (denoted by I). Referring to FIG. 45D, within a detection stage, the detection pulse generating module 3110 generates pulse signals for performing installation detection, during a specific detection period, to cause conduction of a detection path or a power loop in the LED tube lamp, wherein details of how the pulse width of each pulse and the interval between two consecutive pulses are set are referred to other described relevant embodiments elsewhere herein. Since the detection path or power loop is being conducted, a detection current signal Iin on the detection path or power loop, whose value may be obtained by measuring an input current to the power supply module of the LED tube lamp, includes a current pulse Idp generated corresponding to the time that each of the pulse signals is generated, and a detection determining circuit 3130 judges whether the LED tube lamp is correctly/properly installed in a lamp socket by measuring the value of the current pulse Idp. After the detection period Tw shown in FIG. 45D, the detection pulse generating module 3110 stops generating a pulse signal for installation detection, to cause the detection path or the power loop to be in a cutoff state. Viewing the detection current signal Iin broadly along the time axis, the detection pulse generating module 3110 generates a group of current pulses DPg during the detection period Tw, and judges whether the LED tube lamp is correctly/properly installed in a lamp socket by performing installation detection using the group of current pulses DPg. For example, in the embodiment of FIG. 45D, the detection pulse generating module 3110 generates current pulses Idp only during the detection period Tw, wherein the detection period Tw may be set in a range of between 0.5s and 2s and including every two-digit decimal number between and including the 0.5s and 2s, such as 0.51, 0.52, 0.53, . . . 0.60, 0.61, 0.62, . . . , 1.97, 1.98, 1.99, and 2, all in seconds, but this present disclosure is not limited to this range embodiment. And it is noted that by appropriately choosing a detection period Tw, it can be achieved that performing installation detection using the group of current pulses DPg does not generate excessive electrical power by the detection current that will endanger the touching human body, so the electric shock protection can be achieved.

With respect to circuit design, the way of the detection pulse generating module 3110 generating detection current pulses Idp only during the detection period Tw can be implemented by various different circuit embodiments. For example, in one embodiment, a detection pulse generating module 3110 is implemented by a pulse generating circuit (as illustrated in FIG. 19B or FIG. 20B) along with a timing circuit (not illustrated herein), wherein the timing circuit may be configured to, upon detecting a period, output a signal to cause the pulse generating circuit to stop generating the pulse(s). In another embodiment, a detection pulse generating module 3110 is implemented by a pulse generating module (as illustrated in FIG. 19B or FIG. 20B) along with a shielding/isolation circuit (not illustrated herein), wherein the shielding/isolation circuit may be configured to, after a predefined time, shield or prevent the detection pulse(s) from being generated or output by the pulse generating circuit, by any of a number of ways such as pulling (the voltage of) the output terminal of the detection pulse generating module to ground. Under the configuration with a shielding/isolation circuit, the shielding/isolation circuit may be implemented by a simple circuit such as an RC circuit, without the need to modify an original circuit design of the pulse generating circuit.

In some embodiments, the detection pulse generating module 3110 is configured to generate pulses or pulse signals for performing installation detection, at intervals each of which intervals between two consecutive pulses is set greater than or equal to a safety value, in order to prevent the detection current from causing electric shock on the touching human body. FIG. 45E is a signal waveform diagram of the detection current according to some exemplary embodiment. Referring to FIG. 45E, within a detection stage, the detection pulse generating module 3110 generates pulses for performing installation detection, at intervals each of which intervals between two consecutive pulses is set at TIVs (the 's' denoting second) greater than a specific safety value such as 1 second, to cause conduction of a detection path or a power loop in the LED tube lamp, wherein details of how the pulse width of each pulse is set are referred to other described relevant embodiments elsewhere herein. Since the detection path or power loop is being conducted, a detection current signal Iin on the detection path or power loop, whose value may be obtained by measuring an input current to the power supply module of the LED tube lamp, includes a current pulse Idp generated corresponding to the time that each of the pulse signals is generated, and a detection determining circuit 3130 judges whether the LED tube lamp is correctly/properly installed in a lamp socket by measuring the value of the current pulse Idp.

In some embodiments, the detection pulse generating module 3110 is configured to generate a group of pulses or pulse signals for performing installation detection, each group generated during a specific detection period Tw, periodically at intervals each of which intervals being greater than or equal to a specific safety value, in order to prevent the detection current from causing electric shock on the touching human body. FIG. 45F is a signal waveform diagram of the detection current according to a third embodiment. Referring to FIG. 45F, within a detection stage, the detection pulse generating module 3110 generates a group of pulse signals for performing installation detection, during a first detection period Tw, to cause conduction of a detection path or a power loop in the LED tube lamp, wherein details of how the pulse width of each pulse and the interval between two consecutive pulses are set are referred to other described relevant embodiments herein. Since the detection path or power loop is being conducted, a detection current signal Iin on the detection path or power loop includes a current pulse Idp generated corresponding to the time that each of the group of the pulse signals is generated, resulting in a first current pulse group DPg1 of the generated current pulses Idp for or during the first detection period Tw. After the first detection period Tw, during a set period TIV such as a period greater than or equal to 1 second, the detection pulse generating module 3110 stops generating a pulse signal for installation detection, to cause the detection path or the power loop to be in a cutoff state; and then the detection pulse generating module 3110 continues to generate again a group of pulse signals for performing installation detection, only upon entering into the next or a second detection period Tw. Similar to the operations and the waveform of the detection current signal Iin during the first detection period Tw, a second current pulse group DPg2 of generated current pulses Idp and a third current pulse group DPg3 of generated current pulses Idp are produced on the detection current signal Iin during the second detection period Tw and the third detection period Tw, respectively. And in this process, a detection determining circuit 3130 judges whether the LED tube lamp is correctly/properly installed in a lamp socket by measuring the value(s) of each of the first current pulse group DPg1, the second current pulse group DPg2, the third current pulse group DPg3, etc.

It's noted that in practice the magnitude of current of the current pulse Idp is related to or depends on impedance (such as resistance) on the detection path or power loop. Therefore, when designing a detection pulse generating module 3110, the format of the output detection pulse may be designed according to the adopted choice and configuration of the detection path or power loop.

Figure 19G:
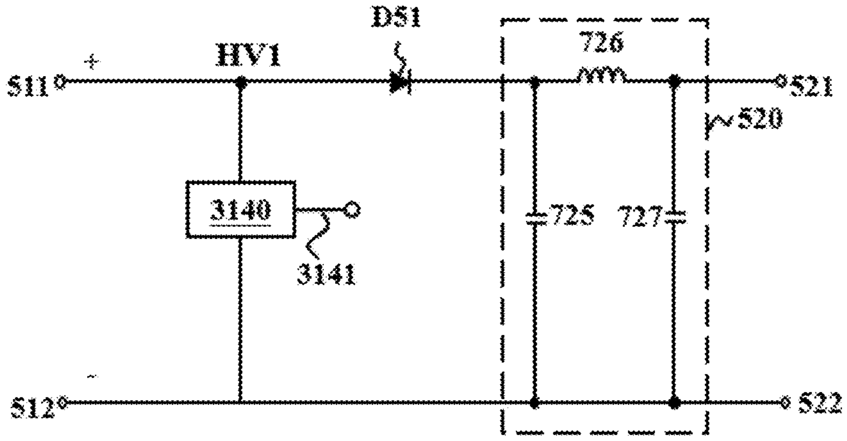
FIGS. 19G-19I are schematic circuit block diagrams of emergency control module in a circuit according to some exemplary embodiments.

Referring to FIG. 19G, FIG. 19G is a schematic circuit block diagrams of an emergency control module in a circuit according to some exemplary embodiments of the present disclosure. The emergency control module 3140 is electrically connected to the first rectifying output terminal 511 and the second rectifying output terminal 512 and is configured to detect the voltage signal HV1 at the rectifying output terminal. Through the voltage signal HV1, the emergency control module 3140 can determine whether the external driving signal currently received by the LED tube lamp is a DC signal. The anode of the diode D51 is connected to the first rectifying output terminal 511, and the cathode of the diode D51 is connected to the input of the filtering circuit (i.e., the connecting end of the capacitor 725 and the inductor 726). The emergency control module 3140 is electrically connected to the detection result latching circuit 3120 through the path 3141. The addition of the diode D51 can limit the current direction on the power loop, so that the voltage signal HV1 detected by the emergency control module 3140 is a rectified signal and is not affected by the capacitor in the filtering circuit. In some embodiments, the diode D51 can also be omitted. In the present embodiment, the first rectifying output terminal 511 is the positive output terminal of the rectifying circuit, and the second rectifying output terminal is the negative terminal of the rectifying circuit.

Figure 19H:
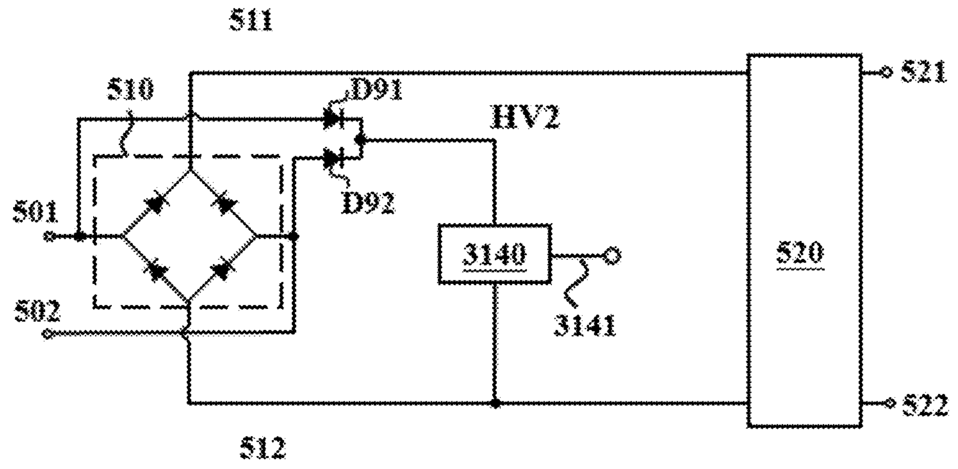

Please refer to FIG. 19H, FIG. 19H is a schematic circuit block diagrams of an emergency control module in a circuit according to some exemplary embodiments of the present disclosure. The present embodiment is similar to the embodiment described in FIG. 19G, except that the emergency control module 3140 detects the voltage signal HV2 before entering the rectifying circuit 510. By detecting the voltage signal HV2, the emergency control module 3140 can also be determined whether the external driving signal currently received by the LED tube lamp is a DC signal. The anode of the diode D91 is connected to the first pin 501, the anode of the diode D92 is connected to the second pin 502, the cathode of the diode D91 and the cathode of the diode D92 are electrically connected to the emergency control module 3140. The emergency control module 3140 is electrically connected to the second rectifying output terminal 512, and is connected to the detection result latching circuit 3120 through the path 3141. In the present embodiment, the first rectifying output terminal 511 is the positive output terminal of the rectifying circuit, and the second rectifying output terminal is the negative output terminal of the rectifying circuit.

Figure 19I:
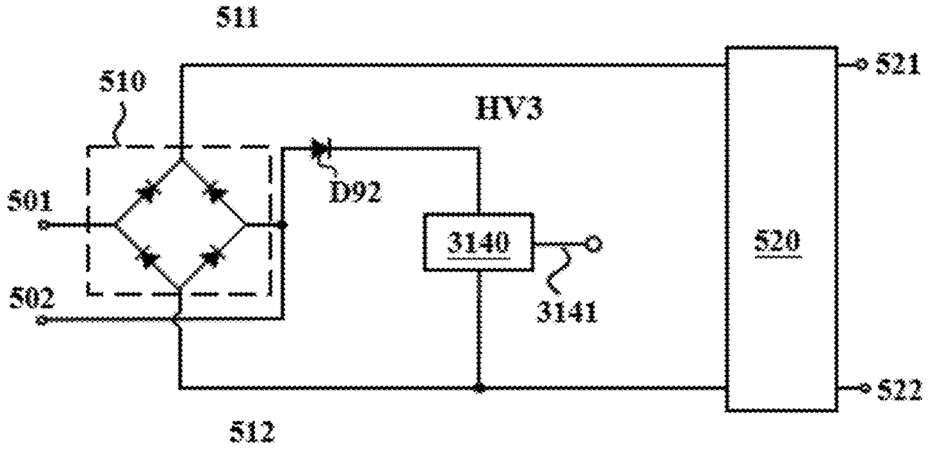

Referring to FIG. 19I, FIG. 19I is a schematic circuit block diagram of an emergency control module in a circuit according to some exemplary embodiments of the present disclosure. The present embodiment is similar to the embodiment described in FIG. 19H, except that the emergency control circuit 3140 in the present embodiment only detects the voltage signal before entering the rectifying circuit 510 through the diode D92. The anode of the diode D92 is connected to the second pin 502, and the cathode is connected to the emergency control module 3140. The emergency control module 3140 is electrically connected to the second rectifying output terminal 512, and is connected to the detection result latching circuit 3120 is connected through path 3141. In the present embodiment, the first rectifying output terminal 511 is the positive output terminal of the rectifying circuit, and the second rectifying output terminal is the negative output terminal of the rectifying circuit.

Figure 45B:
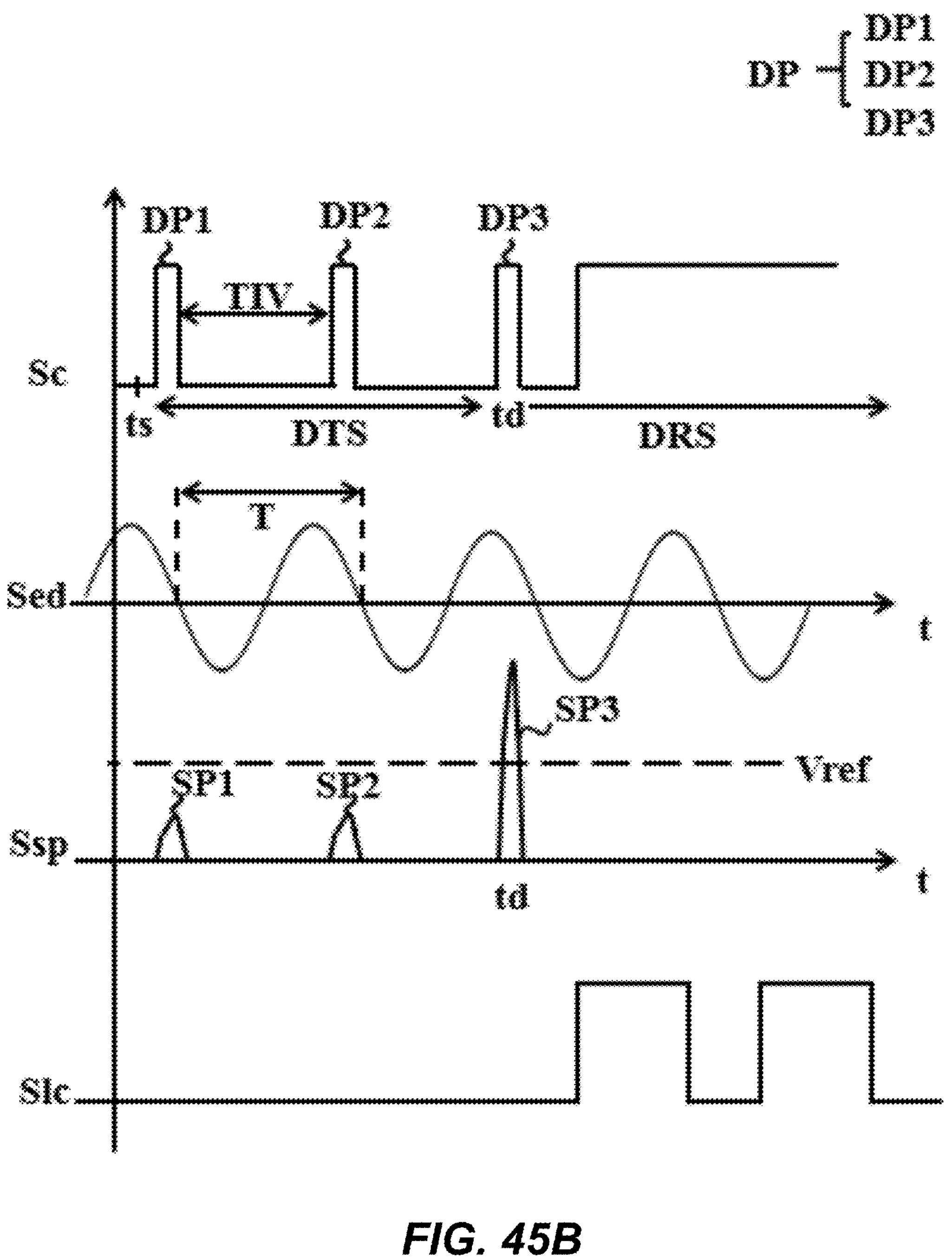
Figure 45C:
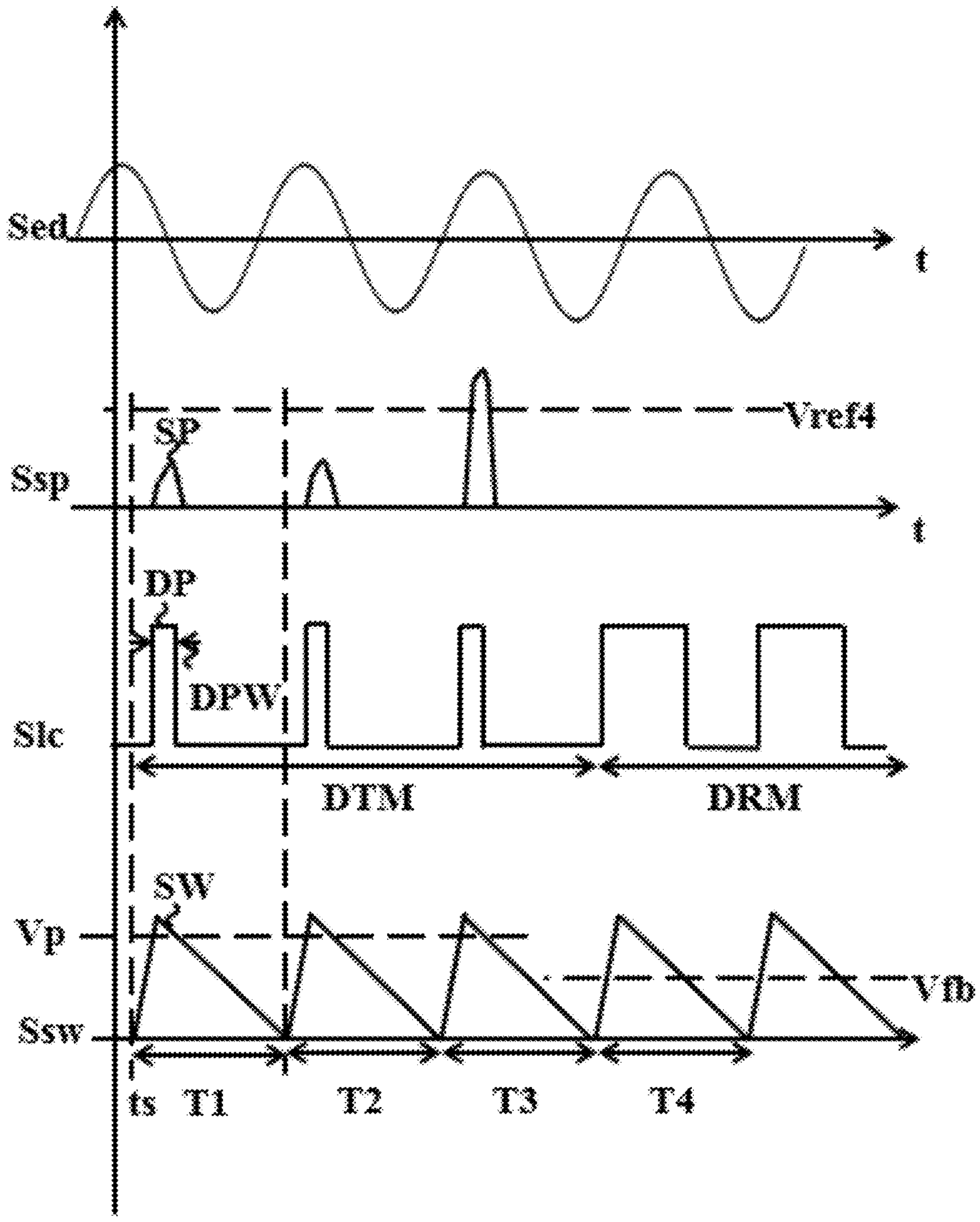
Figure 45D:
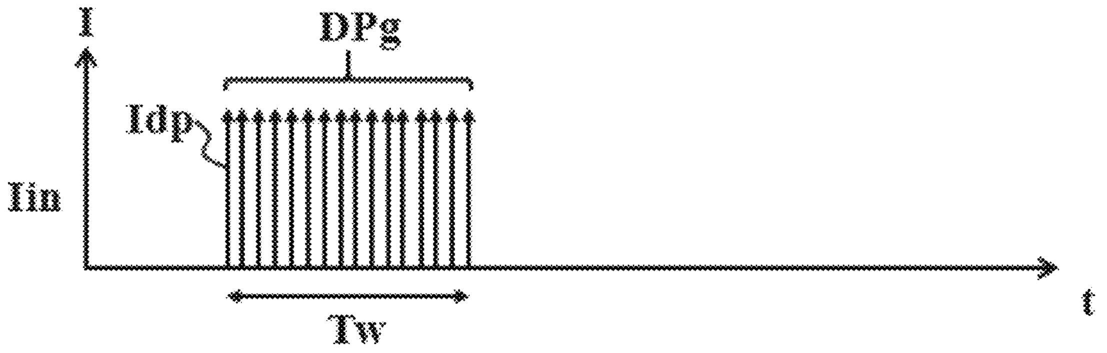
Figure 45E:
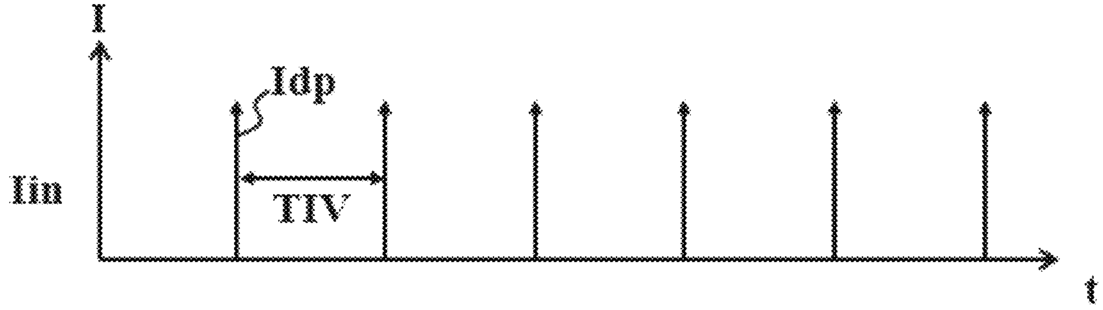
Figure 45F:
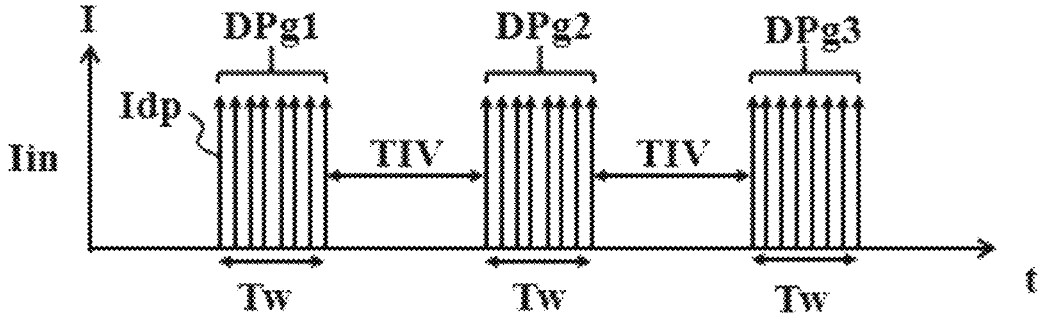
Figure 45G:
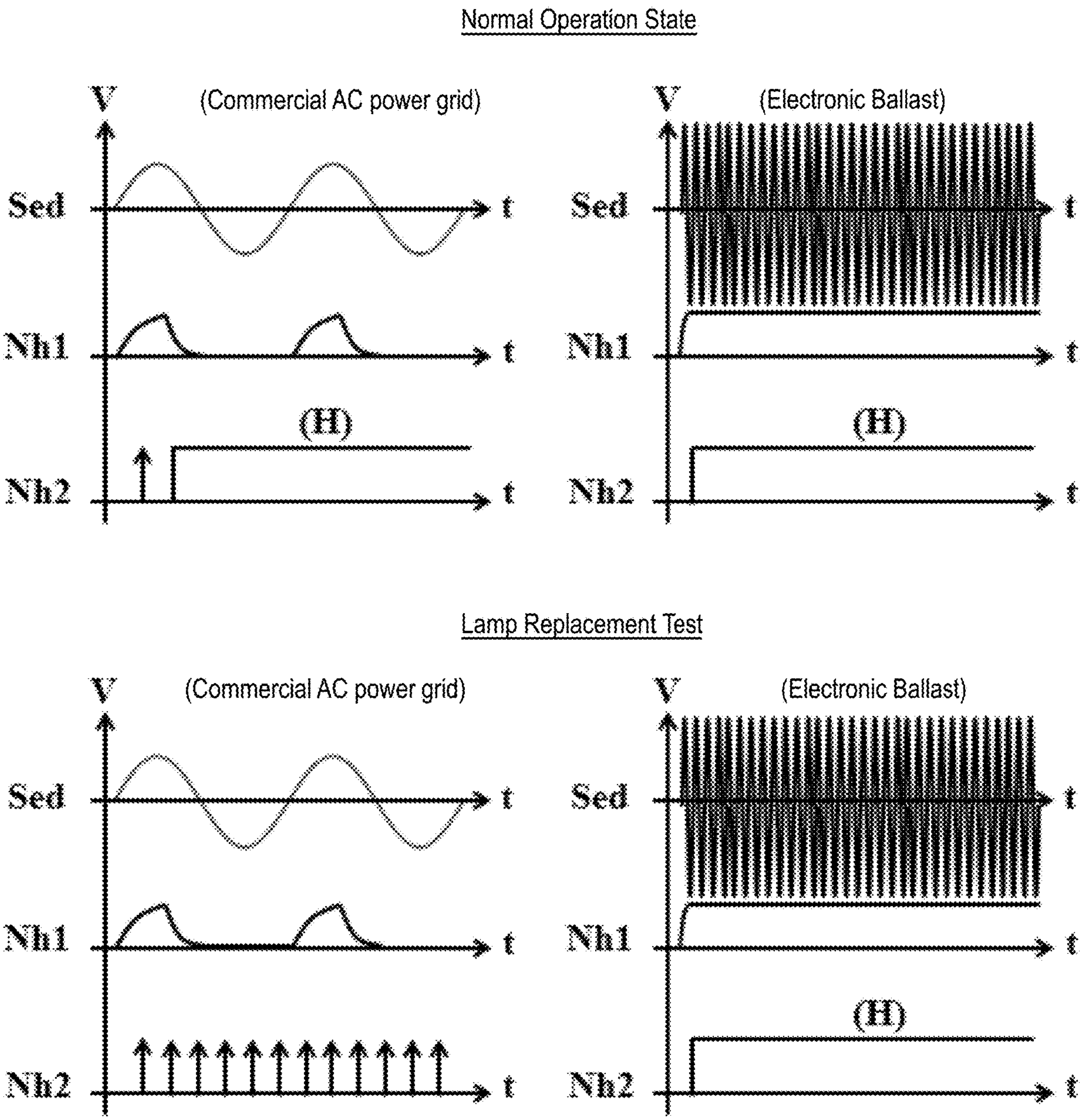
Figure 45H:
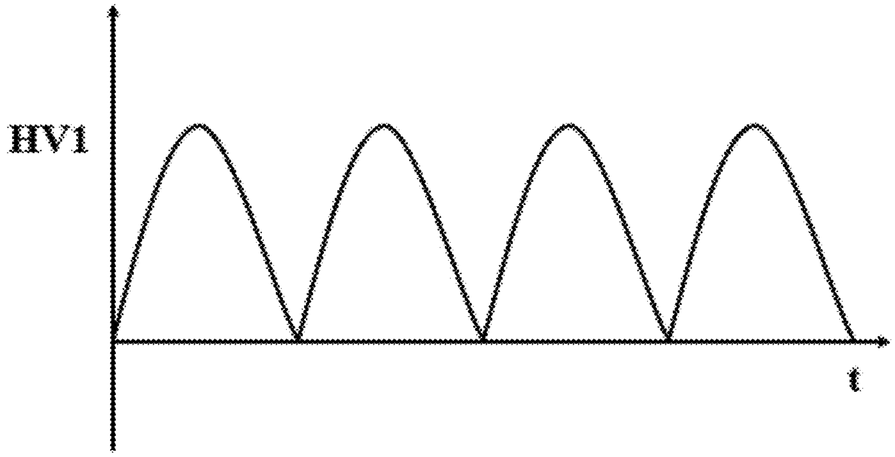
FIGS. 45H-45K are schematic signal waveform diagrams of bus signal according to some exemplary embodiments.
Figure 45I:
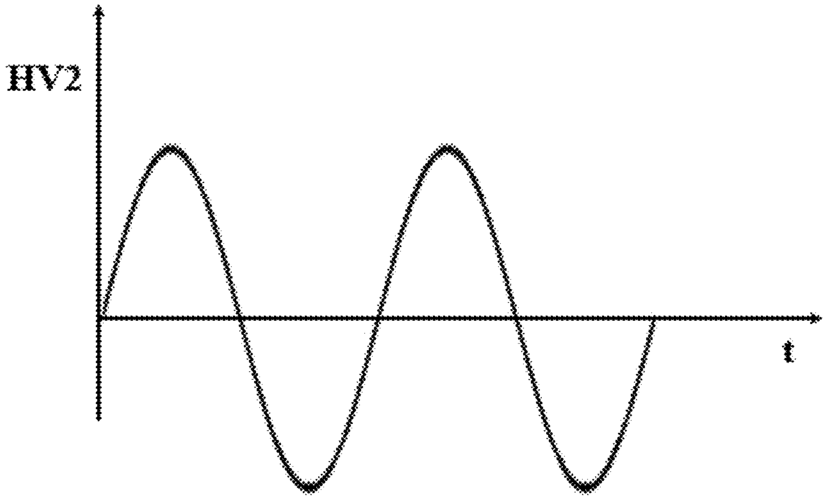
Figure 45J:
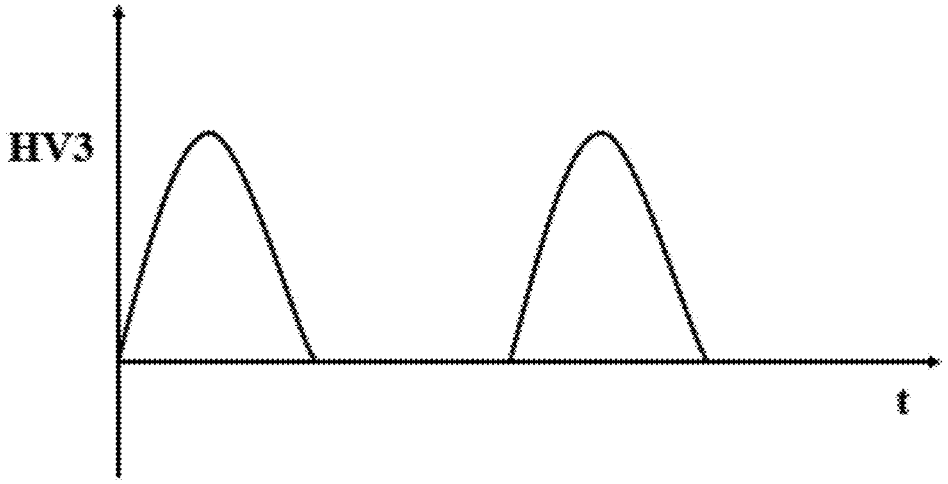
Figure 45K:
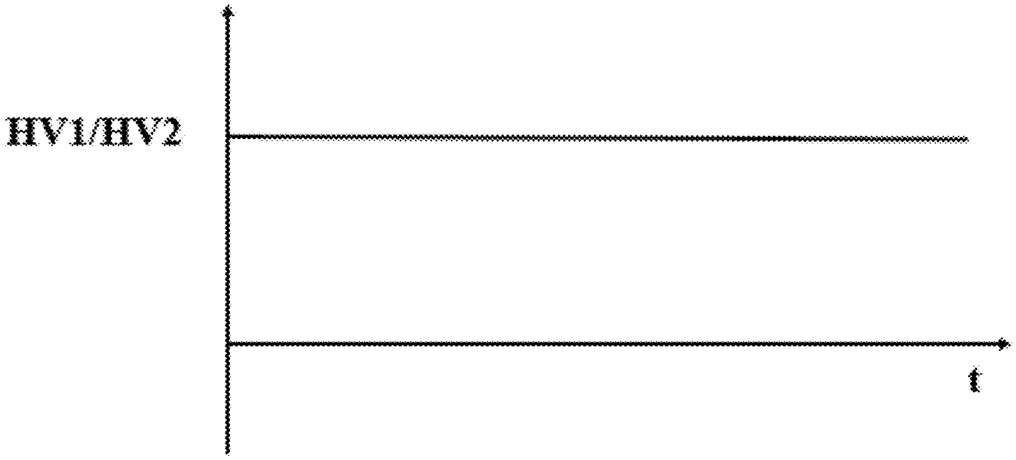

The following is an explanation of the principle of the emergency control module to determine whether the external driving signal is a DC signal with reference to FIGS. 19G-19I and FIGS. 45H-45K. When the external driving signal is an alternating current from mains power grid (i.e., the commercial AC power grid), FIG. 45H is the signal waveform diagram of the voltage signal HV1, FIG. 45I is the waveform diagram of the voltage signal HV2, and FIG. 45J is the waveform diagram of the voltage signal HV2. When the external driving signal is a DC signal (e.g., a DC signal supplied to the emergency ballast), FIG. 45K is a schematic waveform of the voltage signal HV1 or HV2. When the external driving signal is a DC signal, and the second pin 502 is connected to the negative terminal of the DC signal, the voltage signal HV3 received by the emergency control module 3140 is zero. That is, no voltage signal can be detected.

Figure 48C:
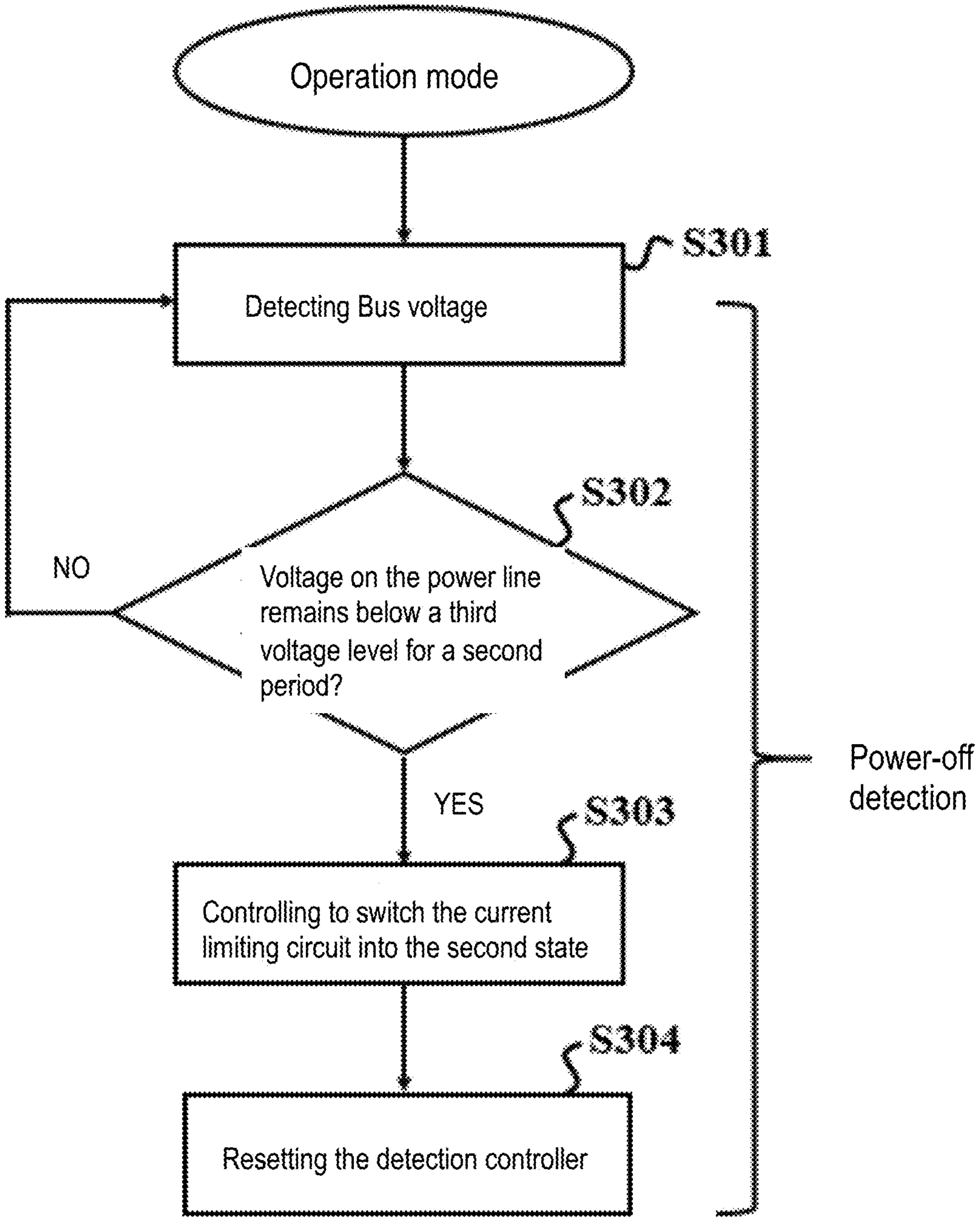
FIG. 48C is a flowchart of a power off detection method according to some exemplary embodiments.
Figure 48D:
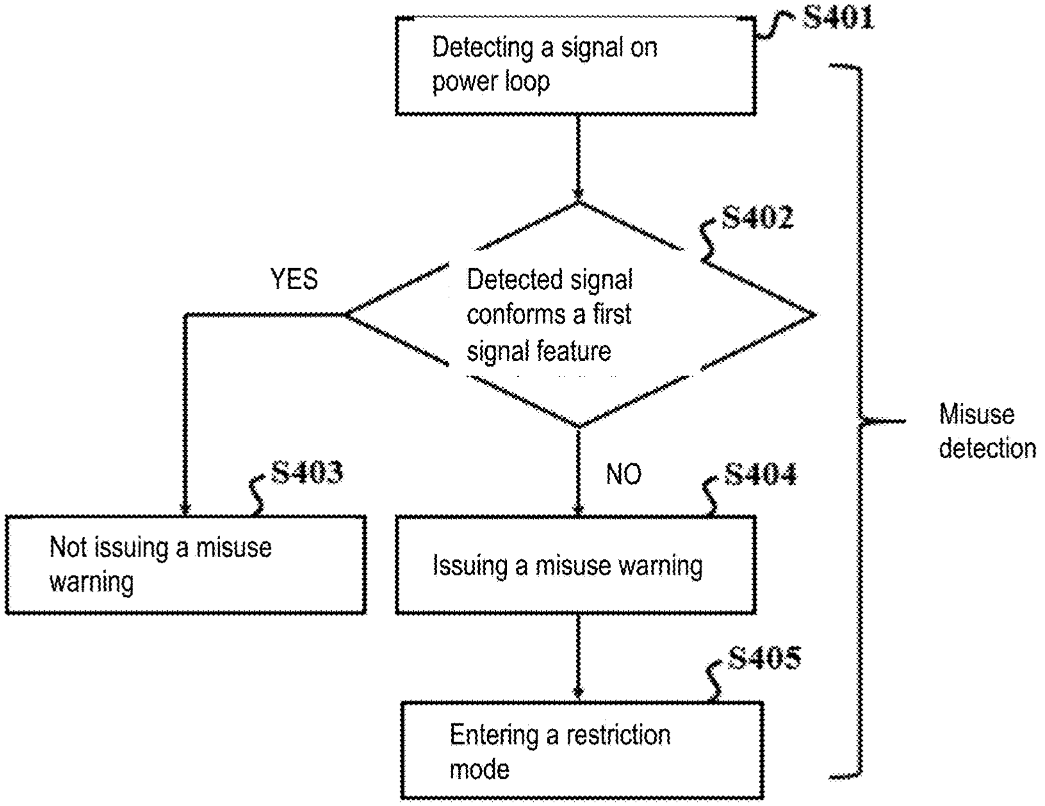
FIG. 48D is flowchart of steps of a method to control a misuse warning module according to some embodiments.
Figure 48E:
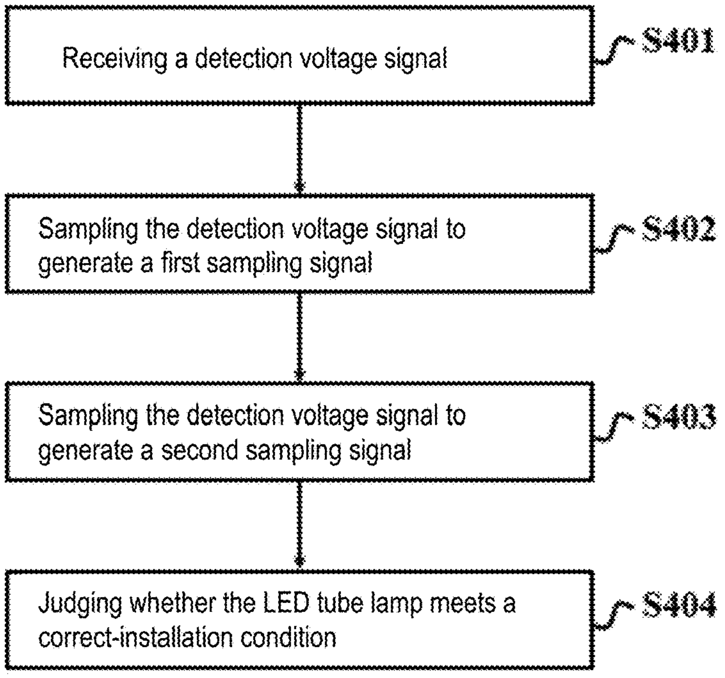
FIGS. 48E-48G are flowcharts of steps of a control method to an installation detection module according to some embodiments.
Figure 48F:
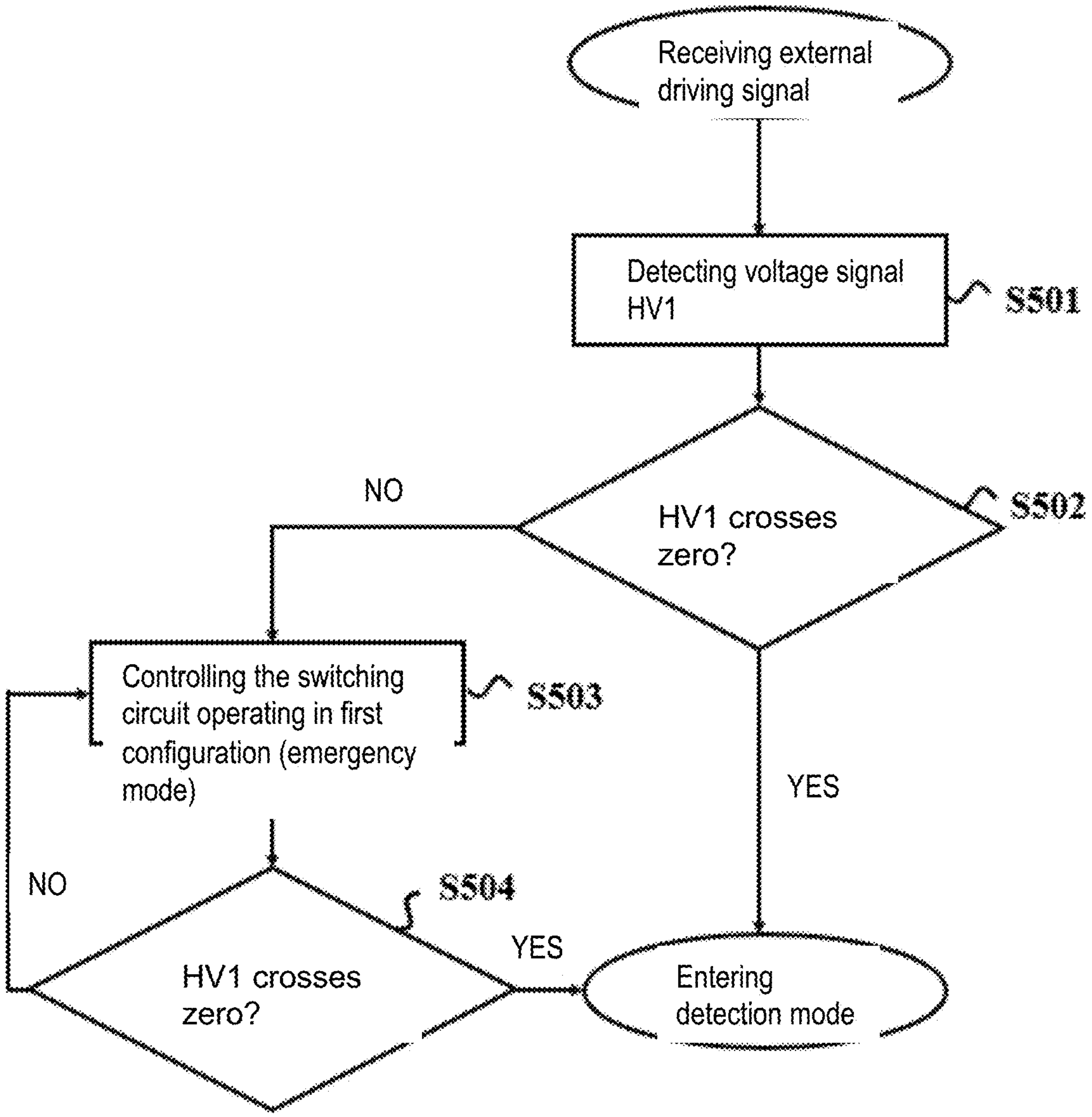

Referring to FIGS. 19G, 45H, 45K and 48F, where FIG. 48F is a flowchart of steps of a control method to an installation detection module according to some embodiments of the present disclosure. When the power supply module of the LED tube lamp receives an external driving signal, the emergency control module 3140 would first detect the obtained voltage signal HV1 (step S501) and determine whether the voltage signal HV1 crosses zero within a certain period of time (step S502). If the emergency control module 3140 determines 'yes' in step S502, the determination indicates that the external driving signal currently received is an AC signal. At this time, the installation detection module 3000*a* enters the detection mode. If the emergency control module 3140 determines 'no' in step S502, the determination indicates that the external driving signal currently received is a DC signal. At this time, the installation detection module 3000*a* enters an emergency mode, and the detection result latching circuit 3120 control switch circuit 3200*a* operates in a first configuration (step S503), wherein the first configuration can be, for example, a conduction state.

On the other hand, in the emergency mode, in addition to the maintain the switching circuit 320*a* in the first configuration, the emergency control module 3140 would further detect the voltage signal HV1 and determine whether the voltage signal HV1 has zero crossing. When the voltage signal HV1 is detected to cross zero (step S504), the emergency control module 3140 determines the external driving signal is switched from DC signal to AC signal. At this time, the emergency control module 3140 would control the installation detection module 3000*a* enter the detection mode. When it is determined that the voltage signal HV1 does not cross zero, the switching circuit 3200*a* continues to maintain in the first configuration.

In some embodiments, step S504 can be omitted, and the detection of the emergency control module is performed only when the LED tube lamp is powered on.

Similarly, the embodiments described in FIGS. 19H and 19I can also utilize the method of detecting a zero-crossing signal to determine whether the external driving signal is a DC signal, which will not be repeated herein.

Figure 48G:
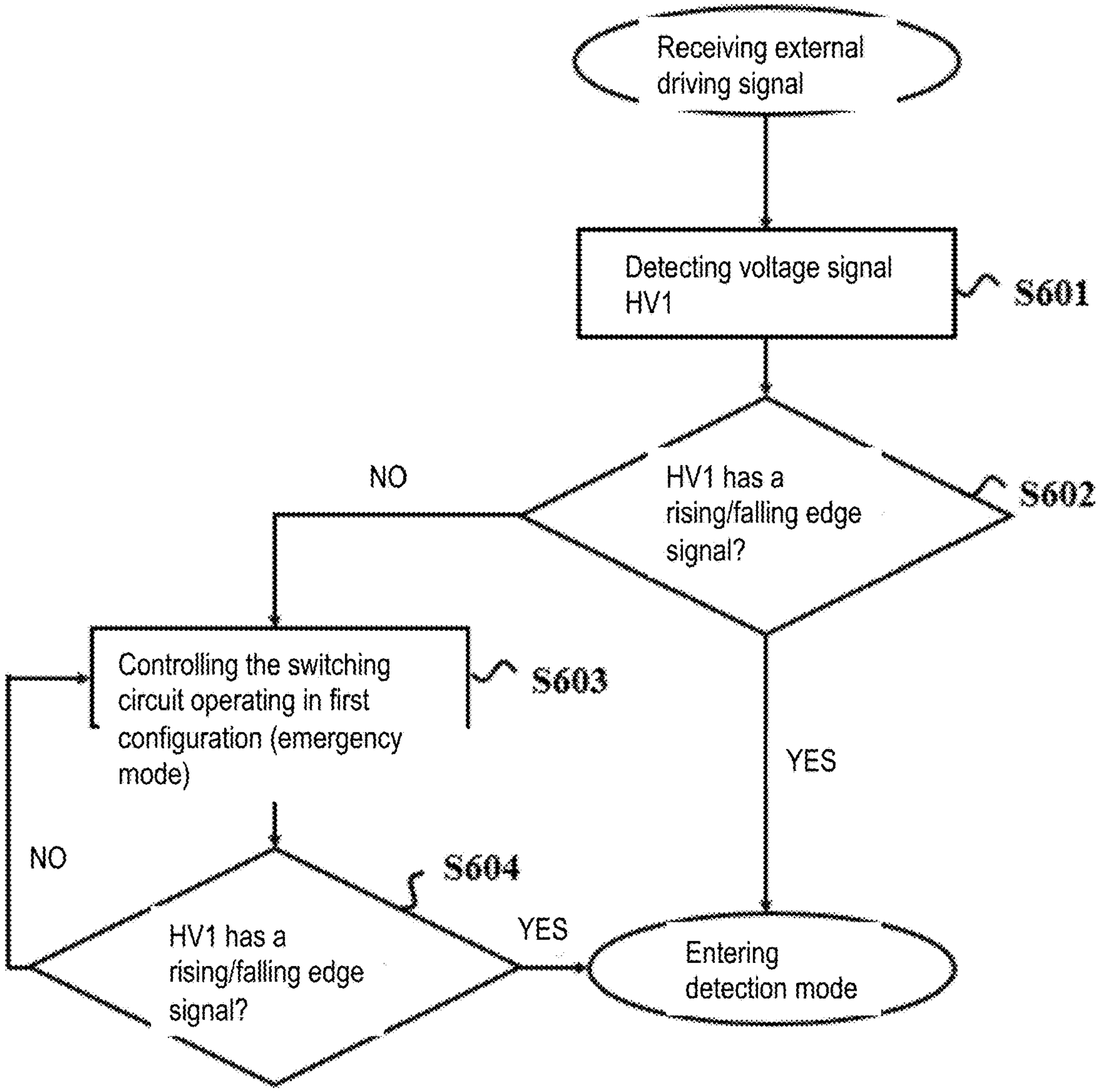

Referring to FIGS. 19G, 45H, 45K and 48G, where FIG. 48G is a flowchart of steps of a control method to an installation detection module according to some embodiments the present disclosure. When the power supply module of the LED tube lamp receives an external driving signal, the emergency control module 3140 would first detect the obtained voltage signal HV1 (step S601) and determine whether the voltage signal HV1 has a rising/falling edge signal within a certain period of time (step S602). If the emergency control module 3140 determines 'yes' in step S602, the determination indicates that the external driving signal currently received is an AC signal, and at this time, the installation detection module 3000*a* enters the detection mode. If the emergency control module 3140 determines 'no' in step S502, the determination indicates that the received external driving signal is a DC signal. At this time, the installation detection module 3000*a* enters the emergency mode, and the detection result latching circuit 3120 would control the switching circuit 3200*a* to be operated in the first configuration (step S603), wherein the first configuration can be, for example, a conduction state.

On the other hand, in the emergency mode, in addition to the maintain the switching circuit 3200*a* in the first configuration, the emergency control module 3140 would further detect the voltage signal HV1 and determine whether the voltage signal HV1 has a rising/falling edge. When the voltage signal HV1 is determined to have a rising/falling edge (step S604), the emergency control module 3140 determines that the external driving signal is switched from DC signal to AC signal and at this time, the emergency control module 3140 would control the installation detection module 3000*a* enter the detection mode. When it is determined that the voltage signal HV1 has no rising/falling edge, the switching circuit 3200*a* continues to be maintained in the first configuration.

In some embodiments, step S604 can be omitted, and the detection of the emergency control module may be performed only when the LED tube lamp is powered on.

Similarly, the embodiments described in FIGS. 19H and 19I can also use the voltage signal with rising/falling edge method to determine whether the external driving signal is a DC signal, which will not be repeated herein.

Through the circuit structure described in the embodiments of FIGS. 19G-19I, the emergency control module controls the installation detection module operate in different states by detecting whether the external driving signal is a DC signal. Furthermore, when the external driving signal is the DC signal provided by the emergency ballast, this DC signal is the driving signal obtained by boosting the voltage signal from batteries. There will be no risk of electric shock if one of the outputs of the driving signal contacts human bodies. In addition, since this DC voltage signal is generally lower than the voltage provided by the mains power grid, ff the installation detection function of the LED tube lamp is equipped, the installation detection module might not work properly and the LED tube lamp might not be lit normally. Therefore, when the external driving signal is the AC signal from mains power grid, the installation detection module may work normally and the installation detection is carried out properly. When the external driving signal is a DC signal, the installation detection module 3000*a* can skip the detection state and directly control the switching circuit 3200*a* to be the conduction state.

Figure 20A:
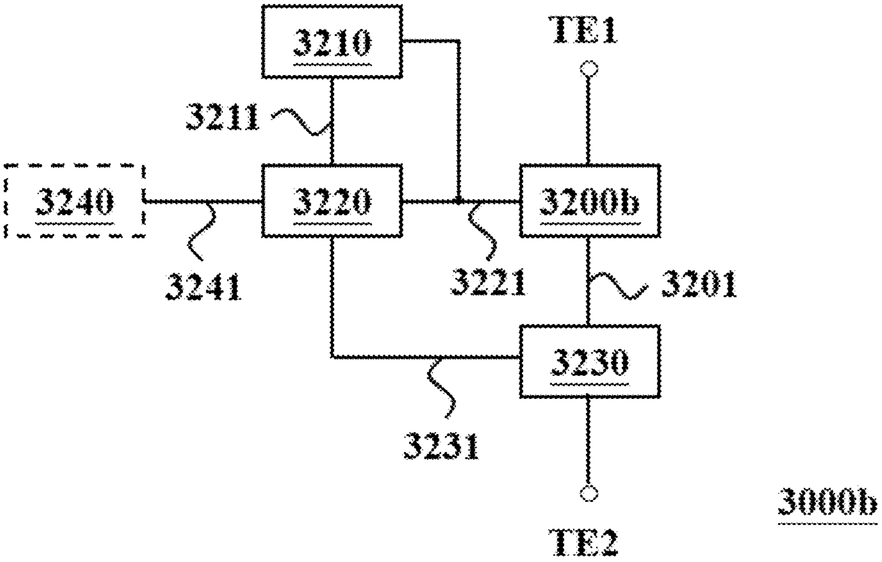
FIG. 20A is a block diagram of an installation detection module according to some exemplary embodiments.
Figure 20B:
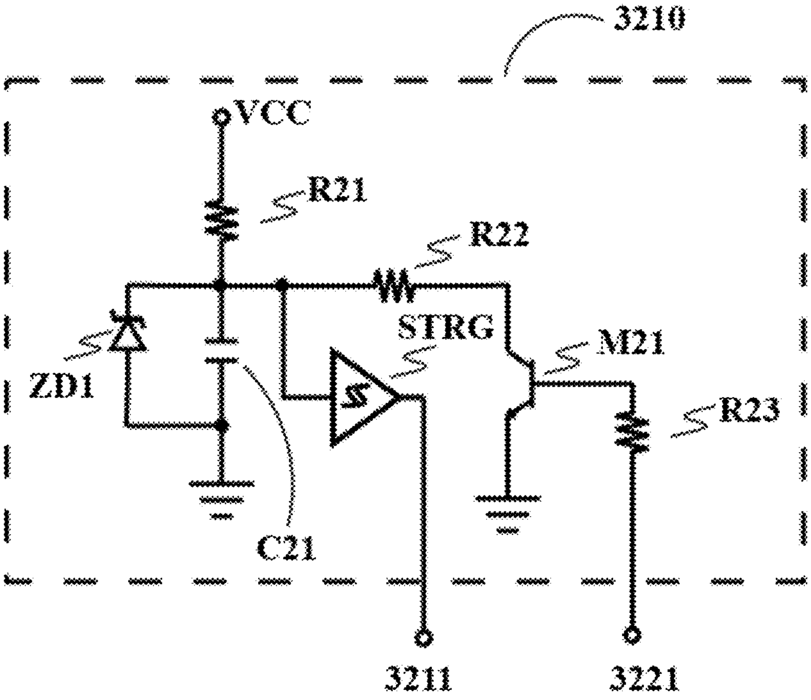
FIGS. 20B-20E are schematic circuit diagrams of an installation detection module according to some exemplary embodiments.

Referring to FIG. 20A, an installation detection module according to an exemplary embodiment is illustrated. The installation detection module 3000*b* includes a detection pulse generating module 3210, a detection result latching circuit 3220, a switch circuit 3200*b*, and a detection determining circuit 3230.

FIG. 45B is a signal waveform diagram of an exemplary power supply module according to an exemplary embodiment. The installation detection operation is described further in accordance with FIG. 45B. The detection pulse generating module 3210 is coupled (e.g., electrically connected) to the detection result latching circuit 3220 via a path 3211 and is configured to generate a control signal Sc having at least one pulse signal DR. A path as described herein may include a conductive line connecting between two components, circuits, or modules, and may include opposite ends of the conductive line connected to the respective components, circuits or modules. The detection result latching circuit 3220 is coupled (e.g., electrically connected) to the switch circuit 3200*b* via a path 3221 and is configured to receive and output the control signal Sc from the detection pulse generating module 3210. The switch circuit 3200*b* is coupled (e.g., electrically connected) to one end (e.g., a first installation detection terminal TE1) of a power loop of an LED tube lamp and the detection determining circuit 3230, and is configured to receive the control signal Sc output from the detection result latching circuit 3220, and configured to conduct (or turn on) during the control signal Scso as to cause the power loop of the LED tube lamp to be conducting. The detection determining circuit 3230 is coupled (e.g., electrically connected) to the switch circuit 3200*b*, the other end (e.g., a second installation detection terminal TE2) of the power loop of the LED tube lamp and the detection result latching circuit 3220, and is configured to detect at least one sample signal Ssp on the power loop when the switch circuit 3200*b* and the power loop are conductive, so as to determine an installation state between the LED tube lamp and a lamp socket. The power loop of the present embodiment can be regarded as a detection path of the installation detection module. The detection determining circuit 3230 is further configured to transmit detection result(s) to the detection result latching circuit 3220 for next control. In some embodiments, the detection pulse generating module 3210 is further coupled (e.g., electrically connected) to the output of the detection result latching circuit 3220 to control the time of the pulse signal DP.

In some embodiments, a detection pulse generating module 3210 is configured to generate a control signal Sc through a detection result latching circuit 3220, in order to cause a switch circuit 3200*b* to operate in a conducting state during a pulse. Meanwhile, a power loop of the LED tube lamp between installation detection terminals TE1 and TE2 is also in a conducting state. Then, a detection determining circuit 3230 detects a sample signal on the power loop, and based on the detected sample signal informs the detection result latching circuit 3220 of a timing to latch the detected sample signal. For example, the detection determining circuit 3230 can be a circuit capable of controlling an output level of a latch circuit, wherein the output level for the latch circuit corresponds to a conducting or cutoff state of the LED tube lamp. The detection result latching circuit 3220 stores a detection result based on the sample signal Ssp (or the sample signal Ssp and the pulse signal DP) and transmits or provides the detection result for the switch circuit 3200*b*. Upon the switch circuit 3200*b* receiving the detection result transmitted by the detection result latching circuit 3220, the switch circuit 3200*b* controls a conducting state between the installation detection terminals TE1 and TE2 according to the detection result.

In some embodiments, the installation detection module 3000*b* further includes an emergency control module 3240. Configuration and operation of the emergency control module 3240 are similar to those of the emergency control module 3140 in the embodiments described above, thus can be understood by referencing the above description of the emergency control module 3140 and are not described here again.

In some embodiments, the detection pulse generating module 3210, the detection determining circuit 3230, the detection result latching circuit 3220, and the switch circuit 3200*b* in the installation detection module 3000*b*, can be respectively implemented by the circuit structures of FIGS. 20B to 20E, but are not limited thereto, wherein FIGS. 20B to 20E are circuit structure diagrams of the installation detection module according to some embodiments. Respective modules/units of the installation detection module are described as follows.

Referring to FIG. 20B, a detection pulse generating module according to an exemplary embodiment is illustrated. The detection pulse generating module 3210 includes: a resistor R21 (which also may be referred to as a sixth resistor), a capacitor C21 (which also may be referred to as a fourth capacitor), a Schmitt trigger STRG, a resistor R22 (which also may be referred to as a seventh resistor), a transistor M21 (which also may be referred to as a second transistor), and a resistor R23 (which also may be referred to as an eighth resistor). In some embodiments, one end of the resistor R21 is connected to a driving signal, for example, VCC, and the other end of the resistor R21 is connected to one end of the capacitor C21. The other end of the capacitor C21 is connected to a ground node. In some embodiments, the Schmitt trigger STRG has an input end and an output end, the input end connected to a connection node of the resistor R21 and the capacitor C21, the output end connected to the detection result latching circuit 3220 via the third path 3211 (FIG. 20A). In some embodiments, one end of the resistor R22 is connected to the connection node of the resistor R21 and the capacitor C21 and the other end of the resistor R22 is connected to a collector of the transistor M21. An emitter of the transistor M21 is connected to a ground node. In some embodiments, one end of the resistor R23 is connected to a base of the transistor M21 and the other end of the resistor R23 is connected to the detection result latching circuit 3220 (FIG. 20A) and the switch circuit 3200*b* (FIG. 20A) via the fourth path 3221. In certain embodiments, the detection pulse generating module 3210 further includes: a Zener diode ZD1, having an anode and a cathode, the anode connected to the other end of the capacitor C21 to the ground, the cathode connected to the end of the capacitor C21 (the connection node of the resistor R21 and the capacitor C21). The detection pulse generating modules 3110 and 3210 in the embodiments of FIG. 19B and FIG. 20B are merely examples, and in practice specific operations of a detection pulse generating circuit may be performed based on configured functional modules in an embodiment of FIG. 40, and thus will be described in detail below with reference to FIG. 40.

Figure 20C:
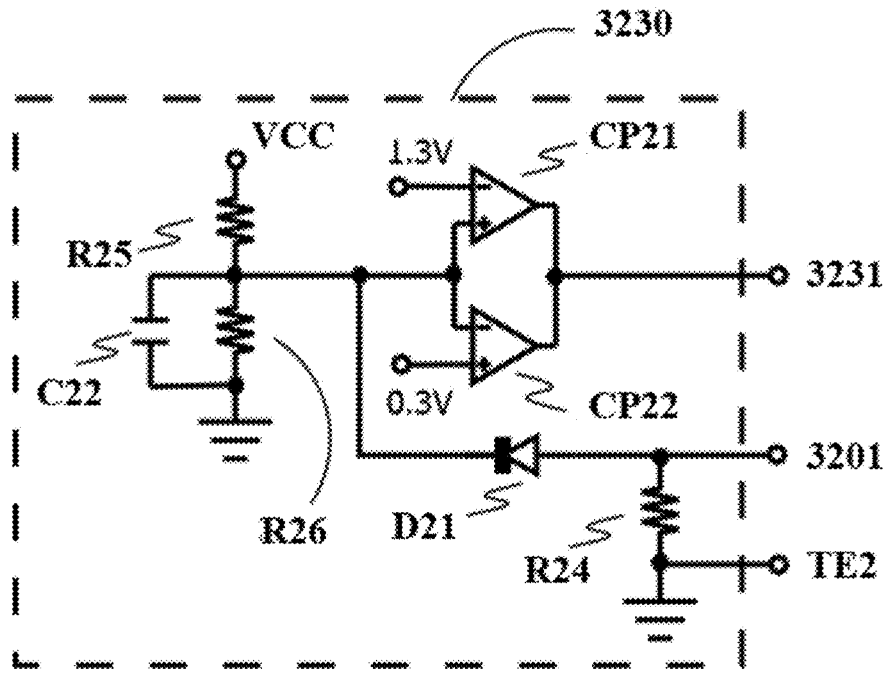

FIG. 20C is circuit structure diagram of a detection determining circuit of an installation detection module according to an exemplary embodiment. Referring to FIG. 20C, the detection determining circuit 3230 includes: a resistor R24 (also referred to as a ninth resistor), having one end connected to the emitter of the transistor M22, and the other end connected to another end of the LED power loop (such as a second installation detection terminal TE2); a diode D21 (also referred to as a second diode), having an anode and a cathode, the anode being connected to an end of the resistor R24; a comparator CP21 (also referred to as a second comparator), having a first input end, a second input end, and an output end, wherein the first input end is connected to a set signal such as a reference voltage Vref of for example, 1.3V, the second input end is connected to the cathode of the diode D21, and the output end is connected to a clock input end (CLK) of a D flip-flop DFF; a comparator CP22 (also referred to as a third comparator), having a first input end, a second input end, and an output end, wherein the first input end is connected to the cathode of the diode D21, the second input end is to be connected to another set signal such as a reference voltage Vref of for example 0.3V, and the output end is connected to the clock input end (CLK) of the D flip-flop DFF; a resistor R25 (also referred to as a tenth resistor) having an end connected to a driving voltage VCC; a resistor R26 (also referred to as an eleventh resistor) having an end connected to another end of the resistor R25 and the second input end of the comparator CP21, and having another end grounded; and a capacitor C22 (also referred to as a fifth capacitor) connected in parallel with the resistor R26. In some embodiments, the diode D21, comparator CP22, resistors R25 and R26, and capacitor C22 can be omitted, and when the diode D21 is omitted, the second input end of the comparator CP21 can be directly connected to an end of the resistor R24. In some embodiments, based on considerations of power factor, the resistor R24 may comprise two resistors connected in parallel and have an equivalent resistance of 0.1-5 ohms.

Figure 20D:
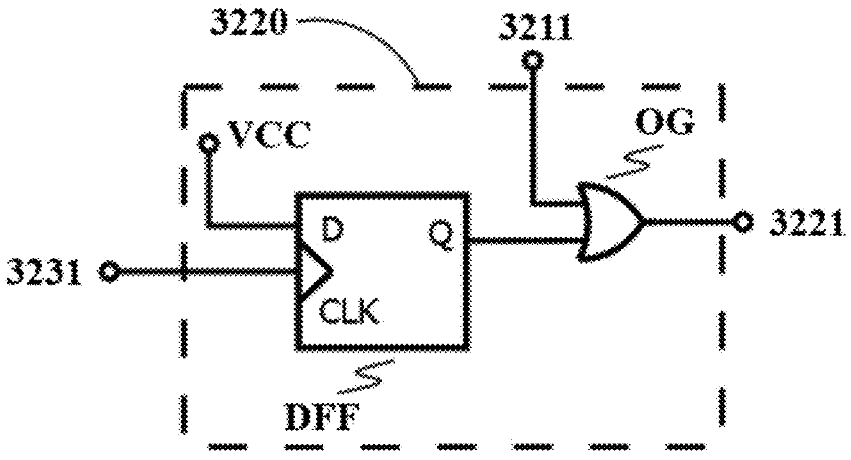

Referring to FIG. 20D, a detection result latching circuit according to an exemplary embodiment is illustrated. The detection result latching circuit 3220 includes: a D flip-flop DFF (which also may be referred to as a second D flip-flop), having a data input end D, a clock input end CLK, and an output end Q, the data input end D connected to the driving signal mentioned above (e.g., VCC), the clock input end CLK connected to the detection determining circuit 3230 (FIG. 13C); and an OR gate OG (which also may be referred to as a third OR gate), having a first input end, a second input end, and an output end, the first input end connected to the output end of the Schmitt trigger STRG (FIG. 20B), the second input end connected to the output end Q of the D flip-flop DFF, the output end of the OR gate OG connected to the other end of the resistor R23 (FIG. 20B) and the switch circuit 3200*b* (FIG. 20A).

Figure 20E:
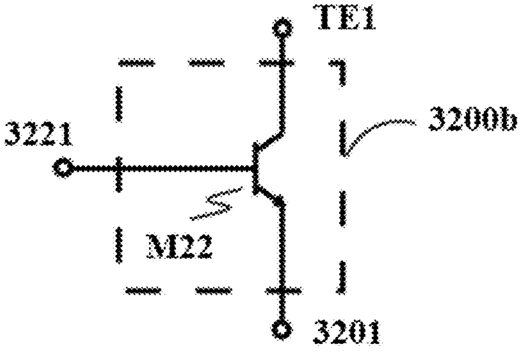

Referring to FIG. 20E, a switch circuit according to an exemplary embodiment is illustrated. The switch circuit 3200*b* includes: a transistor M22 (which also may be referred to as a third transistor), having a base, a collector, and an emitter, the base connected to the output of the OR gate OG via the fourth path 3221 (FIG. 20D), the collector connected to one end of the power loop, such as the first installation detection terminal TE1, the emitter connected to the detection determining circuit 3230 (FIG. 20A). In some embodiments, the transistor M22 may be replaced by other equivalently electronic parts, e.g., a MOSFET.

In some embodiments, some parts of the installation detection module may be integrated into an integrated circuit (IC) in order to provide reduced circuit layout space resulting in reduced manufacturing cost of the circuit. For example, the Schmitt trigger STRG of the detection pulse generating module 3210, the detection result latching circuit 3220, and the two comparators CP21 and CP22 of the detection determining circuit 3230 may be integrated into an IC, but the disclosure is not limited thereto.

An operation of the installation detection module will be described in more detail according to some example embodiments. In one exemplary embodiment, the capacitor voltage may not mutate; the voltage of the capacitor in the power loop of the LED tube lamp before the power loop is conductive is zero and the capacitor's transient response may appear to have a short-circuit condition; when the LED tube lamp is correctly installed to the lamp socket, the power loop of the LED tube lamp in a transient response may have a smaller current-limiting resistance and a bigger peak current; and when the LED tube lamp is incorrectly installed to the lamp socket, the power loop of the LED tube lamp in transient response may have a bigger current-limiting resistance and a smaller peak current. This embodiment may also meet the UL standard to make the leakage current of the LED tube lamp less than 5 MIU (Measurement Indication Unit), in which the unit "MIU" is defined by. The following table illustrates the current comparison in a case when the LED tube lamp works normally (e.g., when the two end caps of the LED tube lamp are correctly installed to the lamp socket) and in a case when the LED tube lamp is incorrectly installed to the lamp socket (e.g., when one end cap of the LED tube lamp is installed to the lamp socket but the other one is touched by a human body).

| | Correct installation | Incorrect installation |
|---|---|---|
| Maximum transient current | | $i_{pk\_max} = \frac{V_{in\_pk}}{R_{fuse} + 500} = \frac{305 \times 1.414}{10 + 500} = 845\ \text{mA}$ |
| Minimum transient current | $i_{pk\_min} = \frac{\Delta V_{in}}{R_{fuse}} = \frac{50}{10} = 5\ \text{A}$ | |

As illustrated in the above table, in the part of the denominator: Rfuse represents the resistance of the fuse of the LED tube lamp. For example, 10 ohms may be used, but the disclosure is not limited thereto, as resistance value for Rfuse in calculating the minimum transient current ipk_min and 510 ohm may be used as resistance value for Rfuse in calculating the maximum transient current ipk_max (an additional 500 ohms is used to emulate the conductive resistance of human body in transient response). In the part of the numerator: maximum voltage from the root-mean-square voltage (Vmax=Vrms*1.414=305*1.414) is used in calculating the maximum transient current ipk_max and minimum voltage difference, for example, 50V (but the disclosure is not limited thereto) is used in calculating the minimum transient current ipk_min. Accordingly, when the LED tube lamp is correctly installed to the lamp socket (e.g., when two end caps of the LED tube lamp are installed to the lamp socket correctly) and works normally, its minimum transient current is 5 A. But, when the LED tube lamp is incorrectly installed to the lamp socket (e.g., when one end cap is installed to the lamp socket but the other one is touched by human body), its maximum transient current is only 845 mA. Therefore, certain examples of the disclosed embodiments use the current which passes transient response and flows through the capacitor in the LED power loop, such as the capacitor of the filtering circuit, to detect and determine the installation state between the LED tube lamp and the lamp socket. For example, such embodiments may detect whether the LED tube lamp is correctly installed to the lamp socket. Certain examples of the disclosed embodiments further provide a protection mechanism to protect the user from electric shock caused by touching the conductive part of the LED tube lamp which is incorrectly installed to the lamp socket. The embodiments mentioned above are used to illustrate certain aspects of the disclosed disclosure but the disclosure is not limited thereto.

Further, referring to FIG. 20A again, in some embodiments, when an LED tube lamp is being installed to a lamp socket, after a period (e.g., the period utilized to determine the cycle of a pulse signal), the detection pulse generating module 3210 outputs a first high level voltage rising from a first low level voltage to the detection result latching circuit 3220 through a path 3211 (also referred to as a third path). The detection result latching circuit 3220 receives the first high level voltage, and then simultaneously outputs a second high level voltage to the switch circuit 3200*b* and the detection pulse generating module 3210 through a path 3221 (also referred to as a fourth path). In some embodiments, when the switch circuit 3200*b* receives the second high level voltage, the switch circuit 3200*b* conducts to cause the power loop of the LED tube lamp to be conducting as well. In this exemplary embodiment, the power loop at least includes the first installation detection terminal TE1, the switch circuit 3200*b*, the path 3201 (also referred to as a first path), the detection determining circuit 3230, and the second installation detection terminal TE2. In the meantime, the detection pulse generating module 3210 receives the second high level voltage from the detection result latching circuit 3220, and after a period (e.g., the period utilized to determine the width (or period) of pulse signal), its output from the first high level voltage falls back to the first low level voltage (the first time of the first low level voltage, the first high level voltage, and the second time of the first low level voltage form a first pulse signal DP1). In some embodiments, when the power loop of the LED tube lamp is conductive, the detection determining circuit 3230 detects a first sample signal, such as a voltage signal, on the power loop. When the first sample signal is greater than or equal to a predefined signal, such as a reference voltage, the installation detection module determines that the LED tube lamp is correctly installed to the lamp socket according to the application principle of this disclosed embodiments described above. Therefore, the detection determining circuit 3230 included in the installation detection module outputs a third high level voltage (also referred to as a first high level signal) to the detection result latching circuit 3220 through a path 3231 (also referred to as a second path). The detection result latching circuit 3220 receives the third high level voltage (also referred to as the first high level signal) and continues to output a second high level voltage (also referred to as a second high level signal) to the switch circuit 3200*b*. The switch circuit 3200*b* receives the second high level voltage (also referred to as the second high level signal) and maintains conducting state to cause the power loop to remain conducting. The detection pulse generating module 3210 does not generate any pulse signal while the power loop remains conductive.

However, in some embodiments, when the first sample signal is smaller than the predefined signal, the installation detection module, according to certain exemplary embodiments as described above, determines that the LED tube lamp has not been correctly installed to the lamp socket. Therefore, the detection determining circuit 3230 outputs a third low level voltage (also referred to as a first low level signal) to the detection result latching circuit 3220. The detection result latching circuit 3220 receives the third low level voltage (also referred to as the first low level signal) and continues to output a second low level voltage (also referred to as a second low level signal) to the switch circuit 3200*b*. The switch circuit 3200*b* receives the second low level voltage (also referred to as the second low level signal) and then keeps blocking to cause the power loop to remain open. Accordingly, the occurrence of electric shock caused by touching the conductive part of the LED tube lamp which is incorrectly installed in the lamp socket can be sufficiently avoided.

In some embodiments, when the power loop of the LED tube lamp remains open for a period (a period that represents the width (or period) of pulse signal DP or the pulse-on period of the control signal Sc), the detection pulse generating module 3210 outputs the first high level voltage rising from the first low level voltage to the detection result latching circuit 3220 through the path 3211 once more. The detection result latching circuit 3220 receives the first high level voltage, and then simultaneously outputs a second high level voltage to the switch circuit 3200*b* and the detection pulse generating module 3210. In some embodiments, when the switch circuit 3200*b* receives the second high level voltage, the switch circuit 3200*b* conducts again to cause the power loop of the LED tube lamp (in this exemplary embodiment, the power loop at least includes the first installation detection terminal TE1, the switch circuit 3200*b*, the path 3201, the detection determining circuit 3230, and the second installation detection terminal TE2) to be conducting as well. In the meantime, the detection pulse generating module 3210 receives the second high level voltage from the detection result latching circuit 3220, and after a period (a period that is utilized to determine the width (or period) of pulse signal DP), its output from the first high level voltage falls back to the first low level voltage (the third time of the first low level voltage, the second time of the first high level voltage, and the fourth time of the first low level voltage form a second pulse signal DP2). In some embodiments, when the power loop of the LED tube lamp is conductive again, the detection determining circuit 3230 also detects a second sample signal SP2, such as a voltage signal, on the power loop yet again. When the second sample signal SP2 is greater than or equal to the predefined signal (e.g., the reference voltage Vref), the installation detection module determines, according to certain exemplary embodiments described above, that the LED tube lamp is correctly installed to the lamp socket. Therefore, the detection determining circuit 3230 outputs a third high level voltage (also referred to as a first high level signal) to the detection result latching circuit 3220 through the path 3231. The detection result latching circuit 3220 receives the third high level voltage (also referred to as the first high level signal) and continues to output a second high level voltage (also referred to as a second high level signal) to the switch circuit 3200*b*. The switch circuit 3200*b* receives the second high level voltage (also referred to as the second high level signal) and maintains a conducting state to cause the power loop to remain conducting. The detection pulse generating module 3210 does not generate any pulse signal while the power loop remains conductive.

In some embodiments, when the second sample signal SP2 is smaller than the predefined signal, the installation detection module determines, according to certain exemplary embodiments described above, that the LED tube lamp has not been correctly installed to the lamp socket. Therefore, the detection determining circuit 3230 outputs the third low level voltage (also referred to as the first low level signal) to the detection result latching circuit 3220. The detection result latching circuit 3220 receives the third low level voltage (also referred to as the first low level signal) and continues to output the second low level voltage (also referred to as the second low level signal) to the switch circuit 3200*b*. The switch circuit 3200*b* receives the second low level voltage (also referred to as the second low level signal) and then keeps blocking to cause the power loop to remain open.

According to the embodiments of FIG. 45B, since the signal level of the first sample signal SP1 generated based on the first pulse signal DP1 and the second sample signal SP2 generated based on the second pulse signal DP2 are smaller than the reference voltage Vref, the switch circuit 3200*b* is maintained to be cut off and the driving circuit (not shown) does not perform effective power conversion during the timepoint is to td (i.e., the detection mode DTM). The effective power conversion refers to generating sufficient power for driving the LED module to emit light. The detection determining circuit 3230 generates a detection result, indicating the LED tube lamp has been correctly installed or is not touched by a user, according to the third sample signal SP3 greater than the reference voltage Vref during the pulse-on period of the third pulse signal DP3, so that the switch circuit 3200*b* is maintained in the conducting state in response to the high level voltage output by the detection result latching circuit 3220 and the power loop is therefore maintained in the conducting state as well. After the power loop is conducting, the driving circuit of the power supply module starts to operate based on the voltage on the power loop, so as to generate the lighting control signal Slc for controlling the conducting state of the power switch (not shown).

Next, referring to FIG. 20B to FIG. 20E at the same time, in some embodiments when an LED tube lamp is being installed to a lamp socket, the capacitor C21 is charged by the driving signal VCC, for example, Vcc, through the resistor R21. And when the voltage of the capacitor C21 rises enough to trigger the Schmitt trigger STRG, the Schmitt trigger STRG outputs a first high level voltage rising from a first low level voltage in an initial state to an input end of the OR gate OG. After the OR gate OG receives the first high level voltage from the Schmitt trigger STRG, the OR gate OG outputs a second high level voltage to the base of the transistor M22 and the resistor R23. When the base of the transistor M22 receives the second high level voltage from the OR gate OG, the collector and the emitter of the transistor M22 are conducting to further cause the power loop of the LED tube lamp (in this exemplary embodiment, the power loop at least includes the first installation detection terminal TE1, the transistor M22, the resistor STRG, and the second installation detection terminal TE2) to be conducting as well. In the meantime, the base of the transistor M21 receives the second high level voltage from the OR gate OG through the resistor R23, and then the collector and the emitter of the transistor M21 are conductive and grounded to cause the voltage of the capacitor C21 to be discharged to the ground through the resistor R22. In some embodiments, when the voltage of the capacitor C21 is not enough to trigger the Schmitt trigger STRG, the Schmitt trigger STRG outputs the first low level voltage falling from the first high level voltage (a first instance of a first low level voltage at a first time, followed by a first high level voltage, followed by a second instance of the first low level voltage at a second time form a first pulse signal DP1). When the power loop of the LED tube lamp is conductive, the current passing through the capacitor in the power loop, such as, the capacitor of the filtering circuit, by transient response flows through the transistor M22 and the resistor R24 and forms a voltage signal on the resistor R24. The voltage signal is compared to a reference voltage, for example, 1.3V, but the reference voltage is not limited thereto, by the comparator CP21. When the voltage signal is greater than and/or equal to the reference voltage, the comparator CP21 outputs a third high level voltage to the clock input end CLK of the D flip-flop DFF. In the meantime, since the data input end D of the D flip-flop DFF is connected to the driving signal VCC, the D flip-flop DFF outputs a high-level voltage (at its output end Q) to another input end of the OR gate OG. This causes the OR gate OG to keep outputting the second high level voltage to the base of the transistor M22, and further results in the transistor M22 and the power loop of the LED tube lamp remaining in a conducting state. Besides, since the OR gate OG keeps outputting the second high level voltage to cause the transistor M21 to be conducting to the ground, the capacitor C21 is unable to reach an enough voltage to trigger the Schmitt trigger STRG.

However, when the voltage signal on the resistor R24 is smaller than the reference voltage, the comparator CP21 outputs a third low level voltage to the clock input end CLK of the D flip-flop DFF. In the meantime, since the initial output of the D flip-flop DFF is a low-level voltage (e.g., zero voltage), the D flip-flop DFF outputs a low-level voltage (at its output end Q) to the other input end of the OR gate OG. Moreover, the Schmitt trigger STRG connected by the input end of the OR gate OG also restores outputting the first low level voltage, the OR gate OG thus keeps outputting the second low level voltage to the base of the transistor M22, and further results in the transistor M22 to remain in a blocking state (or an off state) and the power loop of the LED tube lamp to remain in an open state. Still, since the OR gate OG keeps outputting the second low level voltage to cause the transistor 2764 to remain in a blocking state (or an off state), the capacitor C21 is charged by the driving voltage VCC through the resistor R21 once again for next (pulse signal) detection.

In some embodiments, the cycle (or interval TIV) of the pulse signal is determined by the values of the resistor R21 and the capacitor C21. In certain cases, the cycle of the pulse signal may include a value ranging from about 3 milliseconds to about 500 milliseconds or may be ranging from about 20 milliseconds to about 50 milliseconds. In some cases, the cycle of the pulse signal may include a value ranging from about 500 milliseconds to about 2000 milliseconds. In some embodiments, the width (or period) of the pulse signal is determined by the values of the resistor R22 and the capacitor C21. In certain cases, the width of the pulse signal may include a value ranging from about 1 microsecond to about 100 microseconds or may be ranging from about 10 microseconds to about 20 microseconds. In the embodiments of FIG. 20B and FIG. 20C, descriptions of mechanisms for generating pulse signal(s) and of corresponding states of applied detection current are according to certain embodiments can be seen referring to those of the embodiments of FIGS. 45D-45F, and thus are not presented here again.

The Zener diode ZD1 provides a protection function but it may be omitted in certain cases. The resistor STRG may include two resistors connected in parallel based on the consideration of power consumption in certain cases, and its equivalent resistance may include a value ranging from about 0.1 ohm to about 5 ohms. The resistors R25 and R26 provides the function of voltage division to make the input of the comparator CP22 bigger than the reference voltage, such as 0.3V, but the value of the reference voltage is not limited thereto. The capacitor C22 provides the functions of regulation and filtering. The diode D21 limits the signal to be transmitted in one way. In addition, the installation detection module disclosed by the example embodiments may also be adapted to other types of LED lighting equipment with dual-end power supply, e.g., the LED lamp directly using commercial power as its external driving signal. However, the disclosure is not limited to the above example embodiments.

Figure 21A:
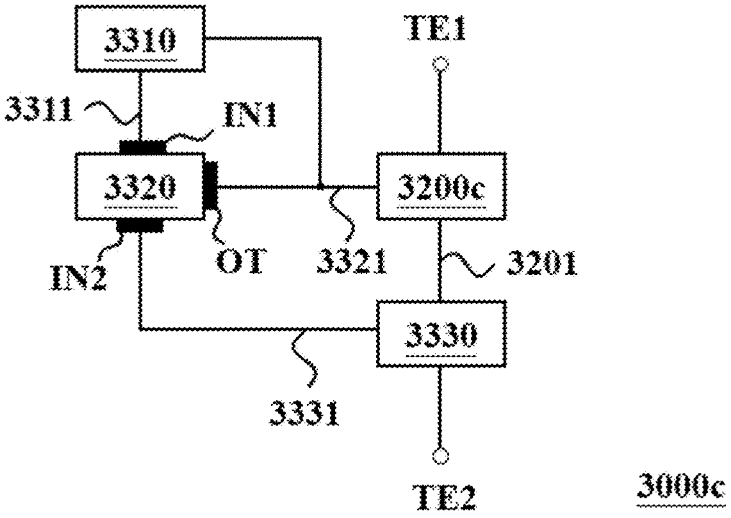
FIG. 21A is a block diagram of an installation detection module according to some exemplary embodiments.

Referring to FIG. 21A, a block diagram of an installation detection module according to an exemplary embodiment is illustrated. The installation detection module 3000*c* includes a pulse generating auxiliary circuit 3310, an integrated control module 3320, a switch circuit 3200*c*, and a detection determining auxiliary circuit 3330. The operation of the installation detection module of the present embodiment is similar to the embodiment of FIGS. 20A to 20C, and thus the signal waveform of the present embodiment can refer to the embodiment illustrated in FIG. 45B. The integrated control module 3320 includes at least three pins such as two input terminals IN1 and IN2 and an output terminal OT. The pulse generating auxiliary circuit 3310 is connected to the input terminal IN1 and the output terminal OT of the integrated control module 3320 and configured to assist the integrated control module 3320 for generating a control signal. The detection determining auxiliary circuit 3330 is connected to the input terminal IN2 of the integrated control module 3320 and the switch circuit 3200*c* and configured to transmit a sample signal related to the signal passing through the LED power loop to the input terminal IN2 of the integrated control module 3320 when the switch circuit 3200*c* and the LED power loop are conducting, such that the integrated control module 3320 may determine an installation state between the LED tube lamp and the lamp socket according to the sample signal. For example, the sample signal may be based on an electrical signal passing through the power loop during the pulse-on period of the pulse signal (e.g., the rising portion of the pulse signal). Switch circuit 3200*c* is connected between one end of the LED power loop and the detection determining auxiliary circuit 3330 and configured to receive the control signal, outputted by the integrated control module 3320, in which the LED power loop is conducting during an enable period of the control signal (i.e., the pulse-on period).

Specifically, under the detection mode DTM, the integrated control module 3320 temporarily causes the switch circuit 3200*c* to conduct, according to the signal received from the input terminal IN1, by outputting the control signal having at least one pulse. During the detection mode DTM, the integrated control module 3320 may detect whether the LED tube lamp is properly connected to the lamp socket and latch the detection result according to the signal on the input terminal IN2. The detection result is regarded as the basis of whether to cause the switch circuit 3200*c* to conduct after the detection mode DTM (i.e., it determines whether to provide power to LED module). The detail circuit structure and operations of the present embodiment will be described below.

In one exemplary embodiment, the integrated control module 3320, the pulse generating auxiliary circuit 3310, the detection determining auxiliary circuit 3330, and the switch circuit 3200*c* in the installation detection module 3000*c* can be respectively implemented by the circuit structures of FIGS. 21B to 21E, but are not limited thereto, wherein FIGS. 21B to 21E are circuit structure diagrams of the installation detection module according to some embodiments. Respective modules/units of the installation detection module are described as follows.

Figure 21B:
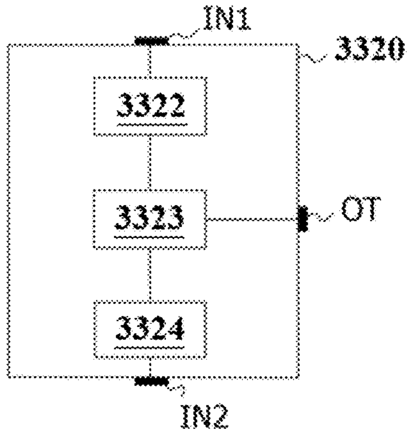
FIGS. 21B-21E are schematic circuit diagrams of an installation detection module according to some exemplary embodiments.

Referring to FIG. 21B, an inner circuit diagram of an integrated control module according to some exemplary embodiments is illustrated. The integrated control module 3320 includes a pulse generating unit 3322, a detection result latching unit 3323, and a detection unit 3324. The pulse generating unit 3322 receives the signal provided by the pulse generating auxiliary circuit 3310 from the input terminal IN1 and accordingly generates a pulse signal. The generated pulse signal will be provided to the detection result latching unit 3323. In an exemplary embodiment, the pulse generating unit 3322 can be implemented by a Schmitt trigger (not shown, it can use a Schmitt trigger such as STRG illustrated in FIG. 20B). According to the exemplary embodiment mentioned above, the Schmitt trigger has an input end coupled to the input terminal IN1 of the integrated control module 3320 and an output terminal coupled to the output terminal OT of the integrated control module 3320 (e.g., through the detection result latching unit 3323). It should be noted that, the pulse generating unit 3322 is not limited to be implemented by the Schmitt trigger, any analog/digital circuit capable of implementing the function of generating the pulse signal having at least one pulse may be utilized in some disclosed embodiments.

The detection result latching unit 3323 is connected to the pulse generating unit 3322 and the detection unit 3324. During the detection mode DTM, the detection result latching unit 3323 outputs the pulse signal generated by the pulse generating unit 3322 as the control signal to the output terminal OT. On the other hand, the detection result latching unit 3323 further stores the detection result signal Sdr provided by the detection unit 3324 and outputs the stored detection result signal Sdr to the output terminal OT after the detection mode DTM, so as to determine whether to cause the switch circuit 3200*c* to conduct according to the installation state of the LED tube lamp. In an exemplary embodiment, the detection latching unit 3323 can be implemented by a circuit structure constituted by a D flip-flop and an OR gate (not shown, for example it can use the D flip-flop DFF and OR gate OG illustrated in FIG. 20D). According to the exemplary embodiment mentioned above, the D flip-flop has a data input end connected to the driving voltage VCC, a clock input end connected to the detection unit 3324, and an output end. The OR gate has a first input end connected to the pulse generating unit 3322, a second input end connected to the output end of the D flip-flop, and an output end connected to the output terminal OT. It should be noted that, the detection result latching unit 3323 is not limited to be implemented by the aforementioned circuit structure, any analog/digital circuit capable of implementing the function of latching and outputting the control signal to control the switching of the switch circuit may be utilized in the present disclosure.

The detection unit 3324 is coupled to the detection result latching unit 3323. The detection unit 3324 receives the signal provided by the detection determining auxiliary circuit 3330 from the input terminal IN2 and accordingly generates the detection result signal Sdr indicating the installation state of the LED tube lamp, in which the generated detection result signal Sdr will be provided to the detection result latching unit 3323. In an exemplary embodiment, detection unit 3324 can be implemented by a comparator (not shown, it can be, for example, the comparator CP21 illustrated in FIG. 20C). According to the exemplary embodiment mentioned above, the comparator has a first input end receiving a setting signal, a second input end connected to the input terminal IN2, and an output end connected to the detection result latching unit 3323. It should be noted that, the detection unit 3324 is not limited to be implemented by the comparator, any analog/digital circuit capable of implementing the function of determining the installation state based on the signal on the input terminal IN2 may be utilized in some disclosed embodiments.

Figure 21C:
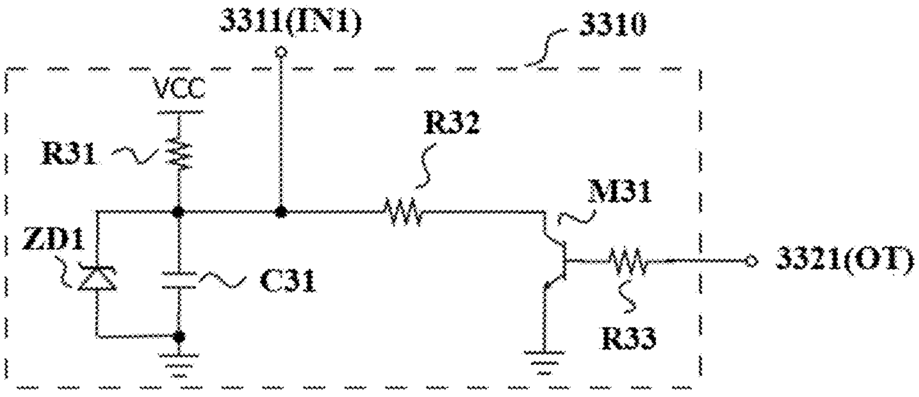

Referring to FIG. 21C, a circuit diagram of a pulse generating auxiliary circuit according to some exemplary embodiments is illustrated. The pulse generating auxiliary circuit 3310 includes resistors R31, R32, and R33, a capacitor C31, and a transistor M31. The resistor R31 has an end connected to a driving voltage (e.g., VCC). The capacitor C31 has an end connected to another end of the resistor R31, and another end connected to ground. The resistor R32 has an end connected to the connection node of the resistor R31 and the capacitor C31. The transistor M31 has a base, a collector connected to another end of the resistor R32, and an emitter connected to the ground. The resistor R33 has an end connected to the base of the transistor M31, and another end connected to the output terminal OT of the integrated control module 3320 and the control terminal of the switch circuit 3200*c* via the path 3311. The pulse generating auxiliary circuit 3310 further includes a Zener diode ZD1. The Zener diode ZD1 has an anode connected to another end of the capacitor C31 and the ground and a cathode connected to the end connecting the capacitor C31 and the resistor R31.

Figure 21D:
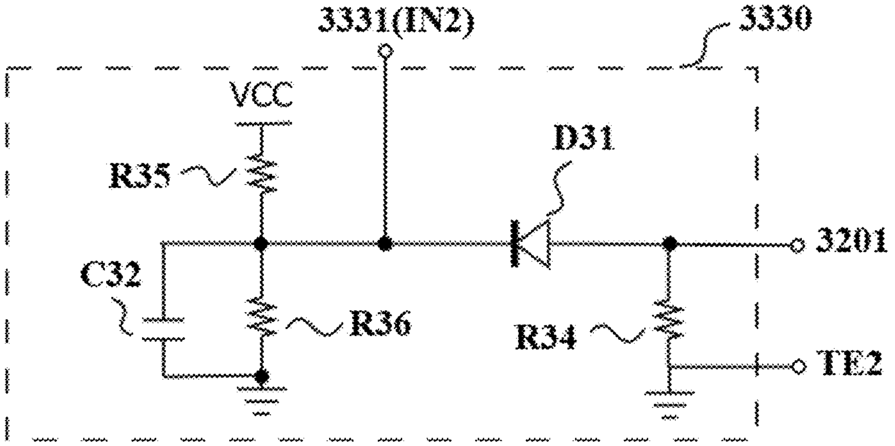

Referring to FIG. 21D, a circuit diagram of a detection determining auxiliary circuit according to some exemplary embodiments is illustrated. The detection determining auxiliary circuit 3330 includes resistors R34, R35 and R36, a capacitor C32 and diode D31. The resistor R34 has an end connected to the switch circuit 3200*c*, and another end connected to another end of the LED power loop (e.g., the second installation detection terminal TE2). The resistor R35 has an end connected to the driving voltage (e.g., VCC). The resistor R36 has an end connected to another end of the resistor R35 and the input terminal IN2 of the integrated control module 3320 via the path 3331, and another end connected to the ground. The capacitor C32 is connected to the resistor R36 in parallel. The diode D31 has an anode connected to the end of the resistor R34 and a cathode connected to the connection node of the resistors R35 and R36. In one exemplary embodiment, the resistors R35 and R36, the capacitor C32, and the diode D31 can be omitted. When the diode D31 is omitted, one end of the resistor R34 is directly connected to the input terminal IN2 of the integrated control module 3320 via the path 3331. In another one exemplary embodiment, the resistor R34 can be implemented by two paralleled resistors based on the power consideration, in which the equivalent resistance of each resistor can be 0.1 ohm to 5 ohm.

Figure 21E:
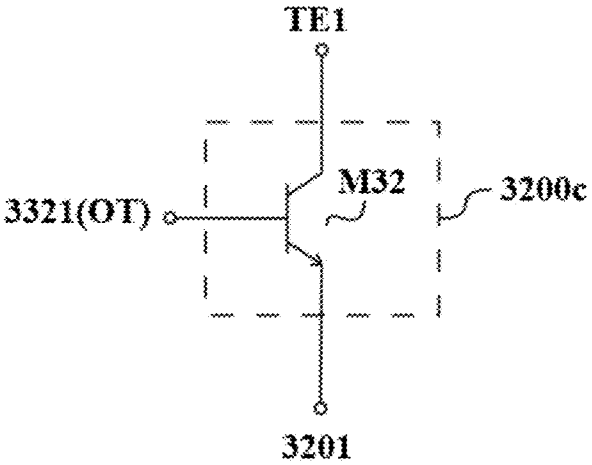

Referring to FIG. 21E, a circuit diagram of a switch circuit according to some exemplary embodiments is illustrated. The switch circuit 3200*c* includes a transistor M32. The transistor M32 has a base connected to the output terminal OT of the integrated control module 3320 via the path 3321, a collector connected to one end of the LED power loop (e.g., the first installation detection terminal TE1), and an emitter connected to the detection determining auxiliary circuit. In some embodiments, the transistor M32 may be replaced by other equivalently electronic parts, e.g., a MOSFET.

It should be noted that, the installation detection module of the present embodiment utilizes the same installation detection principle as the aforementioned embodiment. For example, the capacitor voltage may not mutate; the voltage of the capacitor in the power loop of the LED tube lamp before the power loop being conductive is zero and the capacitor's transient response may appear to have a short-circuit condition; when the LED tube lamp is correctly installed to the lamp socket, the power loop of the LED tube lamp in transient response may have a smaller current-limiting resistance and a bigger peak current; and when the LED tube lamp is incorrectly installed to the lamp socket, the power loop of the LED tube lamp in transient response may have a bigger current-limiting resistance and a smaller peak current. This embodiment may also meet the UL standard to make the leakage current of the LED tube lamp less than 5 MIU. For example, the present embodiment may determine whether the LED tube lamp is correctly/properly connected to the lamp socket by detecting the transient response of the peak current. Therefore, the detail operation of the transient current under the correct installation state and the incorrect installation state may be seen by referring to the aforementioned embodiment, and it will not be repeated herein. The following disclosure will focus on describing the entire circuit operation of the installation detection module illustrated in FIGS. 21A to 21E.

Referring to FIG. 21A again, when an LED tube lamp is being installed to a lamp socket, the driving voltage may be provided to modules/circuits within the installation detection module 3000*c* when power is provided to at least one end cap of the LED tube lamp. The pulse generating auxiliary circuit 3310 starts charging in response to the driving voltage. The output voltage (referred to "first output voltage" hereinafter) of the pulse generating auxiliary circuit 3310 rises from a first low level voltage to a voltage level greater than a forward threshold voltage after a period (e.g., the period utilized to determine the cycle of a pulse signal), in which the first output voltage may output to the input terminal of the integrated control module 3320 via the path 3311. After receiving the first output voltage from the input terminal IN1, the integrated control module 3320 outputs an enabled control signal (e.g., a high-level voltage) to the switch circuit 3200*c* and the pulse generating auxiliary circuit 3310. When the switch circuit 3200*c* receives the enabled control signal, the switch circuit 3200*c* is turned on so that a power loop of the LED tube lamp is conducted as well. Herein, at least the first installation detection terminal TE1, the switch circuit 3200*c*, the path 3201, the detection determining auxiliary circuit 3330 and the second installation detection terminal TE2 are included in the power loop. In the meantime, the pulse generating auxiliary circuit 3310 conducts a discharge path for discharging in response to the enabled control signal. The first output voltage falls down to the first low level voltage from the voltage greater than the forward threshold voltage. When the first output voltage is less than a reverse threshold voltage (which can be defined based on the circuit design), the integrated control module 3320 pulls the enabled control signal down to a disable level in response to the first output voltage (i.e., the integrated control module 3320 outputs a disabled control signal, in which the disabled control signal is, for example, a low level voltage), and thus the control signal has a pulse-type signal waveform (i.e., the first time of the first low level voltage, the first high level voltage, and the second time of the first low level voltage form a first pulse signal DP1). When the power loop is conducting, the detection determining auxiliary circuit 3330 detects a first sample signal (e.g., voltage signal) on the power loop and provides the first sample signal to the integrated control module 3320 via the input terminal IN2. When the integrated control module 3320 determines the first sample signal is greater than or equal to a setting signal (e.g., a reference voltage), which may represent the LED tube lamp has been properly installed in the lamp socket, the integrated control module 3320 outputs and keeps the enabled control signal to the switch circuit 3200*c*. Since receiving the enabled control signal, the switch circuit 3200*c* remains in the conductive state so that the power loop of the LED tube lamp is kept on the conductive state as well. During the period when the switch circuit 3200*c* receives the enabled control signal, the integrated control module 3320 does not output the pulses anymore.

On the contrary, when the integrated control module 3320 determines the first sample signal is less than the setting signal, which may represent the LED tube lamp has not been properly installed in the lamp socket yet, the integrated control module 3320 outputs and keeps the disabled control signal to the switch circuit 3200*c*. As a result of receiving the disabled control signal, the switch circuit 3200*c* remains in the non-conducting state so that the power loop of the LED tube lamp is kept on the non-conducting state as well.

Since the discharge path of the pulse generating auxiliary circuit 3310 is cut off, the pulse generating auxiliary circuit 3310 starts to charge again. Therefore, after the power loop of the LED tube lamp remains in a non-conducting state for a period (i.e., pulse on-time), the first output voltage of the pulse generating auxiliary circuit 3310 rises from the first low level voltage to the voltage greater than the forward threshold voltage again, in which the first output voltage may output to the input terminal of the integrated control module 3320 via the path 3311. After receiving the first output voltage from the input terminal IN1, the integrated control module 3320 pulls up the control signal from the disabled level to an enable level (i.e., the integrated control module 3320 outputs the enabled control signal) and provides the enabled control signal to the switch circuit 3200*c* and the pulse generating auxiliary circuit 3310. When the switch circuit 3200*c* receives the enabled control signal, the switch circuit 3200*c* is turned on so that the power loop of the LED tube lamp is conducted as well. Herein, at least the first installation detection terminal TE1, the switch circuit 3200*c*, the path 3201, the detection determining auxiliary circuit 3330 and the second installation detection terminal TE2 are included in the power loop. In the meantime, the pulse generating auxiliary circuit 3310 conducts, in response to the enabled control signal, a discharge path again for discharging. The first output voltage gradually falls down to the first low level voltage from the voltage greater than the forward threshold voltage again. When the first output voltage is less than a reverse threshold voltage (which can be defined based on the circuit design), the integrated control module 3320 pulls the enabled control signal down to a disable level in response to the first output voltage (i.e., the integrated control module 3320 outputs a disabled control signal, in which the disabled control signal is, for example, a low level voltage), and thus the control signal has a pulse-type signal waveform (i.e., the third time of the first low level voltage, the second time of the high level voltage, and the fourth time of the first low level voltage form a second pulse signal DP2). When the power loop is conducted again, the detection determining auxiliary circuit 3330 detects a second sample signal (e.g., voltage signal) on the power loop and provides the second sample signal to the integrated control module 3320 via the input terminal IN2. When the integrated control module 3320 determines the second sample signal is greater than or equal to a setting signal (e.g., a reference voltage), which may represent the LED tube lamp has been properly installed in the lamp socket, the integrated control module 3320 outputs and keeps the enabled control signal to the switch circuit 3200*c*. Since receiving the enabled control signal, the switch circuit 3200*c* remains in the conductive state so that the power loop of the LED tube lamp is kept on the conductive state as well. During the period when the switch circuit 3200*c* receives the enabled control signal, the integrated control module 3320 does not output the pulses anymore.

When the integrated control module 3320 determines the second sample signal is less than the setting signal, which may represent the LED tube lamp has not been properly installed in the lamp socket yet, the integrated control module 3320 outputs and keeps the disabled control signal to the switch circuit 3200*c*. Since receiving the disabled control signal, the switch circuit 3200*c* remains in the non-conducting state so that the power loop of the LED tube lamp is kept on the non-conducting state as well. Based on the above operation, when the LED tube lamp has not been properly installed in the lamp socket, the problem in which users may get electric shock caused by touching the conductive part of the LED tube lamp can be prevented.

Operation of circuits/modules within the installation detection module is further described below. Referring to FIGS. 21B to 21E, when the LED tube lamp is installed in the lamp socket, the capacitor C31 is charged by a driving voltage VCC via resistor R31. When the voltage of the capacitor C31 is raised to trigger the pulse generating unit 3322 (i.e., the voltage of the capacitor C31 is raised greater than the forward threshold voltage), the output of the pulse generating unit 3322 changes to a first high level voltage from an initial first low-level voltage and provides to the detection result latching unit 3323. After receiving the first high level voltage outputted by the pulse generating unit 3322, the detection result latching unit 3323 outputs a second high level voltage to the base of the transistor M32 and the resistor R33 via the output terminal OT. After the second high level voltage outputted from the detection result latching unit 3323 is received by the base of the transistor M32, the collector and the emitter of the transistor are conducted so as to conduct the power loop of the LED tube lamp. Herein, at least the first installation detection terminal TE1, the transistor M32, the resistor R34, and the second installation detection terminal TE2 are included in the power loop.

In the meantime, the base of the transistor M31 receives the second high level voltage on the output terminal OT via the resistor R33. The collector and the emitter of the transistor M31 are conducting and connected to the ground, such that the capacitor C31 discharges to the ground via the resistor R32. When the voltage of the capacitor C31 is insufficient so that the pulse generating unit 3322 cannot be triggered, the output of the pulse generating unit 3322 is pulled down to the first low level voltage from the first high level voltage (i.e., the first time of the first low level voltage, the first high level voltage, and the second time of the first low level voltage form a first pulse signal DP1). When the power loop is conducting, the current, generated by the transient response, passing through a capacitor (e.g., filtering capacitor in the filtering circuit) in the LED power loop flows through the transistor M32 and the resistor R34 so as to build a voltage signal on the resistor R34. The voltage signal is provided to the input terminal IN2, and thus the detection unit 3324 may compare the voltage signal on the input terminal IN2 (i.e., the voltage on the resistor R34) with a reference voltage.

When the detection unit 3324 determines the voltage signal on the resistor R34 is greater than or equal to the reference voltage, the detection unit outputs a third high level voltage to the detection result latching unit 3323. On the contrary, when the detection unit 3324 determines the voltage signal on the resistor R34 is less than the reference voltage, the detection unit 3324 outputs a third low level voltage to the detection result latching unit 3323.

The detection result latching unit 3323 latches/stores the third high level voltage/third low level voltage provided by the detection unit 3324 and performs a logic operation based on the latched/stored signal and the signal provided by the pulse generating unit 3322, such that the detection result latching unit 3323 outputs the control signal. Herein, the result of the logic operation determines whether the signal level of the outputted control signal is the second high level voltage or the second low level voltage.

More specifically, when the detection unit 3324 determines that the voltage signal on the resistor is greater than or equal to the reference voltage, the detection result latching unit 3323 may latch the third high level voltage outputted by the detection unit 3324, and the second high level voltage is maintained to be output to the base of the transistor M32, so that the transistor M32 and the power loop of the LED tube lamp maintain the conductive state. Since the detection result latching unit 3323 may continuously output the second high level voltage, the transistor M31 is conducted to the ground as well, so that the voltage of the capacitor C31 cannot rise enough to trigger the pulse generating unit 3322. When the detection unit 3324 determines that the voltage signal on the resistor R34 is less than the reference voltage, both the detection unit 3324 and the pulse generating unit 3322 provide a low-level voltage, and thus the detection result latching unit 3323 continuously outputs, after performing the OR logical operation, the second low level voltage to the base of the transistor M32. Therefore, the transistor M32 is maintained to be cut off and the power loop of the LED tube lamp is maintained in the non-conducting state. However, since the control signal on the output terminal OT is maintained at a second low level voltage, the transistor M31 is thus maintained in a cut-off state as well, and repeatedly performs the next (pulse) detection until the capacitor C31 is charged by the driving voltage VCC via the resistor R31 again.

It should be noted that, the detection mode DTM described in this embodiment can be defined as the period that the driving voltage VCC is provided to the installation detection module 3000*c*, however, the detection unit 3324 has not yet determined that the voltage signal on the resistor R34 is greater than or equal to the reference voltage. During the detection mode DTM, since the control signal outputted by the detection result latching unit 3323 alternatively conducts and cuts off the transistor M31, the discharge path is periodically conducted and cut off, correspondingly. Thus, the capacitor C31 is periodically charged and discharged in response to the conducting state of the transistor M31, so that the detection result latching unit 3323 outputs the control signal having a periodic pulse waveform during the detection mode DTM. The detection mode DTM ends when the detection unit 3324 determines that the voltage signal on the resistor R34 is greater than or equal to the reference voltage or the driving voltage VCC is stopped. The detection result latching unit 3323 is maintained to output the control signal having the second high level voltage or the second low level voltage after the detection mode DTM.

In one embodiment, compared to the exemplary embodiment illustrated in FIG. 20A, the integrated control module 3320 is constituted by integrating part of the circuit components in the detection pulse generating module 3210, the detection result latching circuit 3220, and the detection determining circuit 3230 (e.g., as part of an integrated circuit). Another part of the circuit components which are not integrated in the integrated control module 3320 constitutes the pulse generating auxiliary circuit 3310 and the detection determining auxiliary circuit 3330 of the embodiment illustrated in FIG. 21A. In some embodiments, the function/circuit configuration of the combination of the pulse generating unit 3322 in the integrated control module 3320 and the pulse generating auxiliary circuit 3310 can be equivalent to the detection pulse generating module 3210. The function/circuit configuration of the detection result latching unit 3323 in the integrated control module 3320 can be equivalent to the detection result latching module 3220. The function/circuit configuration of the combination of the detection unit 3324 in the integrated control module 3320 and the detection determining auxiliary circuit 3330 can be equivalent to the detection determining circuit 3230.

Figure 22A:
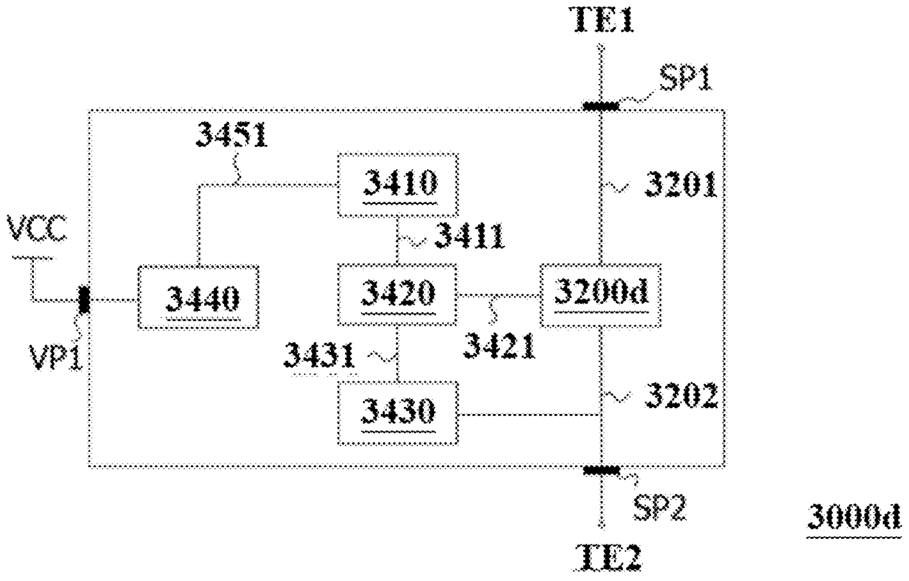
FIG. 22A is a block diagram of an installation detection module according to some exemplary embodiments.

Referring to FIG. 22A, an internal circuit block diagram of a three-terminal switch device according to an exemplary embodiment is illustrated. The installation detection module according to one embodiment is, for example, a three-terminal switch device 3000*d* including a power terminal VP1, a first switching terminal SP1, and a second switching terminal SP2. The power terminal VP1 of the three-terminal switch device 3000*d* is adapted to receive a driving voltage VCC. The first switching terminal SP1 is adapted to connect one of the first installation detection terminal TE1 and the second installation detection terminal TE2 (the first switching terminal SP1 is illustrated as being connected to the first installation detection terminal TE1 in FIG. 22A, but the disclosure is not limited thereto), and the second switching terminal SP2 is adapted to connect to the other one of the first installation detection terminal TE1 and the second installation detection terminal TE2 (the second switching terminal SP2 is illustrated as being connected to the second installation detection terminal TE2 in FIG. 22A, but the disclosure is not limited thereto).

The three-terminal switch device 3000*d* includes a signal processing unit 3420, a signal generating unit 3410, a signal capturing unit 3430, and a switch unit 3200*d*. In addition, the three-terminal switch device 3000*d* further includes an internal power detection unit 3440. The signal processing unit 3420 outputs a control signal having a pulse or multi-pulse waveform during a detection mode DTM, according to the signal provided by the signal generating unit 3410 and the signal capturing unit 3430. The signal processing unit 3420 outputs the control signal, in which the signal level of the control signal remains at a high-level voltage or a low voltage level, after the detection mode DTM, so as to control the conducting state of the switch unit 3200*d* and determine whether to conduct the power loop of the LED tube lamp. The pulse signal generated by the signal generating unit 3410 can be generated according to a reference signal received from outside, or by itself, and the present disclosure is not limited thereto. The term "outside" described in this paragraph is relative to the signal generating unit 3410, which means the reference signal is not generated by the signal generating unit 3410. As such, whether the reference signal is generated by any of the other circuits within the three-terminal switch device 3000*d*, or by an external circuit of the three-terminal switch device 3000*d*, those embodiments belong the scope of "the reference signal received from the outside" as described in this paragraph. The signal capturing unit 3430 samples an electrical signal passing through the power loop of the LED tube lamp to generate a sample signal and detects an installation state of the LED tube lamp according to the sample signal, so as to transmit a detection result signal Sdr indicating the detection result to the signal processing unit 3420 for processing.

In an exemplary embodiment, the three-terminal switch device 3000*d* can be implemented by an integrated circuit. For example, the three-terminal switch device 3000*d* can be a three-terminal switch control chip, which can be utilized in any type of the LED tube lamp having two end caps for receiving power so as to provide the function of preventing electric shock. It should be noted that, the three-terminal switch device 3000*d* is not limited to merely include three pins/connection terminals. For example, a multi-pins switch device (with more than three pins) having at least three pins having the same configuration and function as the embodiment illustrated in FIG. 22A can include additional pins for other purposes, even though those pins may be not described in detail herein. It should be noted that the various "units" described herein, in some embodiments, are circuits, and will be described as circuits.

In an exemplary embodiment, the signal processing unit 3420, the signal generating unit 3410, the signal capturing unit 3430, the switch unit 3200*d*, and the internal power detection unit 3440 can be respectively implemented the circuit configurations illustrated in FIGS. 22B to 22F, but the present disclosure is not limited thereto. Detail exemplary operation of each of the units in the three-terminal control chip are described below.

Figure 22B:
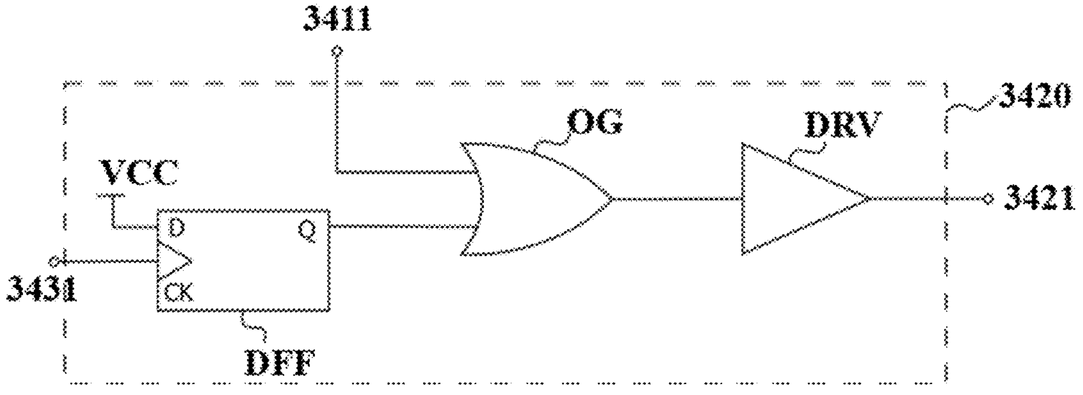
FIGS. 22B-22F are schematic circuit diagrams of an installation detection module according to some exemplary embodiments.

Referring to FIG. 22B, a block diagram of a signal processing unit according to an exemplary embodiment is illustrated. The signal processing unit 3420, which in one embodiment is a circuit, includes a driver DRV, an OR gate OG, and a D flip-flop DFF. The driver DRV has an input end and has an output end connected to the switch unit 3200*d* via the path 3421, in which the driver DRV provides the control signal to the switch unit 3200*d* via the output end and the path 3421. The OR gate OG has a first input end connected to the signal generating unit 3410 via the path 3411, a second input end, and an output end connected to the input end of the driver DRV. The D flip-flop DFF has a data input end (D) receiving a driving voltage VCC, a clock input end (CK) connected to the signal capturing unit 3430 via the path 3431, and an output connected to the second input terminal of the OR gate OG.

Figure 22C:
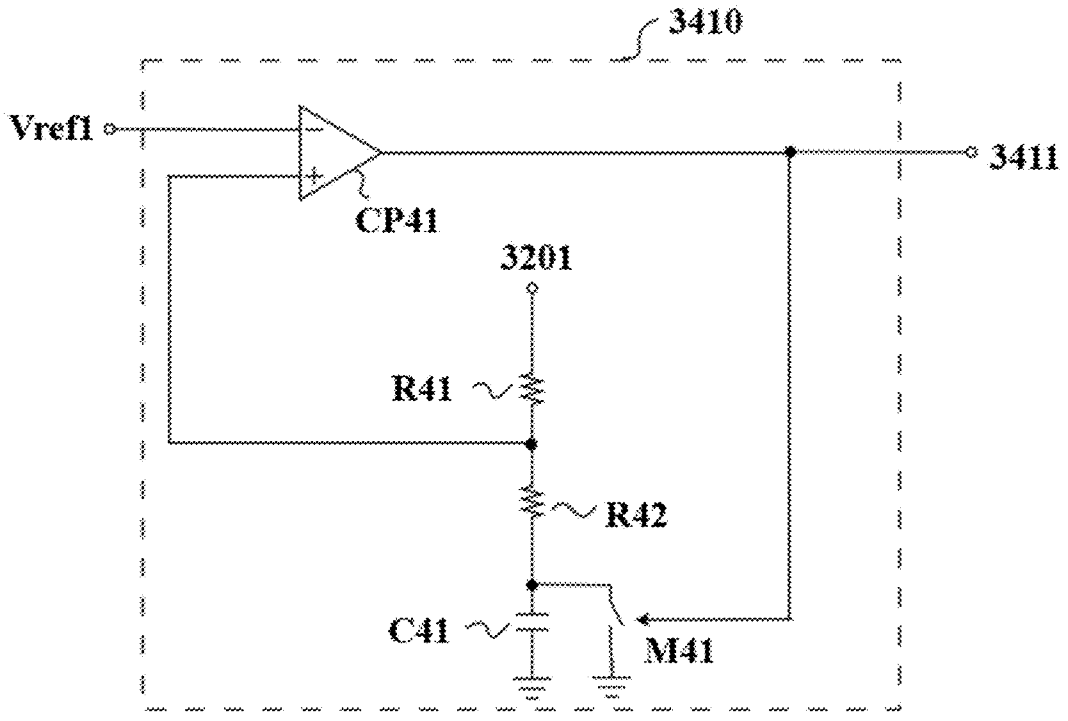

Referring to FIG. 22C, a block diagram of a signal generating unit according to an exemplary embodiment is illustrated. The signal generating unit 3410 includes resistors R41 and R42, a capacitor C41, a switch M41, and a comparator CP41. One end of the resistor R41 receives the driving voltage VCC, and the resistors R41 and R42 and the capacitor C41 are serial connected between the driving voltage VCC and the ground. The switch M41 is connected to the capacitor C41 in parallel. The comparator CP41 has a first input end connected to the connection node of the resistors R41 and R42, a second input end receives a reference voltage Vref, and an output end connected to the control terminal of the switch M41.

Figure 22D:
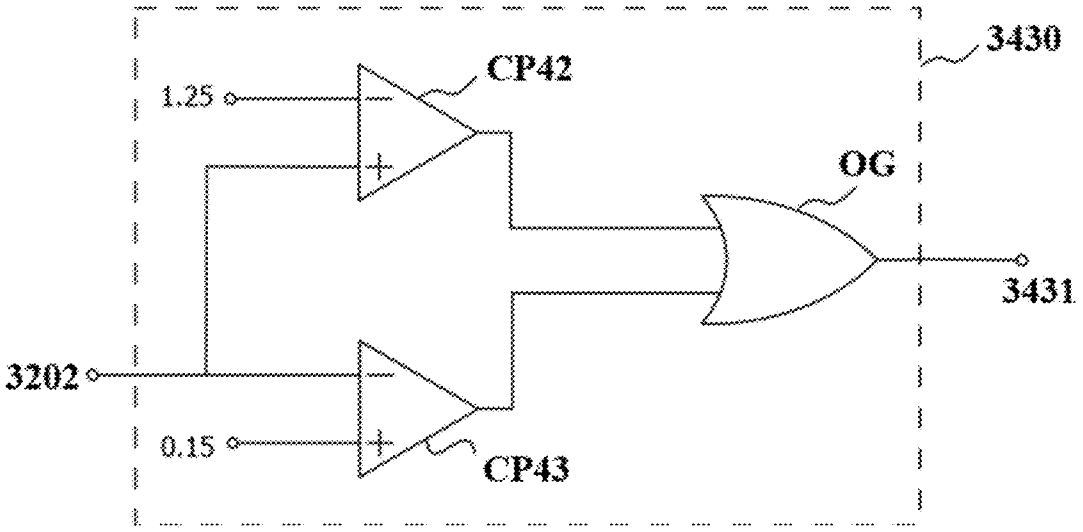

Referring to FIG. 22D, a block diagram of a signal capturing unit according to an exemplary embodiment is illustrated. The signal capturing unit 3430 includes an OR gate and comparators CP42 and CP43. The OR gate OG has a first input end and a second input end, and an output end connected to the signal processing unit 3420 via the path 3431. The comparator CP42 has a first input end connected to one end of the switch unit 3200*d* (i.e., a node on the power loop of the LED tube lamp) via the path 3202, a second input end receiving a first reference voltage (e.g., 1.25V, but not limited thereto), and an output end connected to the first input end of the OR gate OG. The comparator CP43 has a first input end connected to a second reference voltage (e.g., 0.15V, but not limited thereto), a second input end connected to the first input end of the comparator CP42, and an output end connected to the second input end of the OR gate OG.

Figure 22E:
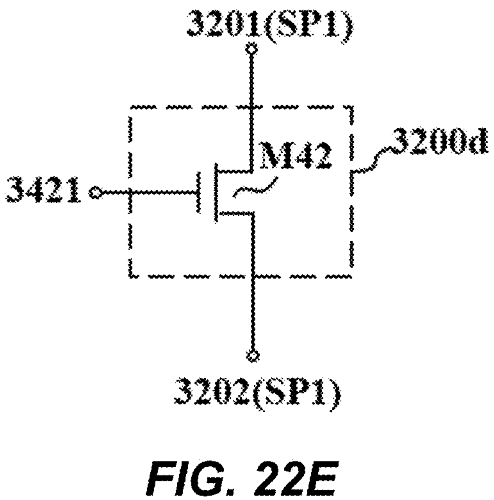

Referring to FIG. 22E, a block diagram of a switch unit according to an exemplary embodiment is illustrated. The switch unit 3200*d* includes a transistor M42. The transistor M42 has a gate connected to the signal processing unit 3420 via the path 3421, a drain connected to the first switch terminal SP1 via the path 3201, and a source connected to the second switch terminal SP2, the first input end of the comparator CP42, and the second input end of the comparator CP43 via the path 3202. In one embodiment, for example, the transistor M42 is an NMOS transistor.

Figure 22F:
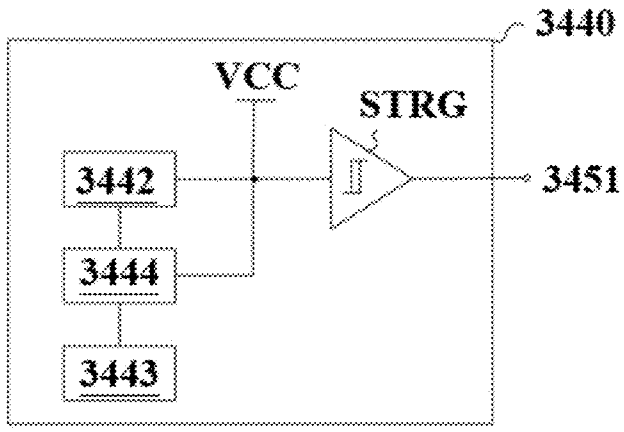

Referring to FIG. 22F, a block diagram of an internal power detection unit according to an exemplary embodiment is illustrated. The internal power detection unit 3440 includes a clamp circuit 3442, a reference voltage generating circuit 3443, a voltage adjustment circuit 3444, and a Schmitt trigger STRG. The clamp circuit 3442 and the voltage adjustment circuit 3444 are respectively connected to the power terminal VP1 for receiving the driving voltage, so as to perform a voltage clamp operation and a voltage level adjustment operation, respectively. The reference voltage generating circuit 3443 is coupled to the voltage adjustment circuit 3444 and is configured to generate a reference voltage to the voltage adjustment circuit 3444. The Schmitt trigger STRG has an input end coupled to the clamp circuit 3442 and the voltage adjustment circuit 3444, and an output end to output a power confirmation signal for indicating whether the driving voltage VCC is normally supplied. If the driving voltage VCC is normally supplied, the Schmitt trigger STRG outputs the enabled power confirmation signal, such that the driving voltage VCC is allowed to be provided to the component/circuit within the three-terminal switch device 3000*d*. On the contrary, if the driving voltage VCC is abnormal, the Schmitt trigger STRG outputs the disabled power confirmation signal, such that the component/circuit within the three-terminal switch device 3000*d* won't be damaged based on working under the abnormal driving voltage VCC.

Referring to FIGS. 22A to 22F, under the circuit operation of the present embodiment, when the LED tube lamp is installed in the lamp socket, the driving voltage VCC is provided to the three-terminal switch device 3000*d* via the power terminal VP1. At this time, the driving voltage VCC charges the capacitor C41 via the resistors R41 and R42. When the capacitor voltage is raised greater than the reference voltage Vref, the comparator CP41 switches to output a high-level voltage to the first input end of the OR gate OG and the control terminal of the switch M41. The switch M41 is conducted in response to the received high level voltage, such that the capacitor starts to discharge to the ground. The comparator CP41 outputs an output signal having pulse-type waveform through this charge and discharge process.

During the period when the comparator CP41 outputs the high-level voltage, the OR gate OG correspondingly outputs the high-level voltage to conduct the transistor M42, such that the current flows through the power loop of the LED tube lamp. When the current passes the power loop, a voltage signal corresponding to the current size can be established on the path 3202. The comparator CP42 samples the voltage signal and compares the signal level of the voltage signal with the first reference voltage (e.g., 1.25V).

When the signal level of the sampled voltage signal is greater than the first reference voltage, the comparator CP42 outputs the high-level voltage. The OR gate OG generates another high-level voltage to the clock input end of the D flip-flop DFF in response to the high-level voltage outputted by the comparator CP42. The D flip-flop DFF continuously outputs the high-level voltage based on the output of the OR gate OG. Driver DRV generates an enabled control signal to conduct the transistor M42 in response to the high-level voltage on the input terminal. At this time, even if the capacitor C41 has been discharged to below the reference voltage Vref and thus the output of the comparator CP41 is pulled down to the low-level voltage, the transistor M42 still remains in the conductive state since the output of the D flip-flop DFF is kept on the high-level voltage.

When the sampled voltage signal is less than the first reference voltage (e.g., 1.25V), the comparator CP42 outputs the low-level voltage. The OR gate OG generates another low-level voltage in response to the low-level voltage outputted by the comparator and provides the generated low level voltage to the clock input end of the D flip-flop DFF. The output end of the D flip-flop DFF remains on the low-level voltage based on the output of the OR gate OG. At this time, once the capacitor C41 discharges to the capacitor voltage below the reference voltage Vref, the output of comparator CP41 is pulled down to the low-level voltage which represents the end of the pulse on-time (i.e., the fallen edge of the pulse). Since the two input ends of the OR gate OG are at the low-level voltage, the output end of the OR gate OG also outputs the low-level voltage, therefore, the driver DRV generates the disabled control signal to cut off the transistor M42 in response to the received low level voltage, so as to cut off the power loop of the LED tube lamp.

As noted above, the operation of the signal processing unit 3420 of the present embodiment is similar to that of the detection result latching circuit 3220 illustrated in FIG. 20D, the operation of the signal generating unit 3410 is similar to that of the detection pulse generating module 3210 illustrated in FIG. 20B, the operation of the signal capturing unit 3430 is similar to that of the detection determining circuit 3230 illustrated in FIG. 20C, and the operation of the switch unit 3200*d* is similar to that of the switch circuit 3200*b* illustrated in FIG. 20E.

Figure 23A:
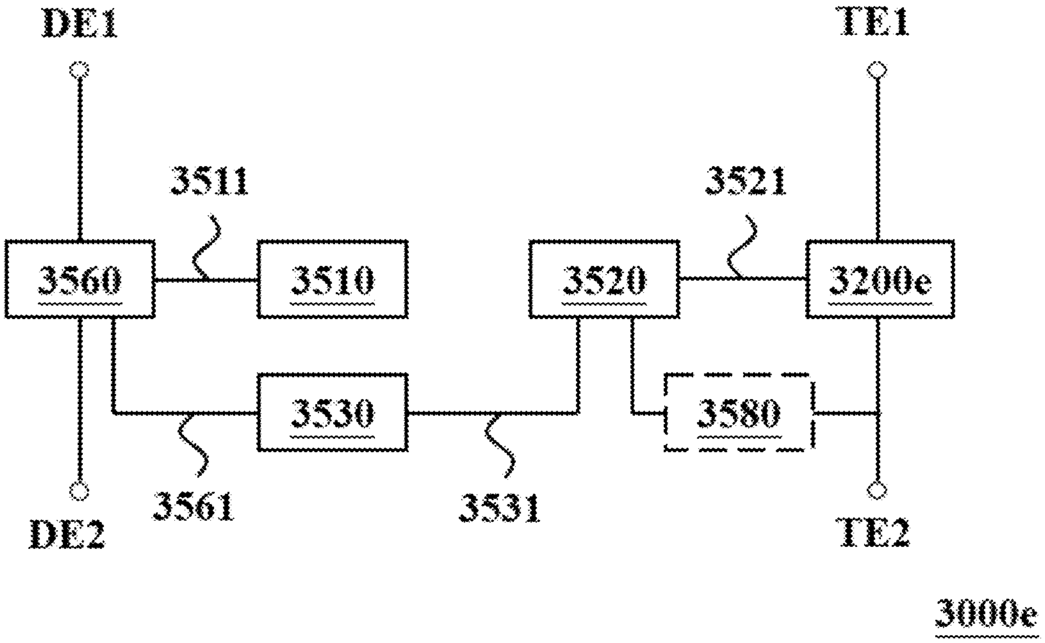
FIG. 23A is a block diagram of an installation detection module according to some exemplary embodiments.

Referring to FIG. 23A, a block diagram of an installation detection module according to an exemplary embodiment is illustrated. The installation detection module 3000*e* includes a detection pulse generating module 3510, a control circuit 3520, a detection determining circuit 3530, a switch circuit 3200*e*, and a detection path circuit 3560. The detection determining circuit 3530 is coupled to the detection path circuit 3560 via the path 3561 for detecting the signal on the detection path circuit 3560. The detection determining circuit 3530 is coupled to the control circuit 3520 via the path 3531 for transmitting the detection result signal Sdr to the control circuit 3520 via the path 3531. The detection pulse generating module 3510 is coupled to the detection path circuit 3560 via the path 3511 and generates a pulse signal to inform the detection path circuit 3560 of a time point for conducting the detection path or performing the installation detection. The control circuit 3520 outputs a control signal according to the detection result signal Sdr and is coupled to the switch circuit 3200*e* via the path 3521, so as to transmit the control signal to the switch circuit 3200*e*. The switch circuit 3200*e* determines whether to conduct the current path between the installation detection terminals TE1 and TE2 (i.e., part of the power loop). The detection path circuit 3560 is coupled to the power loop of the power supply module through a first detection connection terminal DE1 and a second detection connection terminal DE2.

In the present embodiment, the configuration of the detection pulse generating module 3510 can correspond to the configurations of the detection pulse generating module 3110 shown in FIG. 19B or the detection pulse generating module 3210 shown in FIG. 20B. Referring to FIG. 19B, when the detection pulse generating module 3110 is applied to implement the detection pulse generating module 3510, the path 3511 of the present embodiment can correspond to the path 3111, which means the OR gate OG1 is connected to the detection path circuit 3560 via the path 3511. Referring to FIG. 20B, when the detection pulse generating module 3210 is applied to implement the detection pulse generating module 3510, the path 3511 can correspond to the path 3211. In one embodiment, the detection pulse generating module is also connected to the output terminal of the control circuit 3520 via the path 3521, so that the path 3521 can correspond to the path 3221.

The control circuit 3520 can be implemented by a control chip or any circuit capable of performing signal processing. When the control circuit 3520 determines the tube lamp is properly installed (e.g., the pins on both ends of the tube lamp are plugged into the lamp socket) according to the detection result signal Sdr, the control circuit 3520 may control the switch state of the switch circuit 3200*e* so that the external power can be normally provided to the LED module when the tube lamp is properly installed into the lamp socket. In this case, the detection path will be cut off by the control circuit 3520. On the contrary, when the control circuit 3520 determines the tube lamp is not properly installed (e.g., a user is touching the pins on one end of the tube lamp with the other end plugged in) according to the detection result signal Sdr, the control circuit 3520 keeps the switch circuit 3200*e* at the off state since the user has the risk from getting electric shock.

An example of the configuration of the detection determining circuit 3530 can be seen referring to the configurations of the detection determining circuit 3130 shown in FIG. 19C or the detection determining circuit 3230 shown in FIG. 20C. Referring to FIG. 19C, when the detection determining circuit 3130 is applied to implement the detection determining circuit 3530, the resistor R14 can be omitted. The path 3561 of the present embodiment can correspond to the path 3201, which means the positive input terminal of the comparator CP11 is connected to the detection path circuit 3560. The path 3531 of the present embodiment can correspond to the path 3131, which means the output terminal of the comparator CP11 is connected to the control circuit 3520. Referring to FIG. 20C, when the detection determining circuit 3230 is applied to implement the detection determining circuit 3530, the resistor R24 can be omitted. The path 3561 of the present embodiment can correspond to the path 3201, which means the anode of the diode D21 is connected to the detection path circuit 3560. The path 3531 of the present embodiment can correspond to the path 3231, which means the output terminal of the comparators CP21 and CP22 are connected to the control circuit 3520.

The configuration of the switch circuit 3200 can correspond to the configurations of the switch circuit 3200*a* shown in FIG. 19E or 19F or the switch circuit 3200*b* shown in FIG. 20E. Since the switch circuit in both embodiments of FIG. 19E and FIG. 20E are similar to each other, the following description discusses the switch circuit 3200*a* shown in FIG. 19E as an example. Referring to FIG. 19E, when the switch circuit 3200*a* is applied to implement the switch circuit 3200*e*, the path 3521 of the present embodiment can correspond to the path 3121. The path 3201 is not connected to the detection determining circuit 3130, but directly connected to the installation detection terminal TE2.

Figure 23B:
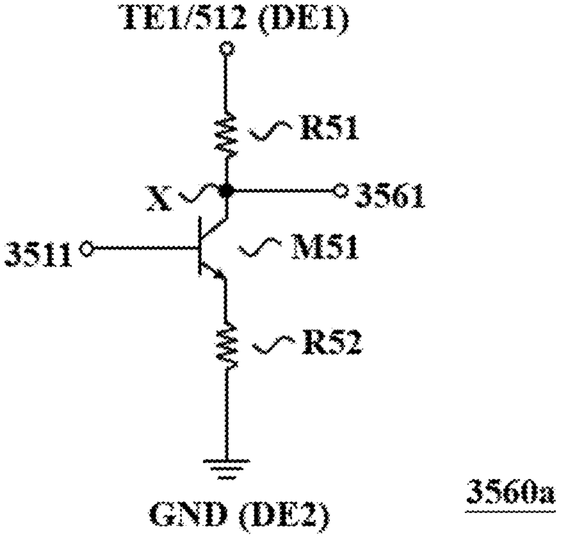
FIGS. 23B to 23D are each schematic diagrams of a circuit architecture of a detection path circuit according to some exemplary embodiments.
Figure 23C:
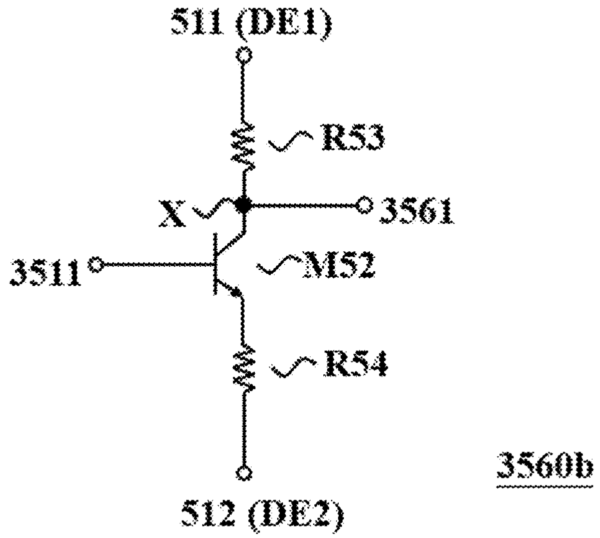
Figure 23D:
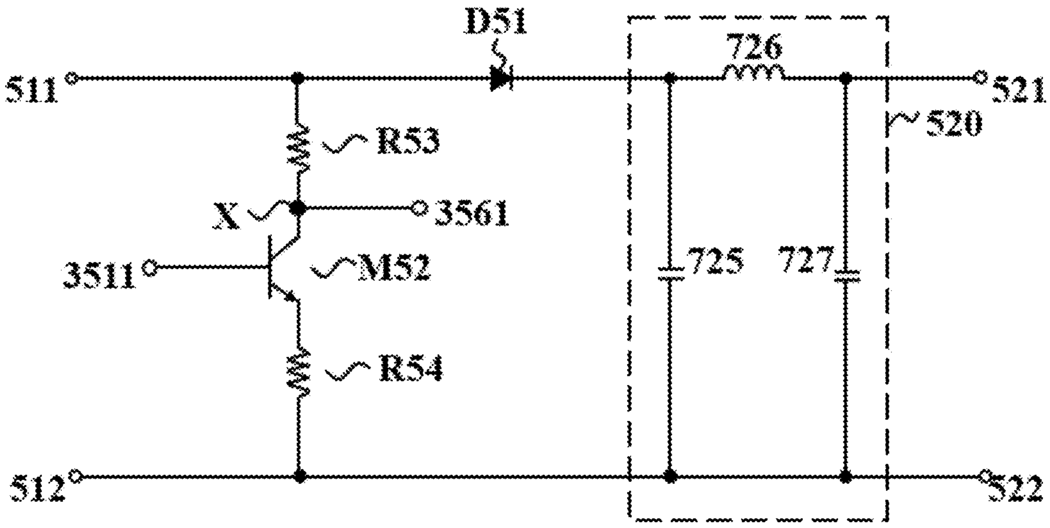

Configuration of the detection path circuit 3560 can be illustrated as shown in FIG. 23B, 23C, or 23D, which are circuit structure diagrams of the detection path circuit according to different embodiments of the present disclosure.

FIG. 23B is a circuit structure diagram of a detection path circuit according to some embodiments. Referring to FIG. 23B, the detection path circuit 3560*a* includes a transistor M51 and resistors R51 and R52. The transistor M51 has a base, a collector, and an emitter, wherein the emitter is connected to a detection pulse generating module 3510 through a path 3511. The resistor R52 has a first end connected to the emitter of the transistor M51, and a second end acting as a second detection connection terminal DE2 connected to a ground terminal GND, so the resistor R52 is serially connected between the emitter of the transistor M51 and the ground terminal GND. The resistor R51 has a first end acting as a first detection connection terminal DE1 connected to a first installation detection terminal TE1, which is connected to a second rectifying output terminal 512 as an exemplary example in these embodiments, and thus the resistor R51 is serially connected between the collector of the transistor M51 and the second rectifying output terminal 512. As to the disposition of a detection path, the detection path in these embodiments is equivalently disposed between a rectifying output terminal and the ground terminal GND.

In these embodiments, as in a detection mode, when the transistor M51 receives a pulse signal provided by the detection pulse generating module 3510, the transistor M51 conducts current during the pulse. In the case that at least one end of the LED tube lamp is installed to the lamp socket, in response to the conducting transistor M51, a detection path from the first installation detection terminal TE1 to the ground terminal GND (through the resistor R51, transistor M51, and resistor R52) enters into a conducting state accordingly, and a voltage signal can be detected at a node X on the detection path. When a user does not touch the tube lamp or the tube lamp is correctly installed to the lamp socket, the level of the voltage signal is determined according to divided voltage of the resistors R51 and R52. When a user touches the tube lamp, the equivalent resistance/impedance of the human body is serially connected between the second detection connection terminal DE2 and ground terminal GND, in other words, the equivalent resistance/impedance of the human body is connected with the resistors R51 and R52 in series. At this time, the level of the voltage signal is determined according to the resistors R51 and R52 and the equivalent resistance/impedance of the human body. Therefore, through disposing the resistors R51 and R52 of appropriate resistances, the voltage signal at the node X can be configured to reflect a state of whether a user has touched the tube lamp, enabling the detection determining circuit 3530 to generate a corresponding detection result signal according to the voltage signal at the node X. Besides, other than the transistor M51 being configured to briefly conduct in the detection mode, when the control circuit 3520 determines that the LED tube lamp is correctly/properly installed to the lamp socket/base, the transistor M51 maintains in a cutoff state, so that the power supply module can normally operate to provide power to the LED module.

Referring to FIG. 23C, the detection path circuit 3560*b* includes the transistor M52 and the resistors R53 and R54, the detection path circuit 3560*b* in FIG. 23C is disposed between the first rectifying output terminal 511 and the second rectifying output terminal 512. In this embodiment, the resistor R53 has a first end (or the first detection connection terminal DE1) connected to the first rectifying output terminal 511, and the resistor R54 has a second end (or the second detection connection terminal DE2) connected to the second rectifying output terminal 512.

In the present embodiment, the transistor M52 is conducting during a pulse-on period when receiving a pulse signal provided by the detection pulse generating module 3510. Under the situation where at least one end of the LED tube lamp is inserted into the lamp socket, a detection path between the first rectifying output terminal 511 and the second rectifying output terminal 512 of FIG. 18 is conducted through the resistor R53, the transistor M52, and the resistor R54 in response to the conducted transistor M52, so as to establish a voltage signal on the node X of the detection path. When the user does not touch the tube lamp or when both ends of the tube lamp are correctly plugged into the lamp socket, the signal level of the voltage signal is determined by the voltage division between the resistors R53 and R54, wherein the second detection connection terminal DE2 and the ground terminal GND are at the same voltage level. When the user touches the tube lamp, some equivalent body impedance is as connected between the resistor R54/the second detection connection terminal DE2 and the ground terminal GND, which means it is connected to the resistors R53 and R54 in series (by the transistor M52). At this time, the signal level of the voltage signal is determined by the voltage division between the resistor R53, the resistor R54, and the equivalent body impedance. Accordingly, by setting appropriate values of the resistors R53 and R54, the voltage signal on the node X may reflect or indicate the state of whether the user touches the LED tube lamp, and thus the detection determining circuit 3530 may generate a corresponding detection result signal according to the voltage signal on the node X. In addition to being temporarily turned on during the detection mode, the transistor M52 remains in a cut-off state when the control circuit 3520 determines the LED tube lamp has been correctly installed in the lamp socket, so that the power supply module is capable of providing power normally to the LED module.

FIG. 23D is a circuit structure diagram of a detection path circuit according to some embodiments. Referring to FIG. 23D, configurations and operations of a detection path circuit 3560*c* in these embodiments are largely the same as those in the embodiments described above, with a main difference that the detection path circuit 3560*c* in these embodiments further includes a current limiting component D51 disposed on a power loop. The current limiting component D51 can be, for example, a diode (referred to as diode D51 below) disposed between a first rectifying output terminal 511 and an input terminal of a filtering circuit 520, which is a connection terminal between a capacitor 725 and an inductor 726, wherein the filtering circuit 520 is illustrated as a π-shape filtering circuit as an example herein but is not limited thereto. In these embodiments, the addition of the current limiting component D51 can limit the direction of current on the main power loop, in order to avoid reverse discharging to the detection path from the charged capacitor 725 when the transistor M51 is conducting current, which reverse discharging to the detection path may negatively affect accuracy of performed detection for the electric shock protection. It should be noted that the configuration/disposition of the diode D51 is merely an embodiment of a current limiting component, the disclosure is not limited thereto and any the current limiting component with function of limiting direction of current can be disposed on the power loop.

According to the above descriptions, in these embodiments whether a user is at risk of getting electric shock can be determined through conducting the detection path and detecting the voltage signal on the detection path. In addition, compared to previous described embodiments, the detection path in these embodiments is additionally built, rather than using the power loop as the detection path, so the detection path and the power loop are not overlapped at least in part. Since the number of electronic components on this additionally built detection path is typically smaller than that of electronic components on the power loop, the detected voltage signal on the additionally built detection path can more accurately reflect the touching from a user of the LED tube lamp having the power loop.

Further, similar to the above-described embodiments, the circuits/modules described in these embodiments can be partially or all configured in one or more integrated circuit chips, as shown in FIGS. 21A to 22F, and thus the details are not described herein.

In some embodiments, when the LED tube lamp is in a state of normal lighting, the installation detection module 3000*e* may further provide a function of restraining/preventing flickering effects. In the structure with this function, as shown in FIG. 23A, the installation detection module 3000*e* may further include a ripple detection circuit 3580. And, in the structure with this function, the switch circuit 3200*e* can be configured as being connected in series to the LED module, for example, one of the installation detection terminals TE1 and TE2 can be electrically connected to the cathode of the LED module and the other installation detection terminal can be electrically connected to the ground terminal.

In the installation detection module 3000*e* having the function of restraining/preventing flickering effects, the circuit operations of the detection pulse generating module 3510, the control circuit 3520, the detection determining circuit 3530, the detection path circuit 3560, and the switch circuit 3200*e* in the detection mode are the same as those in previous embodiments, and in the detection mode the control circuit 3520 does not change the state of operation thereof and/or outputting signal(s) in response to a signal outputted by the ripple detection circuit 3580.

When the LED tube lamp enters into a normal operating mode, the ripple detection circuit 3580 would detect a voltage at the installation detection terminal TE2 and would generate and transmit a corresponding signal to the control circuit 3520. After receiving the signal, the control circuit 3520 would turn to control the switch circuit 3200*e* into operating in a linear region based on the signal received from the ripple detection circuit 3580, causing an equivalent impedance of the switch circuit 3200*e* between the installation detection terminals TE1 and TE2 to vary with the magnitude of the voltage detected by the ripple detection circuit 3580. Thereby, effects of maintaining steady luminance and restraining/preventing flickering in the LED tube lamp can be realized.

Figure 23E:
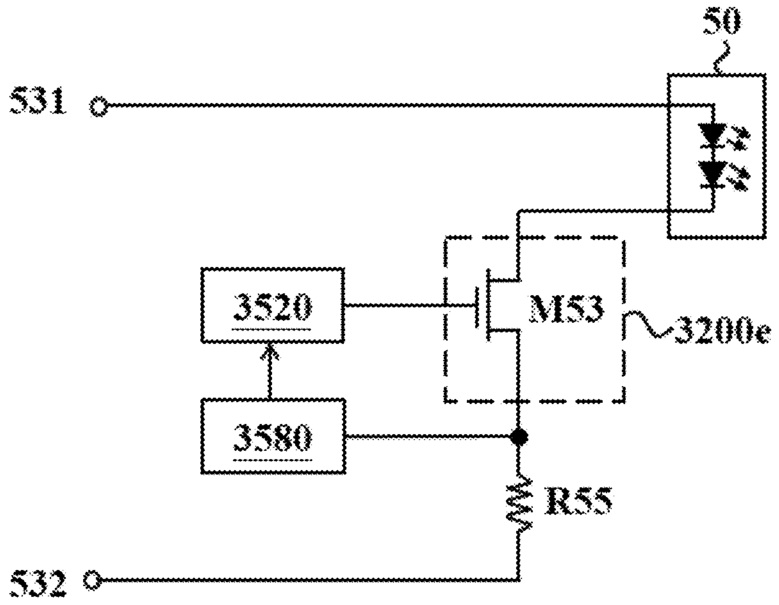
FIG. 23E is a schematic diagram of an installation detection module having the function of flicker suppression according to some embodiments.

Next, circuit operations of an installation detection module having the function of flicker suppression are further described with the embodiment illustrated in FIG. 23E. FIG. 23E is a schematic diagram of an installation detection module having the function of flicker suppression according to some embodiments. Referring to FIG. 23E, only module (s) and circuit(s) directly related to the function of flicker suppression of the installation detection module are illustrated and explained below, with other possible structures and configurations of the installation detection module similar to those described above with reference to embodiments of FIGS. 23A-23D.

In the present embodiment, the switching circuit 3200*e* includes a transistor M53, which is for example but not limited to an N-type MOSFET. The transistor M53 has a first terminal (such as drain terminal) coupled to a negative terminal of the LED module 50 and has a second terminal (such as source terminal) coupled through a resistor R55 to a second driving output terminal 532 (coupled to a ground terminal). So, the transistor M53 is serially connected between the negative terminal of the LED module 50 and a ground terminal.

When the LED tube lamp enters into a normal operation or lighting mode, the ripple detection circuit 3580 is configured to detect a voltage at the second terminal of the transistor M53 and then generate and transmit a corresponding ripple detection signal to the control circuit 3520. Then the control circuit 3520 outputs a corresponding signal to cause the variation in equivalent impedance of the switching circuit 3200*e* to be positively correlated with the magnitude of voltage detected by the ripple detection circuit 3580. For example, when the voltage detected by the ripple detection circuit 3580 is relatively greater, the control circuit 3520 outputs a corresponding signal to cause the equivalent impedance of the switching circuit 3200*e* to be greater; but when the voltage detected by the ripple detection circuit 3580 is relatively smaller, the control circuit 3520 outputs a corresponding signal to cause the equivalent impedance of the switching circuit 3200*e* to be smaller. Therefore, any ripple current originally arising from voltage fluctuation can be offset or regarded as being absorbed by the equivalent impedance of the switching circuit 3200*e*, thereby causing a current flowing through the LED module to be substantially maintained in relatively stable range and thus achieving the effects of flicker suppression.

In summary, in the embodiments of an installation detection module described above without the function of flicker suppression, under a normal operation mode a control circuit 3520 is configured to output a signal to cause a switching circuit 3200*e* to stably operate in a saturation region, so under the normal operation mode the equivalent impedance of the switching circuit 3200*e* substantially does not vary with the variation in voltage between the drain and source terminals of a transistor in the switching circuit 3200*e*, ignoring its channel-length modulation effects. On the other hand, in the embodiments of an installation detection module having the function of flicker suppression, under a normal operation mode a control circuit 3520 is configured to control a switching circuit 3200*e* to operate in a linear region rather than saturation region, thereby causing the equivalent impedance of the switching circuit 3200*e* to vary with the variation of a detected voltage, thereby reducing the flicker phenomenon.

Figure 24A:
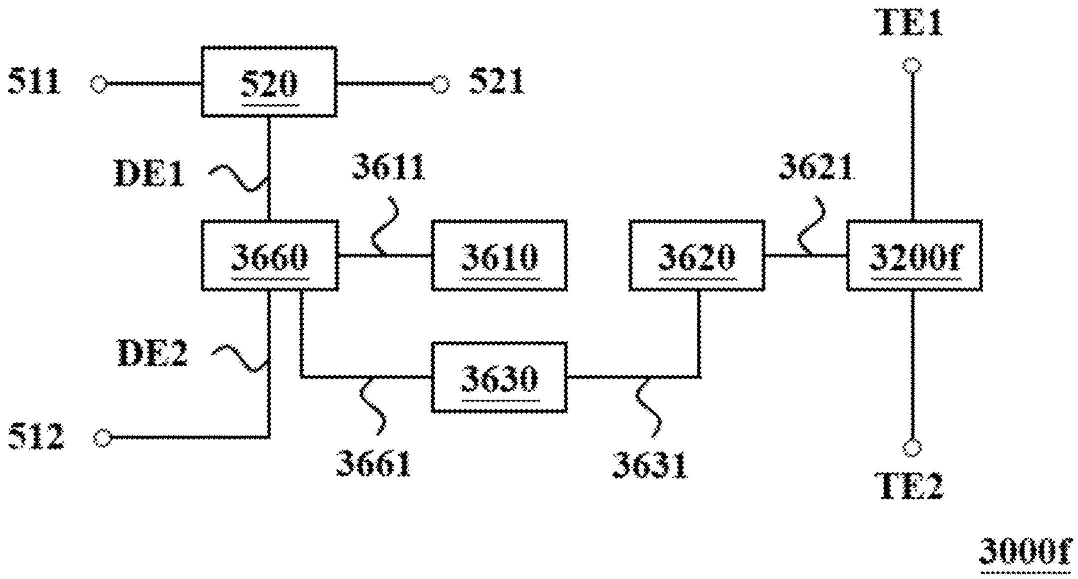
FIG. 24A is a block diagram of an installation detection module according to some exemplary embodiments.

FIG. 24A is a block diagram of an installation detection module according to an exemplary embodiment. Referring to FIG. 24A, the installation detection module 3000*f* includes a detection pulse generating module 3610, a control circuit 3620, a detection determining circuit 3630, a switch circuit 3200*f* and a detection path circuit 3660. Connection relationship of the detection pulse generating module 3610, the control circuit 3620, the detection determining circuit 3630 and the switch circuit 3200*f* are similar to the embodiment illustrated in FIG. 23A, and thus are not repeated herein. The difference between the present embodiment and the embodiment of FIG. 23A is the configuration and operation of the detection path circuit 3660. Specifically, the detection path circuit 3660 has a first detection connection terminal DE1 coupled to a low-level terminal of the filtering circuit 520 and a second detection connection terminal DE2 coupled to the rectifying output terminal 512. In this manner, the detection path circuit 3660 can be regarded as connecting between the low-level terminal of the filtering circuit 520 and the rectifying output terminal 512. For example, the low-level terminal of the filtering circuit 520 is connected to the rectifying output terminal 512 via the detection path circuit 3660.

Figure 24B:
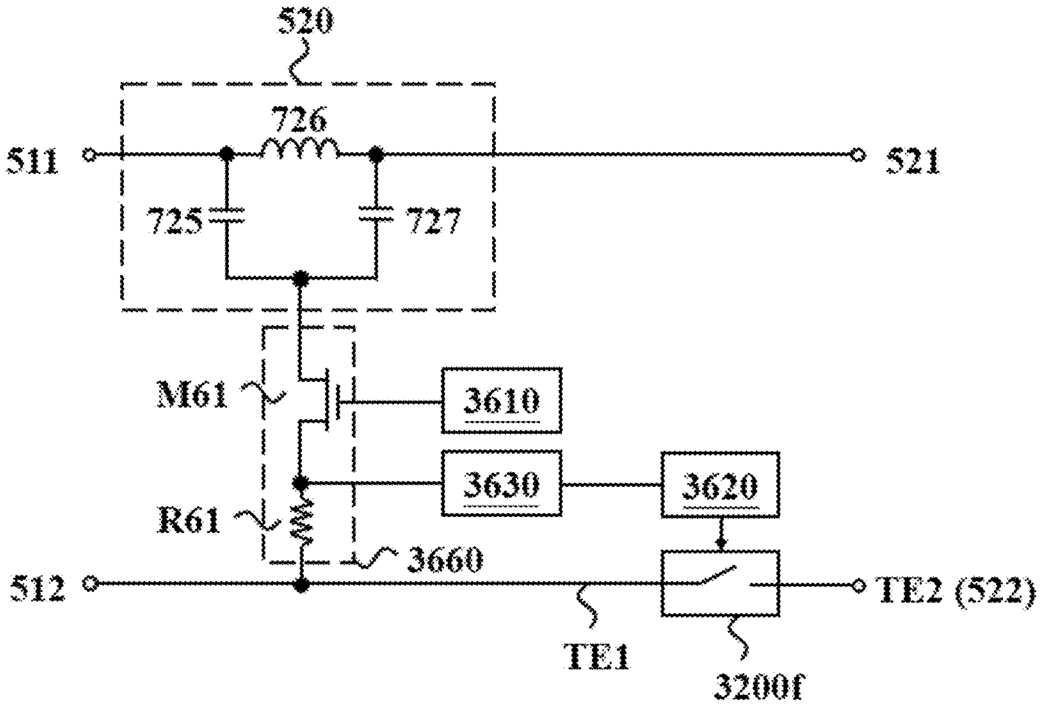
FIGS. 24B-24C are schematic circuit diagram of an installation detection modules according to some exemplary embodiments.
Figure 24C:
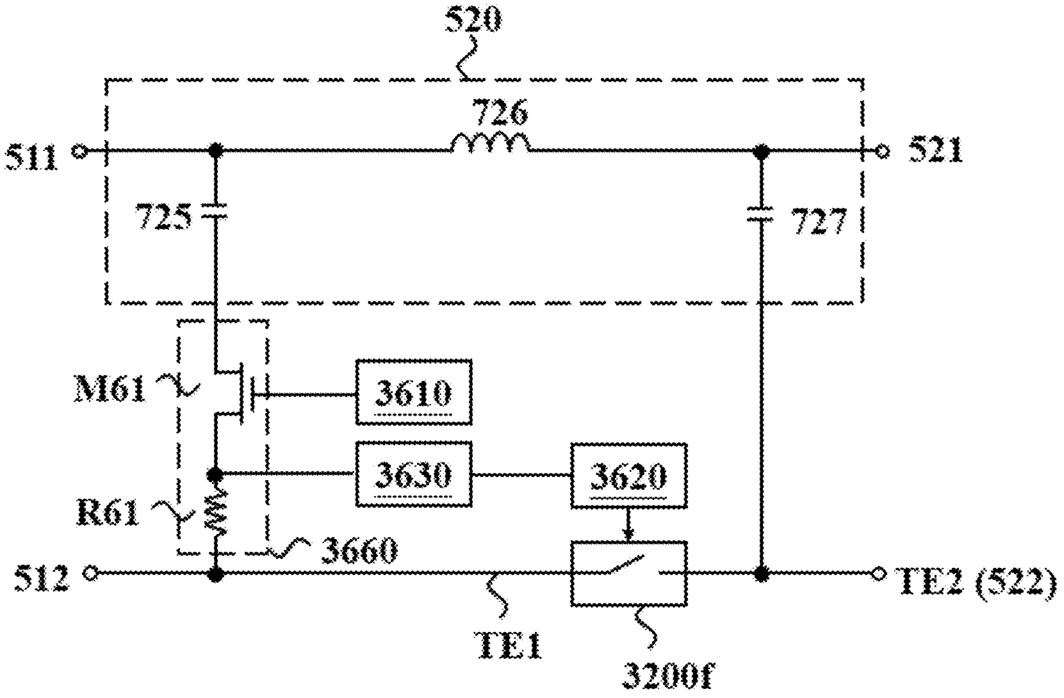

Configuration of the detection path circuit 3660 can be as illustrated in FIG. 24B or FIG. 24C. FIG. 24B or FIG. 24C are circuit structure diagrams of an installation detection module according to different embodiments.

Referring to FIG. 24B, the filtering circuit 520 includes, for example, capacitors 725 and 727 and an inductor 726, which are configured as a pi-type filter. The inductor 726 has a first end connected to the rectifying output terminal 511 and a second end connected to the filtering output terminal 512, which means the inductor 726 is connected between the rectifying output terminal 511 and the filtering output terminal 521 in series. The capacitor 725 has a first end connected to the first end of the inductor 726 and a second end connected to the detection path circuit 3660. The capacitor 726 has a first end connected to the second end of the inductor 726 and a second end connected to the second end of the capacitor 725, and the second ends of the capacitors 725 and 727 can be regarded as the low-level terminal. The installation detection module includes a detection pulse generating module 3610, a control circuit 3620, a detection determining circuit 3630, a switch circuit 3200*f* and a detection path circuit 3660. The detection path circuit 3660 includes a resistor R61 and a transistor M61. The transistor M61 has a gate electrode coupled to the detection pulse generating module 3610, a source electrode coupled a first end of the resistor R61, and a drain electrode coupled to the second ends of the capacitors 725 and 727. A second end of the resistor R61 can be regarded as the second detection connection terminal (e.g., DE2) and coupled to the rectifying output terminal 512 and the first installation detection terminal TE1. The detection determining circuit 3630 is coupled to the first end of the resistor R61 to detect magnitude of the current flowing through the detection path. In the present disclosed embodiment, the detection path can be regarded as formed by the capacitors 725 and 727, the inductor 726, the resistor R61 and the transistor M61.

In some embodiments, when the transistor M61 receives a pulse signal provided from the detection pulse generating module 3610, which means the LED tube lamp (or power supply module) is under the detection mode, the transistor is turned on during the pulse-on period. Under the condition that at least one end of the LED tube lamp is correctly installed in the lamp socket, a current path formed, via the detection path, between the output rectifying terminals 511 and 512 is conducted in response to the transistor M61 being turned on, and therefore generates a voltage signal on the first end of the resistor R61. When there is no person touching the conductive part of the LED tube lamp (or the LED tube lamp is correctly installed in the lamp socket), a level of the voltage signal is determined by the voltage division of the equivalent impedance of the filtering circuit 520 and the resistor R61. When there is a person touching the conductive part of the LED tube lamp (or the LED tube lamp is not correctly installed in the lamp socket), a body impedance is equivalent to serially connect between the second detection connection terminal (e.g., DE2) and the ground terminal. In addition to temporarily turning on the transistor M61 during the detection mode, in some embodiments, the transistor M61 further remains being cut off when the control circuit 3620 determines that the LED tube lamp is correctly installed in the lamp socket, so that the power supply module can operate normally and provide current to the LED module.

Referring to FIG. 24C, the installation detection module includes a detection pulse generating circuit 3610, a control circuit 3620, a detection determining circuit 3630, a switch circuit 3200*f*, and a detection path circuit 3660. The configuration and operation of the installation detection module of the present embodiment are substantially the same as the embodiment illustrated in FIG. 24B, the difference between the embodiments of FIG. 24B and FIG. 24C is that the detection path circuit 3660 of FIG. 24C is disposed between the second end of the capacitor 725 and the rectifying output terminal 512, and the second end of the capacitor 727 is directly connected to the second installation detection terminal TE2 (or second filtering output terminal 522).

Compared to the embodiments illustrated in FIG. 23A, since the passive components of the filtering circuit 520 become part of the detection path, the current size of the current flowing through the detection path circuit 3660 is much smaller than the detection path circuit 3560, and thereby the transistor (e.g., transistor M61 or R61) of the detection path circuit 3660 can be implemented by the components with smaller size to effectively reduce the cost. In addition, resistor R61 can be set as a relatively small resistor, and when the human body equivalent resistance is connected to the LED tube lamp, the equivalent impedance on the sensing path would be changed more drastically, making the detection result less susceptible to the offset of other component parameters. Further, due to the small scale of the current, the signal transmission design of the control circuit 3620 and the detection determining circuit 3630 can meet the signal format requirements of the driving controller more easily, thereby reducing the difficulty of integrated design of the installation detection module the driving circuit. Details will be described in the following embodiments.

Figure 25A:
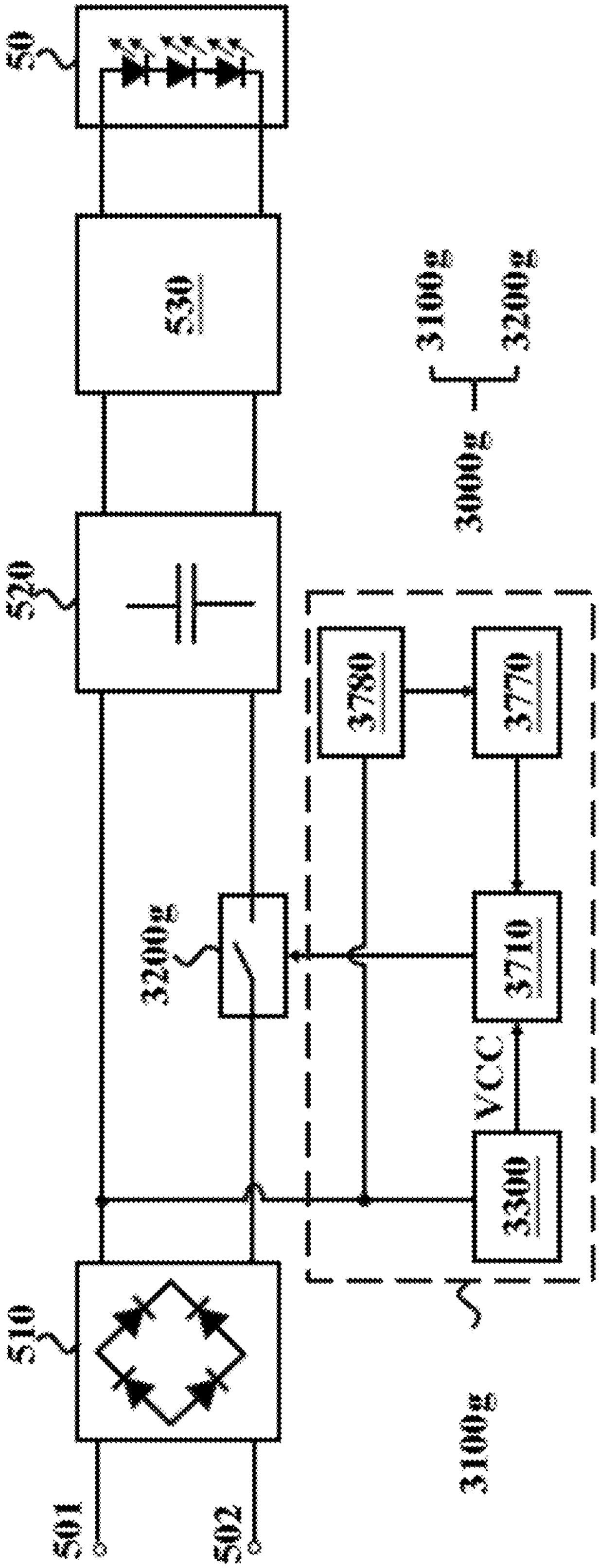
FIG. 25A is a block diagram of an installation detection module according to some exemplary embodiments.

Referring to FIG. 25A, FIG. 25A is a circuit block diagram of a power supply module of an LED tube lamp according to some embodiments of the present disclosure. The power supply module of these embodiments includes a rectifying circuit 510, a filtering circuit 520, a driving circuit 530 and an installation detection module 3000*g*. The installation detection module 3000*g* includes a detection controller 3100*g*, a switch circuit 3200*g* and a bias circuit 3300. The detection controller 3100*g* includes a control module 3710, an activation control circuit 3770 and a detection period determining circuit 3780. The configurations and operations of rectifying circuit 510, filtering circuit 520, and driving circuit 530 can refer to the descriptions of the related above embodiments, and the relevant details are not described herein again.

In installation detection module 3000*g*, the switch circuit 3200*g* is electrically connected in series to the power supply loop/power loop of the power supply module (in FIG. 25A, the switch circuit 3200*g* is disposed between the rectifying circuit 510 and the filtering circuit 520, as an exemplary embodiment), and is controlled by the control module 3710 to switch the turn on/off state. The control module 3710 outputs a control signal in a detection mode to temporarily turn on the switch circuit 3200*g*, in order to detect whether an external impedance is electrically connected to the detection path of the power supply module (which means the user may be exposed to an electric shock risk) during the period in which the switch circuit 3200*g* is turned on (i.e., during the period in which the power supply loop/power loop is turned on/conducted). The detection result determines whether to maintain the detection mode so that the switch circuit 3200*g* is temporarily turned on in a discontinuous form, or to enter into an operating mode so that switch circuit 3200*g* responds to the installation status to remain turned-on or cut-off. The length of the period represented by "temporarily turning on the switch circuit" refers to the length of the period in which the current on the power loop passes through the human body and does not cause any harm to the human body. For example, the length of the period is less than 1 millisecond. However, the present disclosure is not limited thereto. In general, the control module 3710 can achieve the operation of temporarily turning on the switch circuit 3200*g* by transmitting a control signal having pulse waveform. The specific duration of the pulse-on period can be adjusted according to the impedance of the detection path. Descriptions of the circuit configuration examples and the related control actions of the control module 3710 and the switch circuit 3200*g* can refer to those description of other embodiments related to the installation detection module.

The bias circuit 3300 is electrically connected to the power loop to generate a driving voltage VCC based on the rectified signal (i.e., the bus voltage). The driving voltage VCC is provided to control module 3710 to activate/enable the control module 3710, and for the control module 3710 operate in response to the driving voltage.

The activation control circuit 3770 is electrically connected to the control module 3710 and is configured to determine whether to affect the operating state of control module 3710 according to the output signal of detection period determining circuit 3780. For example, when detection period determining circuit 3780 outputs an enable signal, activation control circuit 3770 will respond to the enable signal and control module 3710 to stop operating when detection period determining circuit 3780 outputs a disable signal, activation control circuit 3770 will respond to the disable signal and control the control module 3710 to maintain a normal operating state (i.e., which does not affect the operational state of the control module 3710), where activation control circuit 3770 can control the control module 3710 to stop operation by using the driving voltage VCC or providing a low-level start signal to the enable pin of the control module 3710 However, the present disclosure is not limited to these particular examples.

The detection period determining circuit 3780 is configured to sample the electrical signal on the detection path/power loop, thereby calculating the operation time of the control module 3710 and outputting a signal indicating the calculation result to activation control circuit 3770, so that activation control circuit 3770 controls the operating state of the control module 3710 based on the indicated the calculation result.

The operation of installation detection module 3000*g* of the embodiment of FIG. 25A is described below. When rectifying circuit 510 receives an external power source through pins 501 and 502, bias circuit 3300 generates a driving voltage VCC according to the rectified bus voltage. The control module 3710 is activated or enabled in response to the driving voltage VCC and enters the detection mode. In the detection mode, control module 3710 periodically outputs a pulse-shaped control signal to switch circuit 3200*g*, so that switch circuit 3200*g* is periodically turned on and turned off. Under the operation of the detection mode, the current waveform on the power loop is similar to the current waveform within the detection period Tw in FIG. 45D (i.e., a plurality of spaced-apart current pulses Idp). In addition, detection period determining circuit 3780, upon receiving the bus voltage on the power loop, starts calculating the operation time of the control module 3710 in the detection mode, and outputs a signal indicating the calculation result to activation control circuit 3770.

In the case when the operation time of the control module 3710 has not reached the preset time length, the activation control circuit 3770 does not affect the operating state of the control module 3710. At this time, the control module 3710 determines to maintain the detection mode or enter into the operational mode according to its own detection result. If the control module 3710 determines to enter into the operating mode, the control module 3710 controls the switch circuit 3200*g* to remain in the turn-on state and block the effect of other signals on its operating state. In this case, in the operating mode, regardless the output by the activation control circuit 3770, the operating state of the control module 3710 is not affected.

In the case when the operation time of the control module 3710 has reached the preset time length, and the control module 3710 is still in the detection mode, the activation control circuit 3770 controls, in response to the output of the detection period determining circuit 3780, the control module 3710 to stop operating. At this time, the control module 3710 no longer outputs a pulse signal, and maintains the switch circuit 3200*g* in the turn-off state until the control module 3710 is reset. The preset time length can be regarded as the detection period Tw shown in FIG. 45D.

According to operation described above, the installation detection module 3000*g* can let the power supply module have input current (Iin) waveforms as shown in FIGS. 45D to 45F by setting the pulse interval and the reset cycle of the control signal, thereby ensuring that the electric power in the detection mode is still within a reasonably safe range, to avoid any danger to the human body by the detection current.

From the point of view of circuit operation, the activation control circuit 3770 and the detection period determining circuit 3780 can be regarded as a delay control circuit, which is capable of turning on a specific path, after the LED tube lamp is powered up for a preset delay, to control a target circuit (e.g., the control module 3710). By selecting the setting of the specific path, a delay conduction for the power loop or a delay turning-off/cut-off for the installation detection module can be implemented by the delay control circuit in the LED tube lamp.

Figure 25B:
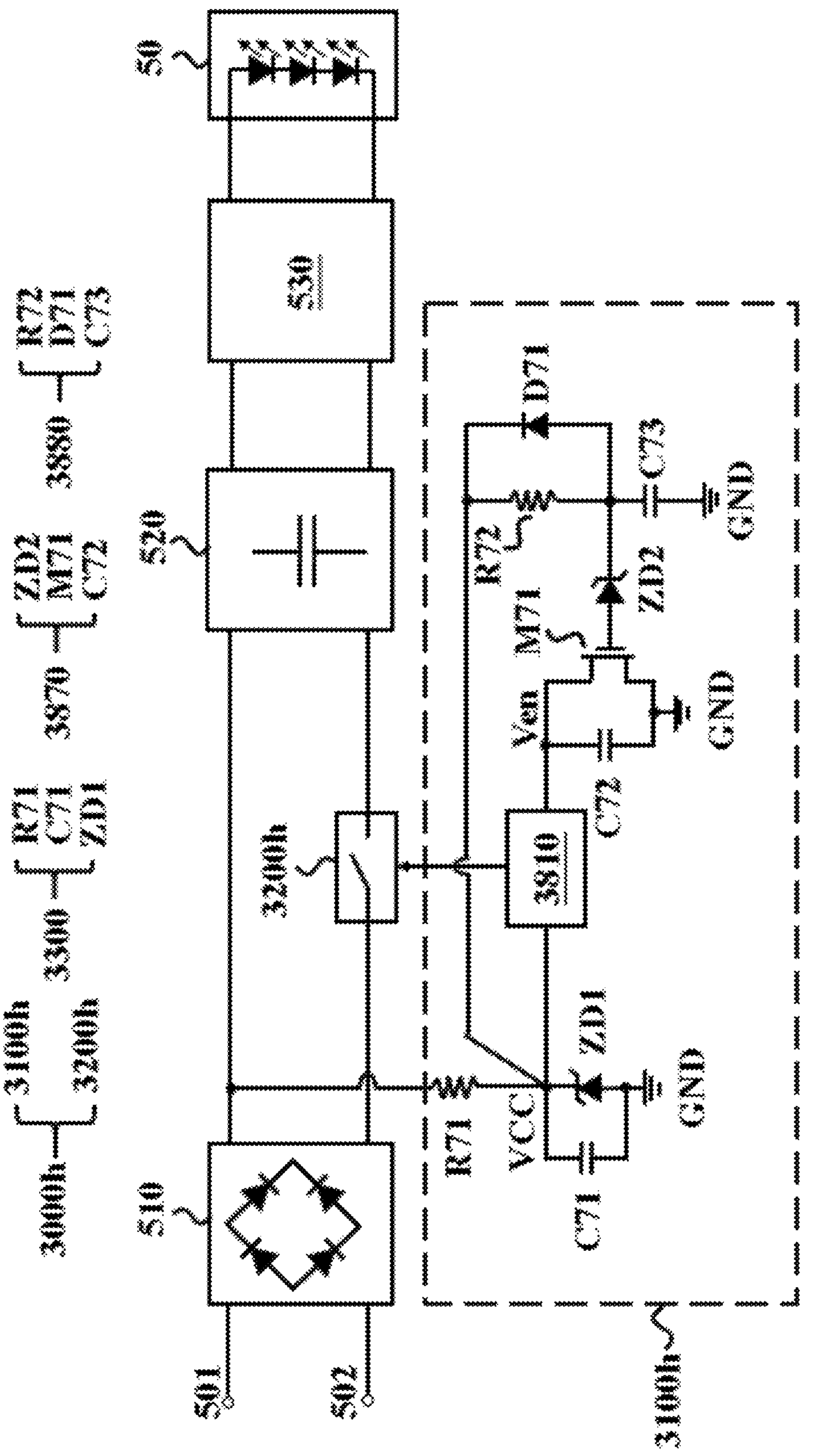
FIGS. 25B-25D are schematic circuit diagrams of an installation detection module according to some exemplary embodiments.

Referring to FIG. 25B, FIG. 25B is a circuit block diagram of an installation detection module for an LED tube lamp according to some embodiments of the present disclosure. The power supply module includes a rectifying circuit 510, a filtering circuit 520, a driving circuit 530, and an installation detection module 3000*h*. The installation detection module 3000*h* includes a detection controller 3100*h*, a switch circuit 3200*h*, and a bias circuit 3300. The detection controller 3100*h* includes a control module 3810, an activation control circuit 3870, and a detection period determining circuit 3880. The configurations and operations of rectifying circuit 510, filtering circuit 520, and driving circuit 530 can refer to the descriptions of the related embodiments. In addition, the configurations and operations of control module 3810 and switch circuit 3200*h* can refer to the descriptions of the embodiment of FIG. 25A above, and details are not described herein again.

In one embodiment, bias circuit 3300*h* includes a resistor R71, a capacitor C71, and a Zener diode ZD1. The first end of resistor R71 is electrically connected to the rectified output terminal (i.e., electrically connected to the bus). Capacitor C71 and Zener diode ZD1 are electrically connected in parallel with each other, and their first ends are both electrically connected to the second end of resistor R71. The power input terminal of control module 3810 is electrically connected to a common node of resistor R71, capacitor C71, and Zener diode ZD1 (i.e., the bias node of bias circuit 3300*h*) to receive the driving voltage VCC on the common node.

Activation control circuit 3870 includes a Zener diode ZD2, a transistor M71, and a capacitor C72. The anode of Zener diode ZD2 is electrically connected to the control terminal of transistor M71. The first end of transistor M71 is electrically connected to control module 3810, and the second end of transistor M71 is electrically connected to the ground terminal GND. Capacitor C72 is electrically connected between the first end and the second end of transistor M71.

Detection period determining circuit 3880 includes a resistor R72, a diode D71, and a capacitor C73. The first end of resistor R72 is electrically connected to the bias node of bias circuit 3300, and the second end of resistor R72 is electrically connected to the cathode of Zener diode ZD2. The anode of diode D71 is electrically connected to the second end of resistor R72, and the cathode of diode D71 is electrically connected to the first end of resistor R72. The first end of capacitor C73 is electrically connected to the second end of resistor R72 and the anode of diode D71, and the second end of capacitor C73 is electrically connected to the ground terminal GND.

The operation of installation detection module 3000*h* of the embodiment of FIG. 25A is described below. When rectifying circuit 510 receives an external power source through pins 501 and 502, the rectified bus voltage charges capacitor C71, thereby establishing a driving voltage VCC at the bias node. Control module 3810 is enabled in response to the driving voltage VCC and enters into the detection mode. In the detection mode, in the first signal cycle, control module 3810 outputs a pulse-shaped control signal to the switch circuit 3200*h*, so that the switch circuit 3200*h* is temporarily turned on and then cut off.

During the switch circuit 3200*h* being turned-on, the capacitor C73 is charged in response to the driving voltage VCC on the bias node, such that the voltage across capacitor C73 gradually rises. In the first signal period, because the increased voltage across capacitor C73 has not reached the threshold level of transistor M71, transistor M71 will remain in the off state. As a result, the enable signal Ven is maintained at a high level accordingly. Then, during the switch circuit 3200*h* being turned-off or cut-off, capacitor C73 will substantially maintain the voltage level or slowly discharge, wherein the voltage change caused by the discharge of capacitor C73 during the switch circuit being turned-off is less than that caused by the charging during the switch circuit being turned-on. The voltage across capacitor C73 during the switch being turned off will be less than or equal to the highest voltage level during the switch being turned on, and the lowest voltage level will not be lower than its initial level at the charging start point, so transistor M71 will always remain in the off state in the first signal period, and the start signal Ven is maintained at a high level. Control module 3810 is maintained in an enabled state in response to a high level enable signal Ven. In the enabled state, control module 3810 determines whether the LED tube lamp is correctly installed according to the signal on the detection path (i.e., determines whether there is additional impedance is introduced). The installation detection mechanism of this part is the same as the previous embodiment, and details are not further described herein.

When control module 3810 determines that the LED tube lamp has not been properly installed to the socket, control module 3810 maintains the detection mode and continuously outputs a pulse-shaped control signal to control switch circuit 3200*h*. In the following signal periods, activation control circuit 3870 and detection period determining circuit 3880 continue to operate in a manner similar to the operation of the first signal period. Specifically, capacitor C73 is charged during the on period of each signal period, so that the voltage across capacitor C73 rises step by step in response to the pulse width and the pulse period. When the voltage across capacitor C73 exceeds the threshold level of transistor M71, transistor M71 is turned on so that the enable signal Ven is pulled down to the ground level/low level. At this time, control module 3810 is turned off in response to the low level enable signal Ven. When control module 3810 is turned off, switch circuit 3200*h* is maintained in turn-off/cut-off state regardless of whether or not an external power source is electrically connected.

When the control module 3810 determines that the LED tube lamp has been properly installed in the lamp socket, the control module 3810 enters an operational mode and outputs a control signal to maintain the switch circuit 3200*h* in a turn-on state. In the operating mode, the control module 3810 does not change the output control signal in response to the enable signal Ven. Even if the enable signal Ven is pulled down to a low level, the control module 3810 does not turn off switch circuit 3200*h* again.

From the point of view of the multiple signal periods in the detection mode, the current waveform measured on the power loop is as shown in FIG. 45D, in which the period of capacitor C73 charged from the initial level to the threshold level of transistor M71 corresponds to the detection period Tw. In the detection mode, control module 3810 continues outputting pulse signal until capacitor C73 is charged to the threshold level of transistor M71, resulting in intermittent current in the power loop. And when the voltage across capacitor C73 exceeds the threshold, the pulse signal is stopped to avoid any danger to the human body by the increased electric power in power loop.

From another perspective, the detection period determining circuit 3880 can be regarded as calculating the pulse-on period of the calculation control signal. When the preset value is reached during the pulse-on period, the control signal is sent out to control activation control circuit 3870, then activation control circuit 3870 affects the operation of control module 3810 to block the pulse output.

In the circuit architecture of this embodiment, the length of the detection period Tw (i.e., the time required for capacitor C73 to reach the threshold voltage of transistor M71) is mainly controlled by adjusting the capacitance value of capacitor C73. The main function of the components such as resistor R72, diode D71, Zener diode ZD2, and capacitor C72 is to support activation control circuit 3870 and detection period determining circuit 3880 to provide voltage stability, voltage limit, current limit, or protection.

Figure 25C:
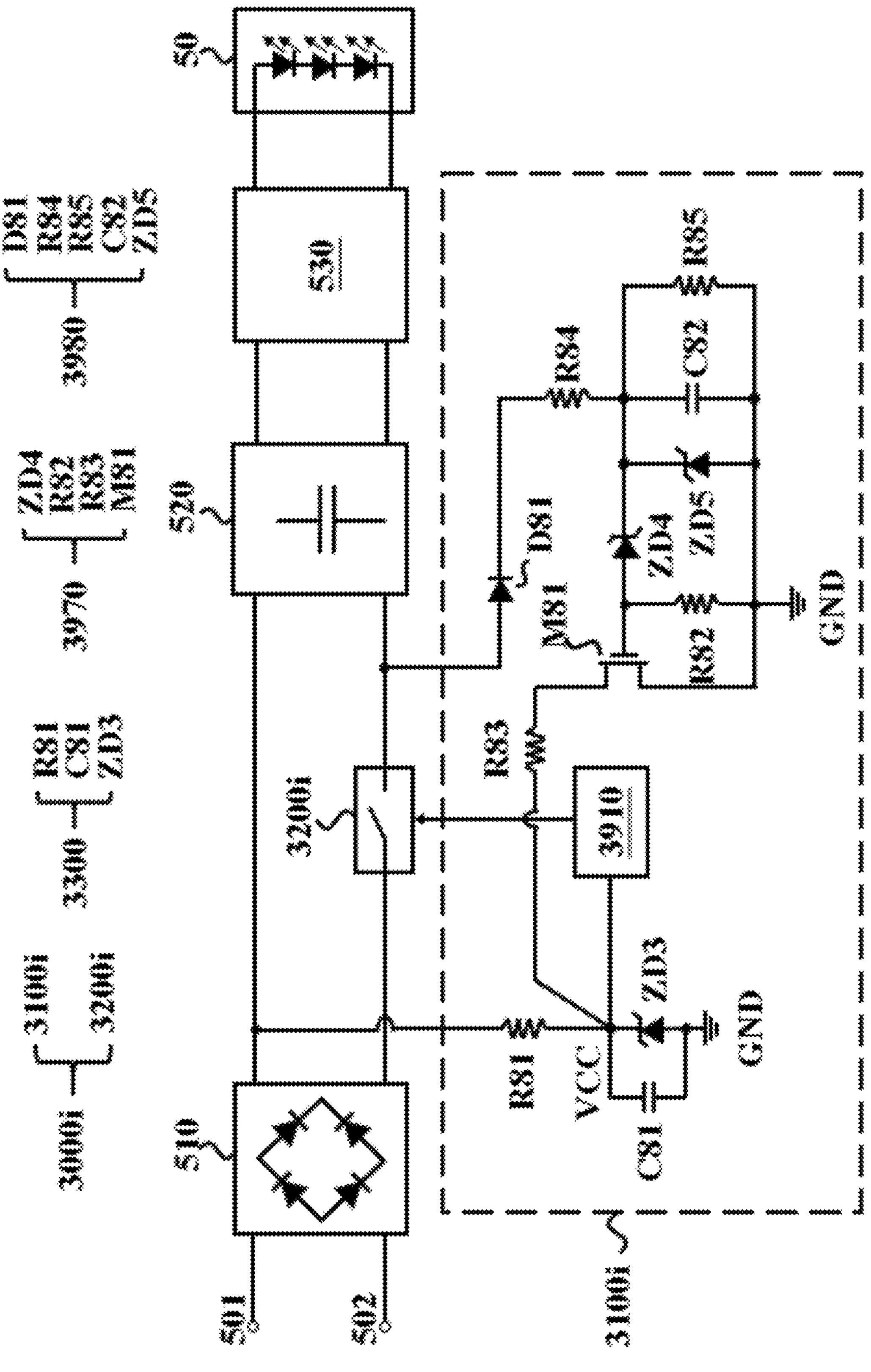

Referring to FIG. 25C, FIG. 25C is a circuit diagram of an installation detection module for a LED tube lamp according to some embodiments of the present disclosure. The power supply module of the embodiment includes rectifying circuit 510, filtering circuit 520, driving circuit 530, and an installation detection module 3000*i*. Installation detection module 3000*i* includes a detection controller 3100*i*, a switch circuit 3200*i*, and a bias circuit 3300*i*. The detection controller 3100*i* includes a control module 3910, an activation control circuit 3970 and a detection period determining circuit 3980. The configurations and operations of rectifying circuit 510, filtering circuit 520, and driving circuit 530 can refer to the descriptions of the related embodiments. In addition, the configurations and operations of control module 3910 and switch circuit 3200*i* can refer to the descriptions of the embodiment of FIG. 25A mentioned above, and the details are not described herein again.

Bias circuit 3300*i* includes a resistor R81, a capacitor C81, and a Zener diode ZD3. The first end of resistor R81 is electrically connected to the rectified output (i.e., electrically connected to the bus). Capacitor C81 and Zener diode ZD3 are electrically connected in parallel with each other, and their first ends are both electrically connected to the second end of resistor R81. The power supply input of control module 3910 is electrically connected to a common node of resistor R81, capacitor C81, and Zener diode ZD3 (i.e., the bias node of bias circuit 3300*i*) to receive the driving voltage VCC.

Activation control circuit 3970 includes a Zener diode ZD4, a transistor M81, and resistors R82 and R83. The anode of Zener diode ZD2 is electrically connected to the control terminal of transistor M81. The first end of resistor R82 is electrically connected to the anode of Zener diode ZD4 and the control terminal of transistor M81, and the second end of resistor R82 is electrically connected to the ground terminal GND. The first end of transistor M81 is electrically connected to the bias node of bias circuit 3300 through a resistor R83, and the second end of transistor M81 is electrically connected to the ground terminal GND.

Detection period determining circuit 3980 includes a diode D81, resistors R84 and R85, a capacitor C82, and a Zener diode 3775. The anode of diode D81 is electrically connected to one end of switch circuit 3200*i*, which can be regarded as the detecting node of detection period determining circuit 3980. The first end of resistor R84 is electrically connected to the cathode of diode D81, and the second end of resistor R84 is electrically connected to the cathode of Zener diode ZD4. The first end of resistor R85 is electrically connected to the second end of resistor R84, and the second end of resistor R85 is electrically connected to the ground terminal GND. Capacitor C82 and Zener diode ZD5 are both electrically connected in parallel with resistor R85, wherein the cathode and the anode of Zener diode ZD5 are electrically connected to the first end and the second end of resistor R85 respectively.

The operation of the installation detection module 3000*i* of this embodiment is described below. When rectifying circuit 510 receives an external power source through pins 501 and 502, the rectified bus voltage charges capacitor C81, thereby establishing a driving voltage VCC at the bias node.

Control module 3910 is enabled in response to the driving voltage VCC and enters the detection mode. In the detection mode, in the first signal cycle, control module 3910 sends a pulse-shaped control signal to switch circuit 3200*i*, so that switch circuit 3200*i* is temporarily turned on and then turned off.

During the period that switch circuit 3200*i* is turned on, the anode of diode D81 can be regarded as electrically connected to ground, so capacitor C82 is not charged. During the first signal period, the voltage across capacitor C82 will remain at the initial level during the switch circuit 3200*i* being turned on, and transistor M81 will remain in the turn-off/cut-off state, and thus will not affect the operation of control module 3910. Next, during the switch circuit 3200*i* being turned off/cut off, the power loop causes the voltage level on the detecting node to rise in response to the external power supply, wherein the voltage applied to the capacitor C82 is equal to the voltage division of the resistors R84 and R85. Therefore, during the period that the switch circuit 3200*i* is turned off, the capacitor C82 is charged in response to the voltage division of resistors R84 and R85, and the voltage across the capacitor C82 gradually rises. During the first signal period, because the increased voltage across the capacitor C82 has not reached the threshold level of the transistor M81, the transistor M81 remains in an off state, so that the driving voltage VCC remains unchanged. Since the transistor M81 remains in the off state during the first signal period no matter whether the switch circuit 3200*i* is turned on or cut off, the driving voltage VCC is not affected. Therefore, control module 3910 is maintained in the enabled or activated state in response to the driving voltage VCC. In the activated state, control module 3910 determines whether the LED tube lamp is correctly installed according to the signal on the detection path (i.e., determines whether an external impedance is introduced). The installation detection mechanism of this part is the same as the previous embodiment, and details are not described herein again.

When control module 3910 determines that the LED tube lamp has not been properly installed to the socket, control module 3910 maintains the detection mode and continuously outputs a pulse-shaped control signal to control switch circuit 3200*i*. In the following signal periods, activation control circuit 3970 and detection period determining circuit 3980 continue to operate in a manner similar to the operation of the first signal period. That is, capacitor C82 is charged during the off period of each signal period, so that the voltage across capacitor C82 rises step by step in response to the pulse width and the pulse period. When the voltage across capacitor C82 exceeds the threshold level of transistor M81, transistor M81 is turned on causing the bias node to be shorted to the ground terminal GND, thereby causing the driving voltage VCC to be pulled down to the ground/low voltage level. At this time, the control module 3910 is disabled or deactivated in response to the driving voltage VCC of the low voltage level. When the control module 3910 is disabled or deactivated, the switch circuit 3200*i* is maintained in an off state regardless of whether or not an external power source is electrically connected.

When the control module 3910 determines that the LED tube lamp has been properly installed in the lamp socket, the control module 3910 will enter an operating mode and issue a control signal to maintain the switch circuit 3200*i* in a conductive state or turn-on state. In the operating mode, since the switch circuit 3200*i* remains turned on, the transistor M81 is maintained in an off state, so that the driving voltage VCC is not affected, and the control module 3910 can operate normally.

From the point of view of the multiple signal periods in the detection mode, the current waveform measured on the power loop is as shown in FIG. 45D, in which the period of capacitor C82 charged from the initial level to the threshold level of transistor M81 corresponds to the detection period Tw. In the detection mode, control module 3910 continues outputting pulse signal until capacitor C82 is charged to the threshold level of transistor M81, resulting in intermittent current in the power loop. And when the voltage across capacitor C82 exceeds the threshold, the pulse signal is stopped to avoid any danger to human body by the increased electric power in power loop.

From another perspective, the detection period determining circuit 3980 is in effect used to calculate the pulse-off period of the control signal, and when the calculated pulse-off period has reached a preset value, then to output a signal to control the activation control circuit 3970, causing the activation control circuit 3970 to affect operation of the control module 3910 so as to block or stop outputting of the pulse signal.

In the circuit architecture, the length of the detection period Tw (i.e., the time required for capacitor C82 to reach the threshold voltage of transistor M81) is mainly controlled by adjusting the capacitance value of capacitor C82 and resistance values of resistors R84, R85, and R82. Components such as diode D81, Zener diodes ZD5 and ZD4, and resistor R83 are used to assist in the operations of activation control circuit 3970 and the detection period determining circuit 3980 to provide the function of voltage stabilization, voltage limiting, current limiting, or protection.

Figure 25D:
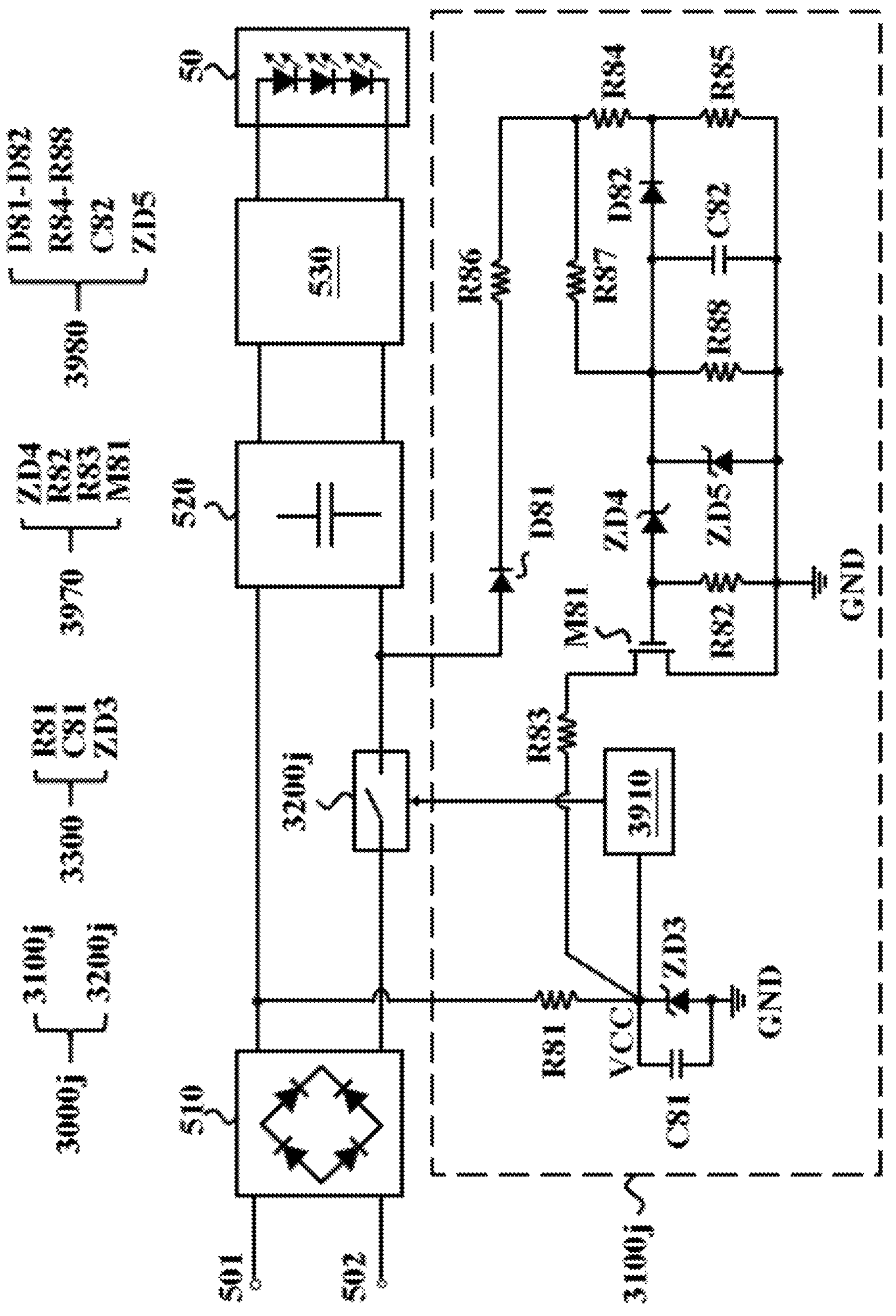

Referring to FIG. 25D, FIG. 25D is a circuit diagram of an installation detection module for an LED tube lamp according to some embodiments of the present disclosure. The power supply module of the embodiment includes rectifying circuit 510, filtering circuit 520, driving circuit 530, and installation detection module 3000*j*. Installation detection module 3000*j* includes detection controller 3100*j*, switch circuit 3200*j*, and bias circuit 3300. The detection controller 3100*j* includes control module 3910, activation control circuit 3970, and detection period determining circuit 3980. In the present embodiment, the configurations and operations of installation detection module 3000*j* is almost the same as these of the embodiment of FIG. 25C. The main difference between FIGS. 18C and 18D is that detection period determining circuit 3980 of the present embodiment in FIG. 25D includes not only diode D81, resistors R84 and R85, capacitor C82 and Zener diode ZD5, but also resistors R86, R87 and R88 and diode D82. Resistor R86 is disposed in series between diode D81 and resistor R84. The first end of resistor R87 is electrically connected to the first end of resistor R84, and the second end of resistor R87 is electrically connected to the cathode of Zener diode ZD4. Resistor R88 and capacitor C82 are electrically connected in parallel with each other. The anode of diode D82 is electrically connected to the first end of capacitor C82 and the cathode of Zener diode ZD4, and the cathode of diode D82 is electrically connected to the second end of resistor R84 and the first end of resistor R85.

In the circuit architecture of this embodiment, the circuit for charging capacitor C82 is changed from resistors R84 and R85 to resistors R87 and R88. Capacitor C82 is charged based on the voltage division of resistors R87 and R88. Specifically, the voltage on the detecting node first generates a first-order partial voltage on the first end of resistor R84 based on the voltage division of resistors R86, R84, and R85, and then the first-order partial pressure generates a second order partial voltage at the first end of capacitor C82 based on the voltage division of resistors R87 and R88. In this configuration, the charging rate of capacitor C82 can be controlled by adjusting the resistance values of resistors R84, R85, R86, R87, and R88, and not limited by just adjusting capacitor value. As a result, the size of capacitor C82 can be effectively reduced. On the other hand, since resistor R85 is no longer working as a component on the charging circuit, a smaller resistance value can be selected, so that the discharging rate of capacitor C82 can be increased, thereby the reset time for the detection period determining circuit 3980 can be reduced.

Figure 26A:
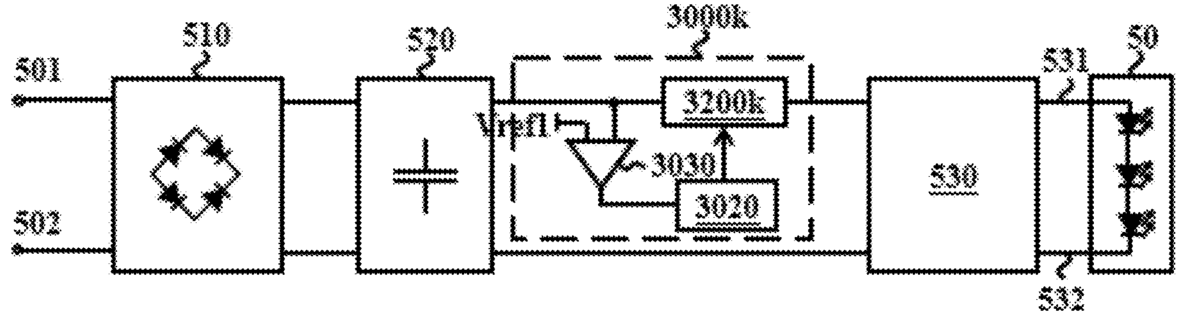
FIGS. 26A-26B are schematic circuit diagrams of an installation detection module according to some exemplary embodiments.

FIG. 26A is a block diagram of an exemplary power supply module in an LED tube lamp according to some exemplary embodiments. Referring to FIG. 26A, the installation detection module 3000*k* has a circuit configuration for continuously detecting the signal on the power loop. The installation detection module 3000*k* includes the control circuit 3020, the detection determining circuit 3030 and the current limiting circuit 3200*k*. The control circuit 3620 is configured to control the current limiting circuit 3200*k* according to the detection result generated by the detection determining circuit 3030, so that the current limiting circuit 3200*k* determines whether to perform the current limiting operation, for limiting the current on the power loop, based on the control of the control circuit 3020. In the present embodiment, the control circuit 3020 is preset to not perform the current limiting operation, which means the current on the power loop is not limited by the current limiting circuit 3200*k* at the preset state. Therefore, under the preset state, as long as the external AC power source is connected to the LED tube lamp, the input power can be provided to the LED module 50 through the power loop.

More specifically, a detection determining circuit 3030 can be activated or enabled by an external power source, begin to continually detect signals at a specific node on the power loop, and transmit a detection result signal to the control circuit 3020. Based on one or more signal features, including voltage level, signal waveform, frequency, and other features, of the detection result signal, the control circuit 3020 determines whether there is an occurrence of a human user touching. When the control circuit 3020 determines, based on the detection result signal, that there is an occurrence of a human user touching, the control circuit 3020 then controls the current limiting circuit 3180 to perform the current limiting operation, in order to limit the current on the power loop to be lower than a specific current value, thereby preventing the occurrence of electric shock to a person. It should be noted that the specific node can be located at the input terminal/side or output terminal/side of any of a rectifying circuit 510, a filtering circuit 520, a driving circuit 530, and an LED module 50, but location of the specific node is not limited thereto.

Figure 26B:
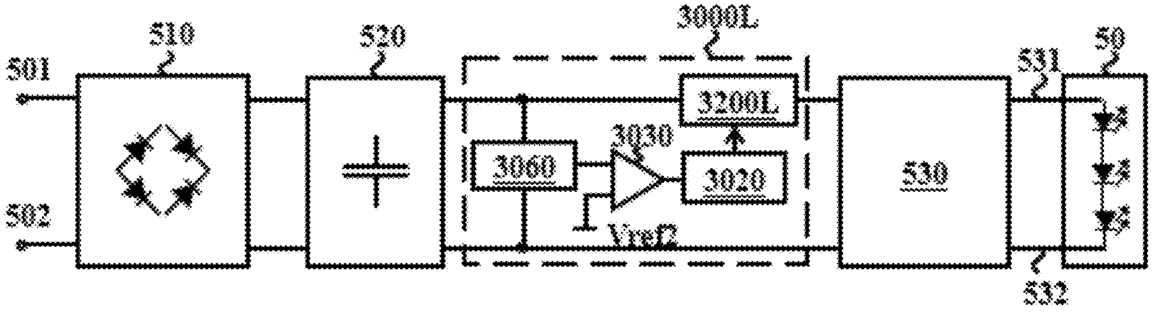

FIG. 26B is a block diagram of an exemplary power supply module in an LED tube lamp according to some exemplary embodiments. Referring to FIG. 26B, the installation detection module 3000L of the present embodiment is substantially the same as the installation detection module 3000*k*. The difference is the installation detection module 3000L has a circuit configuration for continuously detecting the signal on the detection path. The installation detection module 3000L includes a control circuit 3020, a detection determining circuit 3030, a current limiting circuit 3200L and a detection path circuit 3060. The operation of the control circuit 3020, detection determining circuit 3030 and the current limiting circuit 3200L can be referred to in connection with the embodiments of FIG. 26A, and it will not be repeated herein.

The detection path circuit 3060 can be disposed on the input side or the output side of one of the rectifying circuit 510, the filtering circuit 520, the driving circuit 530 and the LED module 50, and the present disclosure is not limited thereto. As described herein, please refer to the embodiments shown in the FIGS. 27-28B and 36-37C for the example of disposing the detection path circuit 3060 on the input side of the rectifying circuit 510. In addition, in the practical application, the detection path circuit 3060 can be implemented by any circuit structure capable of responding the impedance variation caused by the human body. For example, the detection path circuit 3060 can be formed by at least one passive component (e.g., resistor, capacitor, inductor), at least one active component (e.g., MOSFET, silicon-controlled rectifier (SCR)) or the combination of the above.

Generally, the power supply module described above in FIGS. 26A and 26B is of an application and a configuration under a setting of continual detection, which the power supply module may act as a mechanism of installation detection independently or can be used together with a pulse detection setting to act as a mechanism of installation detection or electric shock protection. For example, in one exemplary embodiment, a tube lamp may apply a pulse detection setting when the tube lamp in a state of being not lighted up and turn to applying a setting of continual detection after the tube lamp has been lighted up.

From the perspective of the circuit operation, the switching of the pulse detection setting, and the continuous detection setting can be determined based on the current on the power loop. For example, when the current on the power loop is smaller than the predetermined value (e.g., 5 MIU), the installation detection module enables the pulse detection setting. If the current on the power loop is detected to be greater than the predetermined value, the installation detection module changes to enable the continuous detection setting. From the perspective of the operation and the installation of the LED tube lamp, the installation detection module is preset to enable the pulse detection setting, so that the installation detection module utilizes the pulse detection setting for detecting the installation state (or the risk of electric shock) and performing the electric shock protection when the LED tube lamp is powered up. As long as the correct installation state is detected, the installation detection module changes to utilize the continuous detection setting for detecting whether the conductive part of the LED tube lamp is touched by a user during the LED tube lamp emitting light. In addition, the installation detection module will be reset to the pulse detection setting if the LED tube lamp is powered off.

With respect to hardware configuration of the LED tube lamp system, no matter whether the installation detection module is disposed inside the LED tube lamp (as shown in FIG. 17A) or externally on the lamp socket/fixture (as shown in FIG. 17B), a designer according to needs can selectively apply the continuous detection setting or the pulse detection setting in the LED tube lamp system. In this manner, no matter whether the installation detection module 3000 is configured inside the LED tube lamp or externally on the lamp socket, the installation detection module 3000 can perform installation detection and electric shock protection of the LED tube lamp, according to the above description of various embodiments.

A difference between internally disposing an installation detection module and externally disposing an installation detection module is that the first installation detection terminal TE1 and the second installation detection terminal TE2 of the external installation detection module are connected to and between an external power grid and a conductive pin of the LED tube lamp, for example, the first installation detection terminal TE1 and the second installation detection terminal TE2 are serially connected on a signal line of the external driving signal; and they are electrically coupled to the power loop of the LED tube lamp through the conductive pins. In another respect, although not shown in the described figures, a person of ordinary skill in the art can understand that in some embodiments of the installation detection module of this disclosure, the installation detection module may have or include a bias circuit for generating a driving voltage configured to provide power for operations of circuits in the installation detection module.

The embodiments of the installation detection module illustrated in FIG. 19A, FIG. 20A, FIG. 21A, FIG. 22A, FIG. 23A, FIG. 24A, FIG. 28A, FIG. 30A, FIG. 34A and FIG. 35A teach the installation detection module includes a pulse generating mechanism such as the detection pulse generating modules 3110, 3210, and 3510, the pulse generating auxiliary circuit 3310, and the signal generating unit 3410 for generating a pulse signal, however, the present disclosure is not limited thereto. In an exemplary embodiment, the installation detection module can use the original clock signal in the power supply module to replace the function of the pulse generating mechanism in the above embodiments. For example, in order to generate a lighting control signal having a pulse waveform, the driving circuit (e.g., DC-to-DC converter) in the power supply module has a reference clock, originally. The function of the pulse generating mechanism can be implemented by using the reference clock of the lighting control signal as a reference, so that the hardware of the detection pulse generating module 3110, 3210, 3510/pulse generating auxiliary module 3310/signal generating unit 3410 can be omitted. In this case, the installation detection module can share the circuit configuration with another part of the circuit in the power supply module, so as to realize the function of generating the pulse signal. In addition, the duty cycle of the pulse generating mechanism can be any value in the interval of a real number greater than 0 to 1, in which the duty cycle equal to 0 means the power loop is normally closed, and the duty cycle equal to 1 means the power loop is normally open.

In some embodiments, when the duty cycle is set to smaller than 1, the detection operation of the installation detection module is performed by temporarily conducting a current on the power loop/detection path and detecting a signal on the power loop/detection path to obtain the installation state of the LED tube lamp without causing electric shock. When the LED tube lamp is correctly installed in the lamp socket (i.e., the pins on both end caps are correctly connected to the connecting sockets), the current limiting module is disabled for conducting the driving current on the power loop, so as to drive/light up the LED module. Under such configuration, the current limiting module is preset to be in an enable state, so that the power loop can be maintained in the non-conducting state before confirming whether there is the risk of electric shock (or whether the LED tube lamp is correctly installed). The current limiting module is switched to a disabled state when the LED tube lamp is correctly installed. Taking the switch circuit for example, the enable state of the current limiting module refers to the switch circuit being cut-off, and the disabled state of the current limiting module refers to the switch circuit being turned on. Such configuration can be referred to as a pulse detection setting (the duty cycle is greater than 0 and smaller than 1). Under the pulse detection setting, the installation detection means performs during the pulse-on period of each pulse after powering up, and the electric shock protection means is implemented by suspending the current flowing through the power loop until the correct installation state is detected or the risk of electric shock is excluded.

In some embodiments, when the duty cycle is set to equal to 1, the detection operation of the installation detection module is performed by continuously monitoring/sampling the signal on the power loop/detection path. The sample signal can be used for determining the equivalent impedance of the power loop/detection path. When the equivalent impedance indicates there is a risk of electric shock (i.e., a user touches the conductive part of the LED tube lamp), the current limiting module is switched to be in the enable state for cutting off the power loop. Under such configuration, the current limiting module is preset to be in the disabled state, so that the power loop can be maintained in the conducting/non-limiting state before confirming whether there is the risk of electric shock (or whether the LED tube lamp is correctly installed), in which case the LED tube lamp can be lighted up in the preset condition. The current limiting module is switched to the enable state when the risk of electric shock is detected. Such configuration can be referred to a continuous detection setting (the duty cycle equals to 1). Under the continuous detection setting, the installation detection means performs continuously without considering whether the LED tube lamp is lighted up or not, after powering up, and the electric shock protection means is implemented by allowing the current to flow through the power loop until the incorrect installation state or the risk of electric shock is detected. Either the incorrect installation state or the risk of electric shock being detected can be referred to an abnormal state.

Specifically, the risk of electric shock may occur as long as one end of the LED tube lamp is connected to the external power. Therefore, as shown in FIG. 23A, no matter whether installing or removing the LED tube lamp, once the user touches the conductive part of the tube lamp, the user is exposed to the risk of electric shock. In order to avoid the risk of electric shock, no matter whether the LED tube lamp is lighted up or not, the installation detection module operates based on the pulse detection setting or the continuous detection setting to detect the installation state and the user touching state and protect the user from being electrically shocked. Therefore, the safety of the LED tube lamp can be further improved.

path enabling mechanism, which is configured to provide a conduction signal for turning on the power loop/detection path. In some embodiments, for circuit structures of the detection pulse generating modules 3110, 3210 and 3510, the pulse generating auxiliary module 3310 and signal generating unit 3410 can be correspondingly modified to a circuit for providing fixed voltage. In addition, the switch circuits 3200, 3200*a*-L, can be modified to be preset to be in the conducting state/turn-on state, and to switch to the non-conducting state/cut-off state when the risk of electric shock is detected (it can be implemented by modifying the logic gate of the detection result latching circuit). In some embodiments, the circuit for generating a pulse can be omitted by modifying the circuit structure of the detection determining circuit and the detection path circuit. For example, under the continuous detection setting, the detection pulse generating module 3110 in the installation detection module of FIG. 15A and the detection pulse generating module 3210 in the installation detection module of FIG.

16A can be omitted, and so on. In addition, according to the embodiment of disposing the additional detection path in the installation detection module, the detection pulse generating module 3510 can be omitted if the continuous detection setting is applied, and the detection path circuit 3560 is maintained in the conducting state (e.g., the transistor M51 is omitted).

Figure 27:
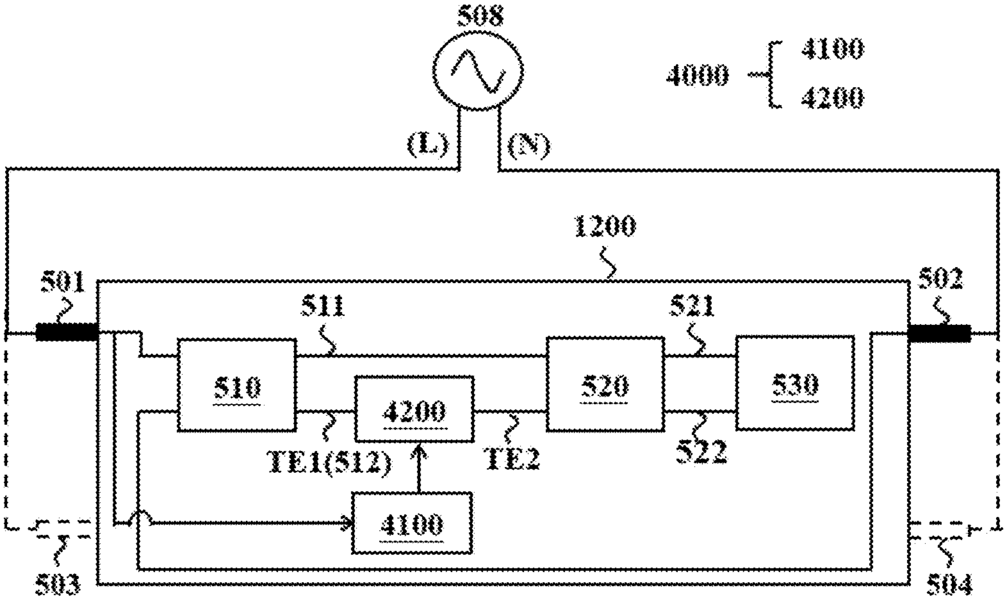
FIG. 27 is a block diagram of an exemplary power supply module in an LED tube lamp according to some exemplary embodiments.

FIG. 27 is a circuit block diagram of a power supply module in an LED tube lamp according to some embodiments. Referring to FIG. 27, the LED tube lamp 1200 is, for example, configured to receive an external driving signal directly provided by an external AC power source 508, wherein the external driving signal is input through the live wire (marked as "L") and the neutral wire (marked as "N") to two pins 501 and 502 on two ends of the LED tube lamp 1200. In practical applications, the LED tube lamp 1200 may further have two additional pins 503 and 504, also on the two ends. Under the structure of the LED tube lamp 1200 having the four pins 501-504, depending on design requirements two pins (such as the pins 501 and 503, or the pins 502 and 504) on an end cap coupled to one end of the LED tube lamp 1200 may be electrically connected or mutually electrically independent, but the disclosure is not limited to any of the mentioned cases. An electric-shock detection module 4000 is disposed inside the LED tube lamp 1200 and includes a detection control circuit 4100 and a current-limiting circuit 4200. The electric-shock detection module 4000 may be and is hereinafter referred to as an installation detection module 4000. The current-limiting circuit 4200 is coupled to a rectifying circuit 510 through a first installation detection terminal TE1 and coupled to a filtering circuit 520 through a second installation detection terminal TE2, so is serially connected on a power loop in the LED tube lamp 1200. Under a detection mode, the detection control circuit 4100 is configured to detect a signal on an input side of the rectifying circuit 510 such as an input signal provided by the external AC power source 508 and configured to determine whether to prevent a current from passing through the LED tube lamp 1200 according to the detection result. When the LED tube lamp 1200 is not yet correctly/properly installed into a lamp socket, the detection control circuit 4100 detects a relatively small current signal and then assumes/presumes it to be facing or passing through relatively high impedance, so the current-limiting circuit 4200 in response cuts off a current path between the first installation detection terminal TE1 and second installation detection terminal TE2 to prevent the LED tube lamp 1200 from operating (i.e., suspending the LED tube lamp 1200 from lighting up). On the other hand, when a relatively large current signal is detected or a relatively small current signal is not detected, the detection control circuit 4100 determines that the LED tube lamp 1200 is correctly/properly installed into a lamp socket, and then the current-limiting circuit 4200 causes or allows the LED tube lamp 1200 to operate in a normal lighting mode (i.e., allowing the LED tube lamp 1200 being lighted up) by maintaining current conduction between the first installation detection terminal TE1 and second installation detection terminal TE2. In some embodiments, when a current signal passing on the input side of the rectifying circuit 510 sampled and detected by the detection control circuit 4100 is equal to or higher than a defined or set current value, the detection control circuit 4100 determines that the LED tube lamp 1200 is correctly/properly installed into a lamp socket and then causes the current-limiting circuit 4200 to conduct current, thereby causing the LED tube lamp 1200 to operate in a normal lighting mode. When the current signal is lower than a defined or set current value, the detection control circuit 4100 determines that the LED tube lamp 1200 is not correctly/properly installed into a lamp socket and thus cuts off the current-limiting circuit 4200 or a current path thereof, thereby causing the LED tube lamp 1200 to enter into a non-conducting state or limiting an effective current value on a power loop in the LED tube lamp 1200 to being smaller than, for example, 5 mA (or 5 MIU according to certain certification standards). The installation detection module 4000 can be regarded as determining whether to allow or limit current conduction based on the detected impedance, thereby causing the LED tube lamp 1200 to operate in a conducting state or enter into a cutoff or current-limited state. Accordingly, the LED tube lamp 1200 using such an installation detection module 4000 has the benefit of avoiding or reducing the risk of electric shock hazard occurring on the body of a user when accidentally touching or holding a conducting part of the LED tube lamp 1200 which is not yet correctly/properly installed into a lamp socket.

Specifically, when (part of) a human body touches or contacts the LED tube lamp, impedance of the human body may cause a change in equivalent impedance on a power loop in the LED tube lamp, so the installation detection module 4000 of FIG. 27 can determine whether a human body has touched or contacted the LED tube lamp by e.g., detecting a change in current/voltage on the power loop, in order to implement the function of electric-shock prevention. The installation detection module 4000 of the present embodiment can determine whether the LED tube lamp 1200 is correctly/properly installed into a lamp socket or whether the body of a user has accidentally touched a conducting part of the LED tube lamp which is not yet correctly/properly installed into a lamp socket, by detecting an electrical signal such as a voltage or current. Further, compared to the embodiment of FIG. 18, since a signal used for determining the installation state is detected/sampled, by the detection control circuit 4100, from the input side of the rectifying circuit 510, the signal characteristics may not be easily influenced by other circuits in the power supply module, so that the possibility of misoperation of the detection control circuit 4100 can be reduced.

From circuit operation perspectives, a method performed by the detection control circuit 4100 and configured to determine, under a detection mode, whether the LED tube lamp 1200 is correctly/properly installed to a lamp socket or whether there is any unintended external impedance being connected to the LED tube lamp 1200 is shown in FIG. 48A. The method includes the following steps: temporarily conducting a detection path for a period and then cutting it off (step S101); sampling an electrical signal on the detection path during the conduction period (step S102); determining whether the sample of electrical signal conforms with predefined signal characteristics (step S103); if the determination result in step S103 is positive, controlling the current-limiting circuit 4200 to operate in a first state (step S104); and if the determination result in step S103 is negative, controlling the current-limiting circuit 4200 to operate in a second state (step S105) and then returning to the step S101.

In the method of FIG. 48A performed in the embodiment of FIG. 27, the detection path can be a current path connected between the input side of the rectifying circuit 510 and a ground terminal, and its detailed circuit configurations in the embodiment are presented and illustrated below with reference to FIGS. 30A and 33C. In addition, the detailed description of how to set parameters such as the conduction period, intervals between multiple conduction periods, and the time point to trigger conduction, of the detection path in the detection control circuit 4100 can refer to the relevant embodiments described in the disclosure.

In the step S101, conducting the detection path for a period may be implemented by means using pulse signal to control switching of a switch.

In the step S102, the sample of electrical signal is a signal that can represent or express impedance variation on the detection path, which signal may comprise a voltage signal, a current signal, a frequency signal, a phase signal, etc.

In step S103, determining whether the sample of electrical signal conforms with or matches predefined signal characteristics may include for example, comparing or evaluating the relation of the sample of electrical signal to a predefined signal. In these embodiments, the determination from the detection control circuit 4100 that the sample of the electrical signal conforms with or matches the predefined signal characteristics may correspond to the determination that the LED tube lamp is correctly installed or in a state without abnormal impedance being coupled in, and the determination from detection control circuit 7100 that the sample of the electrical signal does not conform with or match predefined signal characteristics may correspond to the determination that the LED tube lamp is not correctly installed or is in a state with abnormal impedance being coupled in.

In the steps S104 and S105, the first state and the second state can refer to two distinct circuit-configuration states and may be set according to the configured position and type of the current-limiting circuit 4200. For example, in the case or embodiment where the current-limiting circuit 4200 is independent of the driving circuit 530 and refers to a switching circuit or a current-limiting circuit that is serially connected on the power loop, the first state is a conducting state (or non-current-limiting state) while the second state is a cutoff state (or current-limiting state).

Detailed operations and example circuit structures for performing the above method in FIG. 48A as under the structure of FIG. 27 are illustrated by descriptions herein of different embodiments of an installation detection module.

Figure 28A:
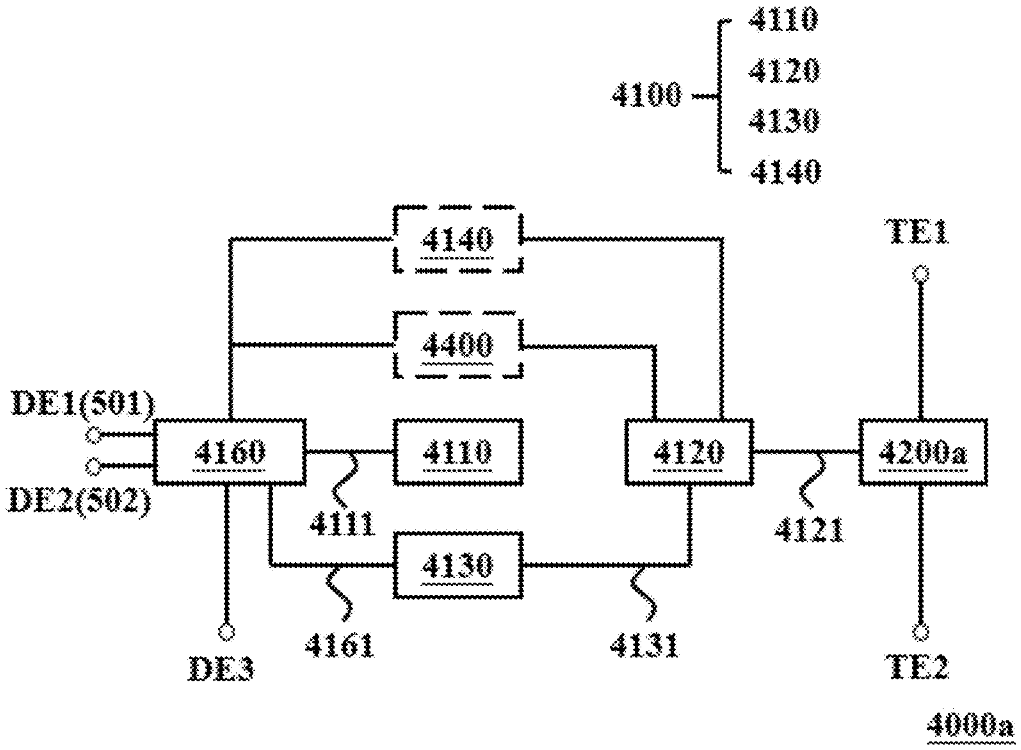
FIG. 28A is a schematic circuit diagram of an installation detection module according to some exemplary embodiments.

FIG. 28A is a circuit block diagram of an installation detection module according to some exemplary embodiments. Referring to FIG. 28A, the installation detection module 4000*a* includes a detection pulse generating module 4110, a control circuit 4120, a detection determining circuit 4130, a detection path circuit 4160, and a switch circuit 4200*a*. The detection determining circuit 4130 is coupled to the detection path circuit 4160 through a path 4161, in order to detect signals on the detection path circuit 4160. The detection determining circuit 4130 is also coupled to the control circuit 4120 through a path 4131, in order to transmit a detection result signal to the control circuit 4120 through the path 4131. The detection pulse generating module 4110 is coupled to the detection path circuit 4160 through a path 4111 and is configured to produce a pulse signal to inform the detection path circuit 4160 of a timing to conduct a detection path or perform a detection operation. The control circuit 4120 is configured to latch a detection result according to the detection result signal; and is coupled to the switch circuit 4200*a* through a path 4121, in order to transmit or reflect the detection result to the switch circuit 4200*a*. The switch circuit 4200*a* determines whether to conduct current or cut off the path between a first installation detection terminal TE1 and a second installation detection terminal TE2 according to the detection result. The detection path circuit 4160 is coupled to the power loop of the power supply module through a first detection connection terminal DE1 and a second detection connection terminal DE2. Explanations related to the detection pulse generating module 4110, control circuit 4120, detection determining circuit 4130, and switch circuit 4200*a* are similar to and can be understood by referencing descriptions of the embodiments of FIG. 23A, and thus are not repeatedly presented herein.

In these embodiments, a detection path circuit 4160 has a first detection connection terminal DE1, a second detection connection terminal DE2, and a third detection connection terminal DE3, wherein the first detection connection terminal DE1 and second detection connection terminal DE2 are electrically connected to two output terminals of a rectifying circuit 510, in order to receive or sample an external driving signal from a first pin 501 and a second pin 502. The detection path circuit 4160 is configured to rectify the received or sampled external driving signal, and to determine, under the control of the detection pulse generating module 4110, whether to conduct a detection path so that the rectified external driving signal can flow thereon. In other words, the detection path circuit 4160, determines whether to conduct the detection path in response to the control of the detection pulse generating module 4110. Detailed circuit operations of using a pulse signal to conduct the detection path and detecting whether abnormal external impedance is coupled in, etc. can be understood by referencing those descriptions of the embodiments of FIGS. 23B to 23D, and thus are not repeatedly described herein.

Figure 32A:
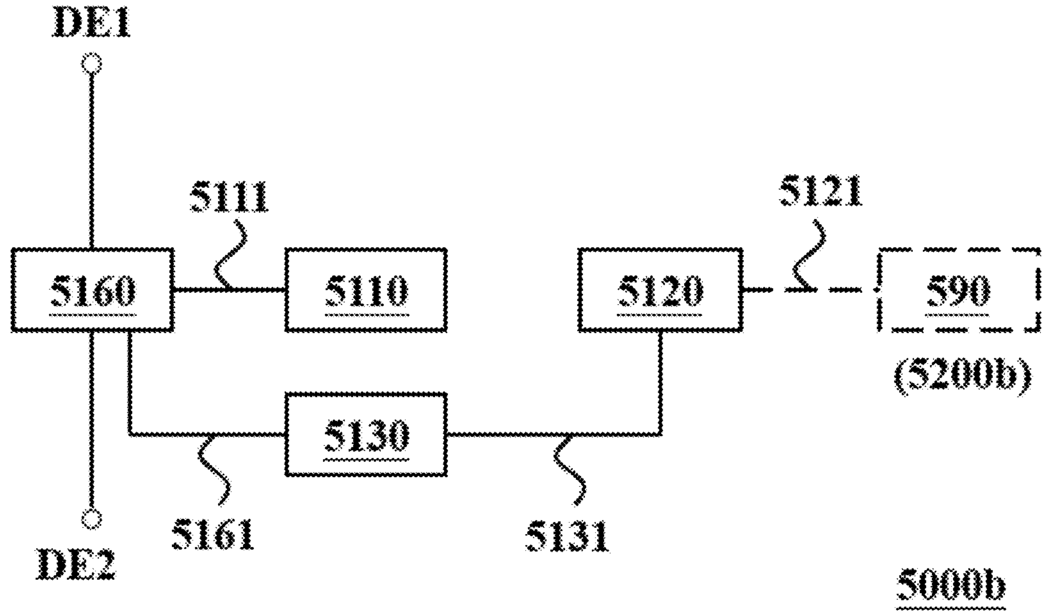
FIG. 32A is a block diagram of an installation detection module for an LED tube lamp according to some embodiments.

In some embodiments, the installation detection module 4000*a* further includes an emergency control module 4140 and a ballast detection module 4400, wherein operations of these two modules are similar to those described in the embodiment of FIG. 19A. A main difference of the embodiment of FIG. 32A from some previous embodiments is that the emergency control module 4140 and a ballast detection module 4400 of the embodiment of FIG. 32A are configured to determine and perform later operations by detecting the signal(s) at the input side/terminal of a rectifying circuit 510, with the other structural and operational similarities to the previous embodiments not described again.

Figure 28B:
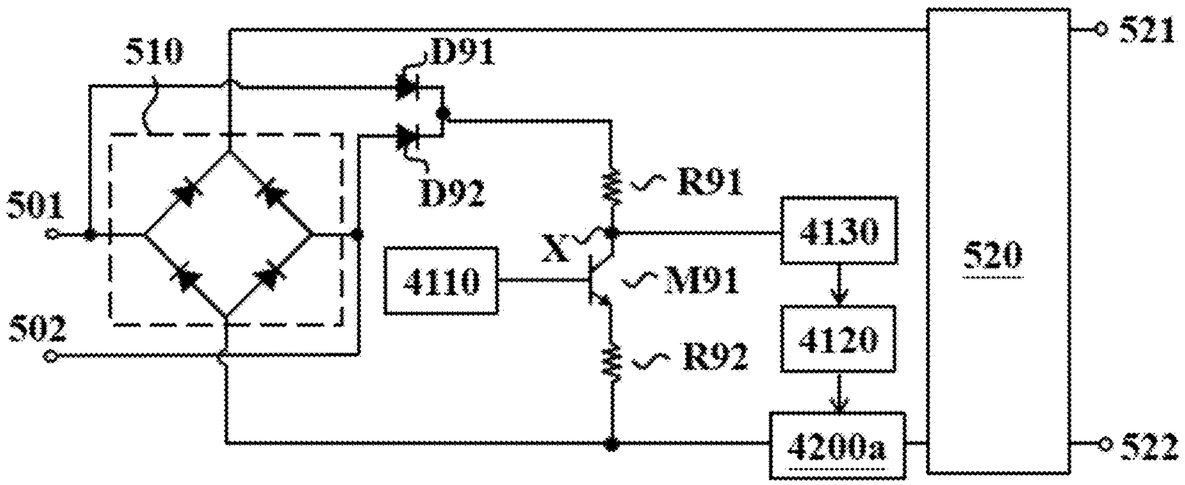
FIG. 28B is a schematic circuit diagram of an installation detection module according to some exemplary embodiments.

FIG. 28B is a circuit structure diagram of an installation detection module according to some exemplary embodiments. Referring to FIG. 28B, configurations and operations of a detection path circuit 3560 in the embodiments of FIG. 28B are largely similar to those of the embodiments described above, with a difference that a detection path circuit 3560 in the embodiments of FIG. 28B further includes current limiting components 3097 and 3098. The current limiting component 3097 can be for example, a diode (referred to as diode 3097 below) disposed between a first rectifying input terminal (i.e., at terminal 501) and a first end of a resistor R91, and the current limiting component 3098 can be for example, a diode (referred to as diode 3098 below) disposed between a second rectifying input terminal (i.e., at terminal 502) and a second end of the resistor R91. The diode 3097 has an anode coupled to the first rectifying input terminal (which is the terminal of the rectifying circuit 510 connected to the first pin 501), and a cathode coupled to the first end of the resistor R91. The diode 3098 has an anode coupled to the second rectifying input terminal (which is the terminal of the rectifying circuit 510 connected to the second pin 502), and a cathode coupled to the second end of the resistor R91. In these embodiments, an external driving signal or AC signal received through the first pin 501 and second pin 502 is provided to the first end of the resistor R91 through the diodes 3097 and 3098. During a positive half cycle of the external driving signal, the diode 3097 is forward-biased to conduct current, and the diode 3098 is reverse-biased to be cut off, causing the detection path circuit 3560 to equivalently establish a detection path between a first rectifying input terminal and a second rectifying output terminal 512 (the same as the second filtering output terminal 522 in these embodiments). During a negative half cycle of the external driving signal, the diode 3097 is reverse-biased to be cut off, and the diode 3098 is forward-biased to conduct current, causing the detection path circuit 3560 to equivalently establish a detection path between a second rectifying input terminal and a second rectifying output terminal 512.

The diodes 3097 and 3098 in these embodiments can limit the direction of the input AC signal, such that the first end of the resistor R91 receives a positive voltage (compared to a ground voltage level) during both the positive half cycle and the negative half cycle of the input AC signal, and therefore phase change in the input AC signal would not affect the voltage signal on the node X and further cause a wrong detection result. Moreover, compared to some embodiments described above, instead of directly connecting to a power loop of a power supply module, the detection path formed by the detection path circuit 3560 in these embodiments is an independent detection path established between the rectifying input terminal and the rectifying output terminal through the diodes 3097 and 3098. Since the detection path circuit 3560 is not directly connected on the power loop and is configured to conduct current only under the detection mode, when the LED tube lamp is correctly/properly installed to the lamp socket and the power supply module thereof is operating normally, the current on the power loop for driving an LED module will not flow through the detection path circuit 3560. Accordingly, since the detection path circuit 3560 does not need to withstand high current when the power supply module of the LED tube lamp is operating normally, there is higher flexibility in selecting the specification of each component of the detection path circuit 3560, and therefore power consumption on the detection path circuit 3560 can be lower. Further, compared to the embodiments illustrated in FIGS. 20B to 20D where the detection path is directly connected to the power loop, since the detection path circuit 3560 in these embodiments is not directly connected to the filtering circuit 520 in the power loop, in circuit design, the issue of reverse discharging from a filtering capacitor of the filtering circuit 520 to the detection path can be prevented, which makes the circuit design simpler.

Figure 29:
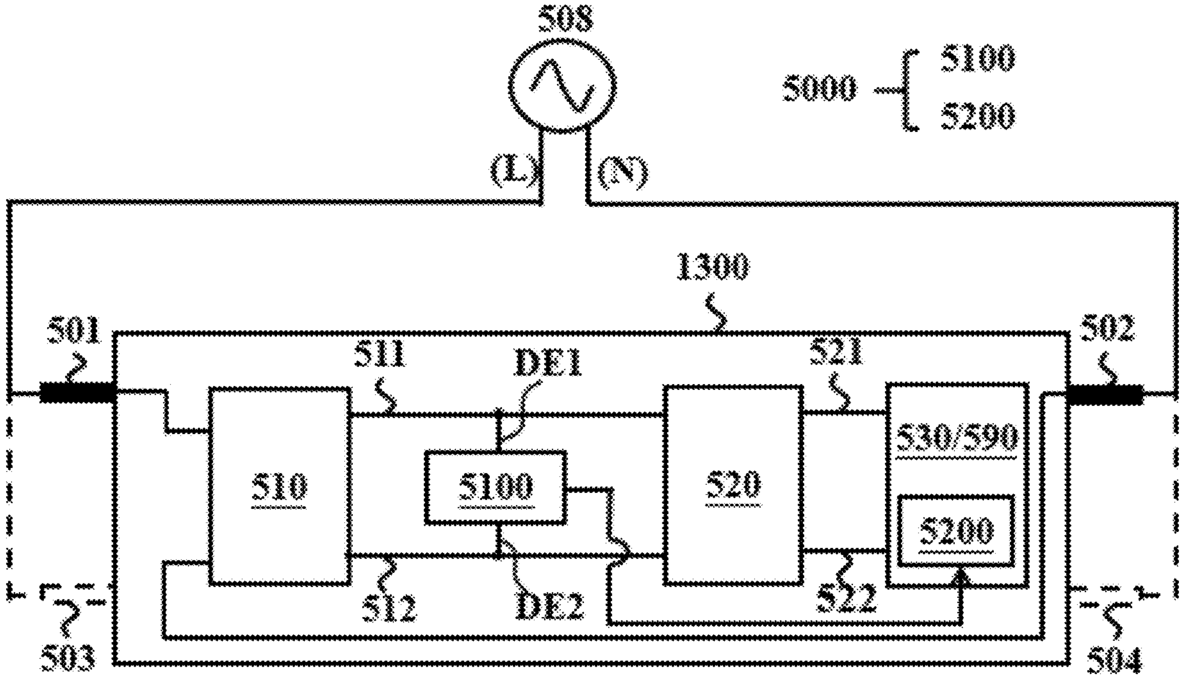
FIG. 29 is a block diagram of an exemplary power supply module in an LED tube lamp according to some exemplary embodiments.

FIG. 29 is a block diagram of an exemplary power supply module in an LED tube lamp according to some exemplary embodiments. Referring to FIG. 29, the LED tube lamp 1300 is, for example, configured to receive an external driving signal directly provided by an external AC power source 508, wherein the external driving signal is input through the live wire (marked as "L") and the neutral wire (marked as "N") to two pins 501 and 502 on two ends of the LED tube lamp 1300. In practical applications, the LED tube lamp 1300 may further have two additional pins 503 and 504, also on the two ends. Under the structure of the LED tube lamp 1300 having the four pins 501-504, depending on design needs two pins (such as the pins 501 and 503, or the pins 502 and 504) on an end cap coupled to one end of the LED tube lamp 1300 may be electrically connected or mutually electrically independent, but the disclosure is not limited to any of the mentioned cases. A shock detection module 5000 is disposed inside the LED tube lamp 1300 and includes a detection control circuit 5100 and a current-limiting circuit 5200. The shock detection module 5000 may be and is hereinafter referred to as an installation detection module 5000. The current-limiting circuit 5200 may be disposed in combination with a driving circuit 530 and may be the driving circuit 530 itself or may comprise a bias adjustment circuit (to be further described in embodiments below) configured for controlling the enabling/disabling of the driving circuit 530. From another perspective, a driving circuit 530 and a shock detection module 5000 as in FIG. 25 may together be regarded or integrated as a driving circuit having the function of electric-shock detection or installation detection. The detection control circuit 5100 is electrically connected to a power loop of the LED tube lamp 1300 through a first detection connection terminal DE1 and a second detection connection terminal DE2, in order to sample and detect, under a detection mode, a signal on the power loop, and is configured to control the current-limiting circuit 5200 according to the detection result, so as to determine whether to prevent a current from passing through the LED tube lamp 1300. When the LED tube lamp 1300 is not yet correctly/properly installed into a lamp socket, the detection control circuit 5100 detects a relatively small current signal and then assumes/presumes it to be facing or passing through relatively high impedance, so the current-limiting circuit 5200 in response disables the driving circuit 530 to prevent the LED tube lamp 1300 from operating in a normal lighting mode (i.e., suspending the LED tube lamp 1300 from lighting up). On the other hand, when a relatively large current signal is detected or a relatively small current signal is not detected, the detection control circuit 5100 determines that the LED tube lamp 1300 is correctly/properly installed into a lamp socket, and then the current-limiting circuit 5200 allows the LED tube lamp 1300 to operate in a normal lighting mode (i.e., allowing the LED tube lamp 1300 being lighted up) by enabling the driving circuit 530. In some embodiments, when a current signal on the power loop sampled and detected by the detection control circuit 5100 is equal to or higher than a defined or set current value, the detection control circuit 5100 determines that the LED tube lamp 1300 is correctly/properly installed into a lamp socket and then causes the current-limiting circuit 5200 to enable the driving circuit 530. But when the current signal sampled and detected by the detection control circuit 5100 is lower than a defined or set current value, the detection control circuit 5100 determines that the LED tube lamp 1300 is not correctly/properly installed into a lamp socket and thus causes the current-limiting circuit 5200 to disable the driving circuit 530, thereby causing the LED tube lamp 1300 to enter into a non-conducting state or limiting an effective current value on a power loop in the LED tube lamp 1300 to being smaller than, for example, 5 mA (or 5 MIU according to certain certification standards). The installation detection module 5000 can be regarded as determining whether to cause current conduction or cutoff of the current-limiting circuit 5200 based on the detected impedance, thereby causing the LED tube lamp 1300 to operate in a conducting or normally driven state or enter into a current-limited state or non-driven state. Accordingly, an LED tube lamp 1300 using such an installation detection module 5000 has the benefit of avoiding or reducing the risk of electric shock hazard occurring on the body of a user when accidentally touching or holding a conducting part of the LED tube lamp 1300 which is not yet correctly/properly installed into a lamp socket.

Specifically, when (part of) a human body touches or contacts the LED tube lamp, impedance of the human body may cause a change in equivalent impedance on a power loop in the LED tube lamp, so the installation detection module 5000 of FIG. 29 can determine whether a human body has touched or contacted the LED tube lamp by e.g. detecting a change in current/voltage on the power loop, in order to implement the function of electric-shock prevention. The installation detection module 5000 of the present embodiment can determine whether the LED tube lamp 1300 is correctly/properly installed into a lamp socket or whether the body of a user has accidentally touched a conducting part of the LED tube lamp which is not yet correctly/properly installed into a lamp socket, by detecting an electrical signal such as a voltage or current. Further, compared to the embodiments of FIGS. 18 and 27, since the current limiting function 5200 is implemented by controlling the driving circuit 530, an additional switching circuit, which may be designed for withstanding large current, serially connected on the power loop for providing electric shock protection is not required. The sizes of selected transistor(s) in such a switching circuit are often strictly limited, so when such a switching circuit is omitted or not required, the overall cost of manufacturing the installation detection module 5000 can be significantly reduced.

From circuit operation perspectives, a method performed by the detection control circuit 5100 and configured to determine under a detection mode whether the LED tube lamp 1300 is correctly/properly installed to a lamp socket or whether there is any unintended external impedance being connected to the LED tube lamp 1300 is shown in FIG. 48A. The method includes the following steps: temporarily conducting a detection path for a period and then cutting it off (step S101); sampling an electrical signal on the detection path during the conduction period (step S102); determining whether the sample of electrical signal conforms with predefined signal characteristics (step S103); if the determination result in step S103 is positive, controlling the current-limiting circuit 5200 to operate in a first state (step S104); and if the determination result in step S103 is negative, controlling the current-limiting circuit 5200 to operate in a second state (step S105) and then returning to the step S101.

In the method of FIG. 48A performed in the embodiment of FIG. 29, the detection path may be a current path connected to the output side of the rectifying circuit 510, and its detailed circuit configurations in the embodiment are presented and illustrated below with reference to FIGS. 30A to 32D. And detailed description of how to set parameters such as the conduction period, intervals between multiple conduction periods, and the time point to trigger conduction, of the detection path in the detection control circuit 4100 is also presented below of different embodiments.

In the step S101, conducting the detection path fora period may be implemented by means using pulse signal to control switching of a switch.

In the step S102, the sample of electrical signal is a signal that can represent or express impedance variation on the detection path, which signal may comprise a voltage signal, a current signal, a frequency signal, a phase signal, etc.

In step S103, determining whether a sample of electrical signal conforms with or matches predefined signal characteristics may include for example, comparing or evaluating the relation of the sample of electrical signal to a predefined signal. In these embodiments, the determination from the detection control circuit 5100 that the sample of electrical signal conforms with or matches predefined signal characteristics may correspond to the determination that the LED tube lamp is correctly installed or in a state without abnormal impedance being coupled in, and the determination from detection control circuit 7100 that a sample of electrical signal does not conform with or matches predefined signal characteristics may correspond to the determination that the LED tube lamp is not correctly installed or is in a state with abnormal impedance being coupled in.

In the steps S104 and S105 performed in the embodiment of FIG. 29, the first state and the second state are two distinct circuit-configuration states and may be set according to the configured position and type of the current-limiting circuit 5200. For example, in the case or embodiment where the current-limiting circuit 5200 refers to a bias adjustment circuit connected to a power supply terminal or enable terminal of a controller of the driving circuit 530, the first state is a cutoff state (or normal bias state, which allows the driving voltage to be normally supplied to the driving controller) while the second state is a conducting state (or bias adjustment state, which suspends the driving voltage from being supplied to the driving controller). And in the case or embodiment where the current-limiting circuit 5200 refers to a power switch in the driving circuit 530, the first state is a driving-control state, where switching of the current-limiting circuit 5200 is only controlled by the driving controller in the driving circuit 530 and not affected by the detection control circuit 7100; while the second state is a cutoff state.

Detailed operations and example circuit structures for performing the above method in FIG. 48A as under the structure of FIG. 29 are illustrated by descriptions herein of different embodiments of an installation detection module.

Referring to FIG. 29 again, in some embodiments, an LED tube lamp 5000 further includes a flicker suppression circuit 590, which may be coupled to an LED module and, when the LED tube lamp 5000 is in a normal operation mode, may be configured to adjust a current to be provided to the LED module based on an input power line voltage signal, in order to cause a current flowing through the LED module to be smooth or even and to be unlikely to be affected by ripple voltages.

In these embodiments, the current limiting circuit 5200 can be disposed with a flicker suppression circuit 590. That is, the current limiting circuit 5200 can be for example, a flicker suppression circuit 590 (or part of the flicker suppression circuit 590), or a bias adjustment circuit for controlling an enabled or disabled state of the flicker suppression circuit 590, wherein embodiments of the bias adjustment circuit are further explained below.

Although the same functional block is used to illustrate a driving circuit 530 and a flicker suppression circuit 590 in embodiments of FIG. 29, they are not limited to being combined together. In actual practice, a driving circuit 530 and a flicker suppression circuit 590 may coexist or be present in a power supply module of an LED tube lamp.

Specifically, the detection control circuit 5100 of FIG. 29 is electrically connected to a power loop of the LED tube lamp 1300 through a first detection connection terminal DE1 and a second detection connection terminal DE2, in order to sample and detect, under a detection mode, a signal on the power loop, and is configured to control the current-limiting circuit 5200 according to the detection result, so as to determine whether to prevent a current from passing through the LED tube lamp 1300. When the LED tube lamp 1300 is not yet correctly/properly installed into a lamp socket, the detection control circuit 5100 detects a relatively small current signal and then assumes/presumes it to be facing or passing through relatively high impedance, so the current-limiting circuit 5200 in response disables the flicker suppression circuit 590 in order to prevent the LED tube lamp 1300 from operating in a normal operation mode or lighting up. On the other hand, when a relatively large current signal is detected or a relatively small current signal is not detected, the detection control circuit 5100 judges that the LED tube lamp 1300 is correctly/properly installed into a lamp socket, and then the current-limiting circuit 5200 enables the flicker suppression circuit 590 in order to cause the LED tube lamp 1300 to operate in a normal operation mode, wherein the LED tube lamp 1300 may light up and the enabled flicker suppression circuit 590 adjusts a current flowing through an LED module based on variation in a voltage signal. In some embodiments, when a current signal on the power loop sampled and detected by the detection control circuit 5100 is equal to or higher than a defined or set current value, the detection control circuit 5100 judges that the LED tube lamp 1300 is correctly/properly installed into a lamp socket and then causes the current-limiting circuit 5200 to enable the flicker suppression circuit 590 to suppress variation in current in response to ripple voltages on the power line voltage signal, in order to suppress the flicker problem in the LED tube lamp. But when the current signal sampled and detected by the detection control circuit 5100 is lower than a defined or set current value, the detection control circuit 5100 judges that the LED tube lamp 1300 is not correctly/properly installed into a lamp socket and thus causes the current-limiting circuit 5200 to disable the flicker suppression circuit 590, thereby causing the LED tube lamp 1300 to enter into a non-conducting state or limiting an effective current value on a power loop in the LED tube lamp 1300 to being smaller than for example 5 mA or 5 MIU according to certain standards.

Figure 30A:
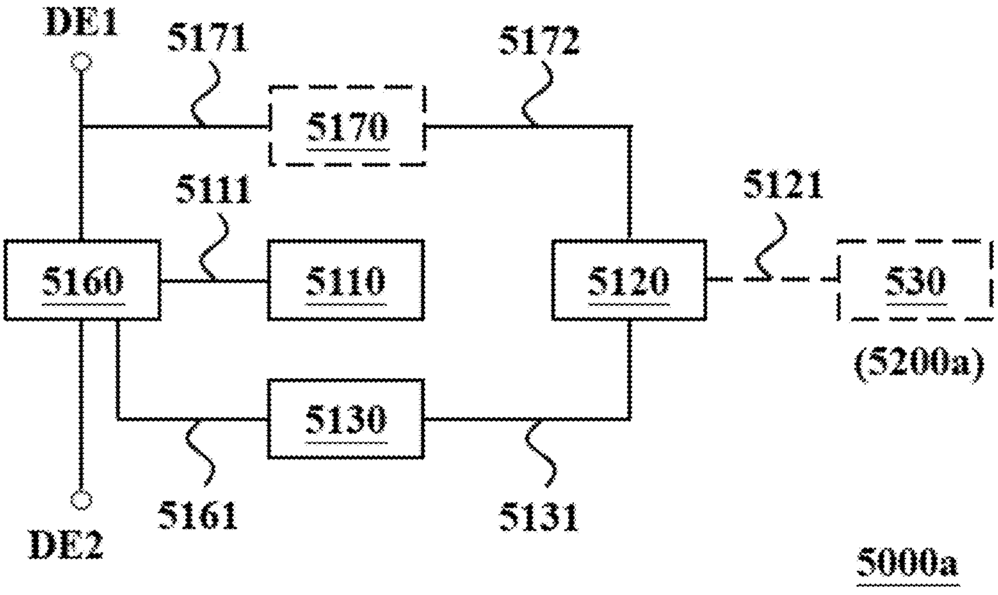
FIG. 30A is a block diagram of an installation detection module according to some exemplary embodiments.

FIG. 30A is a block diagram of an installation detection module according to an exemplary embodiment. Referring to FIG. 30A, the installation detection module 5000*a* includes a detection pulse generating module 5110 (which may be referred to a first circuit 5110), a control circuit 5120 (which may be referred to a third circuit 3480), a detection determining circuit 5130 (which may be referred to a second circuit 5130), and a detection path circuit 5160 (which may be referred to a fourth circuit 5160). The detection pulse generating module 5110 is electrically connected to the detection path circuit 5160 via a path 5111 and is configured to generate a control signal having at least one pulse. The detection path circuit 5160 is electrically connected to the power loop of the power supply module via a first detection connection terminal DE1 and a second detection connection terminal DE2 and is configured to turn on a detection path during pulse-on period of the control signal. The detection determining circuit 5130 is electrically connected to the detection path via a path 5161 and is configured to determine an installation state between the LED tube lamp and the lamp socket according to a signal feature on the detection path. A detection result signal corresponding to the determination result is generated and transmitted to the control circuit 5120 via a path 5131. The control circuit 5120 is electrically connected to the driving circuit 530 via a path 5121 and is configured to affect or adjust the bias of the driving circuit to control the operating state of the driving circuit 530, in which the driving circuit 530 itself or the power switch of the driving circuit 530 can be regarded as a current-limiting circuit 5200*a*. In such a case, the control circuit 5120 may act or be regarded as the driving controller of the driving circuit 530.

Based on the aspects of the operation of the installation detection module 5000*a*, when the LED tube lamp is powered up, the detection pulse generating module 5110 is enabled in response to the connected power source and generates pulse to temporarily turn-on or conduct the detection path formed by the detection path circuit 5160. During the period of the detection path being turned on, the detection determining circuit 5130 samples signal on the detection path to determine whether the LED tube lamp is correctly installed in the lamp socket or whether a leakage current is generated by touching the conductive part of the LED tube lamp. The detection determining circuit 5130 generates a corresponding detection result signal, according to the determination result, and transmits it to the control circuit 5120. When the control circuit 5120 receives the detection result signal indicating the LED tube lamp has been correctly installed in the lamp socket, the control circuit 5120 transmits a corresponding installation state signal to control the driving circuit 530 to normally perform power conversion for providing electricity to the LED module. On the contrary, when the control circuit 5120 receives the detection result signal indicating the LED tube lamp is not correctly installed in the lamp socket, the control circuit 5120 transmits a corresponding installation state signal to control the driving circuit 530 to stop its normal operation or to be disabled. Since the driving circuit 530 disables, the current flowing through the power loop can be limited to less than a safety value (e.g., 5 MIU).

The configuration and operation of the detection pulse generating module 5110, the detection determining circuit 5130 and the detection path circuit 5160 can be seen referring to the description of relevant embodiments of the present disclosure. The difference between the embodiment illustrated in FIG. 30A and the other relevant embodiments is that the control circuit 5120 can be configured for controlling the operation of the driving circuit 530 in the back end, so that the driving circuit 530 can be disabled by adjusting the bias voltage when the LED tube lamp is not correctly installed or when the risk of electric shock exists. Under such configuration, the switch circuit (e.g., switch circuit 3200, 3200*a*-L,), which is disposed on the power loop and thus required to withstand high current, can be omitted, and therefore the cost of the overall installation detection module can be significantly reduced. On the other hand, since the leakage current is limited by controlling the bias voltage of the driving circuit 530 through the control circuit 5120, the circuit design of the driving circuit 530 does not need to be changed, so as to make the commercialization easier.

In an exemplary embodiment, the detection pulse generating module 5110, detection path circuit 5160, detection determining circuit 5130, and control circuit 5120 can be respectively implemented by, but not limited to, the circuit configurations illustrated in FIGS. 30B to 30G. Detailed operations of each of the module and circuits are described below with reference to FIGS. 30B to 30D and 30G.

Figure 30B:
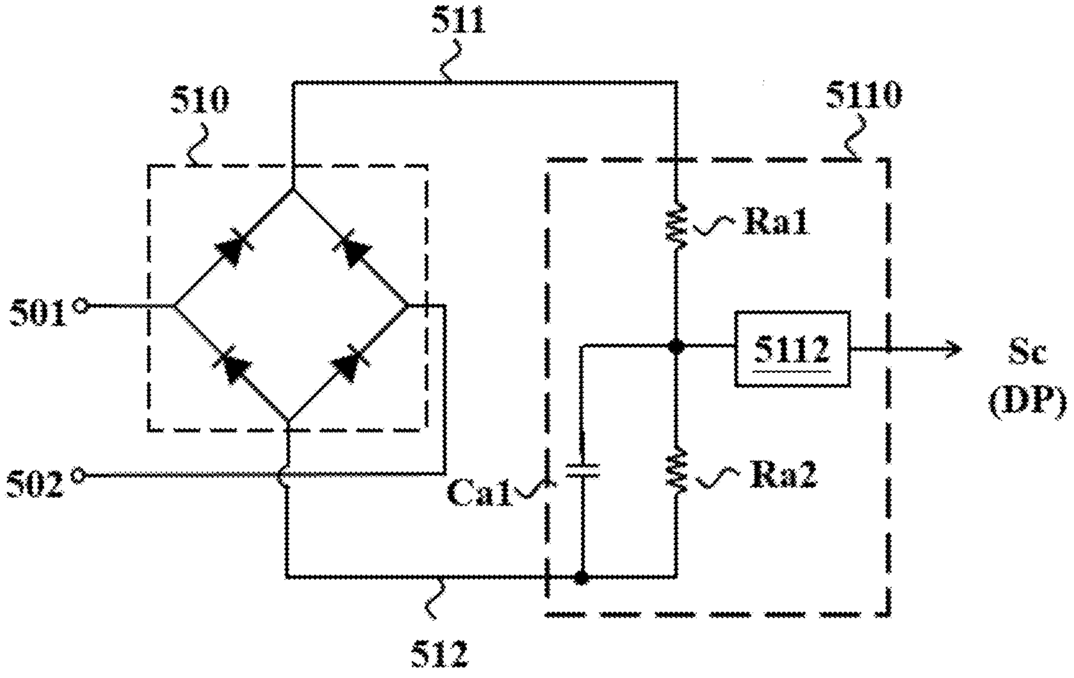
FIGS. 30B-30D and 30G are schematic circuit diagrams of an installation detection module according to some exemplary embodiments.

FIG. 30B is a schematic circuit diagram of the detection pulse generating module according to some embodiments. Referring to FIG. 30B, the detection pulse generating module 5110 includes resistors Ra1 and Ra2, a capacitor Cal and a pulse generating circuit 5112. The resistor Ra1 has a first end and a second end, wherein the first end of the resistor Ra1 is electrically connected to the rectifying circuit 510 via the rectifying output terminal 511. The resistor Ra2 has a first end electrically connected to the second end of the resistor Ra1 and a second end electrically connected to the rectifying circuit 510 via the rectifying output terminal 512. The capacitor Cal is connected to the resistor Ra2 in parallel. The pulse generating circuit 5112 has an input terminal connected to a connection terminal of the resistors Ra2 and Cal and an output terminal connected to the detection path circuit 5160 and for outputting a control signal having pulse DP.

In some embodiments, the resistors Ra1 and Ra2 form a voltage division resistor string configured to sample a bus voltage (i.e., the voltage on the power line of the power supply module). The pulse generating circuit 5112 determines a time point for generating the pulse DP according to the bus voltage and outputs the pulse DP as the control signal Sc based on a pulse-width setting. For example, the pulse generating circuit 5112 may output the pulse DP after the bus voltage rises or falls across zero-voltage point for a period, so that the issue of misjudgment caused by performing installation detection on the zero-voltage point can be addressed. The characteristics of the pulse waveform and the pulse interval setting can be seen by referring to the description of relevant embodiments, and thus are not repeated herein.

Figure 30C:
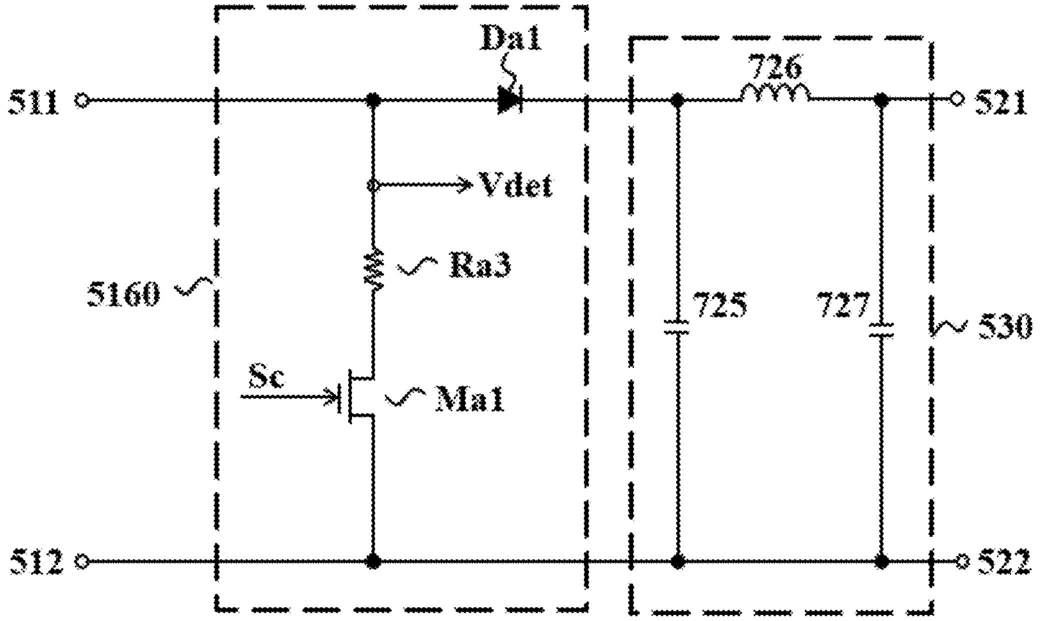

FIG. 30C is a schematic circuit diagram of the detection path circuit according to some embodiments. Referring to FIG. 30C, the detection path circuit 5160 includes a resistor Ra3, a transistor Ma1 and a diode Da1. The resistor Ra3 has a first end connected to the rectifying output terminal 511. The transistor Ma1 is, for example, a MOSFET or a BJT, and has a first terminal connected to a second end of the resistor Ra3, a second terminal connected to the rectifying output terminal 512, and a control terminal receiving the control signal Sc. The diode Da1 has an anode connected to the first end of the resistor Ra3 and the rectifying output terminal 511 and a cathode connected to the input terminal of the filtering circuit in the back end. Taking a pi-filter as an example, the cathode of the diode Da1 can be regarded as electrically connected to the connection terminal of the capacitor 725 and the inductor 726.

In the embodiment illustrated in FIG. 30C, the resistor Ra3 and the transistor Ma1 form a detection path, which can be conducted when the transistor Ma1 is turned on by the control signal Sc. During the period of the detection path being conducted, the detection voltage Vdet changes due to current flowing through the detection path, and the amount of the voltage changes is determined according to the equivalent impedance of the detection path. Taking the detection voltage Vdet, which samples from the first end of the resistor Ra3, as shown in FIG. 30C as an example, during the period of the detection path being conducted, the detection voltage Vdet substantially equals the bus voltage on the rectifying output terminal 511 if there is no body impedance being electrically connected (e.g., if the LED tube lamp is correctly installed); and if there is a body impedance electrically connected between the rectifying output terminal 511 and the ground terminal, the detection voltage Vdet changes into a voltage division of the resistor and the body impedance. Accordingly, the detection voltage Vdet can indicate whether a body impedance is electrically connected to the LED tube lamp.

Figure 30D:
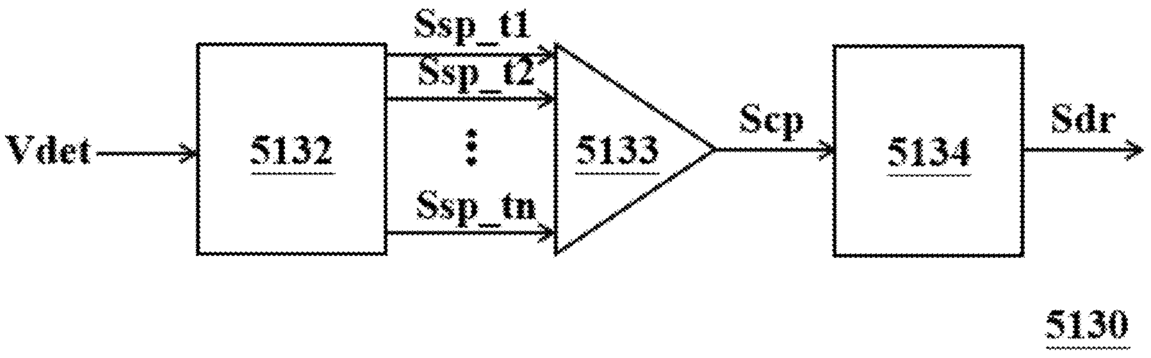

FIG. 30D is a schematic circuit diagram of the detection determining circuit according to some embodiments. Referring to FIG. 30D, the detection determining circuit 5130 includes a sampling circuit 5132, a comparison circuit 5133 and a determining circuit 5134. According to some embodiments, the sampling circuit 5133 may sample the detection voltage Vdet according to a set time point and generate a plurality of sample signals Ssp_t1 to Ssp_tn, respectively corresponding to the detection voltage Vdet at different time points. The comparison circuit 5133 is electrically connected to the sampling circuit 5132 and receives the sample signals Ssp_t1 to Ssp_tn. In some embodiments, part or all of the sample signals Ssp_t1 to Ssp_tn are selected to be compared with each other by the comparison circuit 5133 to generate a comparison result Scp. In some embodiments, the comparison circuit 5133 calculates a difference between any two of the sample signals Ssp_t1 to Ssp_tn and then compares the difference with a preset signal. In some embodiments, the comparison circuit 5133 compares the sample signals Ssp_t1 to Ssp_tn with a preset signal to generate a comparison result Scp. In some embodiments, the comparison circuit 5133 compares two sample signals at adjacent time points to generate a corresponding comparison result Scp. The comparison result Scp will be outputted to the determining circuit 5134 after being generated.

Specifically, when the LED tube lamp is correctly installed into a lamp socket (or when there is no touching/connecting external impedance), the first detection connection terminal DE1 (as the first rectifying output terminal 511) and second detection connection terminal DE2 (as the second rectifying output terminal 512) of the detection path circuit 5160 are equivalently directly connected to the external power source, so no matter whether the detection path of the detection path circuit 5160 is conducted or not, the voltage waveform of the detected voltage Vdet varies along with the phase change in the external driving signal and thus is in a complete waveform of a sinusoidal signal. Therefore, when the LED tube lamp is correctly installed into a lamp socket, no matter whether the detection path of the detection path circuit 5160 is conducted or not, the sampling circuit 5132 may generate the plurality of sample signals Ssp_t1 to Ssp_tn having the same voltage level or close voltage levels respectively.

On the other hand, when the LED tube lamp is not correctly installed into a lamp socket, or when there is touching/connecting external impedance (e.g., body impedance), the first detection connection terminal DE1 is equivalent to electrically connect, through the external impedance, to the external power source. During a time when the detection path is being conducted, the detected voltage Vdet is dropped due to voltage division between the external impedance and the impedance on the detection path (such as resistor Ra3), so as to cause the waveform of the detected voltage Vdet to present discontinuous or non-smooth variations or changes in voltage levels, which means the voltage level has abruptly changed while the detection path is being conducted. During a time when the detection path is not being conducted, since at this time there is typically no conducting current path in the power loop of the LED tube lamp, there is almost and ideally no voltage drop at the first detection connection terminal DE1, and thus the waveform of the detected voltage Vdet maintains its normal complete sinusoidal form. As a result, an installation detection module may determine whether there is an external body impedance touching the LED tube lamp, by identifying the difference in characteristics between voltage waveforms of the detected voltage Vdet. The following is a description of several exemplary mechanisms of this determining.

Figure 30E:
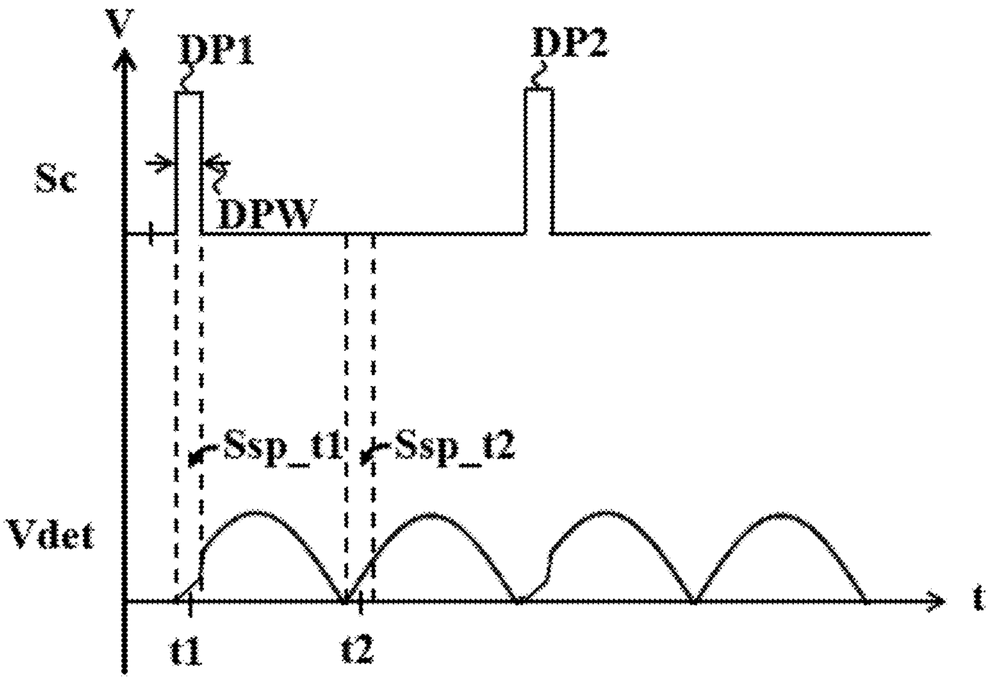
FIGS. 30E and 30F are signal waveform diagrams of an installation detection module according to some embodiments.

Referring to FIGS. 30D and 30E, FIG. 30E is a signal waveform diagram of an installation detection module according to some embodiments. In the present embodiment, the sampling circuit 5132 may sample the detected voltage Vdet at the same phase point during each period of the detected voltage Vdet, in order to sample at least one signal level (such as the sample signal Ssp_t1) at the same phase point in one period of the detected voltage Vdet and during a pulse period DPW and sample at least one signal level (such as the sample signal Ssp_t2) at the same phase point in another period of the detected voltage Vdet and outside a pulse period DPW. When the LED tube lamp is not correctly installed into a lamp socket, a signal level sampled by the sampling circuit 5132 during the pulse period DPW (e.g., the sample signal Ssp_t1) is lower than that sampled by the sampling circuit 5132 outside of each pulse period DPW (e.g., the sample signals Ssp_t2). As a result, the comparison result Scp corresponding to the installation state can be generated by selecting and comparing part or all of the sample signals Ssp_t1 to Ssp_tn, by comparing part or all of the sample signals Ssp_t1 to Ssp_tn with a defined signal, or by comparing a signal, obtained by calculating a difference between two of the sample signals Ssp_t1 to Ssp_tn, with a defined signal. For example, the comparison circuit 5133 may generate a comparison result Scp with a first logic level when the voltage levels of the sample signals Ssp_t1 and Ssp_t2 are the same or very close and may generate a comparison result Scp with a second logic level when the difference between the voltage levels of the sample signals Ssp_t1 and Ssp_t2 reaches a set value. The comparison result Scp with the first logic level refers to the condition in which the LED tube lamp is correctly installed into a lamp socket, while the comparison result Scp with the second logic level refers to the condition in which the LED tube lamp is not correctly installed into a lamp socket.

The determining circuit 5134 receives the comparison result Scp and outputs a detection result signal Sdr. In some embodiments, the determining circuit 5134 can be configured to output the detection result signal Sdr indicating correct installation after (continuously or discontinuously) receiving a certain number of positive comparison results Scp, wherein the positive comparison result Scp refers to the comparison result Scp meeting the requirement of a correct installation condition, for example, the level of the sample signal is higher than the preset signal.

Figure 30F:
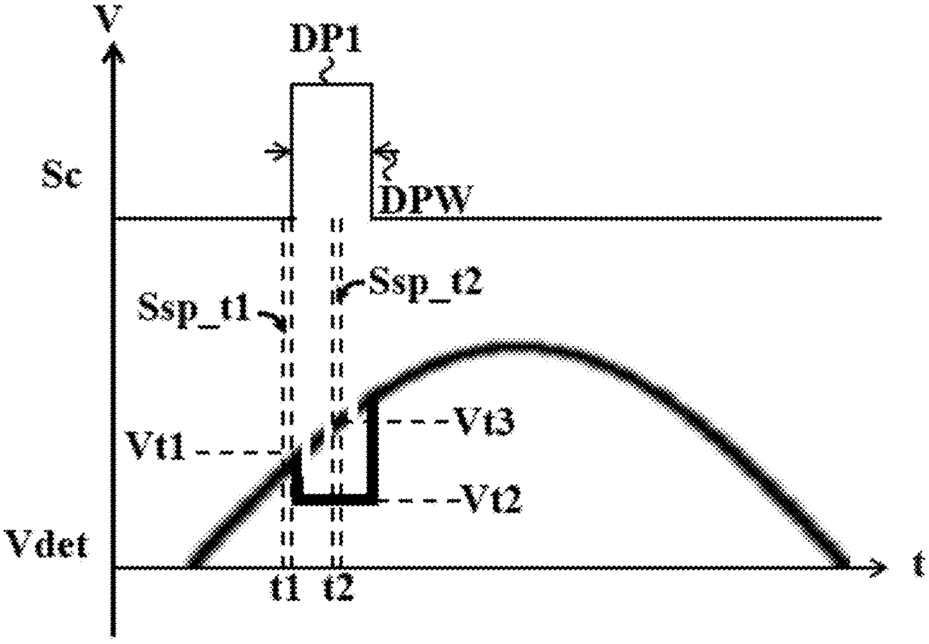

Referring to both FIGS. 30D and 30F, FIG. 30F is a signal waveform diagram of an installation detection module (as 5000*a*) according to some embodiments. In the present embodiment, when the LED tube lamp is correctly installed into a lamp socket, the voltage level of the detected voltage Vdet during each pulse period DPW is approximately smoothly changing from that of the detected voltage Vdet at the starting point and ending point of the pulse period DPW, which smooth changing is illustrated by the broken line along the detected voltage signal Vdet during the pulse period DPW. On the contrary, when the LED tube lamp is not correctly installed into a lamp socket, the voltage level of the detected voltage Vdet during each pulse period DPW is significantly lower than that of the detected voltage Vdet at the starting point and ending point of the pulse period DPW, and thus is not smoothly changing from that of the detected voltage Vdet at the starting point and ending point of the pulse period DPW, which non-smooth changing is illustrated by the solid line along the detected voltage signal Vdet during the pulse period DPW. Therefore, the sampling circuit 5132 may be configured to sample the detected voltage Vdet at least one time close to and either before the starting point or after the ending point of a pulse signal DP1, and configured to sample the detected voltage Vdet at least one time during the pulse signal DP1, so that during one period of the detected voltage Vdet at least one signal level (such as the sample signal Ssp_t1) outside a pulse period DPW is sampled and at least one signal level (such as the sample signal Ssp_t2) during the pulse period DPW is sampled.

The case of the sampling circuit 5132 sampling the detected voltage Vdet before the starting point of a pulse signal DP1 is taken as an example. When the LED tube lamp is correctly installed into a lamp socket, the sampling circuit 5132 samples to get a signal voltage level Vt1 (corresponding to the sample signal Ssp_t1) at a time point t1 before entering into a pulse period DPW, which signal voltage level Vt1 is lower than a signal voltage level Vt3 (corresponding to the sample signal Ssp_t2) obtained by sampling at a time point t2 during the pulse period DPW. On the contrary, when the LED tube lamp is not correctly installed into a lamp socket, the sampling circuit 5132 samples to get a signal voltage level Vt1 (corresponding to the sample signal Ssp_t1) at a time point t1 before entering into a pulse period DPW, which signal voltage level Vt1 is higher than a signal voltage level Vt3 (corresponding to the sample signal Ssp_t2) obtained by sampling at a time point t2 during the pulse period DPW.

The comparison circuit 5133 may be configured to generate a comparison result Scp corresponding to an installation state by comparing the sample signal Ssp_t2 and the sample signal Ssp_t1, comparing each of the sample signal Ssp_t2 and the sample signal Ssp_t1 with a set value, or comparing a difference between the sample signal Ssp_t2 and the sample signal Ssp_t1 with a set value.

Operations of comparing the sample signals Ssp_t1 and Ssp_t2 are taken as an example. For these operations, a comparison circuit 5133 can be configured to generate a comparison result Scp of a first logic level when the signal voltage level (such as signal voltage level Vt3) of the sample signal Ssp_t2 is greater than or equal to the signal voltage level (such as signal voltage level Vt1) of the sample signal Ssp_t1; and configured to generate a comparison result Scp of a second logic level when the signal voltage level (such as signal voltage level Vt2) of the sample signal Ssp_t2 is smaller than the signal voltage level (such as signal voltage level Vt1) of the sample signal Ssp_t1.

Operations of comparing each of the sample signals Ssp_t1 and Ssp_t2 to a set value are taken as an example. The set value can be designed to be for example but it's not limited to, a value between such signal voltage levels Vt1 and Vt3. For these operations, a comparison circuit 5133 can be configured to generate a comparison result Scp of a first logic level when the signal voltage level (such as signal voltage level Vt3) of the sample signal Ssp_t2 is greater than the set value and the signal voltage level (such as signal voltage level Vt1) of the sample signal Ssp_t1 is smaller than the set value; and configured to generate a comparison result Scp of a second logic level when each of the signal voltage level (such as signal voltage level Vt2) of the sample signal Ssp_t2 and the signal voltage level (such as signal voltage level Vt1) of the sample signal Ssp_t1 is smaller than the set value.

Operations of comparing the difference between the sample signals Ssp_t1 and Ssp_t2 to a set value are taken as an example. The set value may be designed to be, for example, a value between signal voltage level (Vt2−Vt1) and signal voltage level (Vt3−Vt1). For example, if the signal voltage level Vt1 is 20V, the signal voltage level Vt2 is 12V, and the signal voltage level Vt3 is 25V, then the set value may be designed to be between −8V (=Vt2−Vt1) and 5V (=Vt3−Vt1). In some embodiments, the set value can be designed to be 0V. For these operations, a comparison circuit 5133 can be configured to generate a comparison result Scp of a first logic level when the difference (such as signal voltage level Vt3−Vt1) in signal voltage level between the sample signals Ssp_t2 and Ssp_t1 is greater than or equal to the set value; and configured to generate a comparison result Scp of a second logic level when the difference (such as signal voltage level Vt2−Vt1) in signal voltage level between the sample signals Ssp_t2 and Ssp_t1 is smaller than the set value. Such a difference as described for these operations may be calculated by different methods based on different circuit designs, and is for example calculated by a voltage level sampled later minus a voltage level sampled earlier, calculated by a voltage level sampled earlier minus a voltage level sampled later, or calculated by taking the absolute value of the difference between two sampled voltage levels (or a greater sampled voltage level minus a smaller sampled voltage level), and the present disclosure is not limited to any of these ways of calculation.

In each of the above three cases of comparing operations, a comparison result Scp of a first logic level indicates conforming to the condition that the LED tube lamp is correctly installed into a lamp socket, while a comparison result Scp of a second logic level indicates conforming to the condition that the LED tube lamp is not correctly installed into a lamp socket.

It should be noted that the descriptions of sampling or comparing the detection voltage Vdet are not only applicable to the installation detection module (as the installation detection module 5000*a*) in the embodiment of FIG. 30A, but also applicable to an installation detection module in other embodiments, especially to the embodiment comprising a detection path circuit.

In some embodiments, the above described circuit operations may be performed or realized by the steps of the flowchart in FIG. 48E, which include receiving a detection voltage signal (such as Vdet) on a detection path circuit (such as 5160) (step S401); sampling the detection voltage signal during a conduction state of the detection path circuit (such as during a pulse period DPW of a pulse signal), to generate a first sample signal (step S402); sampling the detection voltage signal during a cutoff state of the detection path circuit (such as under the control of a pulse signal), to generate a second sample signal (step S403); and judging whether the LED tube lamp meets a correct-installation condition according to the voltage levels of the first sample signal and the second sample signal (step S404).

As illustrated by the signal waveforms of FIGS. 30E, the step S502 may comprise sampling a detection voltage signal Vdet at a time point t1 to generate a first sample signal Ssp_t1 during a pulse period DPW, and the step S503 may comprise sampling the detection voltage signal Vdet at a time point t2 to generate a second sample signal Ssp_t2 outside a pulse period DPW. In practice, the step S502 and the step S503 may for example be performed by using a pulse signal DP1/DP2 to trigger a sampling circuit 5132 to perform a first-time signal sampling followed by performing signal sampling later at constant intervals for two times, wherein the constant interval may be designed to have a length of one or an integer multiple of a half signal period of a power supply signal from an AC power grid, such as a length in the range of between 10 ms (corresponding to a half signal period of a 50 Hz signal) and 16.67 ms (corresponding to a half signal period of a 60 Hz signal), but the present disclosure is not limited to any of these two lengths.

As illustrated by the signal waveforms of FIG. 30F, the step S402 may comprise sampling a detection voltage signal Vdet at a time point t2 to generate a first sample signal Ssp_t2 during a pulse period DPW, and the step S403 may comprise sampling the detection voltage signal Vdet at a time point t1 to generate a second sample signal Ssp_t1 outside a pulse period DPW. From these two ways of performing the steps S402 and S403 as illustrated by FIGS. 30E and 30F, it is understood that according to the distinct adopted detection structure or plan, the order or sequence of performing the steps S402 and S403 of FIG. 48E may be interchanged, which means in some embodiments the step S402 is performed before performing the step S403, but in some other embodiments the step S403 is performed before performing the step S402.

Figure 30G:
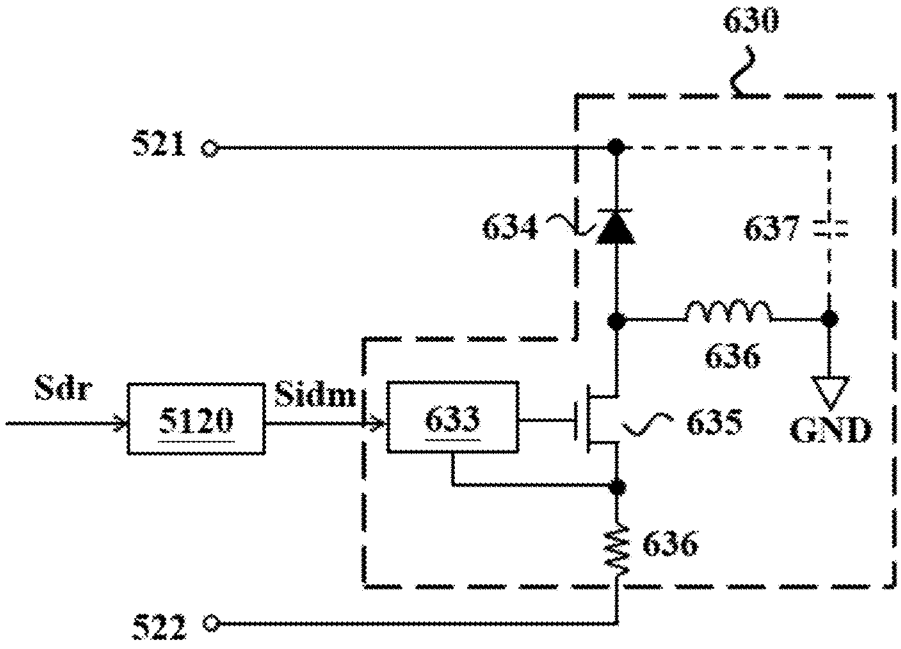

FIG. 30G is a circuit diagram illustrating a control circuit of an installation detection module according to some embodiments. Referring to FIG. 30G, the control circuit 5120 has an input terminal configured to receive a detection result signal Sdr and an output terminal electrically connected to a controller 633 of a driving circuit 630, which driving circuit 630 may have configurations similar to those of a described embodiment herein of FIG. 13B. So, the driving circuit 630's configurations are not repeatedly described.

When the control circuit 5120 receives a detection result signal Sdr indicating correct installation state (the external impedance does not connect to the LED tube lamp), the control circuit 5120 transmits a corresponding installation state signal Sidm to the controller 633 of the driving circuit 630, which controller 633 is then enabled or activated in response to the installation state signal Sidm and controls the operation of a switch 635 so as to generate a driving signal to drive an LED module. On the other hand, when the control circuit 5120 receives a detection result signal Sdr indicating incorrect/improper installation state (the external impedance connects to the LED tube lamp), the control circuit 5120 transmits a corresponding installation state signal Sidm to the controller 633 of the driving circuit 630, which controller 633 is then disabled or not activated, in response to the installation state signal Sidm.

In some embodiments, the controller 633 and the control circuit 5120 of FIG. 30G may be integrated together, wherein the controller 633 and the control circuit 5120 as a whole may be regarded as a driving controller for the driving circuit 630 of FIG. 30G.

Here an exemplary embodiment is described with reference to FIG. 30H which illustrates a circuit diagram of the detection circuit and the driving circuit according to one embodiment. The detection circuit of the present embodiment is similar to the embodiments of FIGS. 30B to 30G and includes a detection pulse generating module 5110, a control circuit 5120, a detection determining circuit 5130, and a detection path circuit 5160. The driving circuit 1030 takes the power conversion circuit structure in FIG. 13B for example and includes a controller 1033, a diode 1034, a transistor 1035, an inductor 1036, a capacitor 1037, and a resistor 1038.

Compared to the embodiments of FIGS. 30B to 30G, the detection path circuit 5160 is for example in a configuration similar to that of a detection path circuit 3660 in FIG. 24B and includes a transistor Ma1 and a resistor Rat The drain terminal of the transistor Ma1 is connected to the common end of the capacitors 725 and 727, and the source terminal of the transistor Ma1 is connected to a first end of the resistor Rat. The second end of the resistor Ra1 is coupled to the first ground terminal GND1. And it is noted that the first ground terminal GND1 and the second ground terminal GND2 of the LED module 50 may be the same ground terminal or two electrically independent ground terminals, while the present disclosure is not limited to any one of these options.

The detection pulse generating module 5210 is coupled to the gate terminal of the transistor and is used to control conduction state of the transistor Ma1. The detection determining circuit 5130 is coupled to a first end of the resistor Ra1 and the controller 1033 and is configured to sample an electrical signal on the first end of the resistor Ra1 and then compare the sampled electrical signal with a reference signal, so as to determine whether the LED tube lamp is correctly installed. The detection determining circuit 5130 generates and transmits an installation detection signal Sidm to the controller 1033 according to the comparison result. In this embodiment, operation details and characteristics about the detection pulse generating module 5110, the control circuit 5120, the detection determining circuit 5130, and the detection path circuit 5160 can be similar to those about the detection pulse generating module 3610, the detection path circuit 3660, and the detection determining circuit 3630 of FIG. 24B and thus are not repeatedly described here.

In some embodiments, the installation detection module 5000*a* shown in FIG. 30A may selectively include a dimming circuit 5170 for realizing a dimming function (or adjusting of brightness of a lighting LED module) of an LED tube lamp. As shown in FIG. 30A, the dimming circuit 5170 is electrically connected to a first detection connection terminal DE1 through a path 5171, and electrically connected to the control circuit 5120 through a path 5172. In a normal operation mode, the dimming circuit 5170 may be configured to generate a dimming signal based on a received electrical signal, and to provide the dimming signal to the control circuit 5120 through the path 5172. Then based on the received dimming signal the control circuit 5120 is configured to adjust controlling of a power switch, in order to adjust the luminance of a lighting LED module corresponding to the dimming signal. Though the dimming circuit 5170 is illustrated in FIG. 30A as being directly connected to a first detection connection terminal DE1 for receiving an electrical signal, the present disclosure is not limited to such a connection.

Specifically, in the process of operations for normally lighting up an LED tube lamp, the dimming circuit 5170 may be configured to sample an electrical signal on a power loop to obtain a dimming message therein, wherein the dimming message may originate from a message which was converted or changed into a corresponding signal feature according to a specific way or specified rule and carried into an input power signal for the LED tube lamp, i.e. the input power signal is a carrier signal. A way for the dimming circuit 5170 to obtain the dimming message may be by performing reverse conversion on or demodulating the signal feature obtained by the sampling. Based on the obtained dimming message, the dimming circuit 5170 may further generate a dimming signal conforming to the input-voltage rating of the control circuit 5120, which may be then a driving controller for a driving circuit 530, for causing the control circuit 5120 to perform dimming control according to the generated dimming signal.

Upon an LED tube lamp starting to receive electrical power and then performing electric-shock detection (as in a detection mode), since the LED tube lamp is not yet lighted up, there is no need yet to perform a dimming function, so in some embodiments during the detection mode the dimming circuit 5170 is maintained in a disabled state, and the dimming circuit 5170 is only enabled, which may be realized by an enabling signal issued by the control circuit 5120, after confirming that the detection is finished, in order to avoid misoperation or wrong operation of the control circuit 5120 due to influence of the dimming signal.

In some embodiments, a dimming circuit 5170 is electrically connected to an input terminal of a rectifying circuit (such as 510), for obtaining a dimming message by sampling a not yet rectified external driving signal.

In some embodiments, a dimming circuit 5170 is configured to receive a dimming control signal through an independent or separate port or interface, and to generate a dimming signal corresponding to the received dimming control signal.

In some embodiments, the detection pulse generating module 5110, control circuit 5120, detection determining circuit 5130, and dimming circuit 5170 of FIG. 30A may be integrated together into a unit to act as a driving controller for the driving circuit 530 in order to control operation of a power switch, for the power supply module to have the integrated functions of constant-current driving, electric-shock detection, and dimming control. The following description further explains a whole circuit structure and configurations of a power supply module having the integrated functions of constant-current driving, electric-shock detection, and dimming control with reference to FIG. 30I. FIG. 30I is a schematic diagram of a power supply module having the functions of constant-current driving, electric-shock detection, and dimming control according to some embodiments. Referring to FIG. 30I, the power supply module of such an embodiment includes a rectifying circuit 510, a filtering circuit 520, a driving circuit 1530, and a detection path circuit 5160. Configurations and operations of the passive components 1534, 1536, and 1537 in the rectifying circuit 510, filtering circuit 520, and driving circuit 1530 are similar or analogous to those of such components in other embodiments described above. A main difference between the embodiment of FIG. 30I and the embodiments previously described is that the driving circuit 1530 of the embodiment of FIG. 30I includes a multi-function or multi-function driving controller 533*m* having the integrated functions of constant-current driving, electric-shock detection, and dimming control. The multi-function driving controller 533*m* may include a control circuit 5120*m* and a power switch 1535, wherein the control circuit 5120*m* under a detection mode is configured to cause periodically brief conduction of the detection path circuit 5160 in order to judge the installation state of the LED tube lamp. Upon judging that the LED tube lamp is correctly installed into a lamp socket the control circuit 5120*m* is configured to enter into a normal operation mode to issue a lighting control signal for controlling switching of the power switch 1535, in order for the driving circuit 1530 to generate a stable current for driving an LED module 50. Furthermore, in the normal operation mode, the control circuit 5120*m* may be configured to obtain a dimming message according to a sample electrical signal from the detection path circuit 5160 and configured to adjust the lighting control signal based on the obtained dimming message, in order to adjust the luminance of the LED module 50 accordingly. For example, when obtaining a dimming message indicating a 50% of luminance, the control circuit 5120*m* may be configured to adjust the duty cycle of the power switch 1535 to be half of its rated value, which rated duty-cycle value corresponds to 100% of the rated luminance, in order to reduce the effective value of an output current of the driving circuit 1530, thereby reducing the luminance of the LED module 50 to be half of its rated luminance.

In some embodiments, if the sampling point of the detection path circuit 5160 is directly connected to the first detection connection terminal DE1, the control circuit 5120*m* may be regarded as sampling an electrical signal directly from the first detection connection terminal DE1 or the power loop.

In some embodiments, the detection path circuit 5160 and the multi-function driving controller 533*m* may be integrated together and as a whole be regarded as a driving controller for the driving circuit 1530.

Figure 31A:
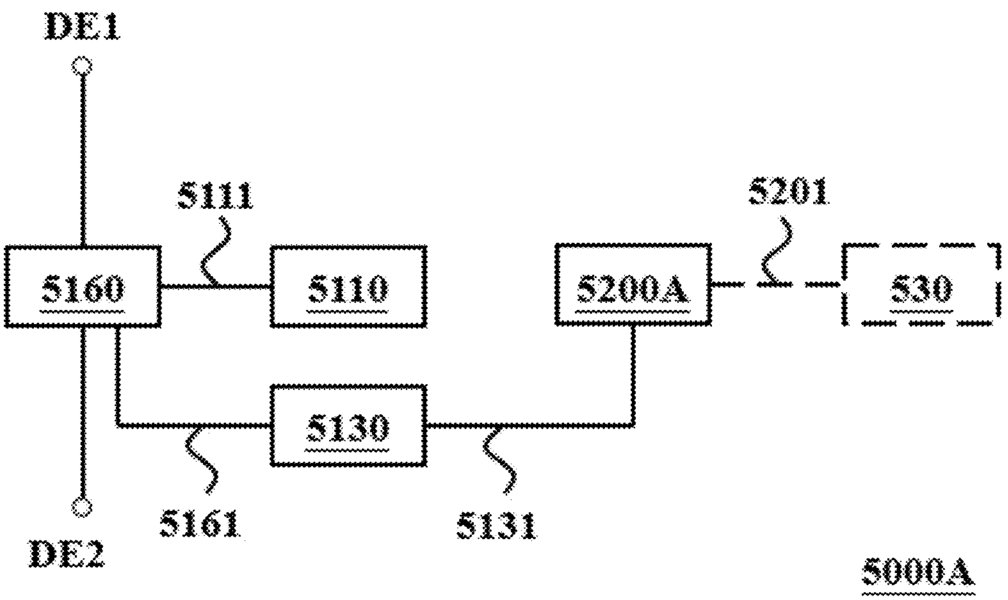
FIG. 31A is a block diagram of an installation detection module according to some exemplary embodiments.

FIG. 31A is a block diagram of an installation detection module according to some embodiments. Referring to FIG. 31A, the installation detection module 5000A includes a detection pulse generating module 5110, a detection determining circuit 5130, a detection path circuit 5160, and a current-limiting circuit 5200A. Configurations and operations of the detection pulse generating module 5110, detection determining circuit 5130, and detection path circuit 5160 are similar to those of the above analogous embodiments of FIGS. 30A-30E, and thus are not repeatedly described here.

A difference between the embodiment illustrated in FIG. 31A and the other analogous embodiments is that the current-limiting circuit 5200A of FIG. 31A comprises or is implemented by a bias adjustment circuit 5200A. The detection determining circuit 5130 is configured to transmit a detection result signal Sdr to the bias adjustment circuit 5200A, which is coupled to a driving circuit 530 through a path 5201 and is configured to affect or adjust the bias voltage of the driving circuit 530 in order to control the operation state of the driving circuit 530.

Figure 31B:
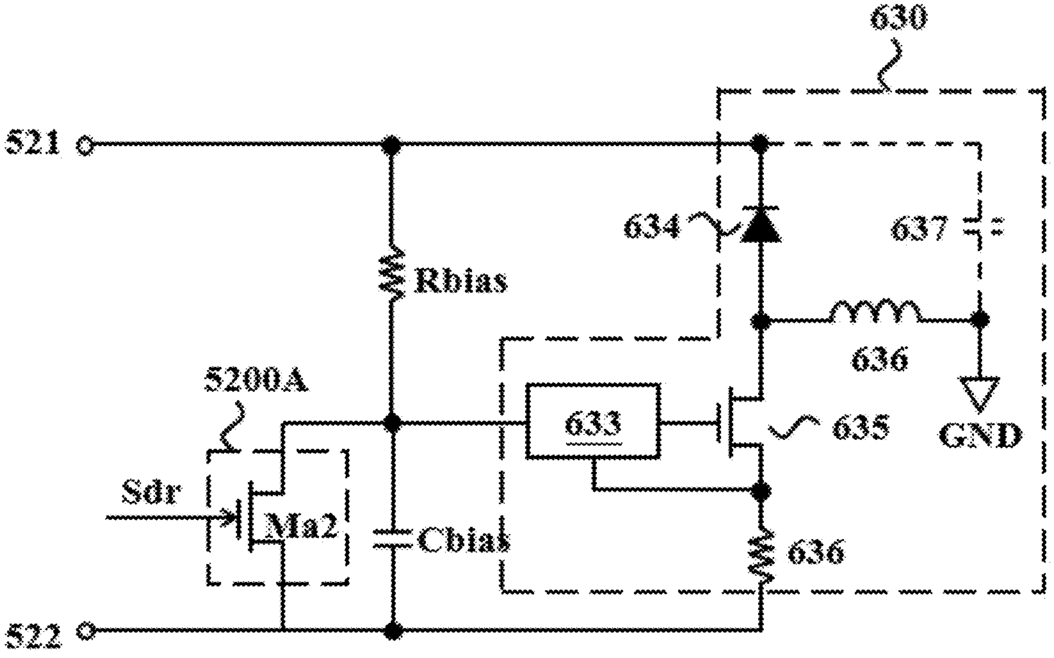
FIG. 31B is schematic circuit diagram of a bias adjustment circuit according to some embodiments.

FIG. 31B is a schematic circuit diagram of the control circuit according to some embodiments. Referring to FIG. 31B, the bias adjustment circuit 5200A includes a transistor Ma2, which has a first terminal electrically connected to the connection terminal of a resistor Rbias and a capacitor Cbias and the power input terminal of the controller 633, a second terminal electrically connected to the second filtering output terminal 522, and a control terminal for receiving the adjustment control signal Vctl. In some embodiments, the resistor Rbias and the capacitor Cbias can be regarded as an external bias circuit of the driving circuit 630, which is configured to provide an operating power for the controller 633.

When the detection determining circuit 5130 determines that the LED tube lamp has been correctly installed in the lamp socket (no body impedance introduced), the detection determining circuit 5130 outputs a disabling detection result signal Sdr to the transistor Ma2, and the transistor Ma2 cuts off in response to the disabling detection result signal Sdr. Under such state, the bias voltage can be provided to the controller 633 and thus enables the controller 633 to control the switching of the switch, and the lamp driving signal can be therefore generated to drive the LED module.

When the detection determining circuit 5130 determines that the LED tube lamp is not correctly installed in the LED tube lamp (body impedance introduced), the detection determining circuit 5130 outputs an enabling detection result signal Sdr to the transistor Ma2 to turn the transistor Ma2 on, so as to electrically connect the power input terminal of the controller 633 to the ground terminal. Under such a state, the controller 633 disables due to the power input terminal being grounded. It worth noting that an additional leakage path may be formed through the transistor Ma2 when the transistor Ma2 is turned on, however, the leakage current does not harm the human body, and meets the safety requirement since the bias voltage applied to the controller 633 is relatively low.

FIG. 32A is a block diagram of an installation detection module 5000*b* for an LED tube lamp according to some embodiments. Referring to FIG. 32A, the installation detection module 5000*b* includes a detection pulse generating module 5110, a control circuit 5120, a detection determining circuit 5130, and a detection path circuit 5160. Configurations and operations of the detection pulse generating module 5110, detection path circuit 5160, and detection determining circuit 5130 are similar to those of the above-described embodiments of FIGS. 30A-30F, and thus are not repeatedly described here.

A main difference of the embodiment of FIG. 32A from some previous embodiments is that a current-limiting circuit 5200*b* is disposed with a flicker suppression circuit 590 in the embodiments of FIG. 32A. In operation, a detection result signal Sdr from the detection determining circuit 5130 is transmitted to the control circuit 5120, in order to control operation of the flicker suppression circuit 590 through the control circuit 5120. The control circuit 5120 is connected to the flicker suppression circuit 590 through a path 5121, and in a detection mode is configured to control operation state of the flicker suppression circuit 590. In a normal operation mode, the flicker suppression circuit 590 is configured to perform current adjustment or compensation according to a detected voltage, in order to reduce the amplitude of a driving current output by a driving circuit, thereby suppressing ripple or flicker phenomena.

Compared to the embodiments of FIG. 18 or 27, since the current-limiting circuit 5200*b* achieves the function/effects of current limiting or electric-shock protection by controlling a flicker suppression circuit 590, it's not needed to additionally and serially connect a switching circuit on a power loop of the LED tube lamp for electric-shock protection, so the overall cost in manufacturing an installation detection module without such a switching circuit is significantly lower.

Figure 32B:
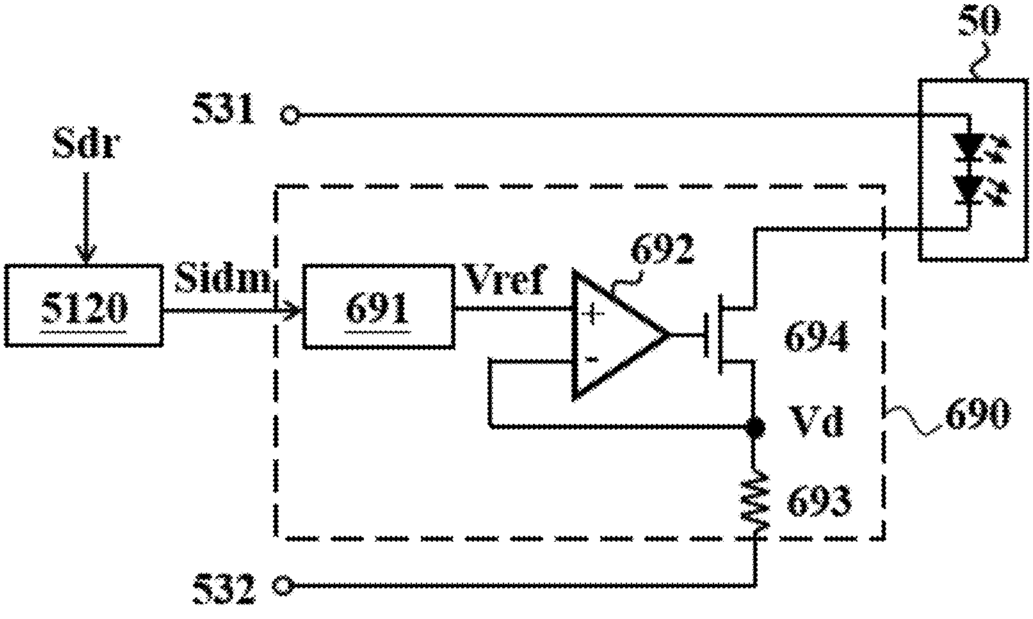
FIG. 32B is a schematic circuit diagram illustrating a control circuit of an installation detection module according to some embodiments.

FIG. 32B is a circuit diagram illustrating a control circuit 5120 of an installation detection module (as 5000*a*) according to some embodiments. Referring to FIG. 32B, a flicker suppression circuit 690 of these embodiments includes a voltage generating circuit 691, an operational amplifier 692, a resistor 693, and a transistor 694. The voltage generating circuit 691 is coupled to a control circuit 5120, in order to generate a reference voltage Vref. The operational amplifier 692 has two input terminals and one output terminal, wherein one (such as a positive input terminal) of the two input terminals is coupled to an output terminal of the voltage generating circuit 691 in order to receive the reference voltage Vref, and the other (such as a negative input terminal) of the two input terminals is coupled to the resistor 693 and the transistor 694. The resistor 693 has a first end coupled to the operational amplifier 692 and transistor 694 and has a second end coupled to a second driving output terminal or a ground terminal. And the transistor 694 has a first terminal coupled to a cathode or negative terminal of the LED module 50, a second terminal coupled to the operational amplifier 692 and the first end of the resistor 693, and a control terminal coupled to the output terminal of the operational amplifier 692.

Specifically, referring to FIGS. 32A and 32B, when the detection determining circuit 5130 determines that the LED tube lamp is not correctly installed into a lamp socket or is still in a detection mode, the control circuit 5120 based on a received detection result signal Sdr indicating incorrect-installation state is configured to transmit a corresponding installation state signal Sidm to the voltage generating circuit 691, which then adjusts the reference voltage Vref to a ground voltage level or low level in response to the installation state signal Sidm, to cause the operational amplifier 692 to output a disabling signal or not output any signal, in order to cause or maintain the transistor 694 in a cutoff state. On the other hand, when the detection determining circuit 5130 judges that the LED tube lamp is correctly installed into a lamp socket or is in a normal operation mode, the control circuit 5120 based on a received detection result signal Sdr indicating correct-installation state is configured to transmit a corresponding installation state signal Sidm to the voltage generating circuit 691, which then adjusts the reference voltage Vref to a proper stable value, enabling the operational amplifier 692 based on the proper reference voltage Vref and a voltage detected from the resistor 693 to generate a control signal to control operation of the transistor 694 within a linear region.

For example, referring to FIGS. 32A and 32B, under a normal operation mode, when the power line voltage increases, the voltage Vd at the negative input terminal of the operational amplifier 692 also increases, to cause the difference between the reference voltage Vref and the voltage Vd to decrease. Then the operational amplifier 692 is configured to generate a lower-voltage level control signal to drive the transistor 694, causing an equivalent impedance between the first and second terminals of the transistor 694 to be relatively large. On the contrary, when the power line voltage decreases, the voltage Vd at the negative input terminal of the operational amplifier 692 also decreases, to cause the difference between the reference voltage Vref and the voltage Vd to increase. Then the operational amplifier 692 is configured to generate a higher-voltage level control signal to drive the transistor 694, causing an equivalent impedance between the first and second terminals of the transistor 694 to be relatively small. Accordingly, when the power line voltage increases, the LED module 50 is in effect serially connected to increasing or higher impedance, but when the power line voltage decreases, the equivalent impedance connected in series with the LED module 50 decreases in response, so that no matter how the power line voltage varies the magnitude of current flowing through the LED module 50 can be maintained at a stable or nearly constant value, thereby avoiding/reducing the incidence of flicker phenomenon.

Figure 33A:
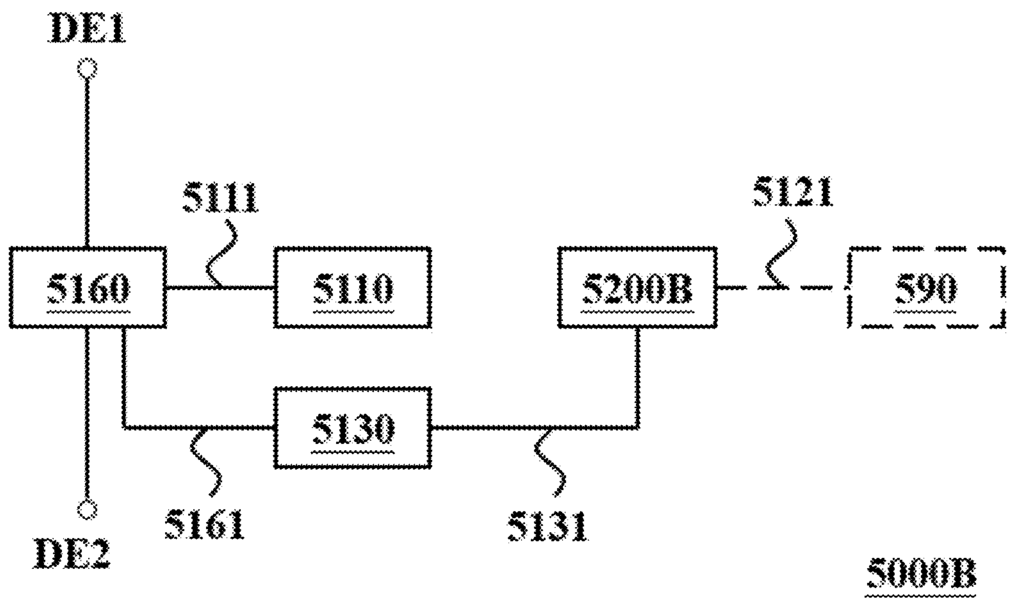
FIG. 33A is a block diagram of an installation detection module for an LED tube lamp according to some embodiments.

FIG. 33A is a block diagram of an installation detection module 5000B for an LED tube lamp according to some embodiments. Referring to FIG. 33A, the installation detection module 5000B includes a detection pulse generating module 5110, a detection determining circuit 5130, a detection path circuit 5160, and a current-limiting circuit 5200B. Configurations and operations of the detection pulse generating module 5110, detection path circuit 5160, and detection determining circuit 5130 of FIG. 33A are similar to those of the above-described embodiments of FIGS. 30A-30E, and thus are not repeatedly described here.

A main difference of the embodiment of FIG. 33A from some previous embodiments is that the current-limiting circuit 5200B of the embodiment of FIG. 33A comprises or is implemented by a bias adjustment circuit 5200B. The detection determining circuit 5130 is configured to transmit a detection result signal Sdr to the bias adjustment circuit 5200B, which is coupled to a flicker suppression circuit 590 through a path 5121 and is configured to affect or adjust the bias voltage of the flicker suppression circuit 590 in order to control operation state of the flicker suppression circuit 590.

Figure 33B:
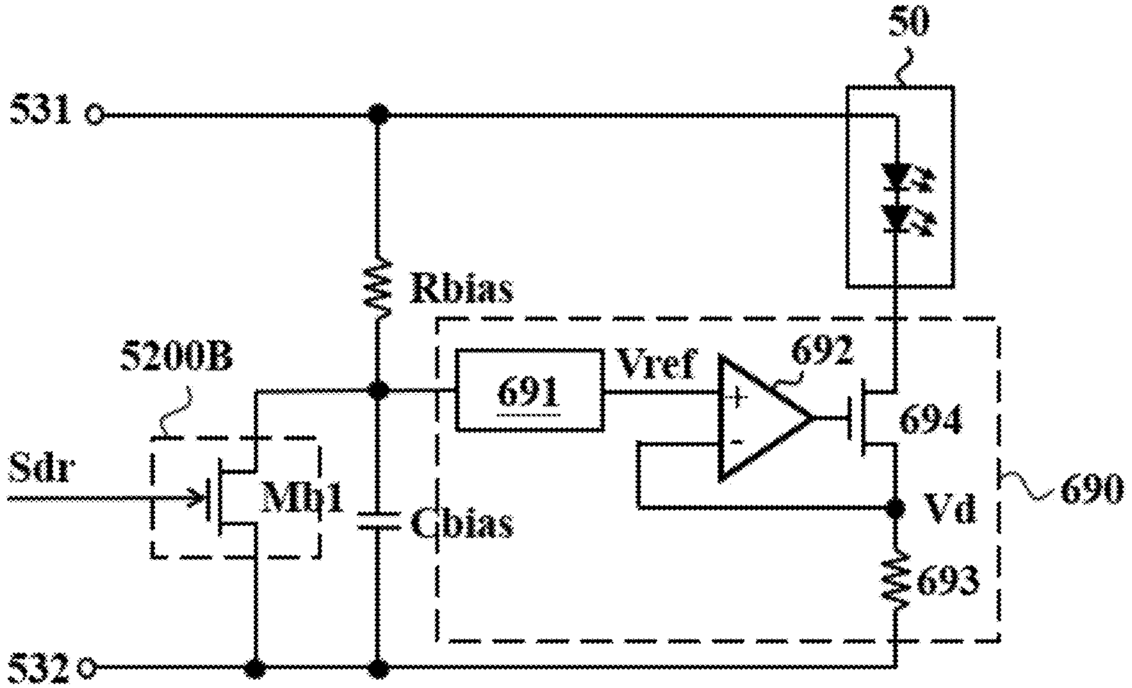
FIGS. 33B and 33C are schematic circuit diagrams of a bias adjustment circuit according to some embodiments.

FIG. 33B is a circuit diagram of a bias adjustment circuit 5200B according to some embodiments. Referring to FIG. 33B, the bias adjustment circuit 5200B includes a transistor Mb1. The transistor Mb1 has a first terminal electrically connected to a common node between a resistor Rbias and a capacitor Cbias and an enabling terminal of a flicker suppression circuit 690 (or a voltage generating circuit 691); a second terminal electrically connected to a second driving output terminal 532; and a control terminal for receiving a detection result signal Sdr. In this embodiment of FIG. 33B, the resistor Rbias and capacitor Cbias act as an external biasing circuit for the flicker suppression circuit 690 and configured to provide power for the flicker suppression circuit 690 (or the voltage generating circuit 691) to operate.

Specifically, referring to FIGS. 33A and 33B, when the detection determining circuit 5130 determines that the LED tube lamp is not correctly installed into a lamp socket or is still in a detection mode, the detection determining circuit 5130 is configured to transmit an enabling detection result signal Sdr to the transistor Mb1, which then conducts in response to the enabling detection result signal Sdr, causing the enabling terminal of the flicker suppression circuit 690 to be in effect shorted to ground (through the second driving output terminal 532), which prevents the voltage generating circuit 691 from being activated. At this state, the reference voltage Vref in FIG. 33B is maintained at a ground voltage level or low level, causing the operational amplifier 692 of FIG. 33B to output a disabling signal or not to output any signal, maintaining the transistor 694 of FIG. 33B in a cutoff state. On the other hand, when the detection determining circuit 5130 judges that the LED tube lamp is correctly installed into a lamp socket or is in a normal operation or lighting mode, the detection determining circuit 5130 is configured to transmit a disabling detection result signal Sdr to the transistor Mb1, which then is cut off in response to the disabling detection result signal Sdr, and therefore the flicker suppression circuit 690 or the voltage generating circuit 691 can normally generate a reference voltage Vref, enabling the operational amplifier 692 based on the generated reference voltage Vref and a voltage Vd detected from the resistor 693 of FIG. 33B to generate a control signal to control operation of the transistor 694 within a linear region.

For example, referring to FIGS. 33A and 33B, under a normal operation mode, when the power line voltage increases, the voltage Vd at the negative input terminal of the operational amplifier 692 increases in response, to cause the difference between the reference voltage Vref and the voltage Vd to decrease. Then the operational amplifier 692 is configured to generate a lower-voltage level control signal to drive the transistor 694, causing an equivalent impedance between the first and second terminals of the transistor 694 to be relatively large. On the contrary, when the power line voltage decreases, the voltage Vd at the negative input terminal of the operational amplifier 692 decreases in response, to cause the difference between the reference voltage Vref and the voltage Vd to increase. Then the operational amplifier 692 is configured to generate a higher-voltage level control signal to drive the transistor 694, causing an equivalent impedance between the first and second terminals of the transistor 694 to be relatively small. Accordingly, when the power line voltage increases, the LED module 50 is in effect serially connected to increasing or higher impedance, but when the power line voltage decreases, the equivalent impedance connected in series with the LED module 50 decreases in response, so that no matter how the power line voltage varies the magnitude of current flowing through the LED module 50 can be maintained at a stable or nearly constant value, thereby avoiding/reducing the incidence of flicker phenomenon.

Figure 33C:
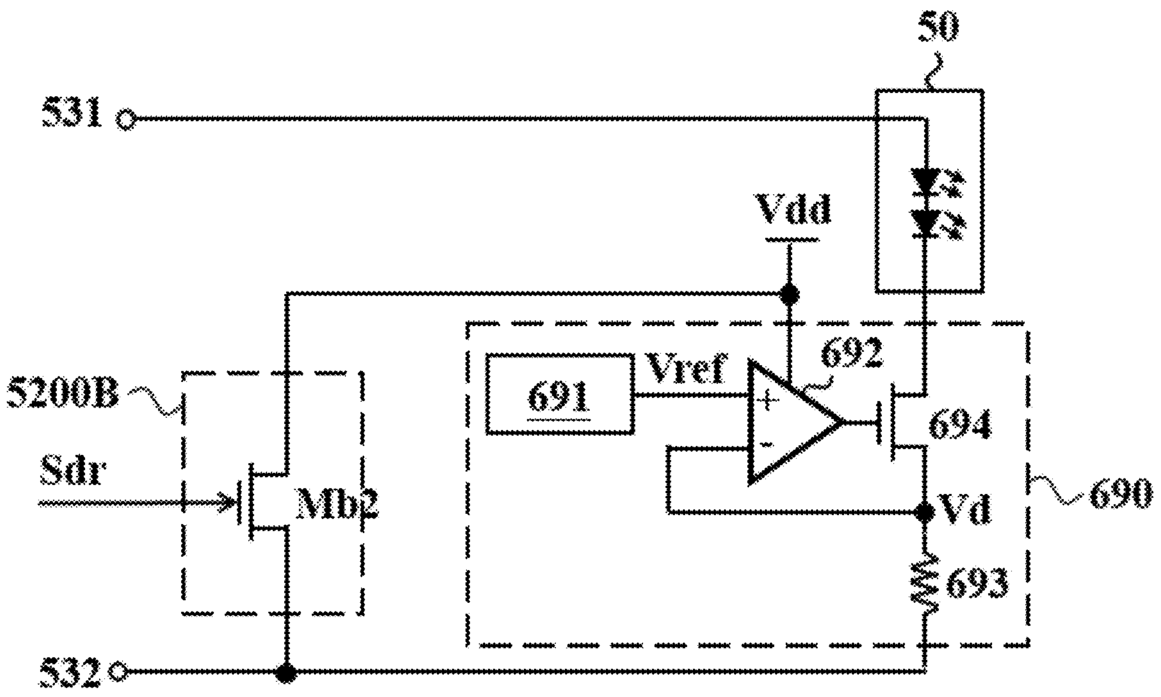

FIG. 33C is a circuit diagram of a bias adjustment circuit 5200B according to some embodiments. Referring to FIG. 33C, the bias adjustment circuit 5200B includes a transistor Mb2. The transistor Mb2 has a first terminal connected to an enabling terminal of an operational amplifier 692 (which is the terminal connected to a biasing voltage Vdd); a second terminal connected to a second driving output terminal 532; and a control terminal for receiving a detection result signal Sdr. The embodiment of FIG. 33C is largely similar to the embodiments of FIG. 33B, with a main difference that the bias adjustment circuit 5200B of the embodiment of FIG. 33C achieves enabling/disabling of a flicker suppression circuit 690 of FIG. 33C by controlling whether the enabling terminal of the operational amplifier 692 be grounded or not.

Specifically, referring to FIGS. 33A and 33C, when the detection determining circuit 5130 judges that the LED tube lamp is not correctly installed into a lamp socket or is still in a detection mode, the detection determining circuit 5130 is configured to transmit an enabling detection result signal Sdr to the transistor Mb2, which then conducts in response to the enabling detection result signal Sdr, causing the enabling terminal of the operational amplifier 692 to be in effect shorted to ground (through the second driving output terminal 532). At this state, no matter what the voltage Vd on the resistor 693 is, the operational amplifier 692 outputs a disabling signal or is regarded as not outputting an enabling signal, to maintain the transistor 694 in a cutoff state. On the other hand, when the detection determining circuit 5130 judges that the LED tube lamp is correctly installed into a lamp socket or is in a normal operation or lighting mode, the detection determining circuit 5130 is configured to transmit a disabling detection result signal Sdr to the transistor Mb2, which then is cut off in response to the disabling detection result signal Sdr, and therefore the operational amplifier 692 can normally receive the biasing voltage Vdd, enabling the operational amplifier 692 based on the reference voltage Vref and a voltage Vd detected from the resistor 693 of FIG. 33C to generate a control signal to control operation of the transistor 694 within a linear region. Other related operations in the embodiment of FIG. 33C are similar to those described above in the embodiments of FIGS. 33A and 33B, so are not described again here.

Figure 34A:
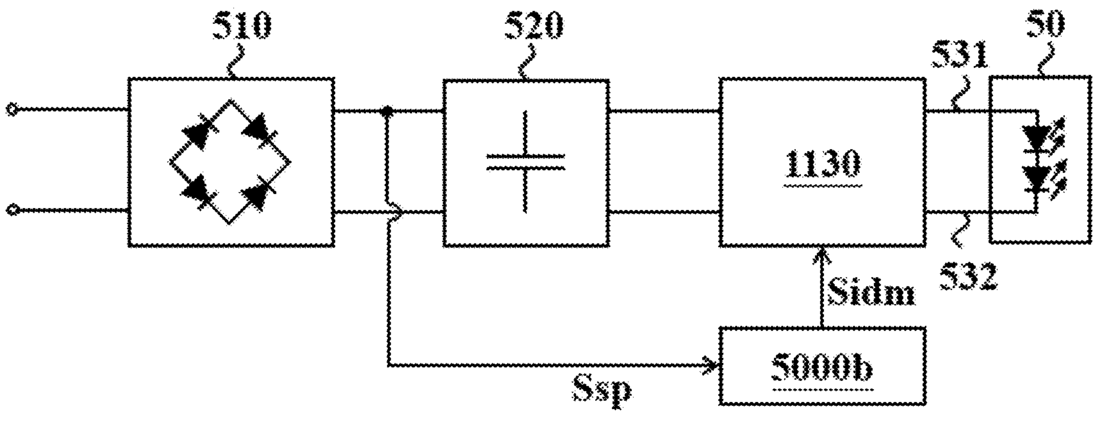
FIG. 34A is a block diagram of an installation detection module according to some exemplary embodiments.

FIG. 34A is a block diagram of an installation detection module according to some exemplary embodiments. Referring to FIG. 34A, the installation detection module in these exemplary embodiments can be regarded as including a detection module 5000*b* and a driving circuit 1030. Connection relations between the rectifying circuit 510, the filtering circuit 520, the driving circuit 1030, and an LED module 50 are similar to those in the above-described embodiments of FIG. 9A, and thus are not repeatedly described herein. The detection module 5000*b* in these embodiments has an input terminal and an output terminal, where the input terminal is coupled to the power loop of the LED tube lamp and the output terminal is coupled to the driving circuit 1030.

Specifically, after the LED tube lamp is powered up (no matter whether or not the LED tube lamp is correctly installed in the lamp socket), the driving circuit 1130 enters an installation detection mode. Under the installation detection mode, the driving circuit 1130 provides a lighting control signal having narrow pulse (e.g., the pulse-on period is smaller than 1 ms) for driving the power switch (not shown), so that the driving current, generated under the installation detection mode, is smaller than 5 MIU or 5 mA. On the other hand, under the installation detection mode, the detection circuit 5000*b* detects an electrical signal on the power loop/detection path and generates an installation detection signal Sidm, in which the installation detection signal Sidm is transmitted to the driving circuit. The driving circuit 1130 determines whether to enter a normal driving mode according to the received installation detection signal Sidm. If the driving circuit 1130 determines to maintain in the installation detection mode, which means the LED tube lamp is not correctly installed in the lamp socket during the first pulse, the next pulse is output, according to a frequency setting, for temporarily conducting the power loop/detection path, so that the electrical signal on the power loop/detection path can be detected by the detection circuit 5000*b* again. On the contrary, if the driving circuit 1130 determines to enter the normal driving mode, the driving circuit 1130 generates, according to at least one of the input voltage, the output voltage, the input current, the output current and the combination of the above, the lighting control signal capable of modulating the pulse width for maintaining the brightness of the LED module 50. In the present embodiment, the input/output voltage and the input/output current can be sampled by a feedback circuit (not shown) in the driving circuit 1130.

Figure 34B:
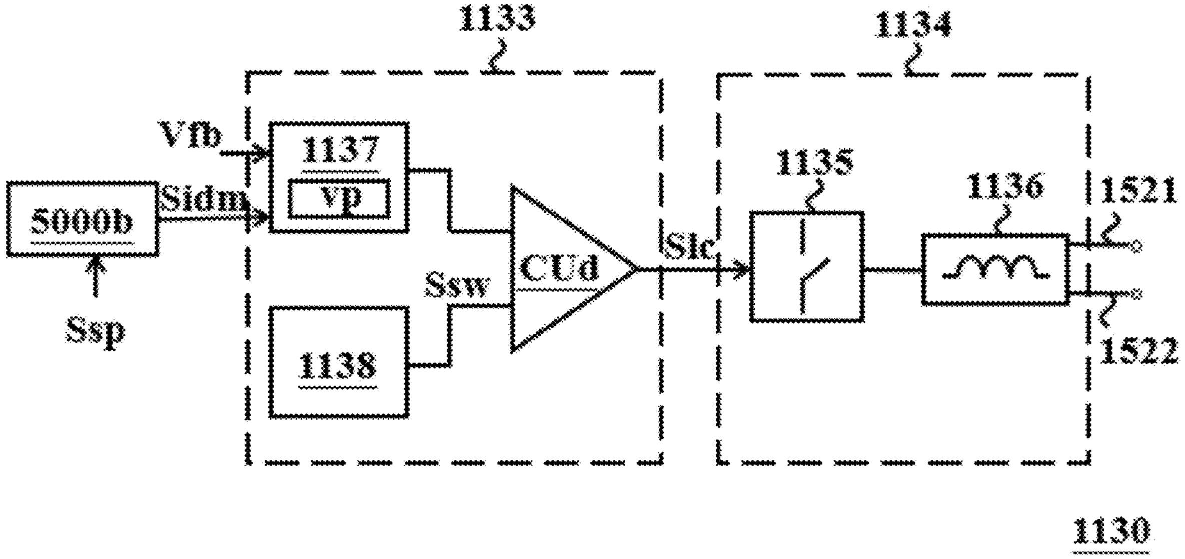
FIG. 34B is schematic diagram of a driving circuit with an electric shock detection function according to some exemplary embodiments.

FIG. 34B is a schematic diagram of an exemplary driving circuit according to some exemplary embodiments. Referring to FIG. 34B, the driving circuit 1130 includes a controller 1133 and a conversion circuit 1134. The controller 1133 includes a signal receiving unit 1137, a sawtooth wave generating unit 1138 and a comparison unit CUd, and the conversion circuit 1134 includes a switch circuit (also known as power switch) 1135 and energy release circuit 1136. The signal receiving unit 1137 has input terminals for receiving a feedback signal Vfb and installation detection signal Sidm and an output terminal coupled to a first input terminal of the comparison unit CUd. The sawtooth wave generating unit 1138 has an output terminal coupled to a second input terminal of the comparison unit CUd. An output terminal of the comparison unit CUd is coupled to a control terminal of the switch circuit 1135. The circuit arrangement of the switch circuit 1135 and the energy release circuit 1136 can be referred to with respect to the embodiments of FIGS. 13A to 13E, and it will not be repeated herein.

In the controller 1133, the signal receiving unit 1137 can be implemented by, for example, a circuit constituted by an error amplifier. The error amplifier is configured to receive the feedback signal Vfb related to the voltage/current information of the power supply module and the installation detection module Sidm. In the present embodiment, the signal receiving unit 1137 selectively outputs a preset voltage Vp or the feedback signal Vfb to the first input terminal of the comparison unit CUd. The sawtooth wave generating unit 1138 is configured to generate and provide a sawtooth signal Ssw to the second input terminal of the comparison unit CUd. In the waveform of the sawtooth signal Ssw of each cycle, the slope of at least one of the rising edge and the falling edge is not infinity. In some embodiments, the sawtooth wave generating unit 1138 generates the sawtooth signal Ssw, according to a fixed operation frequency, no matter what the operation mode of the driving circuit 1130 is. In some embodiments, the sawtooth wave generating unit 1138 generates the sawtooth signal Ssw according to different operation frequencies when operating in different operation modes. For example, the sawtooth wave generating unit 1138 can change the operation frequency according to the installation detection signal Sidm. The comparison unit CUd compares the signal level of the signal on the first and the second input terminal, in which the comparison unit CUd outputs the lighting control signal Slc with high voltage level when the signal level on the first input terminal is greater than the second input terminal and outputs the lighting control signal Slc with low voltage level when the signal level on the first input terminal is not greater than the second input terminal. For example, the comparison unit CUd outputs high voltage when the signal level of the sawtooth signal Ssw is greater than the preset voltage Vp or the feedback signal Vfb, so as to generate the lighting control signal having pulse waveform.

FIG. 45C is a signal waveform diagram of an exemplary power supply module according to an exemplary embodiment. Referring to FIGS. 34B and 45C, when the LED tube lamp is powered up (including the pins on both end caps being connected to the connecting sockets, or the pins on one end cap being connected to the corresponding connecting socket and the pins on the other end cap being touched by the user), the driving circuit 1130 starts to operate and enter the installation detection mode DTM. The operation in the first period T1 is described below. Under the installation detection mode, the signal receiving unit 1137 outputs the preset voltage Vp to the first input terminal of the comparison unit CUd, and the sawtooth wave generating unit 1138 provides the sawtooth signal SW to the second input terminal of the comparison unit CUd. From the perspective of the variation of the sawtooth wave SW, the signal level of the sawtooth wave SW gradually increases, after the start timepoint ts, from the initial level to a peak level. After reaching the peak level, the sawtooth wave SW is gradually decreased to the initial level. Before the signal level of the sawtooth wave SW rises to the preset voltage Vp, the comparison unit CUd outputs the lighting control signal Slc with low voltage. During the period from the timepoint of the signal level rising to exceed the preset voltage Vp to the timepoint falling back below the preset voltage Vp, the comparison unit CUd pulls the signal level up to the high voltage. After the signal level falling to lower than the preset voltage Vp, the comparison unit CUd pulls the signal level down to the low voltage again. By performing the above operation, the comparison unit CUd can generate the pulse DP based on the sawtooth wave SW and the preset voltage Vp, in which the pulse width/pulse-on period DPW of the pulse DP is the duration that the signal level of the sawtooth wave SW is higher than the preset voltage Vp.

The lighting control signal Slc having the pulse DP is transmitted to the control terminal of the switch circuit 1135, so that the switch circuit 1135 is turned on during the pulse-on period DPW. Therefore, the energy release unit 1136 absorbs power and a current is generated on the power loop/detection path in response to the switch circuit being turned on. Since the current generated on the power loop/detection path leads to a signal feature, such as signal level, waveform, and/or frequency changing, the signal feature variation of the sample signal Ssp will be detected by the detection circuit 5000*b*. In the present embodiment, the detection circuit 5000*b* detects the voltage for example, but the disclosure is not limited thereto. Under the first period T1, since the voltage variation SP does not exceed the reference voltage Vref, the detection circuit 5000*b* output the corresponding installation detection signal Sidm to the signal receiving unit 1137, so that the signal receiving unit 1137 is maintained in the installation detection mode DTM and continuously outputs the preset voltage Vp to the comparison unit 1137. Since the voltage variation of the sample signal Ssp under the second period T2 is similar to the sample signal Ssp under the first period T1, the circuit operation under the first and the second periods T1 and T2 are similar, so that the detailed description is not repeated herein.

Conclusively, under the first and the second periods T1 and T2, the LED tube lamp is determined to be not correctly installed. In addition, during the first and the second periods T1 and T2, although the driving circuit 1130 generates the driving current on the power loop, the current value of the driving current does not cause electric shock to the human body because of the turn-on time of the switch circuit 1135 is relatively short, in which the current value is smaller than 5 MIU/mA and can be reduced to 0.

After entering the third period T3, the detection circuit 5000*b* determines the voltage variation of the sample signal Ssp exceeds the reference voltage Vref, so as to provide the corresponding installation detection signal Sidm, indicating the LED tube lamp is correctly installed, to the signal receiving unit 1137. When the signal receiving unit 1137 receives the installation detection signal Sidm indicating the correct installation state, the driving circuit 1130 enters, after the end of the third period T3, the normal driving mode DRM from the installation detection mode DTM. Under the fourth period T4 of the normal driving mode DRM, the signal receiving unit 1137 generates the corresponding signal to the comparison unit CUd according to the feedback signal Vfb instead of the preset voltage Vp, so that the comparison unit CUd is capable of dynamically modulating the pulse-on period of the lighting control signal Slc according to the driving information such as the input voltage, the output voltage and/or the driving current. From the perspective of the signal waveform of the lighting control signal Sc, since the pulse DP is configured to detect the installation state/risk of electric shock, the pulse width of the pulse DP is relatively narrow, compared to the pulse width under the normal driving mode DRM. For example, the pulse width of the pulse under the installation detection mode DTM (e.g., DP) is less than the minimum pulse width under the normal driving mode DRM.

In some embodiments, the detection circuit 5000*b* stops operating under the normal driving mode DRM. In some embodiments, under the normal driving mode DRM, the signal receiving unit 1137 ignores the installation detection signal Sidm regardless of whether the detection circuit 5000*b* continuously operates.

Referring to FIG. 34A again, in some exemplary embodiments, when the LED tube lamp is powered up (no matter whether it's correctly installed or not), the detection circuit 5000*b* would be enabled based on forming of a current path in the LED tube lamp, and the enabled detection circuit 5000*b* detects an electrical signal on a power loop in a short period of time and then according to the detection result transmits an installation detection signal Sidm to the driving circuit 1130, wherein the driving circuit 1130 determines whether to operate or be enabled to perform power conversion, according to the received installation detection signal Sidm. Upon the detection circuit 5000*b* transmitting an installation detection signal Sidm indicating the LED tube lamp is correctly installed, the driving circuit 1130 in response is enabled and then generates a lighting control signal to drive a power switch, so as to convert received power to output power for the LED module. In this case, after transmitting the installation detection signal Sidm indicating the LED tube lamp is correctly installed, the detection circuit 5000*b* would switch into an operation mode not affecting the power conversion by the driving circuit 1130. On the other hand, upon the detection circuit 5000*b* transmitting an installation detection signal Sidm indicating the LED tube lamp is incorrectly installed, the driving circuit 1130 in response remains disabled until receiving an installation detection signal Sidm indicating the LED tube lamp is correctly installed. In this case when the driving circuit 1130 remains disabled, the detection circuit 5000*b* continues in the detection mode for detecting the electrical signal on the power loop until detecting that the LED tube lamp is correctly installed.

Figure 35A:
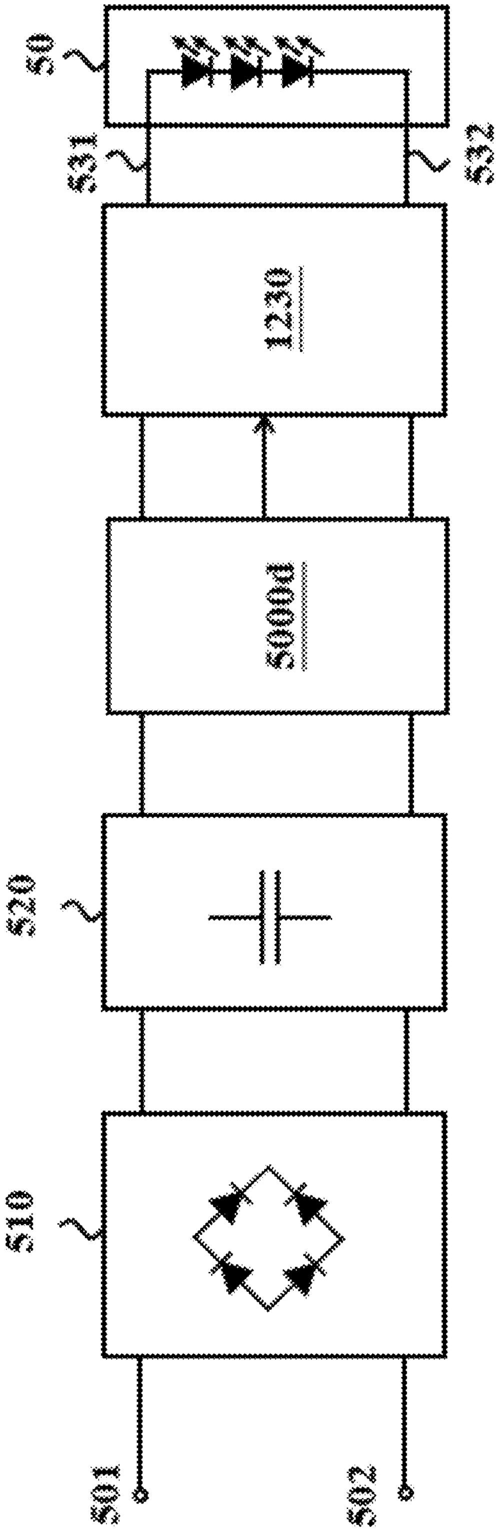
FIG. 35A is a block diagram of an installation detection module according to some exemplary embodiments.

FIG. 35A is a block diagram of an installation detection module according to some embodiments. Referring to FIG. 35A, the power supply module in this embodiment includes a rectifying circuit 510, a filtering circuit 520, an installation detection module 5000*d*, and a driving circuit 1230, wherein the rectifying circuit 510 and the filtering circuit 520 are configured in a way similar to the above-described embodiments. The installation detection module 5000*d* includes a detection triggering circuit which is disposed on the power loop of the LED tube lamp, for example after the stage of the filtering circuit 520 as shown in FIG. 35A, but the present embodiment is not limited to this position of the detection triggering circuit 5000*d*. The detection triggering circuit 5000*d* is coupled to an input power terminal or voltage detection terminal of the driving circuit 1230, whose output terminal(s) is/are coupled to the LED module 50.

In this embodiment, the detection triggering circuit 5310 is enabled when external power is applied to the power supply module of the LED tube lamp, to transform an electrical signal at the output terminal of the filtering circuit 520 into an electrical signal of a first waveform to be provided to the input power terminal or voltage detection terminal of the driving circuit 1230. The driving circuit 1230 then enters into a detection mode when receiving the first-waveform electrical signal, in order to output a narrow-width pulse signal, conforming to a specific detection need, to drive the power switch; and the driving circuit 1230 further determines whether the LED tube lamp is properly/correctly installed in a lamp socket, by detecting the magnitude of current flowing through the power switch or the LED module 50. Upon determining that the LED tube lamp is properly/correctly installed, the driving circuit 1230 will switch or enter into a normal operating mode (or LED operating mode) to drive the power switch, in which mode the driving circuit 1230 is able to provide stable output power to light up the LED module 50. During this normal operating mode, the detection triggering circuit 5310 is disabled so as not to affect power provided from the filtering circuit 520 to the driving circuit 1230, and therefore the electrical signal being provided to the input power terminal or voltage detection terminal of the driving circuit 1230 is not of the first waveform. On the other hand, upon determining that the LED tube lamp is not properly/correctly installed, the driving circuit 1230 will continually output the narrow-width pulse signal to drive the power switch. The time sequence of the signals are similar to those in the above described embodiments of FIG. 45C, please refer to the corresponding descriptions for more details.

Figure 35B:
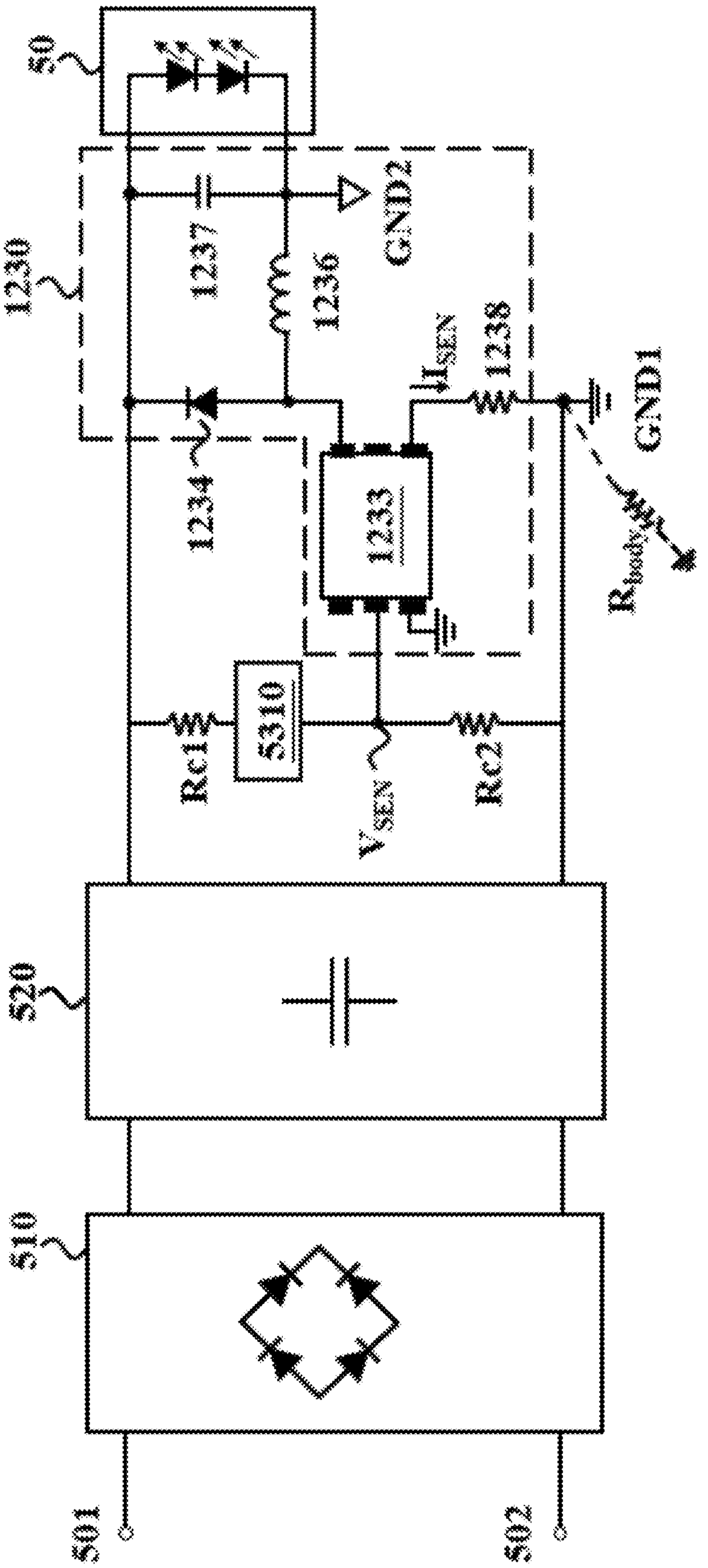
FIG. 35B is schematic diagram of a driving circuit with an electric shock detection function according to some exemplary embodiments.
Figure 35C:
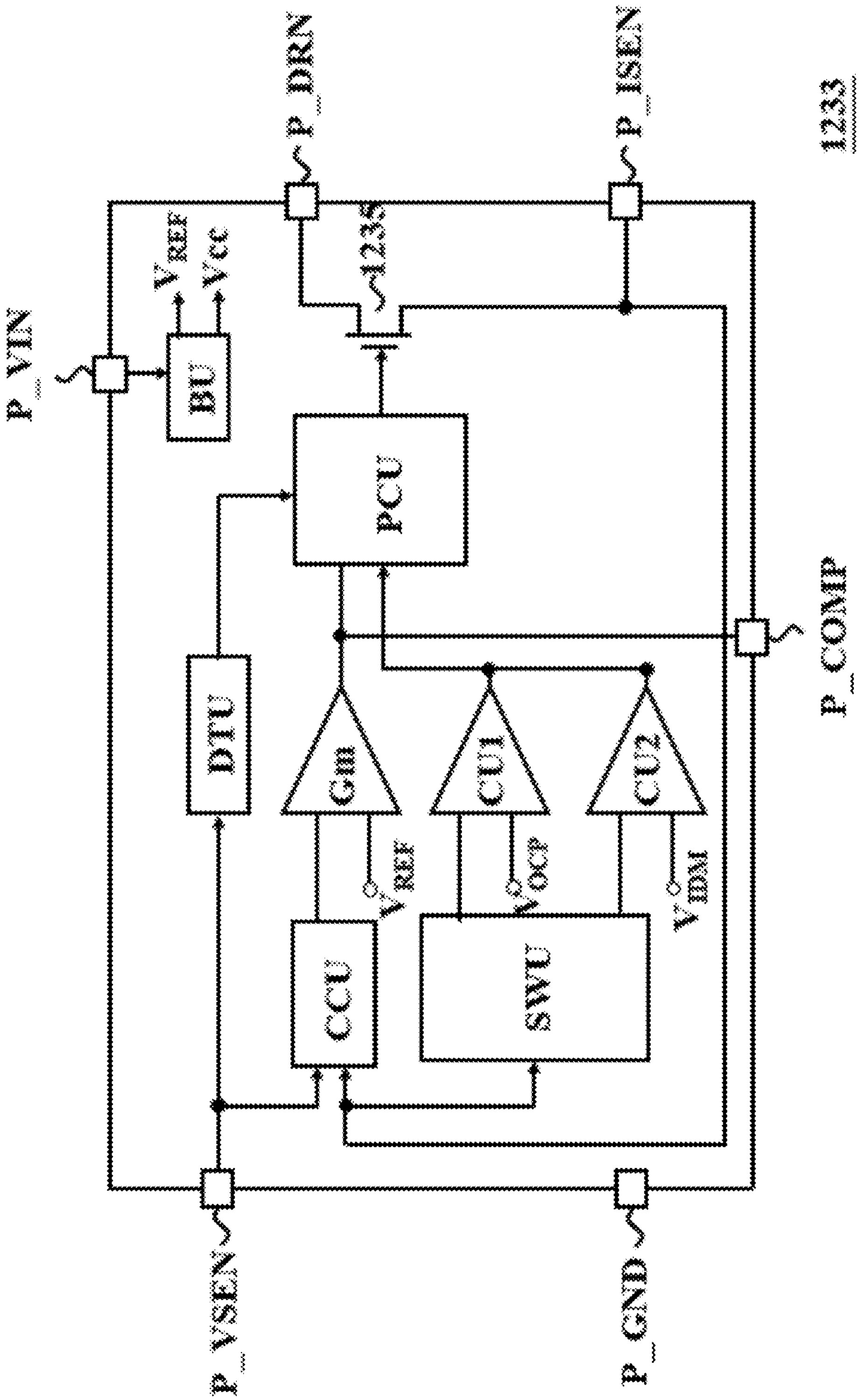
FIG. 35C is a schematic diagram of the circuit cubes of the integrated controller according to some exemplary embodiments.

The embodiment illustrated by FIG. 35A is further elaborated in detail here taking the specific circuits in FIGS. 35B and 35C as examples of the circuit blocks in FIG. 35A. FIG. 35B is a circuit diagram illustrating the detection triggering circuit 5310 and the driving circuit 1230 according to some embodiments, and FIG. 35C is an application circuit diagram illustrating an integrated controller 1233 of the driving circuit 1230 according to some embodiments. In this embodiment of the driving circuit 1230, the driving circuit 1230 includes the controller 1233, an inductor 1236, a diode 1234, a capacitor 1237, and a resistor 1238, wherein the integrated controller 1233 has several signal receiving terminals, such as a power supply terminal P_VIN, a voltage detection terminal P_VSEN, a current detection terminal P_ISEN, a driving terminal P_DRN, a compensation terminal P_COMP, and a reference ground P_GND. An end of the inductor 1236 and the anode of the diode 1234 are connected to the driving terminal P_DRN of the controller 1233. The resistor 1238 is connected to the current detection terminal P_ISEN of the controller 1233. The detection triggering circuit 5310 in this embodiment may comprise for example a switch circuit, which is connected to the voltage detection terminal P_VSEN of the controller 1233. In addition, for meeting operation needs of the integrated controller 1233, the power supply module of the LED tube lamp may further include one or more auxiliary circuits external to the integrated controller 1233, such as resistors Rb1 and Rb2 connected to output terminals of the filtering circuit 520. Other external auxiliary circuits not illustrated in FIG. 35B may be included in the power supply module.

The integrated controller 1233 includes a pulse control unit PCU, a power switch unit PSW, a current control unit CCU, a gain amplification unit Gm, a bias unit BU, a detection triggering unit DTU, a switching unit SWU, and comparison units CU1 and CU2. The pulse control unit PCU is configured to generate a pulse signal to control the power switch unit PSW. The power switch unit PSW is connected to the inductor 1236 and the diode 1234 through the driving terminal P_DRN and is configured to switch on or off in response to the control by the pulse signal, enabling the inductor 1236 to alternately store and release power under normal operating mode in order to provide a stable output current to the LED module 50. The current control unit CCU receives a voltage detection signal VSEN through the voltage detection terminal P_VSEN, and through the current detection terminal P_ISEN receives a current detection signal ISEN indicating the magnitude of current flowing through the resistor 1238. Therefore, the current control unit CCU under the normal operating mode can learn about the real-time operating state of the LED module 50 according to the voltage detection signal VSEN and the current detection signal ISEN, and then generate an output regulation signal according to the real-time operating state of the LED module 50. The output regulation signal is processed by the gain amplification unit Gm and thereby provided to the pulse control unit PCU as a reference signal for the pulse control unit PCU to generate the pulse signal. The bias unit BU is configured to receive a filtered signal output by the filtering circuit 520, and then generate both stable driving voltage VCC and reference voltage VREF to be used by the units in the integrated controller 1233. The detection triggering unit DTU is connected to the detection triggering circuit 5310 and the resistors Rc1 and Rc2 through the voltage detection terminal P_VSEN and is configured to detect whether characteristics of the voltage detection signal VSEN received through the voltage detection terminal P_VSEN conform to that of the first waveform. The detection triggering unit DTU then according to the detection result outputs a detection result signal to the pulse control unit PCU. The switching unit SWU is connected to a first end of the resistor 1238 through the current detection terminal P_ISEN and is configured to provide the current detection signal ISEN selectively to the comparison unit CU1 or the comparison unit CU2, according to the detection result of the detection triggering unit DTU. The comparison unit CU1 is mainly used for overcurrent protection and is configured to compare the received current detection signal ISEN with an overcurrent reference signal VOCP and then output a comparison result to the pulse control unit PCU. And the comparison unit CU2 is mainly used for electric shock protection and is configured to compare the received current detection signal ISEN with an installation reference signal VIDM and then output a comparison result to the pulse control unit PCU.

Specifically, when the LED tube lamp is powered up, the detection triggering circuit 5310 would first be enabled and would then affect or adjust, by for example switching of a switch, the voltage detection signal VSEN (to be) provided at the voltage detection terminal P_VSEN, so as to make the voltage detection signal VSEN have the first waveform. For example, taking a switch as the detection triggering circuit 5310, upon being enabled the detection triggering circuit 5310 may in a short period continually switch for several times between a conduction state and a cutoff state on predefined intervals, to cause the voltage detection signal VSEN to vary/fluctuate in a voltage waveform reflecting the switching of the detection triggering circuit 5310. The default state of the integrated controller 1233 upon initially receiving electrical power is disabled. For example, during this state the pulse control unit PCU does not output the pulse signal to drive the power switch unit PSW to light up the LED module 50. But during this state of the integrated controller 1233 the detection triggering unit DTU determines whether the voltage detection signal VSEN has (characteristics of) the first waveform and then transmits the determination result to the pulse control unit PCU.

When the pulse control unit PCU receives from the detection triggering unit DTU a signal indicating that the voltage detection signal VSEN conforms with (characteristics of) the first waveform, the integrated controller 1233 enters into an installation detection mode. Under the installation detection mode, the pulse control unit PCU outputs a narrow-width pulse signal to drive the power switch unit PSW, limiting a current flowing through the power loop of the LED tube lamp to being below a level (such as 5 MIU) over which level there will be substantial risk of electric shock on a human body. Detailed configuration of the pulse signal under the installation detection mode is similar to and can be set with reference to that in the above-described embodiments of the installation detection module. In one respect, under the installation detection mode, the switching unit SWU switches into a circuit configuration for transmitting the current detection signal ISEN to the comparison unit CU2, such that the comparison unit CU2 compares the received current detection signal ISEN with the installation reference signal VIDM and generates a comparison result. In this configuration of the switching unit SWU, when the LED tube lamp is improperly/incorrectly installed, the second end of the resistor 1238 can be regarded as connected to the ground terminal GND1 via the body impedance Rbody. Since the intervening of the body impedance Rbody may cause the equivalent impedance increases, the body impedance Rbody can be reflected in variation of the current detection signal ISEN, and thus the pulse control unit PCU can correctly determine, according to the comparison result of the comparison unit CU2, whether the LED tube lamp is properly/correctly installed to a lamp socket or whether the risk of electric shock may occur. Thus if the pulse control unit PCU determines that the LED tube lamp is improperly/incorrectly installed to a lamp socket according to the comparison result of the comparison unit CU2, then the integrated controller 1233 remains operating in the installation detection mode, for example, the pulse control unit PCU continues to output a narrow-width pulse signal to drive the power switch unit PSW and judges whether the LED tube lamp is properly/correctly installed to a lamp socket according to the current detection signal ISEN. But if the pulse control unit PCU determines that the LED tube lamp is properly/correctly installed to a lamp socket according to the comparison result, the integrated controller 1233 then enters into a normal operating mode.

Under the normal operating mode, the detection triggering circuit 5310 is inactive or disabled, for example, the detection triggering circuit 5310 doesn't affect or adjust the voltage detection signal VSEN. In this case, the voltage detection signal VSEN is determined merely by voltage division between the resistors Rc1 and Rc2, and in the integrated controller 1233 the detection triggering unit DTU may be disabled or the pulse control unit PCU doesn't use the detection result signal from the detection triggering unit DTU. Also in this case, the pulse control unit PCU adjusts the pulse width of the pulse signal mainly according to signal(s) output by the current control unit CCU and the gain amplification unit Gm, in a way to output a pulse signal having a corresponding rated power to drive the power switch unit PSW, thereby providing a stable output current to the LED module 50. In one respect, under the normal operating mode, the switching unit SWU switches into a circuit configuration for transmitting the current detection signal ISEN to the comparison unit CU1, to enable the comparison unit CU1 to compare the received current detection signal ISEN with the overcurrent reference signal VOCP, so that the pulse control unit PCU can adjust its output pulse signal during an overcurrent condition to prevent circuit damage. It should be noted that the overcurrent protection function available in the integrated controller 1233 is merely optional. In other embodiments, the comparison unit CU1 may be omitted, and the switching unit SWU is accordingly omitted, in the integrated controller 1233, resulting in the current detection signal ISEN being directly provided to an input terminal of the comparison unit CU2.

Figure 35D:
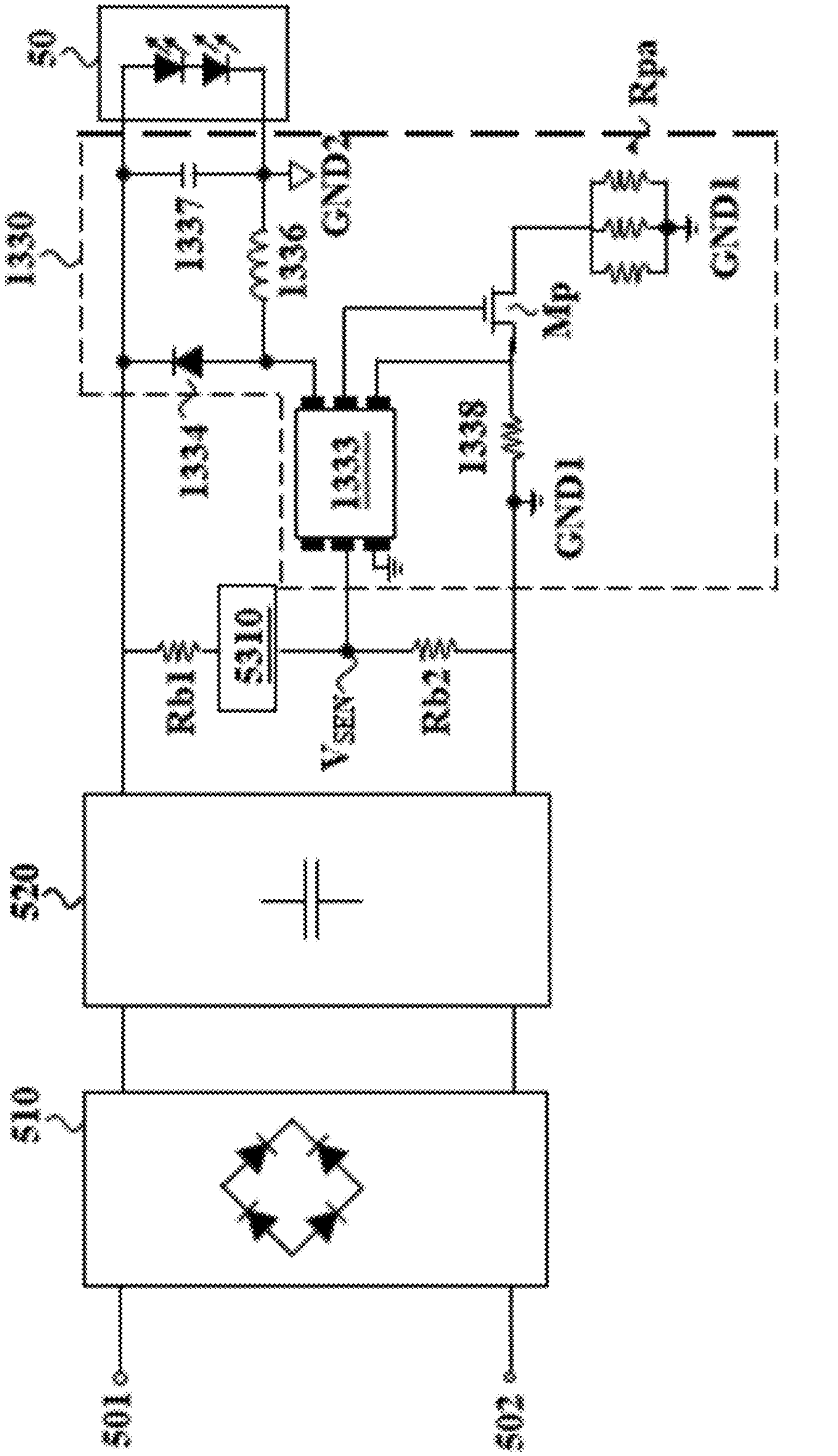
FIG. 35D is schematic diagram of a driving circuit with an electric shock detection function according to some exemplary embodiments.

FIG. 35D is a circuit diagram illustrating the detection triggering circuit 5000*d* and the driving circuit 1330 according to some embodiments. The embodiment is similar to that in FIG. 35B, with a main difference that the embodiment of FIG. 35B further includes a configuration of a transistor Mp and an array Rpa of parallel-connected resistors, wherein the transistor Mp has a drain terminal connected to the first end of the resistor 1338, a gate terminal connected to a detection control terminal of the integrated controller 1333, and a source terminal connected to a first common end of the resistor array Rpa. The resistor array Rpa includes a plurality of parallel-connected resistors, whose resistances can be set based on that of the resistor 1338, and the second common end of the resistor array Rpa is connected to the ground terminal GND1.

In some embodiments, the integrated controller 1333 outputs a signal via the detection control terminal to the gate terminal of the transistor Mp according to its current operation mode, so that the transistor Mp can be turned on in response to the received signal or can be cut off or turned off in response to the received signal during the normal operating mode. In the case of where the transistor Mp is turned on, the resistor array Rpa can be equivalent to connect to the resistor 1338 in parallel, which reduces the equivalent impedance to lower than the resistor 1338 alone. The lower equivalent resistance then can match an order of magnitude of the body impedance. Therefore, during the installation detection mode, when the LED tube lamp is improperly/incorrectly installed (e.g., a user touches the conductive part of the LED tube lamp, or an external impedance is electrically connected to a power loop of the LED tube lamp), the introduction of the resistor array Rpa can adjust the equivalent impedance and thus increase the amount of variation in the current detection signal ISEN. As a result, the sensibility of reflecting the body impedance can be enhanced, and thereby improving the accuracy of the installation detection result.

Figure 36:
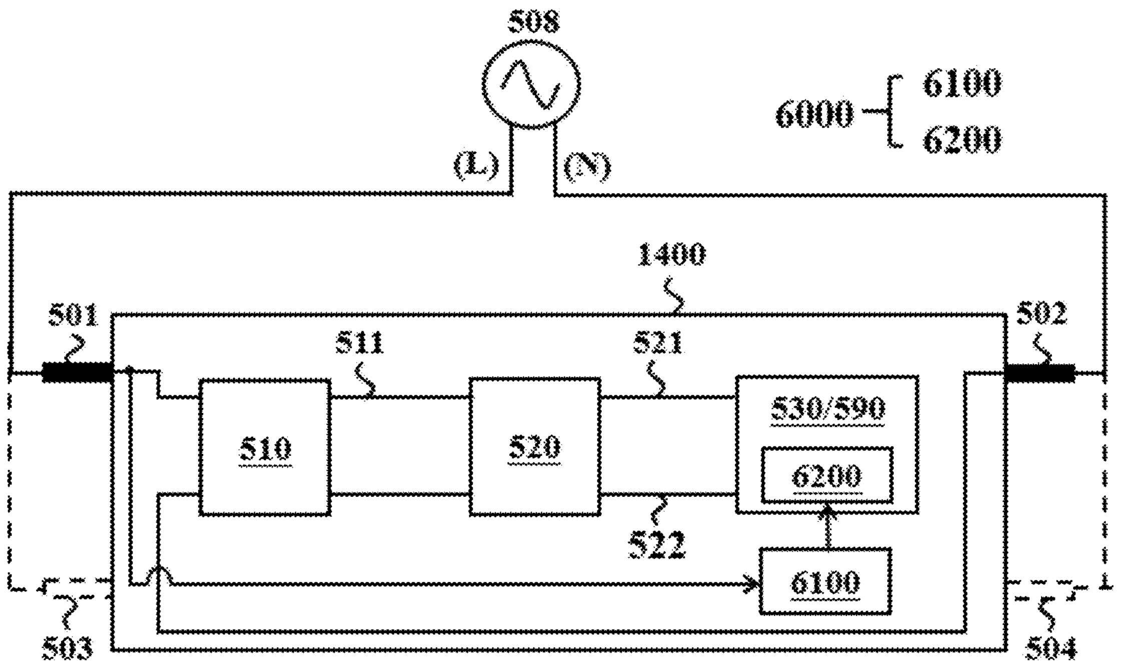
FIG. 36 is a block diagram of an exemplary power supply module in an LED tube lamp according to some exemplary embodiments.

FIG. 36 is a block diagram of an exemplary power supply module in an LED tube lamp according to some exemplary embodiments. Referring to FIG. 36, the LED tube lamp 1400 is, for example, configured to receive an external driving signal directly provided by an external AC power source 508, wherein the external driving signal is input through the live wire (marked as "L") and the neutral wire (marked as "N") to two pins 501 and 502 on two ends of the LED tube lamp 1400. In practical applications, the LED tube lamp 1400 may further have two additional pins 503 and

504, also on the two ends. Under the structure of the LED tube lamp 1400 having the four pins 501-504, depending on design needs two pins (such as the pins 501 and 503, or the pins 502 and 504) on an end cap coupled to one end of the LED tube lamp 1400 may be electrically connected or mutually electrically independent, but the disclosure is not limited to any of the mentioned cases. A shock detection module 6000 is disposed inside the LED tube lamp 1400 and includes a detection control circuit 6100 and a current-limiting circuit 6200. The shock detection module 6000 may be and is hereinafter referred to as an installation detection module 6000. The current-limiting circuit 6200 may be disposed in combination with a driving circuit 530 and may be the driving circuit 530 itself or may comprise a bias adjustment circuit (to be further described in embodiments below) configured for controlling the enabling/disabling of the driving circuit 530. The detection control circuit 6100 is electrically connected to a power loop of the LED tube lamp 1400 through a first detection connection terminal DE1 and a second detection connection terminal DE2, in order to sample and detect, under a detection mode, a signal on the power loop, and is configured to control the current-limiting circuit 6200 according to the detection result, so as to determine whether to prevent a current from passing through the LED tube lamp 1400. When the LED tube lamp 1400 is not yet correctly/properly installed into a lamp socket, the detection control circuit 6100 detects a relatively small current signal and then assumes/presumes it to be facing or passing through relatively high impedance, so the current-limiting circuit 6200 in response disables the driving circuit 530 to prevent the LED tube lamp 1400 from operating in a normal lighting mode (i.e., suspending the LED tube lamp 1400 from lighting up). On the other hand, when a relatively large current signal is detected or a relatively small current signal is not detected, the detection control circuit 6100 determines that the LED tube lamp 1400 is correctly/properly installed into a lamp socket, and then the current-limiting circuit 6200 allows the LED tube lamp 1400 to operate in a normal lighting mode (i.e., allowing the LED tube lamp 1400 being lighted up) by enabling the driving circuit 530. In some embodiments, when a current signal on the power loop sampled and detected by the detection control circuit 6100 is equal to or higher than a defined or set current value, the detection control circuit 6100 determines that the LED tube lamp 1400 is correctly/properly installed into a lamp socket and then causes the current-limiting circuit 6200 to enable the driving circuit 530. But when the current signal sampled and detected by the detection control circuit 6100 is lower than a defined or set current value, the detection control circuit 6100 determines that the LED tube lamp 1400 is not correctly/properly installed into a lamp socket and thus causes the current-limiting circuit 5200 to disable the driving circuit 530, thereby causing the LED tube lamp 1400 to enter into a non-conducting state or limiting an effective current value on a power loop in the LED tube lamp 1400 to being smaller than, for example, 5 mA (or 5 MIU according to certain certification standards). The installation detection module 6000 can be regarded as determining whether to cause current conduction or cutoff of the current-limiting circuit 6200 based on the detected impedance, thereby causing the LED tube lamp 1400 to operate in a conducting or normally driven state or enter into a current-limited state or non-driven state. Accordingly, an LED tube lamp 1400 using such an installation detection module 6000 has the benefit of avoiding or reducing the risk of electric shock hazard occurring on the body of a user when accidentally touching or holding a conducting part of the LED tube lamp 1400 which is not yet correctly/properly installed into a lamp socket.

Specifically, when (part of) a human body touches or contacts an LED tube lamp, some impedance of the human body may cause a change in equivalent impedance on a power loop in the LED tube lamp, so the installation detection module 6000 can determine whether a human body has touched or contacted the LED tube lamp by e.g. detecting a change in current/voltage on the power loop, in order to implement the function to prevent electric shock. The installation detection module 6000 of the present embodiment can determine whether the LED tube lamp is correctly/properly installed into a lamp socket or whether the body of a user has accidentally touched a conducting part of the LED tube lamp which is not yet correctly/properly installed into a lamp socket, by detecting an electrical signal such as a voltage or current. Further, compared to the embodiments of FIGS. 18 and 29, since a signal used for determining the installation state is detected/sampled, by the detection control circuit 6100, from the input side of the rectifying circuit 510, the signal characteristics may not be easily influenced by other circuits in the power supply module, so that the possibility of misoperation of the detection control circuit 6100 can be reduced.

From circuit operation perspectives, a method performed by the detection control circuit 6100 and configured to determine under a detection mode whether the LED tube lamp 1400 is correctly/properly installed to a lamp socket or whether there is any unintended external impedance being connected to the LED tube lamp 1400 is shown in FIG. 48A. The method includes the following steps: temporarily conducting a detection path for a period and then cutting it off (step S101); sampling an electrical signal on the detection path during the conduction period (step S102); determining whether the sample of electrical signal conforms with predefined signal characteristics (step S103); if the determination result in step S103 is positive, controlling the current-limiting circuit 5200 to operate in a first state (step S104); and if the determination result in step S103 is negative, controlling the current-limiting circuit 6200 to operate in a second state (step S105) and then returning to the step S101.

In the method of FIG. 48A performed in the embodiment of FIG. 36, the detection path can be a current path connected between the input side of the rectifying circuit 510 and a ground terminal, and its detailed circuit configurations in the embodiment are presented and illustrated below with reference to FIGS. 37A-37C. In addition, the detailed description of how to set parameters such as the conduction period, intervals between multiple conduction periods, and the time point to trigger conduction, of the detection path in the detection control circuit 6100 can refer to the relevant embodiments described in the disclosure.

In the step S101, conducting the detection path for a period may be implemented by means using pulse signal to control switching of a switch.

In the step S102, the sample of electrical signal is a signal that can represent or express impedance variation on the detection path, which signal may comprise a voltage signal, a current signal, a frequency signal, a phase signal, etc.

In step S103, the determination of whether a sample of electrical signal conforms with or matches predefined signal characteristics may include for example, comparing or evaluating the relation of the sample of electrical signal to a predefined signal. In these embodiments, the determination from the detection control circuit 5100 that a sample of electrical signal conforms with or matches predefined signal characteristics may correspond to the determination that the LED tube lamp is correctly installed or in a state without abnormal impedance being coupled in, and the determination from the detection control circuit 7100 that a sample of electrical signal does not conform with or matches predefined signal characteristics may correspond to the determination that the LED tube lamp is not correctly installed or is in a state with abnormal impedance being coupled in.

In the steps S104 and S105 performed in the embodiment of FIG. 29, the first state and the second state are two distinct circuit-configuration states and may be set according to the configured position and type of the current-limiting circuit 6200. For example, in the case or embodiment where the current-limiting circuit 6200 refers to a bias adjustment circuit connected to a power supply terminal or enable terminal of a controller of the driving circuit 530, the first state is a cutoff state (or normal bias state, which allows the driving voltage to be normally supplied to the driving controller) while the second state is a conducting state (or bias adjustment state, which suspends the driving voltage from being supplied to the driving controller). And in the case or embodiment where the current-limiting circuit 6200 refers to a power switch in the driving circuit 530, the first state is a driving-control state, where switching of the current-limiting circuit 6200 is only controlled by the driving controller in the driving circuit 530 and not affected by the detection control circuit 6100; while the second state is a cutoff state.

Detailed operations and example circuit structures for performing the above method in FIG. 48A as under the structure of FIG. 29 are illustrated by descriptions herein of different embodiments of an installation detection module.

Similar to the described embodiments of FIG. 29, the LED tube lamp 6000 of FIG. 36 may further include a flicker suppression circuit 590, wherein configurations and operations of such an LED tube lamp 6000 are similar to those of the embodiments of FIG. 29, and so are not described again here.

Figure 37A:
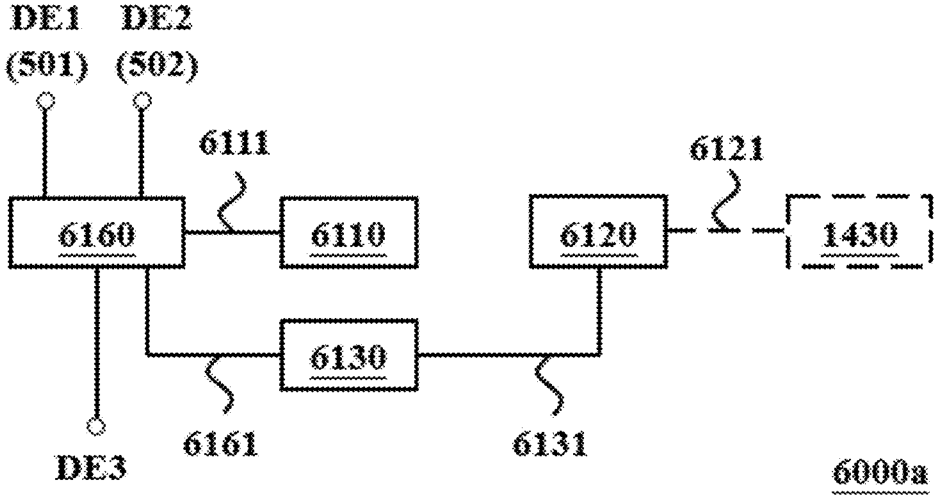
FIG. 37A is a block diagram of an installation detection module according to some exemplary embodiments.

FIG. 37A is a block diagram of an installation detection module according to some exemplary embodiments. Referring to FIG. 37A, the installation detection module 6000*a* includes a detection pulse generating module 6110, a control circuit 6120, a detection determining circuit 6130, and a detection path circuit 6160. The detection determining circuit 6130 is coupled to the detection path circuit 6160 via a path 6161, in order to detect a signal on the detection path circuit 6160. The detection determining circuit 6130 is coupled to the control circuit 6120 via a path 6131, in order to transmit a detection result signal to the control circuit 6120 via the path 6131. The detection pulse generating module 6110 is coupled to the detection path circuit 6160 via a path 6111, in order to generate a pulse signal to inform the detection path circuit 6160 of a time point to conduct a detection path or perform the installation detection. And the control circuit 6120 is coupled to a driving circuit 1430 through a path 6121, in order to control operations of the driving circuit 1430 according to the detection result signal.

In the present embodiment, the detection path circuit 6160 has a first detection connection terminal DE1, a second detection connection terminal DE2, and a third detection connection terminal DE3, wherein the first detection connection terminal DE1 and second detection connection terminal DE2 are electrically connected to two input terminals of a rectifying circuit 510 respectively, in order to receive or sample an external driving signal through a first pin 501 and a second pin 502. The detection path circuit 6160 is configured to rectify the received/sampled external driving signal and to determine under the control of the detection pulse generating module 6110 whether to conduct the rectified external driving signal through a detection path. The detection path circuit 6160 is configured to determine whether to conduct the detection path, in response to the control of the detection pulse generating module 6110. Detailed circuit operations such as using pulse signal for conducting the detection path and detecting whether there is any extraneous impedance being connected to a conductive part of the LED tube lamp are similar to those described in the embodiments of FIGS. 23B to 23D, and thus are not repeatedly described here again. Further, detailed configurations and operations of the detection pulse generating module 6110 and the detection determining circuit 6130 of FIG. 37A can be seen by referring to the descriptions herein of other analogous embodiments, and thus are not repeatedly described again.

From the perspective of the overall operation of the installation detection module 6000*a*, when the LED tube lamp is initially powered up, the detection pulse generating module 6110 is enabled/activated in response to the provided external power and generates pulse signal to temporarily turn on or conduct the detection path formed by the detection path circuit 6160. During the period that the detection path is conducted, the detection determining circuit 6130 samples a signal on the detection path and determines whether the LED tube lamp is correctly installed in the lamp socket or whether a leakage current is generated by a user touching a conductive part of the LED tube lamp. The detection determining circuit 6130 generates a corresponding detection result signal, according to the determination result, and transmits it to the control circuit 6120.

In some embodiments, the control circuit 6120 may comprise a circuit configured to transmit a control signal to a controller in the driving circuit 1430. In the present embodiment, when the control circuit 6120 receives a detection result signal indicating that the LED tube lamp has been correctly installed in the lamp socket, the control circuit 6120 transmits a corresponding control signal to the driving circuit 1430, allowing the driving circuit 1430 to normally perform power conversion for supplying an LED module. On the other hand, when the control circuit 6120 receives a detection result signal indicating that the LED tube lamp is not correctly installed in the lamp socket, the control circuit 6120 transmits a corresponding control signal to the driving circuit 1430, causing the driving circuit 1430 to, in response to the control signal, stop its normal operation or to be disabled. In this case, when the driving circuit 1430 is disabled, the current flowing through the power loop can usually be limited to being lower than a safety value (e.g., 5 MIU).

In some embodiments, the control circuit 6120 comprises and may be referred to below as a bias adjustment circuit 6120, which can control the operation state of the driving circuit 1430 by affecting or adjusting a bias voltage of the driving circuit 1430. In the present embodiment, when the bias adjustment circuit 6120 receives a detection result signal indicating that the LED tube lamp has been correctly installed in the lamp socket, the bias adjustment circuit 6120 does not adjust the bias voltage of the driving circuit 1430, and therefore the driving circuit 1430 can be normally enabled by a received bias voltage and can perform power conversion to provide electricity to the LED module. On the contrary, when the bias adjustment circuit 6120 receives a detection result signal indicating that the LED tube lamp is not correctly installed in the lamp socket, the bias adjustment circuit 6120 adjusts the bias voltage provided to the driving circuit 1430, to a level that is not capable of enabling the driving circuit 1430 to normally perform power conversion. In this case, since the driving circuit 1430 is disabled, the current flowing through the power loop can be limited to lower than the safety value.

Under the configuration of the control circuit 6120, the switching circuit (such as each of the switching circuits 3200, 3200*a*-L, 4200, and 4200*a*) disposed on the power loop and thus required to withstand high current, can be omitted, and therefore the cost of the overall installation detection module can be significantly reduced. On the other hand, since the leakage current is limited by controlling the bias voltage of the driving circuit 1430 through the control circuit 6120, the circuit design of the driving circuit 1430 does not need to be changed, so as to make the commercialization easier.

Figure 37B:
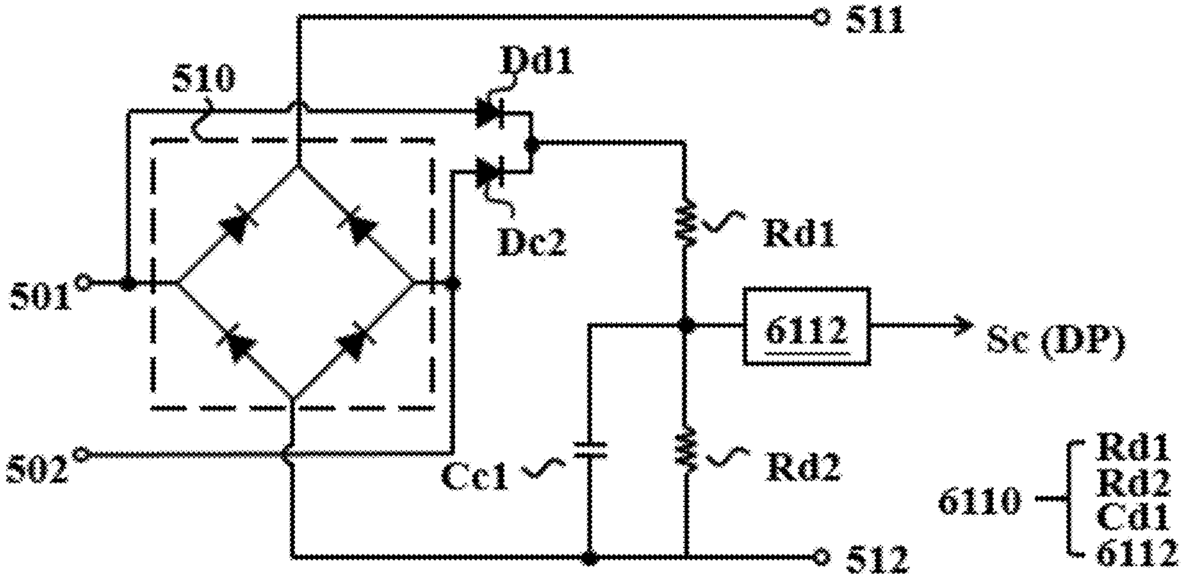
FIGS. 37B and 37C are schematic circuit diagrams of an installation detection module according to some exemplary embodiments.
Figure 37C:
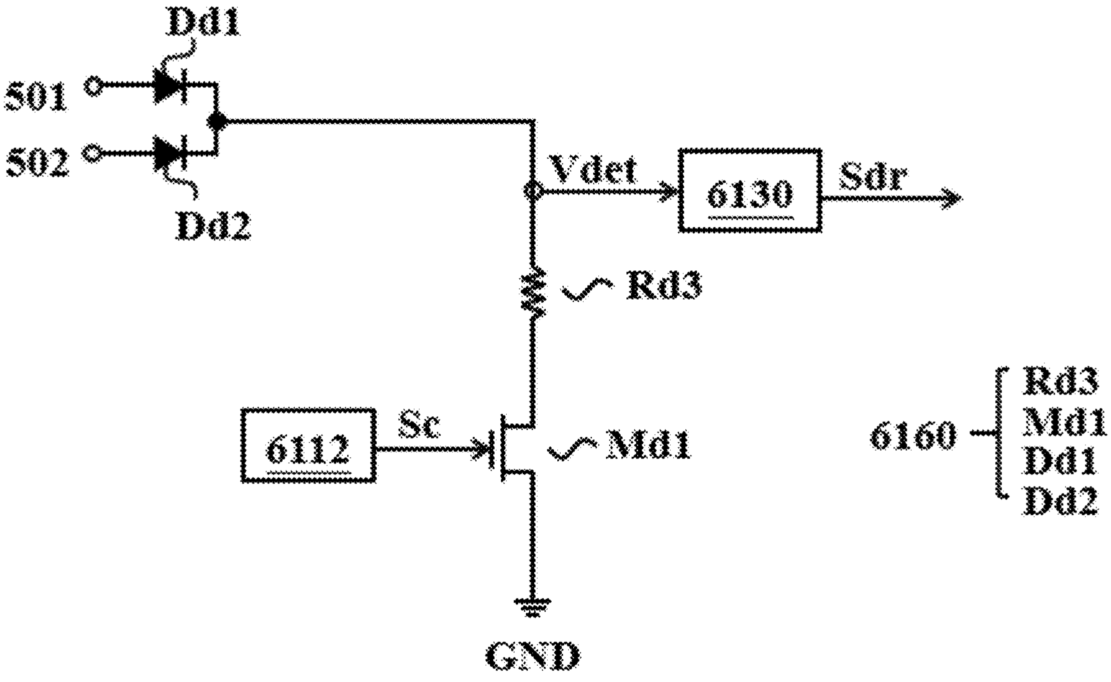

In an exemplary embodiment, the detection pulse generating module 6110 and the detection path circuit 6160 can be respectively implemented by, but not limited to, the circuit configurations illustrated in FIGS. 37B and 37C, and the circuit configurations of the other circuits of the installation detection module 6000*a* are similar to those of the counterpart circuits in other analogous embodiments described herein. Detailed descriptions of the module(s) and circuits illustrated by FIGS. 37B and 37C are presented below.

FIG. 37B is a schematic circuit diagram of the detection pulse generating module according to some embodiments. Referring to FIG. 37B, the detection pulse generating module 6110 includes resistors Rd1 and Rd2, a capacitor Cd1 and a pulse generating circuit 6112. The configuration of the embodiment illustrated in FIG. 29B is similar to that of the detection pulse generating module 5110, the difference between these two embodiments is that the first end of the resistor Rd1 is electrically connected to the first rectifying input terminal (represented as the pin 501) via the diode Dd1 and to the second rectifying input terminal (represented as the pin 502) via the diode Dd2.

FIG. 37C is a schematic circuit diagram of the detection path circuit according to some embodiments. Referring to FIG. 37C, the detection path circuit 6160 includes a resistor Rd3, a transistor Md1 and diodes Dd1 and Dd2. The configuration of the embodiment illustrated in FIG. 37C is similar to that of the detection path circuit 5160, and the difference between these two embodiments is the detection path circuit 6160 further includes the diodes Dd1 and Dd2, and the first end of the resistor Rd3 is electrically connected to the first rectifying input terminal (represented as the pin 501) via the diode Dd1 and to the second rectifying input terminal (represented as the pin 502) via the diode Dd2. In this manner, a detection path can be formed between the rectifying input terminal and the rectifying output terminal, which can be referred to a branch circuit extending from the power loop and is a current path substantially independent from the power loop. The configuration and operation of the diodes Dd1 and Dd2 can be seen referring to the embodiment illustrated in FIG. 28B, and it will not be repeated herein.

Generally speaking, compared to the power supply module including an installation detection module 2520 as described above, the power supply module in the embodiments of FIGS. 29 to 37C includes a driving circuit having installation detection and electric shock protection circuits and functions integrated therein, enabling the driving circuit to perform installation detection and electric shock protection functions. Specifically, the power supply module described in the embodiments of FIGS. 34A and 34B merely needs to further dispose a detection circuit 5000*b* for detecting an electrical signal on a power loop, which can be used in combination with the existing driving circuit to realize installation detection and electric shock protection operations for the LED tube lamp. That is, by adjusting the control mechanism of the driving circuit, the detection pulse generating module, the detection result latching module, and the switch circuit of the installation detection module can all be realized by existing hardware structure(s) in the driving circuit, without the need to dispose additional circuit components. In the embodiments where the driving circuit is enabled to perform installation detection and electric shock protection functions, since the power supply module does not need a complex circuit design including the detection pulse generating module, the detection result latching module, the detection determining circuit, and the switch circuit as the installation detection module described above, design costs of the overall power supply module can be effectively reduced. Besides, due to the reduction of circuit components, the circuit layout of the power supply module may have larger space, and power consumption in the working power supply module is lower, which contributes to causing more of the input power to the LED tube lamp to be used for lighting its LED module, thereby further improving luminance efficiency and reducing the heat produced by the power supply module.

Figure 30H:
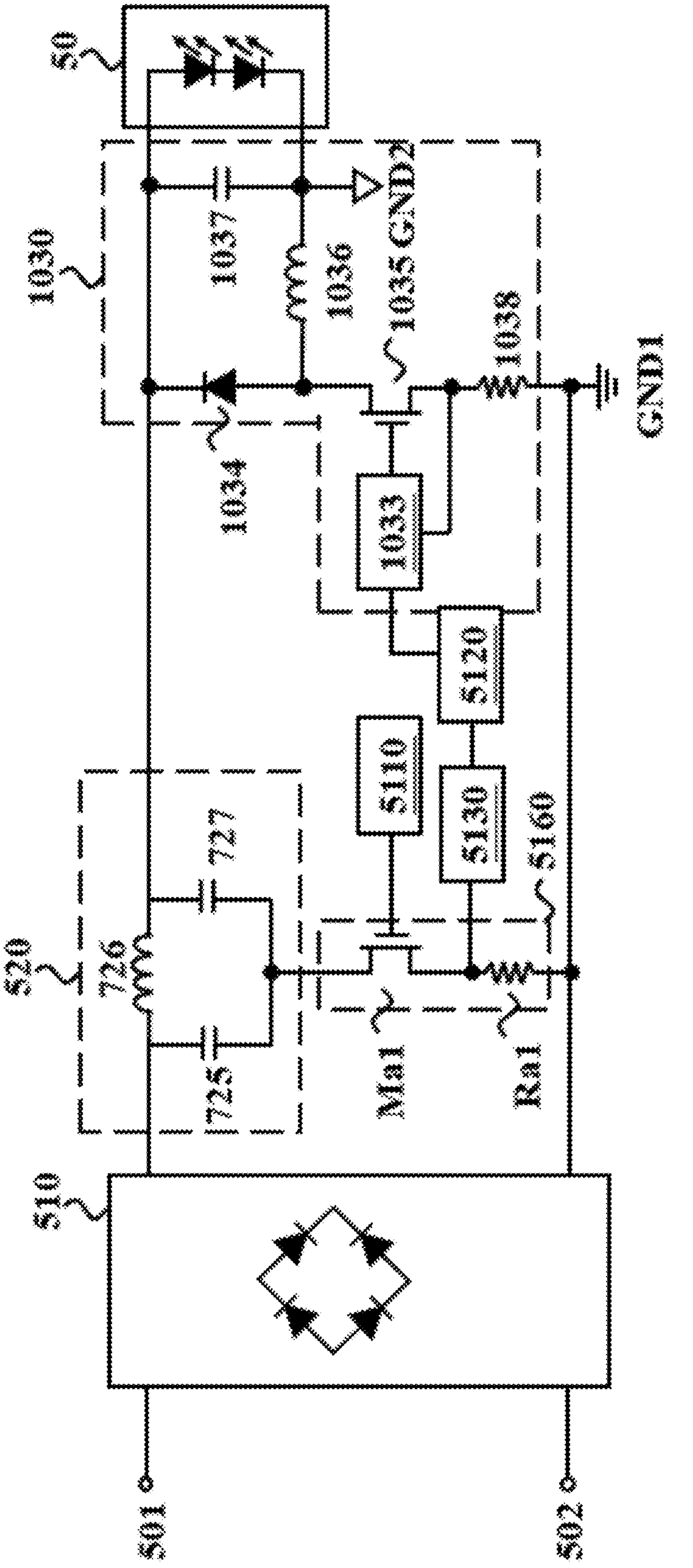
FIG. 30H is a schematic circuit diagram of an installation detection module according to some exemplary embodiments.
Figure 30I:
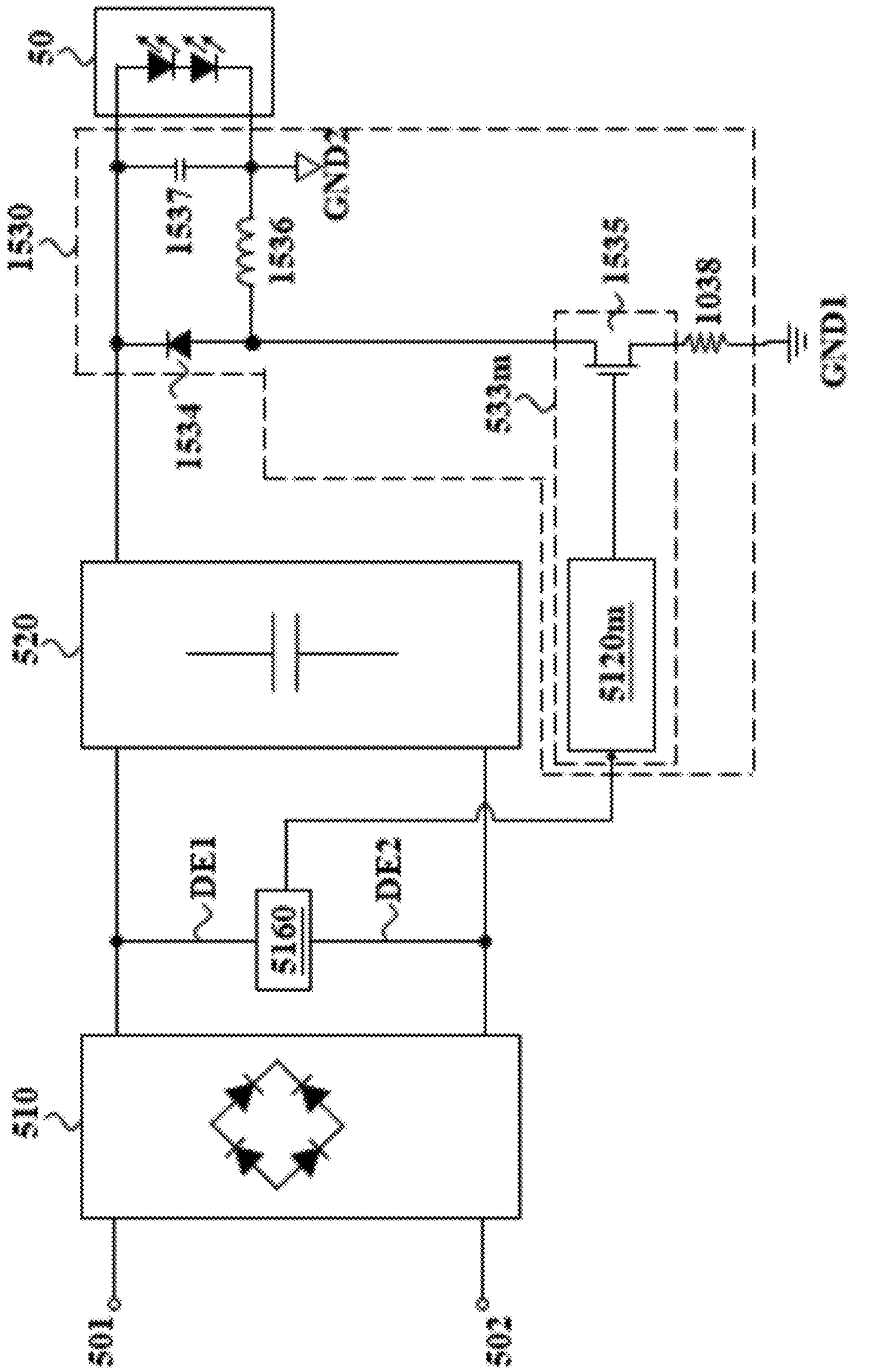
FIG. 30I is a schematic circuit diagram of a power supply module having the functions of constant-current conversion, electric-shock detection, and dimming control according to some embodiments.

Configurations and mechanism of operations of the detection circuit in the embodiments FIG. 30H are similar to those of the detection pulse generating module, the detection path circuit, and the detection determining circuit of an installation detection module, and the functions of the detection result latching circuit and the switch circuit in the installation detection module are implemented by existing controller and power switch(es) in the driving circuit. In the embodiments of FIG. 30H, through disposing a specific detection path circuit 5160, the installation state signal Sidm can be easily designed to be compatible with the signal format of the controller 1033, and therefore difficulties in circuit design can be significantly reduced on the basis of reduced circuit complexity.

It is noted that although the embodiments where the driving circuit is enabled to perform installation detection and electric shock protection functions are explained with reference to the configurations of the detection path circuit 3660 in FIG. 24B, but the disclosure is not limited thereto. In practical applications, the detection path circuit may realize sampling/monitoring of a transient electrical signal by using the configurations of other embodiments described above.

Figure 38:
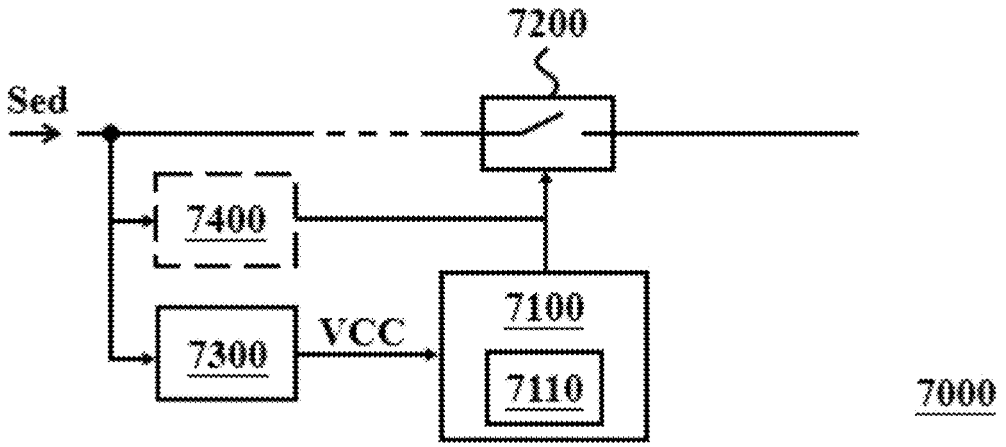
FIG. 38 is a block diagram of an installation detection module according to some exemplary embodiments.

FIG. 38 is a circuit block diagram of an installation detection module according to some exemplary embodiments. Referring to FIG. 38, in the installation detection module 7000, circuits related to installation detection and configured to perform the switching control can be collectively referred as or integrated into a detection controller 7100; and circuits configured to affect the magnitude of the current on the power loop in response to the control by the detection controller 7100 can be collectively referred as or integrated into a current limiting circuit 7200. In addition, although not explicitly pointed out in the above-described embodiments, a person of ordinary skill in the relevant art should know or understand that circuits including an active device need a corresponding driving voltage VCC to work or operate, so some components or wirings in the installation detection module 7000 can be used for generating a driving voltage. In the embodiments of FIG. 38, the circuits used for generating the driving voltage VCC can be collectively referred as or integrated into a bias circuit 7300 (such as each bias circuit in FIGS. 25A to 25C).

Under the allocation of functional modules in the embodiment of FIG. 38, similar to the above described detection control circuit 2100, the detection controller 7100 is configured to perform installation detection and/or impedance detection, so as to determine whether the LED tube lamp is or has been correctly/properly connected to a lamp socket or whether there is any extraneous or unintended external impedance (such as human body impedance) intervening in or coupling to the circuit of the LED tube lamp, wherein the detection controller 7100 would control the current limiting circuit 7200 according to the determination result. When the detection controller 7100 determines that the LED tube lamp is not correctly/properly connected to the lamp socket or there is extraneous or unintended external impedance intervening in, the detection controller 7100 controls the current limiting circuit 7200 to be cut off, to prevent current on the power loop of the LED tube lamp from being excessive to cause an electric shock. Similar to the above described current limiting module 2200, the current limiting circuit 7200 is a circuit configured to enable normal flowing of current on the power loop, when the detection controller 7100 determines that the LED tube lamp is correctly/properly connected to the lamp socket or there is no unintended intervening impedance; and configured to control the current value of the current flowing on the power loop to be below a safety value to prevent electric shock, when the detection controller 7100 determines that the LED tube lamp is not correctly/properly connected to the lamp socket or there is such unintended intervening impedance. In circuit design or configuration, a current limiting circuit 7200 can be a switch circuit independent of the driving circuit and connected to the power loop in series, such as the current-limiting circuit(s) or switch circuit(s) 3200 and 3200*a-l* in FIGS. 19A, 20A, 21A, 22A, 23A, 24A, 25A-D, and 26A-B; a bias adjustment circuit connected to a power input terminal or activation terminal of a controller of the driving circuit (such as the bias adjustment circuit 5200A in FIG. 31A); or the driving circuit (such as a driving circuit 530 in FIG. 34A). A bias circuit 7300 is configured for providing a driving voltage VCC required for operation of the detection controller 7100, and embodiments of the bias circuit 7300 can be understood by referencing description below of embodiments of FIGS. 39A and 36C.

It can be known by referencing the above described embodiments that from a functional perspective, the detection controller 7100 can be regarded as detection control means used in the installation detection module as disclosed herein, and the current limiting circuit 7200 can be regarded as current limiting means used in the installation detection module as disclosed herein, wherein the current limiting means may correspond to any of possible types of circuit embodiments of each above described current limiting circuit or switch circuit, and the detection control means may correspond to part or all of the circuits other than switching means in the installation detection module.

Next, operations of the installation detection module after entering into the LED operating mode DRM are further described here with reference to the steps in FIG. 48C. Referring to FIGS. 38 and 48C, after entering into the LED operating mode DRM, the detection controller 7100 performs following steps: detecting a bus voltage on the power line (step S301); and determining whether the voltage on the power line remains below a third voltage level for a second period (step S302). The second period is for example in the range of 200 ms-700 ms and is preferably 300 ms or 600 ms. The third voltage level is for example in the range of 80V-120V and is preferably 90V or 115V. Thus, in some embodiments of the step S302, the detection controller 7100 determines whether the voltage on the power line remains below 115V for 600 ms.

If the determination result in step S302 is positive, this indicates that the external driving signal is not, or ceases to be, provided to the LED tube lamp, or that the LED tube lamp is powered off, so the detection controller 7100 proceeds to perform the two steps of: controlling to switch the current limiting circuit 7200 into the second state (step S303) and then resetting the detection controller 7100 (step S304). On the other hand, if the determination result in step S302 is negative, this indicates or can be regarded as that the external driving signal is normally provided to the LED tube lamp, so the detection controller 7100 proceeds back to step S301 where it continually detects the voltage on the power line to determine whether the LED tube lamp is powered off.

Figure 39A:
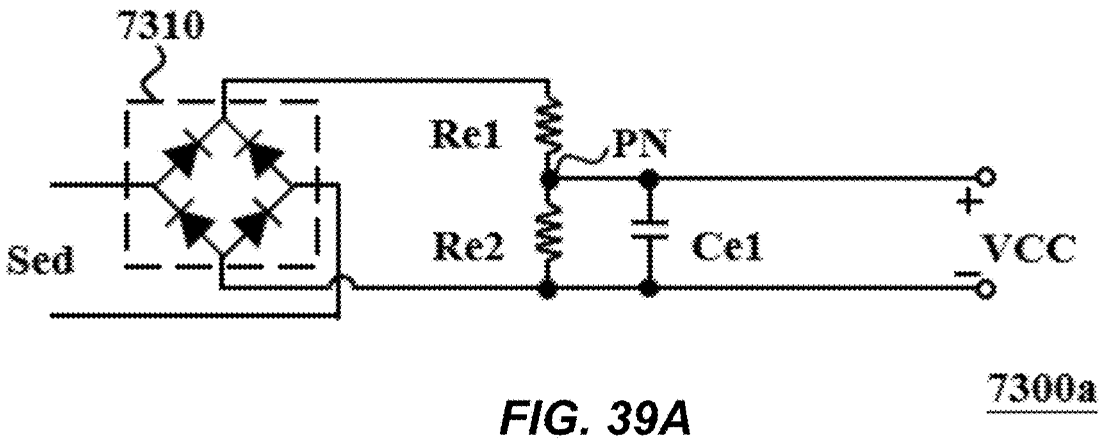
FIGS. 39A and 39B are schematic circuit diagrams of bias circuits of an installation detection module according to some exemplary embodiments.

FIG. 39A is a circuit diagram illustrating a bias circuit with the installation detection module according to some embodiments. Referring to FIG. 39A, in an application where the LED tube lamp receives an AC power as an input, a bias circuit 7300*a* includes a rectifying circuit 7310, resistors Re1 and Re2, and a capacitor Ce1. In this embodiment, the rectifying circuit 7310 includes a full-wave bridge rectifier as an example, to which the present disclosure is not limited. The input terminals of the rectifying circuit 7310 are configured to receive an external driving signal Sed and rectify the external driving signal Sed to output a rectified (nearly) DC signal at the output terminals of the rectifying circuit 7310. Resistors Re1 and Re2 are connected in series between the output terminals of the rectifying circuit 7310, and the resistor Re2 is connected with the capacitor Ce1 in parallel. The rectified signal is divided by the resistor Re1 and Re2 and stabilized by the capacitor Ce1, so as to generate a driving voltage VCC output across two terminals of the capacitor Ce1 (i.e., the node PN and the ground terminal).

In an embodiment where the installation detection module is integrated into the LED tube lamp, since a power supply module in the LED tube lamp usually includes its own rectifying circuit (such as 510), the rectifying circuit 7310 can be replaced by the existing rectifying circuit. And the resistors Re1 and Re2 and the capacitor Ce1 may be directly connected on a power loop of the power supply module, such that the installation detection module can use the rectified bus voltage (i.e., the rectified signal) on the power loop as a power source. In an embodiment where the installation detection module is disposed outside of the LED tube lamp, since the installation detection module directly uses the external driving signal Sed as a power source, the rectifying circuit 7310 is separate from the power supply module and is configured to convert the AC external driving signal Sed into the DC driving voltage VCC to be used by circuits in the installation detection module.

Figure 39B:
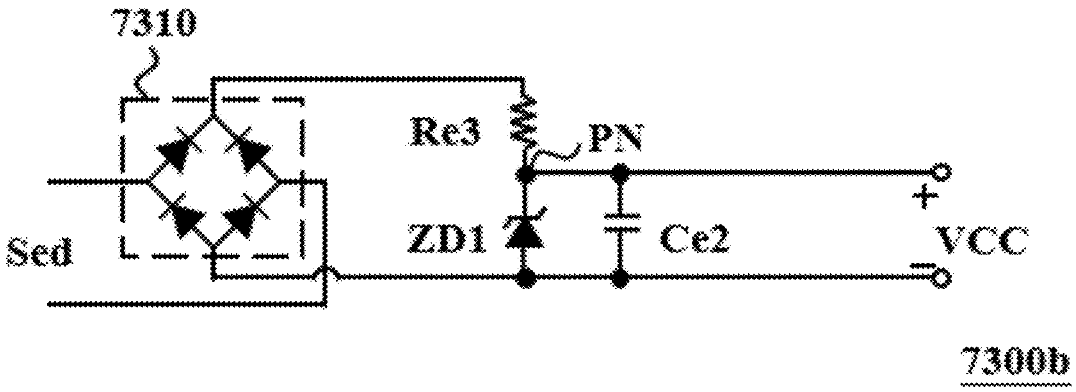

FIG. 39B is a circuit diagram illustrating a bias circuit with the installation detection module according to some embodiments. Referring to FIG. 39B, a bias circuit 7300*b* includes a rectifying circuit 7310, a resistor Re3, a Zener diode ZD1, and a capacitor Ce2. This embodiment is similar to that in FIG. 39A, with a main difference that the Zener diode ZD1 is used to replace the resistor Re2 in FIG. 39A, in order to make the driving voltage VCC more stable.

Figure 40:
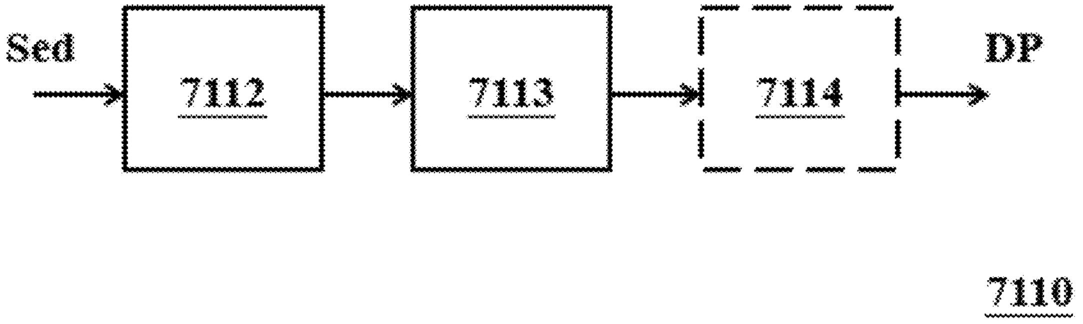
FIG. 40 is a block diagram of a detection pulse generating module according to some exemplary embodiments.

FIG. 40 is an application circuit block diagram of the detection pulse generating module according to some embodiments. Referring to FIG. 40, in this embodiment, a detection pulse generating module 7110 includes a pulse starting circuit 7112 and a pulse-width determining circuit 7113. The pulse starting circuit 7112 is configured to receive the external driving signal Sed, and to determine when (e.g., at what time, for example in relation to the time at which the external driving signal Sed was received) to generate or issue a pulse by the detection pulse generating module 7110, according to the external driving signal Sed. The pulse-width determining circuit 7113 is coupled to an output terminal of the pulse starting circuit 7112 to set or determine width of the pulse, and to issue at the determined time indicated by the pulse starting circuit 7112 a pulse signal DP having the set pulse width.

In some embodiments, the detection pulse generating module 7110 may further comprise an output buffer circuit 7114. An input terminal of the output buffer circuit 7114 is coupled to an output terminal of the pulse-width determining circuit 7113. And the output buffer circuit 7114 is configured or used to adjust the waveform of an output signal (such as a voltage or current signal) from the pulse-width determining circuit 7113, so as to output the pulse signal DP that can meet operation needs of rear end circuit(s).

Taking the detection pulse generating module 3110 illustrated in FIG. 19B as an example, its time at which to issue the pulse signal is determined based on when it receives the driving voltage, so a bias circuit that generates the driving voltage VCC can be regarded as a pulse starting circuit of the detection pulse generating module 3110. In another respect, the pulse width of the pulse signal generated or issued by the detection pulse generating module 3110 is mainly determined by the time constant of an RC charging-discharging circuit composed of the capacitors C11, C12, and C13, and the resistors R11, R12, and R13. So, the capacitors C11, C12, and C13, and the resistors R11, R12, and R13 can together be regarded as a pulse-width determining circuit of the detection pulse generating module 3110. And the buffers BF1 and BF2 can be an output buffer circuit of the detection pulse generating module 3110.

Taking the detection pulse generating module 3210 illustrated in FIG. 20B as another example, its time at which to issue the pulse signal is determined based on the time at which it receives the driving voltage VCC in FIG. 20B and related to the time constant of an RC charging-discharging circuit composed of the resistor R21 and the capacitor C21. So, a bias circuit that generates the driving voltage VCC, the resistor R21, and the capacitor C21 can together be regarded as a pulse starting circuit of the detection pulse generating module 3210. In another respect, the pulse width of the pulse signal generated or issued by the detection pulse generating module 3210 is mainly determined by the forward threshold voltage and reverse threshold voltage of the Schmitt trigger STRG and the switching latency of the transistor M21, so the Schmitt trigger STRG and the transistor M21 can together be regarded as a pulse-width determining circuit of the detection pulse generating module 3210.

Figure 41A:
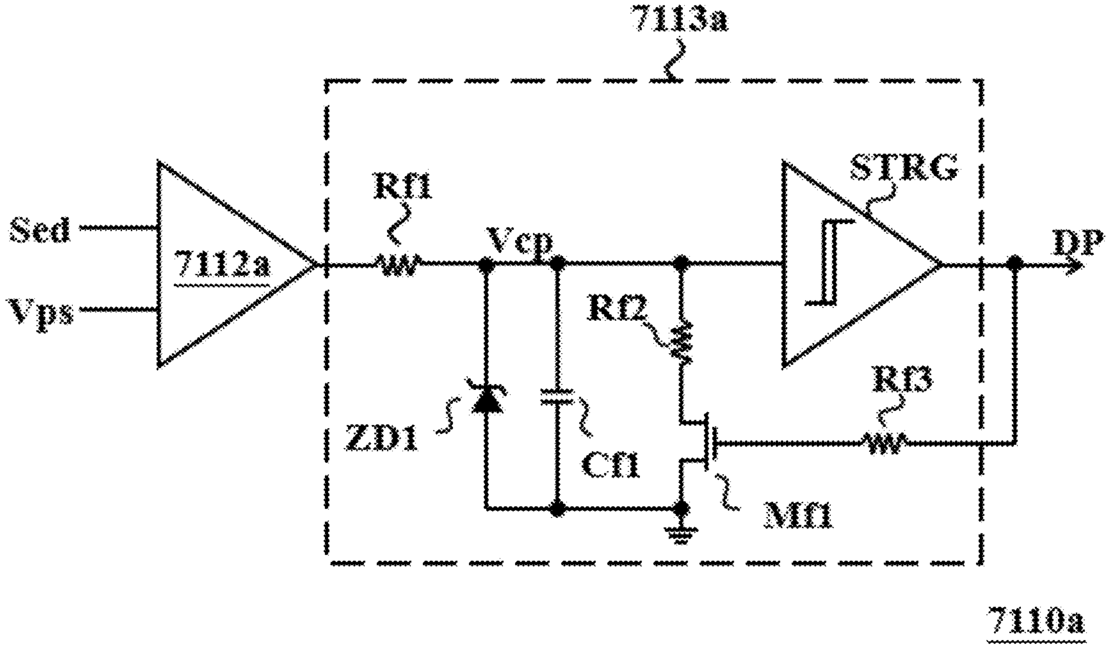
FIGS. 41A and 41B are schematic circuit diagrams of detection pulse generating modules according to some exemplary embodiments.

In some embodiments, a pulse starting circuit of the detection pulse generating modules 3110 or 3210 can implement the control of the pulse starting time (or the time at which to issue the pulse signal) by including a comparator as shown in FIG. 41A. FIG. 41A is a circuit diagram illustrating a detection pulse generating module according to some embodiments. Referring to FIG. 41A, specifically, a detection pulse generating module 7110*a* includes a comparator 7112*a*, as a pulse starting circuit, and a pulse-width determining circuit 7113*a*. The comparator 7112*a* has a first input terminal to receive an external driving signal Sed, a second input terminal to receive a reference voltage level Vps, and an output terminal connected to an end of a resistor Rf1, which end corresponds to the input terminal of driving voltage VCC in FIG. 20B. Here, the comparator 7112*a*'s receiving of the external driving signal Sed is not limited to the way of inputting the external driving signal Sed directly to the first input terminal of the comparator 7112*a*. In some embodiments, the external driving signal Sed may first undergo some signal processing such as rectification and/or voltage division to be transformed to a state signal related to the external driving signal Sed, and the state signal then is inputted to the comparator 7112*a*. The comparator 7112*a* then learns about the state of the external driving signal Sed according to the state signal, which way is equivalent to the comparator 7112*a* directly receiving the external driving signal Sed or performing its following step of signal comparison based on the external driving signal Sed. The pulse-width determining circuit 7113*a* includes resistors Rf1, Rf2, and Rf3, a Schmitt trigger STRG, a transistor Mf1, a capacitor Cf1, and a Zener diode ZD1, wherein configuration of these devices is similar to that in FIG. 20B and therefore description of connections between these devices is referred to such descriptions of embodiments above. Under the configuration of FIG. 41A, an RC circuit composed of the capacitor Cf1 and the resistor Rf1 begins to charge the capacitor Cf1 only upon a voltage level of the external driving signal Sed exceeding the reference voltage level Vps, to in turn control the time to issue the pulse signal DP. Corresponding variations of three relevant signals along the time axis are shown in FIG. 43A.

Figure 43A:
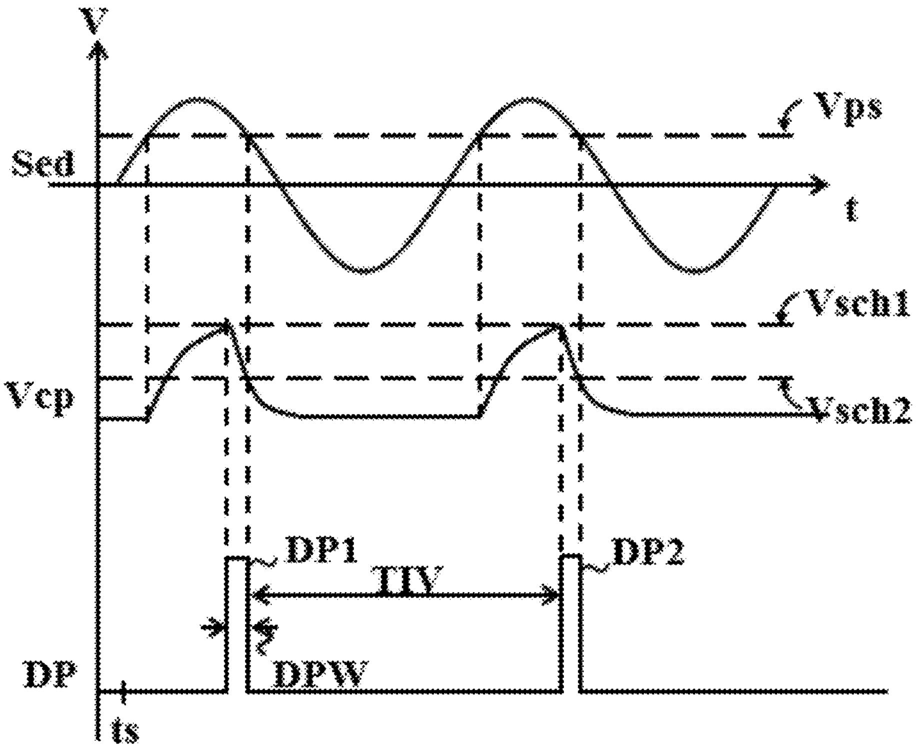
FIGS. 43A-43D are schematic signal waveform diagrams of detection pulse generating modules according to some exemplary embodiments.

Referring to FIGS. 41A and 43A, in this embodiment of FIG. 43A, the comparator 7112*a* as a pulse starting circuit outputs a high-level signal to an end of the resistor Rf1 to begin charging the capacitor Cf1, whose voltage Vcp gradually increases over time during the charging. When the voltage signal Vcp reaches the forward threshold voltage Vsch1 of the Schmitt trigger STRG, the Schmitt trigger STRG's output terminal outputs a high-level signal, which in turn conducts the transistor Mf1. Upon the conducting of the transistor Mf1, the capacitor Cf1 begins discharging to ground through the resistor Rf2 and the transistor Mf1, so as to gradually decrease the voltage signal Vcp. When the decreasing voltage signal Vcp reaches the reverse threshold voltage Vsch2 of the Schmitt trigger STRGz, the Schmitt trigger STRG's output terminal switches from outputting the high-level signal to outputting a low-level signal, thus forming/generating the pulse signal or waveform DP1, whose pulse width DPW is determined by the forward threshold voltage Vsch1, the reverse threshold voltage Vsch2, and the switching latency of the transistor Mf1. Upon forming the pulse signal DP1, another similar pulse signal or waveform DP2 is similarly generated by the Schmitt trigger STRG after an interval TIV, in which the interval TIV can be defined by a duration that the voltage signal Vcp falls from less than the reverse threshold voltage Vsch2 to higher than the forward threshold voltage Vsch1 again. Generation of such similar pulse signals (DP2, DP3, and etc.) may similarly follow.

In some embodiments, the pulse starting circuit 7112 indicates the time to generate or issue a pulse signal, thereby determining the time to generate the pulse signal by the detection pulse generating module 7110, when the external driving signal Sed reaches or exceeds a specific voltage level, as implemented by an embodiment in FIG. 33B. FIG. 33B is a circuit diagram illustrating a detection pulse generating module according to some embodiments. Referring to FIG. 33B, specifically, a detection pulse generating module 7110*b* includes a pulse starting circuit 7112*b* and a pulse-width determining circuit 7113*b*. The pulse starting circuit 7112*b* includes a comparator CPf1 and a signal edge triggering circuit SETC. The comparator CPf1 has a first input terminal to receive an external driving signal Sed, a second input terminal to receive a reference voltage level Vps, and an output terminal connected to an input terminal of the signal edge triggering circuit SETC. The signal edge triggering circuit SETC may for example comprises a rising-edge triggering circuit or a falling-edge triggering circuit, configured to detect the time of the comparator CPf1 switching its output state, and then to transmit an instruction to generate a pulse signal for the later-stage pulse-width determining circuit 7113*b*. The pulse-width determining circuit 7113*b* may comprise any kind of pulse generating circuit that capable of generating, according to the pulse generation instruction, a pulse signal with a set width at a specific time, such as the circuits in each of FIG. 19B and FIG. 20B, or an integrated device like a 555 timer, and the disclosure is not limited to these example circuits. It's noted that although in FIG. 33B it's illustrated that the comparator CPf1's first input terminal directly receives an external driving signal Sed, the disclosure is not limited to this example. In some embodiments, the external driving signal Sed may first undergo some signal processing such as rectification, filtering, and/or voltage division to be a reference signal and then received by the first input terminal of the comparator CPf1. Thus, the pulse starting circuit 7112*b* can determine the time at which to generate a pulse signal based on a received reference signal related to or indicative of the voltage level or phase state of the external driving signal Sed.

Figure 41B:
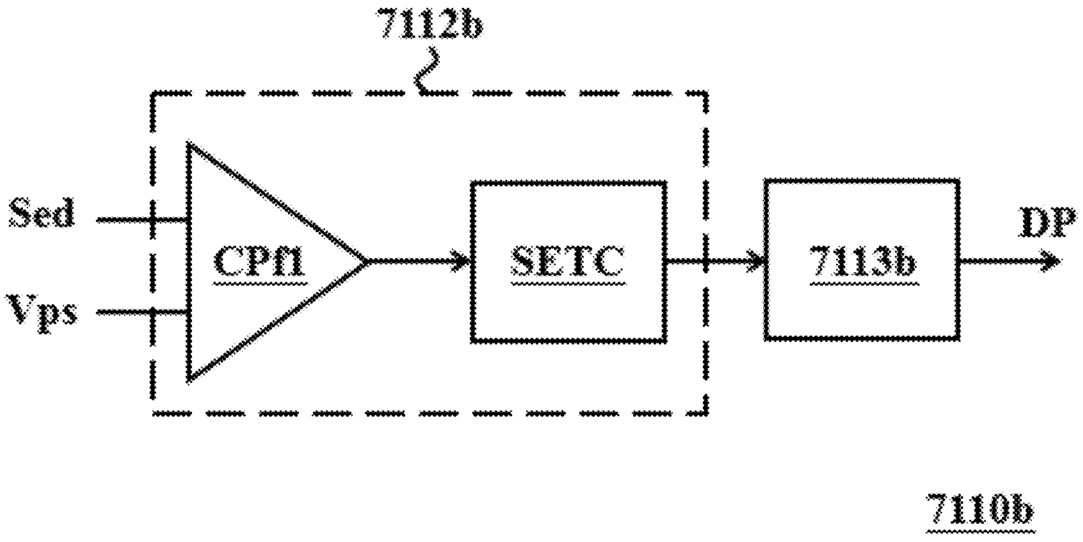
Figure 43B:
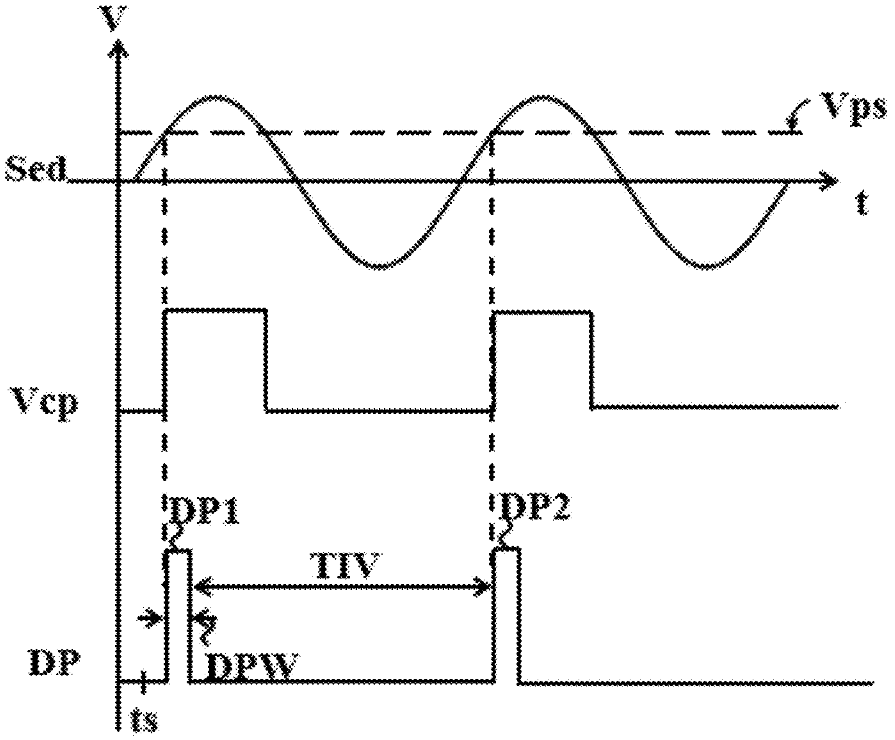
Figure 43C:
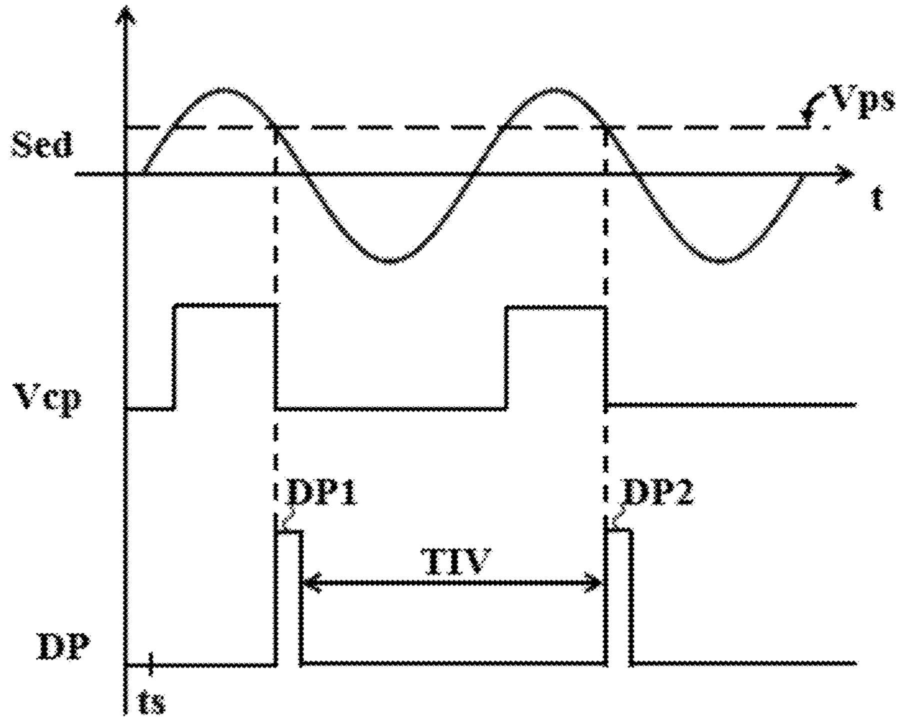

Corresponding variations of three relevant signals along the time axis generated in the embodiment of the detection pulse generating module 3610 in FIG. 41B are shown in each of FIG. 43B and FIG. 43C, wherein FIG. 43B shows waveforms of the three signals generated under the rising edge-triggered method and FIG. 43C shows waveforms of the three signals generated under the falling edge-triggered method. Referring to FIG. 41B and FIG. 43B, in this embodiment under the rising edge-triggered method, the comparator CPf1 begins outputting a high-level signal upon a voltage level of the external driving signal Sed exceeding a reference voltage level Vps, and the output is maintained at the high level for the duration that the external driving signal Sed is above the reference voltage level Vps. When the external driving signal Sed gradually decreases from its peak value and upon its falling below the reference voltage level Vps, the comparator CPf1 switches into outputting a low-level signal (again). Accordingly, the output terminal of the comparator CPf1 outputs an output voltage signal Vcp as shown in FIG. 43B. Around when a rising edge occurs on the voltage signal Vcp, the signal edge triggering circuit SETC triggers and outputs an enable signal to the pulse-width determining circuit 7113*b*, so that the pulse-width determining circuit 7113*b* around the time of the rising edge generates a pulse signal DP having a pulse or waveform DP1, according to the enable signal and a set pulse width DPW of the pulse DP1. According to these described operations, the detection pulse generating module 7110*b* can adjust the time to generate the pulse DP1 of the pulse signal DP by adjusting, or changing the setting of, the reference voltage level Vps, so that the detection pulse generating module 7110*b* is triggered to generate the pulse DP1 of the pulse signal DP only upon the external driving signal Sed reaching a specific voltage level or phase. Therefore, the problem of generating the pulse DP1 of the pulse signal DP wrongly around when the external driving signal Sed crosses a zero-voltage level associated with some embodiments mentioned earlier can be prevented by this rising edge-triggered method.

In some embodiments, the reference voltage level Vps may be adjusted according to the voltage level of the external driving signal Sed on the power line, so that the detection pulse generating module can generate a pulse DP1 of a pulse signal DP at a time point according to the distinct nominal supply voltage (such as 120V or 277V) of the AC power grid providing the power line. Thus, no matter what a distinct nominal supply voltage of an AC power grid providing the external driving signal is, the portion of a period of the external driving signal Sed on the power line or detection path of the LED tube lamp for which portion a detection is in a triggered state (for the duration of the pulse on the voltage signal Vcp) can be adjusted or limited according to the distinct nominal supply voltage, by adjusting the reference voltage level Vps, to improve accuracy of the installation detection or impedance detection. For example, the reference voltage level Vps may comprise a first reference voltage level corresponding to a first nominal supply voltage such as 120V of an AC power grid and a second reference voltage level corresponding to a second nominal supply voltage such as 277V of another AC power grid. When the external driving signal Sed received by the detection pulse generating module 7110*b* has the first nominal supply voltage, the pulse starting circuit 7112*b* determines the time at which to generate a pulse DP1 of the pulse signal DP based on the first reference voltage level of the reference voltage level Vps. When the external driving signal Sed received by the detection pulse generating module 7110*b* has the second nominal supply voltage, the pulse starting circuit 7112*b* determines the time at which to generate a pulse DP1 of the pulse signal DP based on the second reference voltage level of the reference voltage level Vps.

Referring to FIG. 41B and FIG. 43C, operations in this embodiment under the falling edge-triggered method are similar to those in the embodiment of FIG. 43B, with the main difference that under the falling edge-triggered method the signal edge triggering circuit SETC triggers and outputs an enable signal to the pulse-width determining circuit 7113*b* around when a falling edge occurs on the voltage signal Vcp, so the pulse-width determining circuit 7113*b* around the time of the falling edge generates a pulse signal DP having a pulse or waveform DP1. In some embodiments under the falling edge-triggered method, the reference voltage level Vps may comprise a first reference voltage level, such as 115V, corresponding to a first nominal supply voltage such as 120V of an AC power grid and a second reference voltage level, such as 200V, corresponding to a second nominal supply voltage such as 277V of another AC power grid. When the external driving signal Sed received by the detection pulse generating module 7110*b* has the first nominal supply voltage, the pulse starting circuit 7112*b* determines to generate a pulse DP1 of the pulse signal DP when the external driving signal Sed falls below the first reference voltage level of 115V. When the external driving signal Sed received by the detection pulse generating module 7110*b* has the second nominal supply voltage, the pulse starting circuit 7112*b* determines to generate a pulse DP1 of the pulse signal DP when the external driving signal Sed falls below the second reference voltage level of 200V.

Based on the above teachings and embodiments, a person of ordinary skill in the relevant art can understand that apart from the signal-edge triggering operations above, various possible mechanisms for determining the time to generate a pulse signal DP may be implemented by the pulse starting circuit 7112. For example, the pulse starting circuit 7112 may be designed to start recording time upon detecting a rising edge or a falling edge occurring on the voltage signal Vcp, and to trigger and output an enable signal to the pulse-width determining circuit 7113 when the recorded time reaches a predefined duration. Another example is that the pulse starting circuit 7112 may be designed to activate the pulse-width determining circuit 7113 in advance when the pulse starting circuit 7112 detects a rising edge occurring on the voltage signal Vcp, and to trigger and output an enable signal to the pulse-width determining circuit 7113 when later detecting a falling edge occurring on the voltage signal Vcp, for the early-activated pulse-width determining circuit 7113 to be able to quickly respond in order to generate the pulse signal DP at an accurate time point.

Figure 43D:
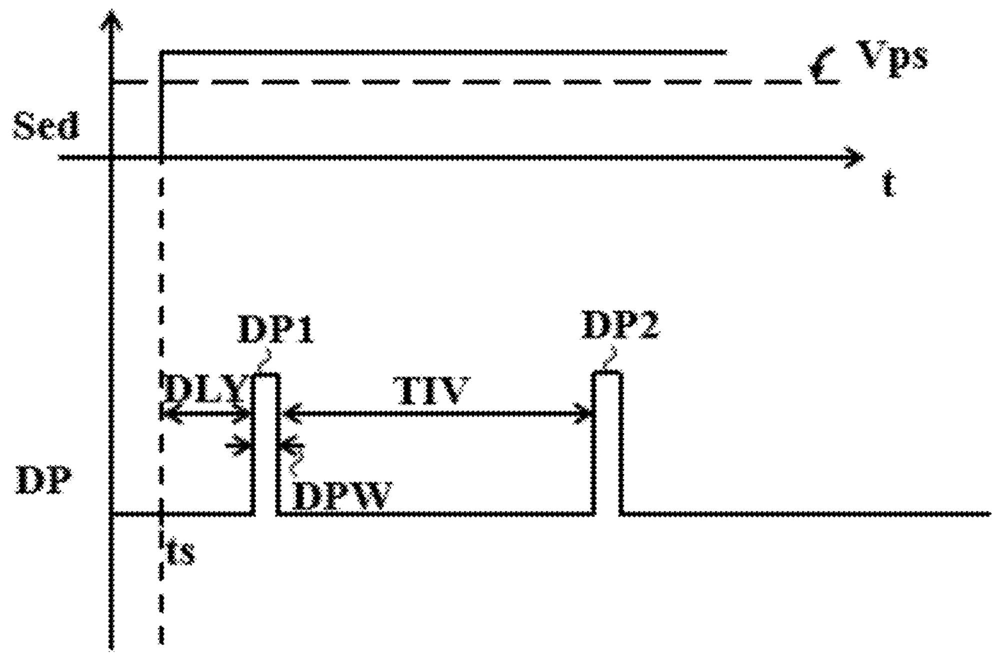

Corresponding variations of two relevant signals along the time axis generated in some embodiments of the detection pulse generating module are shown in FIG. 35D. Referring to FIG. 43D, operations in this embodiment are similar to those in the embodiments of FIG. 43B and FIG. 43C, with the main difference that in this embodiment the pulse starting circuit 7112 is designed to start recording time upon the external driving signal Sed exceeding a reference voltage level Vps, and to trigger so as to generate a pulse DP1 of a pulse signal DP when the recorded time reaches a delay duration DLY. Upon generating the pulse DP1, after an interval TIV shown in FIG. 43D, another similar pulse or waveform DP2 is generated by the detection pulse generating module, which can be followed by similar operations of pulse generation.

Referring to FIG. 38 again, in some embodiments, the installation detection module 7000 further includes a ballast detection module 7400 (similar to the ballast detection module 3400 of FIG. 19A or the ballast detection module 4400 of FIG. 28A), which is configured for determining the type of an external driving signal input to the LED tube lamp of the installation detection module 7000, to determine for example whether it is provided by an electronic ballast, and is configured for adjusting a way of controlling the current-limiting circuit 7200. For this purpose, the ballast detection module 7400 may be configured to determine whether an external driving signal Sed currently received by the LED tube lamp is an AC signal provided by an electronic ballast or directly by a commercial power grid, by detecting a signal feature of the external driving signal Sed or a signal feature of a power line voltage in a power supply module of the LED tube lamp which is derived or follows from the external driving signal Sed. Such a signal feature of the external driving signal Sed may be one of the electrical signal characteristics such as frequency, amplitude, and phase.

In some embodiments, the mentioned adjustment of a way of controlling the current-limiting circuit 7200 may comprise for example: (1) when judging that an external driving signal Sed input to an LED tube lamp is provided by an electronic ballast, intermittently conducting the current-limiting circuit 7200 to cause the LED tube lamp to flash as misuse warning, alerting a user that the LED tube lamp might currently be installed by mistake to an incompatible lamp socket (as described in the embodiments of FIG. 19A); or (2) when judging that an external driving signal Sed input to a ballast-bypass LED tube lamp is provided by an electronic ballast, shunting or causing a pulse signal used for detecting installation state to bypass, and maintaining the current-limiting circuit 7200 in a conducting state, in order to enable the LED tube lamp to light up in response to the input external driving signal Sed provided by an electronic ballast.

Figure 42:
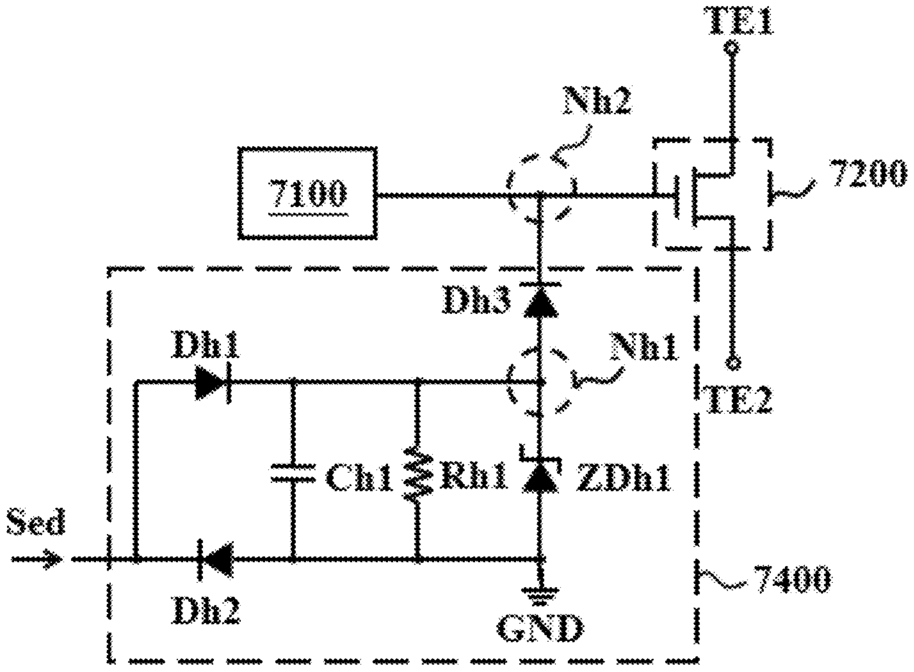
FIG. 42 is a circuit diagram of a ballast detection module according to some embodiments.

In the embodiment (2) of adjusting a way of controlling the current-limiting circuit 7200, the LED tube lamp may be of both Type-A and Type-B, and the specific circuit structure of the ballast detection module 7400 is as illustrated in FIG. 42. FIG. 42 is a circuit diagram of a ballast detection module according to some embodiments. In this embodiment of FIG. 42, the ballast detection module 7400 includes diodes Dh1 and Dh2, a capacitor Ch1, a resistor Rh1, and a voltage regulating diode ZDh1. The diodes Dh1 and Dh2 constitute a half-wave rectifying circuit, wherein the anode of the diode Dh1 and the cathode of the diode Dh2 are connected in order to receive an external driving signal Sed. The capacitor Ch1 has one end electrically connected to the cathode of the diode Dh1, and the other end electrically connected to the anode of the diode Dh2. The resistor Rh1, capacitor Ch1, and voltage regulating diode ZDh1 are connected in parallel with each other, and the voltage regulating diode ZDh1 is electrically connected to a control terminal of the current-limiting circuit 7200. In some embodiments, the ballast detection module 7400 may further include a diode Dh3, which has an anode electrically connected to the cathode of the voltage regulating diode ZDh1 and has a cathode electrically connected to the control terminal of the current-limiting circuit 7200.

For better concretely explaining operations of the ballast detection module 7400 of the embodiment of FIG. 42, the ballast detection module 7400 is below further explained with reference to the signal waveforms in FIG. 45G respectively at the two nodes Nh1 and Nh2 in FIG. 42. Referring to both FIGS. 42 and 45G, when an external driving signal Sed is provided by a commercial AC power grid, since the frequency and voltage amplitude of a power signal (as the external driving signal Sed) from a commercial AC power grid is relatively low, after undergoing half-wave rectification by the diodes Dh1 and Dh2 and voltage regulation by the capacitor Ch1, the rectified and regulated driving signal Sed causes a small voltage to be generated at the node Nh1, which small voltage is not sufficient to cause the voltage regulating diode ZDh1 to enter into a reverse-breakdown state, so the ballast detection module 7400 then is equivalent to being in a floating state and does not affect the state of the signal at the node Nh2. Therefore, no matter whether the LED tube lamp is in a normal operation state (i.e., without touching extraneous impedance) or in a state under a lamp-replacement test (i.e., connected to touching extraneous human-body impedance), the current-limiting circuit 7200 is mainly controlled by a signal output by the detection control circuit 7100 of FIG. 42.

In another case, when an external driving signal Sed is provided by an electronic ballast, since the frequency and voltage amplitude of a power signal (as the external driving signal Sed) from an electronic ballast is relatively low, the voltage at the node Nh1 is or will be greater than the breakdown voltage of the voltage regulating diode ZDh1, causing the voltage regulating diode ZDh1 to enter into a reverse-breakdown state and causing the voltage at the node Nh2 to be stable at a high voltage level sufficient to conduct the current-limiting circuit 7200. At this state, an output signal of the detection control circuit 7100 is seen as being shunted or bypassing through the ballast detection module 7400, and control of the current-limiting circuit 7200 is taken over by the ballast detection module 7400. Therefore, even when the LED tube lamp is in a state under a lamp-replacement test (i.e., connected to touching extraneous human-body impedance), a pulse signal output by the detection control circuit 7100 is or may be shunted by a high voltage level signal output by the ballast detection module 7400, causing the current-limiting circuit 7200 to be maintained in a conducting state and not to intermittently conduct for performing installation detection.

Figure 43E:
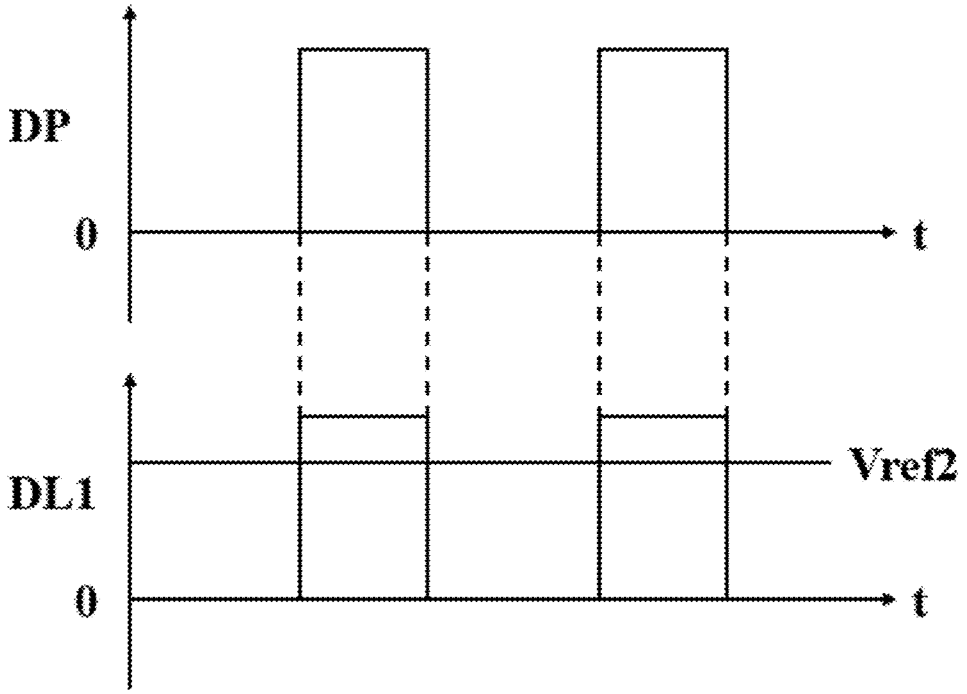
FIGS. 43E-FIG. 43G are schematic waveform diagrams of the path detection signal according some embodiments.
Figure 43F:
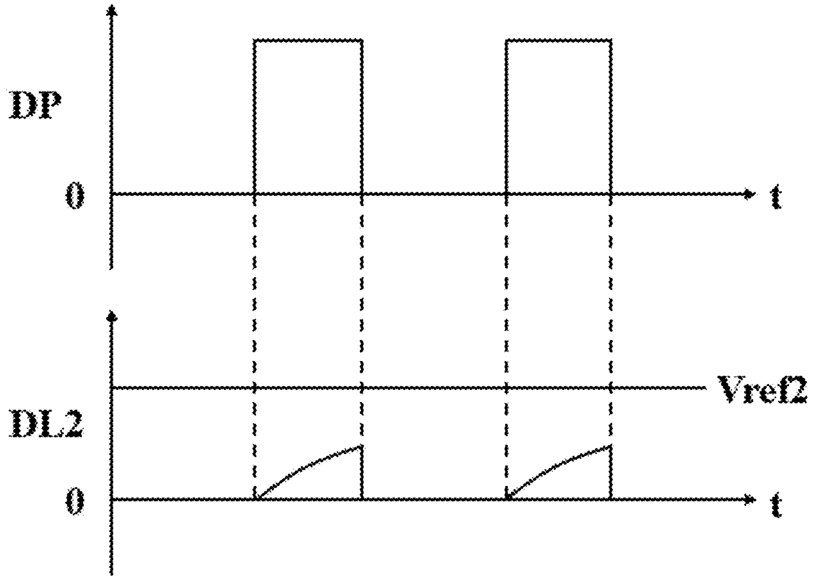
Figure 43G:
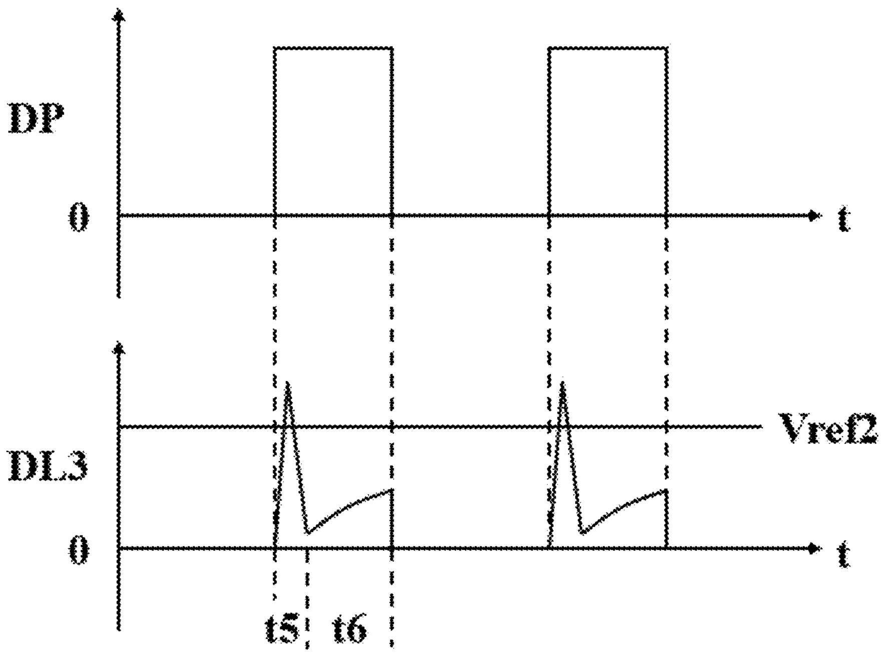
Figure 44:
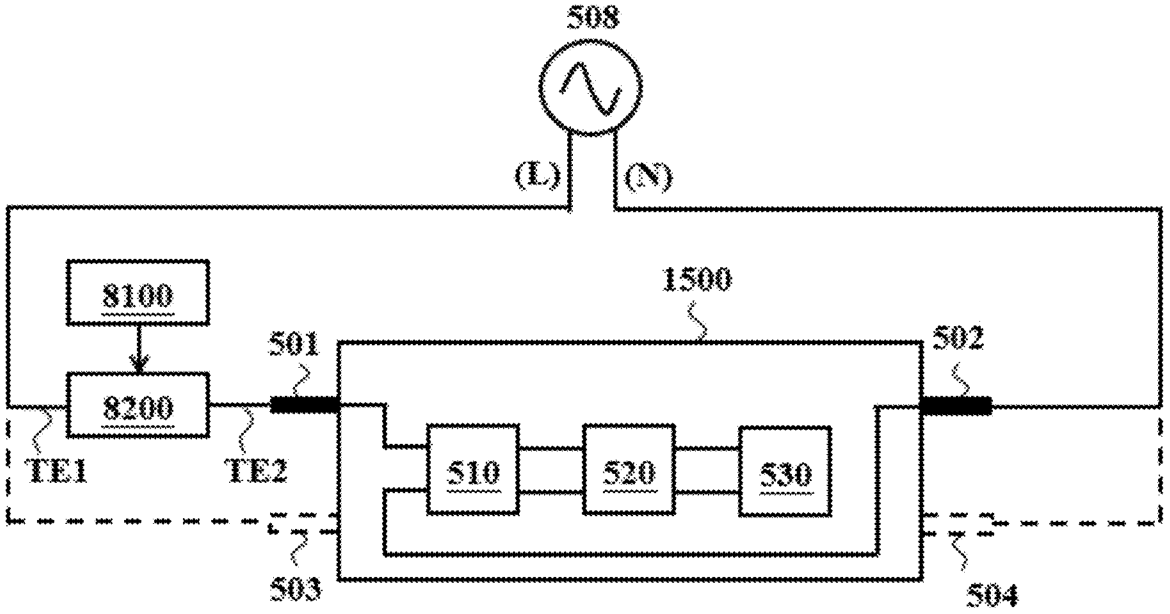
FIG. 44 is a block diagram of an exemplary power supply module in an LED tube lamp according to some exemplary embodiments.

FIG. 44 is a block diagram of an exemplary power supply module in an LED tube lamp according to some exemplary embodiments. Compared to the embodiment of FIG. 17A, an installation detection module 8000 is disposed outside of the LED tube lamp 1500 and includes a detection control circuit 8100 and a current-limiting circuit 8200 which is disposed on a power line from an external power source 508, and for example disposed in a lamp socket or fixture. Referring to FIG. 36, when pins on two ends of the LED tube lamp 1500 are electrically connected to the external power source 508, the current-limiting circuit 8200 is serially connected on a power loop of the LED tube lamp 1500 through a pin 501, causing or enabling the detection control circuit 8100 to judge, by performing any installation detection method as described in the embodiments of FIGS. 17A to 43D, whether the LED tube lamp 1500 is correctly/properly installed into a lamp socket or whether the body of a user has accidentally touched a conducting part of the LED tube lamp 1500 which is not yet correctly/properly installed, and the detection control circuit 8100 then controls the current-limiting circuit 8200 to limit power supply from the external power source 508 to the LED tube lamp 1500 when determining that the LED tube lamp 1500 is not correctly/properly installed into a lamp socket or there is risk of electric shock upon the body of a user touching a conducting part of the LED tube lamp 1500.

It should be noted that, the current-limiting circuits 4200 and 4200*a* mentioned above are embodiments of a means for limiting current, which is configured to limit the current on a power loop to less than a specific value (e.g., 5 MIU) when being enabled (such as to cut off a switch circuit). After referencing the above-described embodiments, a person having ordinary skill in the art may understand how to implement the current limiting means by using a structure generally similar to a switch circuit. For example, such switch circuit structure can be implemented by electronic switch (e.g., MOSFET, BJT), electromagnetic switch, relay, bidirectional triode thyristor (TRIAC), thyristor, or variable-impedance component (e.g., variable capacitor, variable resistor, or variable inductor). In other words, a person having ordinary skill in the art should understand that based on the concept of using a switch circuit to realize current limiting as disclosed herein, the scope of embodiments encompassed of the present disclosure includes any equivalent embodiments to the mentioned embodiments of the above-described switch circuits.

Further, according to the embodiments illustrated above, one skilled in the art should understand that the installation detection module illustrated can not only be designed as a distributed circuit applied in the LED tube lamp, but rather some components of the installation detection module can be integrated into an integrated circuit in an exemplary embodiment. Alternatively, all circuit components of the installation detection module can be integrated into an integrated circuit in another exemplary embodiment. Therefore, the circuit cost and the size of the installation detection module can be saved. In addition, by integrating/modularizing the installation detection module, the installation detection module can be more easily utilized in different types of the LED tube lamps so that the design compatibility of the LED tube lamp can be improved. Also, under the application of utilizing the integrated installation detection module in the LED tube lamp, the light emitting area of the LED tube lamp can be significantly improved since the circuit size within the tube lamp is reduced. For example, the integrated circuit design may reduce the working current (reduced by about 50%) and enhance the power efficiency of the integrated components. As a result, the saved power can be used for being supplied to the LED module for emitting light, so that the luminous efficiency of the LED tube lamp can be further improved.

For example, in the above-described embodiments, the installation detection module can also be referred to as a detection module/circuit, a current leakage detection module/circuit, a leakage current protection module/circuit, or an impedance detection module/circuit. The detection result latching module can also be referred to as a detection result storage module/circuit or a control module/circuit. The detection controller can be a circuit including a detection pulse generating module, a detection result latching module, and a detection determining circuit, but is not limited thereto. Besides, the detection pulse generating module in the above-described embodiments can be referred to as a detection triggering circuit.

To summarize, the embodiments illustrated in FIG. 17A to FIG. 44C teach a concept of electric shock protection by utilizing electrical control and detection method. Compared to mechanical electric shock protection (i.e., using the mechanical structure interaction/shifting for implementing the electric shock protection), the electrical electric shock protection has higher reliability and durability since the mechanical fatigue issue may not occur in the electrical installation detection module.

It should be noted that in embodiments of using detection pulse(s) for installation detection, the installation detection module in operation does not or will not substantially change characteristics and states of the LED tube lamp having the installation detection module that are related to LED driving and light emitting by the LEDs. The characteristics related to LED driving and light emitting by the LEDs include for example characteristics, such as phase of the power line signal and output current for the LED module, which can affect the brightness of light emission and output power of the lighted-up LED tube lamp. Operations of the installation detection module are only concerned with or related to leakage current protection when the LED tube lamp is not yet lighted up, which purpose makes the installation detection module distinctive from circuits used to adjust characteristics of LED lighting states, such as a DC power conversion circuit, a power factor correction circuit, and a dimmer circuit.

Figure 46A:
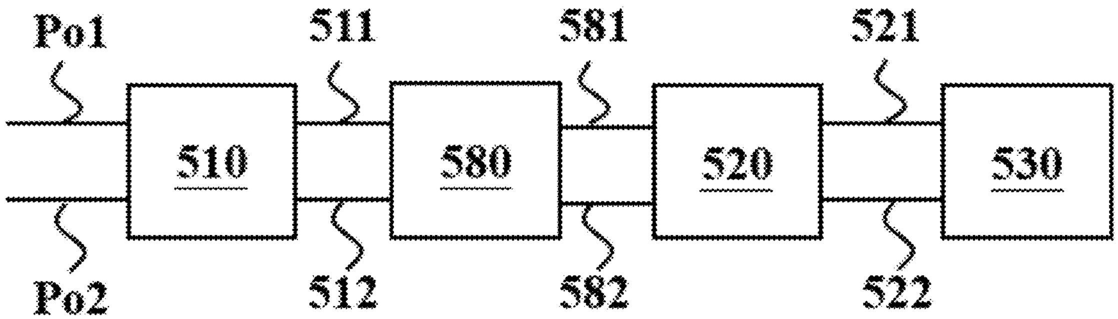
FIG. 46A is a block diagram of a power supply module according to some embodiments.

FIG. 46A is a block diagram of a power supply module in an LED tube lamp according to some embodiments. Compared to the above-described embodiments, the power supply module in this embodiment of FIG. 46A includes a rectifying circuit 510, a filtering circuit 520, and a driving circuit 530, and further includes a misuse warning module 580. The misuse warning module 580 is coupled to the rectifying circuit 510; is configured to detect the power line voltage and judge according to the detection result whether an input external driving signal is an AC signal provided by an electronic ballast; and is configured to control the operation or lighting mode of the LED tube lamp according to the judging result. By this way of operating the misuse warning module 580, when a ballast-bypass LED tube lamp is installed by mistake to a lamp socket of a ballast, the ballast-bypass LED tube lamp then issues a misuse warning to alert or remind a user of the misuse situation, for preventing an AC signal output by an electronic ballast from damaging the ballast-bypass LED tube lamp. The misuse warning can be regarded as any kind of notice that capable of physically observed by a user, such as flickering light or sound. In addition to controlling the light pattern of the LED tube lamp to prompt the misuse of the lamp, the misuse warning module can also prompt the misuse of the LED tube lamp by independently setting the warning light or generating a warning sound, and the present disclosure is not limited thereto.

The power supply module of the present embodiment may also be applied to other types of LED lights, such as bypass HID lamps.

Figure 46B:
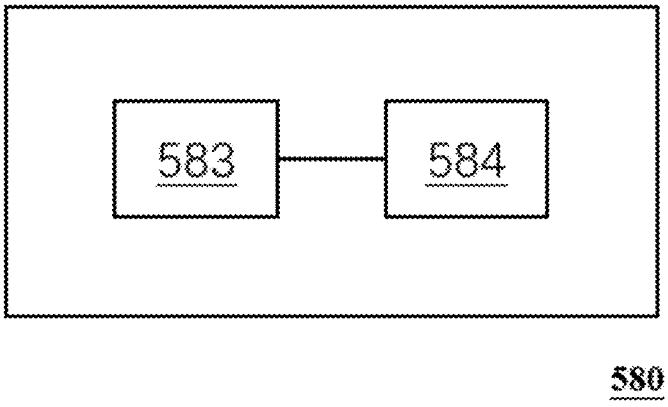
FIGS. 46B-46C are block diagrams of a misuse warning module according to some embodiments.

Referring to FIG. 46B, FIG. 46B is a block diagram of a misuse warning module according to some embodiments of the present disclosure. The misuse warning module 580 includes a misuse detection circuit 583 and a warning circuit 584. The misuse detection circuit 583 electrically connected to the power loop of the LED tube lamp to detect the power supply signal of the LED tube lamp and determine whether the power supply signal is an AC signal from mains power grid and generate a detection signal accordingly. The warning circuit 584 is electrically connected to the misuse detection circuit 583 and is configured to receive the detection signal and determine whether to perform the warning action based on the detection signal, the warning may include a light flashing, an indicator light warning, a warning sound, etc.

Figure 46C:
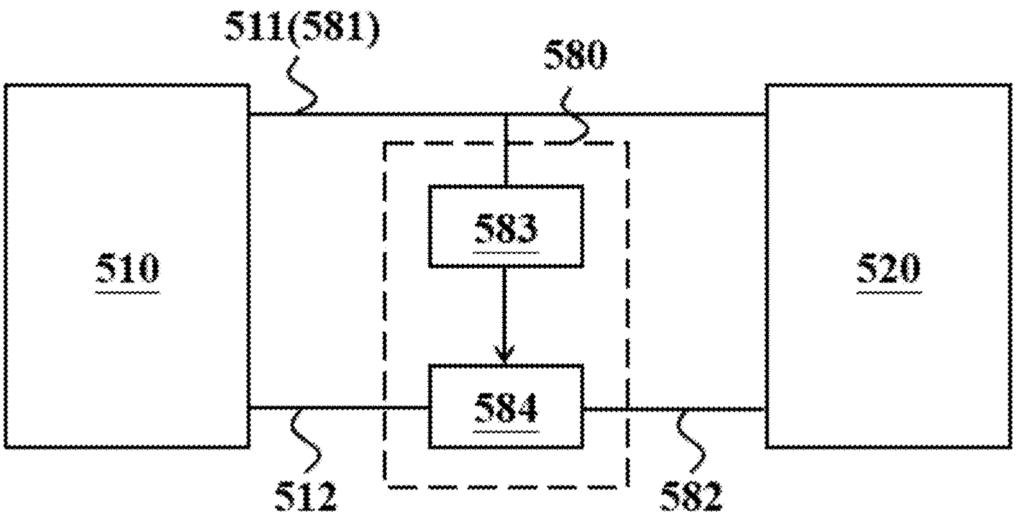

An example configuration of the misuse warning module could be shown in FIG. 46C, FIG. 46C is a schematic circuit block diagram of a misuse warning module according to some embodiments of the present disclosure. Referring to FIGS. 47B and 46C together, FIG. 47B is a schematic diagram of a circuit architecture of a warning circuit according to some embodiments the present disclosure. In the present embodiment, the misuse warning module 580 includes a misuse detection circuit 583 and a warning circuit 584. The warning circuit 584 includes a switching device 5841 and a control circuit 5842, the control circuit 5842 is electrically connected to the misuse detection circuit 583, the first pin of the switch 5841 is electrically connected to the second rectifying output terminal 512, and the second pin of the switch 5841 is electrically connected to the circuit node 582. The misuse detection control circuit 583 is configured to detect the power line voltage and to judge according to a signal feature of the detected power line voltage whether an input external driving signal currently received by the LED tube lamp of the misuse warning module 580 is an AC signal output by an electronic ballast or directly provided by a commercial power grid. Since an AC signal output by a ballast (especially an electronic ballast) has characteristics of having relatively high frequency and/or high voltage, but an AC signal output by a power grid typically has characteristics of having relatively low frequency (such as in the range of 50 Hz to 60 Hz) and/or low voltage (generally lower than 305V), the source of an external driving signal input to the LED tube lamp can be identified by detecting a signal feature, such as the frequency, amplitude, or phase, of the power line voltage signal input in a power supply module of the LED tube lamp.

In some embodiments, when the misuse detection control circuit 583 detects a signal feature of the power line voltage as conforming to that of a type of output signal provided by a commercial power grid, this indicates that the currently input external driving signal is or might be an AC signal provided by an AC power grid. As a result, the misuse detection circuit 583 would send a first detection signal, then the control circuit 5842 would receive the first detection signal and controls the switching device 5841 to be conducted continuously based on the first detection signal.

On the other hand, when the misuse detection control circuit 583 detects a signal feature of the power line voltage as not conforming to that of a type of output signal provided by a commercial power grid, this indicates that the currently input external driving signal is or might be an AC signal provided by an electronic ballast, Thus, the misuse detection circuit 583 would send a second detection signal to the control circuit 5842. The control circuit 5842 controls the switching device 5841 switching states based on the second detection signal in order to affect the continuity of current in a power loop of the LED tube lamp and cause a later-stage LED module to generate or emit a specific light pattern as a misuse warning, in response to variation in the continuity of a current flowing in the power loop.

In some embodiments, the control circuit 5842 is electrically connected to the driving circuit 530 and is configured to enable or disable the driving circuit 530 based on the first detection signal or the second detection signal to implement the warning/alarm function. For example, when the external power supply signal is an AC signal from the mains power grid, the control circuit 5842 enables the driving circuit 530 based on the first detection signal to light the LED tube lamp normally. When the external power supply signal is a signal provided by the ballast, the control circuit 5842 disables the driving circuit 530 based on the second detection signal or intermittently enables and disables the driving circuit 530 to make the LED tube lamp flash, warning the user that the LED tube lamp is misused.

In the embodiment shown in FIG. 46C, the misuse warning module 580 is connected to the power loop of the LED tube lamp through the terminals thereof and is configured to obtain the signal in the power loop. When the signal is detected as a ballast characteristic signal, a second detection signal is output. As described herein, the second detection signal is the control signal transmitted the misuse detection circuit 583 in the embodiment shown in FIG. 46C.

Referring to the embodiment shown in FIG. 46, the ballast characteristic signal refers to AC signals with the characteristics output by the ballast (especially the electronic ballast), such as high frequency, high voltage, etc. For example, the ballast characteristic signal may indicate the high frequency value (or range) of the AC signal output from the ballast by its voltage level (or range). For another example, the ballast characteristic signal may indicate the valley level and/or phase of the AC signal output from the ballast by its voltage level (or range). In this embodiment, the misuse warning module detects at least one of frequency, phase, and amplitude of the signal in the power loop through the terminals thereof to determine whether the signal is a ballast characteristic signal.

In order to be able to effectively retain the information, such as high frequency, high voltage and other characteristic, of the signal in the power loop, in some embodiments, the terminal of the misuse warning module is connected to the output or input of the rectifying circuit in the power loop of the LED tube lamp.

In some embodiments, the misuse warning module further includes other detection result latching circuits (not shown), the detection result latching circuit is electrically connected between the misuse detection circuit and the warning circuit and is configured to temporarily store the first detection signal or second detection signal output by the misuse detection circuit output and output the stored first detection signal or second detection signal to the warning circuit. The detection result latching circuit can be implemented by circuit architectures such as a flip-flop and logic gate circuit, but the disclosure is not limited to this, any analog/digital circuit architecture that can implement the function of latching and outputting a first detection signal or a second detection signal to transmit to the warning module can be applied herein. It should be noted that in practical applications, without affecting the overall circuit operation, the detection result latching circuit can be omitted, or designed to be shared or time-multiplexed based on the actual circuit design needs.

In some embodiments, the misuse warning module includes a misuse warning circuit. The misuse detection circuit has a terminal, and the terminal is configured to be electrically connected a power loop of the LED tube lamp to obtain the signal in the power loop through the terminal. When the signal is detected as a ballast characteristic signal, the misuse detection circuit would output the second detection signal. The warning circuit is electrically connected to the misuse detection circuit and is configured to generate a misuse warning of the LED tube lamp based on the received second detection signal. Specifically, the warning circuit includes a control circuit and a switching device connected to the power loop in series. The control circuit is electrically connected to the misuse detection circuit and is configured to control the switching device to turn on or off based on the received second detection signal, so that the warning circuit is able to cause the LED module in the LED tube lamp to generate a misuse warning by affecting the current continuity of the power loop. As described herein, the control circuit and the warning circuit can be, for example, a portion of the driving circuit of the LED tube lamp.

In some examples, the control circuit may also be implemented by a control chip or any circuit with signal computing and processing capabilities. When the control circuit determines that the current input external driving signal is an AC signal provided by the mains power grid based on the first detection signal, the control circuit would control the warning circuit to remain in the conducted state so that the power loop can also remain in the conduction state, and the external power supply can be provided to the LED module at later-stage normally. When the control circuit determines that the current input external driving signal is the AC signal provided by the ballast based on the second detection signal, the control circuit would control the warning circuit to be in a switching state to affect the current continuity on the power circuit, so that the LED module at later-stage could generate a misuse warning. For example, the current continuity change on the power loop can refer to intermittent conduction of the current in the power loop, so that the LED module at the later stage would produce a specific on-and-off flickering light pattern as a misuse warning. For another example, the current continuity change on the power loop can refer to the strong/weak change of the current in the power loop, so that the LED module at later stage would produce a specific light-dark light pattern as a misuse warning.

It is noted that in the practical circuit design, the control circuit can also share the circuit components with the misuse detection circuit. For example, the warning circuit and the control circuit shares the same circuit components such as driver devices and logic devices. In addition, all the circuit components in the misuse warning module can also be integrated into one integrated circuit, so as to save the circuit cost and size of the misuse warning module and make it easier to be compatible with different types of LED tube lamp designs.

It is noted that the warning circuit 584 of the misuse warning module described above is an embodiment set with affecting the current continuity of the power loop. After referring to the above embodiments, those skilled in the art should be able to understand that affecting the current continuity the power circuit can be implemented by similar warning circuit architectures. For example, the warning circuit can be implemented by using electronic switches, electromagnetic switches, relays, TRIACs, thyristors, or adjustable impedance components (e.g., variable resistor, variable capacitor, variable inductance, etc.). In other words, those skilled in the art should be able to understand that under the concept of using a warning circuit to affect the current continuity of the power loop has been specifically disclosed in the present disclosure, the scope of the present disclosure also extends to the equivalents of the embodiments of the above-described warning circuit.

In some embodiments, the misuse detection control circuit 583 maintains the switching circuit 584 in a cutoff state, thereby avoiding the potential danger to a user due to not immediately removing the LED tube lamp from the incompatible lamp socket.

Figure 46D:
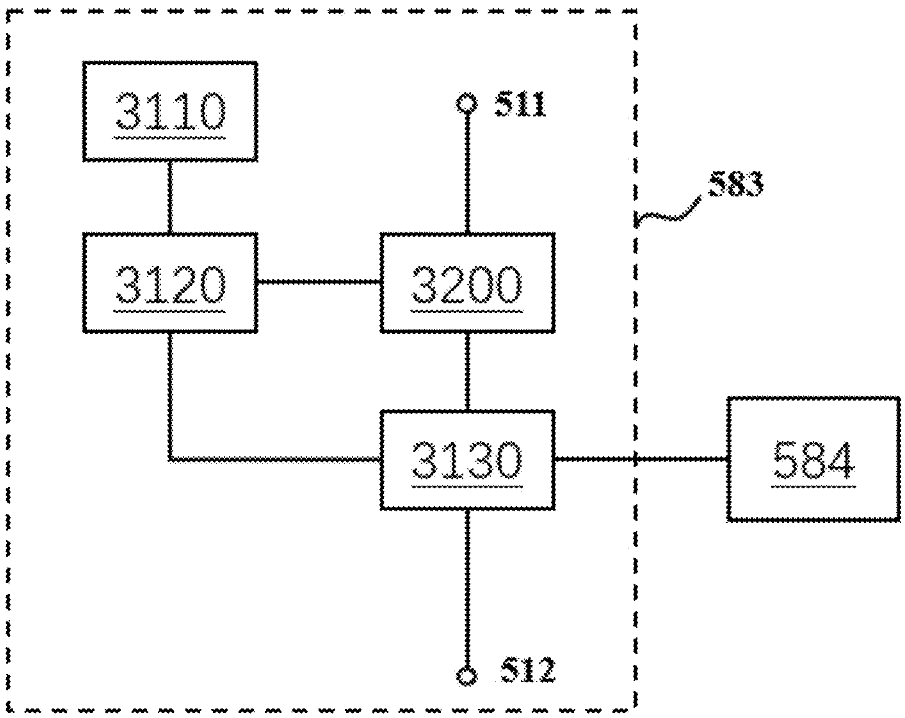
FIGS. 46D-46E are schematic circuit block diagrams of a misuse detection circuit according to some embodiments.
Figure 46E:
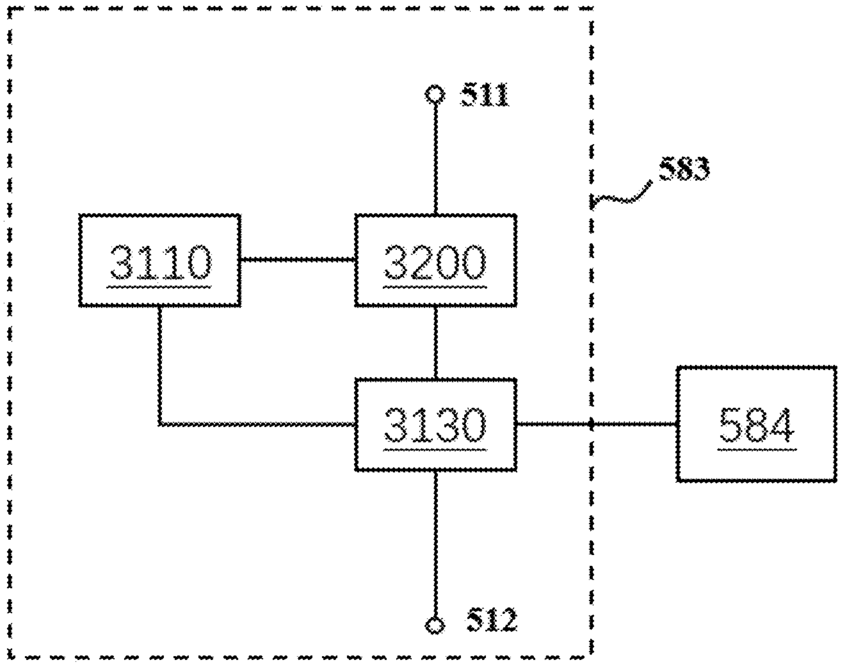
Figure 46F:
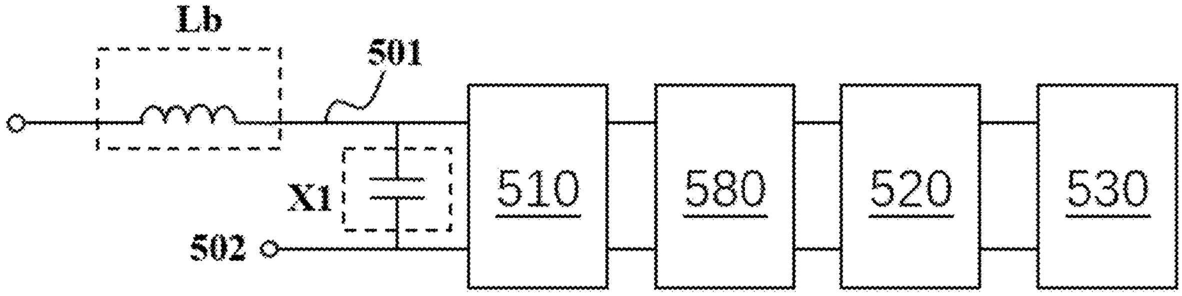
FIG. 46F is a schematic circuit block diagram of a power supply module according to some embodiments.
Figure 46G:
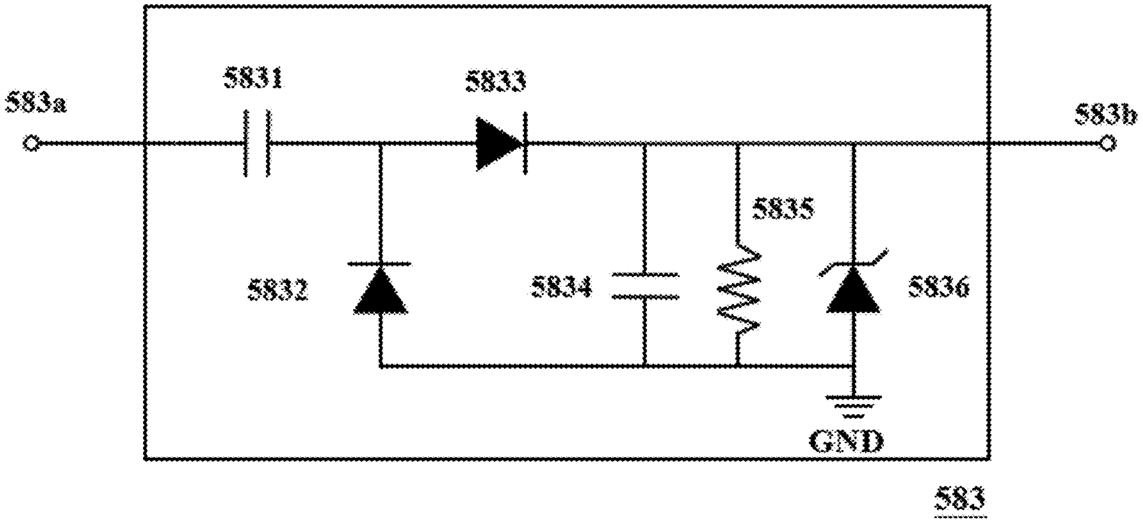
FIG. 46G is a schematic diagram of a circuit architecture of a misuse detection circuit according to some embodiments.

Referring to FIG. 46G, FIG. 46G is a schematic circuit architecture of an embodiment of the present disclosure. The present embodiment mainly describes the principle of how the misuse detection circuit 583 uses the frequency of the external power supply signal to determine the type of external power supply signal. In the present embodiment, the misuse detection circuit 583 includes capacitors 5831, 5834, diodes 5832, 5833, resistors 5835 and Zener diodes 5836. One end of the capacitor 5831 is electrically connected to the input of the misuse detection circuit 583, and the other end of the capacitor 5831 is electrically connected to the anode of the diode 5833 and the cathode of the diode 5832. The anode of the diode 5832 is electrically connected to a common node GND. One end of the capacitor 5834 is electrically connected to the cathode of the diode 5833, and the other end of the capacitor 5834 is electrically connected to the common node GND. The resistor 5835 and the capacitor 5834 are connected in parallel, and the Zener diode 5836 and the capacitor 5834 are connected in parallel. The output 583_b_ of the misuse detection circuit 583 is electrically connected to the cathode of the diode 5833. The input 583_a_ of the misuse detection circuit 583 is electrically connected to the first pin 501 or the second pin 502 of the LED tube lamp. The common node GND is electrically connected to the second rectifying output terminal, and the output 583_b_ of the misuse detection circuit 583 is electrically connected to the warning circuit 584.

The following describes the principle of how the misuse detection circuit 583 determines the type of external power supply signal. When the external power supply signal is AC signal from mains power grid, the frequency of the AC signal from the mains power grid is around 50-60 Hz, which could be referred as a low-frequency signal. In some examples, the capacitor 5831 is set as the high-pass filtering capacitor, so the low-frequency AC signal from the mains power grid is not able to pass through the capacitor 5831, and a low electric potential can be detected at the output 583_b_ of the misuse detection circuit. When the external power supply signal is the high-frequency signal provided by the electronic ballast (e.g., 20 KHz-200 KHz), the high-frequency electronic ballast signal can pass through the capacitor 5831 (which is set as a high-pass filtering capacitor), and the high-frequency signal forms a relatively high and stable voltage on the Zener diode 5836. As described herein, when the external power supply signal is the AC signal from mains power grid, the misuse detection circuit 583 would output a signal with low electric potential, and this low-electric-potential signal would be the first detection signal. When the external power supply signal is the signal provided by the electronic ballast, the misuse detection circuit 583 would output a signal with high-electric potential, and this high-electric-potential signal would the second detection signal.

By utilizing the embodiments disclosed in the present disclosure, it can be determined whether the external power supply signal is an AC signal from the mains power grid or the electronic ballast. When it is determined that the external power supply signal is the signal provided by the electronic ballast, a warning signal can be generated to warn the misuse of the LED tube lamp and avoid burning of the LED tube lamp or causing of fire.

Referring to FIG. 46D, FIG. 46D is a schematic circuit block diagram of a misuse detection circuit according to some embodiments of the present disclosure. In the present embodiment, the circuit architecture of the misuse detection circuit is similar to that of the embodiment shown in FIG. 19A, with a difference that, in the present embodiment, the current limiting circuit 3200 is electrically connected to the first rectifying output terminal 511, and the detection determining circuit 3130 is electrically connected to the second rectifying output terminal 512.

Referring FIGS. 18 and 46D together, when the LED tube lamp is connected to the AC signal from the mains power grid, the AC signal from the mains power grid forms a detection path through the first pin 501, the rectifying circuit 510, the misuse detection circuit 583 and the second pin 502. In the present embodiment, the detection pulse generating module 3110 is configured to generate a pulse signal and transmit the pulse signal to the detection result latching circuit 3120. The detection result latching circuit 3120 may simultaneously receive the pulse signal generated by the detection pulse generating module 3110 and the detection result signal generated by the detection determining circuit 3130 and output a latch signal to the current limiting circuit 3200.

The operation of the misuse detection circuit 583 will be described in detail below. When the system is powered on, the detection pulse generating module 3110 generates a pulse signal DP (e.g., referring to FIGS. 43A-43D), the detection result latching circuit 3120 only receives the pulse signal DP at this time, and the pulse signal DP would be directly transmitted to the current limiting circuit. When the pulse signal DP is at high electric potential, the current limiting circuit 3200 is would be enabled and conducted, the first rectifying output terminal 511 and the second rectifying output terminal 512 are also conducted and as a result, the external power supply signal forms the detection path by the misuse detection circuit 583. When the pulse signal DP is at low electric potential, the current limiting circuit 3200 is disabled and disconnected, and the detection path is disconnected thereby. In other words, the current limiting circuit 3200 can be controlled by the pulse signal DP to be conducted and cut-off on so that a path detection signal can be formed on the detection path. The detection determining circuit 3130 can detect this path detection signal, determine the type of external power supply signal based on the path detection signal, and output a first detection signal or a second detection signal. Then, the first detection signal or the second detection signal can be transmitted to the detection result latching circuit 3120 and the warning circuit 584.

When the detection determining circuit 3130 determines that the external power supply signal is AC signal from mains power grid based on the path detection signal, the detection determining circuit would output the first detection signal. The first detection signal is configured to indicate the detection result latching circuit to output a low-electric-potential signal continuously, so that the current limiting circuit 3200 would be cut of when receiving this low-electric-potential signal and the misuse detection circuit may stop working. The first detection signal also indicates the warning circuit 584 to be not operated and the warning would not be generated. In this case, the LED tube lamp is installed normally and there is no misuse occurred. When the detection determining circuit 3130 determines that the external power supply signal is the signal provided by the inductive ballast based on the path detection signal, the detection determining circuit 3130 outputs the second detection signal. The second detection signal indicates the detection result latching circuit 3120 to output a low-electric-potential signal continuously, so that the current limiting circuit 3200 is cut-off when receiving this low-electric-potential signal and the misuse detection circuit 583 may stop working. The second detection signal also indicates the warning circuit 584 to be enabled, so a warning can be generated to remind the user that the LED tube lamp is not installed normally, which also indicates a misuse is occurred.

In some embodiments, when it is determined that the external power supply signal is a signal provided by an inductive ballast, the second detection signal indicates the detection result latching circuit 3120 not to perform latching. That is, the detection result latching circuit 3120 outputs the pulse signal DP to the current limiting circuit 3200 and the misuse detection circuit 583 may resume to detect continuously.

The principle of how the detection determining circuit 3130 determines the type of external power supply signal would be described in detail below with reference to FIGS. 43E-43G. FIGS. 43E-43G are schematic diagrams of the waveform of the path detection signal DL under different external power supply signals according to some embodiments of the present disclosure.

Referring to FIG. 43E, when the external power supply signal is an AC signal from mains power grid, the signal DP is the pulse signal generated by the detection pulse generating module 3110, and the path detection signal DL1 is formed on the detection path correspondingly. The corresponding relationship between the path detection signal DL1 and the pulse signal DP is shown in FIG. 43E. When the pulse signal DP is a high-electric-potential signal, the path detection signal DL1 is also high-electric-potential signal. When the pulse signal DP is a low-electric-potential signal, the path detection signal DL1 is also a low-electric-potential signal.

Referring to FIGS. 43F and 46F, when there is no x capacitor connected to the input of the rectifying circuit 510 in the LED tube lamp, and the external power supply signal is provided by the inductive ballast, the circuit can be equivalent to the connection of an inductor Lb on the power loop of the LED tube lamp, and the AC signal from the mains power grid is provided as power supply to the LED tube lamp through the inductor Lb. When the current limiting circuit 3200 in the misuse warning module 580 is turned on, the detection path formed by the AC signal from the mains power grid through the inductor Lb, the rectifying circuit 510, and the misuse warning module 580. Since the current in the inductor Lb cannot be changed abruptly, the path detection signal DL2 in FIG. 43F gradually increases as the pulse signal becomes high electric potential. When the pulse signal DP becomes low electric potential, the detection path is disconnected and the path detection signal becomes zero Referring to FIGS. 43E and 43F together, Comparing the situations when the external power supply signal is the AC signal from mains power grid and the external power supply signal is the signal provided by the inductive ballast, the path detection signal DL1 and DL2 are significantly different, and the detection determining circuit 3130 can use the difference between the path detection signal DL1 and DL2 to determine the type of external power supply signal. This difference can be, for example, the difference in the peak, amplitude average, waveform and other parameters of the path detection signal DL1 and DL2, the present disclosure is not limited to this, as long as DL1 and DL2 can be distinguished, the determination of the type of external power supply signal can be achieved.

Taking the distinguishable difference is the amplitude of the path detection signals DL1 and DL2 as an example, a reference threshold Vref2 can be set before the determination is made. When the amplitude of the path detection signal DL is greater than this set threshold Vref2, the external power supply signal can be determined to be AC signal from mains power grid, and when the amplitude of the path detection signal is lower than this set threshold Vref2, the external power supply signal can be determined to be the signal provided by the inductive ballast. In some examples, the value of the reference threshold Vref2 can be set to be lower than the maximum value of the path detection signal DL1 and greater than the minimum value of the path heartbeat DL2.

Referring to FIGS. 43G and 46F, when the x capacitor is connected to the input of the rectifying circuit 510 in the LED tube lamp, and the external power supply signal is provided by an inductive ballast, the circuit can be equivalent to a capacitor Lb connected to the power loop of the LED tube lamp, and the input of the rectifying circuit 510 is connected in parallel with a capacitor X1. The present embodiment is similar to the embodiment shown in FIG. 43F, except that capacitor X1 is further set in the present embodiment, and the waveform of the path detection signal DL3 is shown in FIG. 43G. When the pulse signal DP changes from low electric potential to high electric potential, the current limiting circuit 3200 is turned on, capacitor X1 is discharged through the detection path. During the t5 time period, the electric potential of the path detection signal DL3 rises first, and the path detection signal DL3 gradually decreases when the capacitor X1 is discharged gradually. Further, during the t6 time period, the waveform of the path detection signal DL3 is the same as the waveform of the corresponding time period in FIG. 43F. Since the current across the inductor Lb cannot be changed abruptly, the path detection signal DL3 gradually increases during the t6 time period.

Referring to FIGS. 43E and 43G together, Comparing the situations when the external power supply signal is AC signal from mains power grid and the external power supply signal is the signal provided by the inductive ballast, the path detection signal DL1 and DL3 are significantly different, and the detection determining circuit 3130 can use the difference between the path detection signal DL1 and DL3 to determine the type of external power supply signal. This difference can be, for example, the difference in the peak, amplitude average, waveform and other parameters of the path detection signal DL1 and DL3, the present disclosure is not limited to this, as long as DL1 and DL3 can be distinguished, the external power supply signal type can be determined.

Take the distinguishable difference is the amplitude of the path detection signals DL1 and DL3 as an example, a reference threshold Vref2 can be set to determine the relationship between the amplitude of path detection signals DL1 and DL3 and the reference threshold Vref2 during the t6 time period. During the t6 time period, when the amplitude of the path detection signal DL1 or DL3 is greater than this set threshold Vref2, the external power supply signal is determined to be AC signal from mains power grid. When the amplitude of the path detection signal is lower than this set threshold Vref2, the external power supply signal is determined to be the signal provided by the inductive ballast. In some examples, the value of the reference threshold Vref2 can be set to be less than the maximum value of the path detection signal DL1 in the t6 time period and greater than the minimum value of the path detection signal DL3 in the t6 time period.

Referring to FIG. 46E, FIG. 46E is a schematic circuit block diagram of a misuse detection circuit according to some embodiments of the present disclosure. The circuit structure of the misuse detection circuit 583 in the present embodiment is similar to that of the embodiment described in FIG. 46D, except that the misuse detection circuit 583 of the present embodiment removes the detection result latching circuit 3120. In this embodiment, the detection pulse generating module 3110 is electrically connected to the current limiting circuit 3200 and the detection determining circuit 3130. The current limiting circuit 3200 is electrically connected to the first rectifying output terminal 511 and the detection determining circuit 3130. The detection determining circuit 3130 is electrically connected to the second rectifying output terminal 512 and the warning circuit 584.

The actions of the misuse detection circuit 583 are described as follows. When the system is powered on, the detection pulse generating module 3110 generates a pulse signal DP (e.g., referring to FIGS. 43A-43D). The current limiting circuit 3200 may receive the pulse signal DP. When the pulse signal DP is at a high electric potential, the current limiting circuit 3200 would be in a conducted state. When the pulse signal DP is at a low electric potential, the current limiting circuit 3200 is in a disconnection state. As a result, form a path detection signal can be formed on the detection path by controlling the conduction and disconnection of the current limiting circuit 3200 through the pulse signal DP. The detection determining circuit 3130 detects the path detection signal and thereby determines the type of external power supply signal, and outputs the first detection signal or the second detection signal to the detection pulse generating module 3110 and the warning circuit 584.

When the external power supply signal is determined to be the AC signal from mains power grid, the detection determining circuit 3130 outputs the first detection signal. The first detection signal indicates that the detection pulse generating circuit 3110 continues to operate, that is, the detection pulse generating circuit 3110 may continuously output a pulse signal. The first detection signal indicates the warning circuit 584 to be disabled, that is, the warning circuit 584 does not generate a warning, which indicates that the LED tube lamp is installed normally.

When it is determined that the external power supply signal is the signal provided by the inductive ballast, the detection determining circuit 3130 outputs the second detection signal, the second detection signal indicates that the detection pulse generating circuit 3110 stops working, that is, the detection pulse generating circuit 3110 may continuously output a low-electric-potential signal, and the current limiting circuit 3200 receives this low-electric-potential signal and keeps in the cut-off state. The second detection signal indicates the warning circuit 584 to be enabled, that is, a corresponding warning is generated to remind the user that the LED tube lamp is misused.

In some embodiments, when it is determined that the external power supply signal is the signal provided by the inductive ballast, the detection pulse generating module 3110 can be continuously operated so as to continuously detect the misuse situation and ensure the safety of use.

By the above embodiments, the misuse warning module 580 can determine whether the external power supply signal is provided by the inductive ballast. When the external power supply signal is provided by the inductive ballast, the misuse warning module 580 generates a warning to remind the user of the misuse of the LED tube lamp to ensure the safety of use.

Referring to the embodiments described in FIGS. 46A-47B, the misuse warning module can be independently implemented to determine whether the external power supply signal is an AC signal from the mains power grid or the electronic ballast. The misuse warning module can also be independently implemented to determine whether the external power supply signal is an AC signal from the mains power grid, or an inductive ballast provided. Similarly, the above two technical solutions can also be combined to determine whether the external power supply signal is the signal provided by the AC signal from the mains power grid, the electronic ballast or the inductive ballast.

As for ballast-bypass type LED tube lamp, when the ballast-bypass type LED tube lamp is connected to a ballast for power supply, circuit damage and even fire can be caused. The misuse warning module can determine whether the external power supply signal is an AC signal from the mains power grid. As a result, when it is determined that the external power supply signal is the signal provided by the ballast, the misuse warning module can generate an alarm to warn the misuse situation and avoid further damages.

Figure 47A:
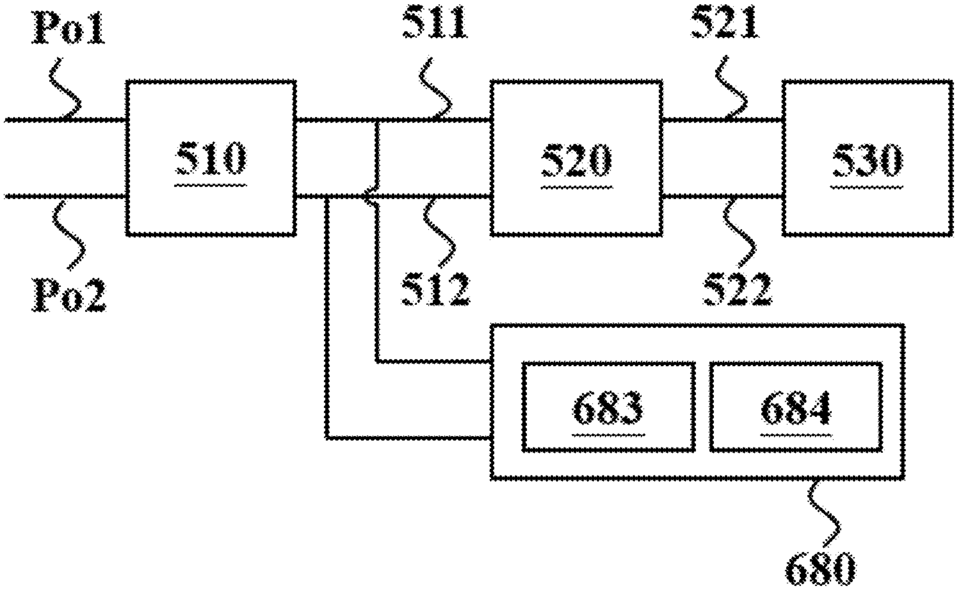
FIG. 47A is a block diagram of a power supply module according to some embodiments.
Figure 47B:
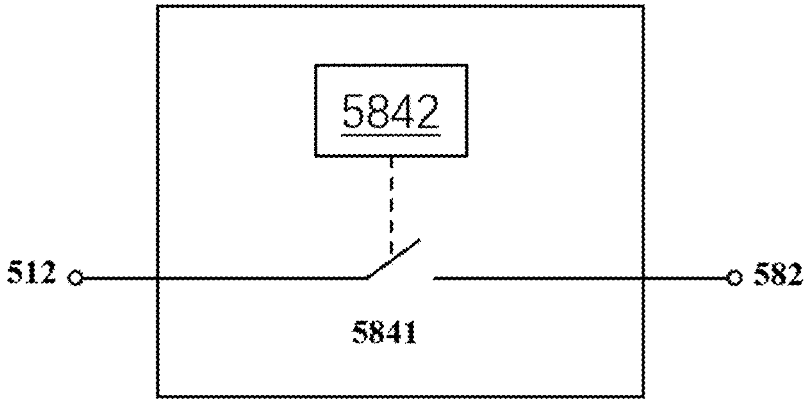
FIG. 47B is a schematic diagram of a circuit architecture of a warning circuit according to some embodiments.

FIG. 47A is a block diagram of a power supply module in an LED tube lamp according to some embodiments. The power supply module in this embodiment of FIG. 47A includes a rectifying circuit 510, a filtering circuit 520, and a driving circuit 530, and further includes a misuse warning module 680. The misuse warning module 680 is configured to detect the power line voltage and judge according to the detection result whether an input external driving signal is an AC signal provided by an electronic ballast; and is configured to according to the determination result issue a misuse warning (such as a sounding) to alert or remind a user of a misuse situation, in order to prevent an AC signal output by an electronic ballast from damaging a ballast-bypass LED tube lamp. Compared to the embodiments of FIG. 46A, since the misuse warning module 680 is not designed to control an LED module to show a light pattern as a misuse warning, it is not needed to serially connect the misuse warning module 680 on the power loop of the LED tube lamp.

In this embodiment of FIG. 47A, the misuse warning module 680 includes a misuse detection circuit 683 and a warning circuit 684. The misuse detection circuit 683 is configured to detect the power line voltage and to judge according to a signal feature of the detected power line voltage whether an input external driving signal currently received by the LED tube lamp of the misuse warning module 680 is an AC signal output by an electronic ballast or directly provided by a commercial power grid.

In some embodiments, when the misuse detection circuit 683 of FIG. 47A detects a signal feature of the power line voltage as conforming to that of a type of output signal provided by a commercial power grid, this indicates that the currently input external driving signal is or might be an AC signal provided by an AC power grid, then the misuse detection circuit 683 disables the warning circuit 684, causing the warning circuit 684 not to issue a misuse warning. On the other hand, when the misuse detection circuit 683 detects a signal feature of the power line voltage as not conforming to that of a type of output signal provided by a commercial power grid, this indicates that the currently input external driving signal is or might be an AC signal provided by an electronic ballast, then the misuse detection circuit 683 enables the warning circuit 684, causing the warning circuit 684 to issue a misuse warning. In some embodiments, the warning circuit 684 comprises or is embodied by a buzzer, in order to buzz to alert the user of the misuse situation when the ballast-bypass LED tube lamp is installed by mistake to a lamp socket of a ballast. The disclosure is not limited thereto. For example, in some embodiments, the warning circuit 684 can also include a warning light, whereby when the LED tube lamp is installed to the lamp holder, the warning light can emit lights with different colors or different intensities to remind the user of the current installation state (i.e., whether the external driving signal is provided by the ballast). In some other embodiments, the warning circuit 684 can include both a buzzer and a warning light, whereby when the LED tube lamp is incorrectly installed to the lamp holder with ballast, at the same time with the help of a beep sound and the light of the warning light, the user can be reminded of the current misuse situation.

In the example shown in FIG. 47A, the misuse detection circuit 683 is disposed in a misuse warning module. The warning circuit 684 is disposed in a warning module. Specifically, the misuse warning module is connected to the power loop of the LED tube lamp by the terminals thereof and is configured to obtain the signal in the power loop, and outputs a second detection signal when detecting that the signal is a ballast characteristic signal. The warning module and the misuse warning module are electrically connected and are configured to generate the misuse warning of the LED tube lamp based on the received second detection signal. As described herein, the second detection signal can be a disabled signal or an enable signal issued by the misuse detection circuit 683 illustrated in the embodiment shown in FIG. 47A.

Combined with the embodiment shown in FIG. 47A, the ballast characteristic signal can refer to the AC signal output by the ballast (especially the electronic ballast) with the characteristics such as high frequency, high voltage, etc. The ballast characteristic signal can be identified from the high electric potential (or high electric potential interval) thereof. For example, the electric potential (or electric potential interval) of the ballast characteristic signal may indicate phase and crest/trough value of the AC signal output by the ballast. In this embodiment, the misuse warning module detects at least one of frequency, phase, and amplitude of the signal in the power loop through the terminals thereof to determine whether the signal is a ballast characteristic signal.

In order to be able to effectively retain the information, such as high frequency, high voltage and other characteristic, of the signal in the power loop, in some embodiments, the terminal of the misuse warning module is connected to the output or input of the rectifying circuit in the power loop of the LED tube lamp.

In some embodiments, the misuse warning module further includes other detection result latching circuits (not shown), the detection result latching circuit is electrically connected between the misuse detection circuit and the warning circuit and is configured to temporarily store the first detection signal or second detection signal output by the misuse detection circuit output and output the stored first detection signal or second detection signal to the warning circuit. The detection result latching circuit can be implemented by circuit architectures such as a flip-flop and logic gate circuit, but the disclosure is not limited to this, any analog/digital circuit architecture that can implement the function of latching and outputting a first detection signal or a second detection signal to transmit to the warning module can be applied herein. It should be noted that in practical applications, without affecting the overall circuit operation, the detection result latching circuit can be omitted, or designed to be shared or time-multiplexed based on the actual circuit design needs. Please refer to FIG. 47B, in the present embodiment, the warning circuit 584 includes a switching component 5841 connected in series to the power loop of the LED tube lamp. By controlling the conduction and cut-off of the switching device 5841 to affect the current continuity of the power loop, the effect of flashing LED tube lamp can be implemented to prompt the user of the lamp misuse situation and the warning effect can be achieved.

In some embodiments, the flash effect can also be implemented in other manners. For example, in the embodiment of FIG. 30G, the control circuit 5842 of the warning circuit is electrically connected to the controller 633 of the driving circuit and is configured to transmit the first detection signal or the second detection signal to the controller 633, so the controller 633 can enable or disable the driving output based on the first detection signal or the second detection signal to affect the continuity of the driving output signal. The effect of flashing lamps can also be achieved, and the present disclosure is not limited thereto.

In some embodiments, the switching component 5841 is electrically connected between the driving circuit 530 and the LED module 50 and is configured to change the current continuity of the LED module 50 to achieve a flashing effect.

Concrete operation mechanism(s) of an LED tube lamp having a misuse warning module are further explained with reference to FIG. 48D. FIG. 48D is flowchart of steps of a method to control a misuse warning module according to some embodiments. Referring to FIG. 48D, upon a power supply module of an LED tube lamp receiving an external driving signal, a misuse warning module of the LED tube lamp detects a signal on a power loop of the LED tube lamp (step S401) and then judges whether a detected signal feature conforms to a first signal feature (step S402). The first signal feature may be one of the electrical signal characteristics such as frequency, amplitude, and phase. In the embodiment of FIG. 48D, the first signal feature for example conforms to that of an output signal of an AC power grid, but the present disclosure is not limited to this case. In some embodiments, the first signal feature is set conforming to that of an output signal of an electronic ballast.

Still referring to FIG. 48D, proceeding further in the method of controlling a misuse warning module, when the misuse warning module judges that the detected signal feature conforms to the first signal feature, this indicates that the currently input external driving signal is or might be an AC signal provided by an AC power grid, so the misuse warning module does not issue a misuse warning (step S403), and according to a set operation sequence related to misuse detection in the power supply process causes the LED tube lamp to normally light up (i.e. entering into or maintaining in a normal operation mode) or causes an installation detection module to perform installation detection (in a detection mode). On the contrary, when the misuse warning module judges that the detected signal feature does not conform to the first signal feature, this indicates that the currently input external driving signal is or might be an AC signal provided by an electronic ballast, so the misuse warning module issues a misuse warning (step S404). In some embodiments, upon issuing a misuse warning, the misuse warning module further causes the LED tube lamp to enter into a restriction mode (step S405). Under the restriction mode, the misuse warning module may prohibit the LED tube lamp from lighting up (i.e., a driving current is prevented from passing or being generated) or restrict or limit the LED tube lamp to operating in a limited-current state (i.e., the magnitude of a driving current is lowered or limited), in order to prevent the LED tube lamp from being damaged. So, such a restriction mode of an LED tube lamp may ensure the LED tube lamp safely operates, by limiting an output power of the power supply module of the LED tube lamp to being below its power rating.

It's noted that depending on design needs the first signal feature as a determination basis may be designed to conform to that of an output signal of an AC power grid or an electronic ballast, so the possible determination results at the step S402 in FIG. 48D can be logically exchanged and then correspond to the following two steps S403 and S404 respectively. For example, if the first signal feature is chosen as conforming to that of an output signal of an electronic ballast, the determination results at the step S402 in FIG. 48D are exchanged such that the step S403 is performed if the determination result is negative (meaning the ballast-bypass LED tube lamp is likely not installed by mistake to a lamp socket of a ballast) and the steps S404 and S405 are performed if the determination result is positive, but the present disclosure is not limited to this case.

In some embodiments of using an installation detection module together with a misuse warning module, such as using the installation detection module 3000*a* including a ballast detection module 3400 of FIG. 19A, the steps of misuse detection may be performed in a detection mode of an LED tube lamp. For example, operations for misuse detection by a misuse warning module (or ballast detection module) and operations for installation detection by an installation detection module may be performed concurrently or in proper order, and when a misuse situation is detected by the misuse warning module a misuse warning is issued and the LED tube lamp is then caused to enter into a restriction mode. In some other embodiments, the steps of misuse detection may be performed in a normal operation mode of an LED tube lamp. For example, upon judging that the LED tube lamp has been correctly installed to a lamp socket an installation detection module is configured to cause the LED tube lamp to enter into a normal operation mode to enable normal lighting of the LED tube lamp. Under the normal operation mode, a misuse warning module (or ballast detection module) is configured to perform operations for misuse detection, and when a misuse situation is detected a misuse warning is issued and the LED tube lamp is then caused to leave the normal operation mode to enter into a restriction mode.

It's also noted that although the described optional emergency control module (such as 3140, 3240, and 4140), ballast detection module (such as 3400 and 4400), warning circuit (such as 3160), and dimming circuit 5170 are each described or explained above with reference to some directly relevant embodiments, a person of ordinary skill in the art after reading the description herein can readily and clearly understand applicable configurations and operations of such optional modules and/or circuits when applied in other embodiments of an installation detection module which are different from such optional modules' respective above described embodiments, for example when applied in the embodiments of installation detection modules 2000-8000, or especially when applied in the embodiments of installation detection modules 3000*a*-3000L, 4000*a*, 5000*a*, and 6000*a*.

Figure 54:
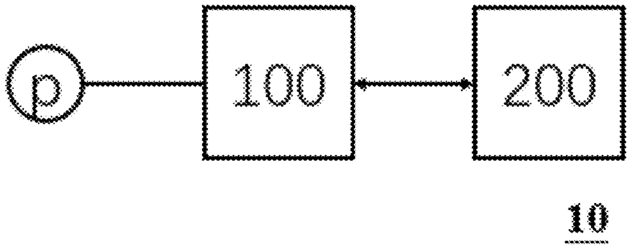
FIG. 54 is a schematic diagram of the circuit structure of a LED lamp lighting system according to some embodiments.

Referring to FIG. 54, FIG. 54 is a schematic diagram of the circuit structure of the LED lamp lighting system according to some embodiments of the present disclosure. The LED lamp lighting system 10 includes a power supply module 100 and a LED lamp 200. The power supply module 100 is electrically connected to an external power supply and is configured to receive an external power supply signal and convert the external power supply signal into a driving signal suitable for driving the LED lamp 200. The LED lamp 200 electrically connected to the power supply module, to receive the driving signal and light up.

In order to meet different lighting needs, LED lamp 200 is designed to be emit lights with different luminous fluxes. In order to achieve different luminous flux, the current parameters that the LED lamp 200 required is different, so the power supply module 100 is required to output driving signals with different parameters to drive the LED lamp 200 with different parameters to meet the lighting needs in different scenarios.

Figure 55A:
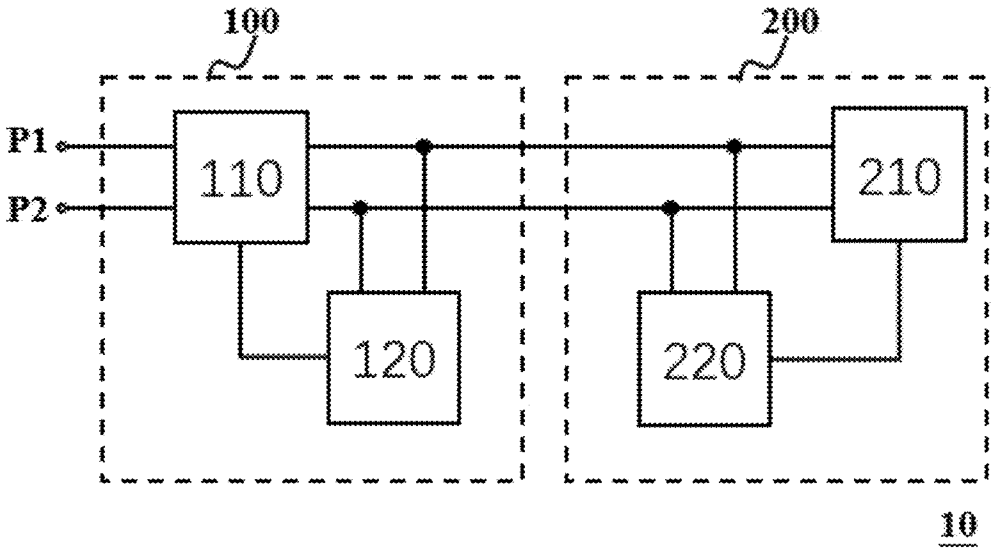
FIGS. 55A-55C are schematic circuit block diagrams of a LED lamp lighting system according to some embodiments.

Referring to FIG. 55A, FIG. 55A is a schematic circuit block diagram of a LED lamp lighting system according to some embodiments of the present disclosure. In the present embodiment, the power supply module 100 includes a first input terminal P1, a second input terminal P2, a driving circuit 110 and a load identification circuit 120. The first input terminal P1 and the second input terminal P2 are electrically connected to an external power supply to receive an external power supply signal. The driving circuit 110 is electrically connected to the first input terminal P1 and the second input terminal P2 to receive the external power supply signal and convert the external power supply signal to generate a driving signal. The load identification circuit 120 is electrically connected to the driving circuit 110 and the output of the power supply module, and is configured to generate a detection signal.

The LED lamp 200 includes an LED module and an ID module. The LED module is electrically connected to the output of the power supply module 100 and is configured to receive a driving signal to emit lights. The ID module is electrically connected to the output of the power supply module 100 and the LED module and is configured to receive the detection signal and generate a feedback signal including an ID information of the LED lamp 200. In the present embodiment, this ID information includes the current parameters required to drive the LED lamp 200. The power supply module 100 may adjust the current parameters of the driving signal based on this feedback signal to light up the LED lamp 200 normally and reaching the luminous flux of the LED light 200 was designed to achieve.

For ease of description, the ID module can be referred as a tag module.

Figure 57A:
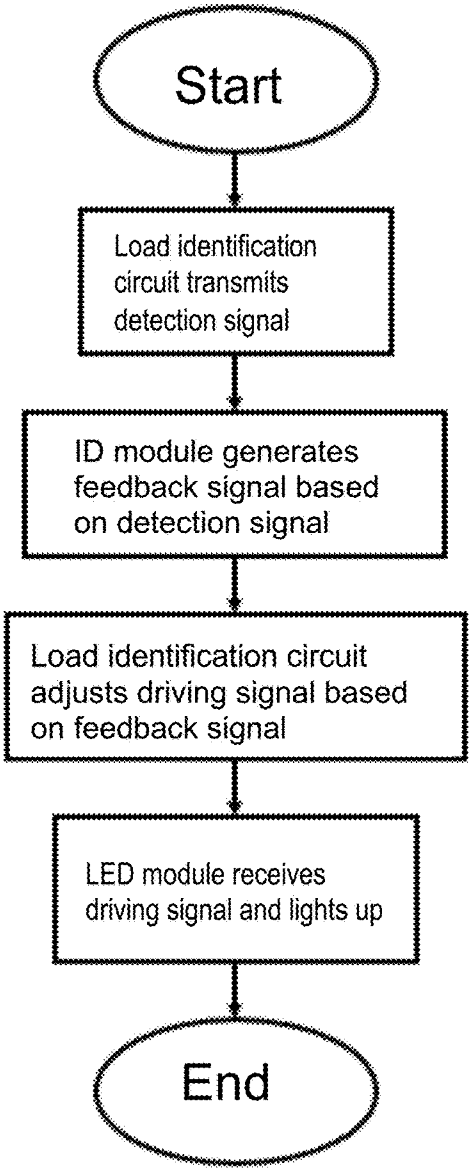

Combined with the flow chart shown in FIG. 57A, the principle of how the power supply module 100 in the present embodiment identifies the LED lamp 200 is described in detail below. After the power supply module 100 receives the external power supply signal, the load identification circuit 120 can generate a detection signal and transmit the detection signal to the LED lamp 200. The tag module 220 of the LED lamp 200 receives the detection signal and generates a feedback signal. This feedback signal may include the ID information of the LED lamp 200. In the present embodiment, this ID information may include the current parameters required to drive the LED module 210. The load identification circuit 120 receives the feedback signal and adjusts the output parameters of the driving circuit 110 based on the feedback signal to output a driving signal that may match the LED lamp 200 so the LED lamp 200 can emit lights after receiving the driving signal.

Through the circuit structure shown in the present embodiment, the power supply module 100 may adjust the current parameters of the driving signal based on the ID information of the LED lamp 200 to light up the LED lamp 200 normally. This process does not require interventions from human and can complete the matching adjustment action by the LED lamp 200 itself.

In the present embodiment, the detection signal can be a power supply signal and the LED module can be enabled after receiving the power supply signal and generate a feedback signal, where the feedback signal includes the ID information of the LED lamp 200. This power supply signal causes the tag module in the LED lamp 200 to start operating normally. In some embodiments, the detection signal can be a digital signal or an analog signal, and the present disclosure is not limited thereto.

Figure 55B:
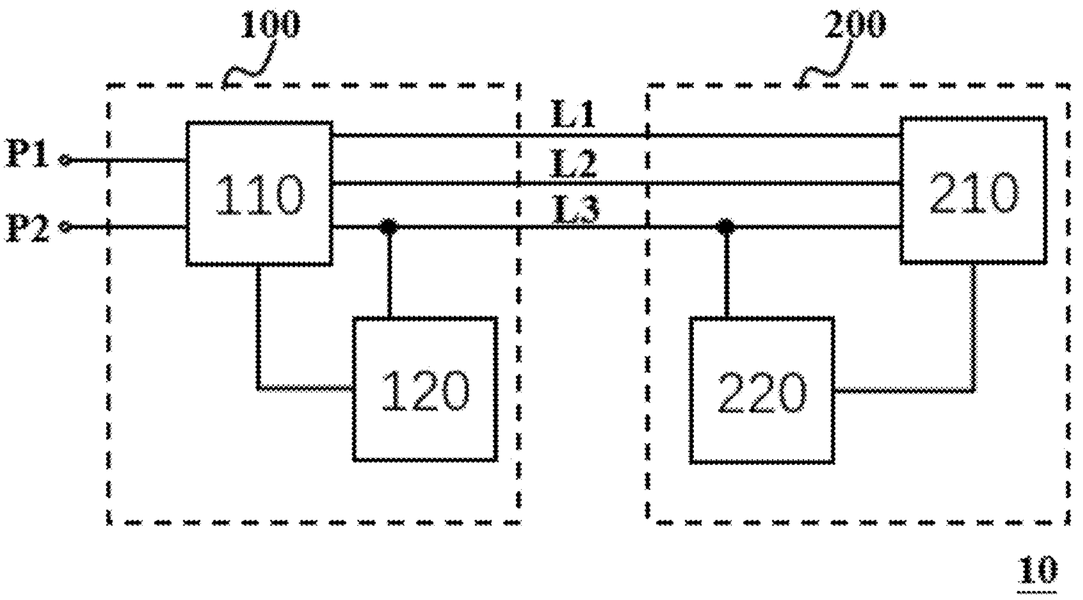

Referring to FIG. 55B, FIG. 55B is a schematic circuit block diagram of a LED lamp lighting system according to some embodiments of the present disclosure. The present embodiment is similar to the embodiment shown in FIG. 55A, except that in the present embodiment, the power supply module 100 and the LED lamp 200 are electrically connected through connecting wires L1, L2 and L3. The connecting wires L1 and L2 are configured to transmit the driving signal to LED lamp 200 from the power supply module 100. The connecting wires L2 and L3 are configured to transmit the feedback signal from the LED lamp 200 to the power supply module 100.

Figure 57B:
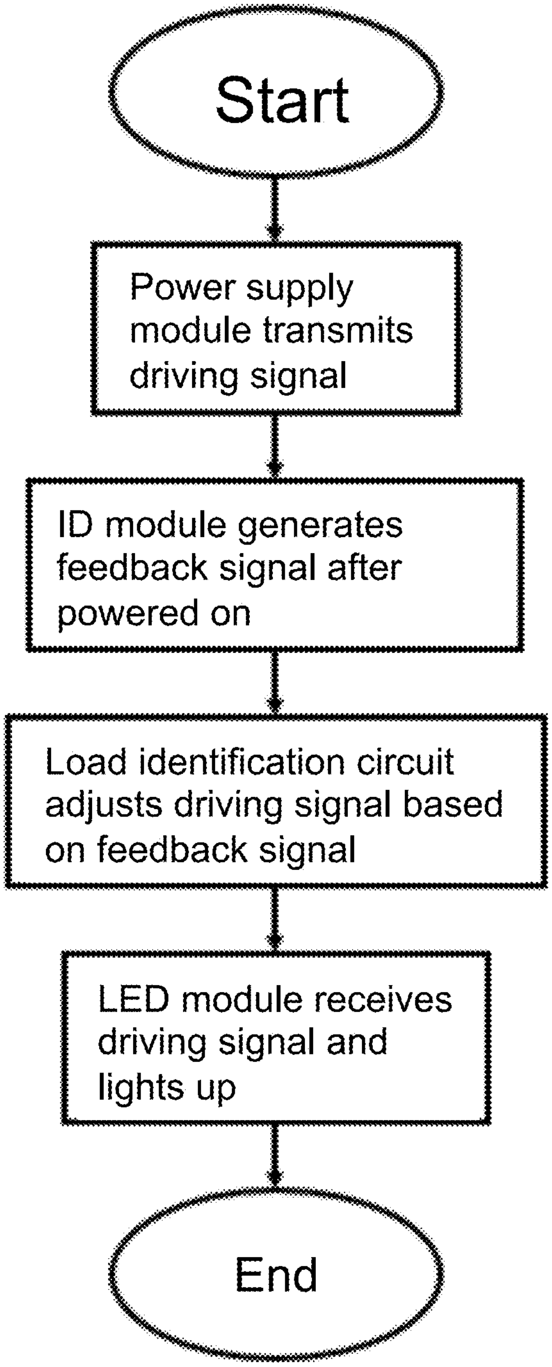

The principle of how the power supply module 100 in the present embodiment identifies the LED lamp 200 is described below with the flow chart shown in FIG. 57B. Specifically, after the power supply module 100 receives the external power supply signal, the driving signal is generated and sent to the LED light through the connecting wires L1 and L2. Then, the tag module 220 would be enabled and generate a feedback signal to be sent to the power supply module 100 through the connecting wires L2 and L3. The load identification circuit 120 of the power supply module 100 receives the feedback signal and adjusts the parameters of the driving signal of the output of the driving circuit 110 based on the feedback signal, the LED module 210 receives the adjusted driving signal and lights up. In the present embodiment, the driving signal is transmitted to the LED lamp 200 through the connecting wires L1 and L2, and the feedback signal is transmitted to the power supply module 110 through the connecting wires L2 and L3. These two signals can be transmitted at the same time, there is no interference between each other, and the transmission of the signals can be considered parallel transmission. This transmission method can improve the signal stability and transmission efficiency.

Figure 55C:
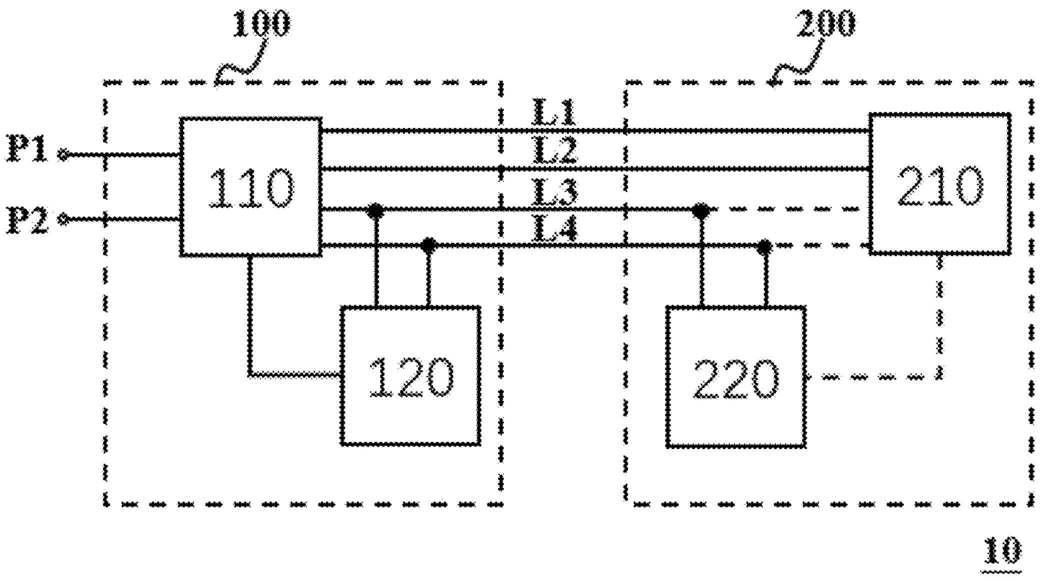

Referring to FIG. 55C, FIG. 55C is a schematic circuit block diagram of a LED lamp lighting system according to some embodiments of the present disclosure. The circuit structure of the present embodiment is similar to the embodiment shown in FIG. 55B, except that the power supply module 100 and the LED lamp 200 are electrically connected through 4 connecting wires L1, L2, L3 and L4. The connecting wires L1 and L2 are configured to transmit driving signals from the power supply module 100 to LED lamp 200. The connecting wires L3 and L4 are configured to transmit the feedback signal from the LED lamp 200 to the power supply module 100.

In the present embodiment, the tag module can be implemented using independent passive components, such as resistors, capacitors, and the like. Taking implementing the tag module by a resistor as an example, the working principle of the present embodiment is illustrated below. Please refer to the flowchart shown in FIG. 57A together, in the present embodiment, the tag module includes a resistor R1, and the two ends of the resistor R1 are electrically connected to the connecting wires L3 and L4, respectively. First, the power supply module 100 receives an external power supply signal. Then, the load identification circuit 120 transmits a detection signal to the tag module through the connecting wires L3 and L4. The resistor R1 receives the detection signal and generates a feedback signal based on this detection signal, and the load identification circuit can adjust the driving signal based on the feedback signal. In the present embodiment, the detection signal can be a constant current, when this current flows through the resistor R1, a voltage U1 would be formed on the resistor R1 and the voltage U1 can be referred as the feedback signal. Further, the load identification circuit 120 can obtain the ID information of the LED lamp 200 by detecting this voltage U1. Different resistors R1 may correspond to different voltages U1 and different driving signals at the same time. By setting the resistors R1 with different resistance in different types of LED tube lamps, the corresponding driving signal can be obtained. In some examples, the correspondence between the resistor R1 and the driving signal can be set by the parameters of the internal components of the load identification circuit 120.

Figure 56:
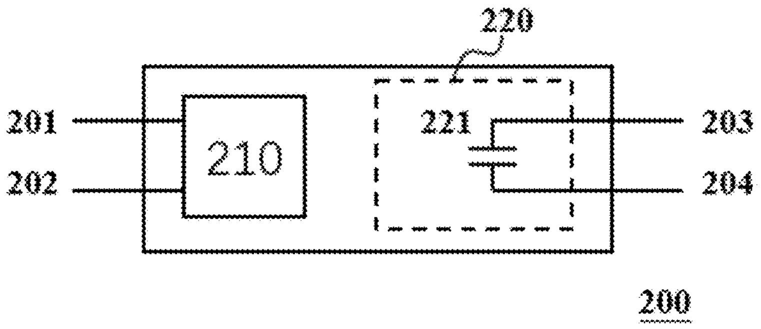

Referring to FIG. 56, FIG. 56 is a schematic diagram of the circuit structure of a LED lamp 200 according to some embodiments of the present disclosure. In the present embodiment, the LED lamp 200 includes an LED module 210, a tag module and 4 pins 201, 202, 203 and 204. The LED module 210 electrically connected to the pins 201 and 202 and is configured to receive a driving signal and light up. The tag module 220 includes a capacitor 221. Both ends of the capacitor 221 are electrically connected to the pins 203 and 203 respectively to receive a detection signal. The detection signal can determine the size (i.e., the capacitance) of the capacitor 221 by detecting the charging time of the capacitor 221, and the size of the capacitor 221 may correspond to different driving signals. By setting different sizes of capacitors 221 in different types of LED tube lamps, the corresponding driving signal can be obtained. The correspondence of the capacitor 221 and the driving signal can be set by the parameters of the internal components of the load identification circuit 120.

In some embodiments, the power supply module 100 further includes a rectifying circuit and a filtering circuit to rectify and filter the received external power supply signal. The driving circuit can be configured to receive the rectified and filtered signal to perform power conversion. In the present embodiment, the rectifying circuit, the filtering circuit and the driving circuit can be implemented using the prior art familiar to the industry, and the present disclosure is not limited thereto.

In the design of the power supply module, the external driving signal as described herein can be a low frequency AC signal (e.g., provided by a mains power or mains electricity) or a DC signal (e.g., provided by a battery or an external driving power supply), and can be input to the LED tube lamp under the double-ended power-supply configuration. In the embodiments using the double-ended power-supply configuration or driving structure for the LED tube lamp, those embodiments may also support single-ended power-supply configuration that uses merely one of the two ends of the LED tube lamp to receive the external driving signal.

The rectifying circuit in the power supply module of the LED tube lamp can be omitted when the external driving signal input to the LED tube lamp is a DC signal.

In the design of the rectifying circuit in the power supply module, a first rectifying unit and a second rectifying unit of a dual rectifying circuit are respectively coupled to conductive pin(s) at one end cap and conductive pin(s) at the other end cap, which two end caps are disposed respectively on two ends of the LED tube lamp. The dual rectifying circuit is applicable to the driving structure of double-ended power-supply configuration. Besides, the LED tube lamp having at least one rectifying unit is applicable to the driving structure of using a low frequency AC signal, a high frequency AC signal, or a DC signal to power the LED tube lamp.

The two rectifying units may comprise, for example, two half-wave rectifier circuits, two full-wave bridge rectifying circuits, or a combination of one half-wave rectifier circuit and one full-wave bridge rectifying circuit.

In the design of conductive pin(s) for the LED tube lamp, arrangements of pins may include disposing one single pin on each end of the LED tube lamp (e.g., two pins in total) or disposing two pins on each end of the LED tube lamp (e.g., four pins in total). The structure of disposing one single pin on each end of the LED tube lamp is applicable to the rectifying-circuit design with one rectifying circuit. The structure of disposing two pins on each end of the LED tube lamp is applicable to the rectifying-circuit design with two rectifying circuits, wherein the external driving signal can be received by the two pins at only one end of the LED tube lamp or any pin at each of two ends.

In the design of a filtering circuit of the power supply module, the filtering circuit may include one single capacitor or a π(pi) filter circuit, which can be used to filter out high frequency components of a rectified signal in order to provide a DC signal with low ripples as a filtered signal. The filtering circuit may comprise an LC filtering circuit in order to present high impedance at a specific frequency for conforming to current-magnitude requirements at the specific frequency. Moreover, the filtering circuit may comprise a filtering unit coupled between a rectifying circuit and conductive pin(s) in order to reduce the EMI caused by circuit(s) of the LED tube lamp. The LED tube lamp may omit a filtering circuit in the power supply module thereof when a DC signal is input as an external driving signal.

A protection circuit can be additionally added to protect the LED module. The protection circuit may detect the current and/or voltage of the LED module to determine whether to activate corresponding overcurrent and/or overvoltage protection.

In the design of an auxiliary power supply module of the power supply module of the LED tube lamp, the energy storage unit of the auxiliary power supply module can be a battery or a supercapacitor, connected in parallel with the LED module. The auxiliary power supply module may be applied to the design of a power supply module including a driving circuit.

In the design of an LED module with the power supply module, the LED module may comprise a plurality of strings of LED components, which strings are connected in parallel, each string may comprise LED components including single-color LED chips or different-color LED chips, and the LED components of each string may be connected with each other to form a mesh connection structure.

In other words, the abovementioned features can be implemented in any combination and can be used to improve an LED tube lamp.

What is claimed is:

1. A misuse warning module, comprising:

a detection circuit, electrically connected to a power loop of a LED lamp, and configured to detect a type of an external power supply signal and current level of the power loop to generate a detection signal; and a warning circuit, configured to receive the detection signal and generate a warning when the LED lamp is not properly installed, wherein the type of the external power supply signal is provided by at least two of a commercial power grid, a DC power supply, and an electronic ballast.

2. The misuse warning module of claim 1, wherein the detection circuit comprising:

a first detection circuit, electrically connected to the power loop of the LED lamp, and configured to detect the current level of the power loop, output a first detection signal when the current level is greater than a set threshold, and output a second detection signal when the current level is lower than or equal to the set threshold.

3. The misuse warning module of claim 2, wherein the detection circuit further comprises:

a second detection circuit, electrically connected to an input of an external power supply, and configured to output a third detection signal when the external power supply signal is provided by the DC power supply.

4. The misuse warning module of claim 3, wherein the detection circuit further comprises:

a third detection circuit, electrically connected to the input of the external power supply, and configured to output a fourth detection signal when the external power supply signal is provided by the electronic ballast, wherein the third detection circuit determines whether the external power supply signal is provided by the electronic ballast by detecting at least one of frequency, phase, and amplitude of the external power supply signal.

5. The misuse warning module of claim 4, wherein the first detection circuit comprises:

a detection pulse generating module, configured to generate a pulse signal;

a switching circuit, coupled to the power loop, and configured to conduct or cut off based on the pulse signal; and a detection determining circuit, configured to detect the current level of the power loop when the switching circuit is conducted, output the first detection signal when the current level is greater than the set threshold and output the second detection signal when the current level is lower than or equal to the set threshold.

6. The misuse warning module of claim 5, wherein the switching circuit is configured to conduct based on the first detection signal and/or the third detection signal.

7. The misuse warning module of claim 5, wherein the warning circuit is configured to instruct the switching circuit to be intermittently conducted based on the second detection signal and/or the fourth detection signal to cause the LED light to flash.

8. The misuse warning module of claim 5, wherein the switching circuit is configured to cut off based on the second detection signal and/or the fourth detection signal, and the warning circuit is configured to generate the warning based on the second detection signal and/or fourth detection signal.

9. The misuse warning module of claim 8, wherein the warning circuit comprises at least one of: a buzzer, a warning light, wherein the buzzer or the warning light is configured to generate a warning based on the second detection signal.

10. The misuse warning module based on claim 5, wherein the misuse warning module further comprises a current limiting circuit, connected in series to the power loop, for conducting the power loop based on the first detection signal and/or third detection signal, and intermittently conducting the power loop based on the second detection signal and/or the fourth detection signal to make the LED light flash.

11. The misuse warning module of claim 5, wherein the misuse warning module further comprises a current limiting circuit, connected in series to the power loop and configured to conduct the power loop based on the first detection signal and/or third detection signal, and cut off the power loop based on the second detection signal and/or fourth detection signal, the warning circuit is configured to generate the warning based on the second detection signal and/or the fourth detection signal.

12. The misuse warning module of claim 11, wherein the warning circuit comprises at least one of a buzzer or a warning light, wherein the buzzer or the warning light is configured to generate a warning based on the second detection signal.

13. An LED lamp, comprising:

at least two pins, a first pin and a second pin, configured to receive an external driving signal;

a power supply module, electrically connected to the first pin and the second pin, and configured to execute power conversion of the external driving signal to generate a driving signal;

an LED module, configured to receive the driving signal to light up;

an installation detection module, configured to detect current in a power loop and determine whether to limit the current of the power loop based on the current level of the power loop;

an impedance adjusting module, electrically connected to the first pin and the second pin, and configured to adjust impedance of the power loop to affect the determination of the installation detection module, wherein when a first resistor is connected in series in the power loop, the installation detection module limits the current of the power loop and the LED lamp cannot be lit normally; and when at least two or more of the LED lamps are connected in parallel, the installation detection module does not limit the current of the power loop and the plurality of the LED lights are lit normally; and wherein, the external power supply signal is supplied to the LED lamp through the power loop, and the first resistor is connected in series with the plurality of LED lamps, wherein the installation detection module comprises:

a detection pulse generating module, configured to generate a pulse signal;

a switching circuit, coupled to the power loop, and configured to conduct or cut off based on the pulse signal; and a detection determining circuit, configured to detect current level of the power loop when the switching circuit is conducted and output the first detection signal when the current level is greater than a set threshold, wherein the switching circuit is turned on based on the first detection signal.

14. The LED lamp of claim 13, wherein the resistance of the first resistor is 100-500 ohms.

15. The LED lamp of claim 13, wherein the impedance adjusting module comprises a first capacitor, a first pin of the first capacitor is electrically connected to the first pin, and a second pin of the first capacitor is electrically connected to the second pin.

16. The LED lamp of claim 15, wherein the capacitance of the first capacitor is 30-50 nF.

17. The LED lamp of claim 16, wherein the capacitance of the first capacitor is 47 nF.

* * * * *